US005999480A

United States Patent [19]

Ong et al.

[11] Patent Number: 5,999,480

[45] Date of Patent: Dec. 7, 1999

[54] DYNAMIC RANDOM-ACCESS MEMORY HAVING A HIERARCHICAL DATA PATH

[75] Inventors: Adrian Ong; Paul S. Zagar; Troy Manning; Brent Keeth; Ken Waller, all of Boise, Id.

[73] Assignee: Micron Technology, Inc., Boise, Id.

[21] Appl. No.: 09/167,259

[22] Filed: Oct. 6, 1998

Related U.S. Application Data

[63] Continuation of application No. 08/869,035, Jun. 5, 1997, which is a continuation of application No. 08/420,943, Apr. 5, 1995, abandoned.

[51] Int. Cl.[6] .................... G11C 8/00

[52] U.S. Cl. .................... 365/230.06; 365/230.03

[58] Field of Search .................... 365/189.01, 230.06, 365/230.03, 230.02

[56] References Cited

U.S. PATENT DOCUMENTS

| | | | |
|---|---|---|---|
| 5,416,748 | 5/1995 | Fujita | 365/230.03 |
| 5,517,442 | 5/1996 | Kirihata et al. | 365/230.03 |
| 5,521,877 | 5/1996 | Aimoto | 365/230.03 |
| 5,570,320 | 10/1996 | Runas | 365/230.03 |
| 5,586,078 | 12/1996 | Takase et al. | 365/230.03 |

*Primary Examiner*—Tan T. Nguyen

*Attorney, Agent, or Firm*—Arnold, White, & Durkee

[57] ABSTRACT

A semiconductor dynamic random-access memory (DRAM) device embodying numerous features that collectively and/or individually prove beneficial and advantageous with regard to such considerations as density, power consumption, speed, and redundancyis disclosed. The device is a 64 Mbit DRAM comprising eight substantially identical 8 Mbit partial array blocks (PABs), each pair of PABs comprising a 16 Mbit quadrant of the device. Between the top two quadrants and between the bottom two quadrants are column blocks containing I/O read/write circuitry, column redundancy fuses, and column decode circuitry. Column select lines originate from the column blocks and extend right and left across the width of each quadrant. Each PAB comprises eight substantially identical 1Mbit sub-array blocks (SABs). Associated with each SAB are a plurality of local row decoder circuits functioning to receive partially decoded row addresses from a column predecoder circuit and generating local row addresses supplied to the SAB with which they are associated. A hierarchical data path is provided wherein a plurality of multiplexers are distributed throughout each SAB, these multiplexers functioning to selectively couple sense amplifier output signals to local data I/O lines associated with each SAB. In one embodiment, the data path multiplexers are physically disposed within gaps defined by adjacent ones of the local row address decoders distributed throughout each SAB.

2 Claims, 297 Drawing Sheets

ROW REDUNDANT LASER FUSES

| ROW PREDEC. ADDRESS | BLOW LASER FUSE | | | |
|---|---|---|---|---|
| RA12<0> | X0 | **X1** | **X2** | **X3** |
| RA12<1> | **X0** | X1 | **X2** | **X3** |
| RA12<2> | **X0** | **X1** | X2 | **X3** |
| RA12<3> | **X0** | **X1** | **X2** | X3 |
| RA34<0> | X0 | **X1** | **X2** | **X3** |
| RA34<1> | **X0** | X1 | **X2** | **X3** |
| RA34<2> | **X0** | **X1** | X2 | **X3** |
| RA34<3> | **X0** | **X1** | **X2** | X3 |
| RA56<0> | X0 | **X1** | **X2** | **X3** |
| RA56<1> | **X0** | X1 | **X2** | **X3** |
| RA56<2> | **X0** | **X1** | X2 | **X3** |
| RA56<3> | **X0** | **X1** | **X2** | X3 |
| RA78<0> | X0 | **X1** | **X2** | **X3** |
| RA78<1> | **X0** | X1 | **X2** | **X3** |
| RA78<2> | **X0** | **X1** | X2 | **X3** |
| RA78<3> | **X0** | **X1** | **X2** | X3 |
| EVEN | X0 | **X1** | **X2** | **X3** |
| ODD | **X0** | X1 | **X2** | **X3** |
| RA_11<0> | **X0** | **X1** | X2 | **X3** |
| RA_11<1> | **X0** | **X1** | **X2** | X3 |
| RA910<0> | X0 | **X1** | **X2** | **X3** |
| RA910<1> | **X0** | X1 | **X2** | **X3** |
| RA910<2> | **X0** | **X1** | X2 | **X3** |
| RA910<3> | **X0** | **X1** | **X2** | X3 |

NOTE: BOXED FUSES ARE THE 'BLOWN' FUSES.

PRETEST ADDRESS

| BLOCK | | ROW ADDRESS |
|---|---|---|
| RO | R8 | 4,5,6,7 |
| R1 | R9 | 1016,1017,1018,1019 |
| R2 | R10 | 1028,1029,1030,1031 |
| R3 | R11 | 2040.2041,2042,2043 |
| R4 | R12 | 2052,2053,2054,2055 |
| R5 | R13 | 3064,3065,3066,3067 |
| R6 | R14 | 3076,3077,3078,3079 |
| R7 | R15 | 4088,4089,4090,4091 |

(COMPRESSED TO 8 MEG BLOCK; UNSCRAMBLED ADDRESSES)

FIG. 11

COLUMN REDUNDANT LASER FUSES

| COL PREDEC. ADDRESS | BLOW LASER FUSE |
|---|---|
| CA23<0> | NONE |
| CA23<1> | X2 |
| CA23<2> | X3 |
| CA23<3> | X2,X3 |
| CA45<0> | NONE |
| CA45<1> | X4 |
| CA45<2> | X5 |
| CA45<3> | X4,X5 |
| CA67<0> | NONE |
| CA67<1> | X6 |
| CA67<2> | X7 |
| CA67<3> | X6,X7 |
| CA8<0> | NONE |
| CA8<1> | X8 |

PRETEST ADDRESS

| BANK | ROW ADDRESS | | | | | | |
|---|---|---|---|---|---|---|---|
| | A8 | A7 | A6 | A5 | A4 | A3 | A2 |
| RO | 0 | 0 | 0 | 0 | 1 | 1 | 1 |
| R1 | 0 | 0 | 0 | 0 | 1 | 1 | 0 |
| R2 | 0 | 0 | 0 | 0 | 1 | 0 | 1 |
| R3 | 0 | 0 | 0 | 0 | 1 | 0 | 0 |
| R4 | 0 | 0 | 0 | 0 | 0 | 0 | 0 |
| R5 | 0 | 0 | 0 | 0 | 0 | 0 | 1 |
| R6 | 0 | 0 | 0 | 0 | 0 | 1 | 0 |
| R7 | NA | NA | NA | NA | NA | NA | NA |

FIG. 12

| | | |
|---|---|---|
| FIG. 13A | FIG. 13C | FIG. 13E |
| FIG. 13B | FIG. 13D | FIG. 13F |

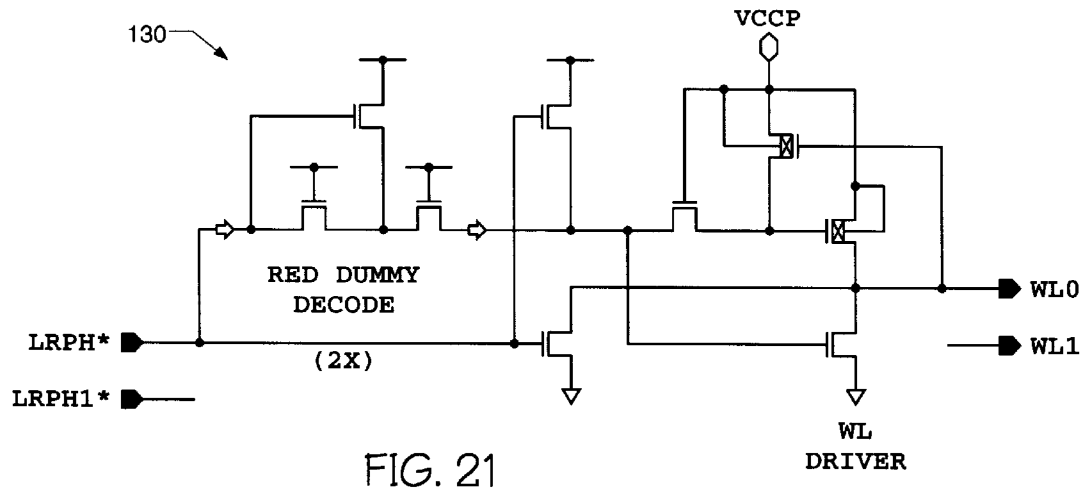

FIG. 21

LASER/ELECTRICAL FUSE OPTIONS

OPT4KREF

| | |
|---|---|
| NOT BLOWN | 8K REFRESH |
| BLOWN | 4K REFRESH |

OPTFAST

| | |
|---|---|
| NOT BLOWN | SLOW |
| BLOWN | FAST |

OPTS

| | |
|---|---|
| NOT BLOWN | FAST-PAGE |
| BLOWN | STATIC COLUMN |

ROWRED

| | |
|---|---|
| NOT BLOWN | NOT USED |
| BLOWN | NOT USED |

COLRED

| | |
|---|---|
| NOT BLOWN | FAST EQIO/EQSA |
| BLOWN | SLOW EQIO/EQSA |

| OPTSRB | OPTSRA | REF RATE |
|---|---|---|
| NOT BLOWN | NOT BLOWN | 128 ms |
| NOT BLOWN | BLOWN | 192 ms |
| BLOWN | NOT BLOWN | 256 ms |
| BLOWN | BLOWN | 64 ms |

| ENTOPO | OPTSRA |
|---|---|
| NOT BLOWN | DATA TOPO ON |
| BLOWN | DATA TOPO OFF |

BONDING OPTIONS

| XOPTA | XOPTB | |
|---|---|---|
| NO | NO | OPTX16 |
| NO | VCC | OPTX8 |
| VCC | NO | OPTX4 |
| VCC | VCC | OPTX1 |

| OPTEDO | |
|---|---|
| NO | NO EDO |
| VSS | EDO |

| OPTION FUSE | OPTION FUSE SELECT ADDR A10 | A9 | A8 | A7 | A6 | A5 |
|---|---|---|---|---|---|---|
| OPT4KREF | 1 | 1 | 1 | 0 | 0 | 0 |
| OPTS | 1 | 1 | 1 | 0 | 0 | 1 |
| OPTFAST | 1 | 1 | 1 | 0 | 1 | 0 |
| ROWRED | 1 | 1 | 1 | 0 | 1 | 1 |
| COLRED | 1 | 1 | 1 | 1 | 0 | 0 |
| OPTSRA | 1 | 1 | 1 | 1 | 0 | 1 |
| OPTSRB | 1 | 1 | 1 | 1 | 1 | 0 |
| ENTOPO | 1 | 1 | 1 | 1 | 1 | 1 |

FIG. 22

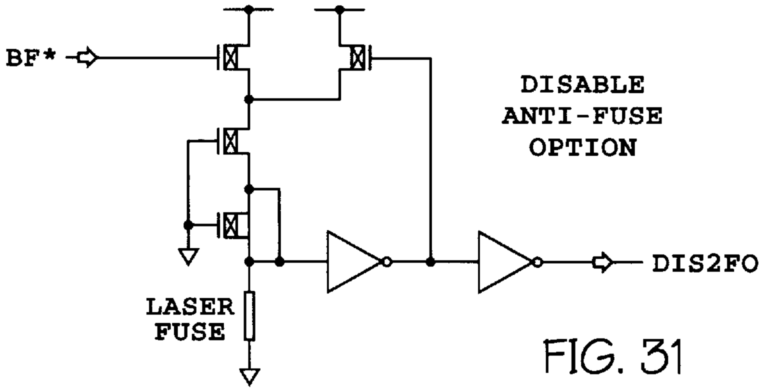
FIG. 31
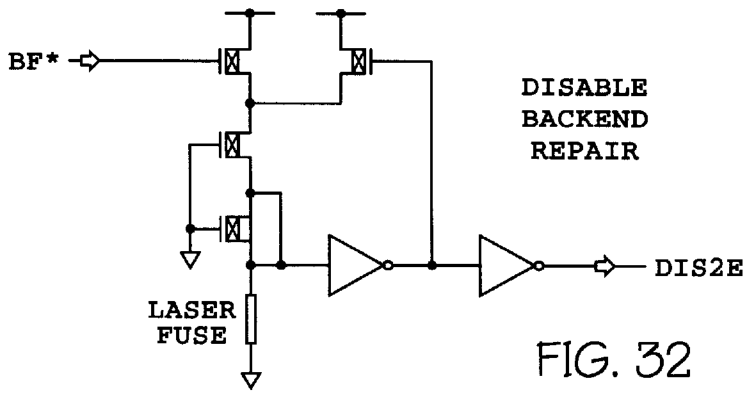
FIG. 32
8 MEG ARRAY ICC-STANDBY TEST
| A1 | A8 | A7 | SIGNAL DE-ACTIVATED | ARRAY SECTION ENABLED (REF TO X4) |
|---|---|---|---|---|
| 0 | 0 | 0 | D8ML*<0> | LEFT DQ0 |
| 0 | 0 | 1 | D8MR*<0> | RIGHT DQ0 |
| 0 | 1 | 0 | D8ML*<1> | LEFT DQ1 |
| 0 | 1 | 1 | D8MR*<1> | RIGHT DQ1 |
| 1 | 0 | 0 | D8ML*<2> | LEFT DQ2 |
| 1 | 0 | 1 | D8MR*<2> | RIGHT DQ2 |
| 1 | 1 | 0 | D8ML*<3> | LEFT DQ3 |
| 1 | 1 | 1 | D8MR*<3> | RIGHT DQ3 |
FIG. 33
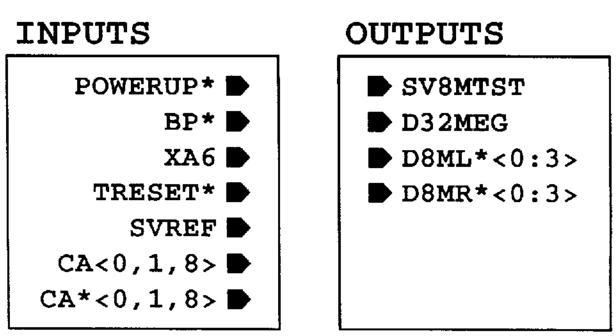
FIG. 34

ENSA/EPSA CONTROL

TEST MODE ADDRESS KEYS

| A1 | A0 | A6 | A5 | A4 | A3 | A2 | TEST MODE |
|---|---|---|---|---|---|---|---|
| - | - | - | - | 0 | 0 | 0 | NO TEST |
| - | - | - | - | 0 | 0 | 1 | 16X TEST |
| - | - | - | - | 0 | 1 | 0 | 32X TEST |
| - | - | - | - | 0 | 1 | 1 | 64X TEST |
| - | - | - | - | 1 | 0 | 0 | FUSE ID |
| - | - | - | - | 1 | 0 | 1 | DISABLE DVC2 WITH ALL ROWS HIGH |
| - | - | - | - | 1 | 1 | 0 | DISABLE REDUNDANT ELEMENT |
| - | - | - | - | 1 | 1 | 1 | DISABLE DATA TOPO |
| - | 0 | 0 | 0 | - | - | - | NO TEST |
| - | 0 | 0 | 1 | - | - | - | ROW REDUNDANT ELEMENT PRTEST |
| - | 0 | 1 | 0 | - | - | - | COLUMN REDUNDANT ELEMENT PRTEST |
| - | 0 | 1 | 1 | - | - | - | ANTI-FUSE STRESS TEST |
| - | 1 | 0 | 0 | - | - | - | TEST DATA COMPRESSION |
| - | 1 | 0 | 1 | - | - | - | 4K REFRESH (OTHERWISE 8K REF) |
| - | 1 | 1 | 0 | - | - | - | DISABLE RAS/CAS LOCKOUT |
| - | 1 | 1 | 1 | - | - | - | SELF REFRESH TEST |
| 0 | - | - | - | - | - | - | JEDEC TEST MODE |
| 1 | - | - | - | - | - | - | MICRON TEST MODE |

FIG. 61

SUPERVOLTAGE AND BACKEND PROGRAMMING INPUTS

| INPUT PAD | DESCRIPTION OF USAGE | PAGE |
|---|---|---|
| A0 | GENERATES PRGCANR (ONLY IF SVPRG IS HIGH) | 8 |
| A1 | GENERATES PRGCANC (ONLY IF SVPRG IS HIGH) | 8 |
| A2 | GENERATES PRGR (ONLY IF SVPRG IS HIGH) | 8 |
| A3 | GENERATES PRGC (ONLY IF SVPRG IS HIGH) | 8 |
| A4 | SUPERVOLTAGE - NOT USED | 4A |
| A5 | SUPERVOLTAGE - SELF REFRESH TEST | 7 |
| A6 | SUPERVOLTAGE - 8 MEG ICC TEST | 4B |
| A7 | SUPERVOLTAGE - WCBR | 7 |
| A10 | ANTI-FUSE PROGRAMMING VOLTAGE | 8 |
| A11 | SUPERVOLTAGE - ELECT FUSE PROGRAM SVPRG | 8 |
| WE | SUPERVOLTAGE - GROUND VBB | 7 |

FIG. 62

JEDEC/MICRON TESTMODE
| READ DATA | OUTPUT | |
|---|---|---|
| | JEDEC | MICRON |
| ALL 0'S | 1 | 0 |
| ALL 1'S | 1 | 1 |
| DIFFERENT | 0 | TRISTATE |
FIG. 63
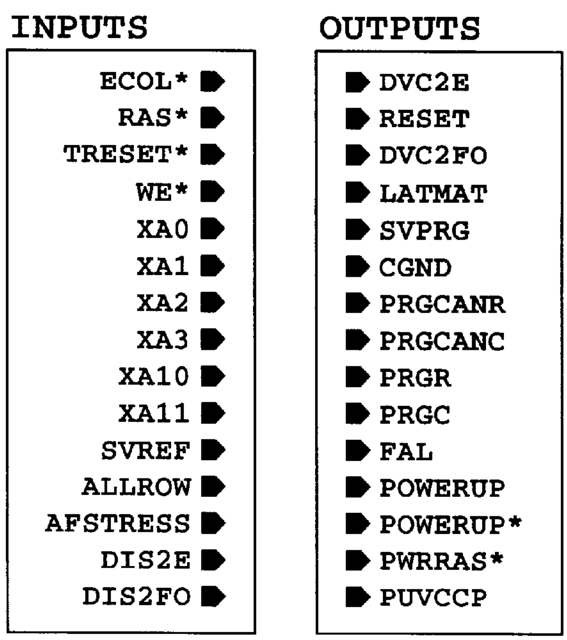
FIG. 64
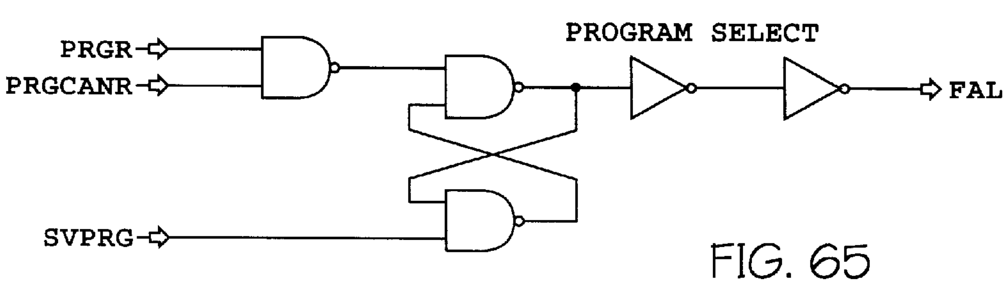
FIG. 65

| FIG. 66A | FIG. 66B | FIG. 66C |
|---|---|---|

| | | |
|---|---|---|
| FIGURE 83A | FIGURE 83B | FIGURE 83C |
| FIGURE 83D | FIGURE 83E | FIGURE 83F |

FIG. 83

| | | |
|---|---|---|
| FIGURE 84A | FIGURE 84B | FIGURE 84C |
| FIGURE 84D | FIGURE 84E | FIGURE 84F |

FIG. 84

| CONFIG | ROW ADDRESS 8K REF | ROW ADDRESS 4K REF | COLUMN ADDRESS 8K REF | COLUMN ADDRESS 4K REF |
|---|---|---|---|---|
| 4M X 16 | A0 - A12 | A0 - A11 | A0 - A8 | A0 - A9 |
| 8M X 8 | A0 - A12 | A0 - A11 | A0 - A9 | A0 - A10 |
| 16M X 4 | A0 - A12 | A0 - A11 | A0 - A10 | A0 - A11 |
| 64M X 1 | A0 - A12 | - | A0 - A11 | - |

| TEST MODE ADDRESS COMPRESSION (REF TO X1) THE FOLLOWING COLUMN ADDRESSES ARE IGNORED | |
|---|---|
| 16X | A12, A11, A10, A9 |
| 32X | A12, A11, A10, A9, A8 |
| 64X | A12, A11, A10, A9, A8, A7 |
| 128X | A12, A11, A10, A9, A8, A7, RA12 |

FIG. 88

INPUTS

X8/X16 DQ PADS
(DQ4 DQ5 DQ6 DQ7 DQ8 DQ9 DQ10 DQ11)

| ASSEMBLY PIN-OUT | SCHEMATIC PIN-OUT | BOND PAD PDQ | DW | DR/DR* |
|---|---|---|---|---|
| DQ1 | DQ0 | 0<br>1 | 0<br>1 | 0, 1<br>0, 1 |
| DQ2 | DQ1 | 2<br>3 | 2<br>3 | 2, 3<br>2, 3 |
| DQ3 | DQ2 | 4<br>5 | 4<br>5 | 4, 5<br>4, 5 |
| DQ4 | DQ3 | 6<br>7 | 6<br>7 | 6, 7<br>6, 7 |
| DQ5 | DQ4 | 8<br>9 | 8<br>9 | 8, 9<br>8, 9 |
| DQ6 | DQ5 | 10<br>11 | 10<br>11 | 10, 11<br>10, 11 |
| DQ7 | DQ6 | 12<br>13 | 12<br>13 | 12, 13<br>12, 13 |
| DQ8 | DQ7 | 14<br>15 | 14<br>15 | 14, 15<br>14, 15 |

X4 CONFIGURATION

| ASSEMBLY PIN-OUT | SCHEMATIC PIN-OUT | BOND PAD PDQ | DATA WRITE DW | DATA READ DR/DR* |
|---|---|---|---|---|
| DQ1 | DQ0 | 0 | 0,4,5 | 0,1,4,5 |
| | | 1 | 1 | 0,1,4,5 |
| DQ2 | DQ1 | 2 | 2,6,7 | 2,3,6,7 |
| | | 3 | 3 | 2,3,6,7 |
| DQ3 | DQ2 | 12 | 12 | 8,9,12,13 |
| | | 13 | 13,8,9 | 8,9,12,13 |
| DQ4 | DQ3 | 14 | 14 | 10,11,14,15 |
| | | 15 | 15,10,11 | 10,11,14,15 |

X1 CONFIGURATION

| DR/DR* | BOND PAD PDQ | ASSEMBLY PIN-OUT |
|---|---|---|
| DRn<0> | PDQ0 | (DOUT) |
| DRn<1> | | |
| DRn<2> | | |
| DRn<3> | | |

FIG. 178

DQ COMPRESSION
| DR/DW | PDQ | X8 DQ | X16 DQ |
|---|---|---|---|
| 0,1,4,5 | 0,1 | 0 | 0 |
| 2,3,6,7 | 2,3 | 1 | 2 |
| 8,9,12,13 | 12,13 | 6 | 13 |
| 10,11,14,15 | 14,15 | 7 | 15 |
FIG. 179
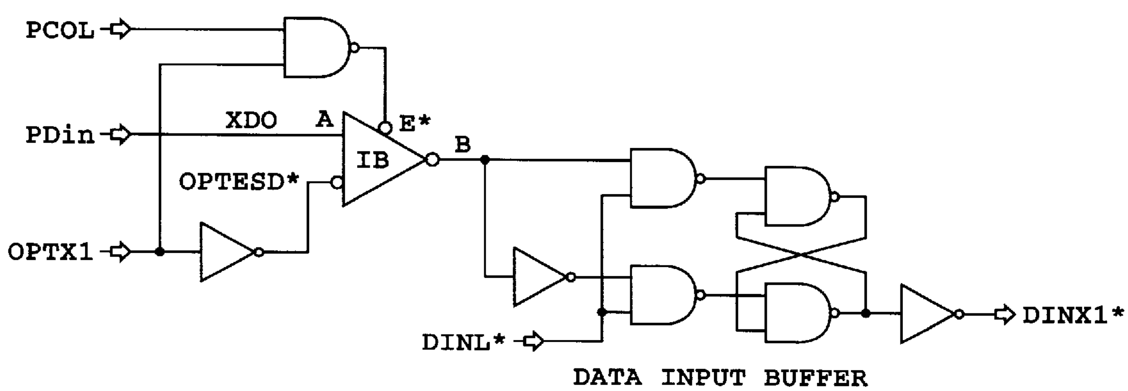
FIG. 180
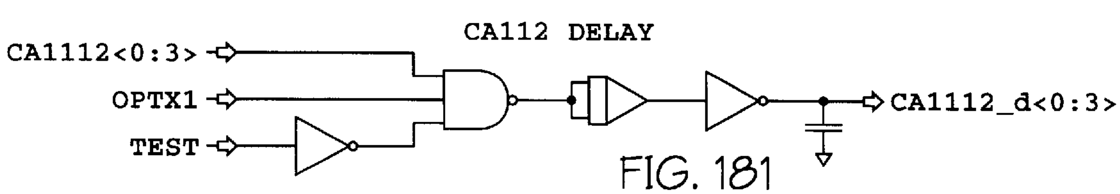
FIG. 181

| FIG. 194A | FIG. 194B |
| --- | --- |

| CONFIG | ROW ADDRESS | | | |
|---|---|---|---|---|
| | 8K REFRESH | 4K REFRESH | 8K REFRESH | 4K REFRESH |
| 4M X 16 | A0 - A12 | A0 - A11 | A0 - A8 | A0 - A9 |
| 8M X 8 | A0 - A12 | A0 - A11 | A0 - A9 | A0 - A10 |
| 16M X 4 | A0 - A12 | — | A0 - A10 | A0 - A11 |
| 64M X 1 | A0 - A12 | — | A0 - A12 | — |

FIG. 204

| CONFIG | TEST MODE ADDRESS COMPRESSION (REF TO X1)<br>THE FOLLOWING COLUMN ADDRESSES ARE IGNORED |
|---|---|
| 16X | A12, A11, A10, A9 |
| 32X | A12, A11, A10, A9, A8 |
| 64X | A12, A11, A10, A9, A8, A7 |
| 128X | A12, A11, A10, A9, A8, A7, PLUS ROW ADDRESS A12 |

FIG. 205

DQ CONFIGURATION

| CA9 10<2> (X16) | CA9 10<2> (X8) | CA9 10<2> (X4) | CA9 10<1> (X16) | CA9 10<1> (X8) | CA9 10<1> (X4) | (X1) |
|---|---|---|---|---|---|---|
| DQ5 | DQ2 | DQ0 | DQ4 | DQ2 | DQ0 | CA1112<0> |
| DQ7 | DQ3 | DQ1 | DQ6 | DQ3 | DQ1 | CA1112<1> |
| DQ13 | DQ6 | DQ2 | DQ12 | DQ6 | DQ2 | CA1112<2> |
| DQ15 | DQ7 | DQ3 | DQ14 | DQ7 | DQ3 | CA1112<3> |

| CA910<0> | | | CA910<1> | | | |
|---|---|---|---|---|---|---|
| DQ10 | DQ5 | DQ3 | DQ11 | DQ5 | DQ3 | CA1112<3> |
| DQ8 | DQ4 | DQ2 | DQ9 | DQ4 | DQ2 | CA1112<2> |
| DQ2 | DQ1 | DQ1 | DQ3 | DQ1 | DQ1 | CA1112<1> |
| DQ0 | DQ0 | DQ0 | DQ1 | DQ0 | DQ0 | CA1112<0> |

FIG. 206

X8 CONFIGURATION

| ASSEMBLY PIN-OUT | SCHEMATIC PIN-OUT | BOND PAD PDQ | DW | DR/DR* |
|---|---|---|---|---|
| DQ1 | DQ0 | 0<br>1 | 0<br>1 | 0, 1<br>0, 1 |
| DQ2 | DQ1 | 2<br>3 | 2<br>3 | 2, 3<br>2, 3 |
| DQ3 | DQ2 | 4<br>5 | 4<br>5 | 4, 5<br>4, 5 |
| DQ4 | DQ3 | 6<br>7 | 6<br>7 | 6, 7<br>6, 7 |
| DQ5 | DQ4 | 8<br>9 | 8<br>9 | 8, 9<br>8, 9 |
| DQ6 | DQ5 | 10<br>11 | 10<br>11 | 10,11<br>10,11 |
| DQ7 | DQ6 | 12<br>13 | 12<br>13 | 12,13<br>12,13 |
| DQ8 | DQ7 | 14<br>15 | 14<br>15 | 14,15<br>14,15 |

FIG. 207

X4 CONFIGURATION

| ASSEMBLY PIN-OUT | SCHEMATIC PIN-OUT | BOND PAD PDQ | DATA WRITE DW | DATA READ DR/DR* |
|---|---|---|---|---|
| DQ1 | DQ0 | 0 | 0,4,5 | 0,1,4,5 |
| | | 1 | 1 | 0,1,4,5 |
| DQ2 | DQ1 | 2 | 2,6,7 | 2,3,6,7 |
| | | 3 | 3 | 2,3,6,7 |
| DQ3 | DQ2 | 12 | 12 | 8,9,12,13 |
| | | 13 | 13,8,9 | 8,9,12,13 |
| DQ4 | DQ3 | 14 | 14 | 10,11,14,15 |
| | | 15 | 15,10,11 | 10,11,14,15 |

X1 CONFIGURATION

| DR/DR* | BOND PAD PDQ | ASSEMBLY PIN-OUT |
|---|---|---|
| DRn<0> | PDQ0 | (DOUT) |
| DRn<1> | | |
| DRn<2> | | |
| DRn<3> | | |

FIG. 208

DQ COMPRESSION

| DR/DW | X8 CONFIG PDQ | X8 CONFIG ASSEM DQ | X16 CONFIG PDQ | X16 CONFIG ASSEM DQ |
|---|---|---|---|---|
| 0,1,4,5 | 0,1 | 1 | 0 | 1 |
| 2,3,6,7 | 2,3 | 2 | 2 | 3 |
| 8,9,12,13 | 12,13 | 7 | 13 | 14 |
| 10,11,14,15 | 14,15 | 8 | 15 | 16 |

FIG. 209

ADDRESS COMPRESSION

| CONFIG | ROW ADDRESS 8K REF | ROW ADDRESS 4K REF | COLUMN ADDRESS 8K REF | COLUMN ADDRESS 4K REF |
|---|---|---|---|---|
| 4M X 16 | A0-A12 | A0-A11 | A0-A8 | A0-A9 |
| 8M X 8 | A0-A12 | A0-A11 | A0-A9 | A0-A10 |
| 16M X 4 | A0-A12 | A0-A11 | A0-A10 | A0-A11 |
| 64M X 1 | A0-A12 | - | A0-A12 | - |

FIG. 210

| TEST MODE ADDRESS COMPRESSION (REF TO X1) THE FOLLOWING COLUMN ADDRESSES ARE IGNORED | |
|---|---|
| 16X | A12, A11, A10, A9 |
| 32X | A12, A11, A10, A9, A8 |
| 64X | A12, A11, A10, A9, A8, A7 |
| 128X | A12, A11, A10, A9, A8, A7, RA12 |

FIG. 211

| | RA8=0 | | | | TWIST | RA8=1 | | | |
|---|---|---|---|---|---|---|---|---|---|
| RA0 | 0 | 1 | 0 | 1 | | 0 | 1 | 0 | 1 |
| RA1 | 0 | 0 | 1 | 1 | | 0 | 0 | 1 | 1 |
| | R512 | R513 | R514 | R515 | | R768 | R769 | R770 | R771 |
| CA2=0 | D1 1 | D0 1 | D0 1 | D1 1 | | D0 0 | D1 1 | D1 1 | D0 0 |
| | D0 0 | D1 0 | D1 0 | D0 0 | | D1 0 | D0 1 | D0 1 | D1 0 |
| | D3 1 | D2 1 | D2 1 | D3 1 | | D2 0 | D3 1 | D3 1 | D2 0 |
| | D2 0 | D3 0 | D3 0 | D2 0 | | D3 0 | D2 1 | D2 1 | D3 0 |
| CA2=1 | D3 0 | D2 0 | D2 0 | D3 0 | | D2 1 | D3 0 | D3 0 | D2 1 |
| | D2 1 | D3 1 | D3 1 | D2 1 | | D3 1 | D2 0 | D2 0 | D3 1 |
| | D1 0 | D0 0 | D0 0 | D1 0 | | D0 1 | D1 0 | D1 0 | D0 1 |
| | D0 1 | D1 1 | D1 1 | D0 1 | | D1 1 | D0 0 | D0 0 | D1 1 |

FIG. 220

| SAB0 | | | | | | | | |
|---|---|---|---|---|---|---|---|---|
| OPERATION TYPE | | | SELECTION CONTROL | | | | | |
| | | | INPUT | | | OUTPUT | | |
| PRIMARY ROW TO FIRE? | REDUNDANT ROW IN SAB0? | PRIMARY ADDRESS IN SAB0? | PRIMARY ADDRESS LINES | ONE OF $\overline{REDPH0}$- $\overline{REDPH3}$ | $\overline{RBO}$ | ELBK | LENPH | RED |
| YES | | YES | 1 | 1 | 1 | 1 | 1 | 0 |
| | | NO | 0 | 1 | 1 | 0 | 0 | 0 |
| NO | YES | YES | 1 | 0 | 0 | 1 | 1 | 1 |
| | | NO | 0 | 0 | 0 | 1 | 1 | 1 |
| | YES | YES | 1 | 0 | 1 | 0 | 0 | 0 |
| | | NO | 0 | 0 OR 1* | 1 | 0 | 0 | 0 |

*DEPENDING ON WHETHER REDUNDANT ROW IN ANOTHER SAB IS TO FIRE

FIG. 225

ROW ANTIFUSE SELECTION WITHIN EACH BANK

| FUSE SELECTION ADDRESS A4 | A3 | A2 | A1 | REPAIR ADDRESS=1 |
|---|---|---|---|---|
| 0 | 0 | 0 | 0 | A1 |
| 0 | 0 | 0 | 1 | A2 |
| 0 | 0 | 1 | 0 | A3 |
| 0 | 0 | 1 | 1 | A4 |
| 0 | 1 | 0 | 0 | A5 |
| 0 | 1 | 0 | 1 | A6 |
| 0 | 1 | 1 | 0 | A7 |
| 0 | 1 | 1 | 1 | A8 |
| 1 | 0 | 0 | 0 | A9 |
| 1 | 0 | 0 | 1 | A10 |
| 1 | 0 | 1 | 0 | A0 |
| 1 | 0 | 1 | 1 | A11 |
| 1 | 1 | 0 | 0 | ENABLE BANK |
| 1 | 1 | 0 | 1 | - |
| 1 | 1 | 1 | 0 | - |
| 1 | 1 | 0 | 1 | - |

ANTI-FUSE NOT BLOWN, ADDRESS=0
ANTI-FUSE BLOWN, ADDRESS=1

FIG. 232

ROW FUSEBANK ENABLE SELECTION

| ROW FUSEBANK | FUSEBANK SELECTION ADDRESS A10 | A9 | A8 | A7 | A6 | A5 |
|---|---|---|---|---|---|---|
| R0 | | | 0 | 0 | 0 | 0 |
| R1 | | | 0 | 0 | 0 | 1 |
| R2 | | | 0 | 0 | 1 | 0 |
| R3 | | | 0 | 0 | 1 | 1 |
| R4 | | | 0 | 1 | 0 | 0 |
| R5 | | | 0 | 1 | 0 | 1 |
| R6 | | | 0 | 1 | 1 | 0 |
| R7 | | | 0 | 1 | 1 | 1 |
| R8 | | | 1 | 0 | 0 | 0 |
| R9 | | | 1 | 0 | 0 | 1 |
| R10 | | | 1 | 0 | 1 | 0 |
| R11 | | | 1 | 0 | 1 | 1 |
| R12 | | | 1 | 1 | 0 | 0 |
| R13 | | | 1 | 1 | 0 | 1 |
| R14 | | | 1 | 1 | 1 | 0 |
| R15 | | | 1 | 1 | 1 | 1 |
| LEFT | 0 | 0 | | | | |
| RIGHT | 0 | 1 | | | | |

FIG. 233

COLUMN ANTIFUSE SELECTION WITHIN EACH BANK

| FUSE SELECTION ADDRESS A1 | A0 | A6 | REPAIR ADDRESS=1 |
|---|---|---|---|
| 0 | 0 | 1 | A2 |
| 0 | 0 | 0 | A3 |
| 0 | 1 | 1 | A4 |
| 0 | 1 | 0 | A5 |
| 1 | 0 | 1 | A6 |
| 1 | 0 | 0 | A7 |
| 1 | 1 | 0 | A8 |
| 1 | 1 | 1 | BANK ENABLE |

FIG. 234

COLUMN FUSEBANK ENABLE SELECTION

| COLUMN FUSEBANK | FUSEBANK SELECTION ADDRESS A10 | A9 | A8 | A7 |
|---|---|---|---|---|
| C0 | 0 | 0 | 0 | 0 |
| C1 | 0 | 0 | 0 | 1 |
| C2 | 0 | 0 | 1 | 0 |
| C3 | 0 | 0 | 1 | 1 |
| C4 | 0 | 1 | 0 | 0 |
| C5 | 0 | 1 | 0 | 1 |
| C6 | 0 | 1 | 1 | 0 |
| C7 | 0 | 1 | 1 | 1 |
| C8 | 1 | 0 | 0 | 0 |
| C9 | 1 | 0 | 0 | 1 |
| C10 | 1 | 0 | 1 | 0 |
| C11 | 1 | 0 | 1 | 1 |
| C12 | 1 | 1 | 0 | 0 |
| C13 | 1 | 1 | 0 | 1 |
| C14 | 1 | 1 | 1 | 0 |
| C15 | 1 | 1 | 1 | 1 |

FIG. 235

DYNAMIC RANDOM-ACCESS MEMORY HAVING A HIERARCHICAL DATA PATH

This is a continuation of co-pending application Ser. No. 08/869,035 filed Jun. 5, 1997, which was a continuation of application Ser. No. 08/420,943, filed Apr. 5, 1995 now abandoned.

RELATED APLICATIONS

This application relates to subject matter that is also the subject of the following U.S. Patents: U.S. Pat. No. 5,311,481 to Casper et al. entitled "Wordline Driver Circuit Having a Directly Gated Pull-Down Device;" U.S. Pat. No. 5,293,342 to Casper et al., entitled "Wordline Driver Circuit Having an Automatic Precharge Circuit;" U.S. Pat. No. 5,162,248 to Dennison et al., entitled "Optimized Container Stacked Capacitor DRAM Cell Utilizing Sacrificial Oxide Deposition and Chemical Mechanical Polishing;" U.S. Pat. No. 5,270,241 to Dennison et al., entitled "Optimized Container Stacked Capacitor Cell Utilizing Sacrificial Oxide Deposition and Chemical Mechanical Polishing;" U.S. Pat. No. 5,229,326 to Dennison et al. entitled "Method for Making Electrical Contact With An Active Area Through Submicron Contact Openings and a Semiconductor Device;" U.S. Pat. No. 5,340,763 to Dennison, entitled Multi Pin Stacked Capacitor and Process to Fabricate Same-;"and U.S. Pat. No. 5,340,765 to Dennison et al., entitled "Enhanced Capacitance Stacked Capacitor Using Hemi-spherical Grain Polysilicon."

This application also relates to subject matter which is the subject of the following co-pending patent applications: U.S. patent application Ser. No. 08/315,154 filed on Sep. 29, 1994 in the name of Adrian Ong, entitled "A High Speed Global Row Redundancy System;" U.S. patent application Ser. No. 08/275,890 filed on Jul. 15, 1994 in the name of Adrian Ong et al., entitled "Sense Circuit for Tracking Charge Transfer Through Access Transistor in a Dynamic Random Access Memory;" U.S. patent application Ser. No. 08/311,582 filed on Sep. 22, 1994 in the name of Adrian Ong et al., entitled "Memory Integrated Circuits Having On-Chip Topology Logic Driver, and Methods for Testing and Producing Such Memory Integrated Circuits;" U.S. patent application Ser. No. 08/238,972 filed on May 5, 1994 in the name of Manning et al., entitled "NMOS Output Buffer Having a Controlled High-Level Output;" U.S. patent application Ser. No. 08/325,766 filed on Oct. 19, 1994 in the name of Paul Zagar et al., entitled "An Efficient Method for Obtaining Usable Parts from a Practically Good Memory Integrated Circuit;" and U.S. patent application Ser. No. 08/164,163 filed on Dec. 6, 1993 filed in the name of Troy Manning, entitled "System Powered with Inter-Coupled Charge Pumps."

FIELD OF THE INVENTION

This invention relates to the field of semiconductor devices, and more particularly relates to a high-density semiconductor random-access memory.

BACKGROUND OF THE INVENTION

A variety of semiconductor-based dynamic random-access memory devices are known and/or commercially available. The above-referenced '154, '890, '582, '972, and '766 applications and '481, '342, '248, '241, '326, '763, and '765 patents each relate to and describe in some detail how various aspects of semiconductor memory device technology have been and will continue to be crucial to the continued progress in the field of computing in general, and to the accessibility to and applicability of computer technology in particular.

Advances in the field of physical and structural aspects of semiconductor technology, for example various developments which have reduced the minimum practical size of semiconductor structures to well within the sub-micron range, have proven greatly beneficial in increasing the speed, capacity and/or capability of state-of-the-art semiconductor devices. Notwithstanding such advances, however, certain logical and algorithmical considerations must still be addressed.

In fact, some advances in semiconductor processing technology in some sense make it particularly important, in some cases imperative, that certain logical or algorithmical compensatory measures be taken in the designing of semiconductor devices.

For designers and manufacturers of semiconductor devices in general, and for semiconductor memory devices in particular, there are numerous considerations which must be addressed. Certain aspects of semiconductor memory design become even more critical as their speed and density is increased and their size is decreased. The present invention is directed to a memory device in which various design considerations are taken into account in such a manner as to yield numerous beneficial results, including speed and density maximization, size and power consumption minimization, enhanced reliability, and improved yield, among others.

Memory integrated circuits (ICs) have a memory array of millions of memory cells used to store electrical charges indicative of binary data. The presence of an electrical charge in a memory cell typically equates to a binary "1" value and the absence of an electrical charge typically equates to a binary "0" value. The memory cells are accessed via address signals on row and column lines. Once accessed, data is written to or read from the addressed memory cell via digit or bit lines. One important consideration in the design of semiconductor memory devices relates to the arrangement of memory cells, row lines, and column lines in a particular layout or configuration, commonly referred to as the device's "topology". Circuit topologies vary considerably among variously designed memory ICs.

One common design found in many memory circuit topologies is the "folded bit line" structure. In a folded bit line construction, the bit lines are arranged in pairs with each pair being assigned to complementary binary signals. For example, one bit line in the pair is dedicated to a binary signal DATA and the other bit line is dedicated to handle the complementary binary signal DATA*. (The asterisk notation "*" is used throughout this disclosure to indicate the binary complement of a signal or data value.)

The memory cells are connected to either of the bit lines in the folded pair. During read and write operations, the bit lines are driven to opposing voltage levels depending upon the data content being written to or read from the memory cell. The following example describes a read operation of a memory cell holding a charge indicative of a binary '1": The voltage potential of both bit lines in the pair is first equalized to a middle voltage level, for example, 2.5 volts. Then, the addressed memory cell is accessed and the charge held therein is transferred to one of the bit lines, raising the voltage of that bit line slightly above that line's counterpart in the pair. A sense amplifier, or similar circuit, senses the voltage differential on the bit line pair and further increases this differential by increasing the voltage on the first bit line to, say, 5 volts, and decreasing the voltage on the second bit line to, say, 0 volts. The folded bit lines thereby output the data in complementary form.

One variation on the folded bit line structure is a so-called "twisted" bit line structure. FIG. 1 illustrates a twisted bit line structure having bit line pairs D0/D0* through D3/D3* that flip or twist at junctions 1 across the array. Memory cells are coupled to the bit line pairs throughout the array. Representative memory cells 2*a* through 2*n* and 3*a* through 3*n* are represented in FIG. 1 coupled to bit line pair D0/D0*. The twisted bit line structure evolved as a technique to reduce bit-line interference noise during chip operation. Such noise is increasingly more problematic as memory capacities increase and the sizes of physical structures on the chip decrease. The twisted bit line structure is therefore particularly advantageous in larger memories, such as a 64 megabit (Mbit) or larger dynamic random access memory (DRAM).

A twisted bit line structure presents a more complex topology than the simple folded bit line construction. Addressing memory cells in the FIG. 1 layout is more involved. For instance, different addresses are used for the memory cells on either side of a twist junction 1. As memory ICs increase in memory capacity, yet stay the same or decrease in size, noise problems and other layout constraints force the designer to conceive of more intricate configurations. As a result, the topologies of these circuits become more and more complex, and are more difficult to describe mathematically as each layer of complexity adds additional terms to a topology-describing equation. This in turn may give rise to more complex addressing schemes.

One problem that arises for memory ICs involves testing procedures. It is increasingly more difficult to test memory ICs that have intricate topologies. To test ICs, memory manufacturers often employ a testing machine that is preprogrammed with a complex boolean function that describes the topology of the memory IC. Conventional testing machines are capable of handling limited-sized addresses (e.g., 6-bits). As topologies grow more complex, however, such addresses may be incapable of fully addressing all individual cells for some test patterns. This renders the testing apparatus ineffective. Furthermore, if a user wishes to troubleshoot a particular memory device after some period of use, it is very difficult to derive the necessary boolean function for input to the testing machine without consulting the manufacturer.

The difficulties associated with memory IC testing become more manifest when a form of compression is used during testing to accelerate the testing period. It is common to write test patterns of all "1"s or all "0"s to a group of memory cells simultaneously. Consider the following example test pattern of writing all "1"s to the memory cells in the twisted bit line pairs of FIG. 1. Under the testing compression, one bit is used to address four bit line pairs D0/D0*, D1/D1*, D2/D2*, and D3/D3. Under conventional addressing schemes, the task of placing "1's in all memory cells is impossible because it cannot be discerned from a single address whether the memory cell, in order to receive a "1", needs to have a binary "1" or "0" placed on the bit line connected to the memory cell. Accordingly, testing machines may not adequately test memory ICs of complex topologies. Conversely, it is less desirable to test memory ICs on a per-cell basis, as the necessary testing period is too long.

Another consideration which must be taken into account in the design of memory ICs arises, as noted above, as a result of the extremely small size of various components (transistors, diodes, etc . . . ) disposed on a single chip, which renders the chip susceptible to component defects caused, for example, by material impurities and fabrication hazards. In order to address such this problems, chips are often built with redundant components and/or circuits that can be switched-in in lieu of corresponding circuits found defective during testing or operation. Usually the switching-out of a defective component or circuit and the switching-in of a corresponding redundant element is accomplished by using programmable logic circuits which are activated by blowing certain fuse-type devices built into the chip's circuitry. The blowing of the fuse-type devices is normally performed prior to packaging, burn-in and delivery of the IC die.

The number of redundant circuits available in a given IC is of course limited by the space available on the chip. Allocation of IC area is balanced between the competing goals of providing the maximum amount of primary circuitry, while maintaining adequate redundancy.

Memory chips are particularly well suited to benefit from redundancy systems, since typical memory ICs comprise millions of essentially equivalent memory cells, each of which capable of storing a logical 1 or 0 value. The cells are typically divided into generally autonomous "sections" or memory "arrays". For example, in a 16 Mbit DRAM there may be 4 sections of 4 Mbits apiece. The memory cells are typically arranged into an array of rows and columns, with a single row or column being referred to herein as an "element.". A number of elements may be grouped together to form a "bank" of elements.

Over the years, engineers have developed many redundancy schemes which strive to efficiently use the available space on an IC. One recent scheme proposed by Morgan (U.S. Pat. No. 5,281,868) exploits the fact that fabrication defects typically corrupt physically adjacent memory locations. The scheme proposed in the Morgan '868 patent reduces the number of fuses required to replace two adjacent columns by using one set of column-determining fuses to address the defective primary column, and an incrementor for addressing an adjacent column. A potential problem with this scheme, however, is that sometimes only one column is defective. Thus, more columns may be switched-out than is necessary to circumvent the defect.

Another perceived problem with common redundancy systems is that redundant elements serving one SAB may not be available for use by other SABs. Providing this capability using conventional techniques results in a prohibitive number of interconnection lines and switches. Because the redundant circuitry located on each SAB may only be available to replace primary circuitry on that SAB, each SAB must have an adequate number of redundant circuits available to replace the most probable number of defective primary circuits which may occur. Often, however, one SAB will have no defects, while another has more defects than can be replaced by its redundant circuitry. In the SAB with no defects, the redundant circuitry will be unused while still taking up valuable space. The SAB having too many defects may cause the entire chip to be scrapped.

While providing redundant elements in a semiconductor memory is effective in facilitating the salvage of a device having some limited number of defects in its memory array, certain other types of defects can cause the device to exhibit undesirable characteristics such as increased standby current, speed degradation, reduction in operating temperature range, or reduction in supply voltage range. Certain of these types of defects cannot be repaired effectively through redundancy techniques. Defects such as power-to-ground shorts in a portion of the array can prevent the device from operating even to the extent required to locate the defect in a test environment. Memory devices with limited known defects have been sold as "partials", "audio RAMs" or "off spec devices" provided that the defects do not prohibitively degrade the performance of the functional portions of the memory. The value of a partially functional device decreases dramatically as the performance of the device deviates from that of the standard fully-functional device. The desire to make use of devices with limited defects, and the problems associated with the performance of these devices due to the defects are well known in the industry.

The concept of providing redundant circuitry within a memory device addresses a problem that is essentially physical in nature, and, as noted above, involves a trade-off in the allocation of chip area between primary and redundant elements. The aforementioned issue of device topology, on the other hand, provides a good illustration of a consideration which has both physical (electrical) and logical significance, since the twisted bit-line arrangement complicates the task of testing the device. Another example of a consideration which has both structural and logical impact involves the manner in which memory locations within a memory device are accessed.

Fast page mode DRAMs are among the most popular standard semiconductor memories today. In DRAMs supporting fast page mode operation, a row address strobe signal (/RAS) is used to latch a row address portion of a multiplexed DRAM address. Multiple occurrences of a column address strobe signal (/CAS) are then used to latch multiple column addresses to access data within the selected row. On the falling edge of /CAS an address is latched, and the DRAM outputs are enabled. When /CAS transitions high the DRAM outputs are placed in a high-impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. /CAS may be low for as little as 15 nanoseconds, and the data access time from /CAS to valid output data (tCAC) may be up to 15 nanoseconds; therefore, in a worst case scenario there is no time to latch the output data external to the memory device. For devices that operate faster than the specifications require, the data may still only be valid for a few nanoseconds.

Those of ordinary skill in the art will appreciate that on a heavily loaded microprocessor memory bus, trying to latch an asynchronous signal that is valid for only a few nanoseconds can be very difficult. Even providing a new address every 35 nanoseconds requires large address drivers which create significant amounts of electrical noise within the system. To increase the data throughput of a memory system, it has been common practice to place multiple devices on a common bus. For example, two fast page mode DRAMs may be connected to common address and data buses. One DRAM stores data for odd addresses, and the other for even addresses. The /CAS signal for the odd addresses is turned off (high) when the /CAS signal for the even addresses is turned on (low). This so-called "interleaved" memory system provides data access at twice the rate of either device alone. If the first /CAS is low for 20 nanoseconds and then high for 20 nanoseconds while the second /CAS goes low, data can be accessed every 20 nanoseconds (i.e., at a rate of 50 megahertz). If the access time from /CAS to data valid is fifteen nanoseconds, the data will be valid for only five nanoseconds at the end of each 20 nanosecond period when both devices are operating in fast page mode. As cycle times are shortened, the data valid period goes to zero.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low pulse occurs, or until /RAS or the output enable (/OE) goes high. Determining when valid data will arrive at the outputs of a fast page mode or EDO DRAM can be a complex function of when the column address inputs are valid, when /CAS falls, the state of /OE and when /CAS rose in the previous cycle. The period during which data is valid with respect to the control line signals (especially /CAS) is determined by the specific implementation of the EDO mode, as adopted by various DRAM manufacturers.

Methods to shorten memory access cycles tend to require additional circuitry, additional control pins and nonstandard device pinouts. The proposed industry standard synchronous DRAM (SDRAM), for example, has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

In order for existing computer systems to use an improved device having a nonstandard pinout, those systems must be extensively modified. Additionally, existing computer system memory architectures are designed such that control and address signals may not be able to switch at the frequencies required to operate the new memory device at high speed due to large capacitive loads on the signal lines. The Single In-Line Memory Module (SIMM) provides an example of what has become an industry standard form of packaging memory in a computer system. On a SIMM, all address lines connect to all DRAMs. Further, the row address strobe (/RAS) and the write enable (/WE) are often connected to each DRAM on the SIMM. These lines inherently have high capacitive loads as a result of the number of device inputs driven by them. SIMM devices also typically ground the output enable (/OE) pin making /OE a less attractive candidate for providing extended functionality to the memory devices.

There is a great degree of resistance to any proposed deviations from the standard SIMM design due to the vast number of computers which use SIMMs. Industry's resistance to radical deviations from standards, and the inability of current systems to accommodate the new memory devices tend to delay the widespread acceptance of non-standard parts. Therefore, only limited quantities of devices with radically different architectures will be manufactured initially. This limited manufacture prevents the reduction in cost which typically can be accomplished through the manufacturing improvements and efficiencies associated with a high volume product.

There is another perceived difficulty associated with performing write cycles at increasingly high frequencies. In a standard DRAM, write cycles are performed in response to both /CAS and /WE being low after /RAS is low. Data to be written is latched, and the write cycle begins when the latter of /CAS and /WE goes low. In order to allow for maximum "page mode" operating frequencies, the write cycle is often timed out, so that it can continue for a short period of time after /CAS goes high, especially for "late write" cycles. Maintaining the write cycle throughout the timeout period eases the timing specifications for /CAS and /WE that the device user must meet, and reduces susceptibility to glitches on the control lines during a write cycle. The write cycle is terminated after the timeout period, and if /WE is high a read access begins based on the address present on the address input lines. The read access will typically begin prior to the next /CAS falling edge so that the column address to data valid specification can be met (tAA). In order to begin the read cycle as soon as possible, it is desirable to minimize write cycle time while guaranteeing completion of the write cycle. Minimizing the write cycle duration in turn minimizes the margin to some device operating parameters despite the speed at which the device is actually used. Circuits to model the time required to complete the write cycle typically provide an estimate of the time required to write an average memory cell. While it is desirable to minimize the write cycle time, it is also necessary to guarantee that enough time is allowed for the write to complete, so extra delay may be added, making the write cycle slightly longer than required.

Throughout a memory device's product lifetime, manufacturing process advances and circuit enhancements often allow for increases in device operating frequencies. Write cycle timing circuits may need to be adjusted to shorten the minimum write cycle times to match these performance improvements. Fine tuning of these timing circuits is time consuming and costly. If the write cycles are too short, the device may fail under some or all operating conditions. If the write cycles are too long, the device may not be able to achieve the higher operating frequencies that are more profitable for the device manufacturers.

A further consideration to be addressed in the design of semiconductor devices that has both process and algorithmic significant relates to the relative physical locations of the various functional components on a given IC. Those of ordinary skill in the art will appreciate, for example, that including larger numbers of metallic or otherwise conductive layers within the allowable design parameters (so-called "design rules) of a particular species of semiconductor device can simplify, reduce, or mitigate certain logical hurdles. However, inclusion of more metal layers tends to increase the cost and complexity of the manufacturing process. Thus, while conventional wisdom may suggest grouping or locating particular elements of a semiconductor device in a certain area for algorithmic and/or logical reasons, such approaches may not be entirely optimal when viewed from the perspective of manufacturing and processing considerations.

Yet another consideration to be addressed in the design of semiconductor devices relates to the power supply circuitry for such devices. The design of systems which incorporate semiconductor devices such as microprocessors, memories, etc. . . is routinely constrained by a limited number of power supply voltages ($V_{cc}$). For example, consider a portable computer system powered by a conventional battery having a limited power supply voltage. For proper operation, different components of the system, such as a display, a processor, and memory employ several technologies which require power to be supplied at various operating voltages. Components often require operating voltages of a greater magnitude than the power supply voltage or in other cases involve a voltage of reverse polarity. The design of a system, therefore, includes power conversion circuitry to efficiently develop the required operating voltages. One such power conversion circuit is known as a charge pump.

The demand for highly-efficient and reliable charge pump circuits has increased with the increasing number of applications utilizing battery powered systems such as notebook computers, portable telephones, security devices, battery backed data storage devices, remote controls, instrumentation, and patient monitors, to name a few.

Inefficiencies in conventional charge pumps lead to reduced system capability and lower system performance in both battery and non-battery operated systems. Inefficiency can adversely affect system capabilities causing limited battery life, excess heat generation, and high operating costs. Examples of lower system performance include low speed operation, excessive delays in operation, loss of data, limited communication range, and the inability to operate over wide variations in ambient conditions including ambient light level and temperature.

Product reliability is a product's ability to function within given performance limits, under specified operating conditions over time. "Infant mortality" is the failure of an integrated circuit (IC) early in its life due to manufacturing defects. Limited reliability of a charge pump can affect the reliability of the entire system.

To reduce infant mortality, new batches of semiconductor IC devices (e.g., charge pumps) are "burned-in" before being shipped to customers. Burn-in is a process designed to accelerate the occurrence of those failures which are commonly at fault for infant mortality. During the burn-in process, the ICs are dynamically stressed at high temperature (e.g., 125° C.) and higher-than-normal voltage (for example, 7 volts for a 5 volt device) in cycles that can last several hours or days. The devices can be tested for functionality before, after, and even during the burn-in cycles. Those devices that fail are eliminated.

Conventional pump circuits are characterized by a two part cycle of operation and low duty cycle. Pump operation includes pumping and resetting. Duty cycle is low when pumping occurs at less than 50% of the cycle. Low duty cycle Consequently introduces low frequency components into the output DC voltage provided by the pump circuit. Low frequency components cause interference between portions of a system, intermittent failures, and reduced system reliability. Some systems employed conventional pump circuits include filtering circuits at additional cost, circuits to operate the pump at elevated frequency, or both. Elevated frequency operation in some cases leads to increased system power dissipation with attendant adverse effects.

During normal operation of a charge pump, especially charge pumps providing operating voltages higher than $V_{cc}$ (boosted voltages), certain internal "high-voltage" nodes in the charge pump circuitry reach voltages having a magnitude significantly higher than either the power-supply voltage or the produced operating voltage (so-called "over-voltages"). These over-voltages can reach even higher levels under the dynamic stress high voltages during burn-in testing. When an IC charge pump is tested during a burn-in cycle, high burn-in over-voltages in combination with high burn-in temperatures can cause oxidation of silicon layers of the IC device and can permanently damage the charge pump.

In addition to constraints on the number of power supply voltages available for system design, there is an increasing demand for reducing the magnitude of the power supply voltage. The demand in diverse applications areas could be met with high efficiency charge pumps that operate from a supply voltage of less than 5 volts.

Such applications include memory systems backed by 3 volt standby supplies, processors and other integrated circuits that require either reverse polarity substrate biasing or booted voltages outside the range 0 to 3 volts for improved operation. As supply voltage is reduced, further reduction in the size of switching components paves the way for new and more sophisticated applications. Consequently, the need for high efficiency charge pumps is increased because voltages necessary for portions of integrated circuits and other system components are more likely to be outside a smaller range.

SUMMARY OF THE INVENTION

The present invention is directed to a semiconductor dynamic random-access memory device which is believed to embody numerous features which collectively and/or individually prove beneficial and advantageous with regard to such considerations as have been described above.

In a disclosed embodiment of the invention, the memory device is a 64 Mbit dynamic random-access memory device which comprises eight substantially identical 8 Mbit partial array blocks or PABs, with each pair of PABs comprising a 16 Mbit quadrant of the device. Between the top two quadrants and between the bottom two quadrants are column blocks containg I/O read/write circuitry, column redundancy fuses, and column decode circuitry. Column select lines originate from the column blocks and extend right and left therefrom across the width of each quadrant.

Each PAB in the memory array comprises eight substantially identical 1 Mbit sub-array blocks or SABs. Associated with each SAB are a plurality of local row decoder circuits which function to receive partially decoded row addresses from a column predecoder circuit and to generate local row addresses which are supplied to the SAB with which they are associated. This distributed row decoding arrangement is believed to office significant benefits with regard to the above-mentioned design considerations, among others.

Various pre-packaging and/or post-packaging options are provided for enabling a large degree of versatility, redundancy, and economy of design. In accordance with one aspect of the invention, certain programmable options of the disclosed device are programmable by means of both laser fuses and electrical fuses. For example, redundant rows and columns are provided which may be switched-in, either in pre- or post-packaging processing, in place of rows or columns which are found during a testing procedure to be defective. During pre-packaging processing, the switching-in of a redundant row or column is accomplished by blowing a laser fuse in an on-chip laser fusebank. Post packaging, redundant rows and columns are switched-in by addressing a nitride capacitor electrical fuse and applying a programming voltage to blow the addressed fuse.

In accordance with another aspect of the invention, a redundant row or column which is switched-in in place of a defective row or column but which is itself subsequently found to be defective can be cancelled and replaced with another redundant row or column.

In the RAS chain, circuitry is provided for simulating the RC time constant behavior of word lines and digit lines during memory accesses, such that memory access cycle time can be optimized.

Among the programmable options for the device in accordance with the present invention is an option for selectively disabling portions of the device which cannot be repaired with the device's redundancy circuitry, such that a memory device of smaller capacity but with an industry-standard pinout is obtained.

Test data compression circuitry is provided for optimizing the process of testing each cell in the array. In addition, onchip topology circuitry is provided for simplifying the testing procedure.

In accordance with another aspect of the present invention, an improved voltage generator for supplying power to the memory device is provided. The voltage generator includes an oscillator, and a plurality of charge pump circuits forming one multi-phase charge pump. In operation, each pump circuit, in response to the oscillator, provides power to the memory device for a time, and enables a next pump circuit of the plurality to supply power at another time.

According to a first aspect of such a system, power is supplied to the memory device in a manner characterized by continuous pumping, thereby supplying higher currents. The charge pump circuits can be designed so that the voltage generator provides either positive or negative output voltages.

The plurality of charge pumps cooperate to provide a 100% pumping duty cycle. Switching artifacts, if any, on the pumped DC voltage supplied to the memory device are of lower magnitude and are at a frequency more easily removed from the pumped DC voltage.

A signal in a first pump circuit is generated for enabling a second pump circuit. By using the generated signal for pump functions in a first pump and for enabling a second pump, additional signal generating circuitry in each pump is avoided. Each pump circuit includes a pass transistor for selectively coupling a charged capacitor to the memory device when enabled by a control signal. By selectively coupling, each pump circuit is isolated at a time when the pump is no longer efficiently supplying power to the memory device.

Each pump circuit operates at improved efficiency compared to prior art pumps, especially in MOS integrated circuit applications wherein the margin between the power supply voltage ($V_{cc}$) and the threshold voltage ($V_t$) of the pass transistor is less than about 0.6 volts. Greater efficiency is achieved by driving the pass transistor gate at a voltage further out of the range between ground and $V_{cc}$ voltages than the desired pump voltage is outside such range.

In an alternative embodiment, the memory device includes a multi-phase charge pump, each stage of which includes a FET as a pass transistor. The substrate of the memory device is pumped to a bias voltage having a polarity opposite the polarity of the power signal, $V_{cc}$, from which the integrated circuit operates. By developing a control signal as the result of a first stepped voltage and a second stepped voltage, and applying the control signal to the gate of the FET, efficient coupling of a pumped charge to the substrate results. High-voltage nodes of the memory device can be coupled to protection circuits which clamp down over-voltages during burn-in testing, thus allowing accurate burn-in testing while preventing over-voltage damage.

In a preferred embodiment of the present invention, the protection circuit is built as part of a charge pump integrated circuit which supplies a boosted voltage to a system. The charge pump has at least one high-voltage node. Protection circuits are coupled to each high-voltage node. Each protection circuit includes a switching element and a voltage clamp coupled in series. The voltage damp also couples to the high-voltage node, while the switching element can also couple to a reference voltage source. A burn-in detector can detect burn-in conditions and enable the protection circuits. The switch element activates the voltage clamp, and the voltage clamp clamps down the voltage of the high-voltage node, thus avoiding over-voltage damage.

BRIEF DESCRIPTION OF THE DRAWINGS

Various features and advantages of the present invention will perhaps be best appreciated with reference to a detailed description of a specific embodiment of the invention, when read in conjunction with the accompanying drawings, wherein:

FIG. 11 is a diagram setting forth the correlation between predecoded row addresses and laser fuses to be blown, and between row fusebanks and row addresses in the memory device of FIG. 2;

FIG. 12 is a diagram setting forth the correlation between predecoded column addresses and laser fuses to be blown, and between column fusebanks and pretest addresses in the memory device of FIG. 2;

FIG. 21 is a schematic diagram of a word line driver from the memory device of FIG. 2;

FIG. 22 is a table identifying various laser and electrical fuse options available for the memory device of FIG. 2;

FIG. 31 is a schematic diagram of circuitry for disabling fuse options in the memory device of FIG. 2;

FIG. 32 is a schematic diagram of circuitry for disabling backend repair options in the memory device of FIG. 2;

FIG. 33 is a table identifying sections of the memory device of FIG. 2 that are deactivated in response to certain fuse option fuses being blown in the memory device of FIG. 2;

FIG. 34 identifies the inputs and outputs to the circuitry for disabling the 32 MEG option of the memory device of FIG. 2;

FIG. 61 is a table listing test mode addresses for the memory device of FIG. 2;

FIG. 62 is a table listing supervoltage and backend programming inputs for the memory device of FIG. 2;

FIG. 63 is a table listing read data and outputs for test modes of the memory device of FIG. 2;

FIG. 64 identifies the inputs to backend repair programming logic in the memory device of FIG. 2

FIG. 65 is a schematic diagram of program select circuitry associated with the backend repair programming logic of the memory device of FIG. 2;

FIG. 88 is a table identifying row and column addresses for 4K and 8K refreshing of the memory device of FIG. 2;

FIG. 119 is a schematic/block diagram of a portion of local topology enable circuitry in the memory device of FIG. 2;

FIG. 120 is a schematic diagram of another portion of local topology enable circuitry in the memory device of FIG. 2;

FIG. 121 is a schematic diagram of another portion of local topology enable circuitry in the memory device of FIG. 2;

FIG. 122 is a schematic diagram of reset circuitry associated with local topology enable circuitry in the memory device of FIG. 2;

FIG. 123 is a schematic diagram of enabled 4:1 column predecode circuitry in the memory device of FIG. 2;

FIG. 124 is a schematic/block diagram of local topology redundancy pickup circuitry in the memory device of FIG. 2;

FIG. 125 is a schematic diagram of row decode and odd/even buffer circuitry in the memory device of FIG. 2;

FIG. 126 is a schematic/block diagram of row decode buffer circuitry in the memory device of FIG. 2;

FIG. 127 is a schematic diagram of odd/even row decode buffer circuitry in the memory device of FIG. 2;

FIGS. 128A–128B are schematic diagram of array select, reset buffer, and driver circuitry in the row decode circuitry of the memory device of FIG. 2;

FIG. 129 is a schematic/block diagram of column 4:1 predecode circuitry in the memory device of FIG. 2;

FIG. 130 is a schematic diagram of column address 2:1 predecode circuitry in the memory device of FIG. 2;

Figure 2:
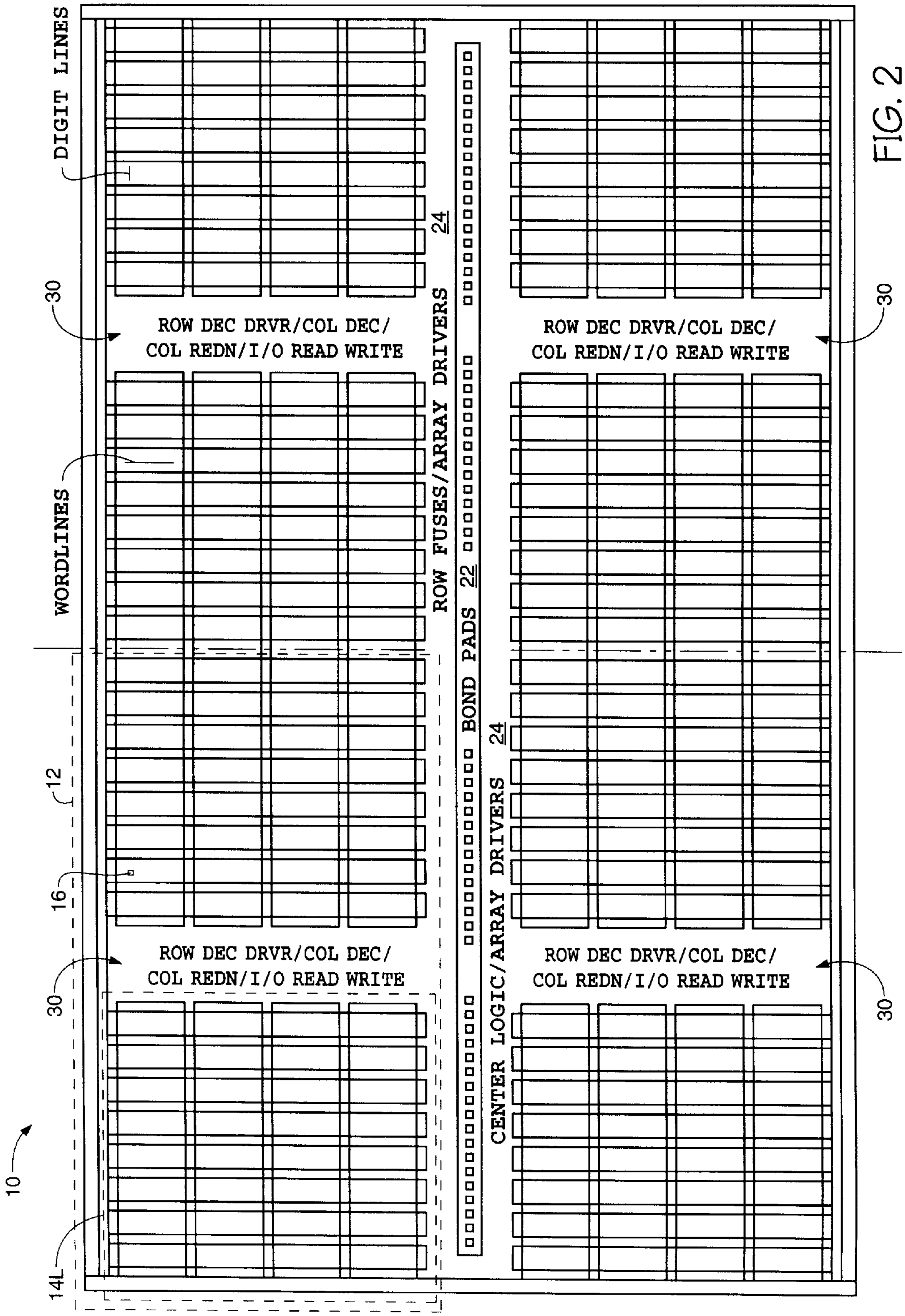
FIG. 2 is a layout diagram of a 64 Mbit dynamic random access memory device in accordance with one embodiment of the invention.
Figures 76, 76A:
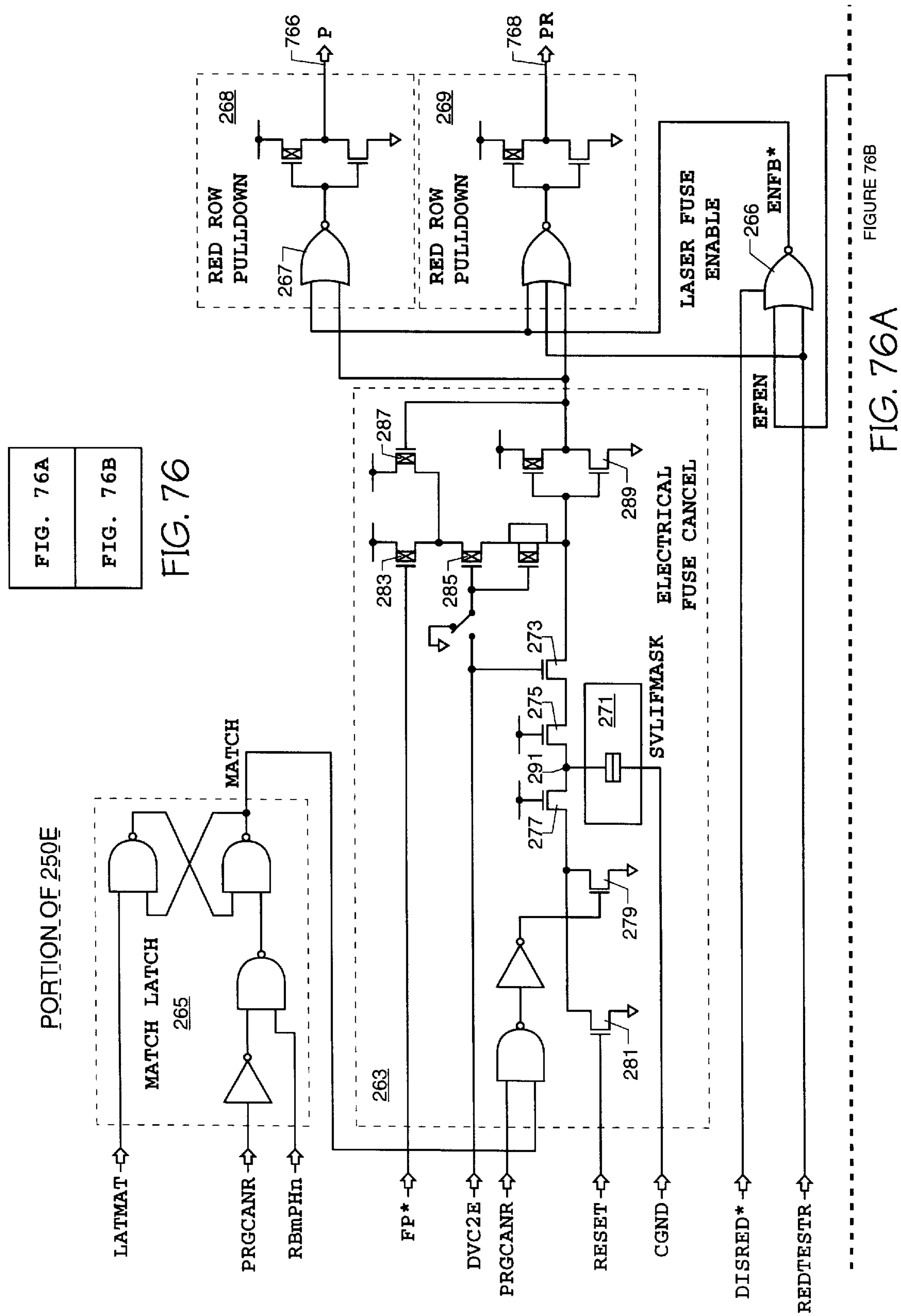
FIGS. 76A–76B are schematic diagram of a portion of row redundancy electrical fusebanks in the memory device of FIG. 2.
Figure 76B:
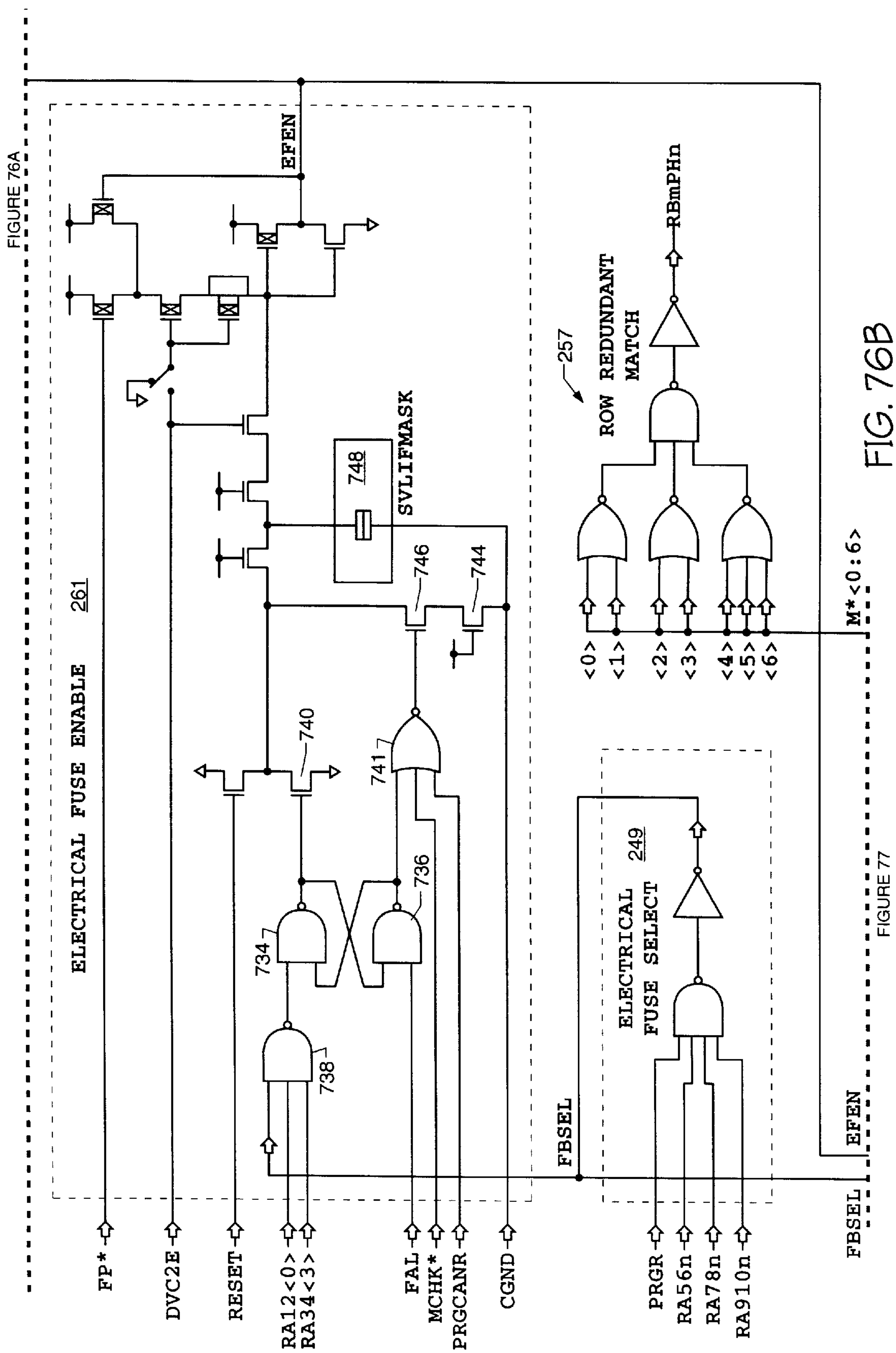
Figure 77:
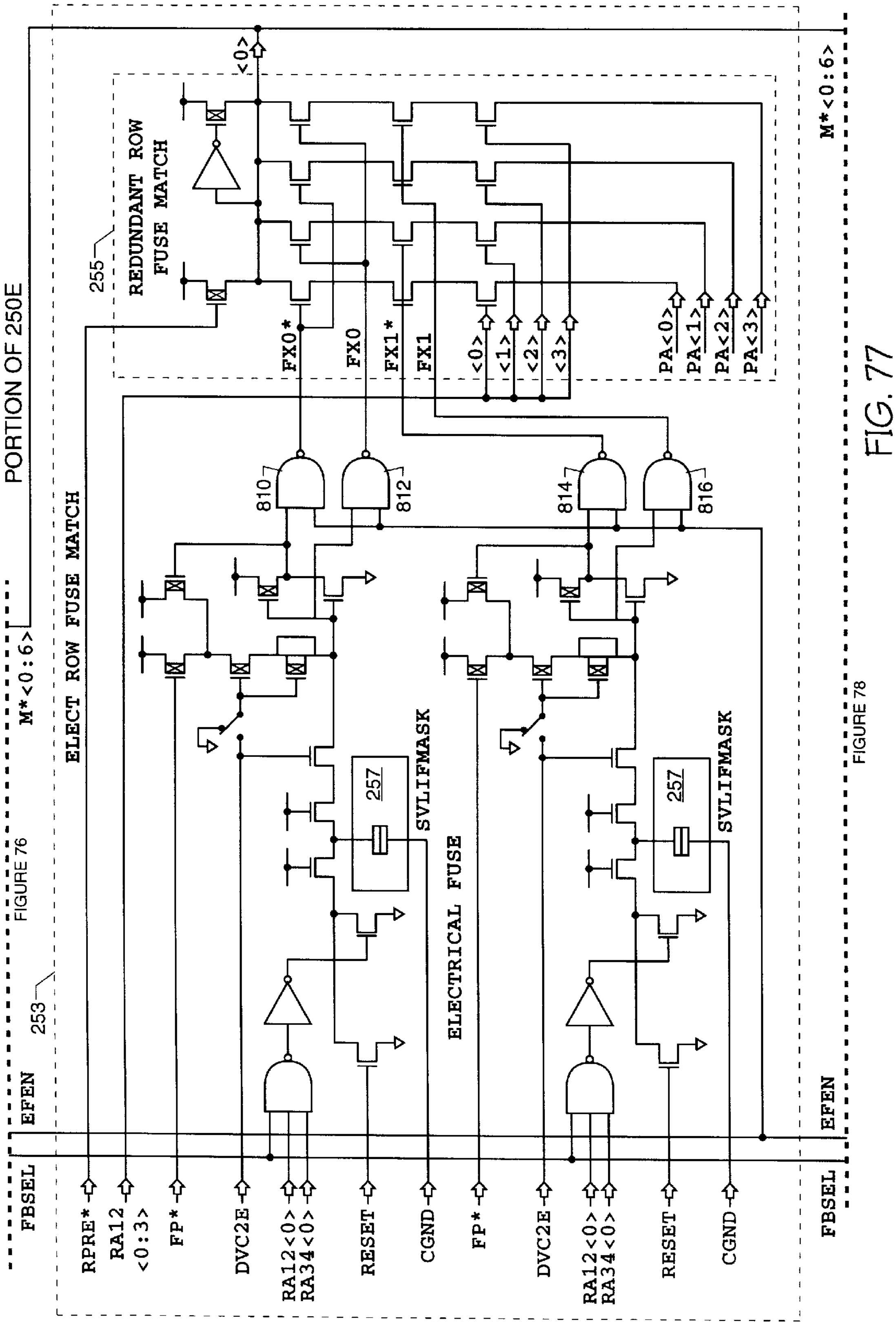
FIG. 77 is a schematic diagram of another portion of row redundancy electrical fusebanks from FIG. 76.
Figure 78A:
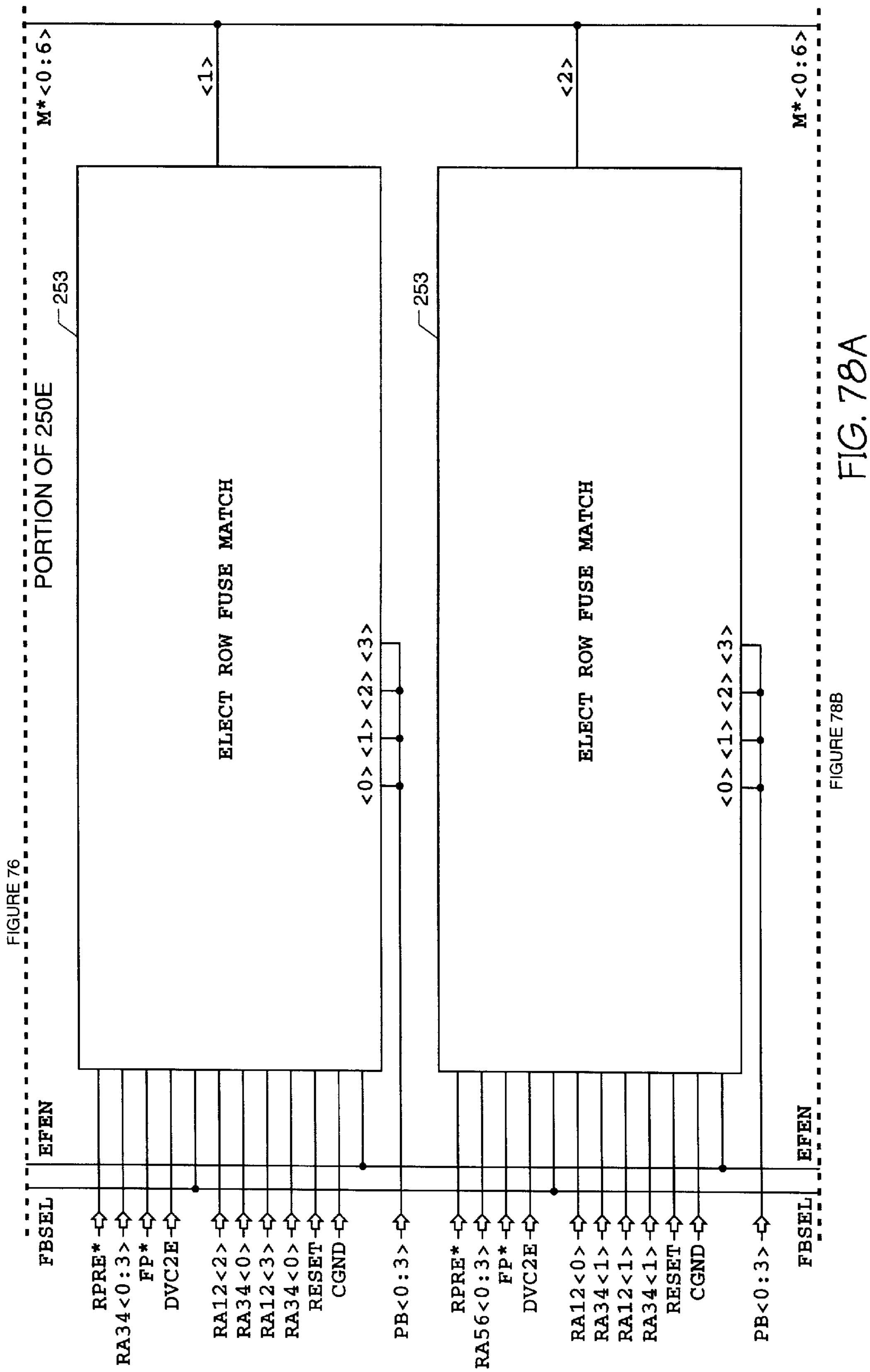
FIGS. 78A–78C are schematic diagram of another portion of the row redundancy electrical fusebank circuit from FIGS. 76 and 77, including row redundancy electrical fuse match circuits.
Figure 78B:
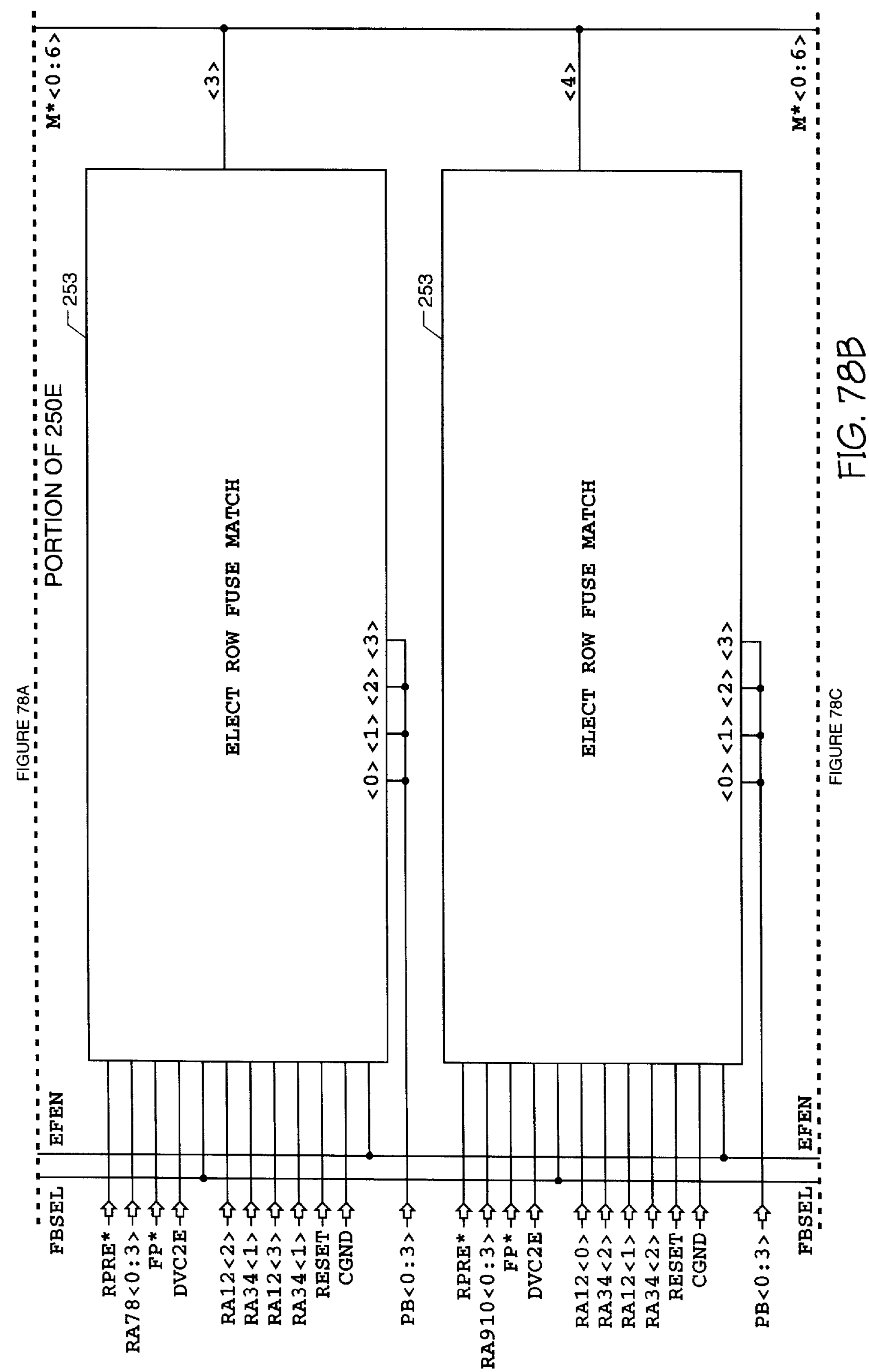
Figure 78C:
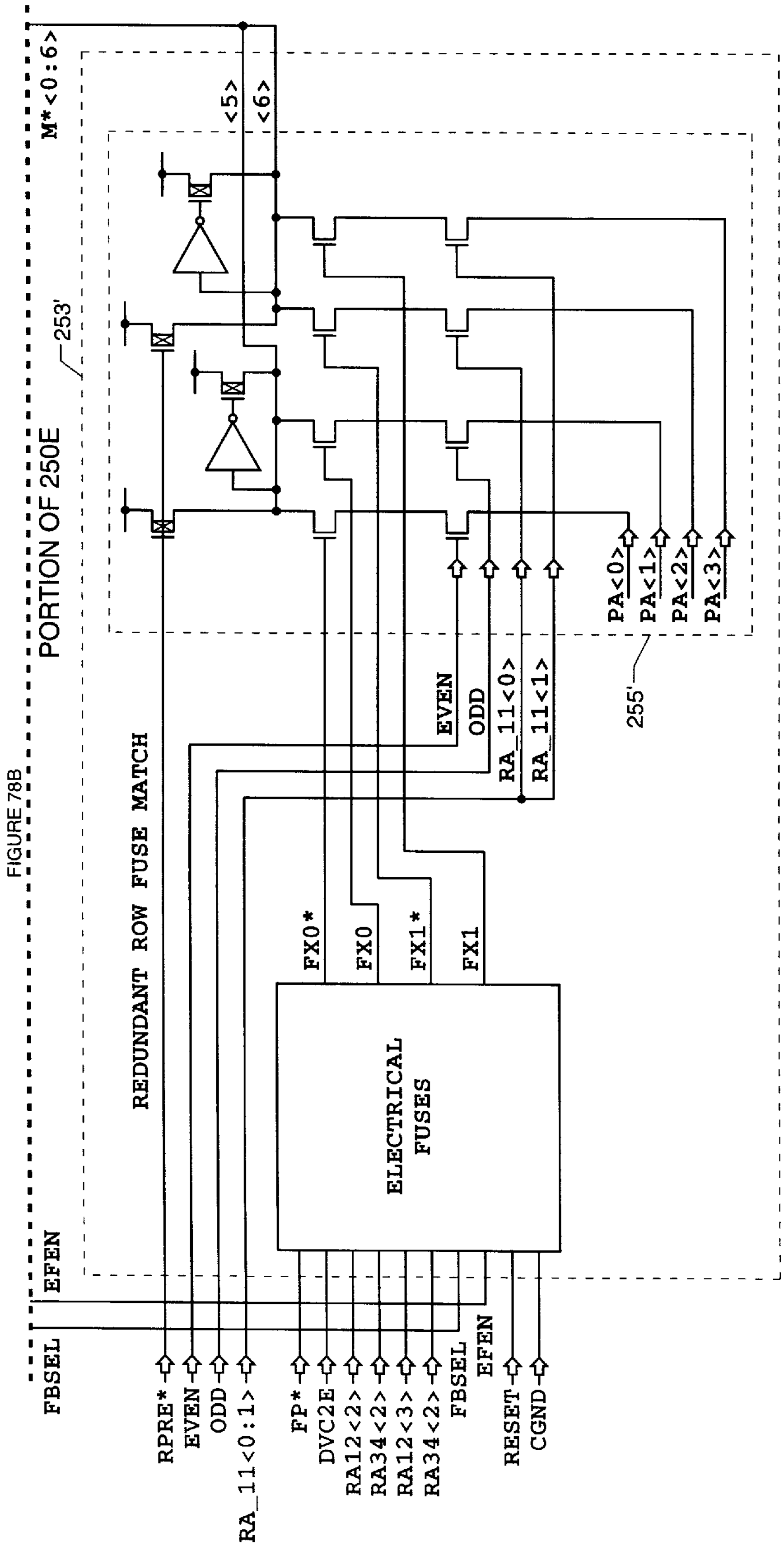
Figure 131:
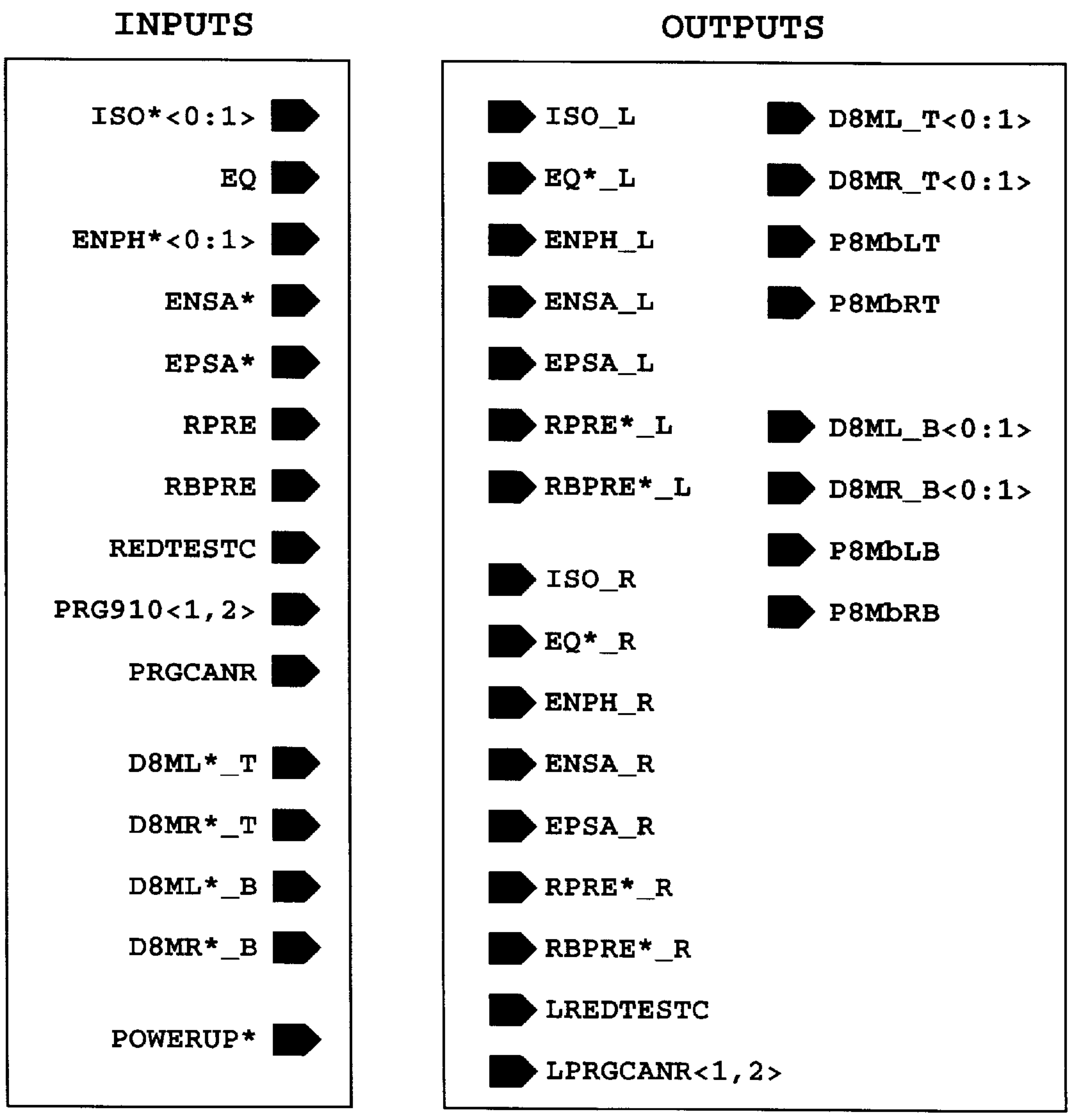
Figure 132:
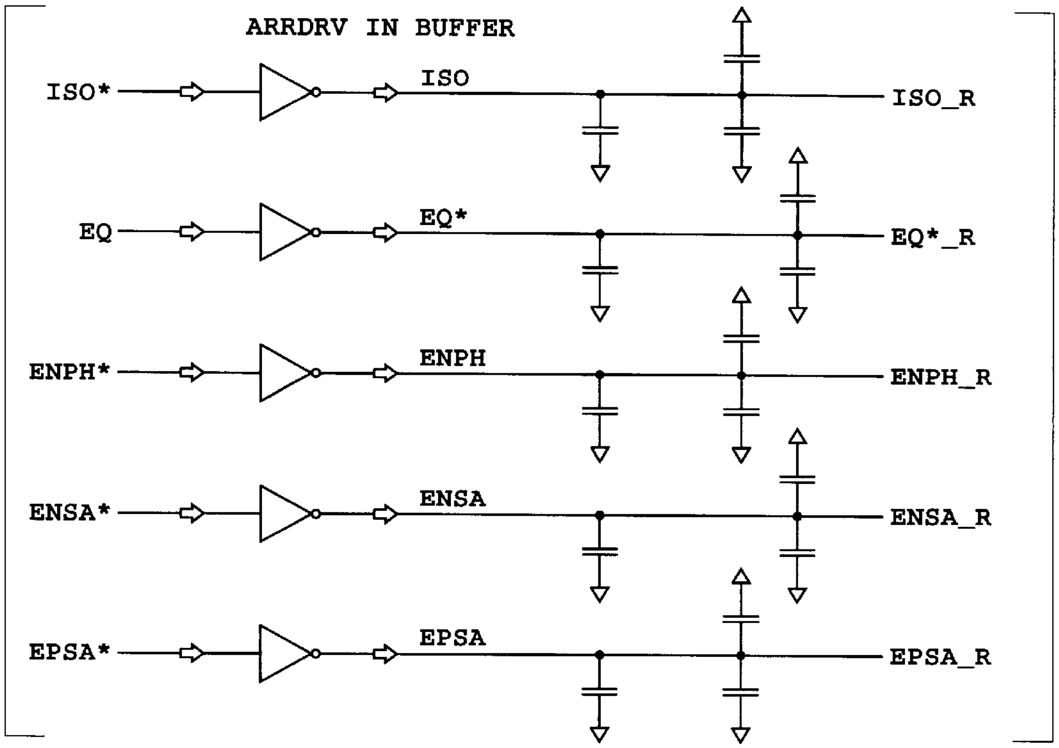
Figure 133:
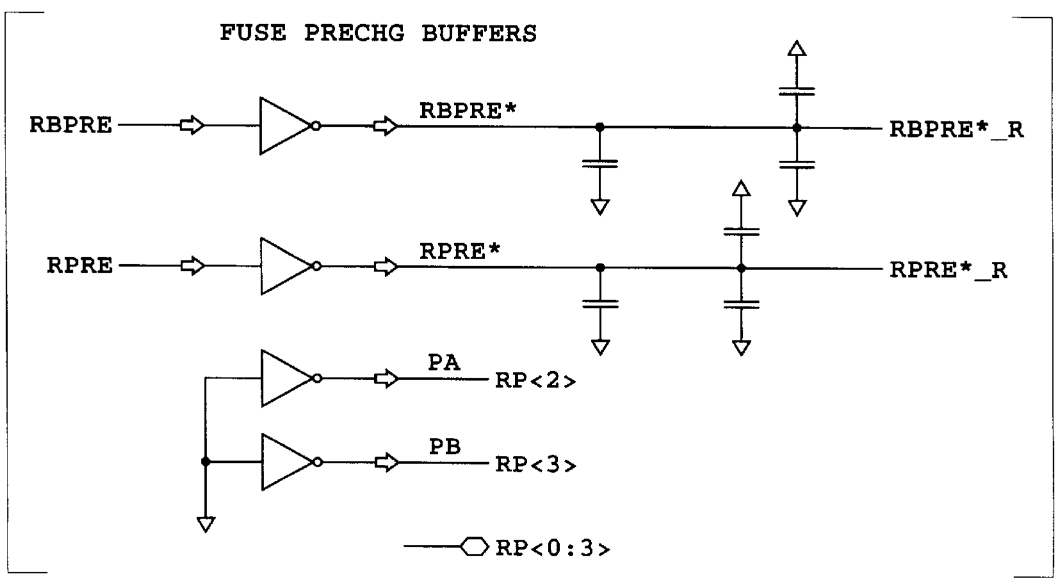
Figure 134:
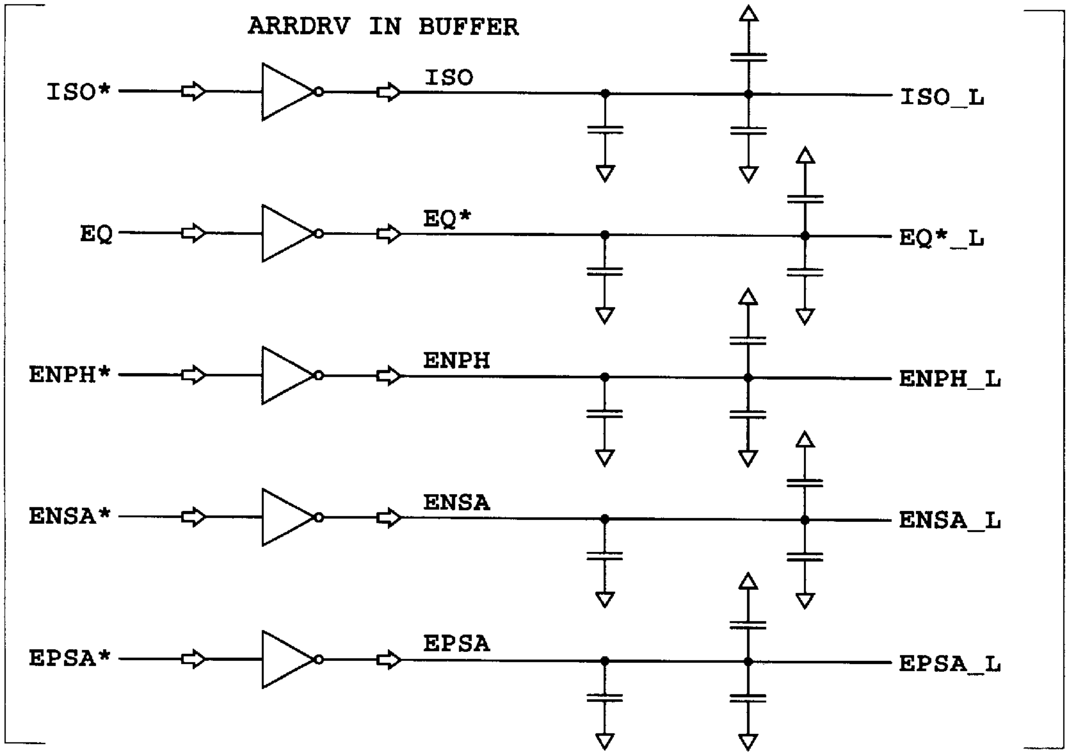
Figure 135:
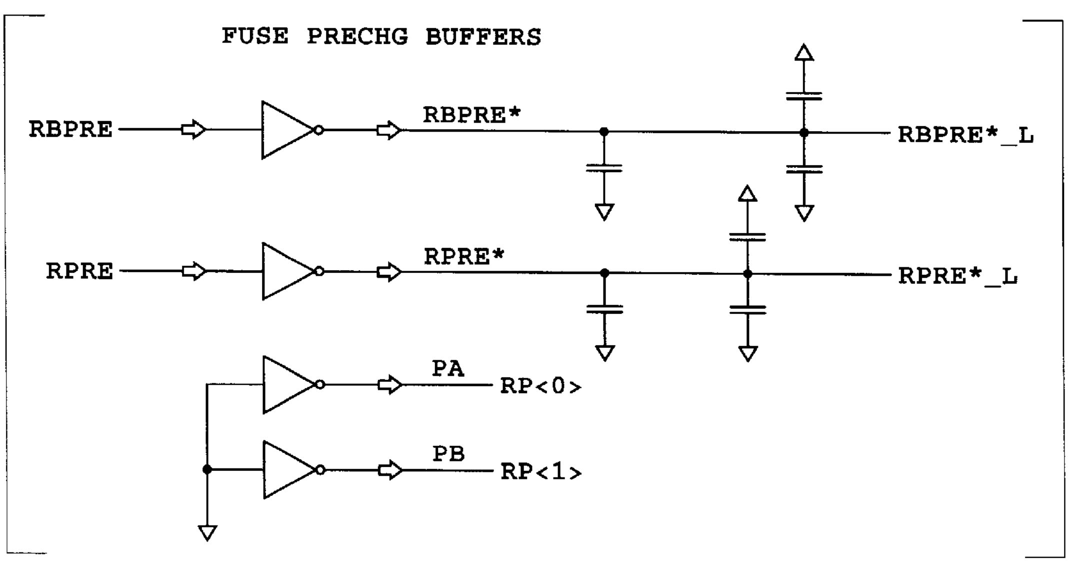
Figure 136:
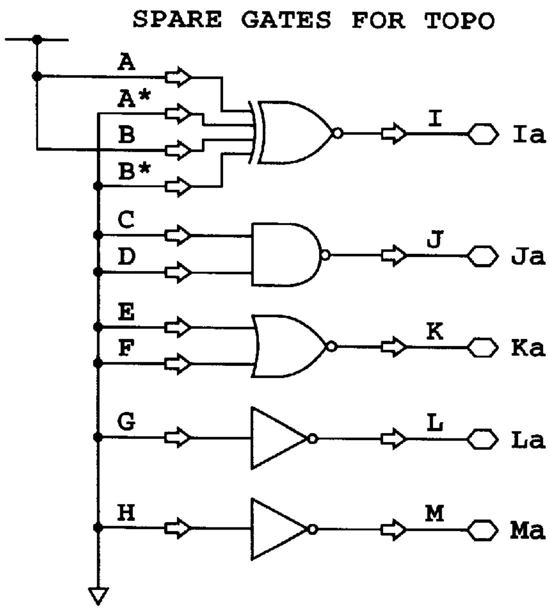
Figure 137:
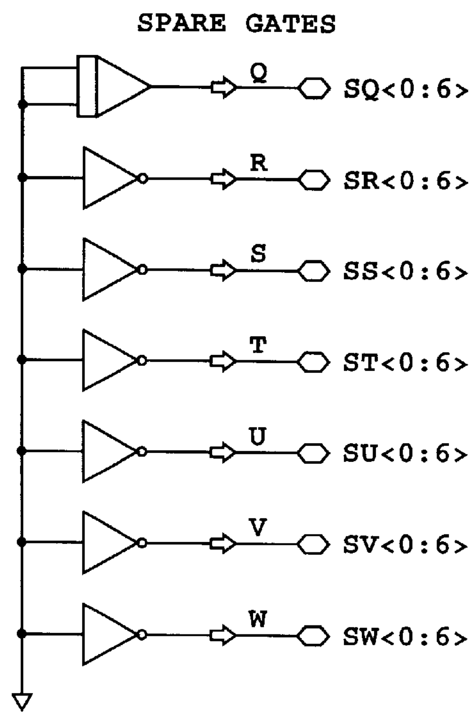
Figure 138:
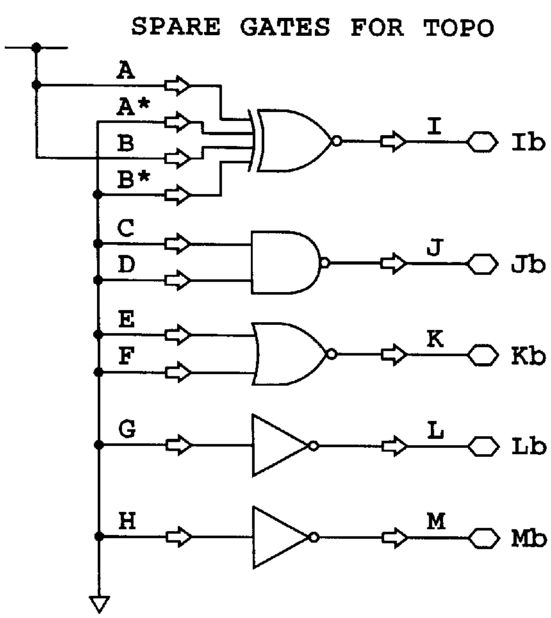
Figure 139:
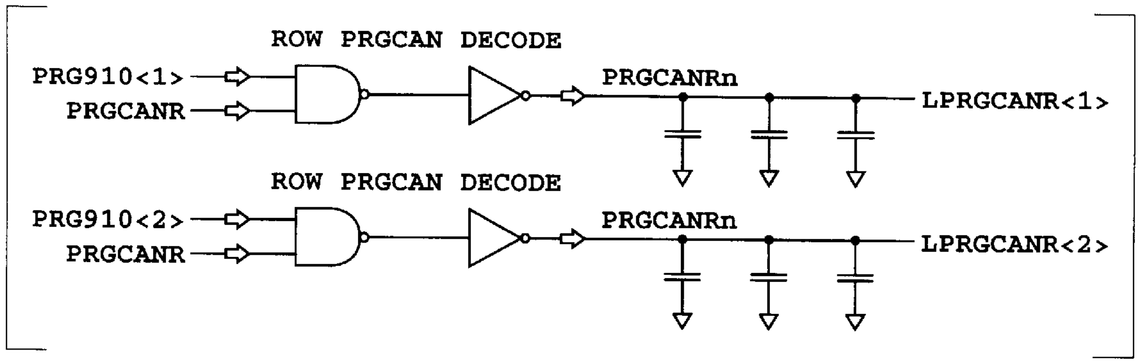
Figure 140:
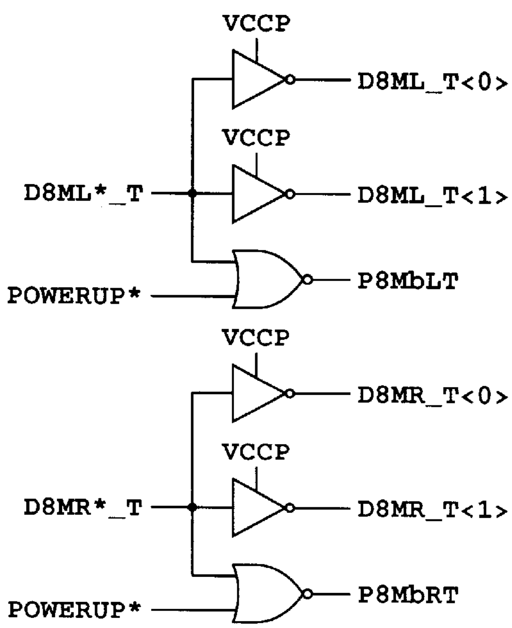
Figure 141:
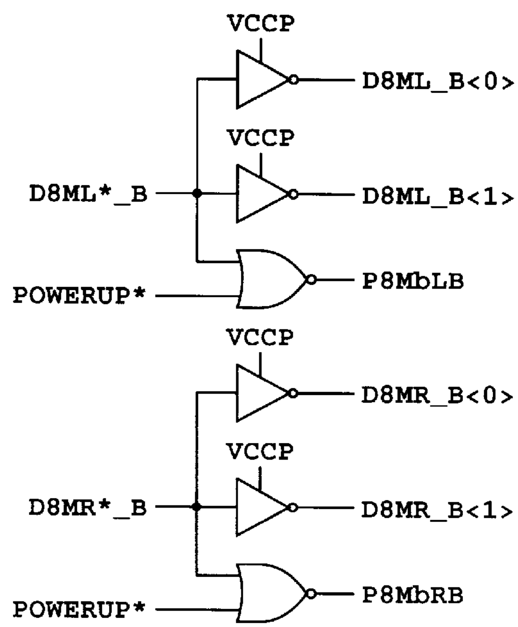
Figure 142:
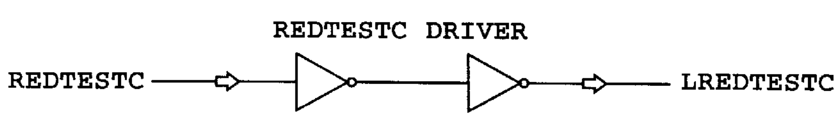
Figure 143:
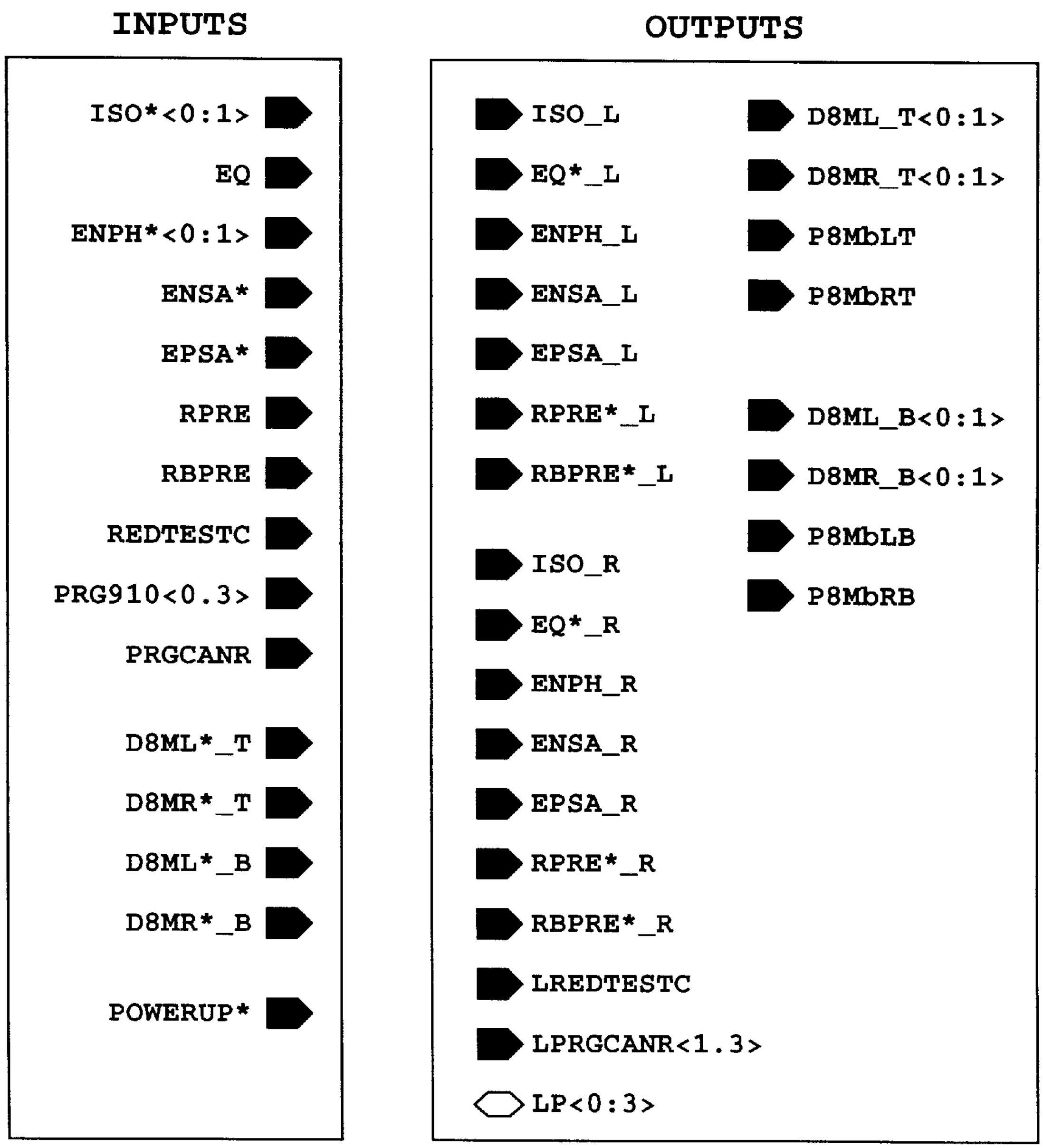
Figure 144:
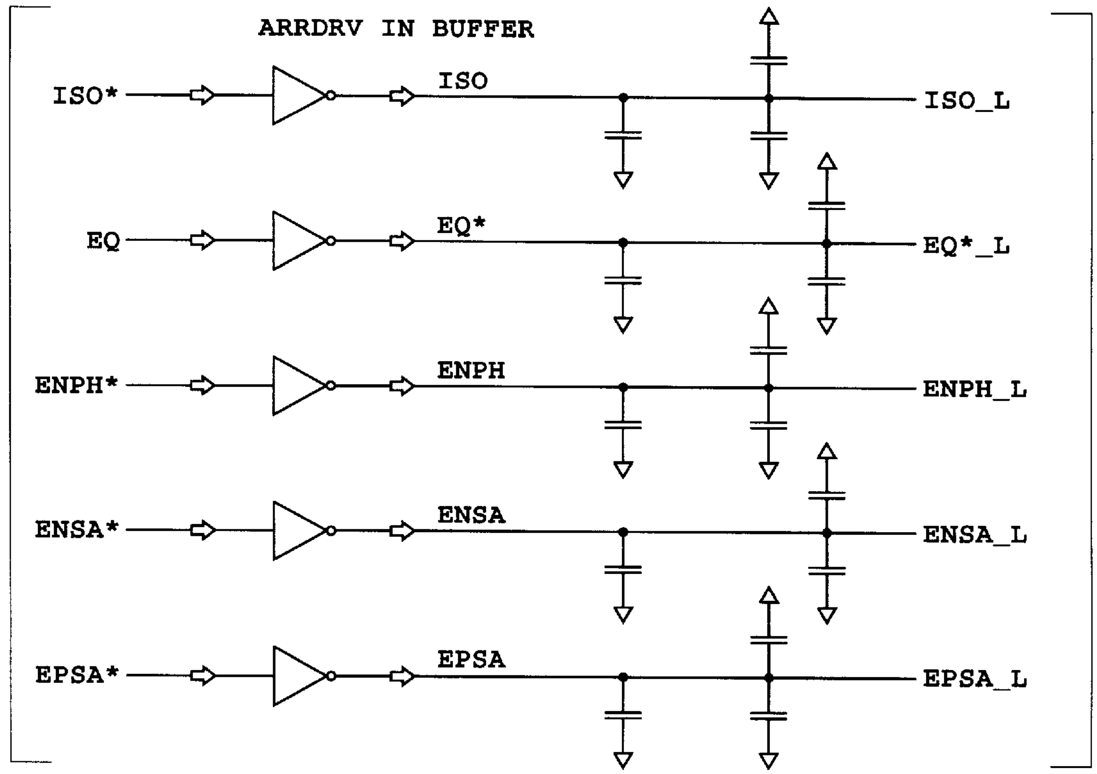
Figure 145:
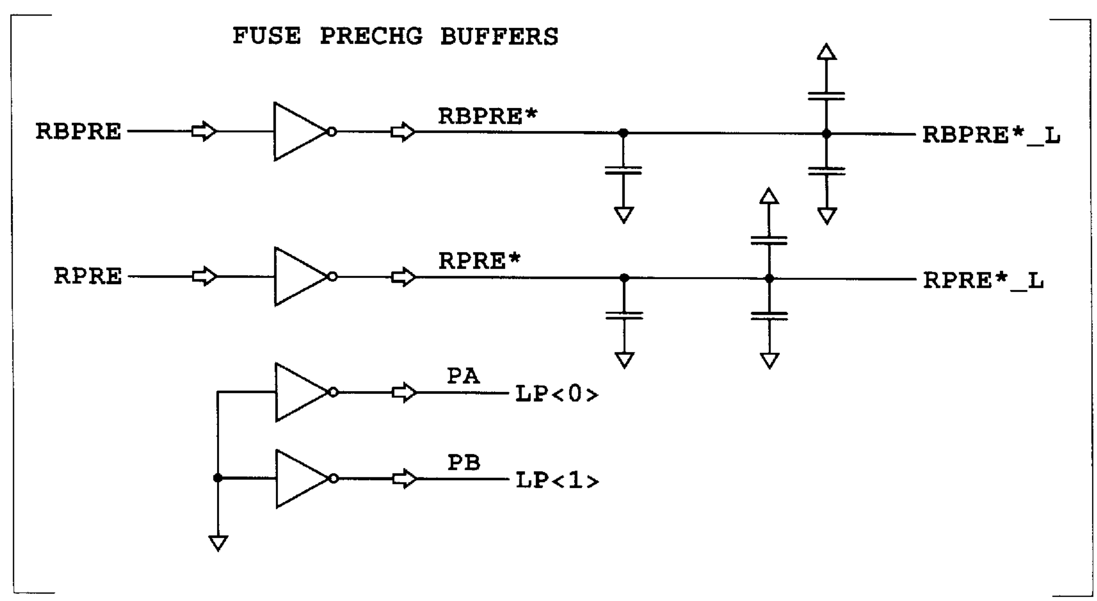
Figure 146:
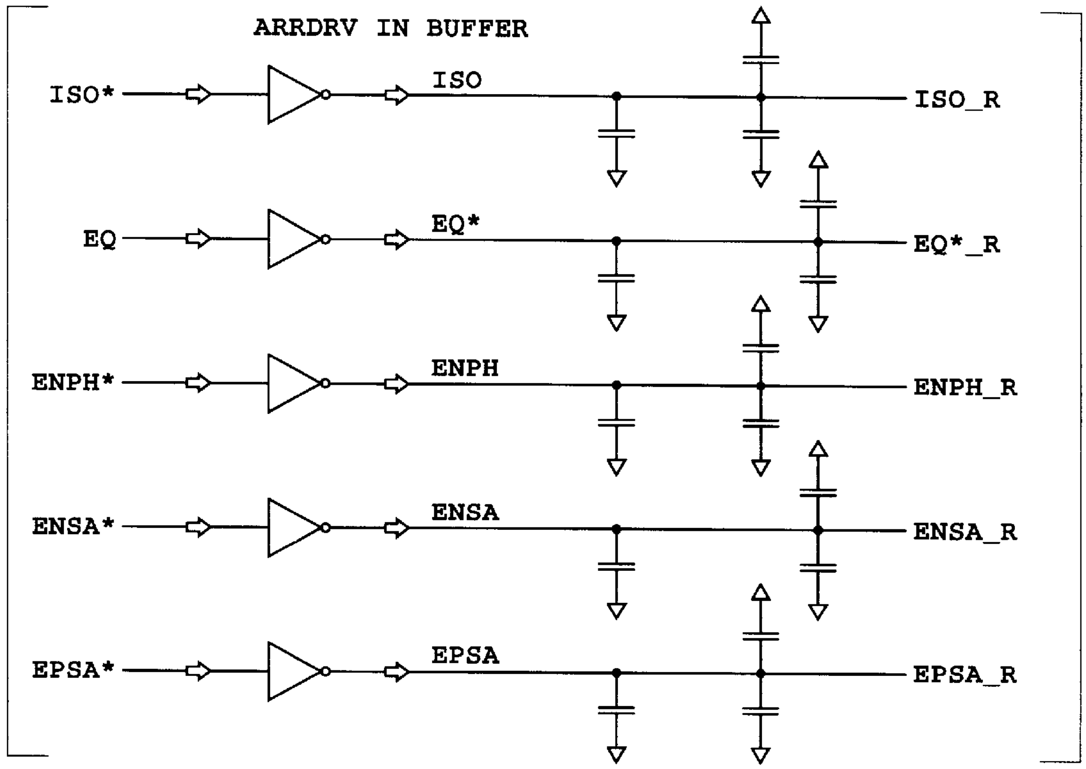
Figure 147:
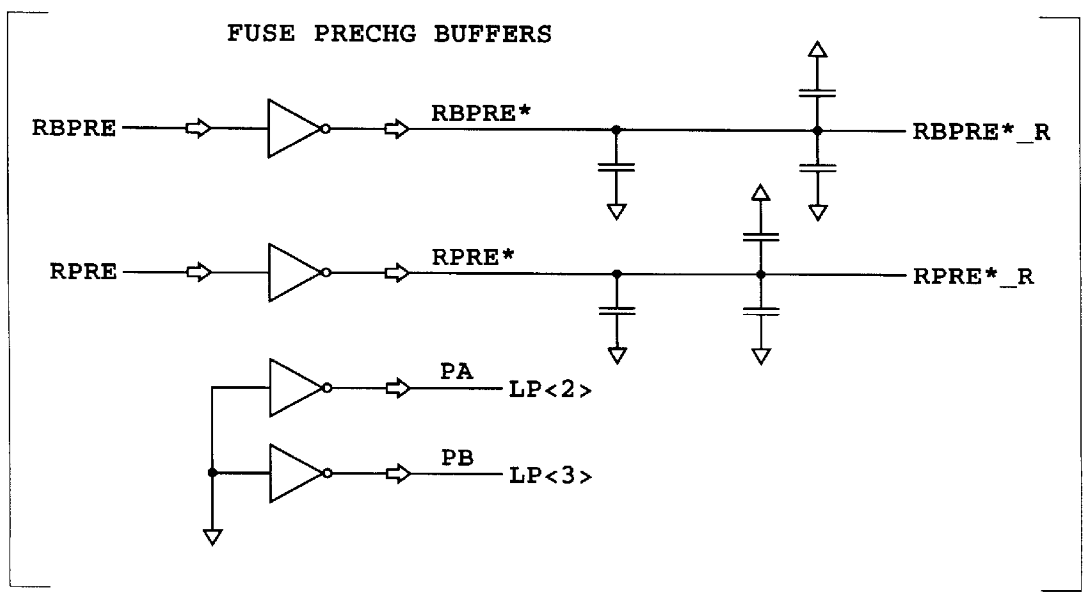
Figure 148:
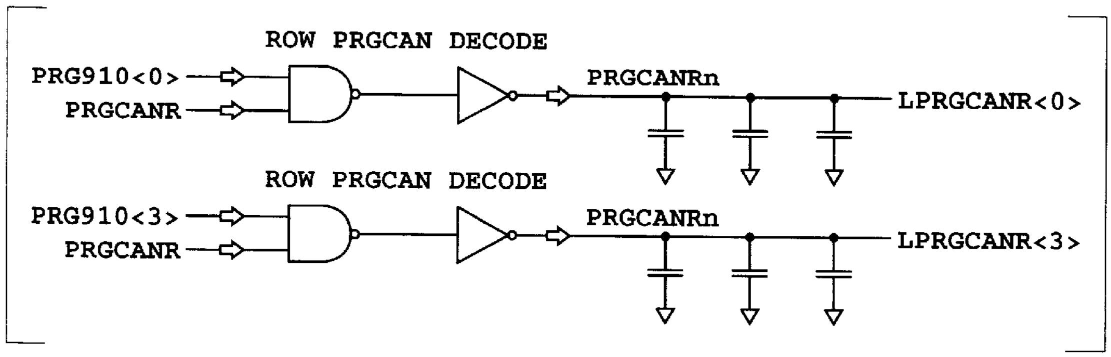
Figure 149:
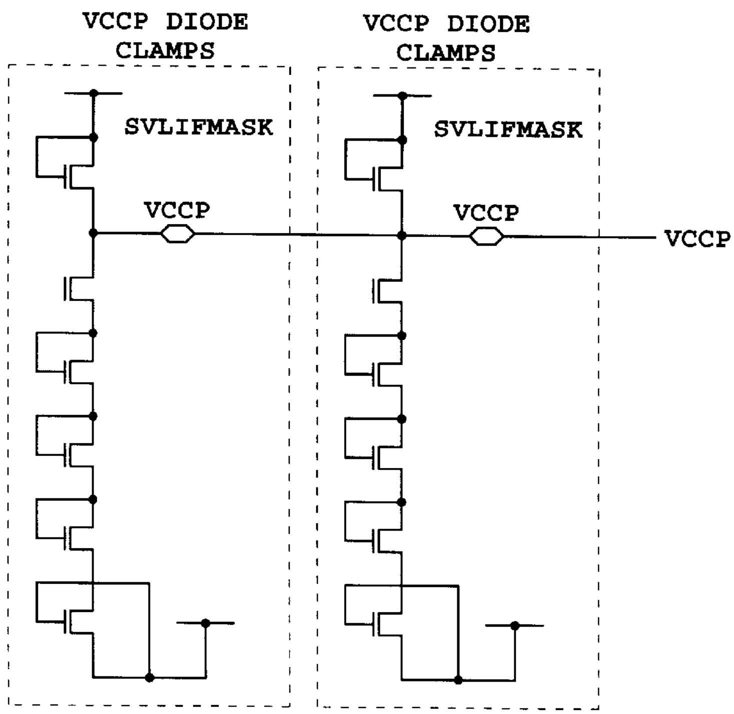
Figure 150:
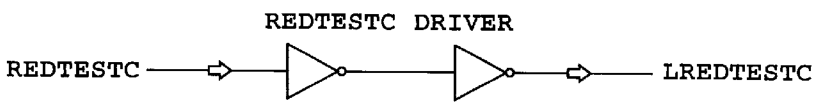
Figure 151:
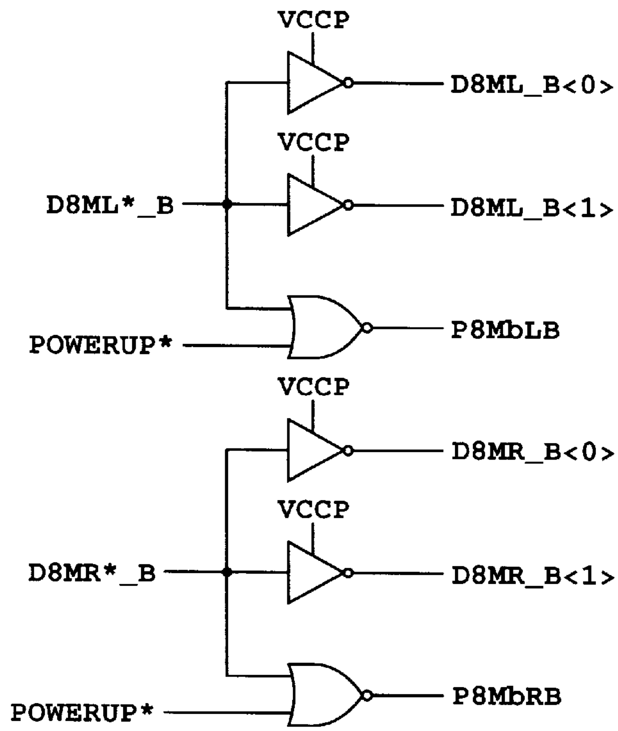
Figure 152:
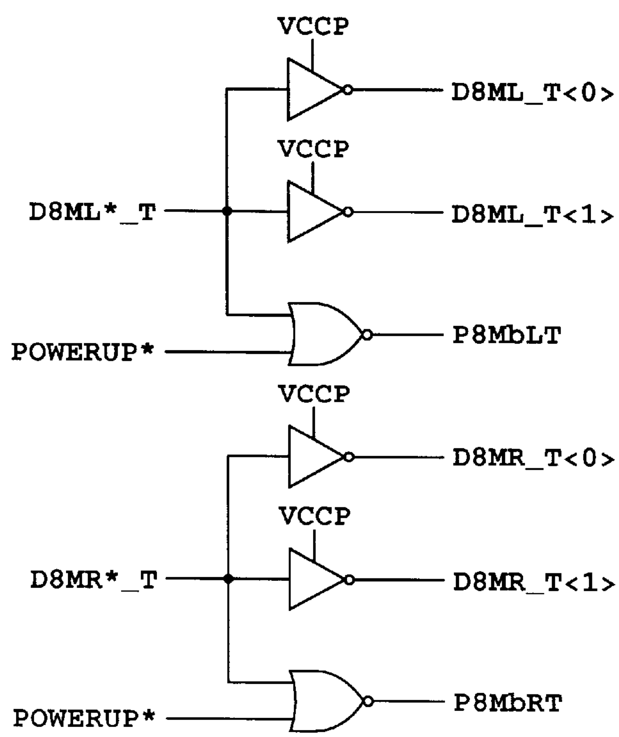
Figure 153:
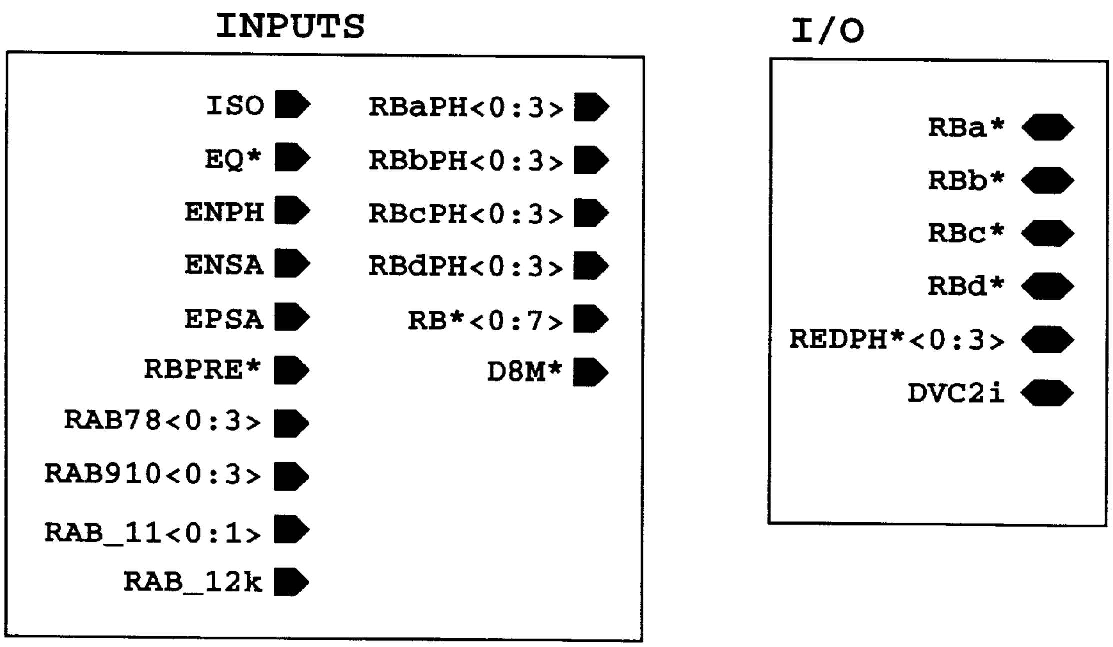
Figure 154:
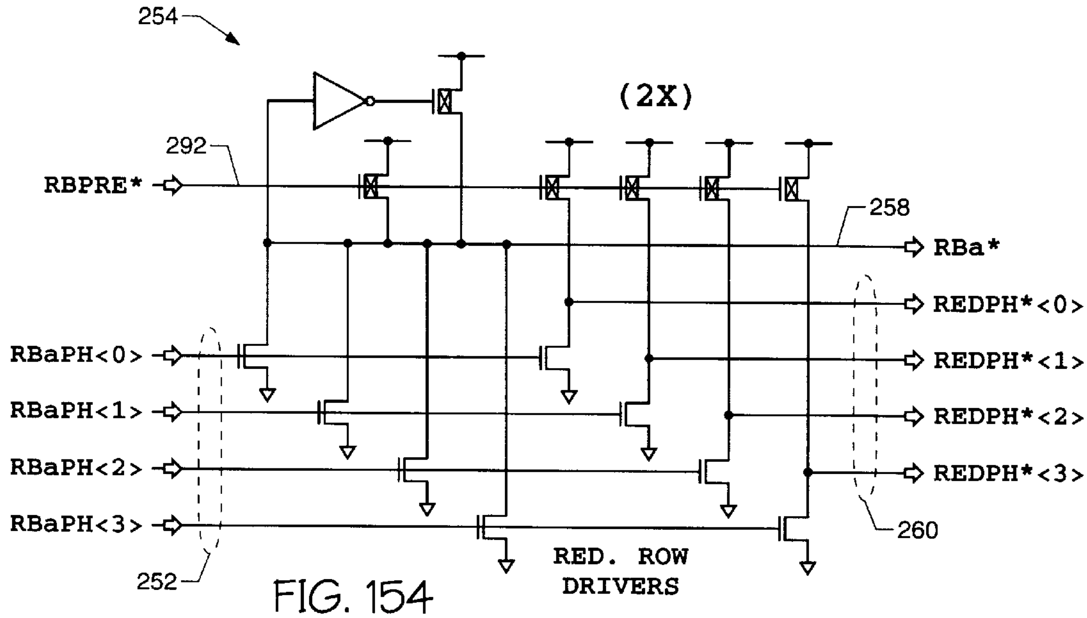
Figure 155:
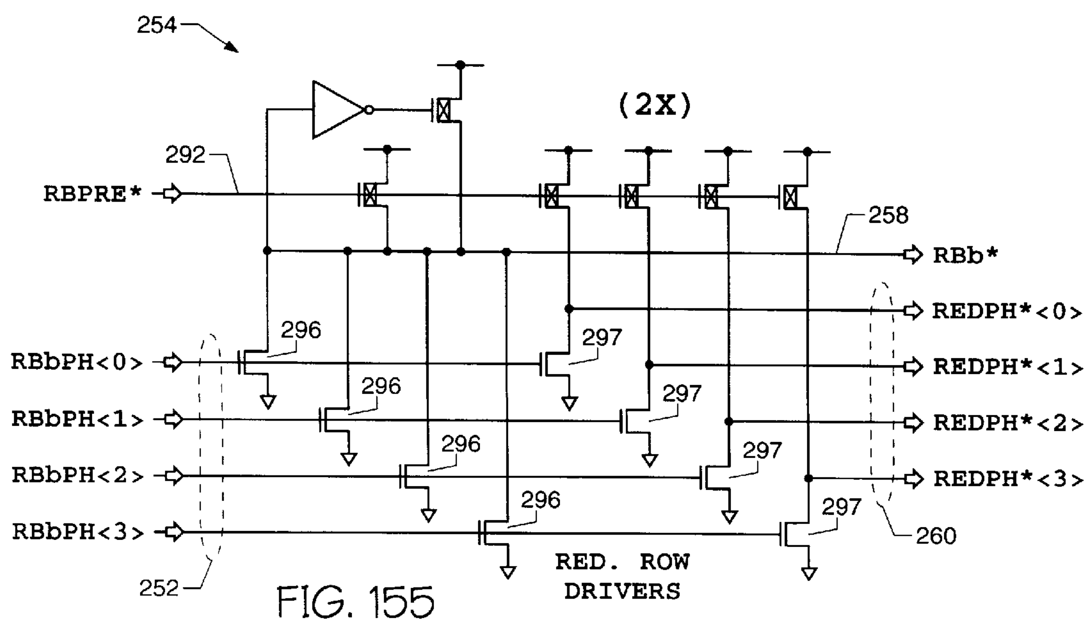
Figure 156:
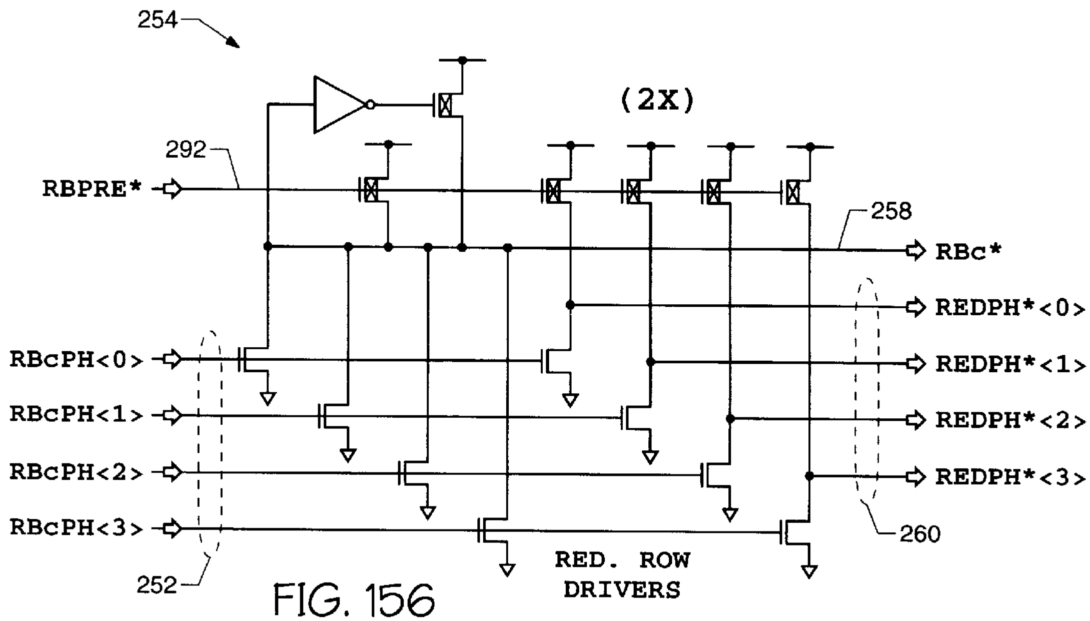
Figure 157:
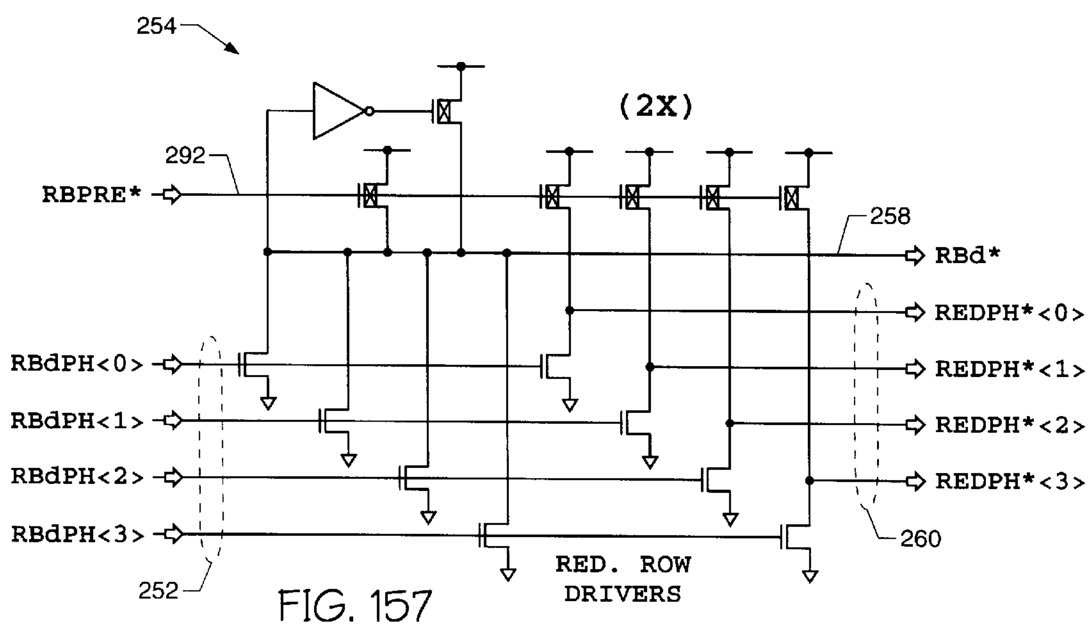
Figure 158:
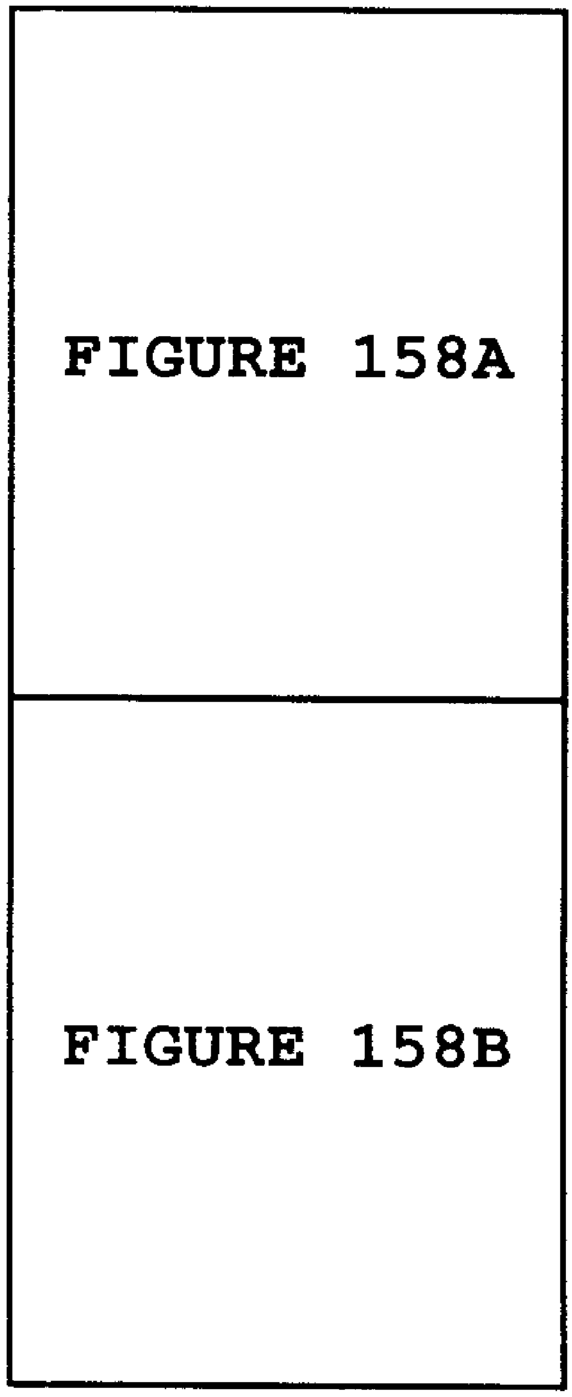
Figure 158A:
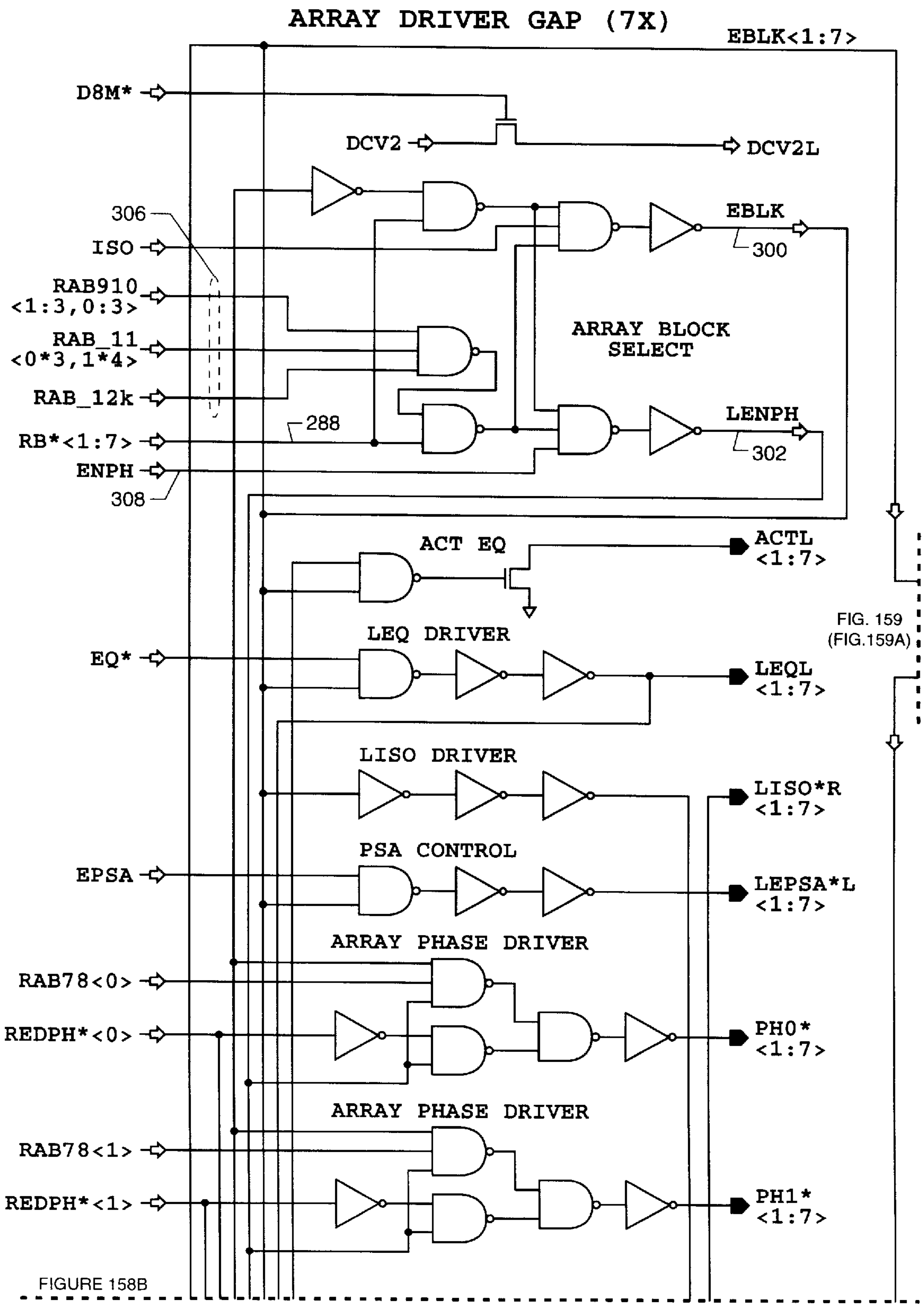
Figure 158B:
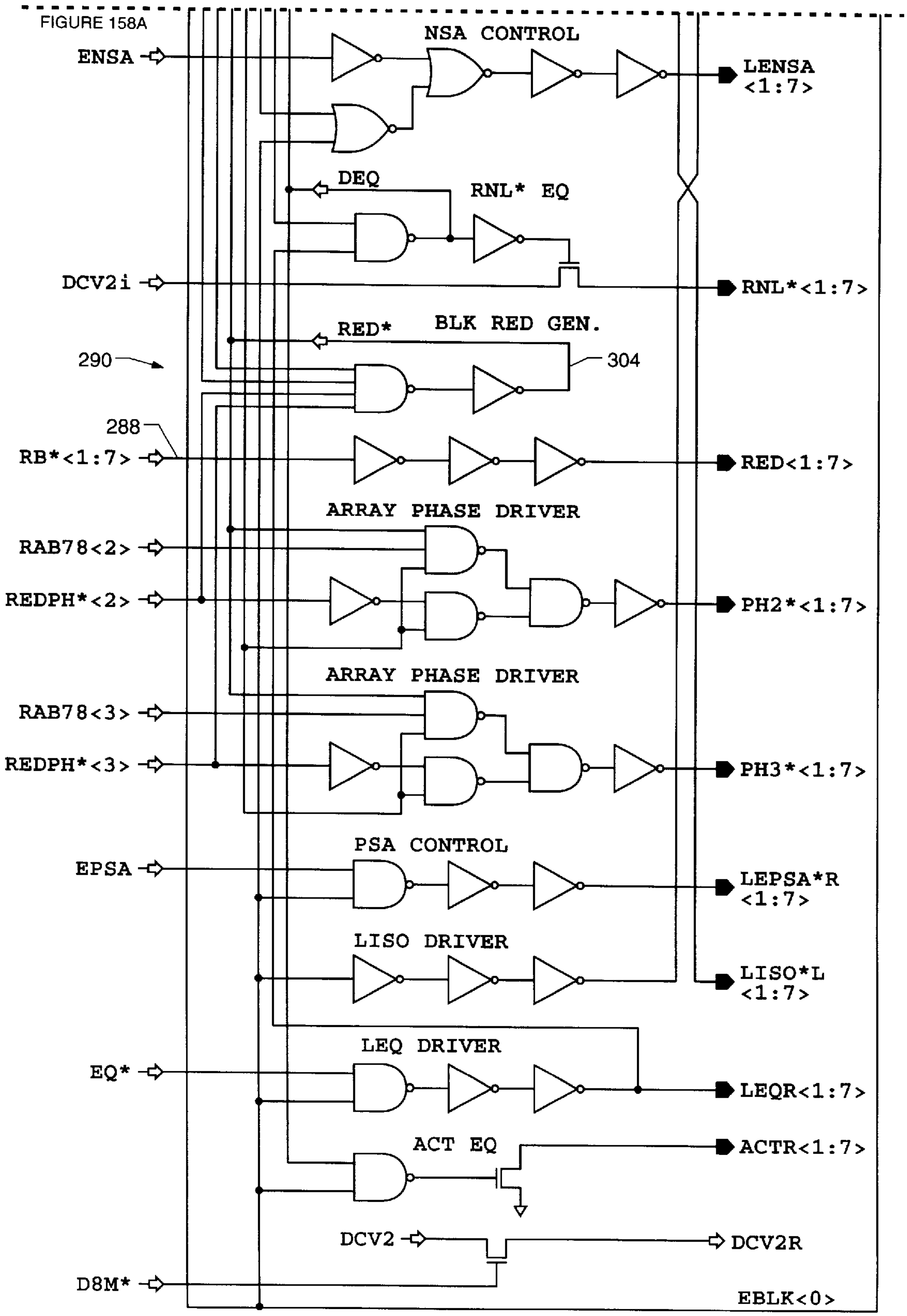
Figure 159:
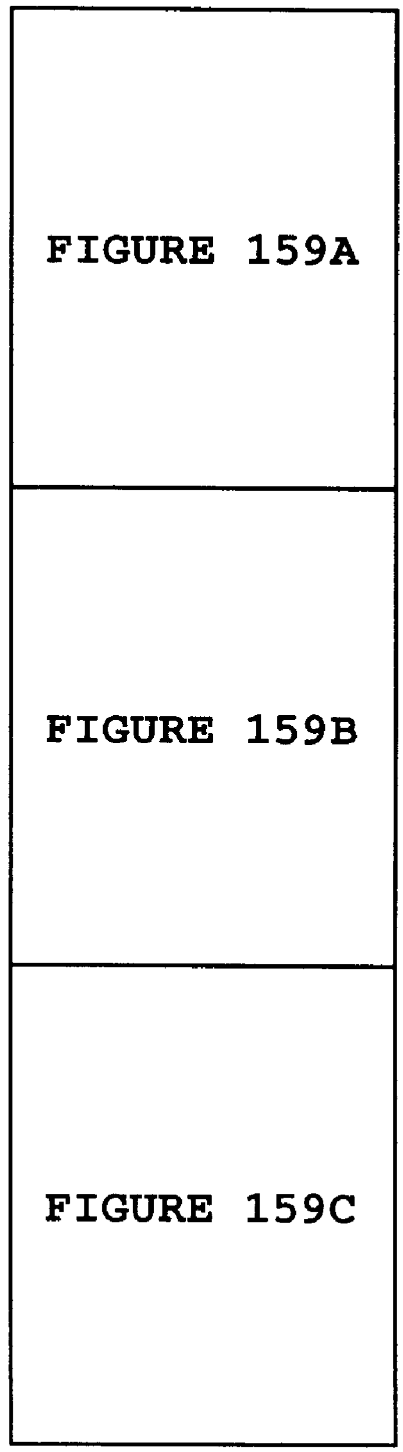
Figure 159A:
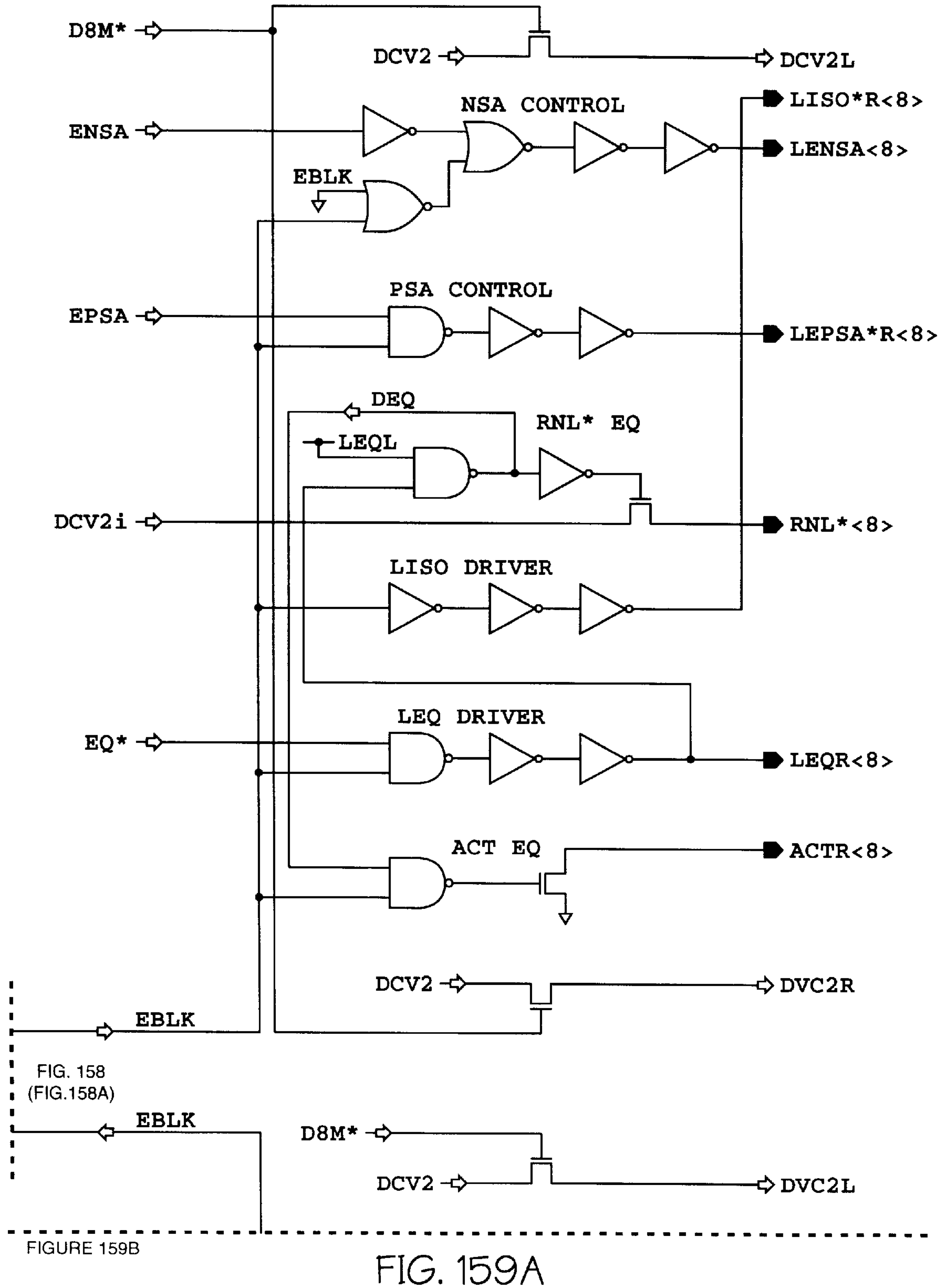
Figure 159B:
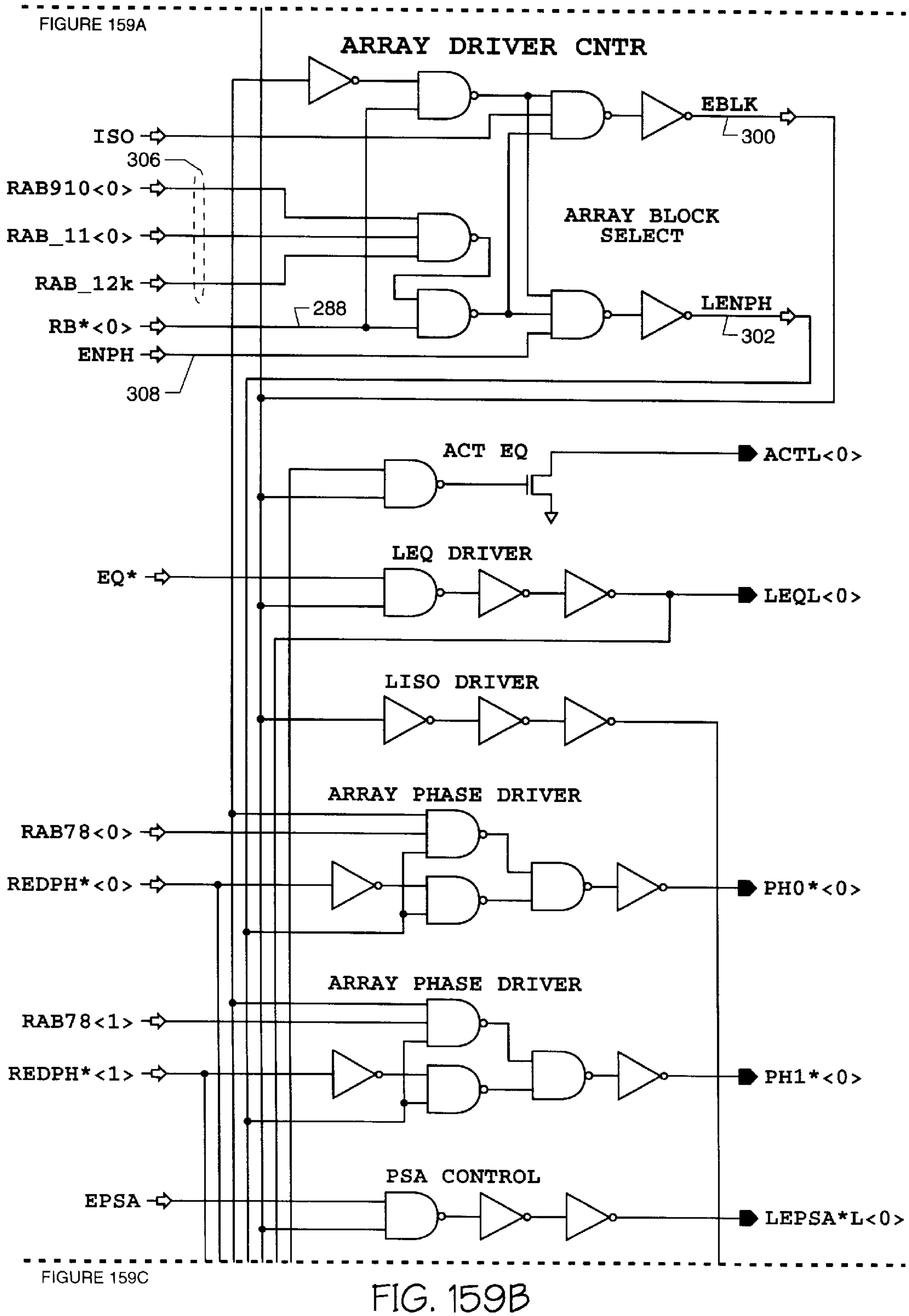
Figure 159C:
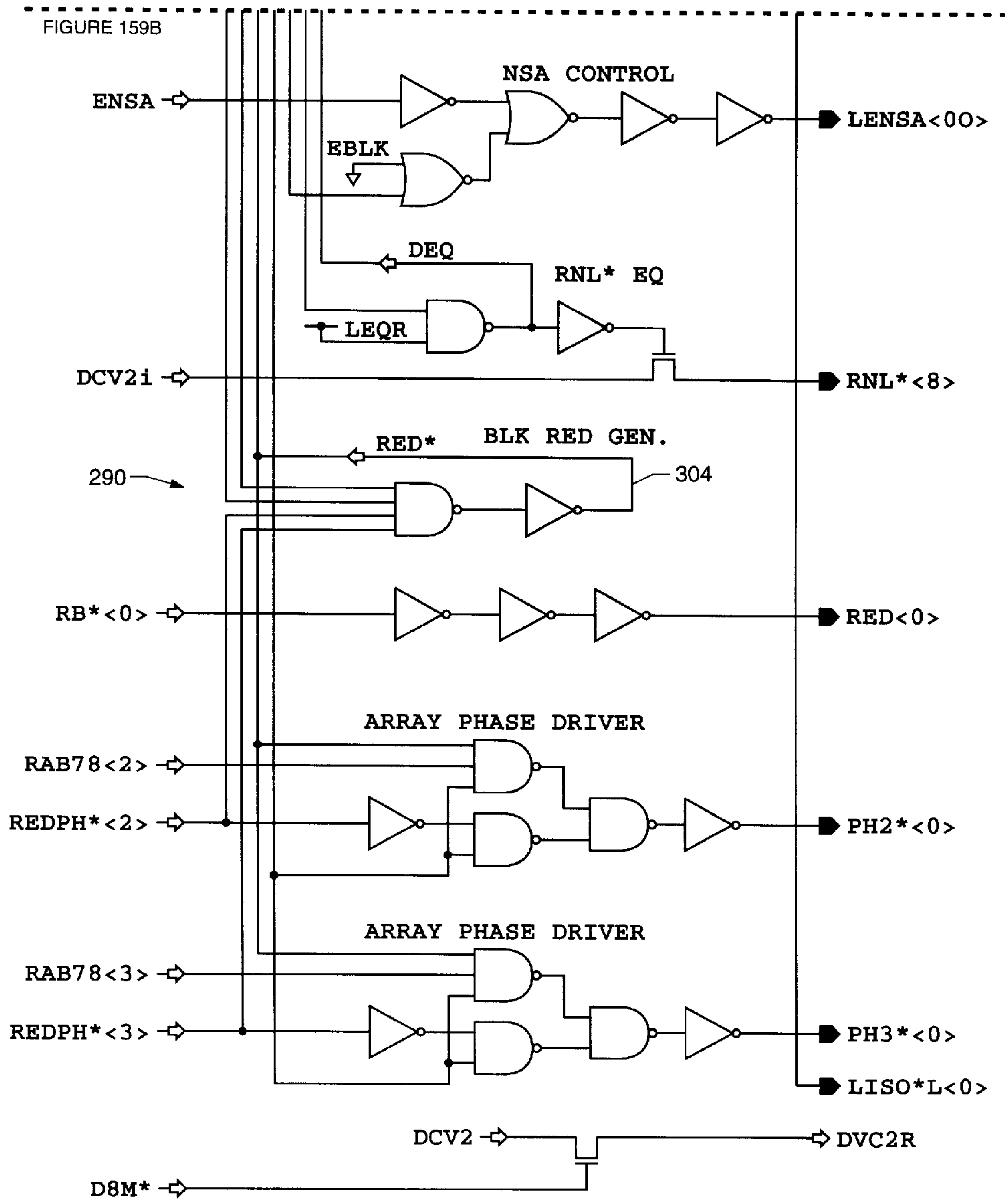
Figure 160:
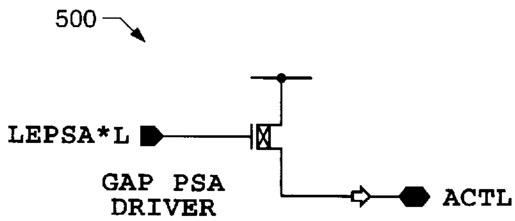
Figure 161:
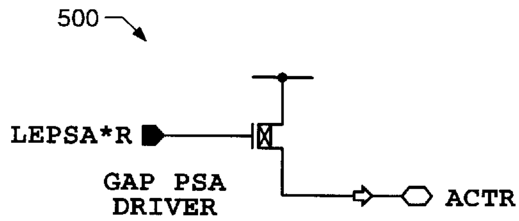
Figure 162:
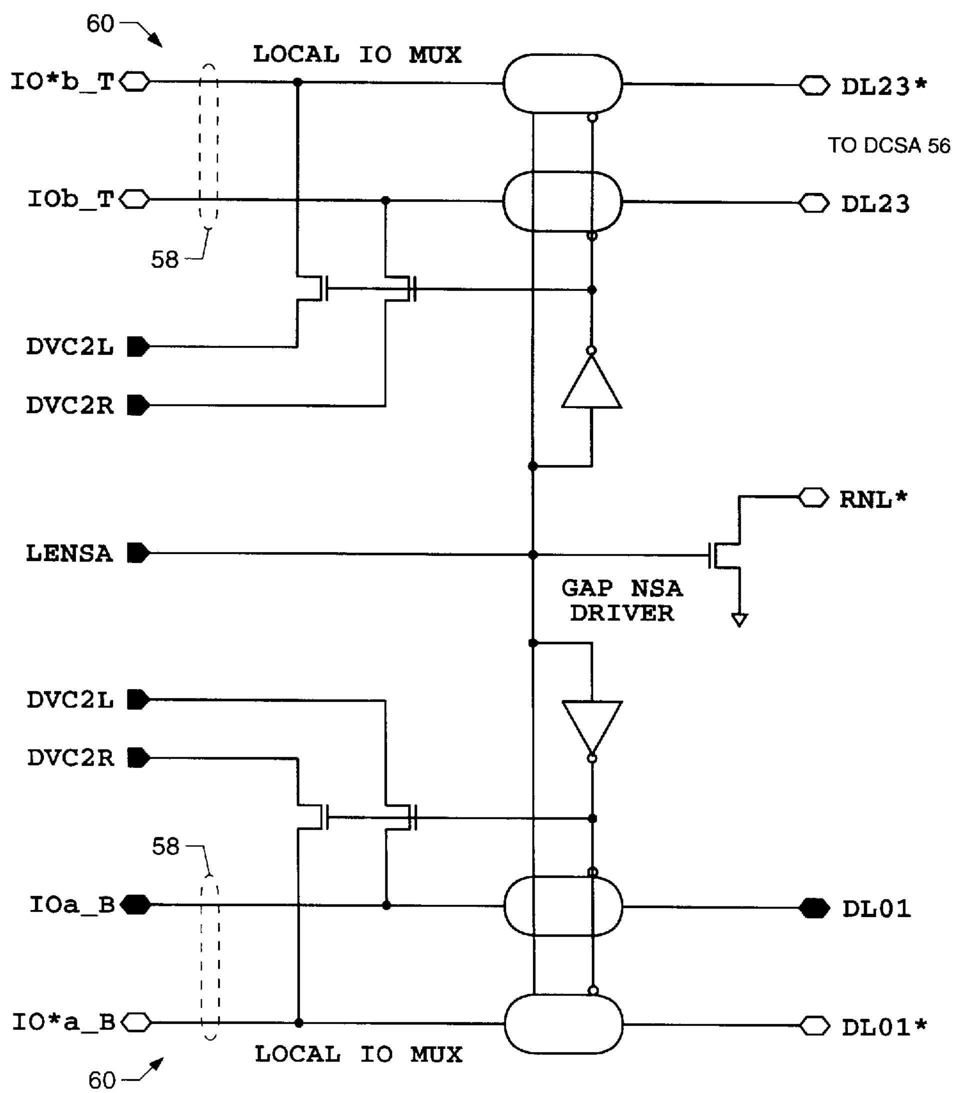
Figure 163:
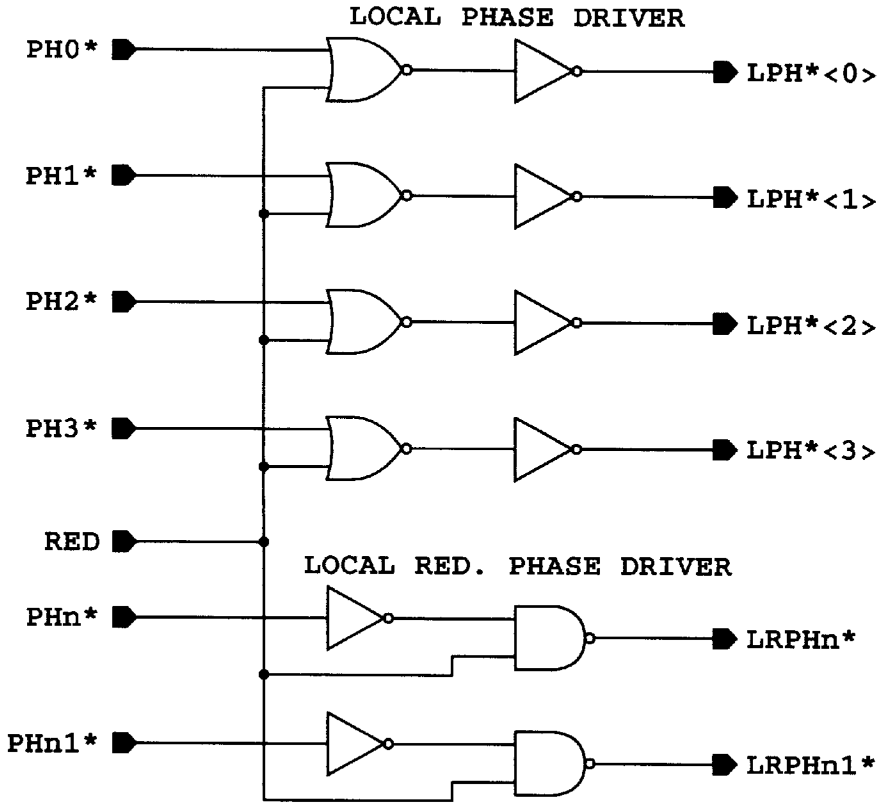
Figure 164:
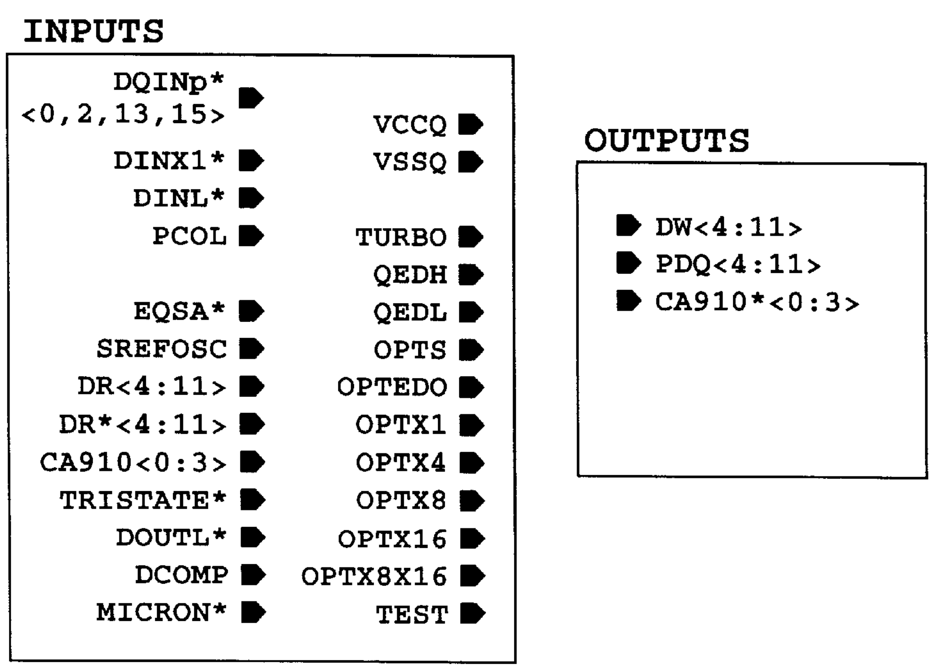
Figure 165:
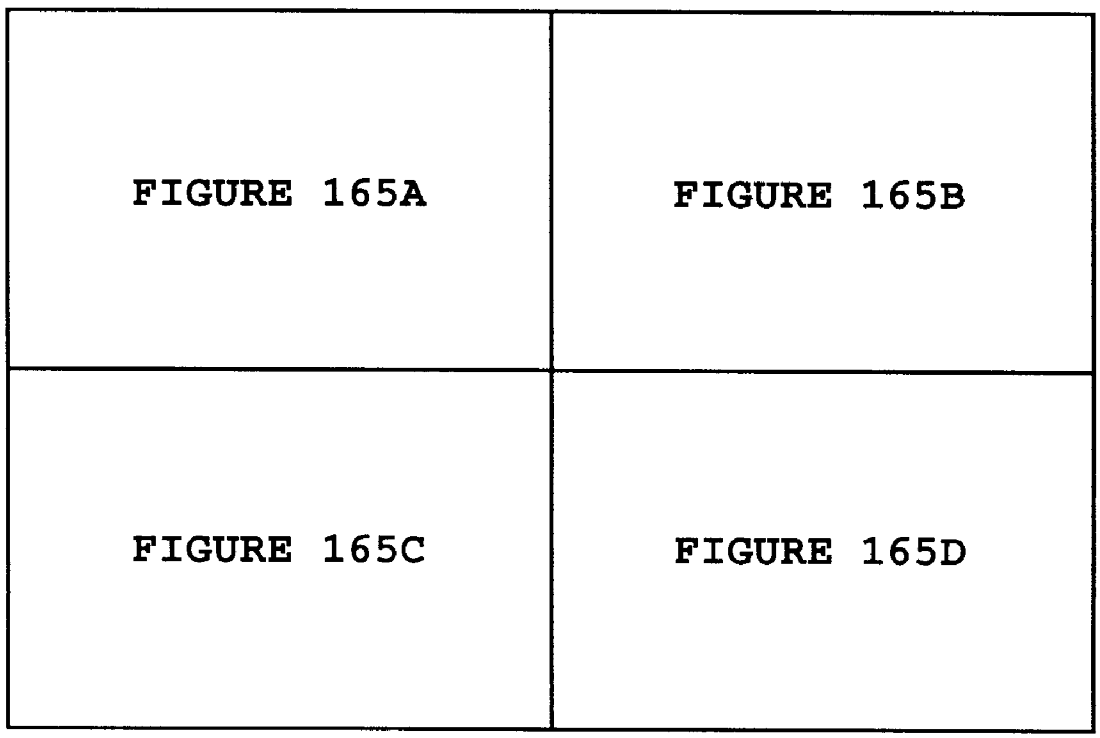
Figure 165A:
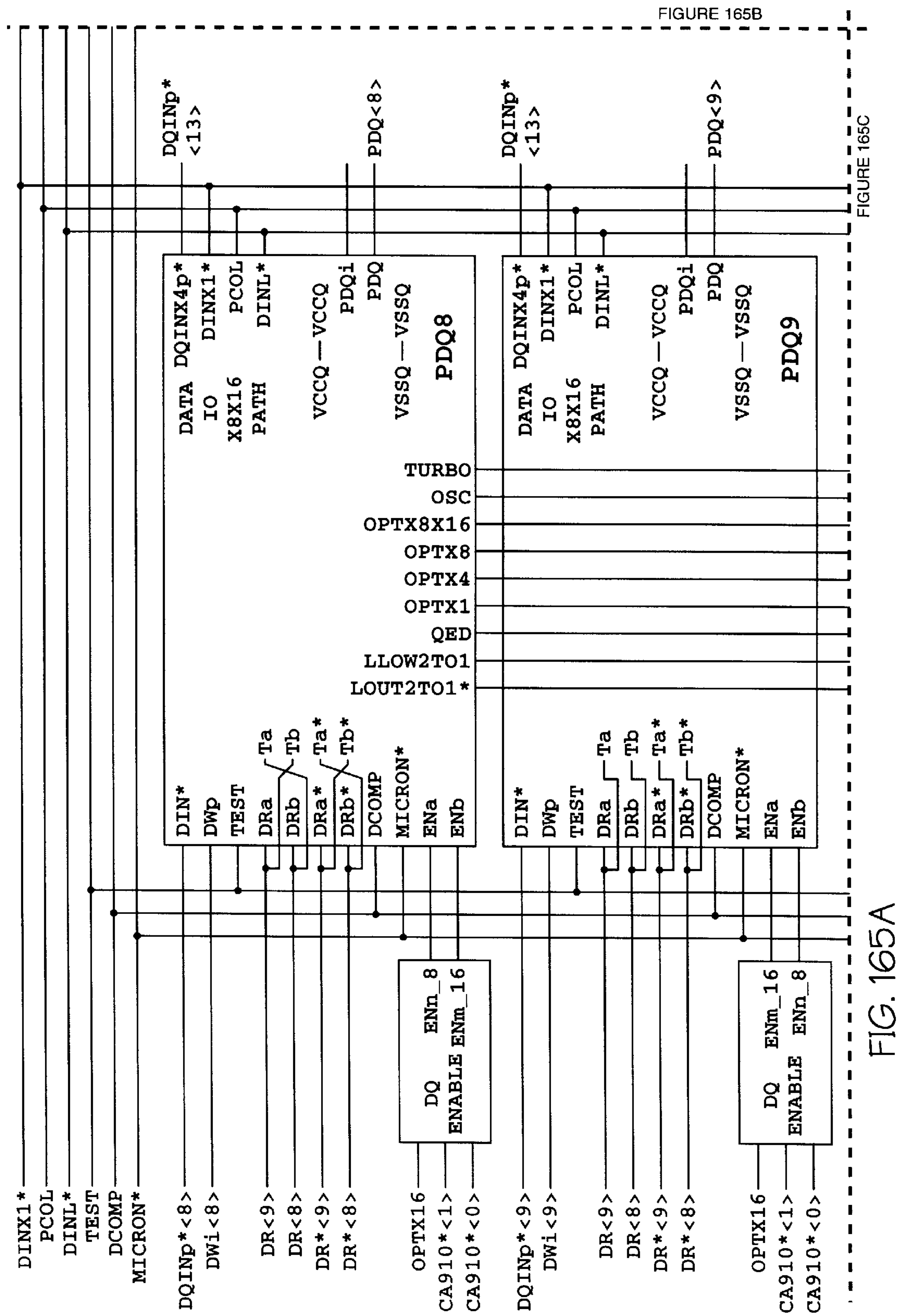
Figure 165B:
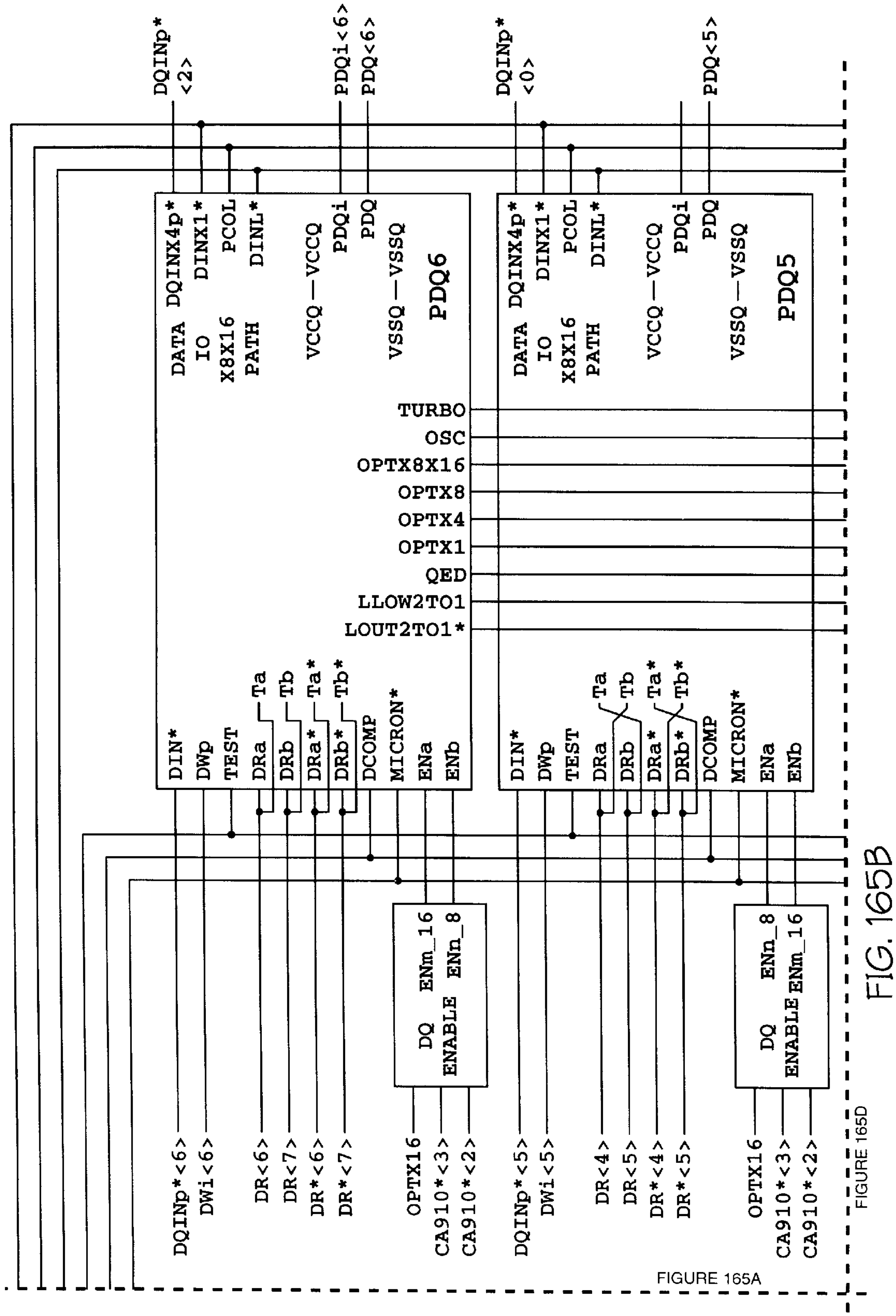
Figure 165C:
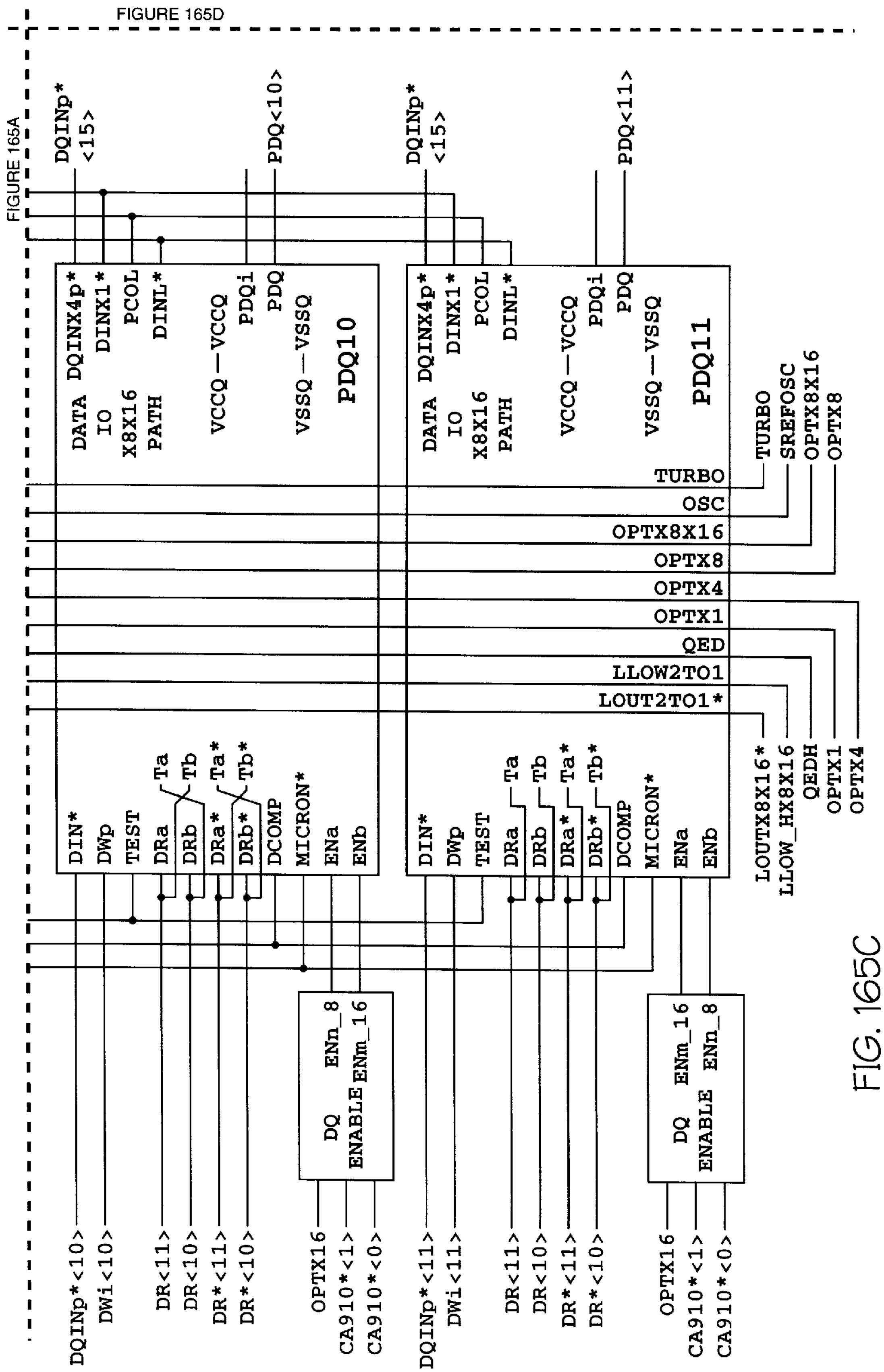
Figure 165D:
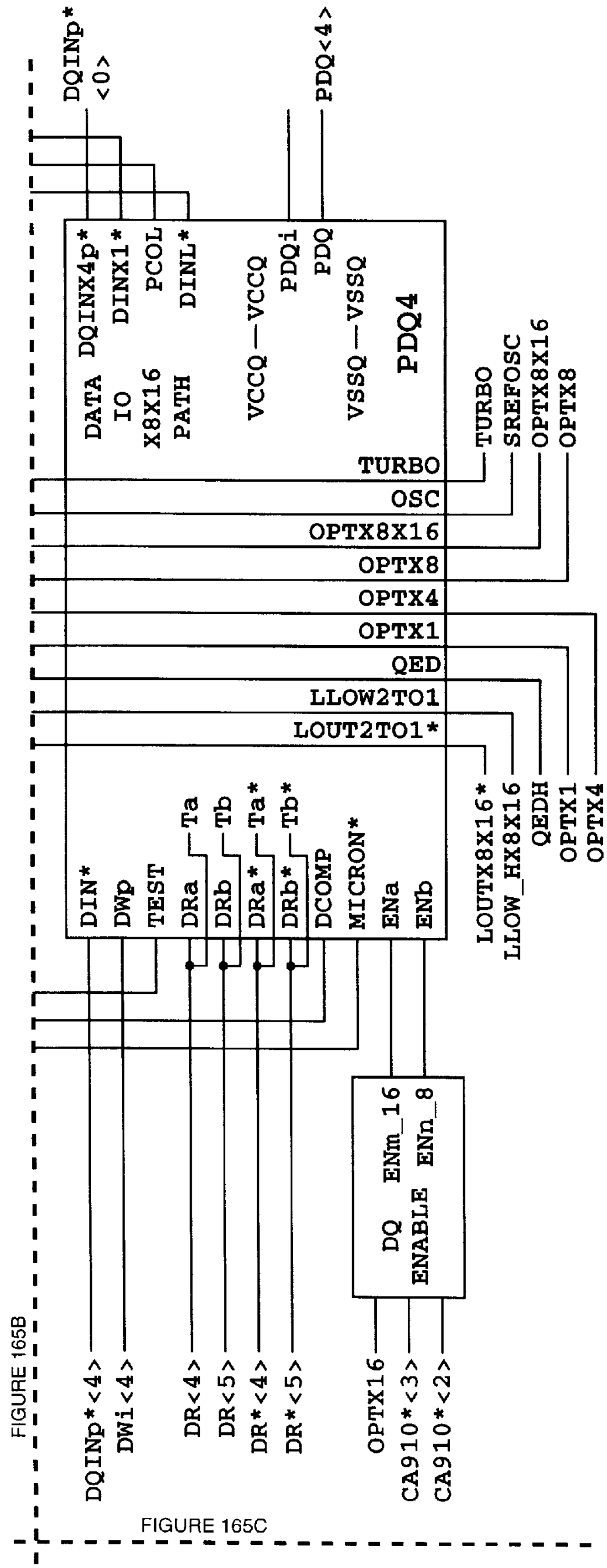
Figure 166:
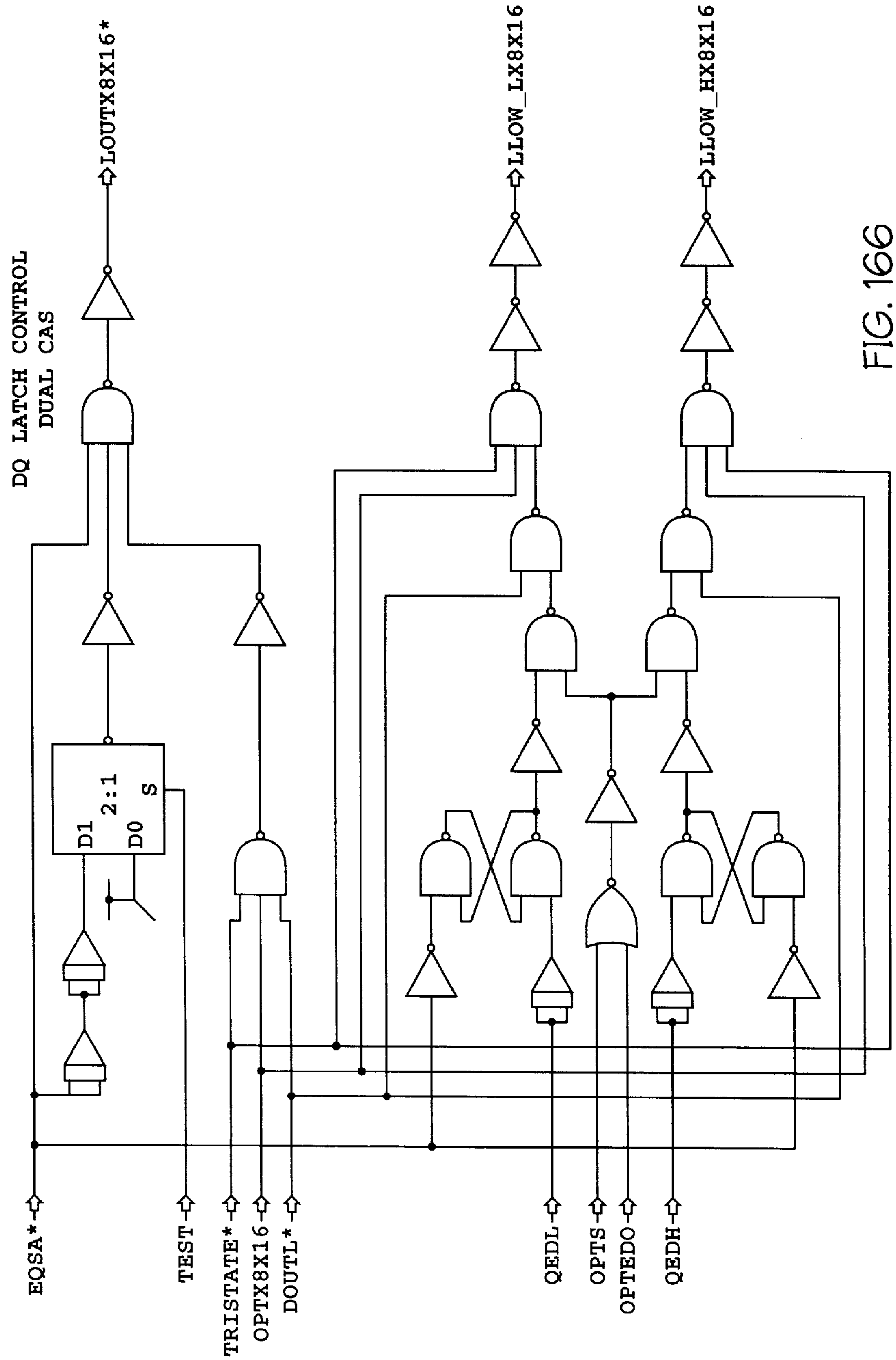
Figures 167, 169:
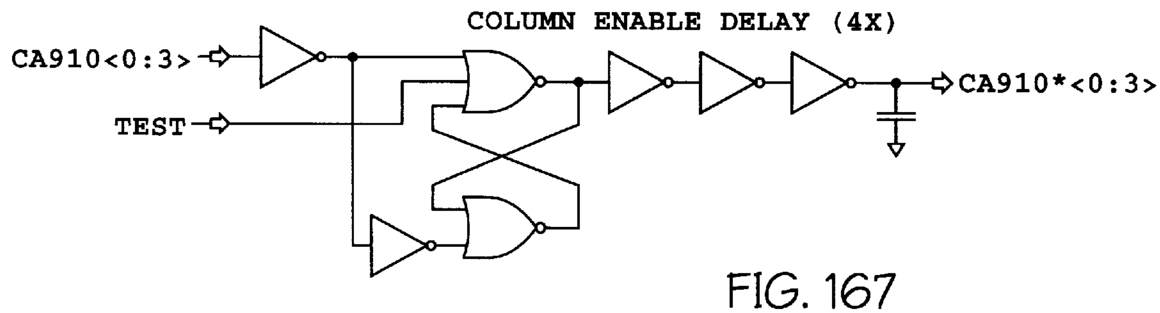
Figures 168, 168A:
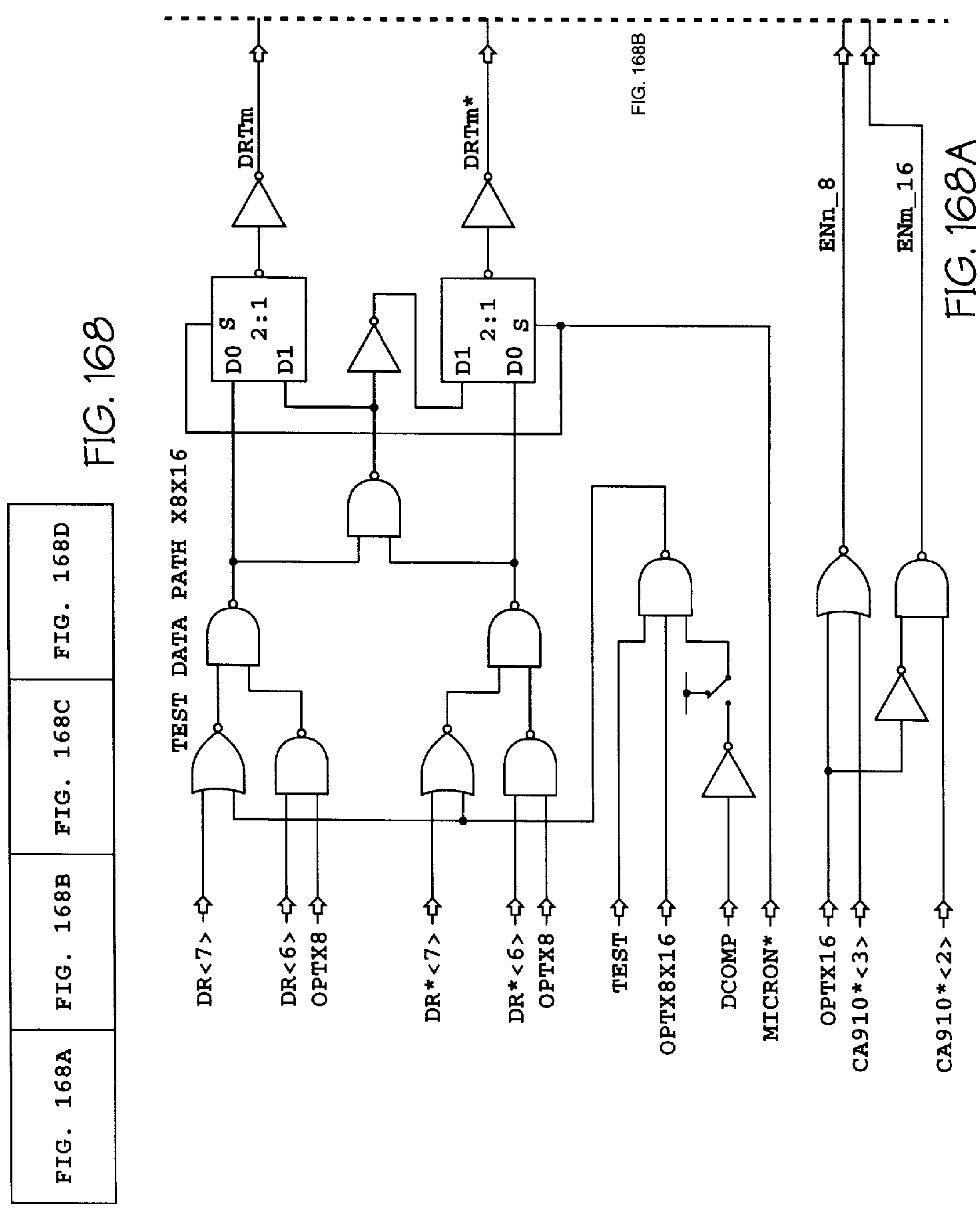
Figure 168B:
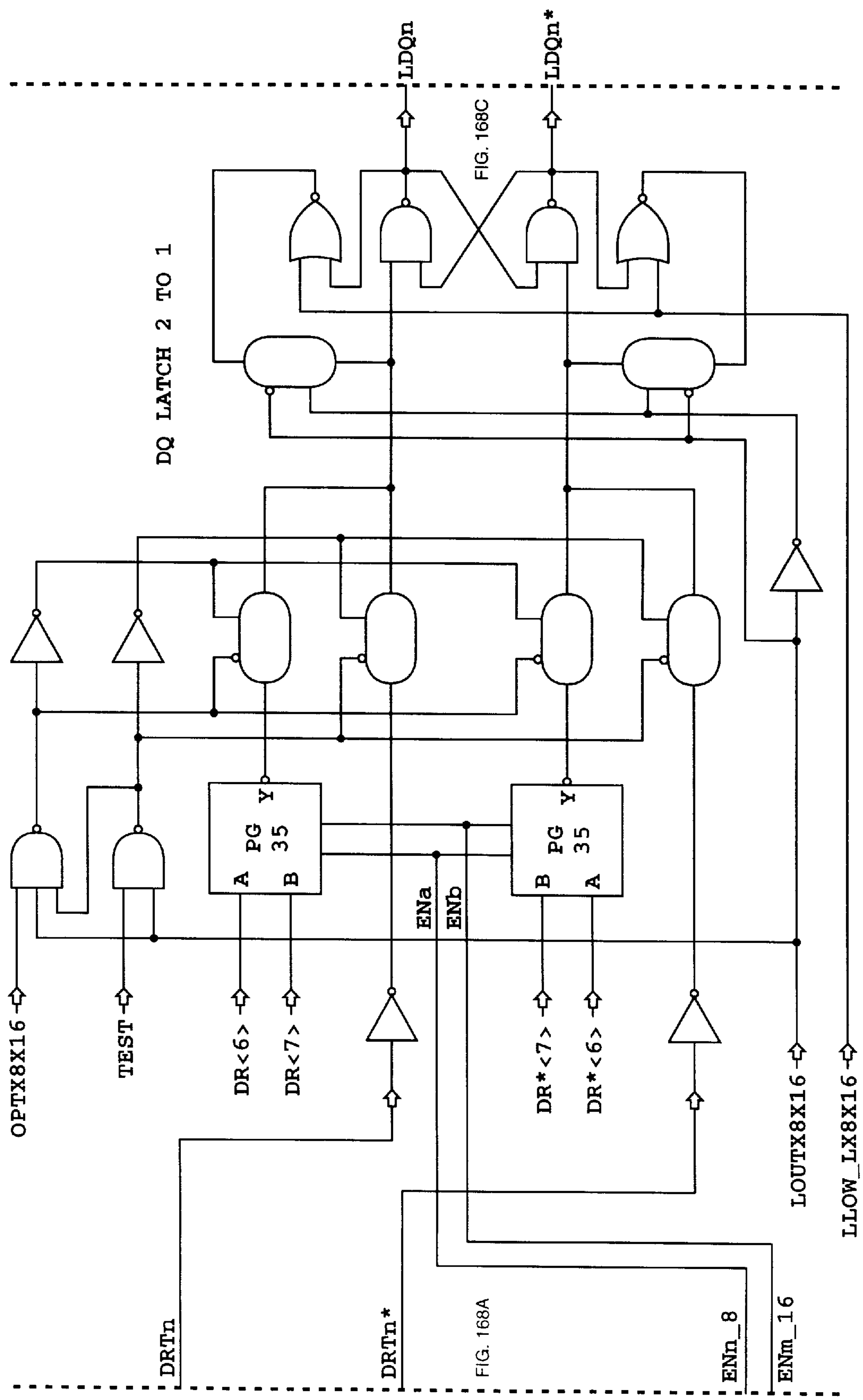
Figure 168C:
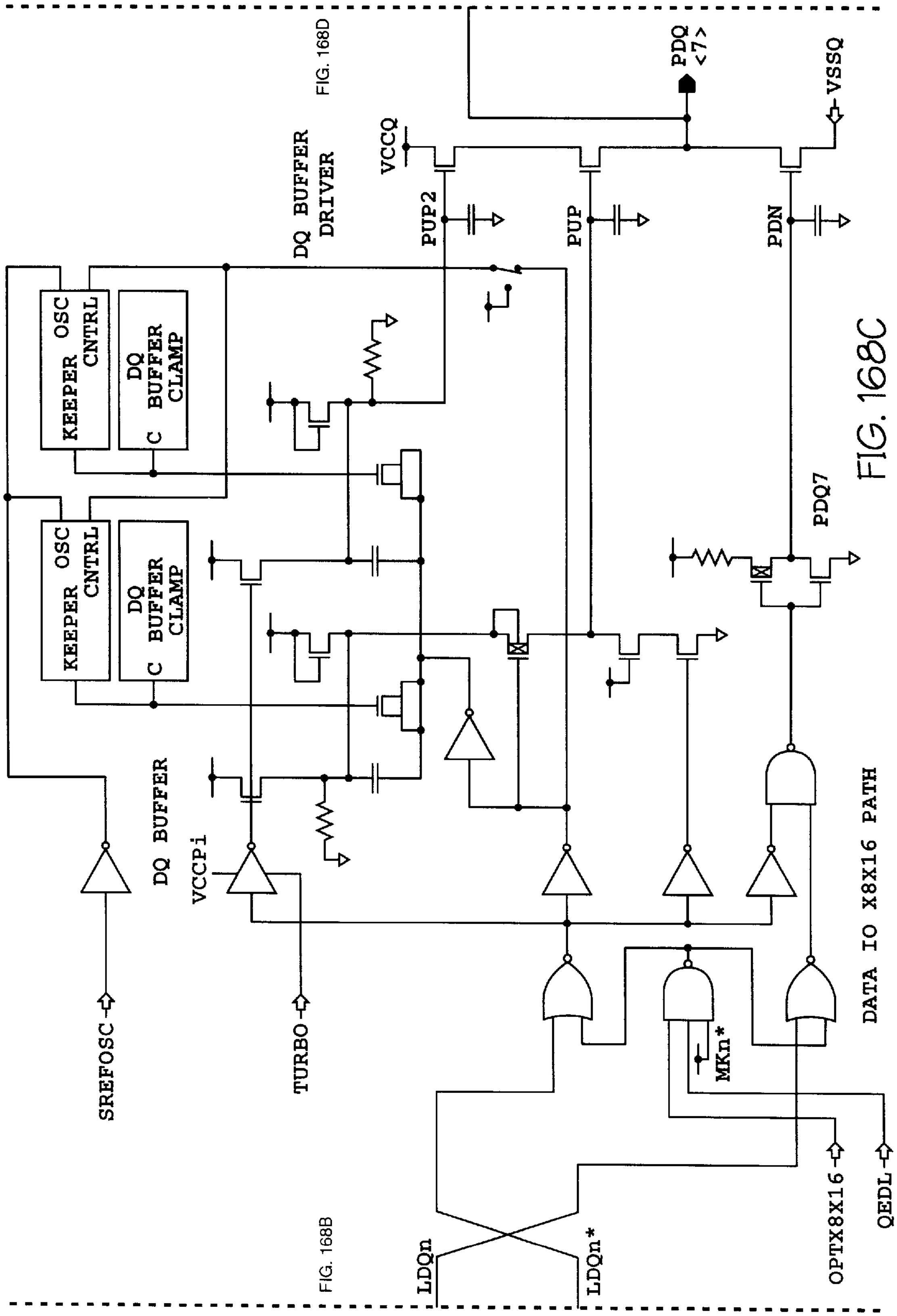
Figure 168D:
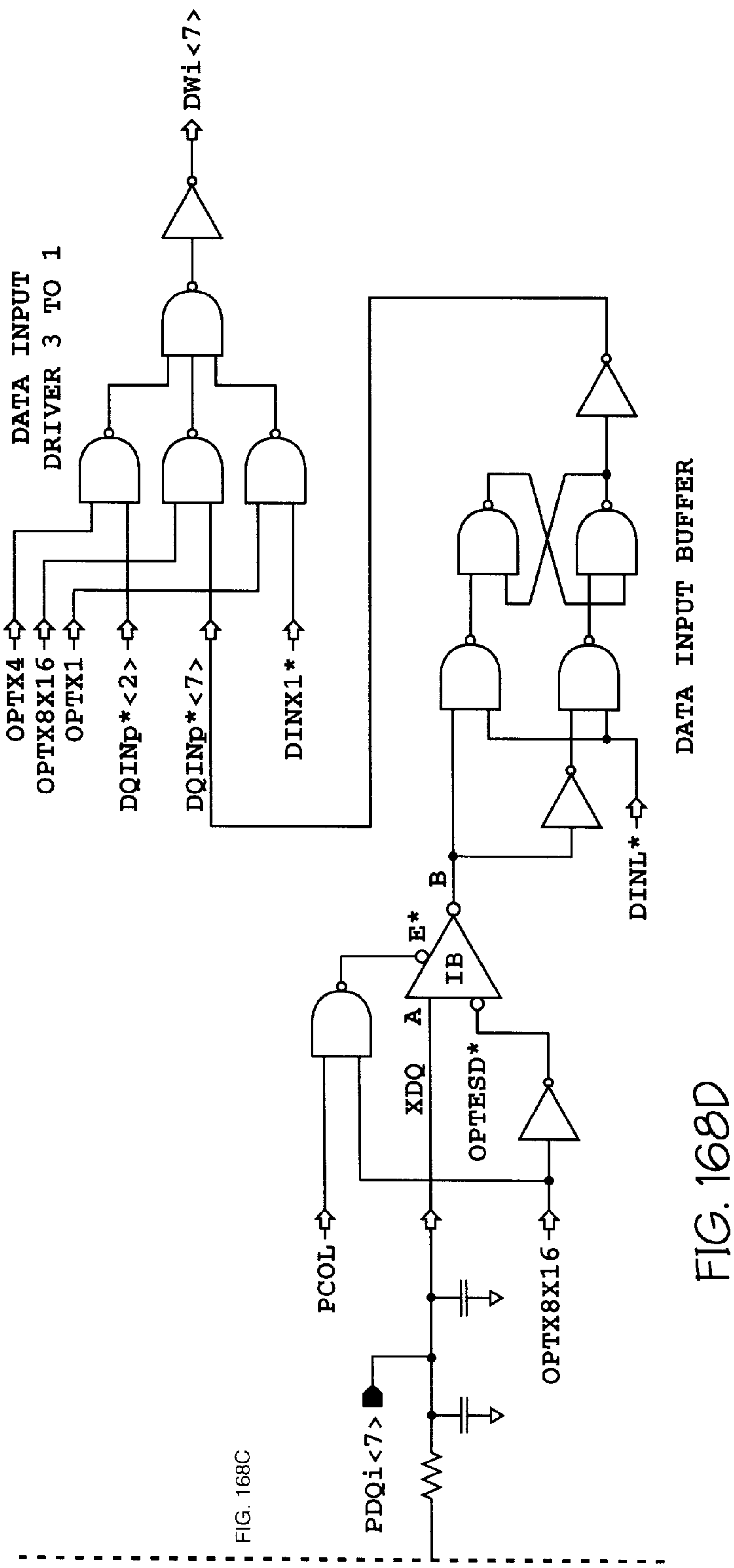
Figure 170:
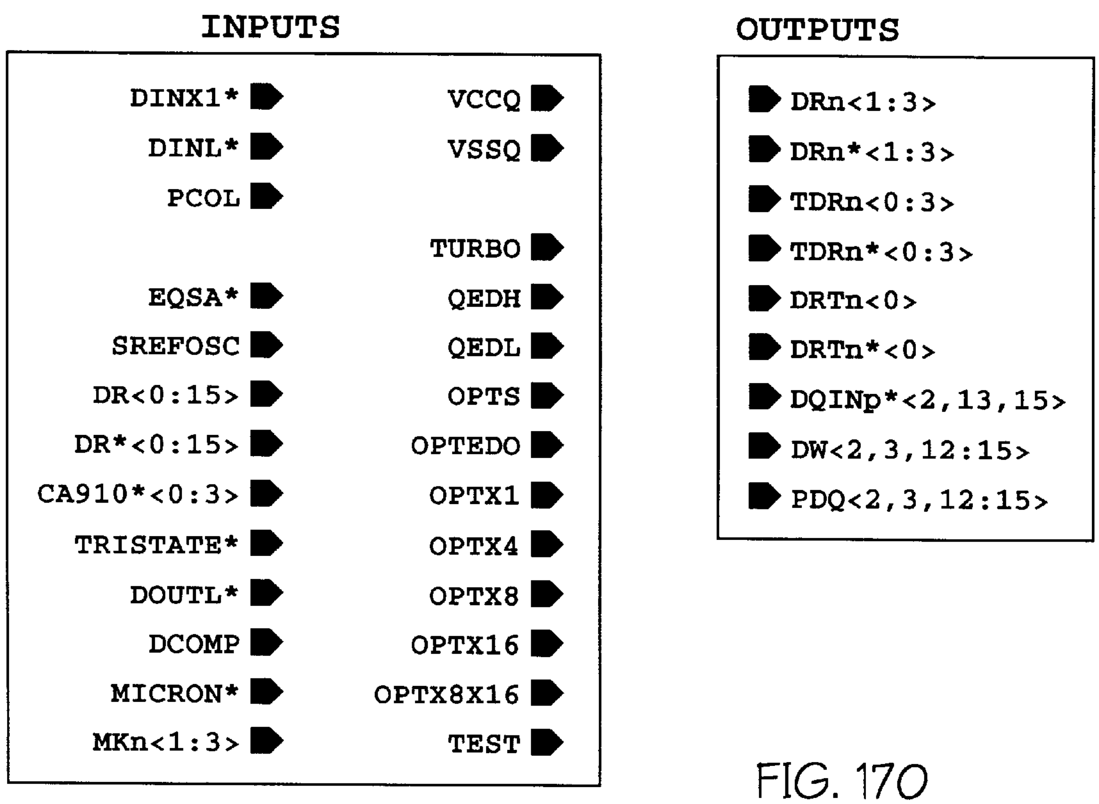
Figure 171:
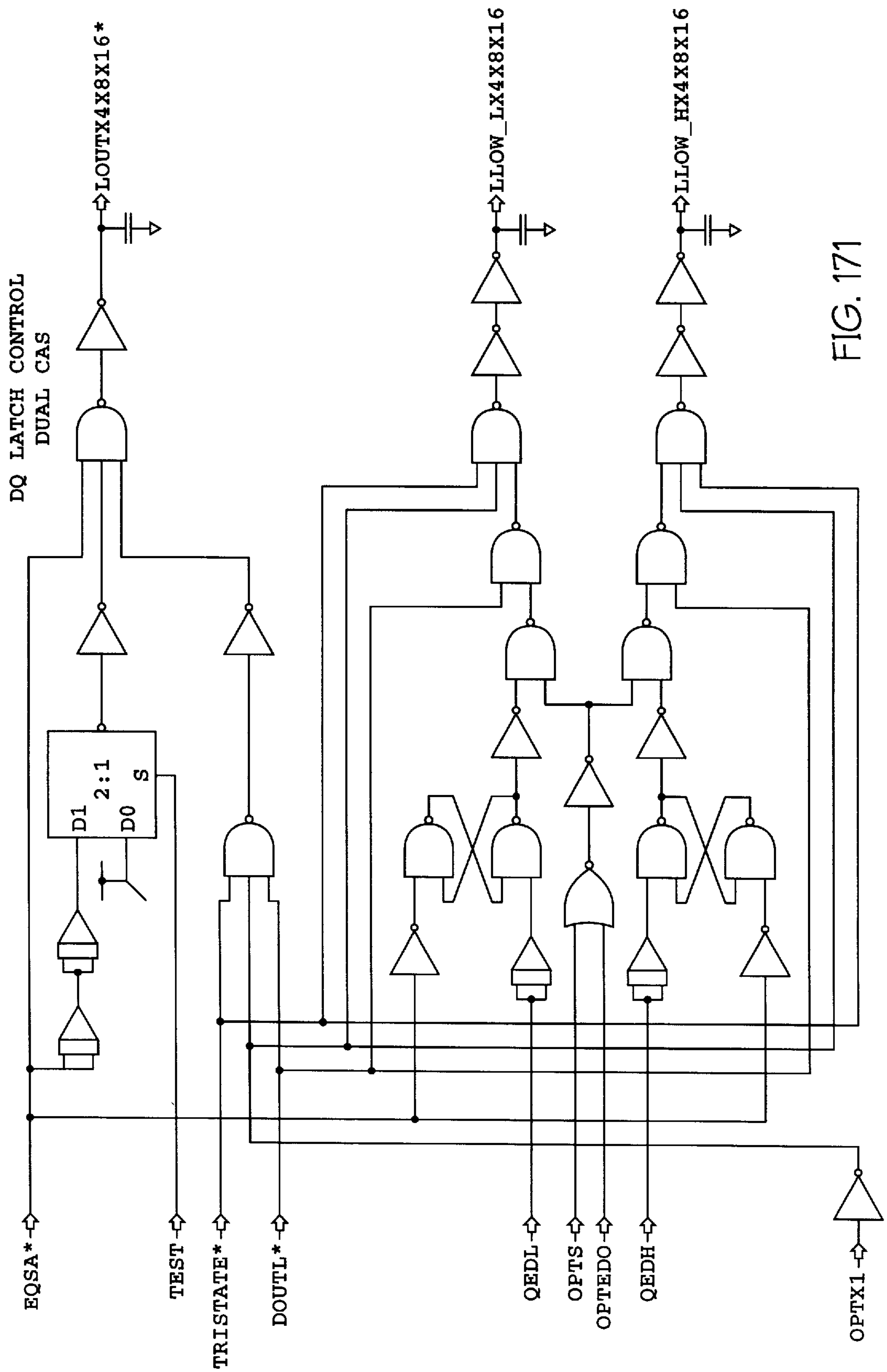
Figure 172:
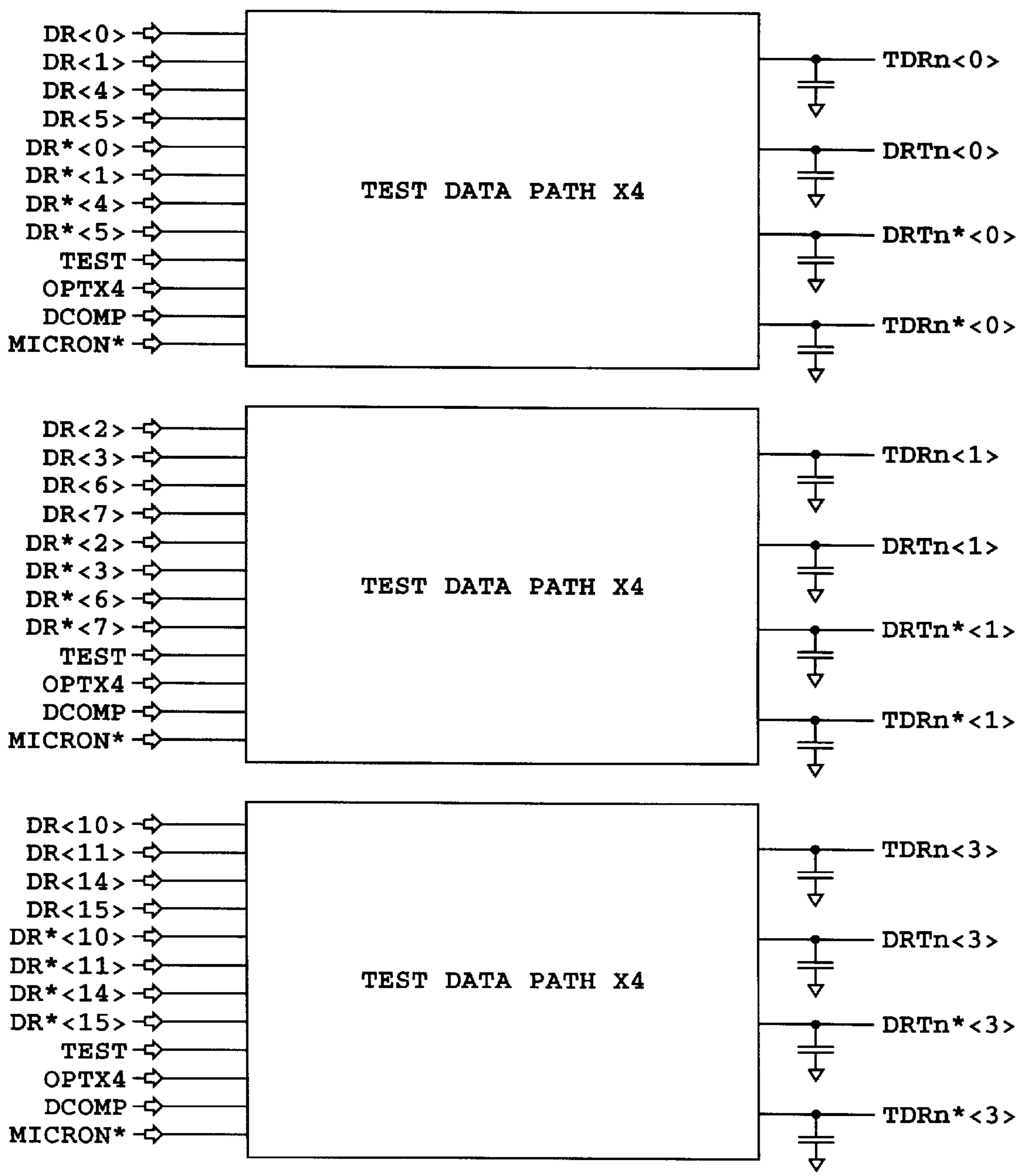
Figure 173:
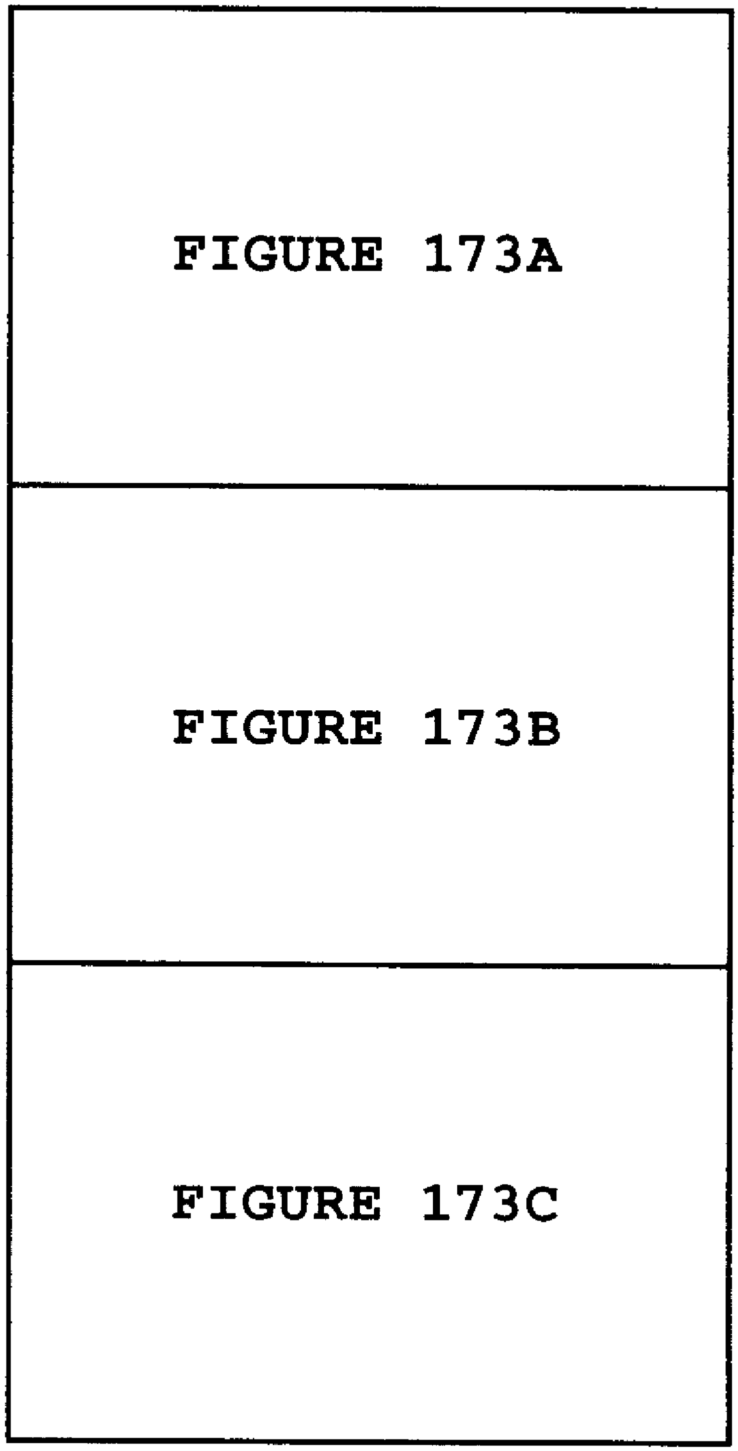
Figure 173A:
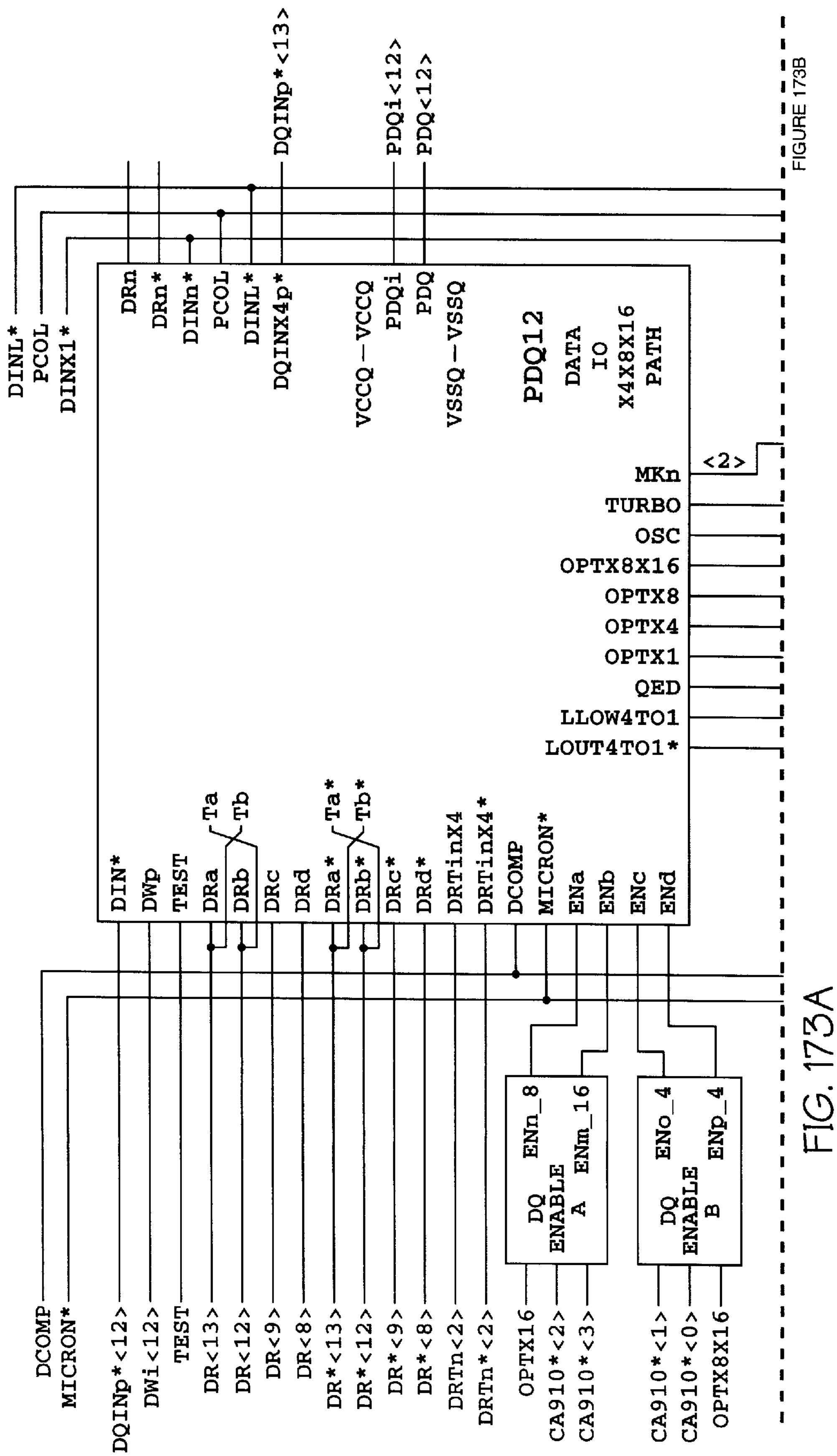
Figure 173B:
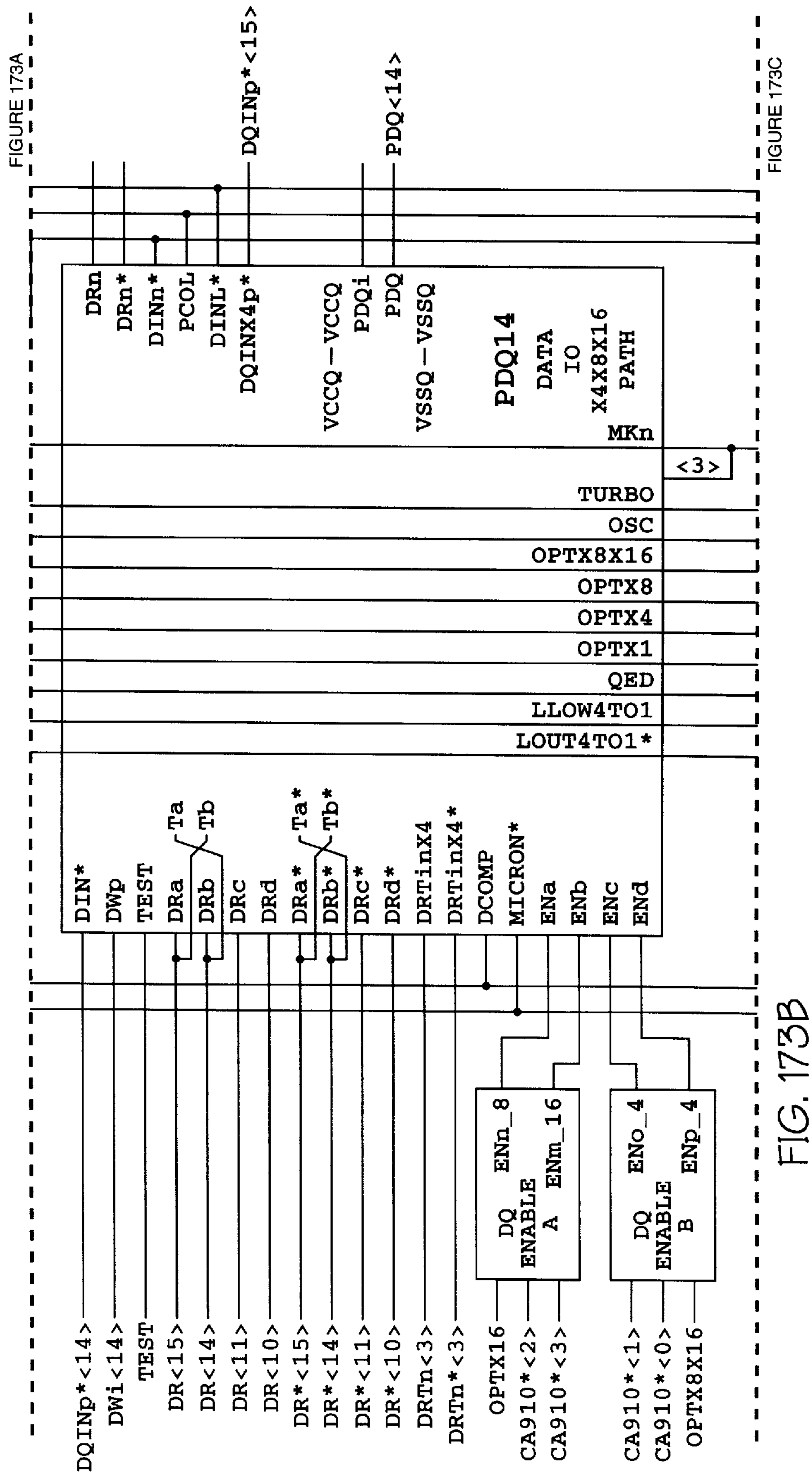
Figure 173C:
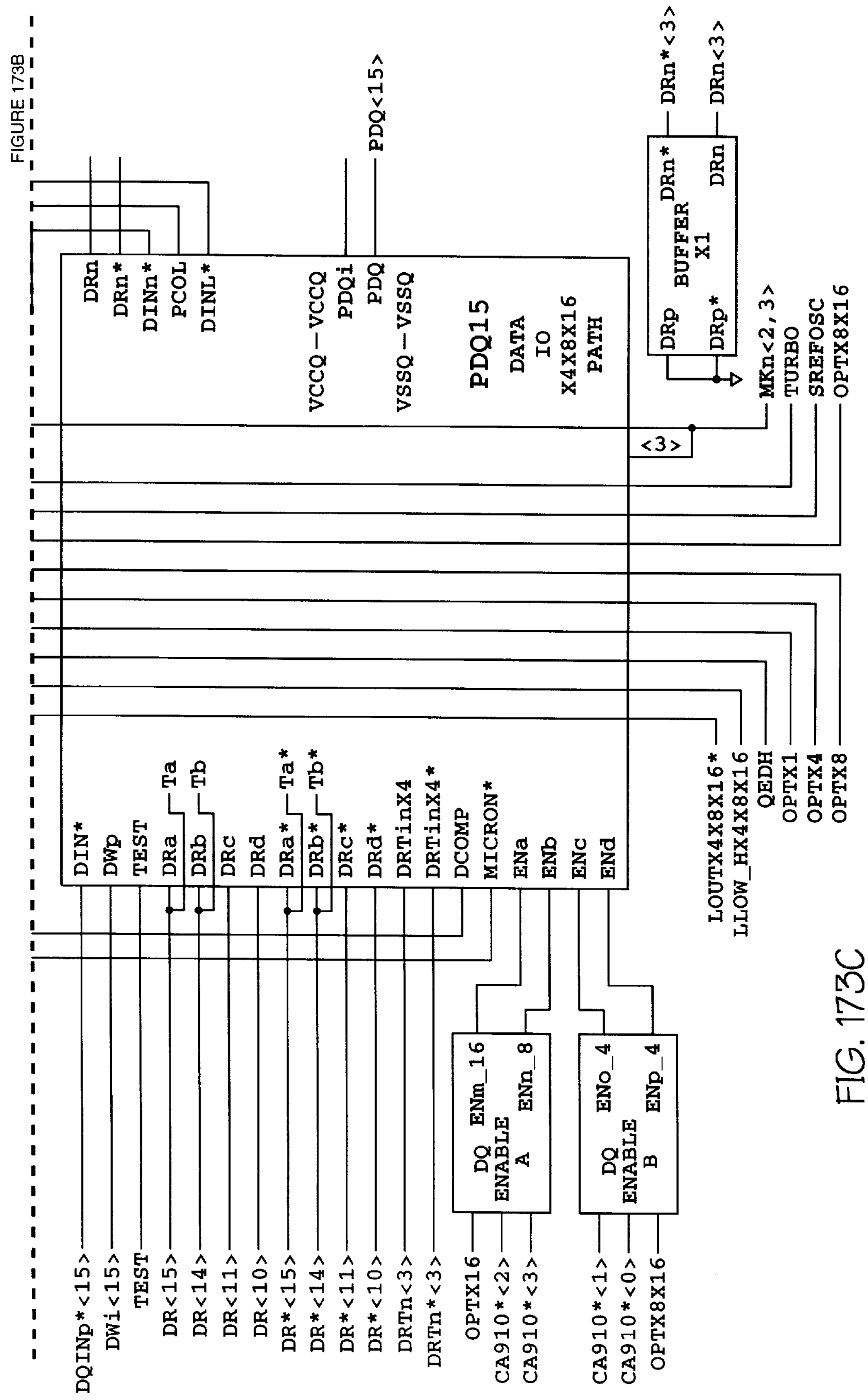
Figure 174:
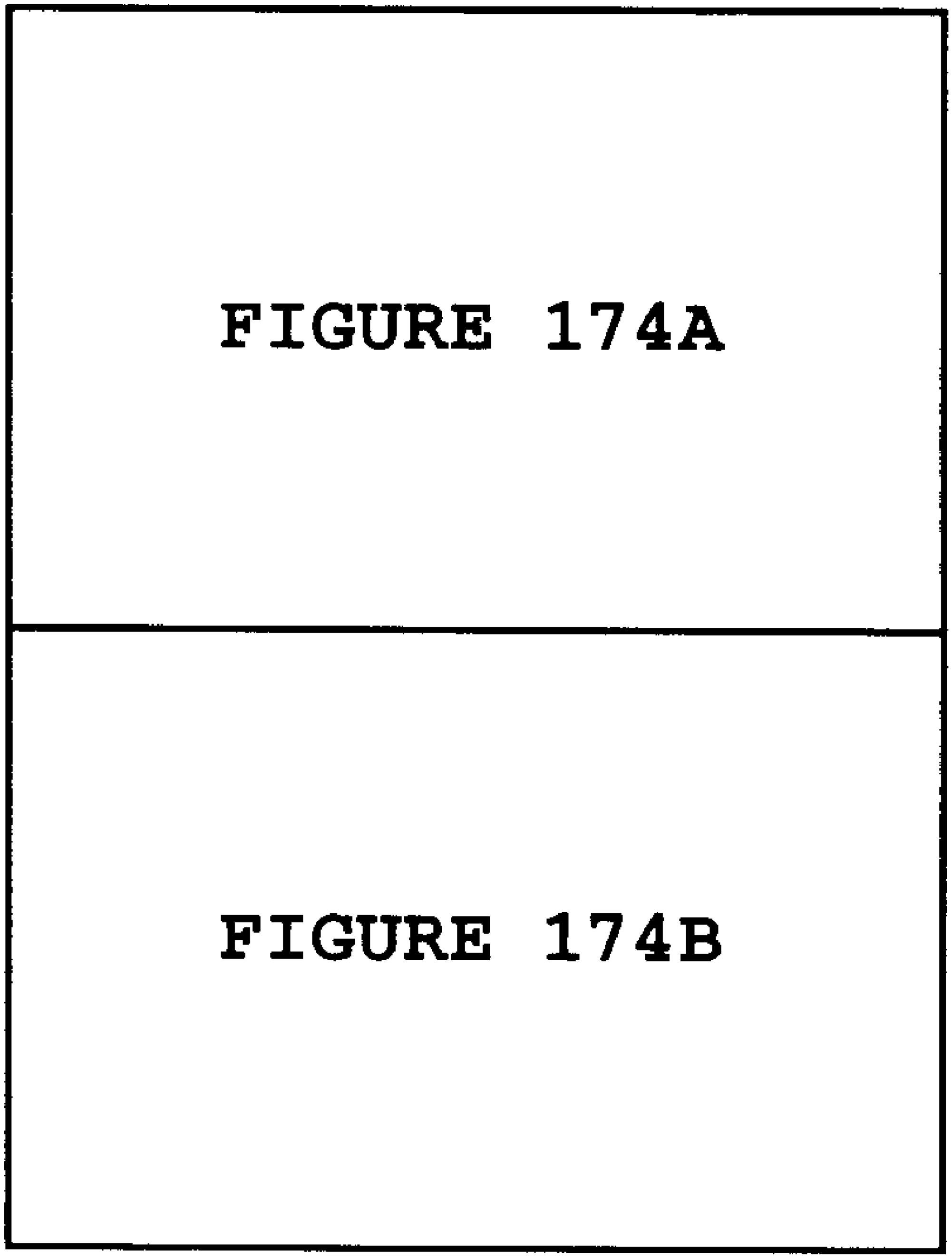
Figure 174A:
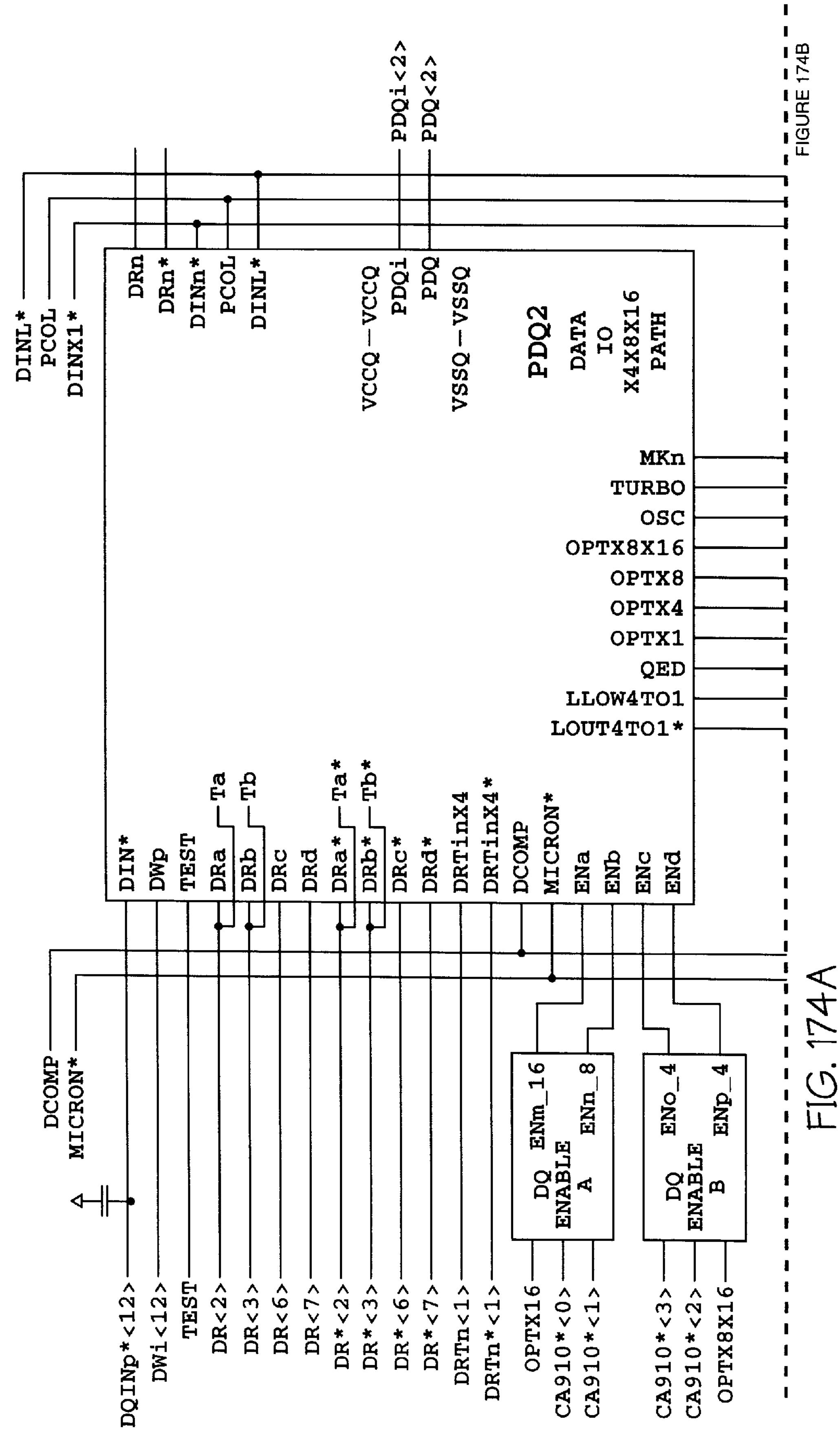
Figure 174B:
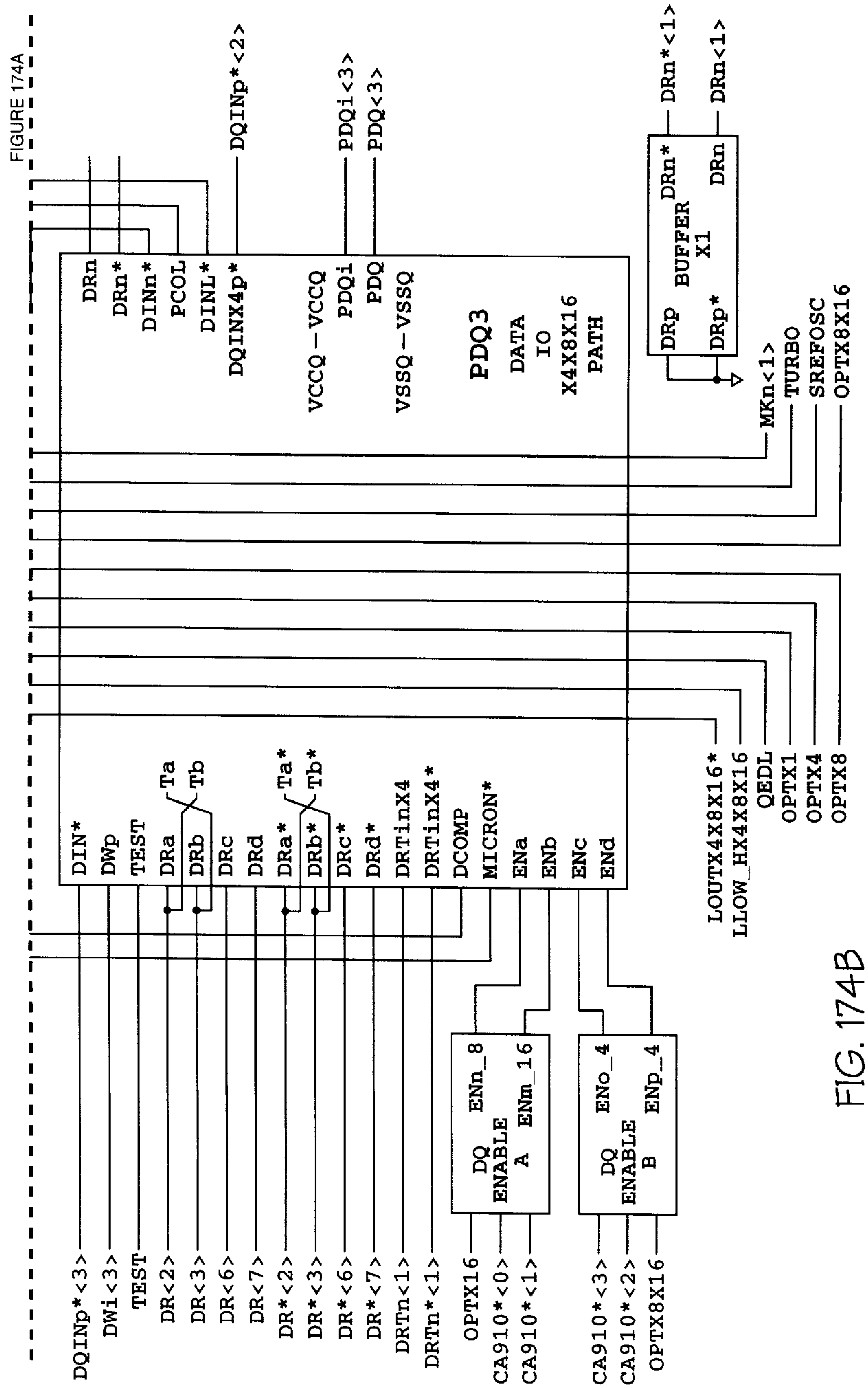
Figure 175:
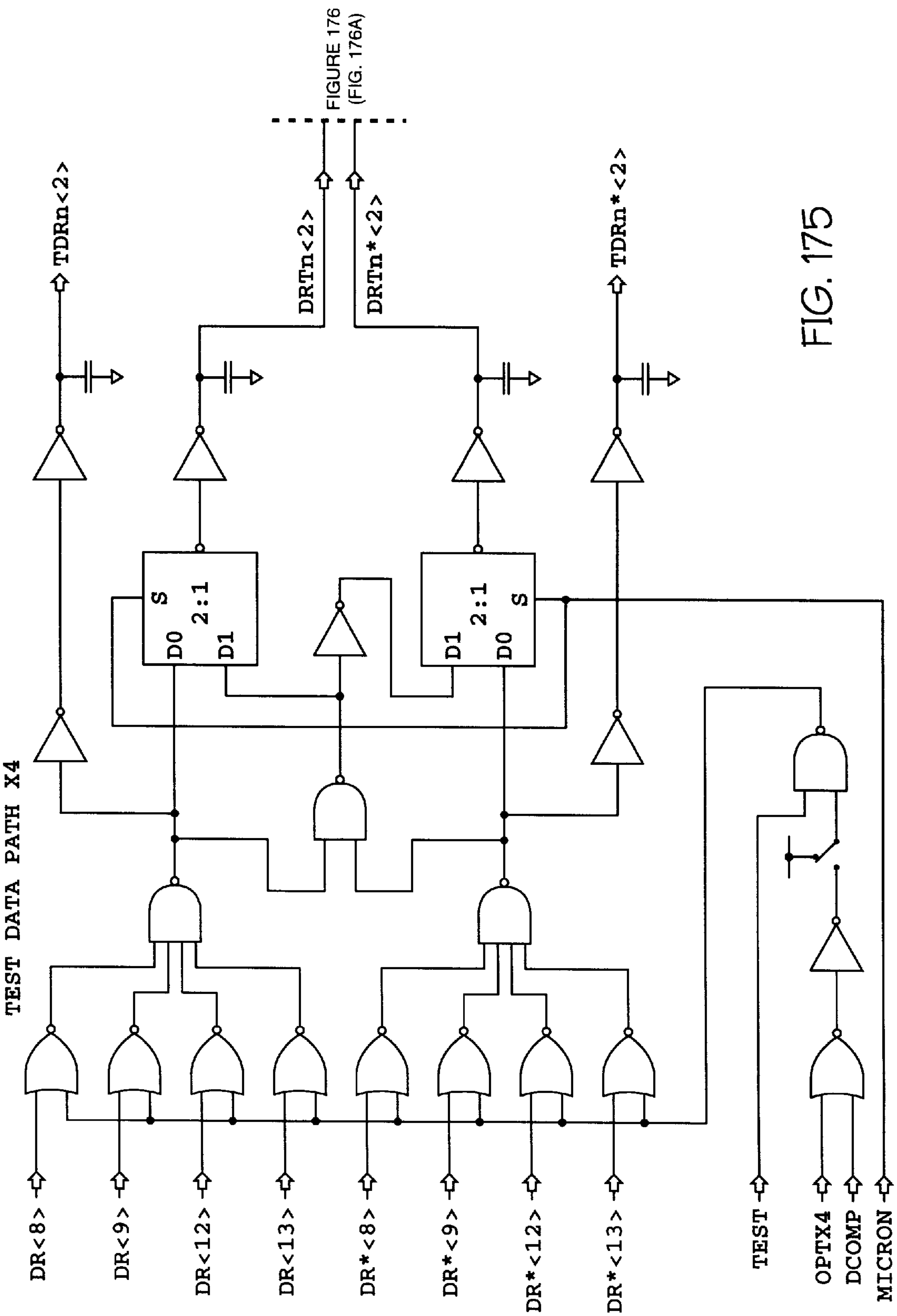
Figures 176, 176A:
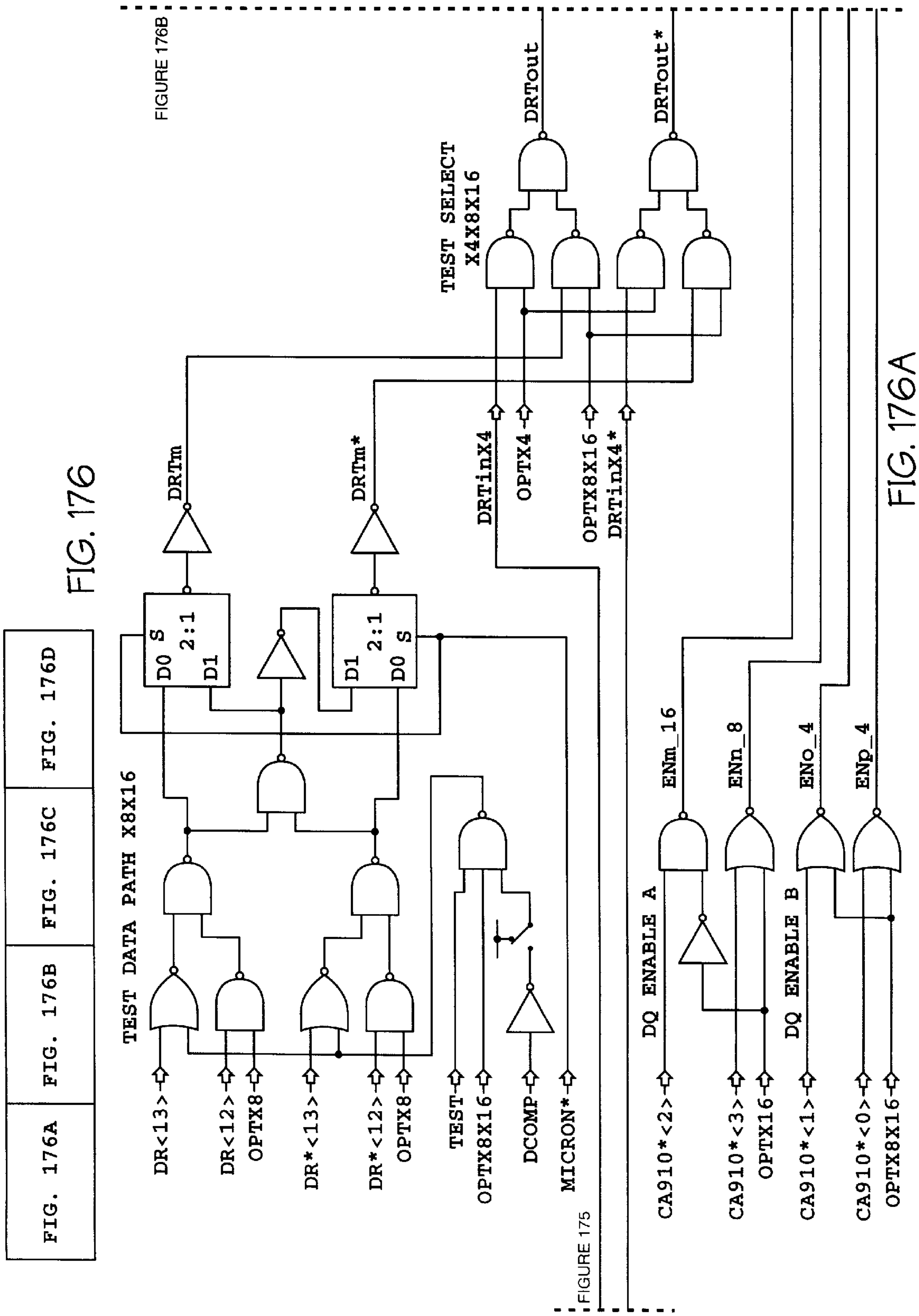
Figure 176B:
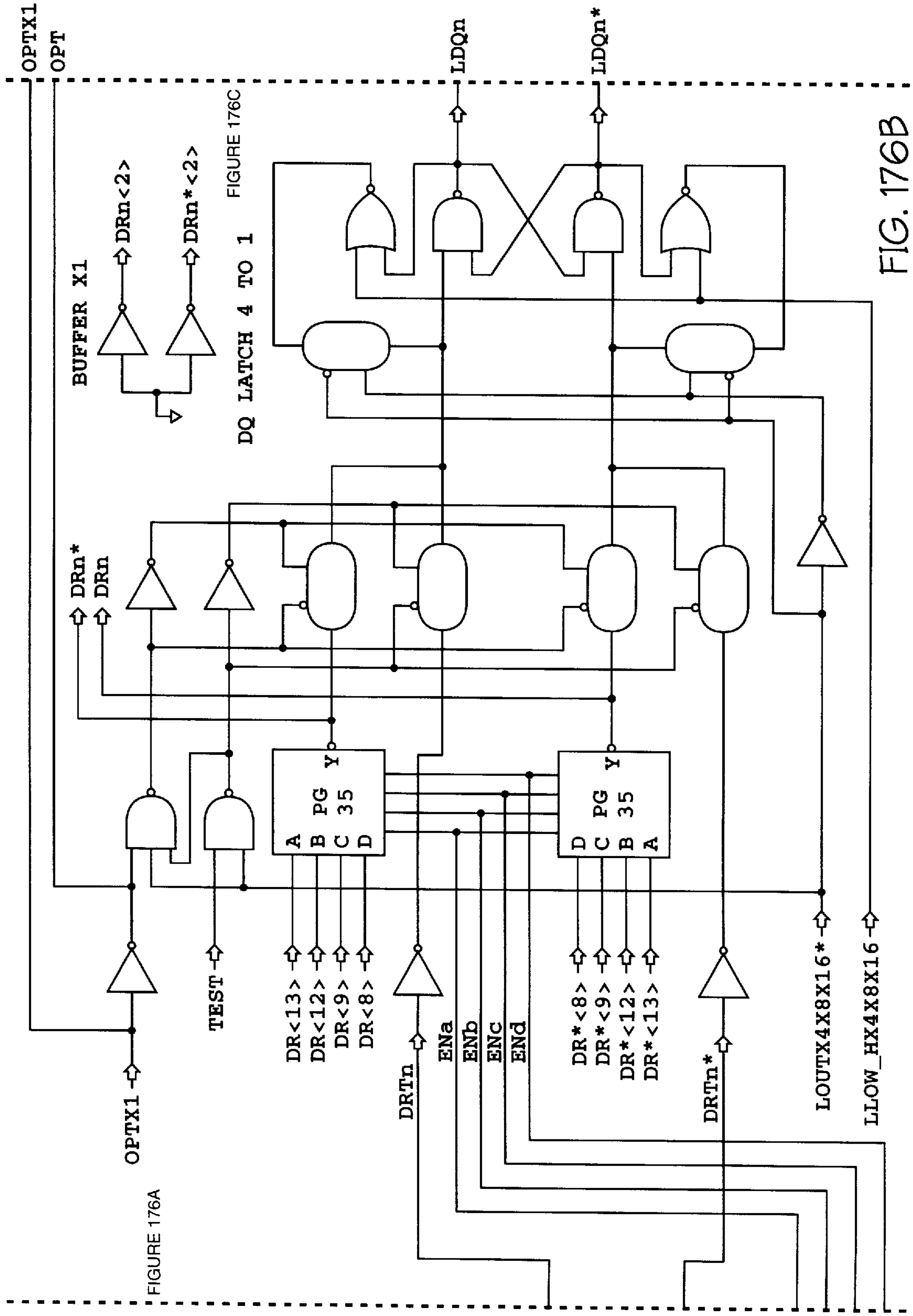
Figure 176C:
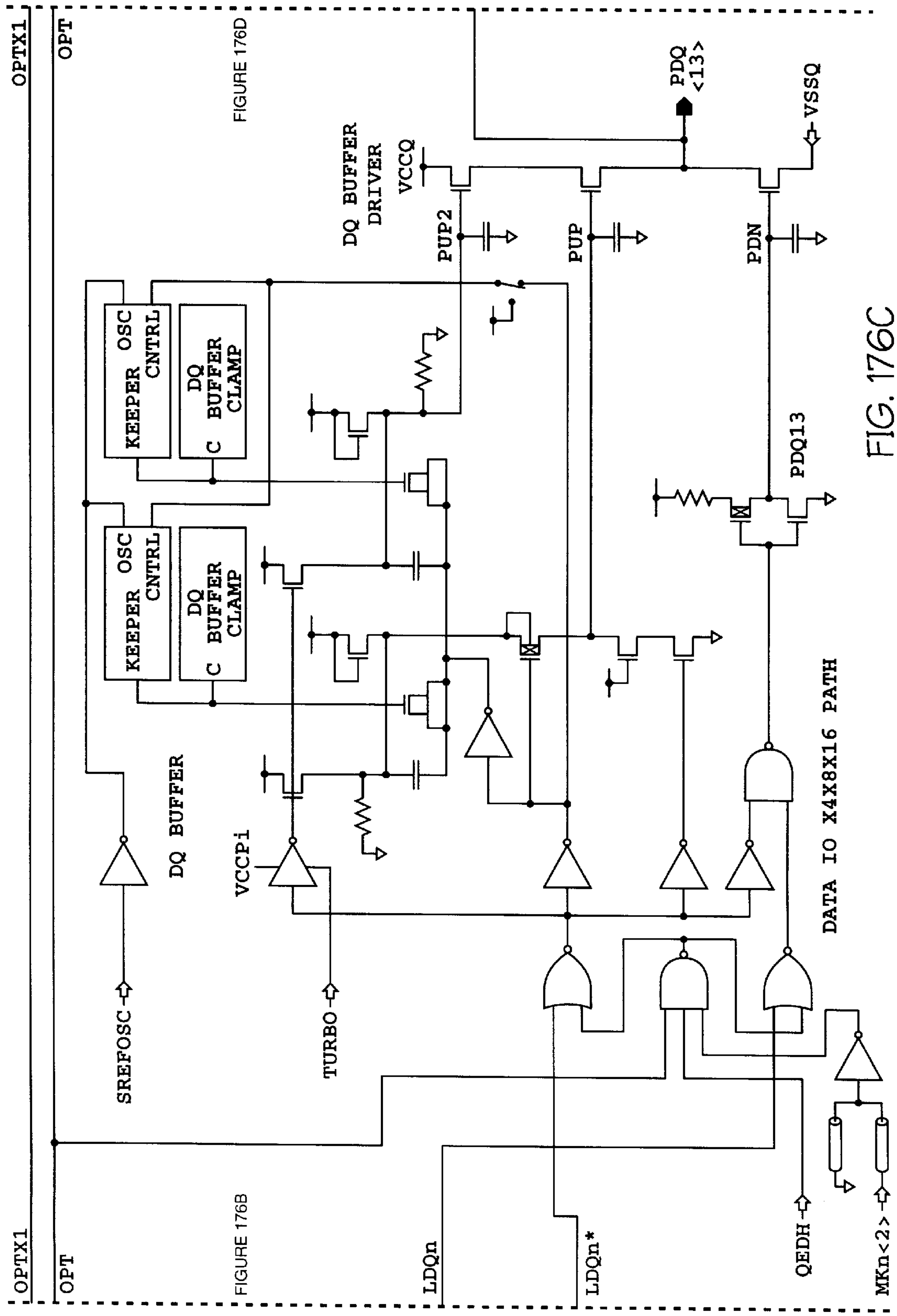
Figure 176D:
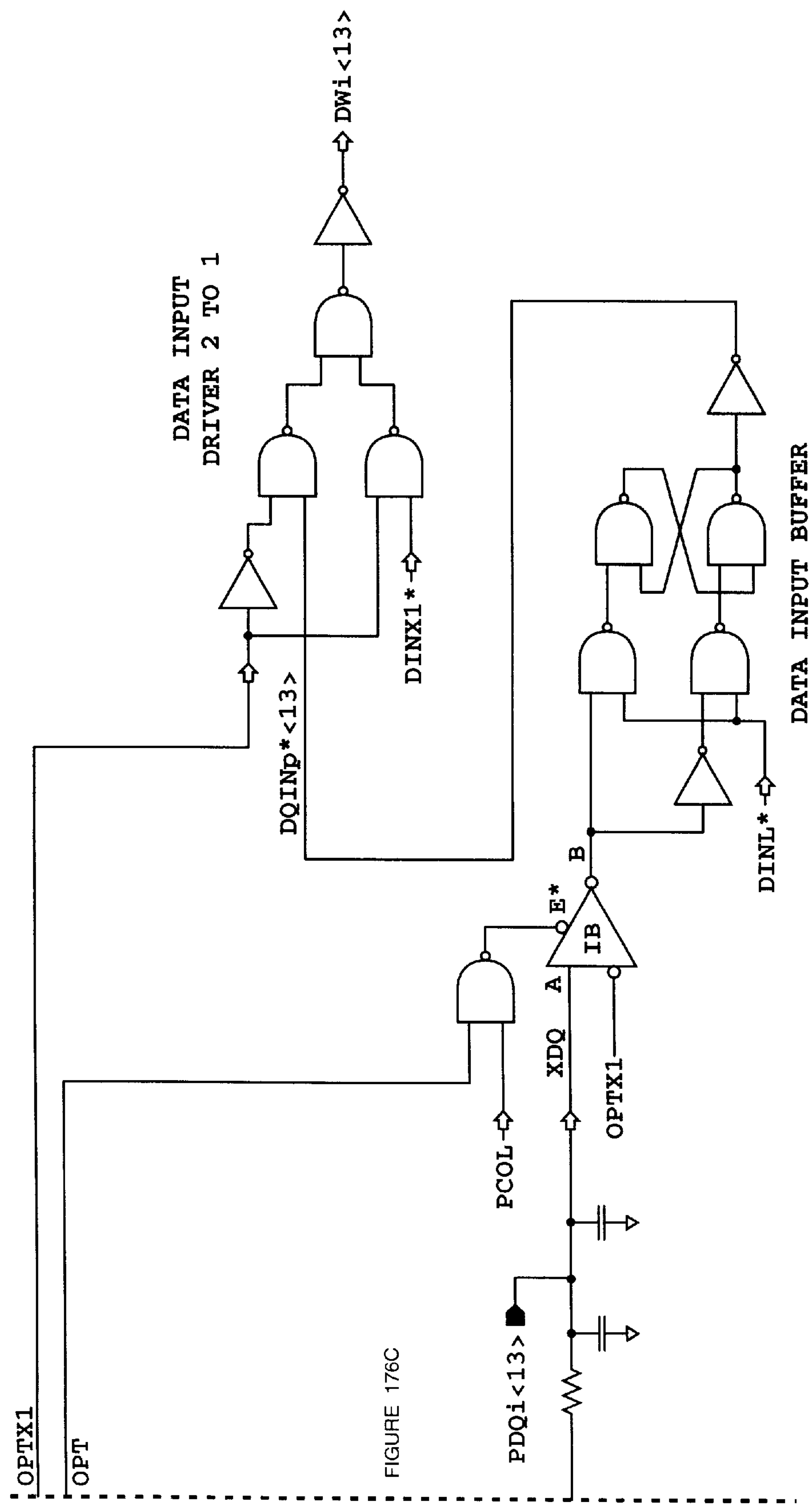
Figure 177:
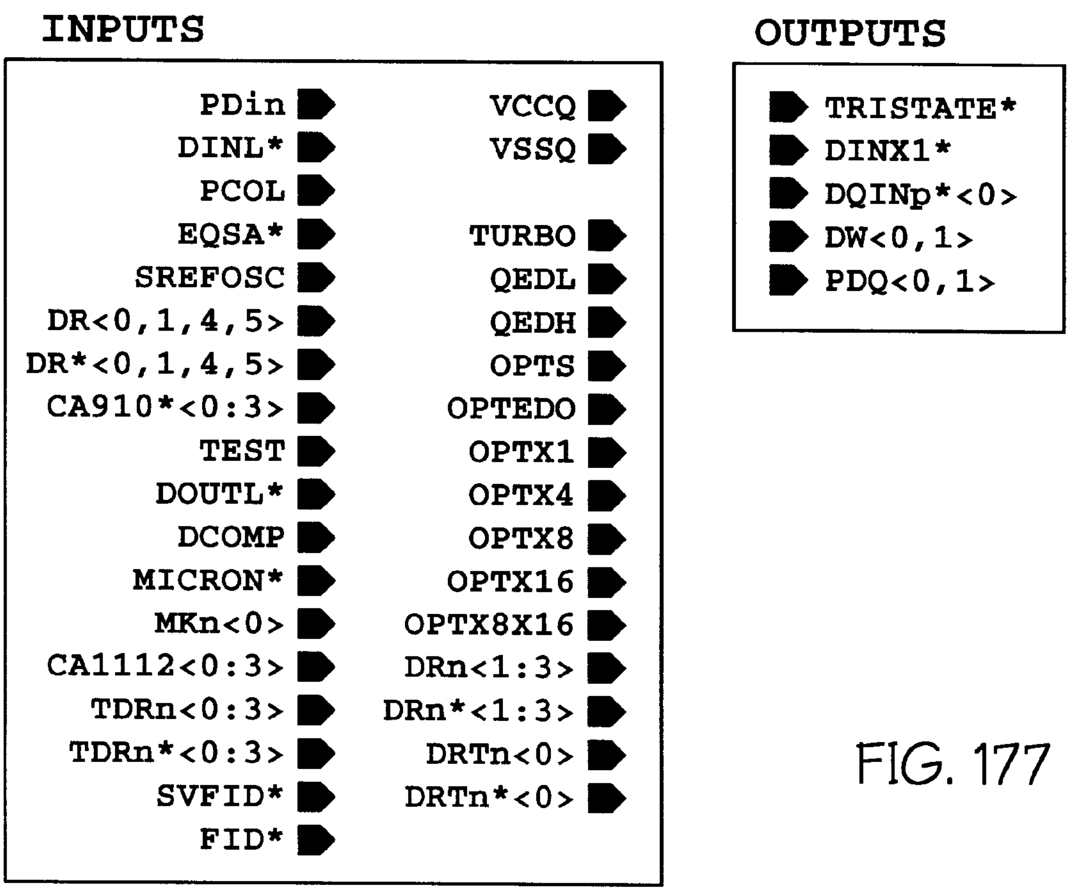
Figure 182A:
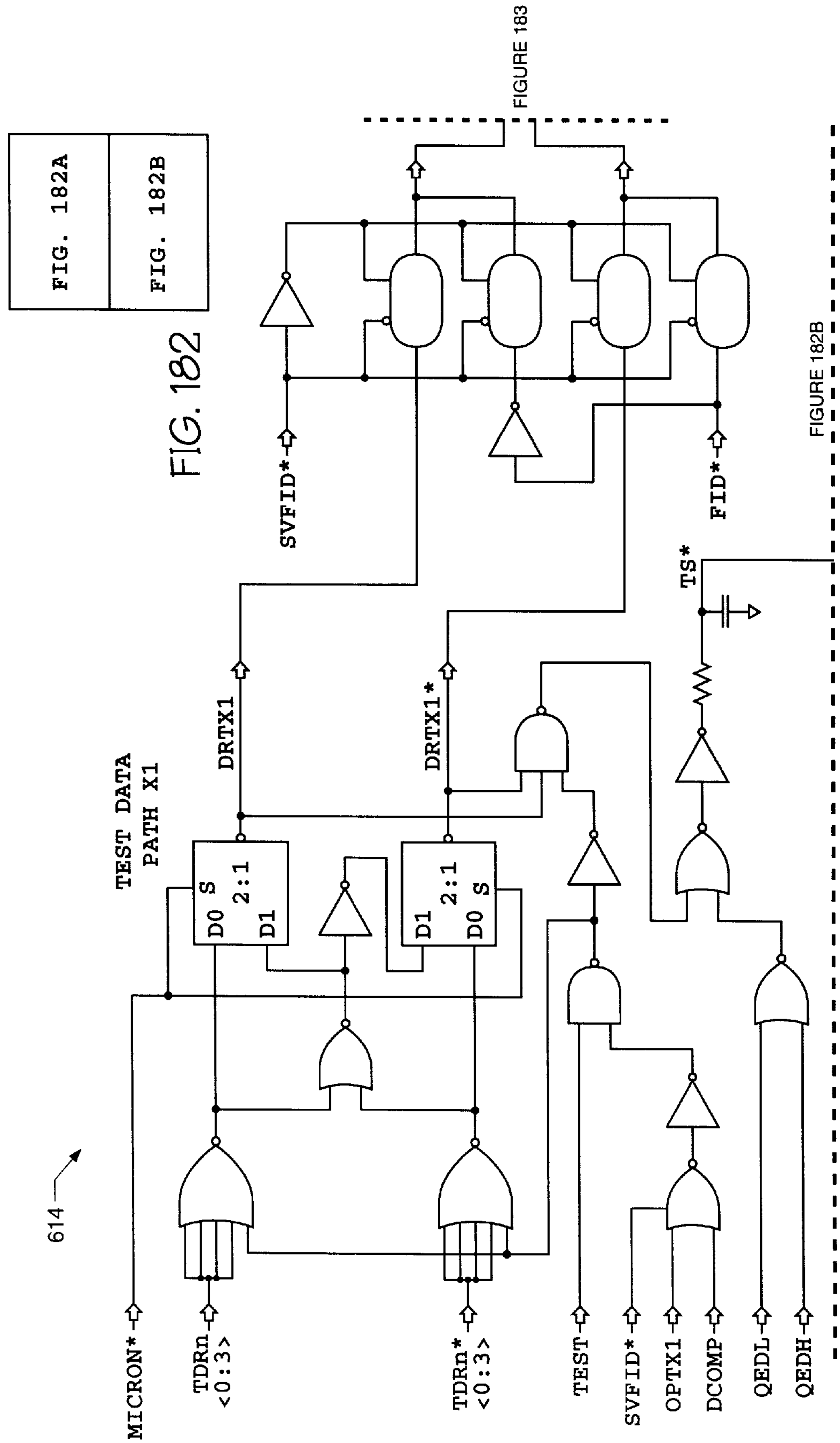
Figure 182B:
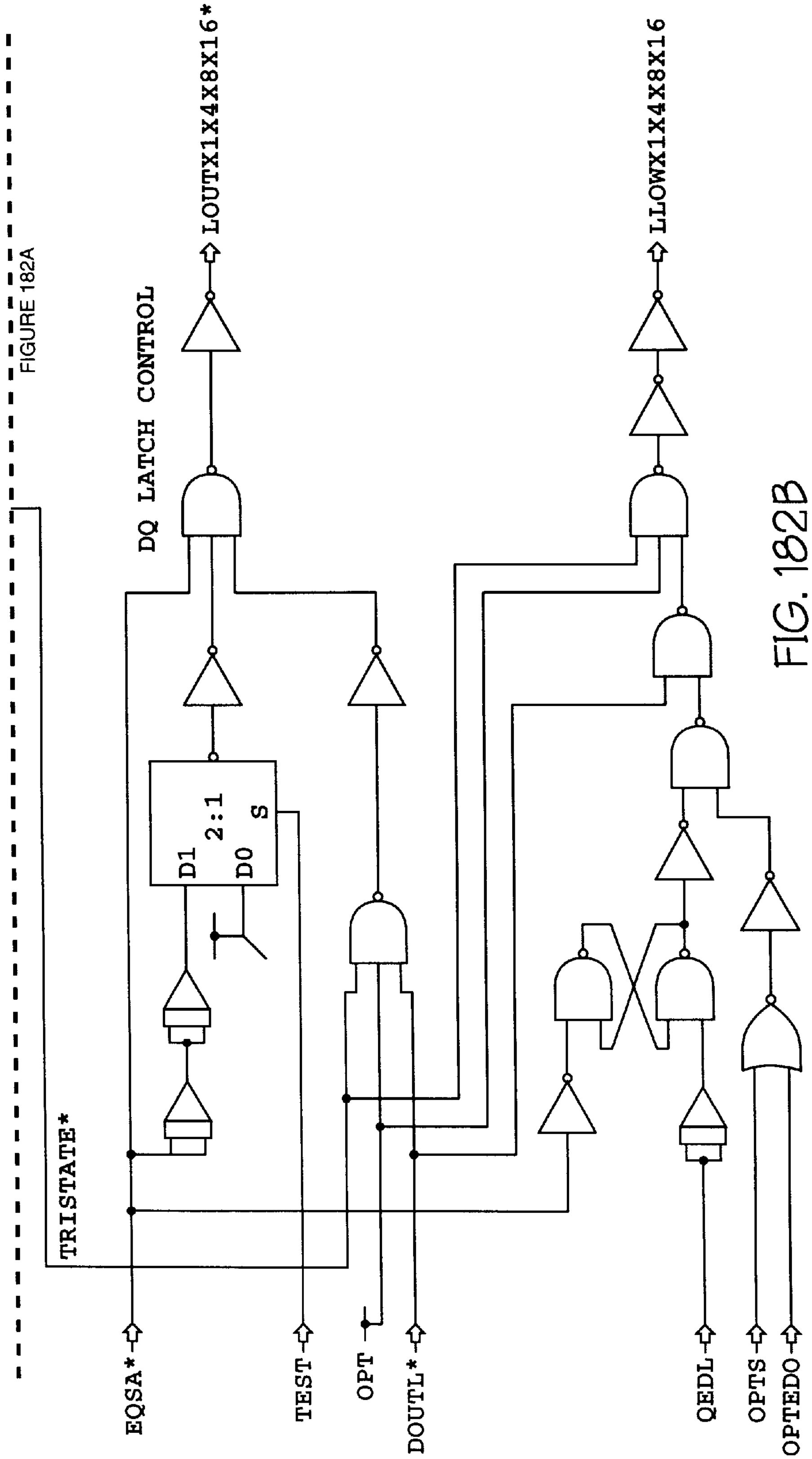
Figures 183, 183A:
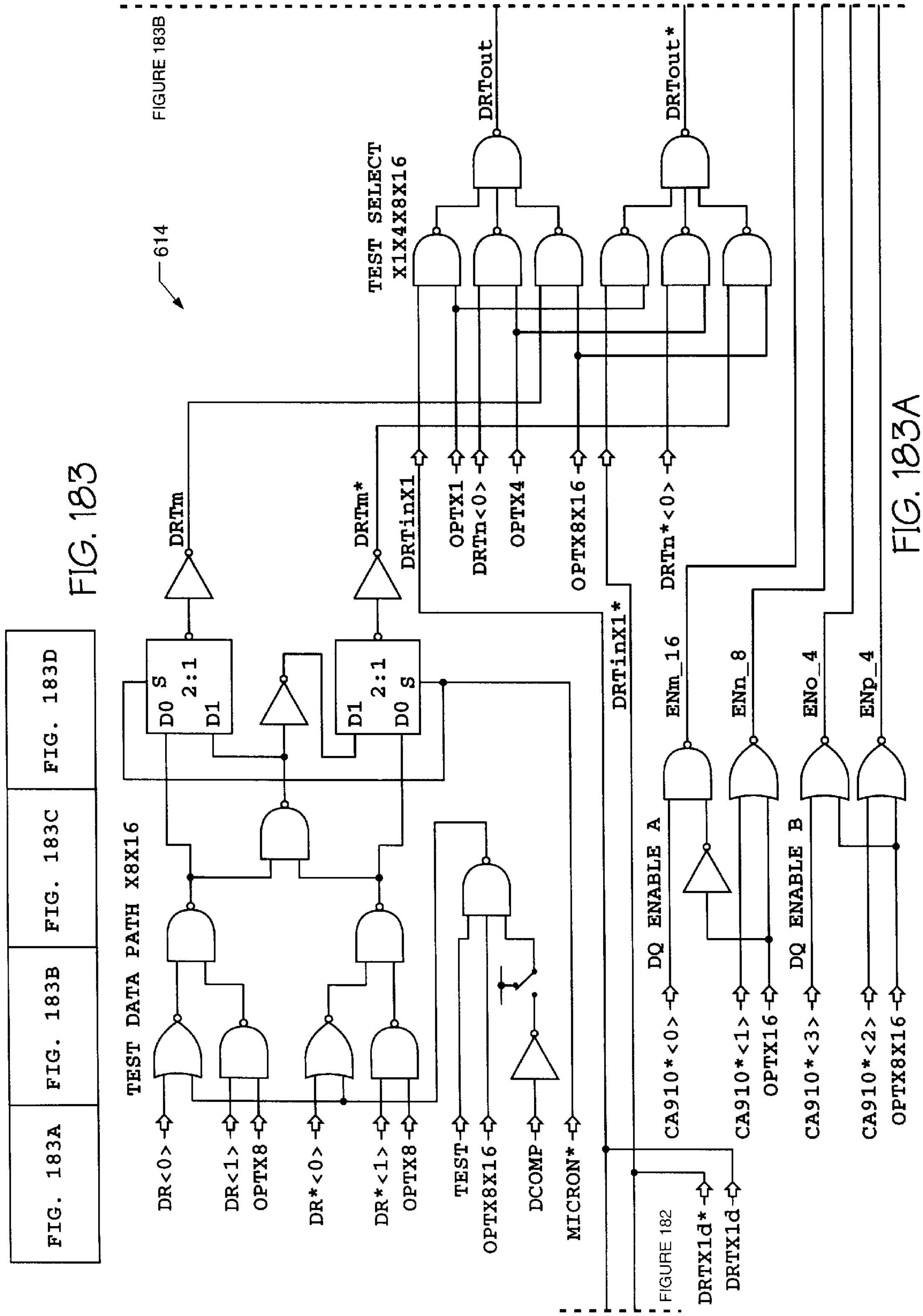
Figure 183B:
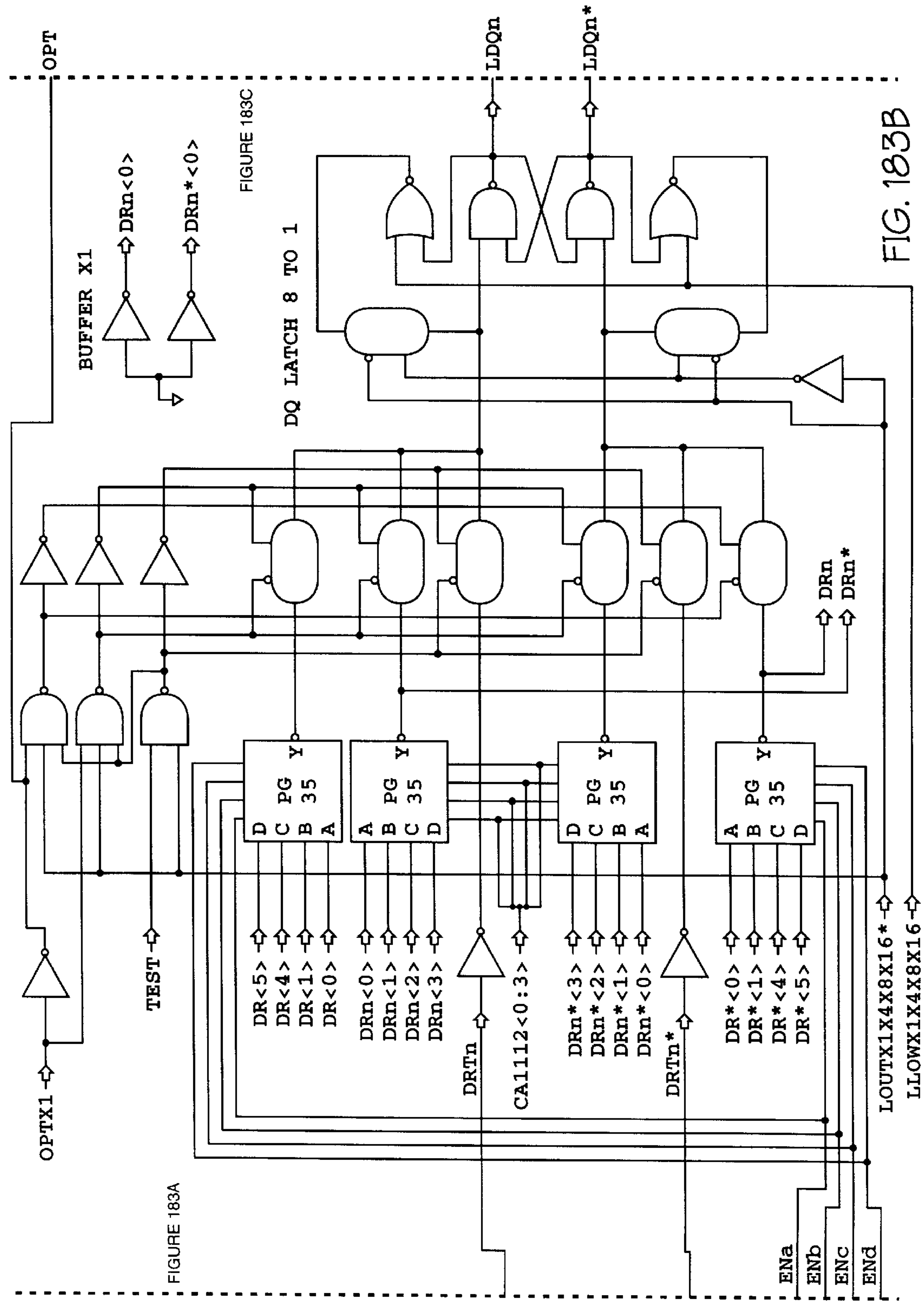
Figure 183C:
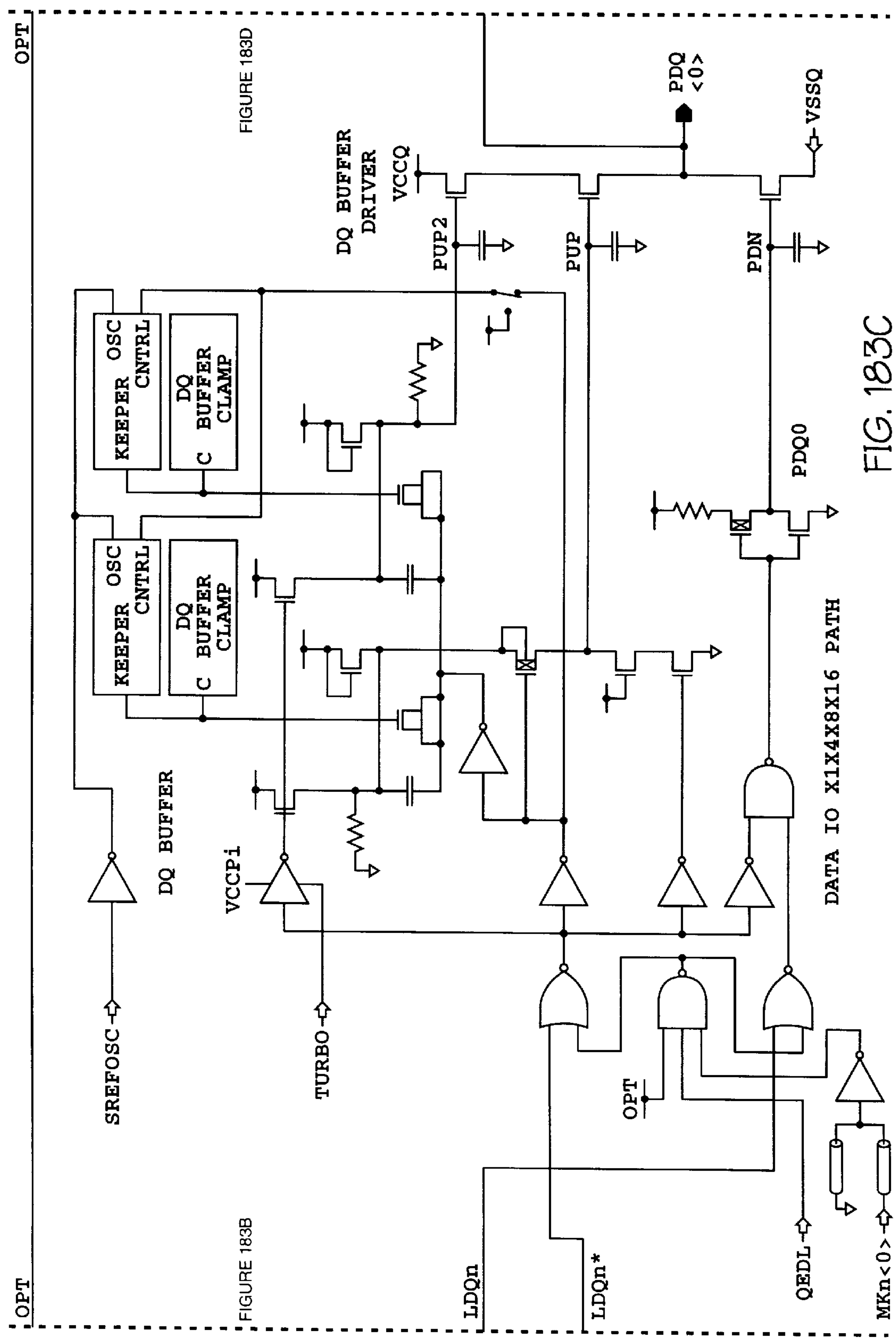
Figure 183D:
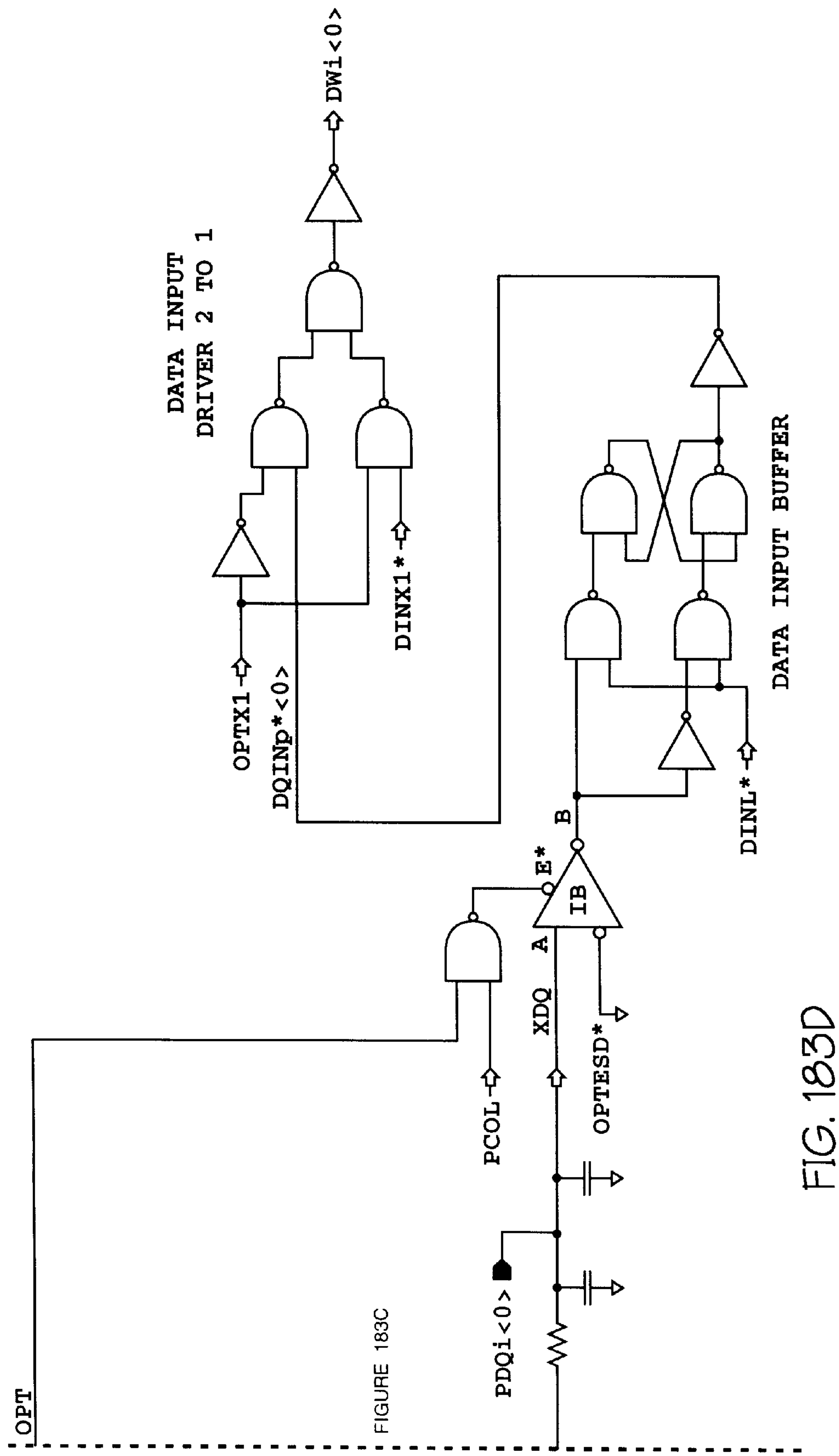
Figure 184:
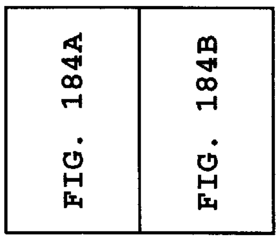
Figure 184A:
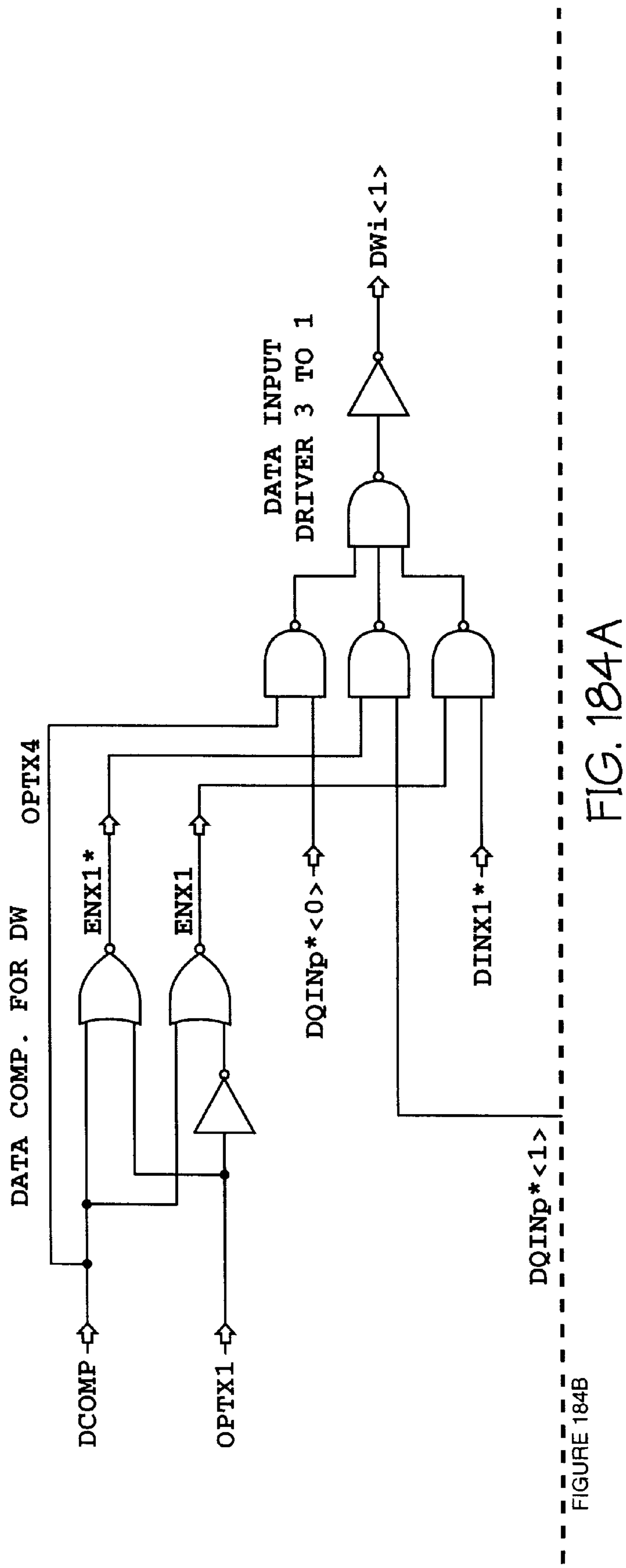
Figure 184B:
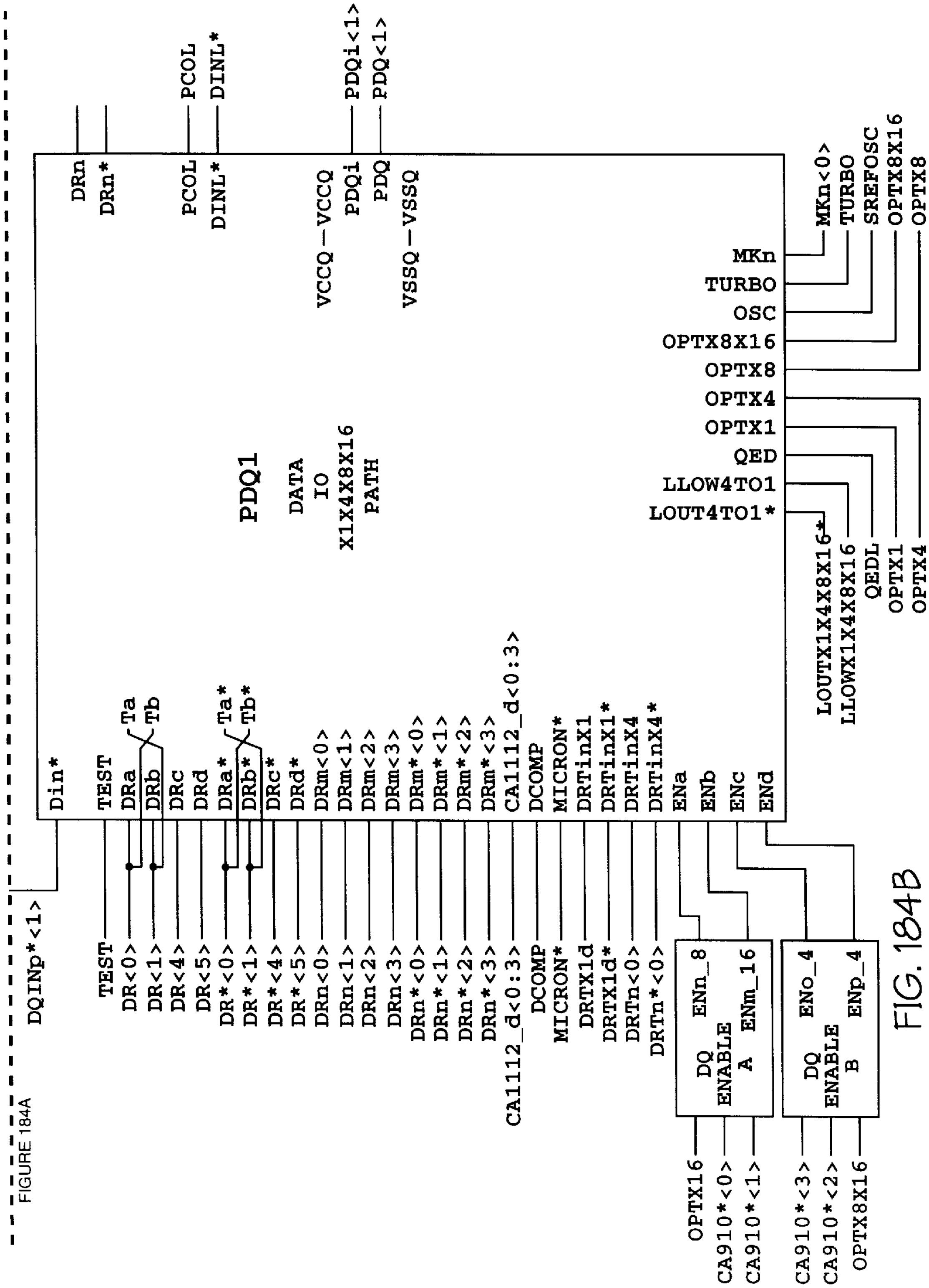
Figure 185:
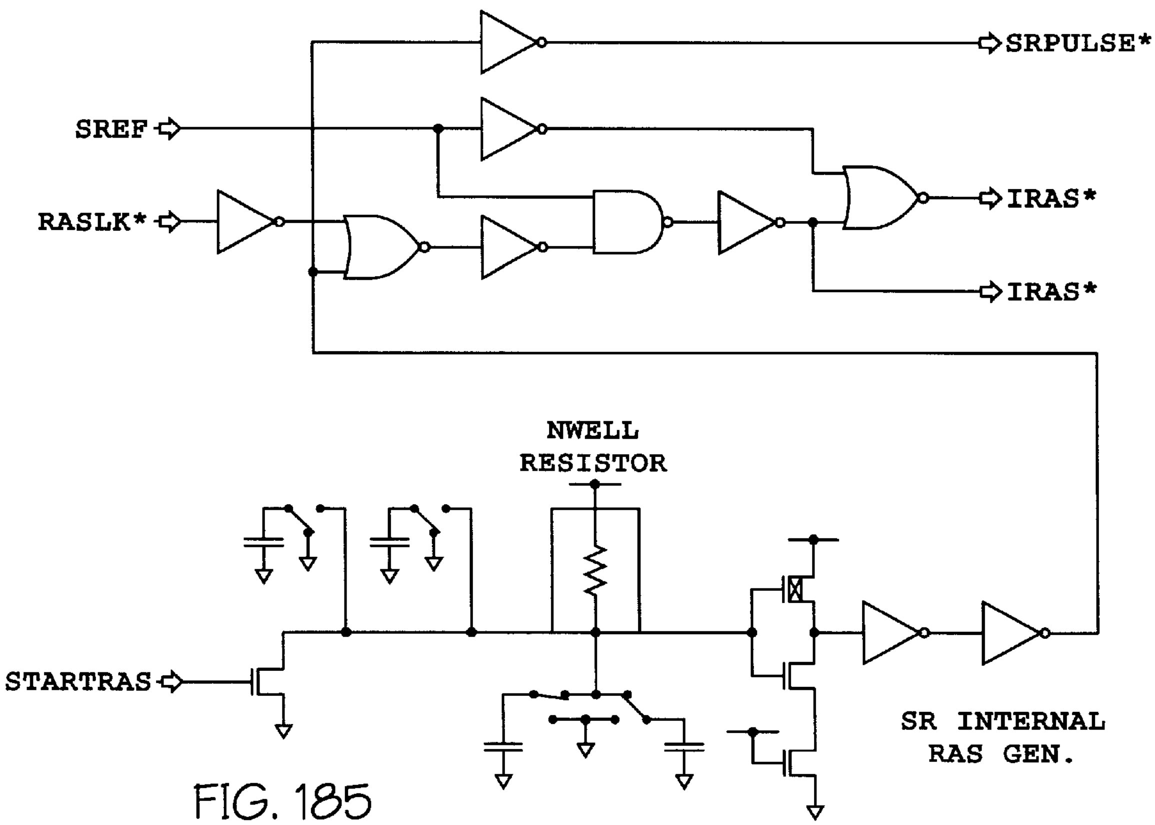
Figure 186:
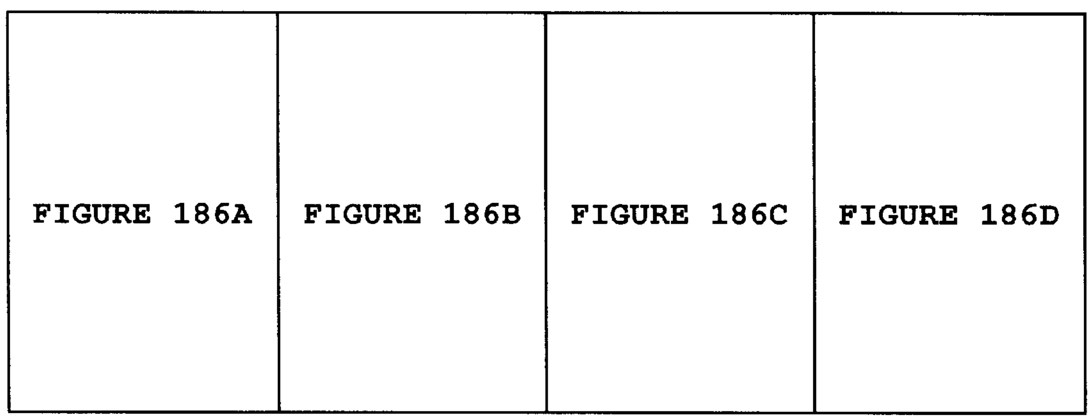
Figure 186A:
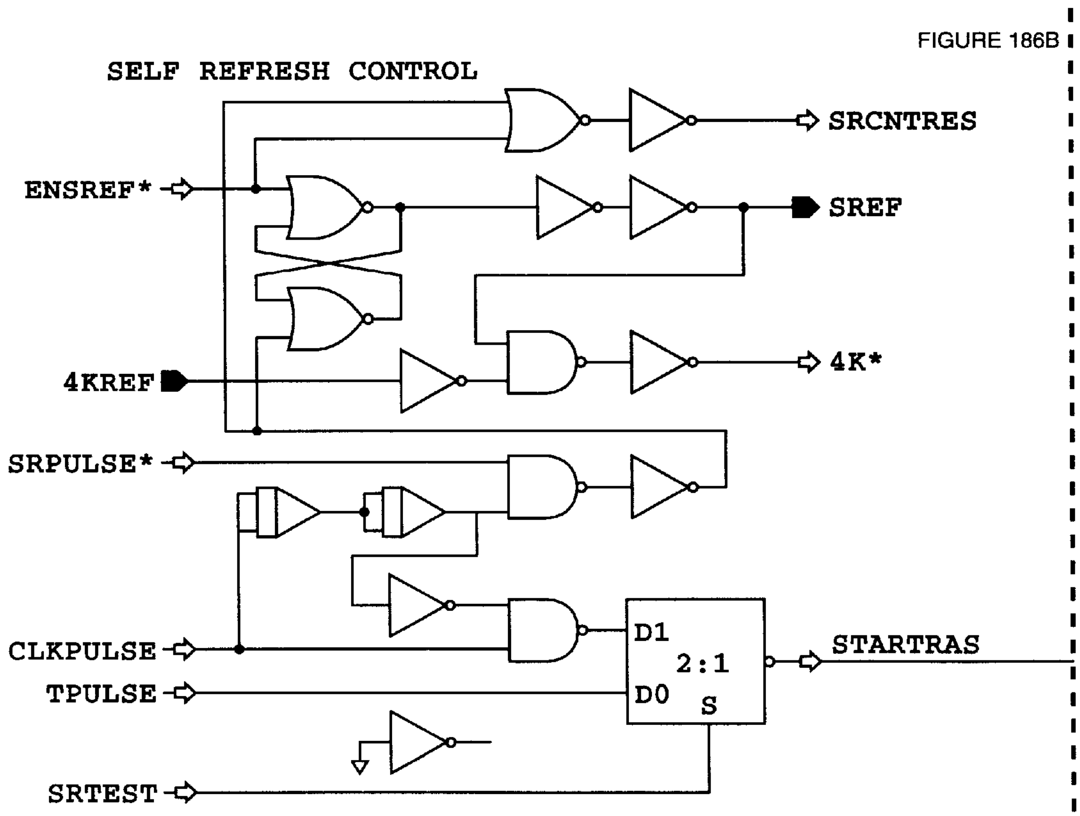
Figure 186B:
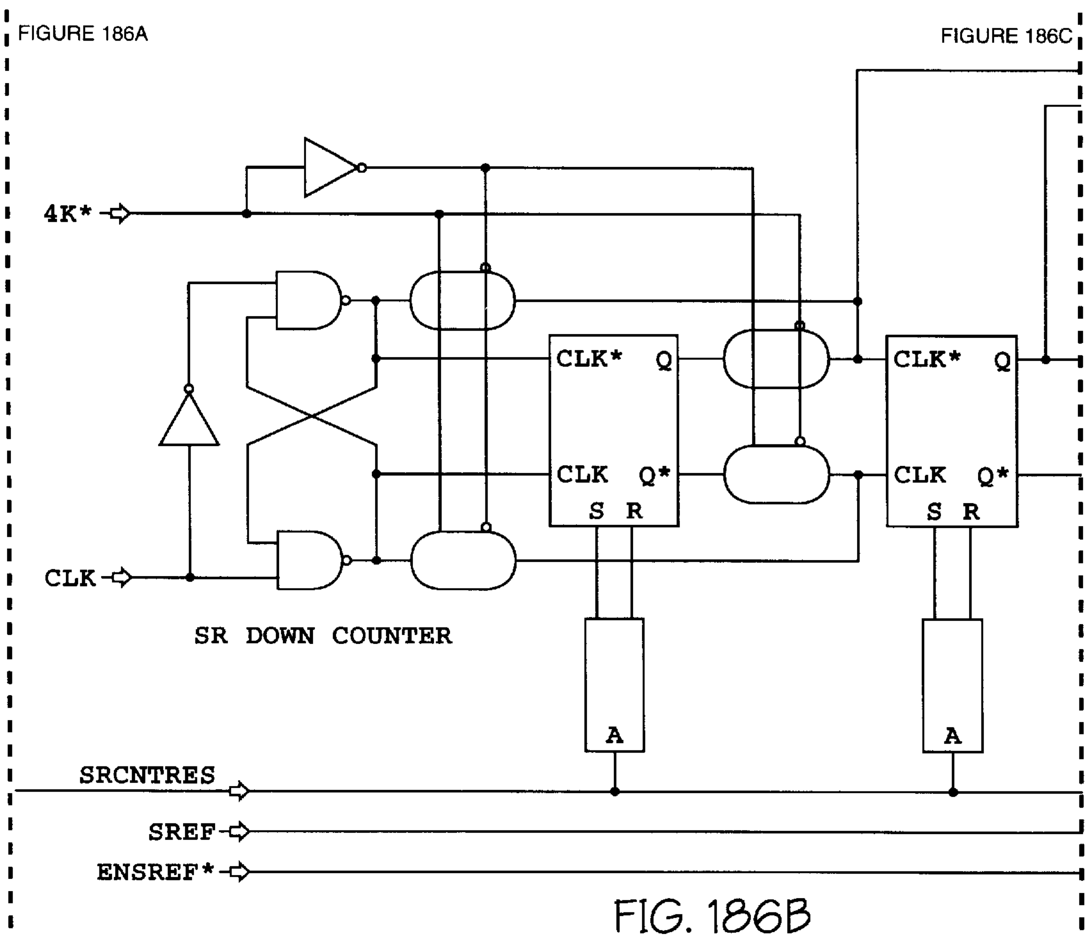
Figure 186C:
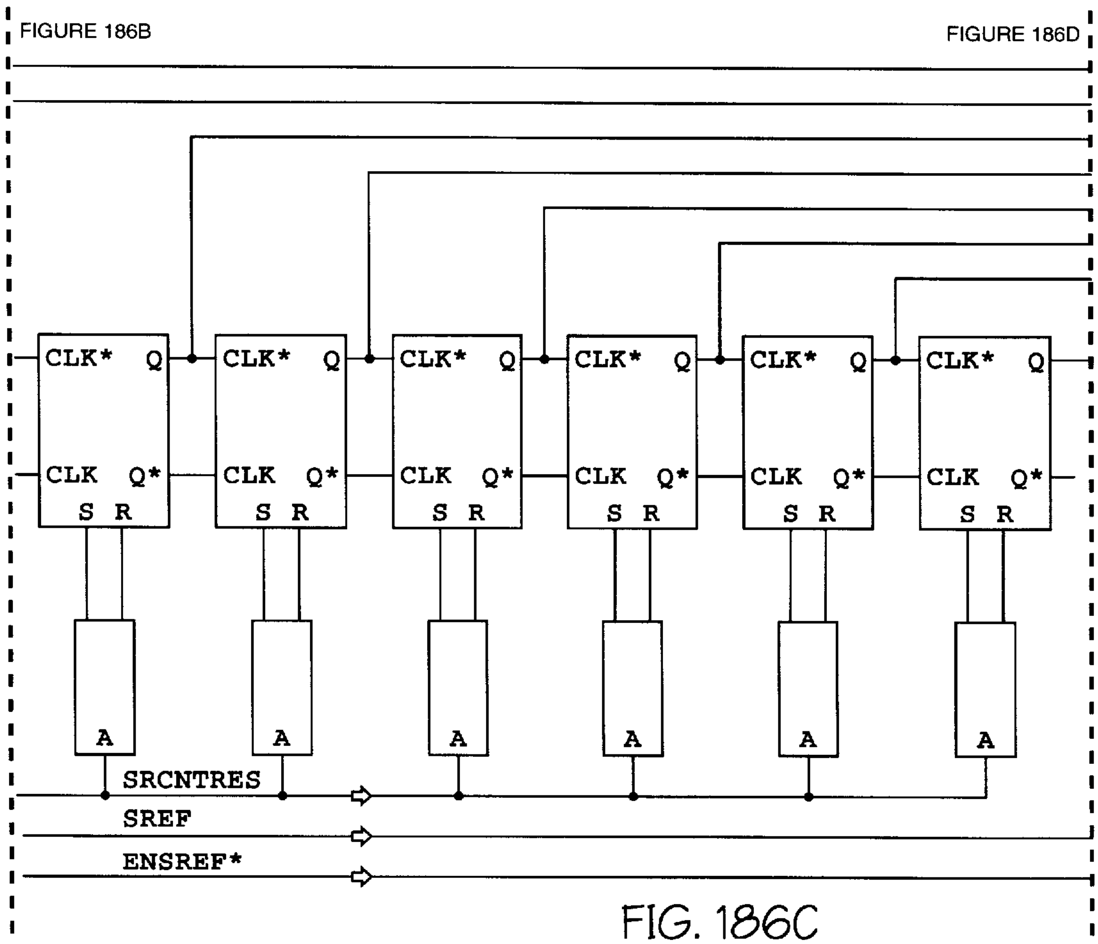
Figure 186D:
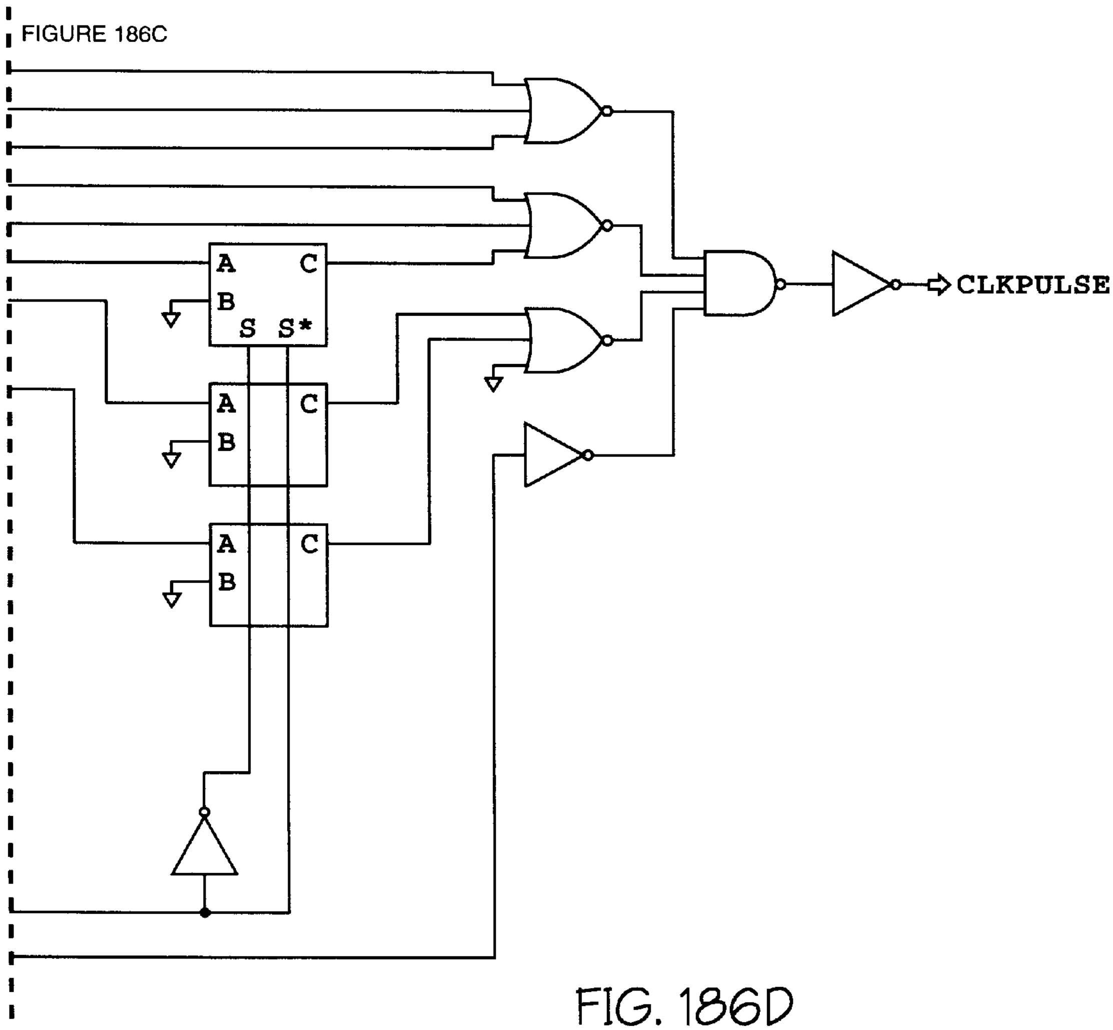
Figure 187A:
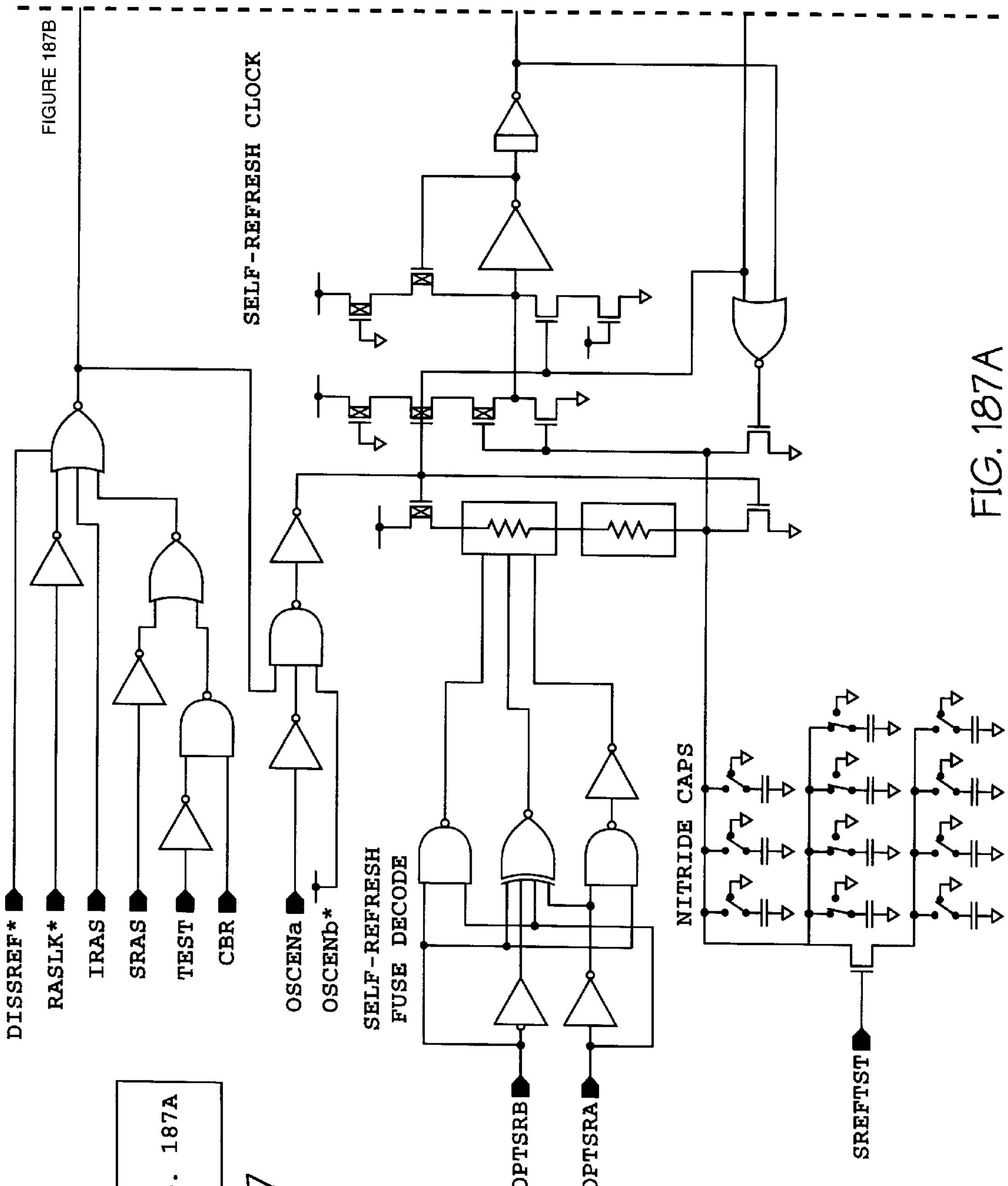
Figure 187:
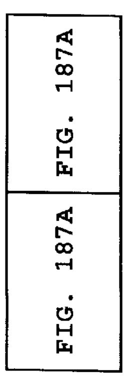
Figure 187B:
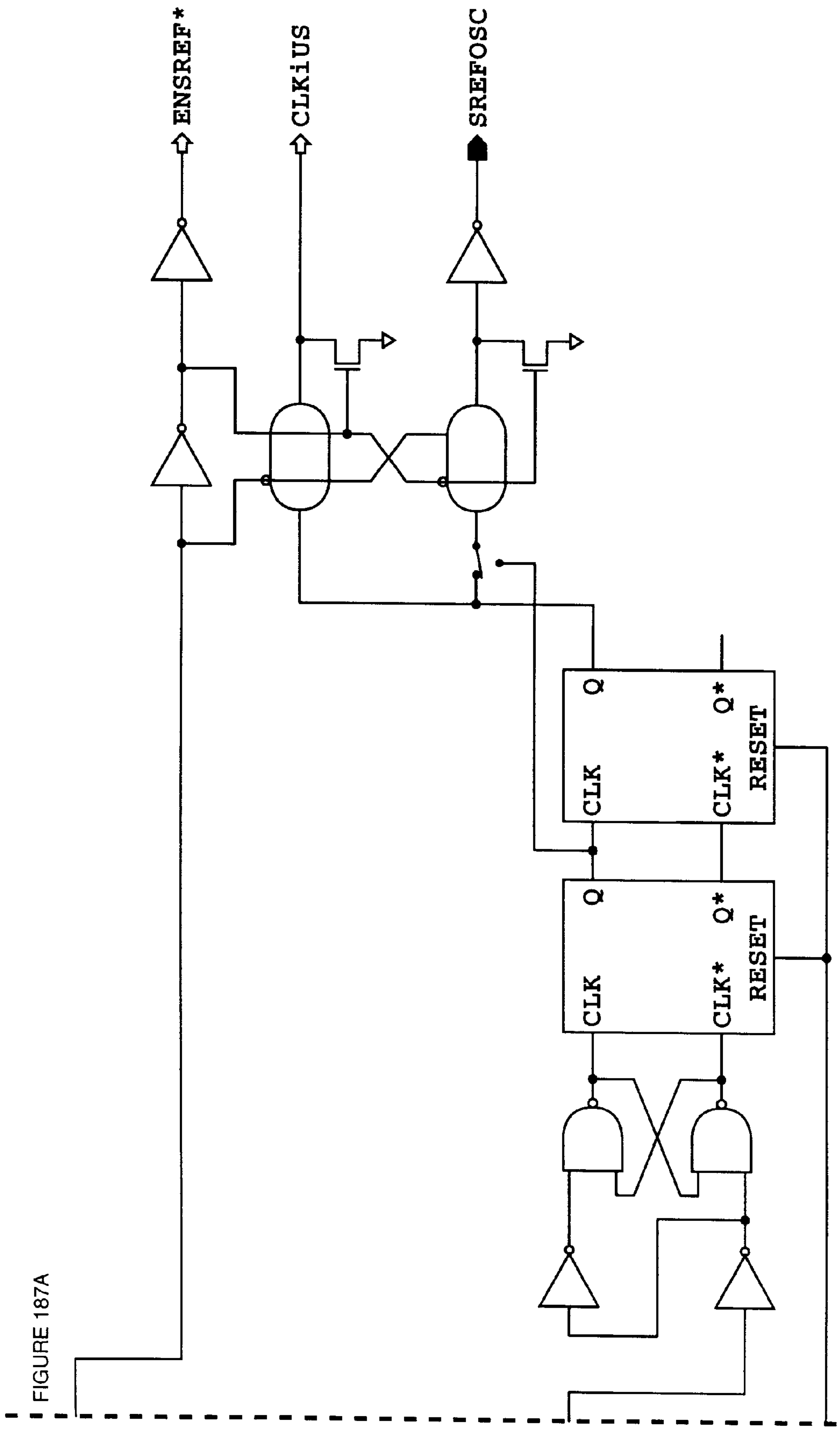
Figure 188:
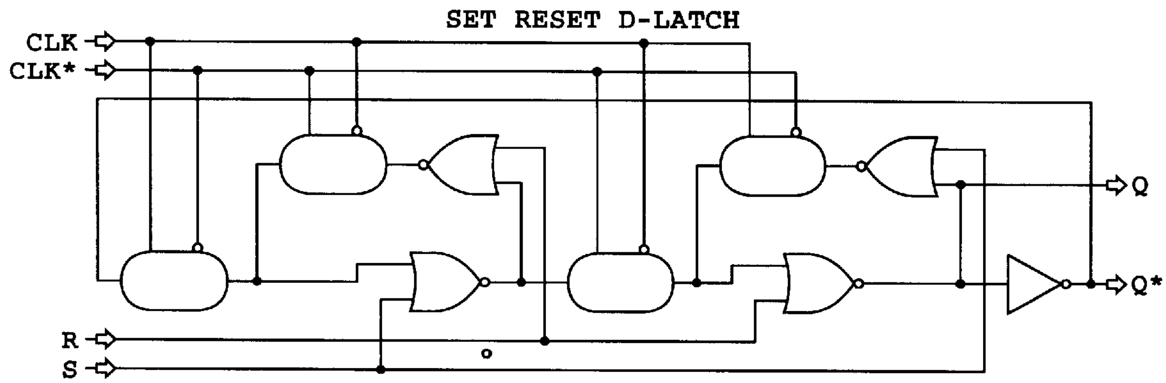
Figure 190:
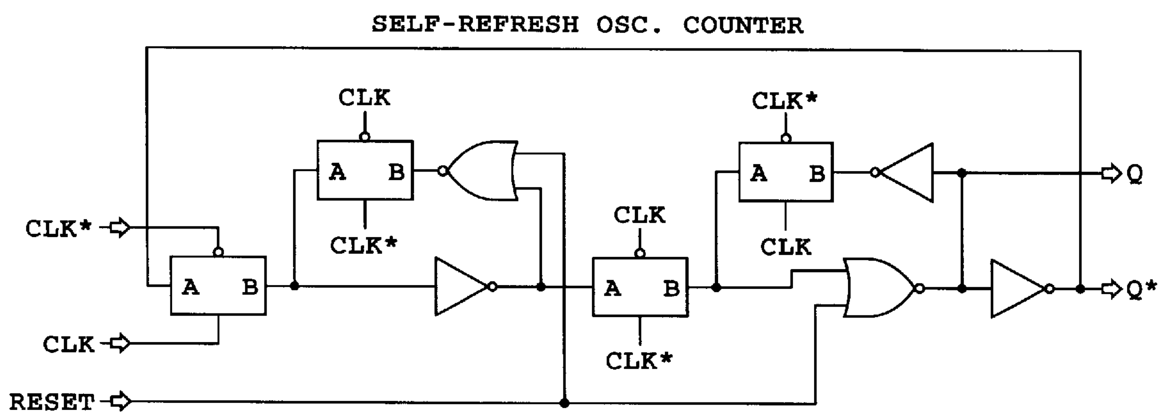
Figure 189:
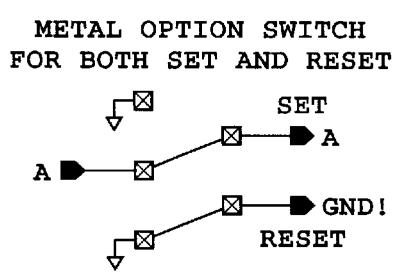
Figure 191:
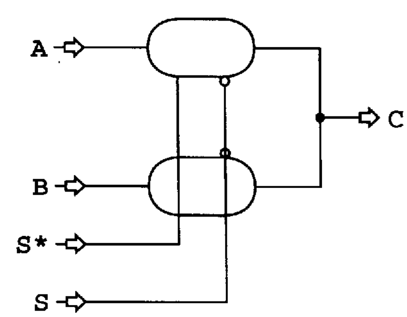
Figure 192:
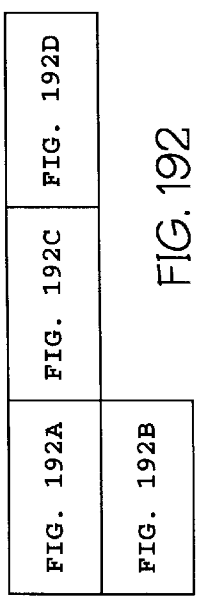
Figure 192A:
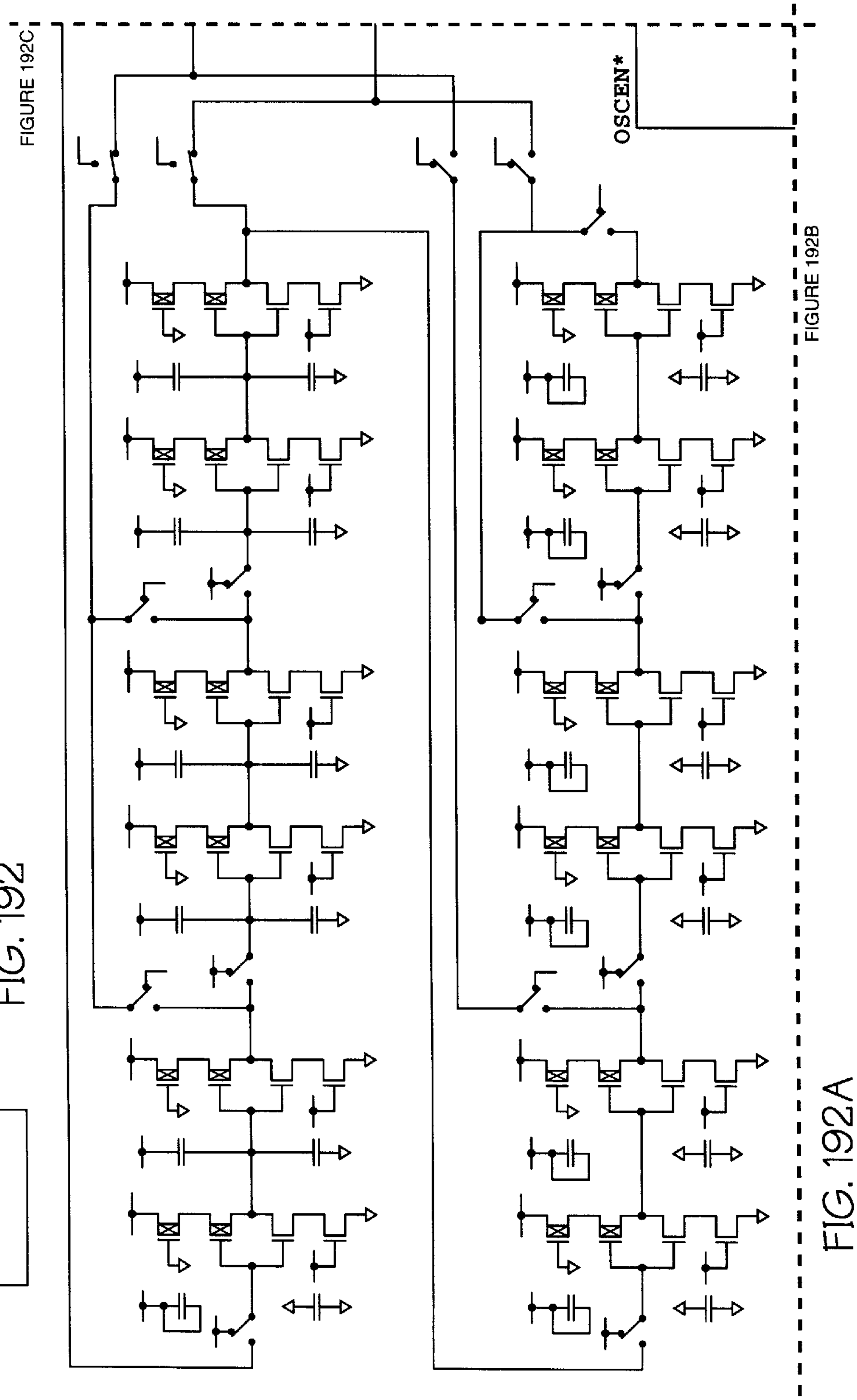
Figure 192B:
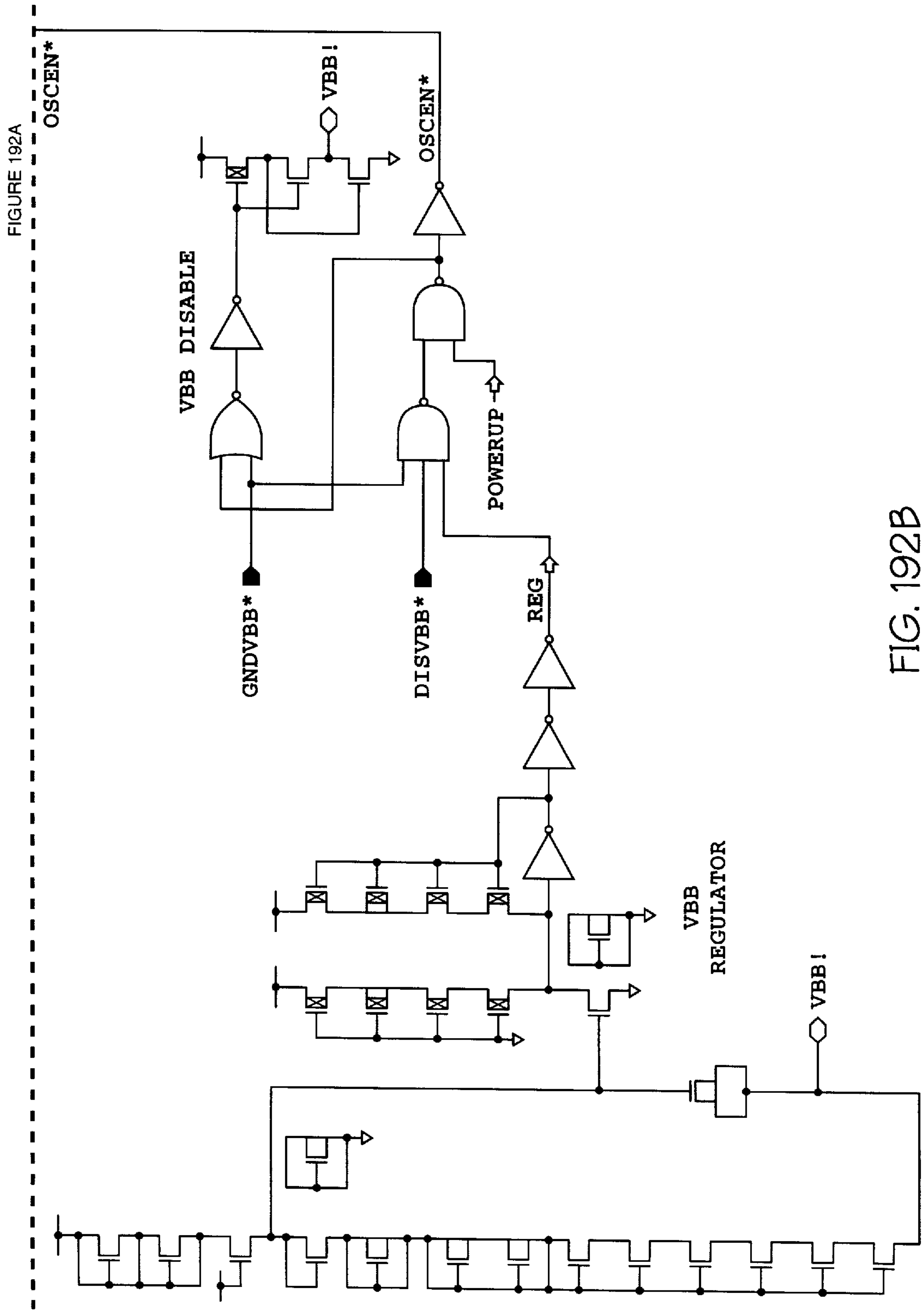
Figure 192C:
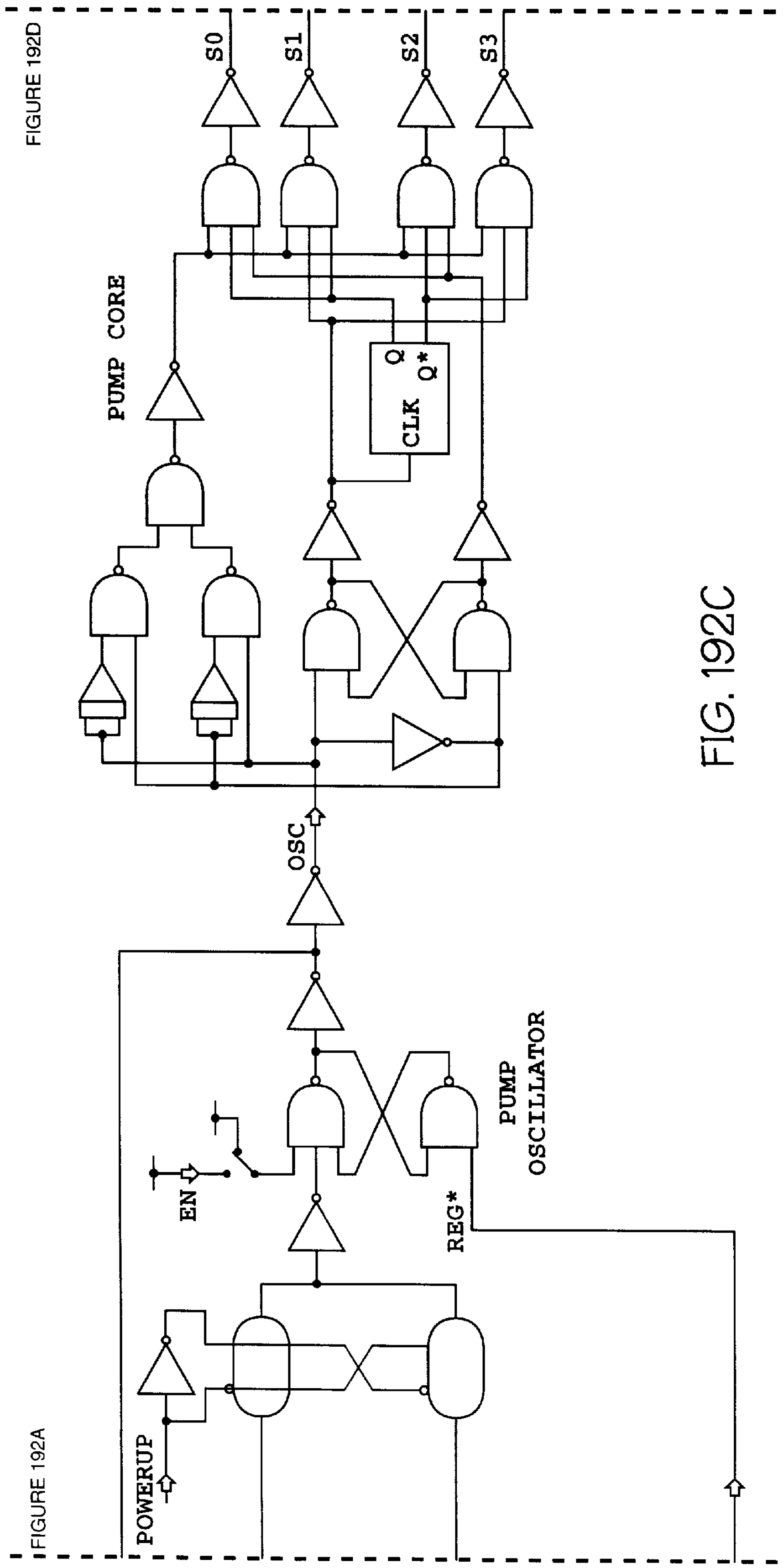
Figure 192D:
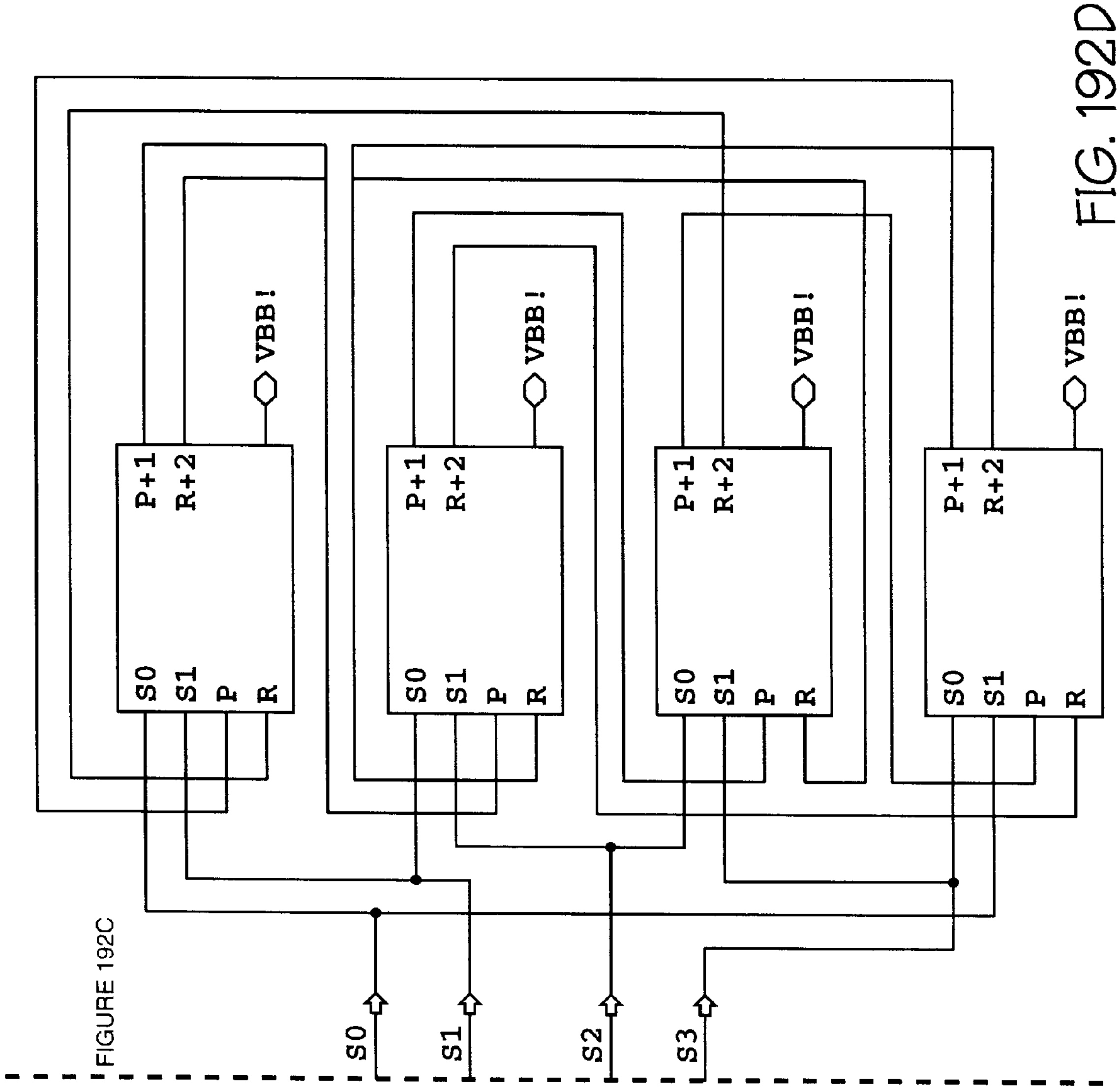
Figure 193:
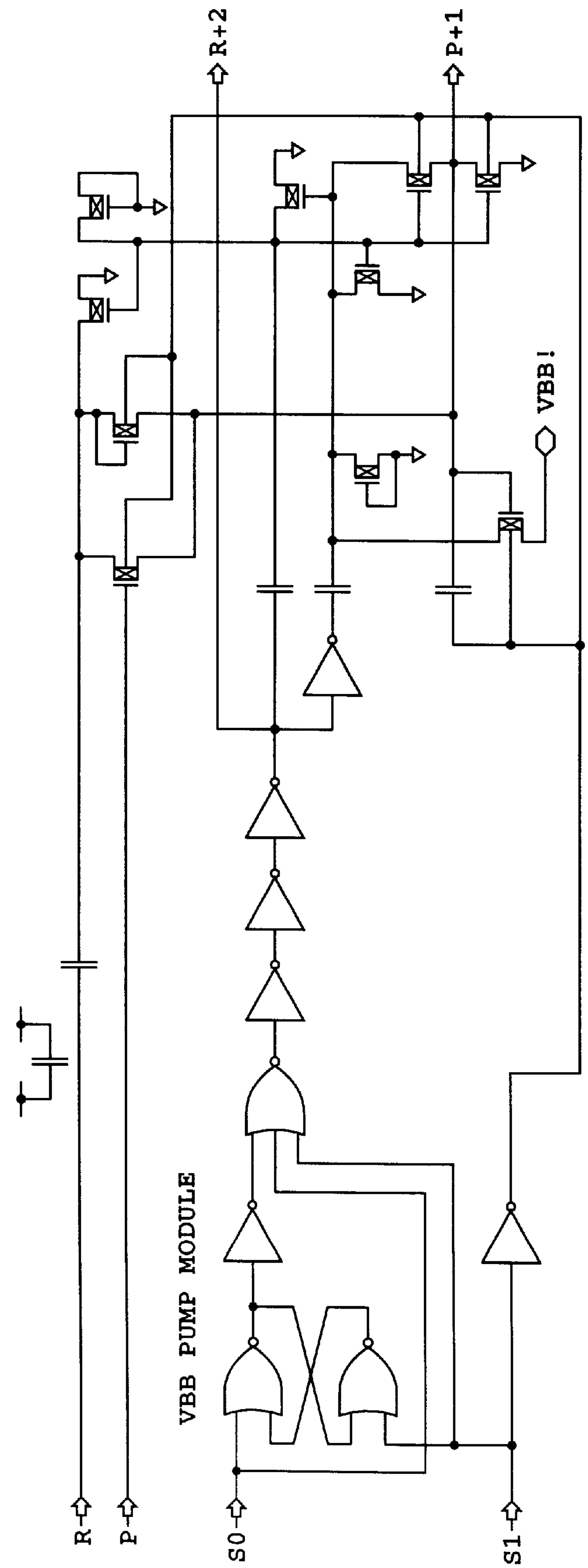
Figures 194, 194A:
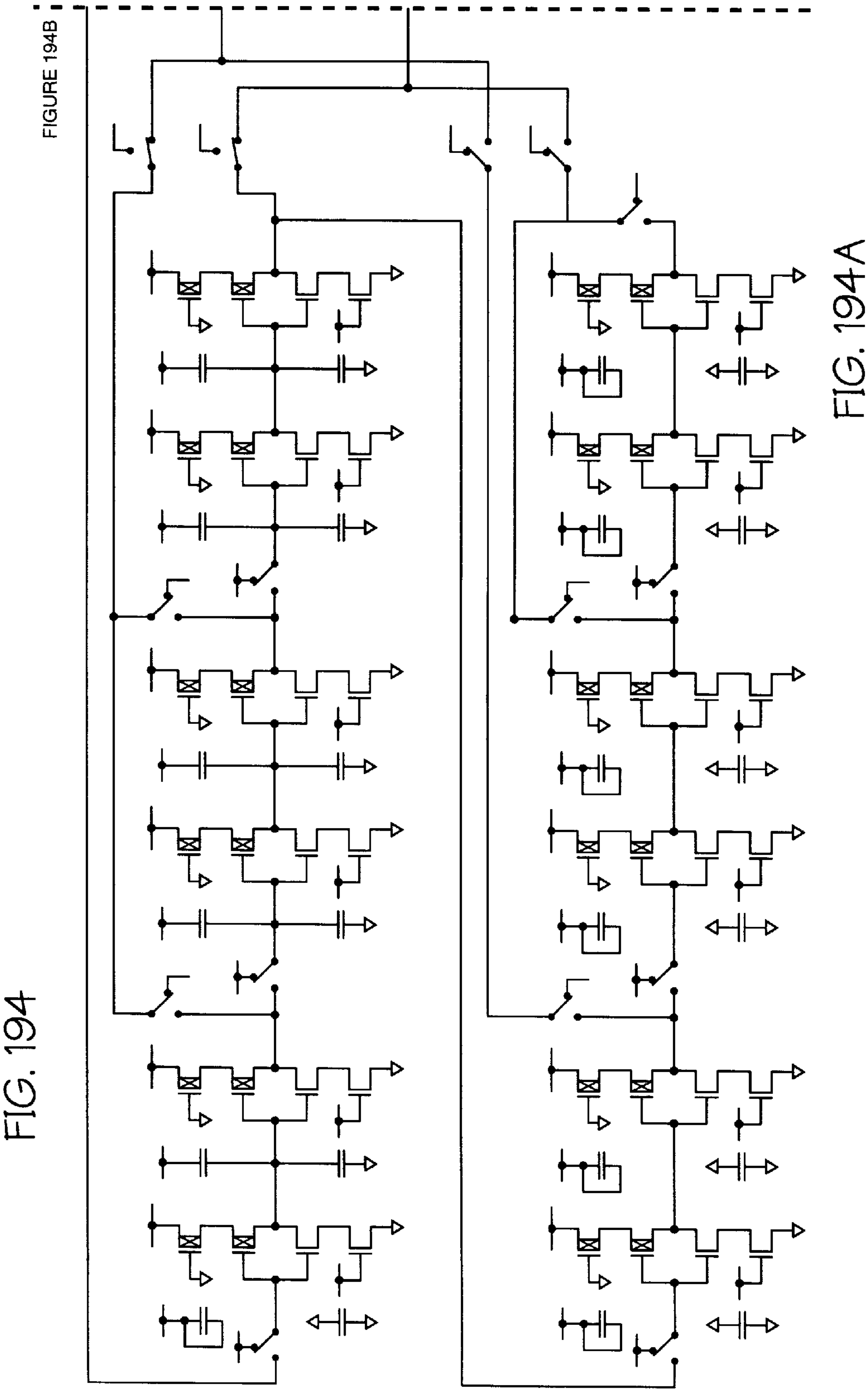
Figure 194B:
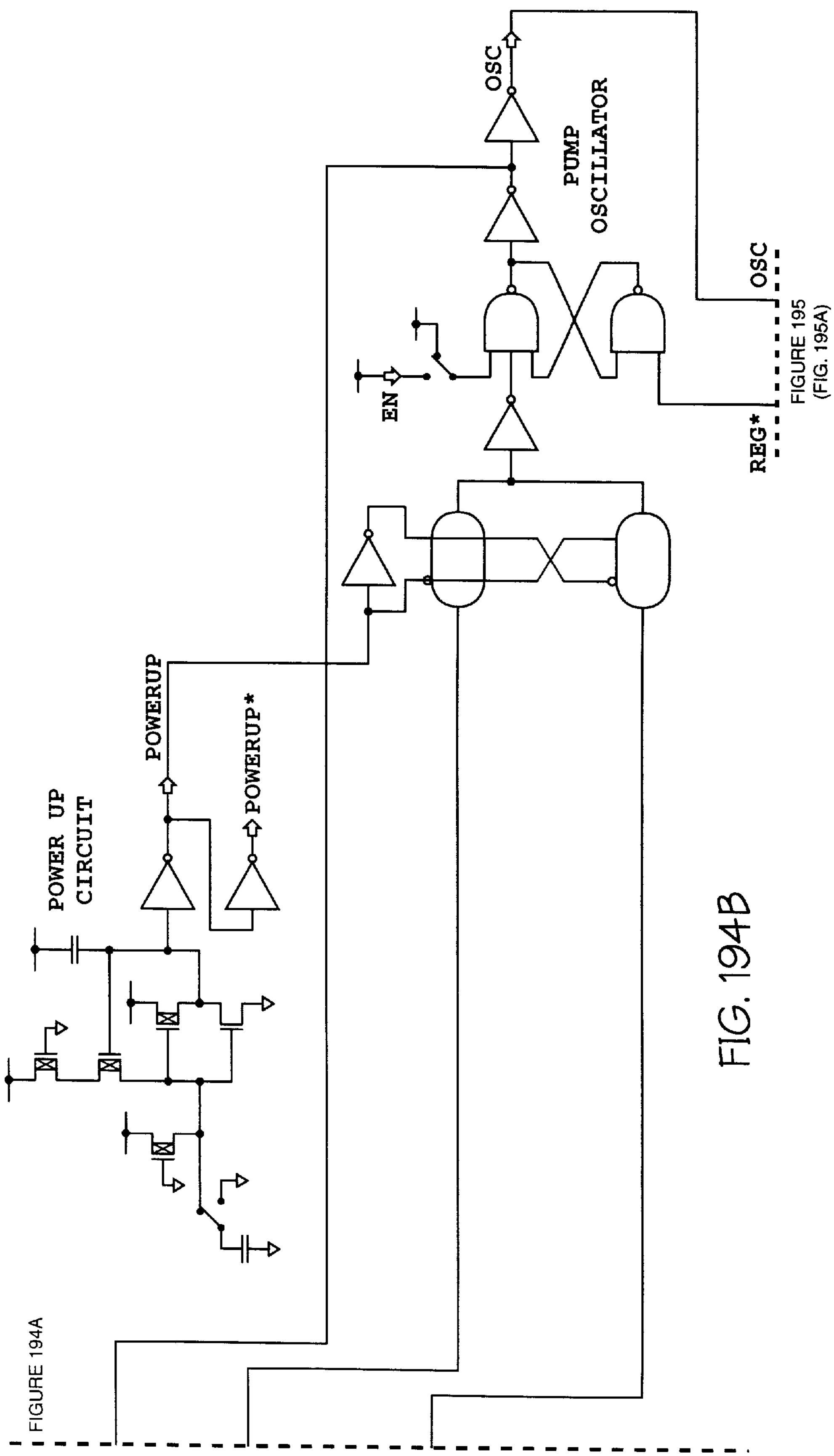
Figures 195, 195A:
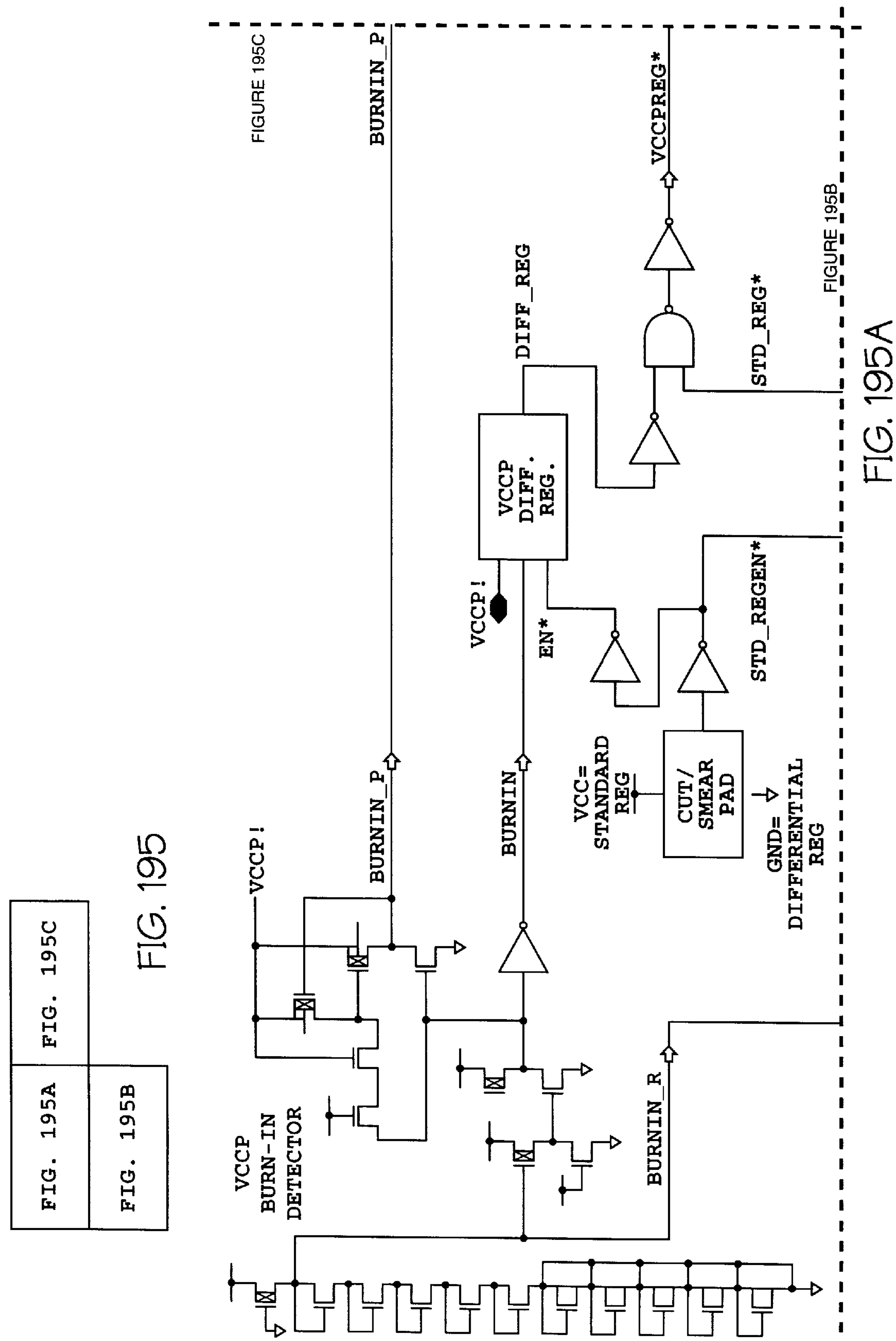
Figure 195B:
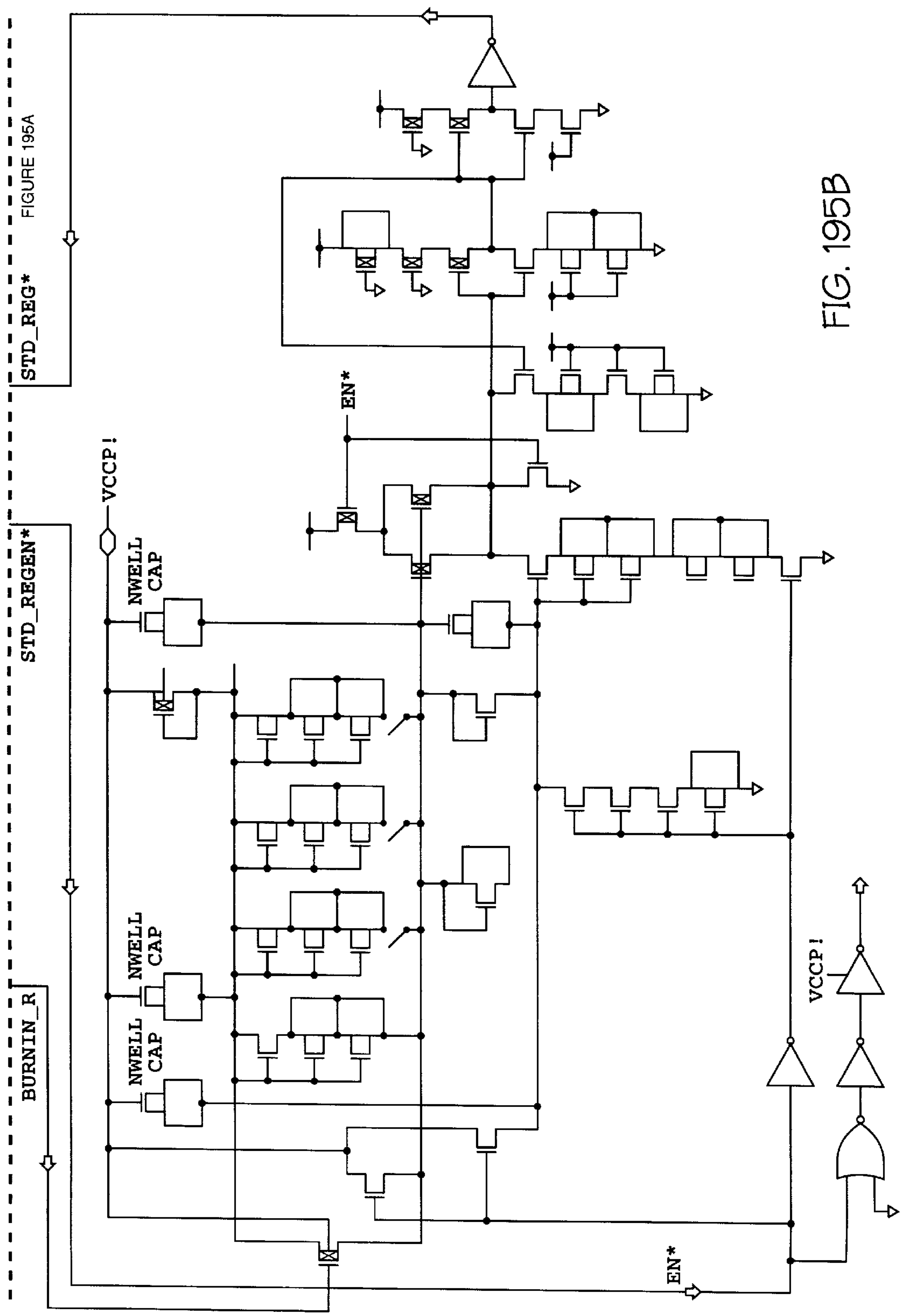
Figure 195C:
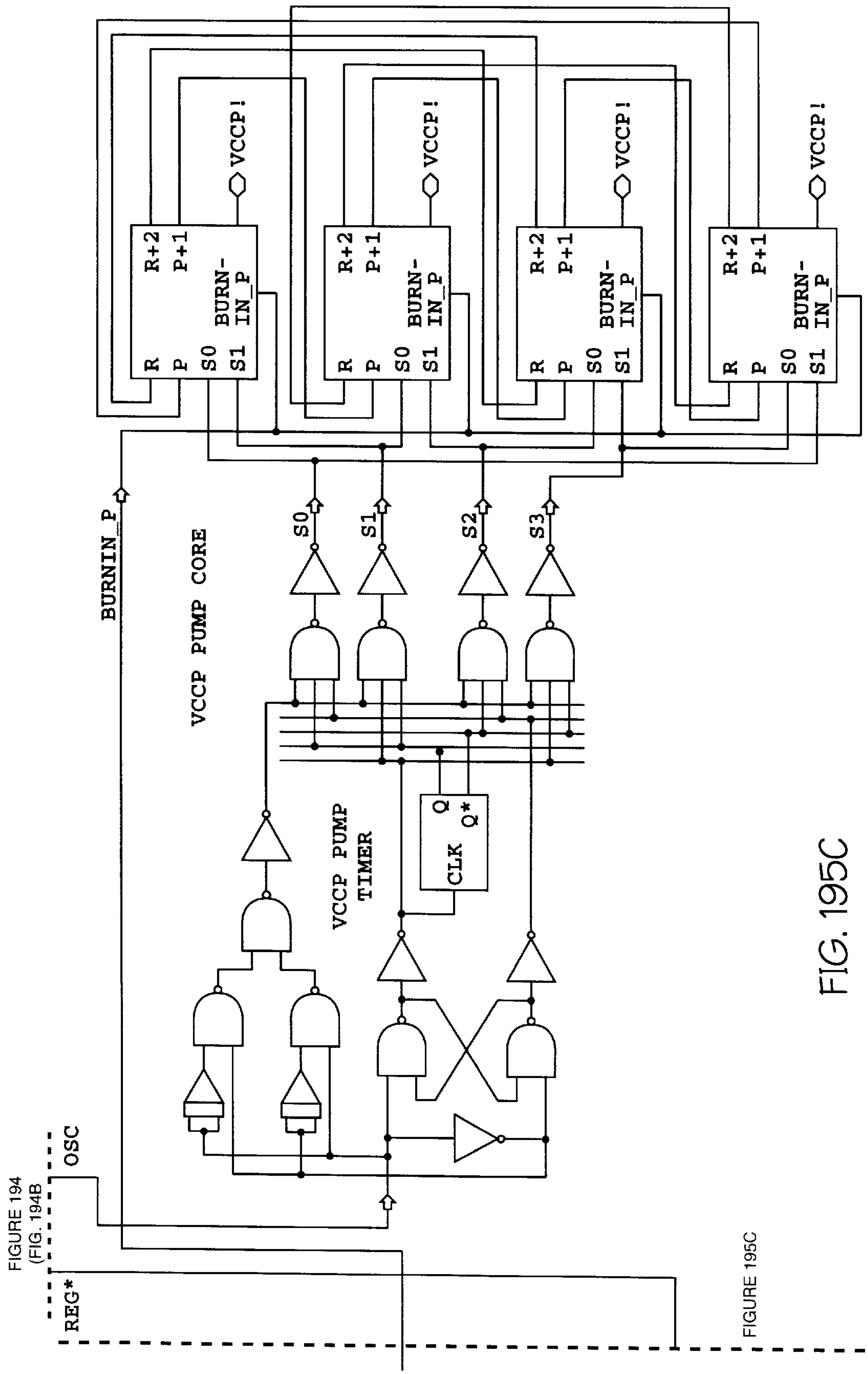
Figure 196:
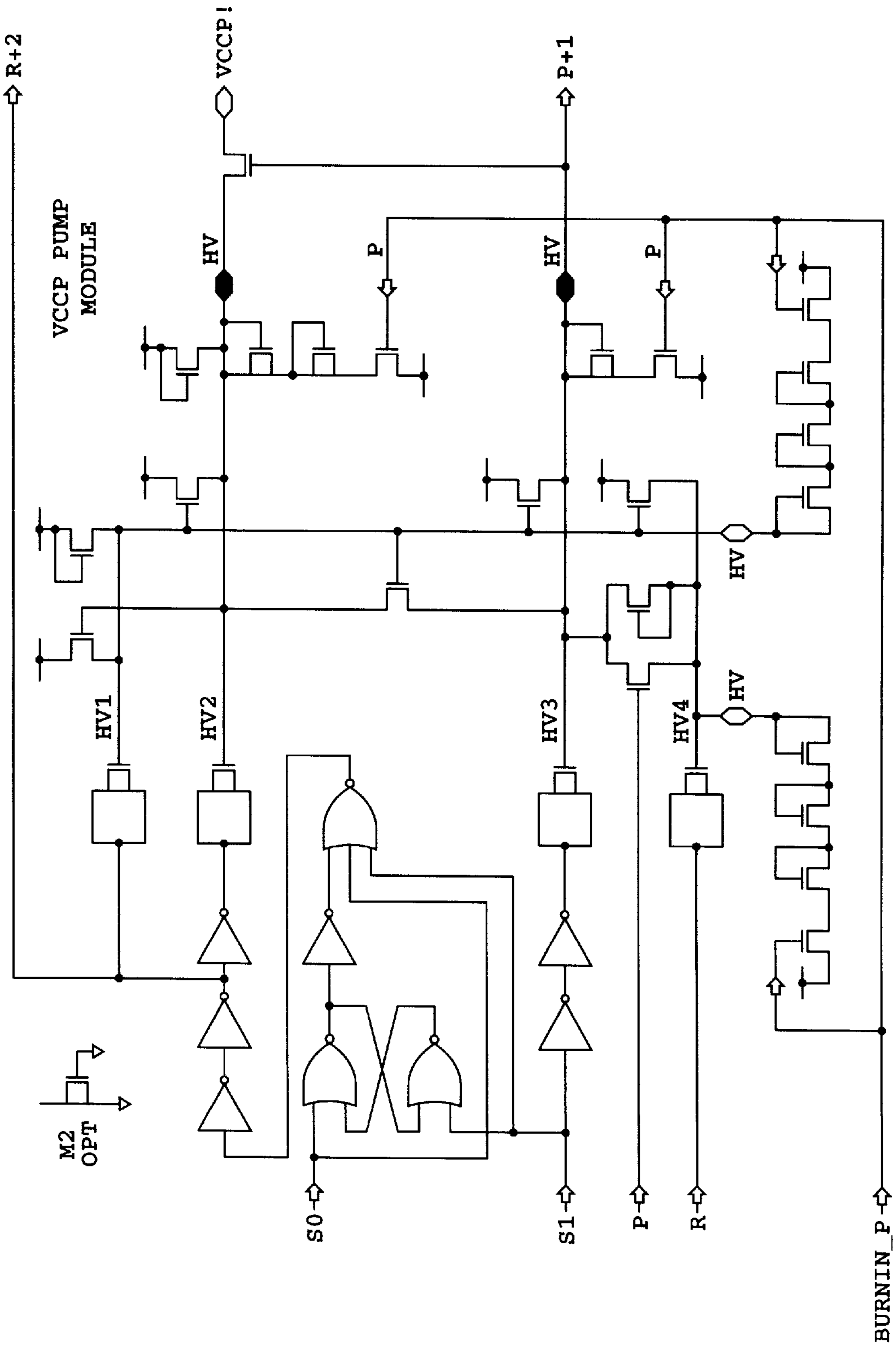
Figure 197:
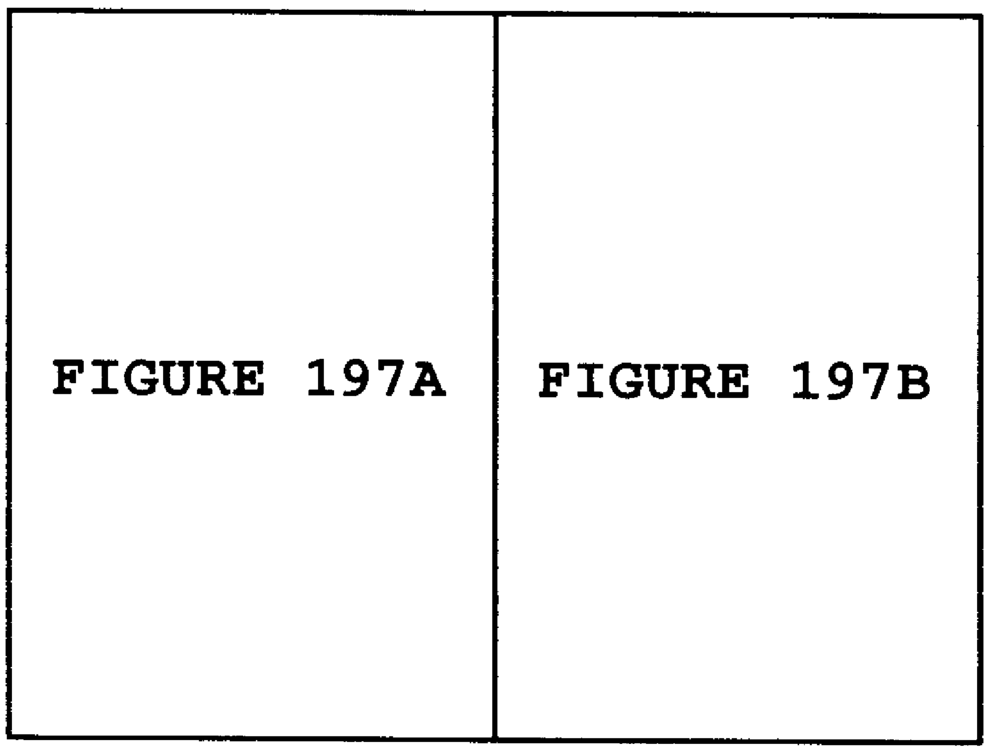
Figure 197A:
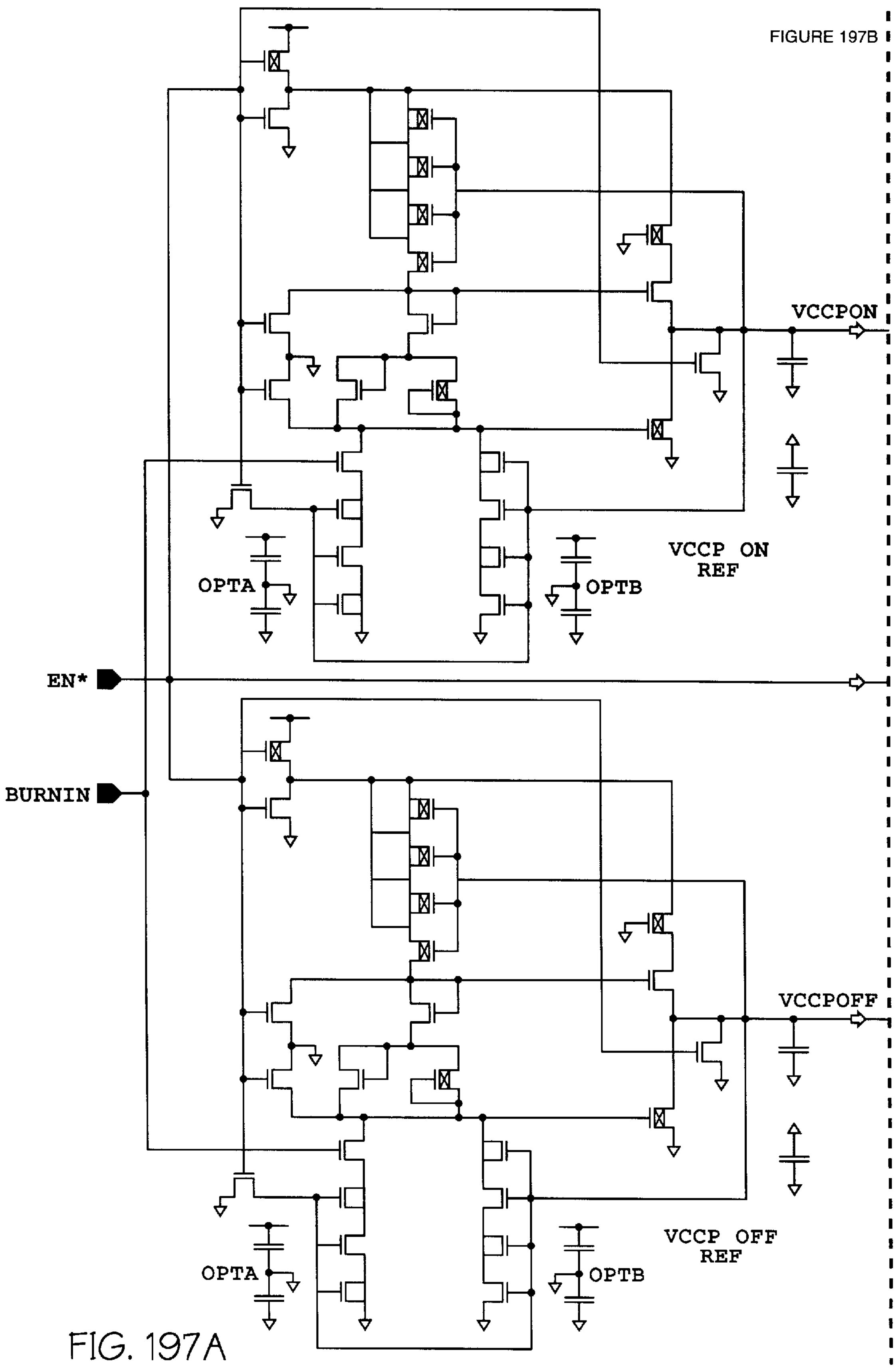
Figure 197B:
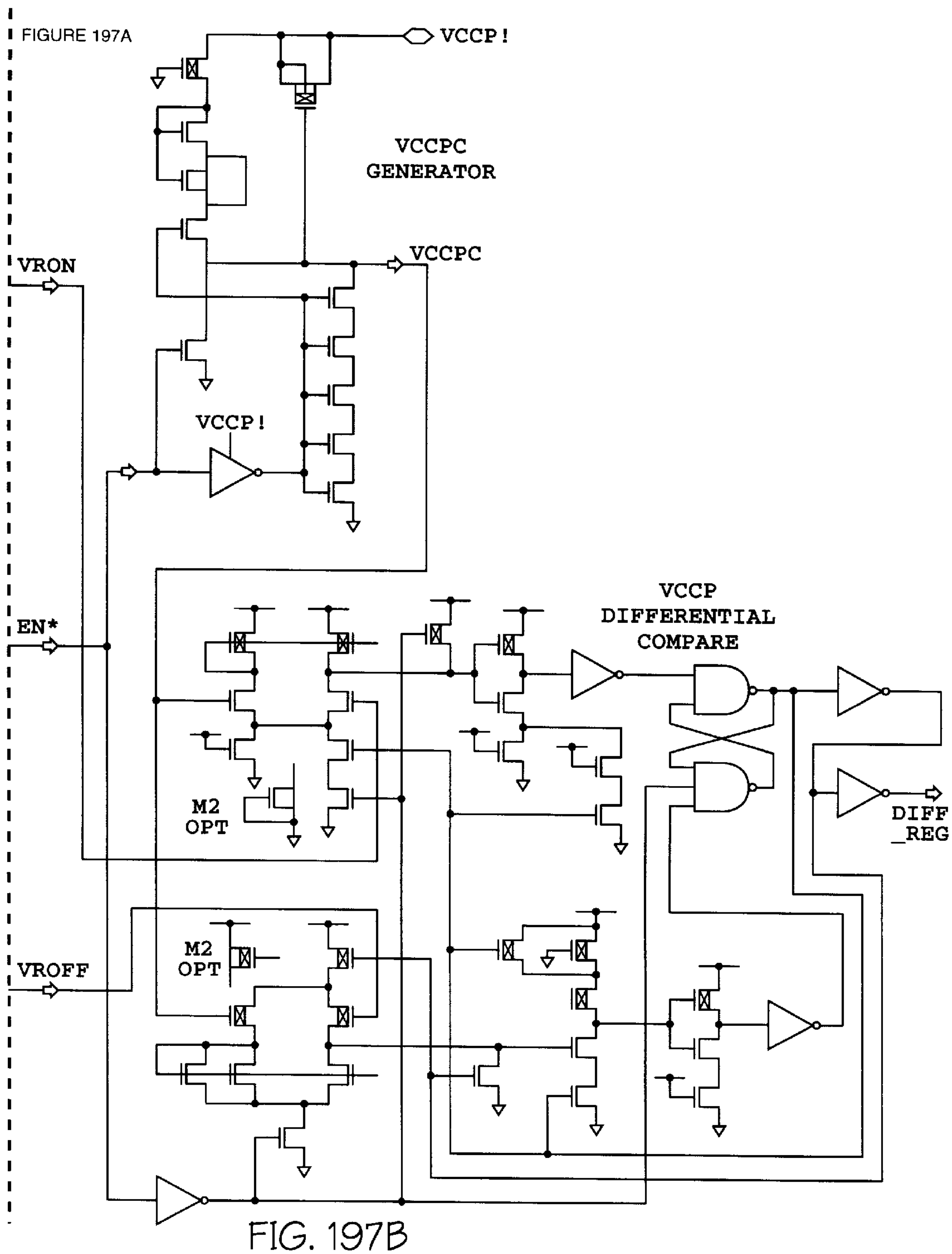
Figure 198:
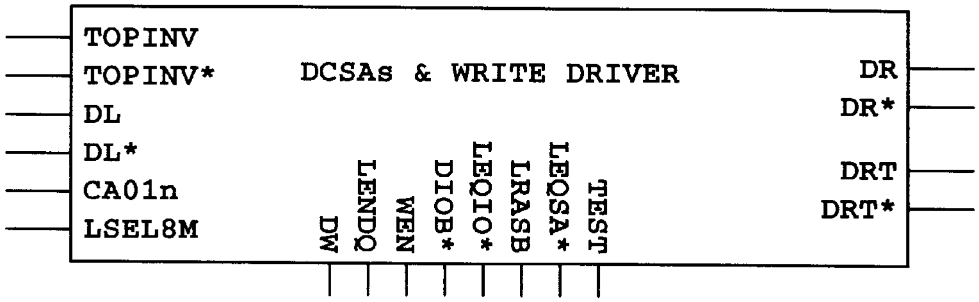
Figure 199:
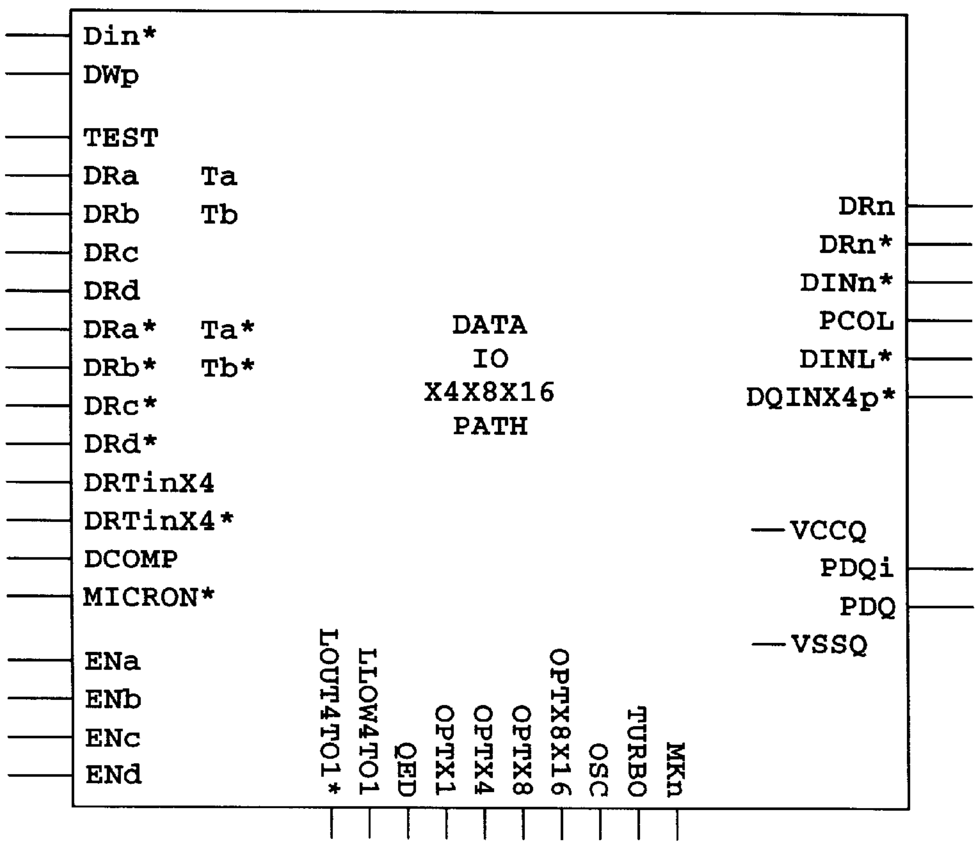
Figure 200:
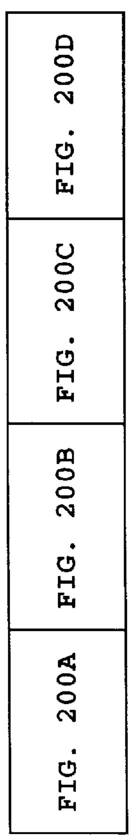
Figure 200A:
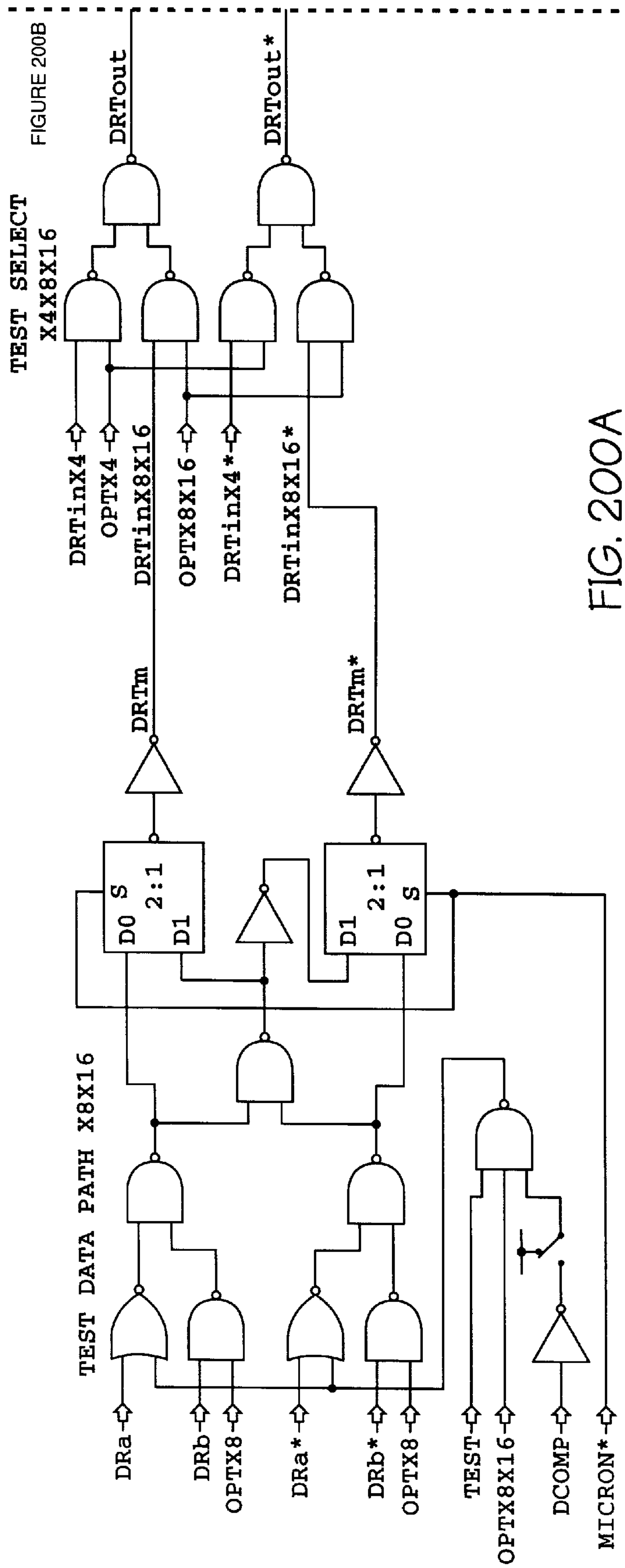
Figure 200B:
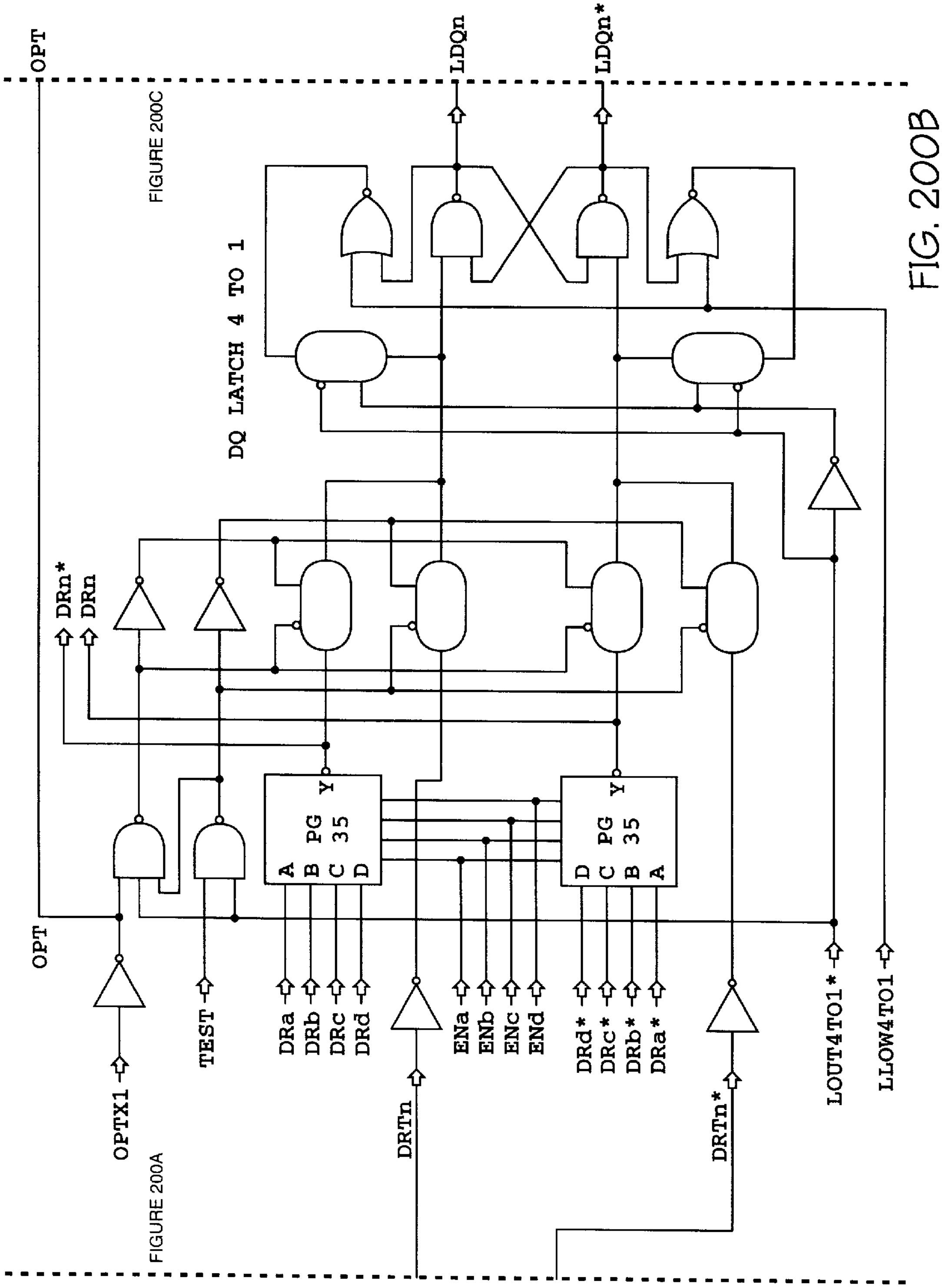
Figure 200C:
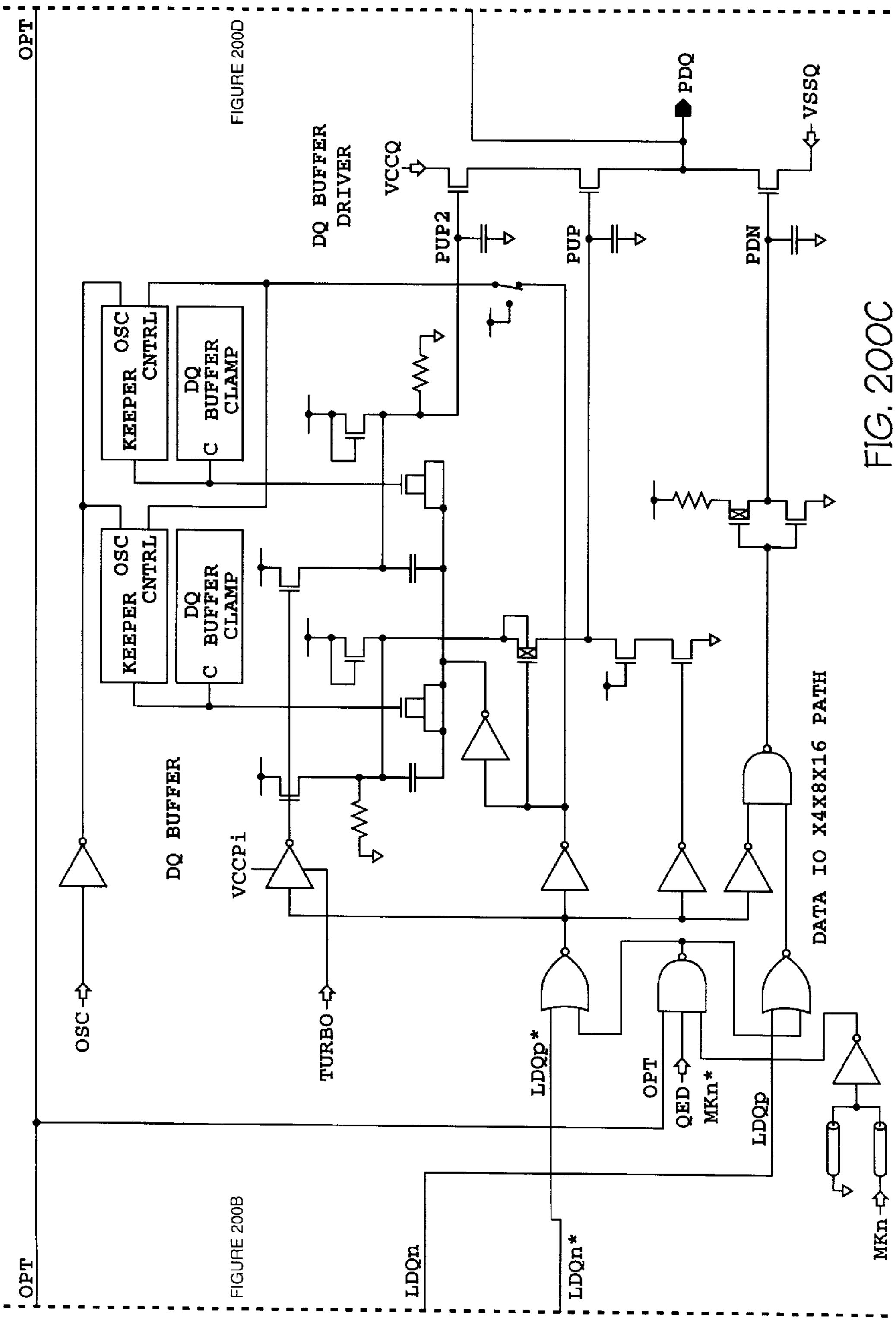
Figure 200D:
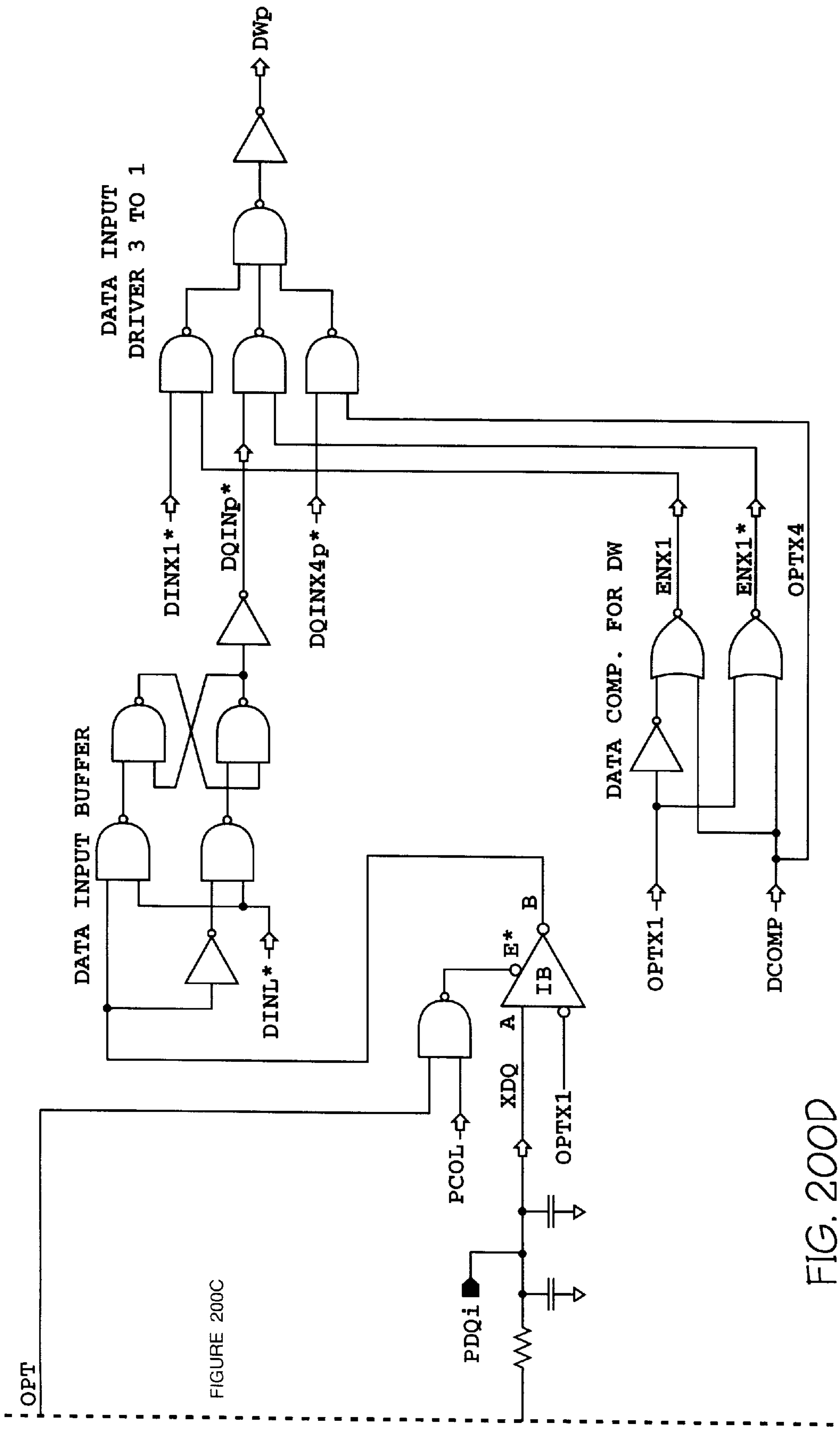
Figure 201:
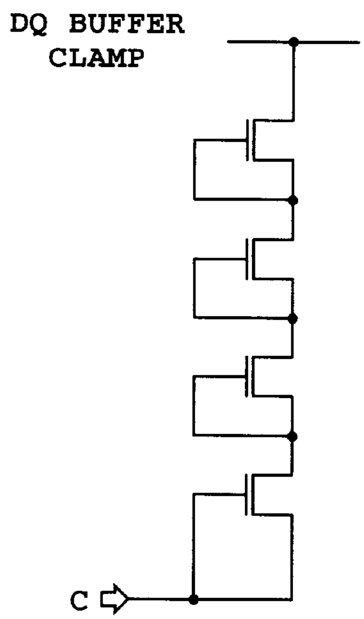
Figure 202:
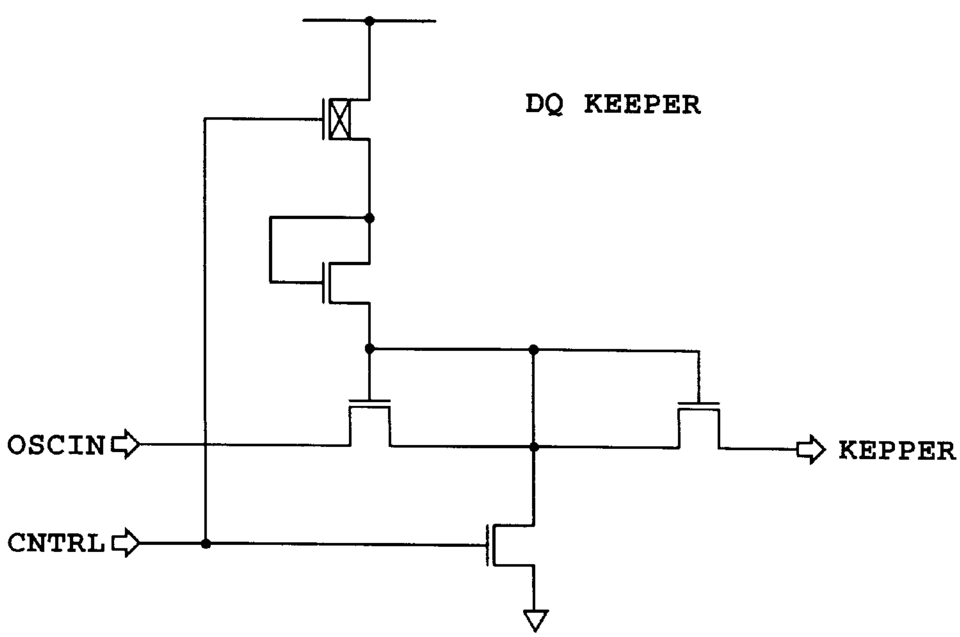
Figures 203, 203A:
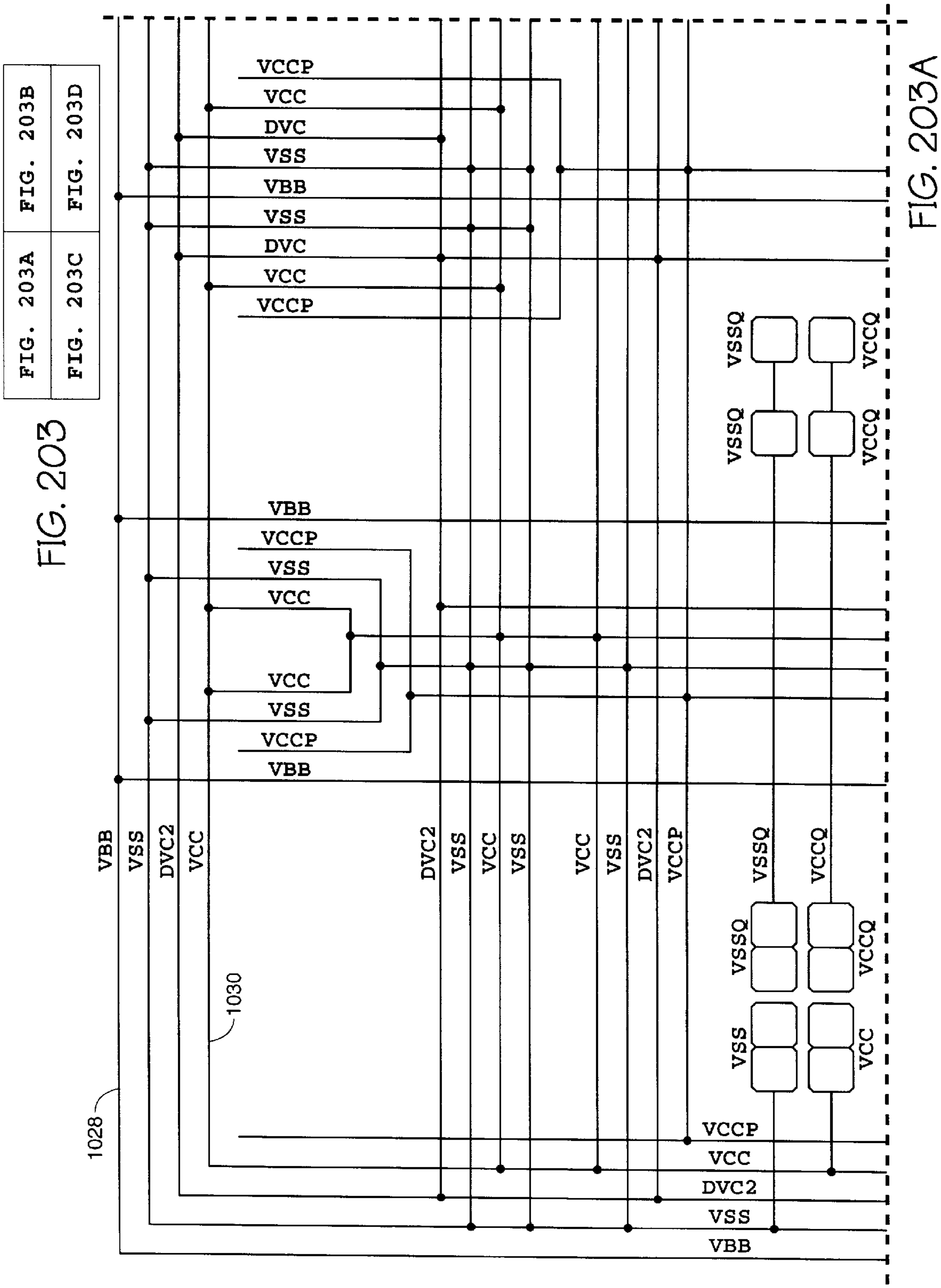
Figure 203B:
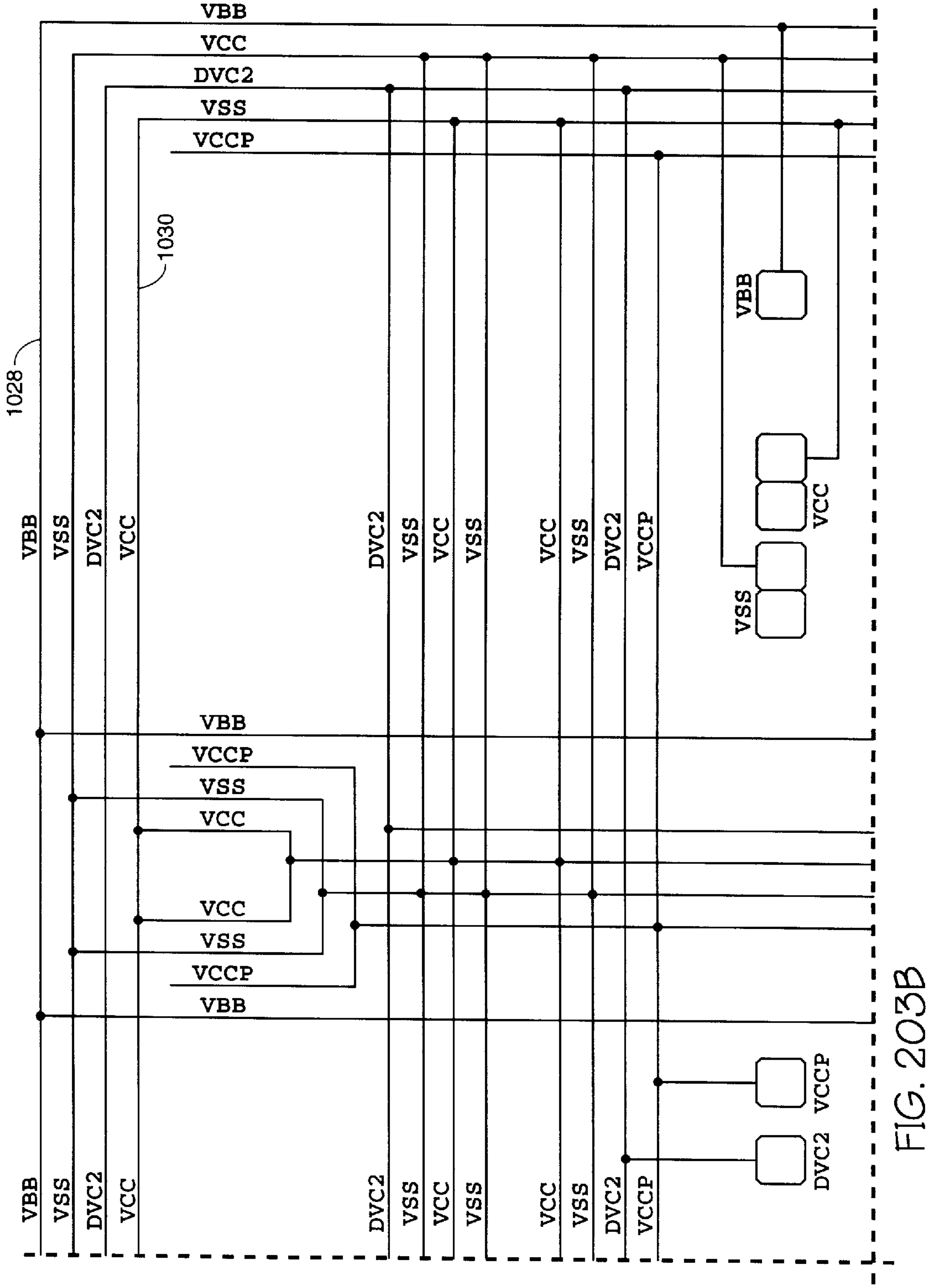
Figure 203C:
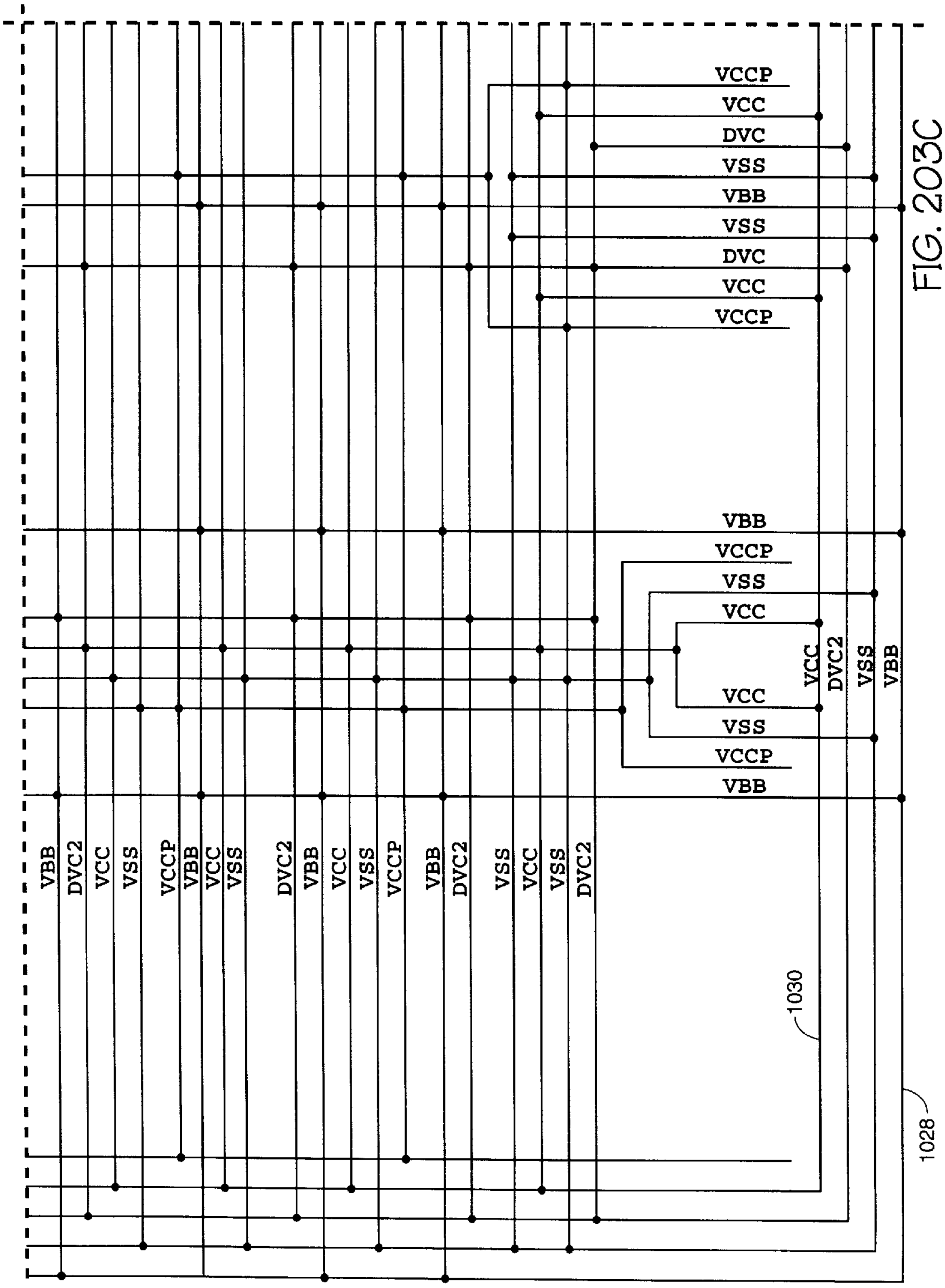
Figure 203D:
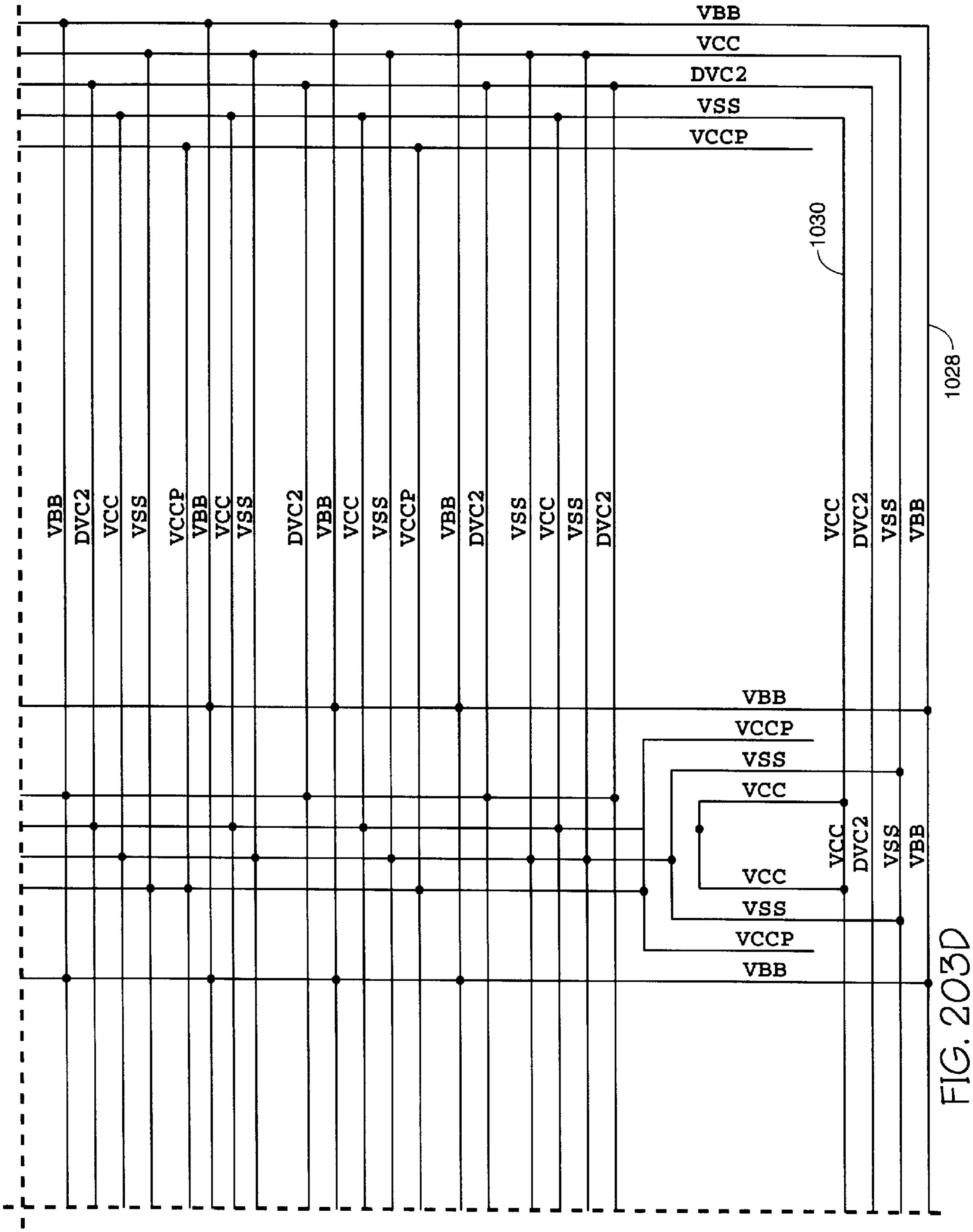
Figure 212:
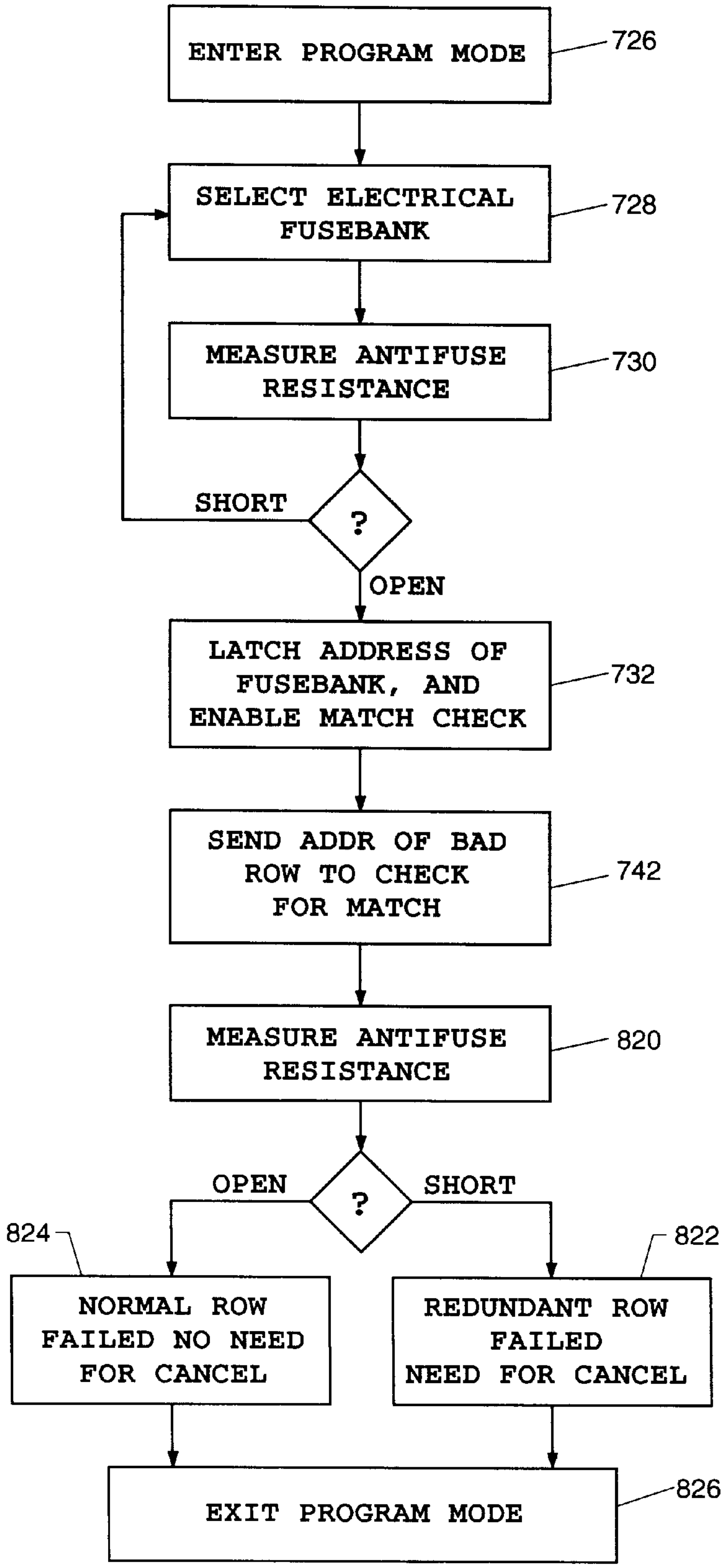
Figure 213:
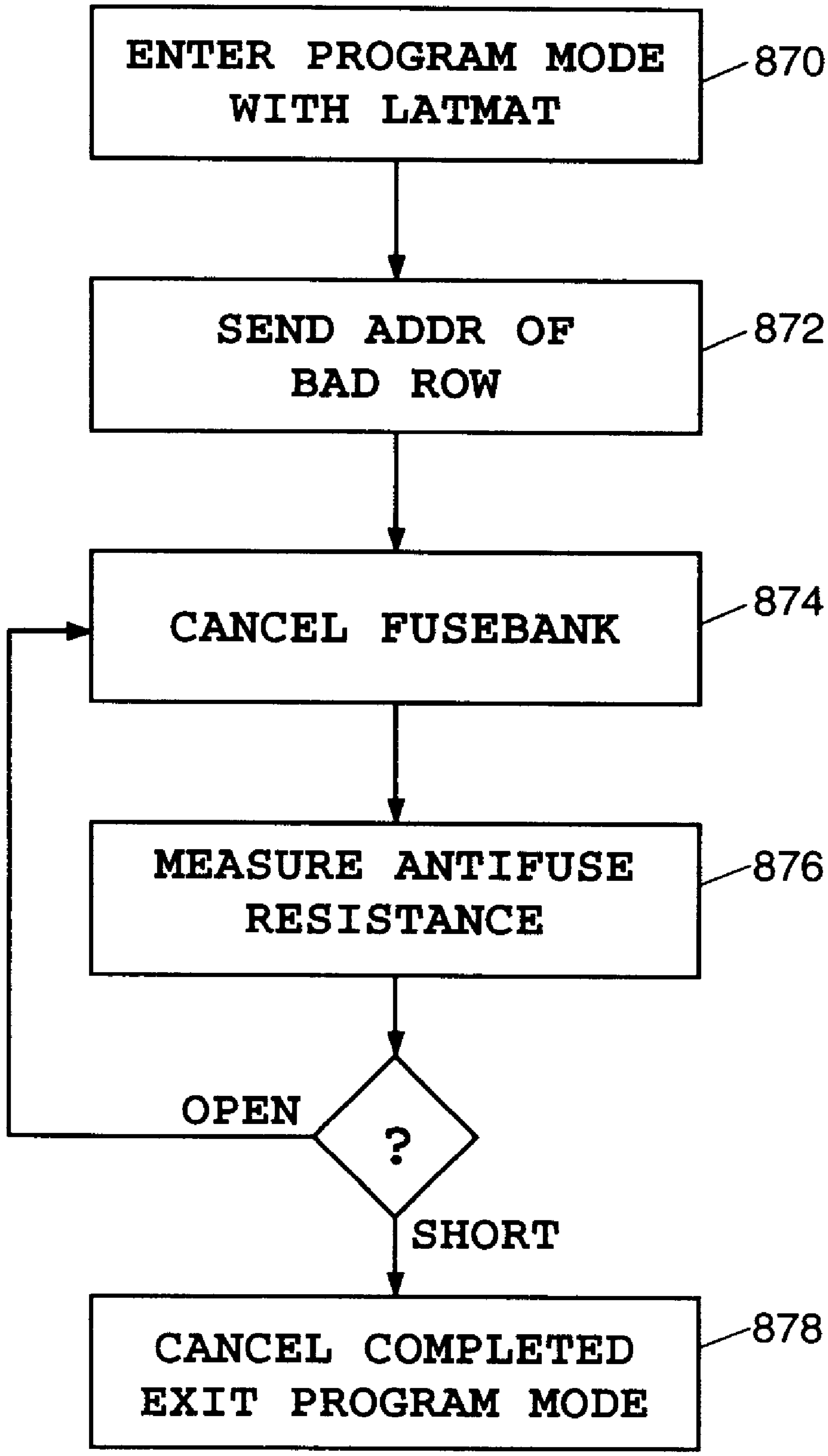
Figure 214:
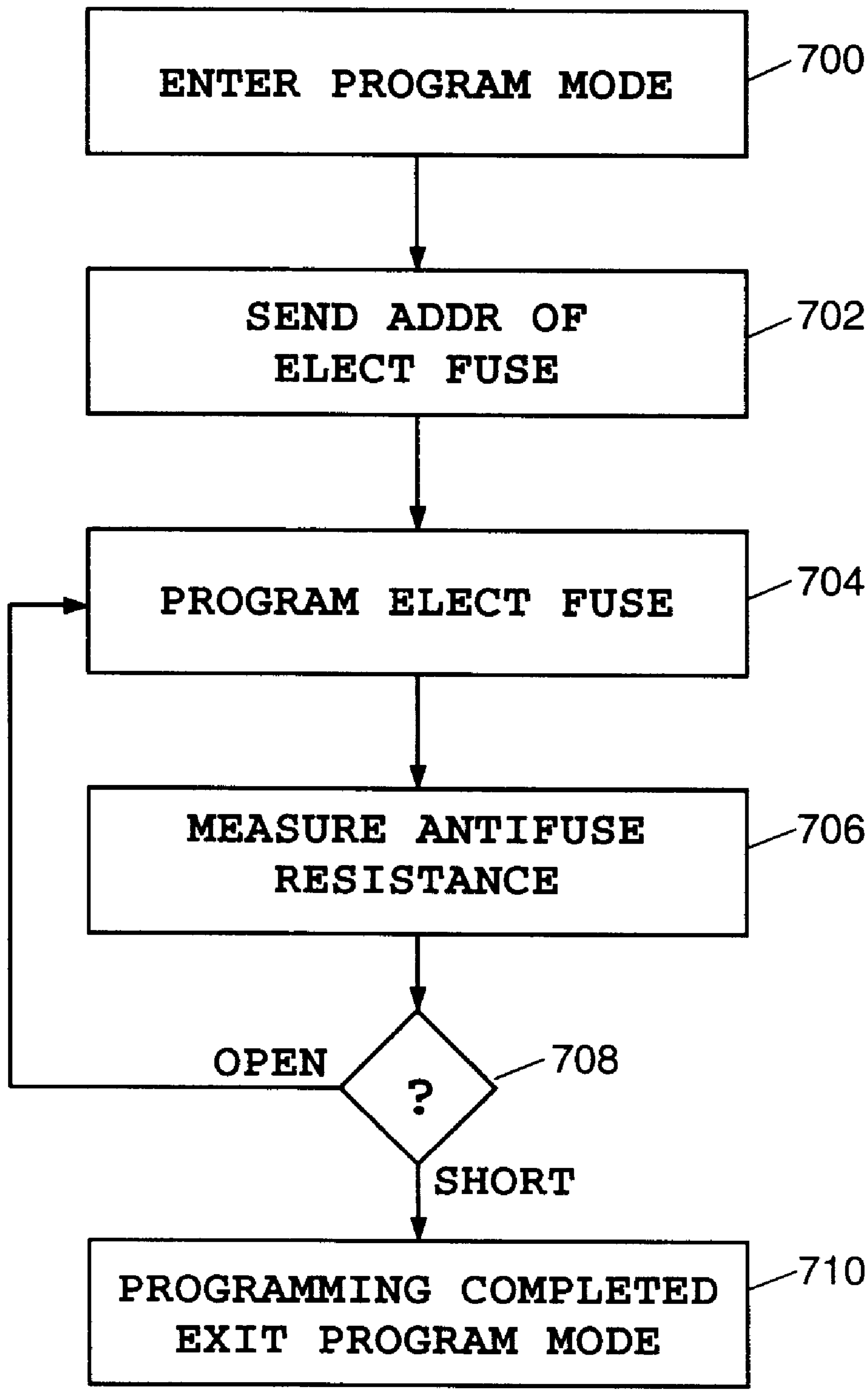
Figure 215:
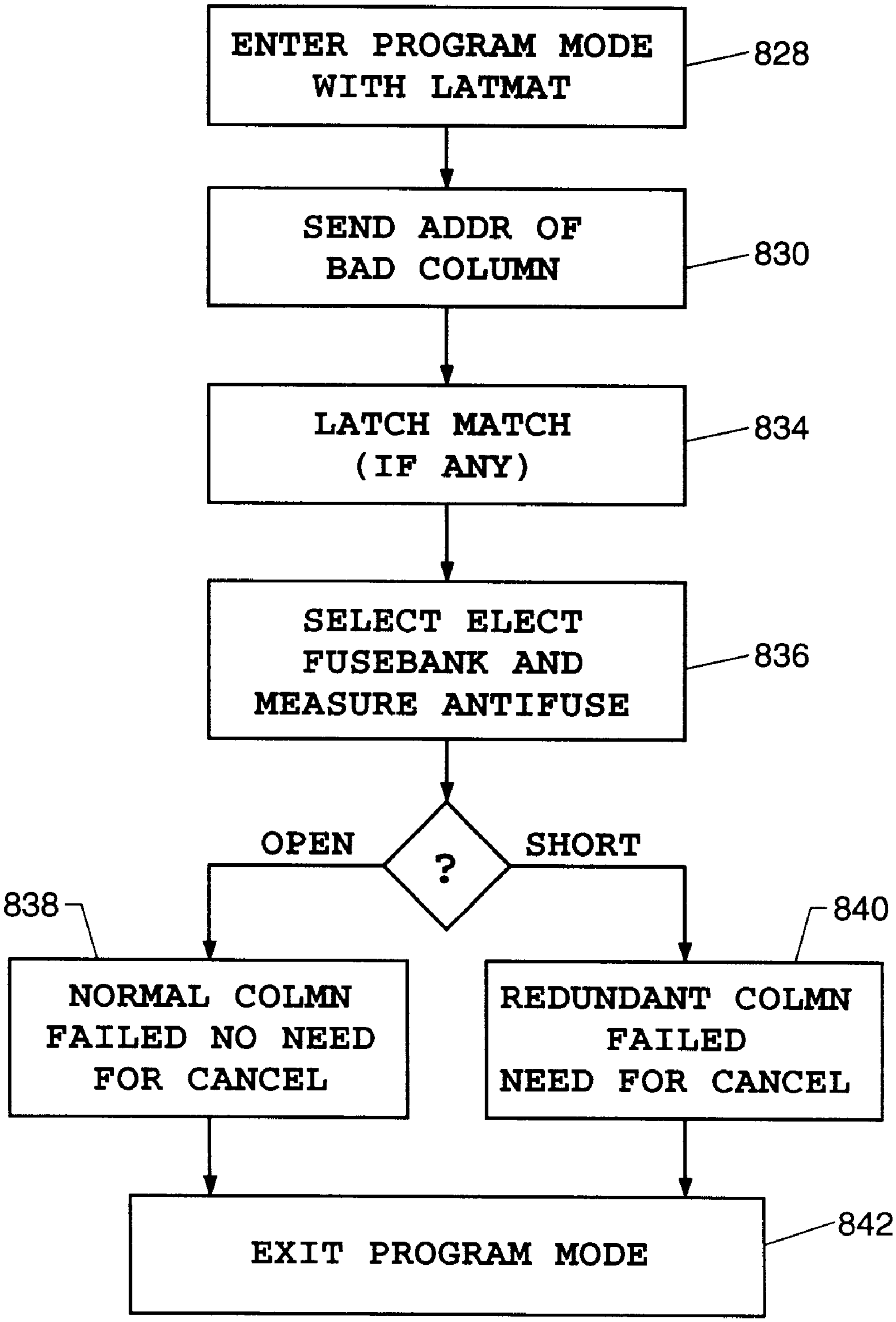
Figure 216:
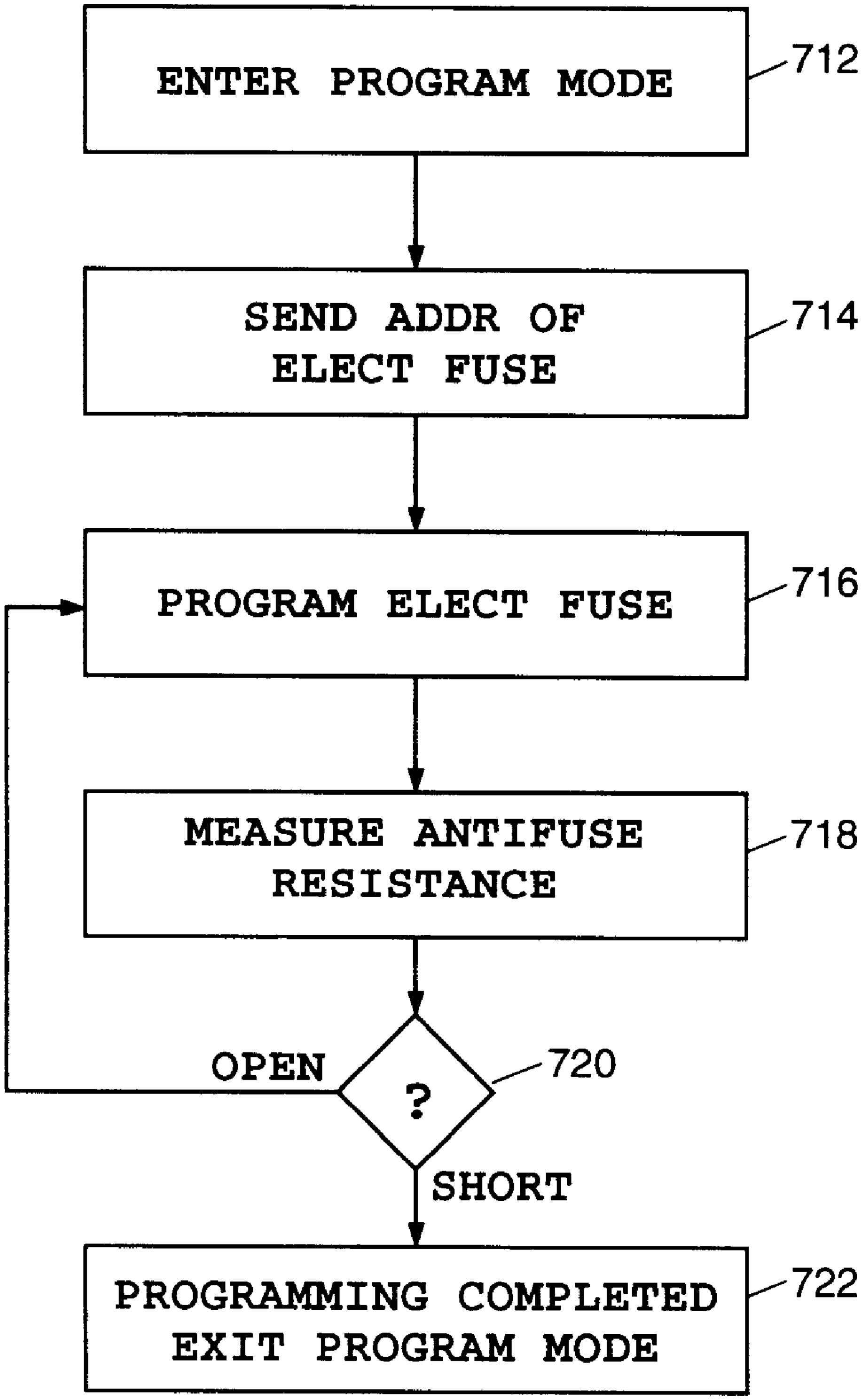
Figure 217:
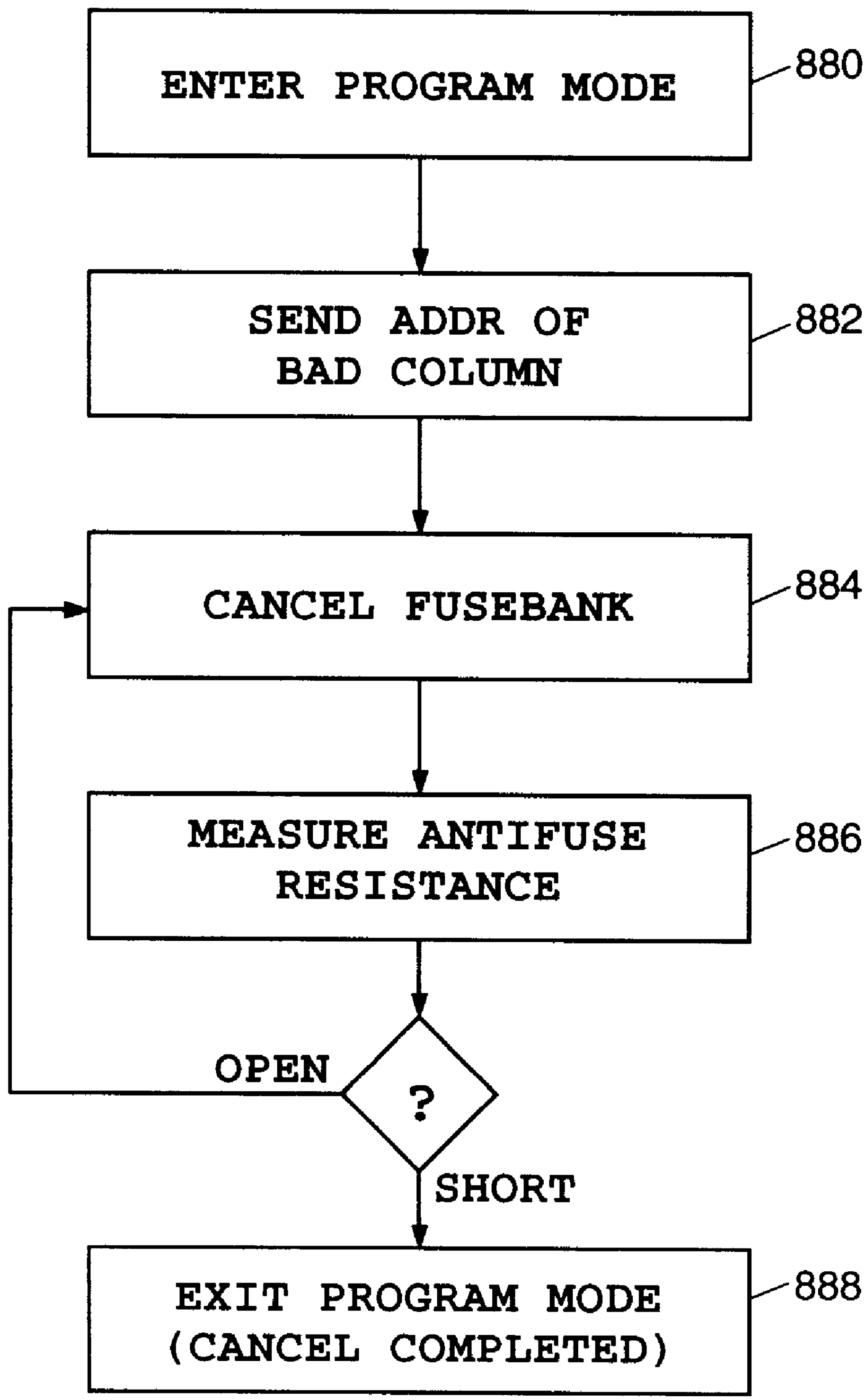
Figure 218:
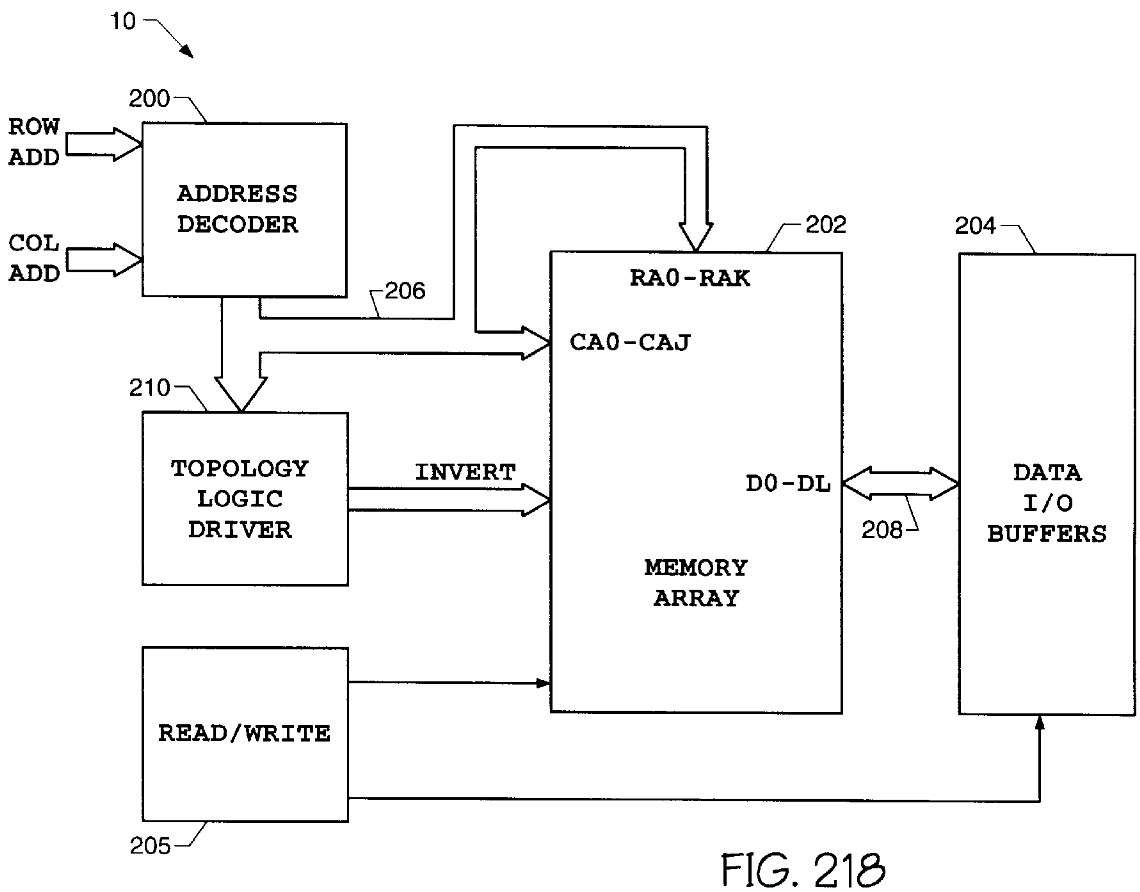
Figure 219:
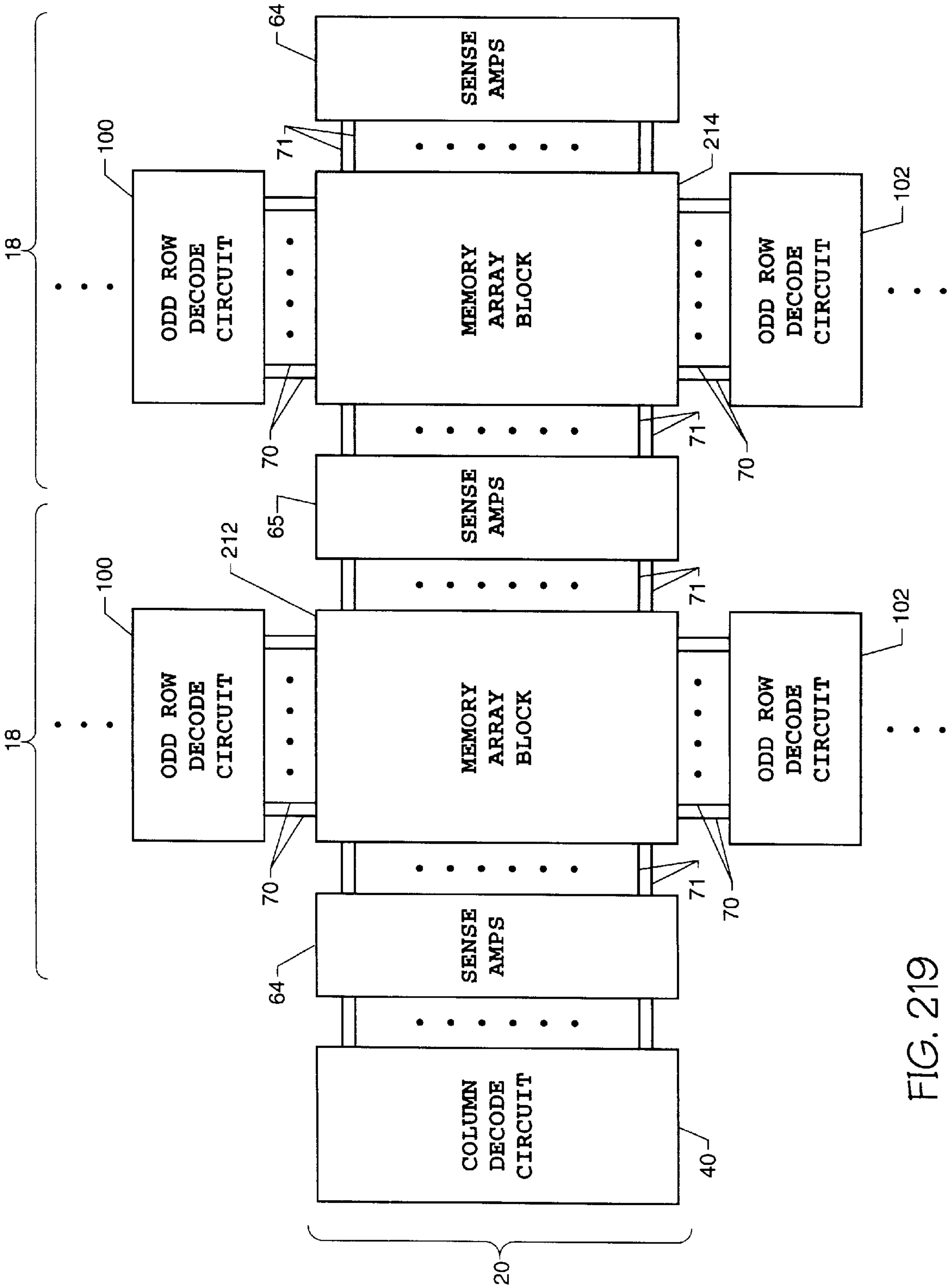
Figure 221:
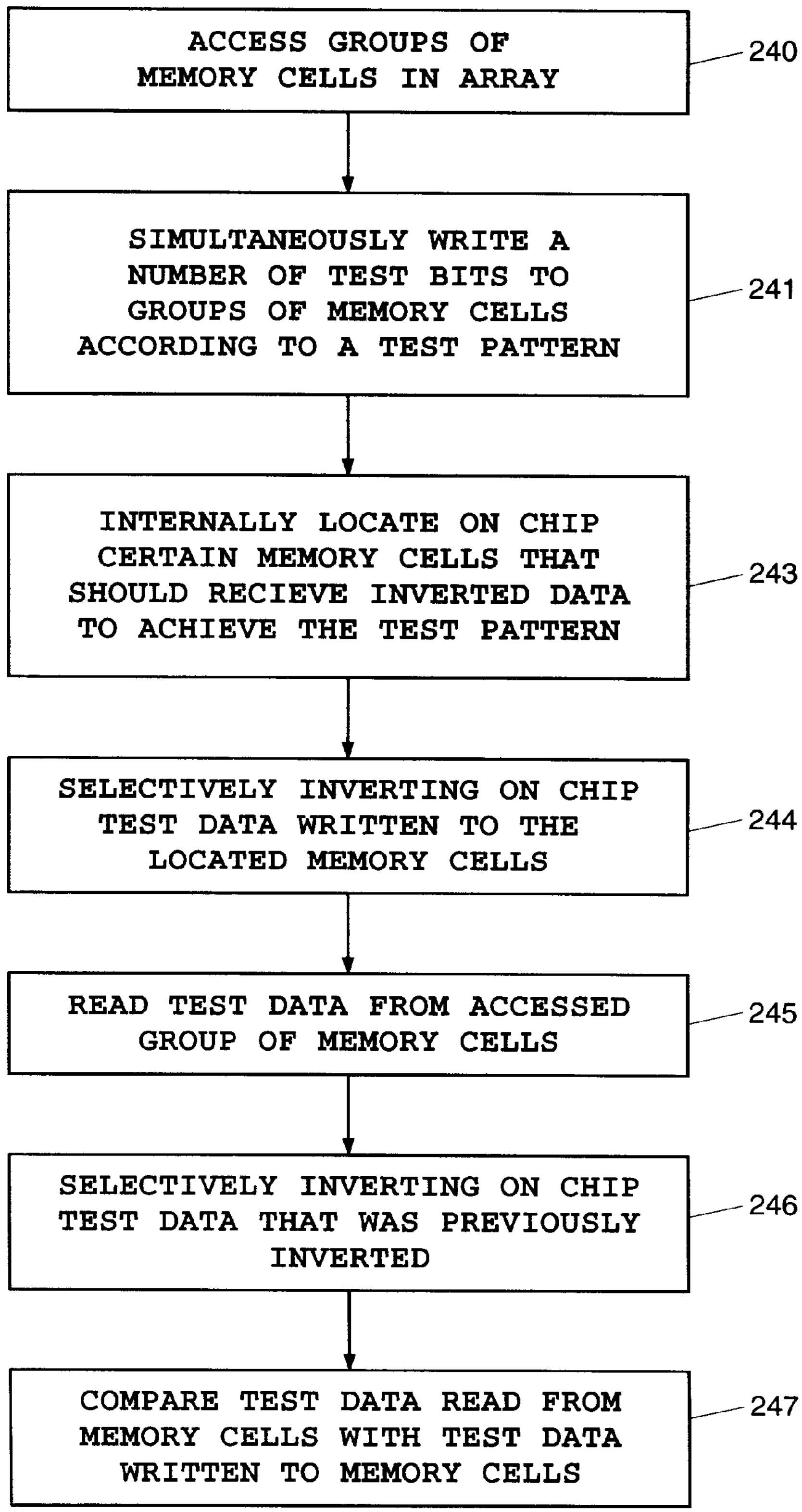
Figure 222:
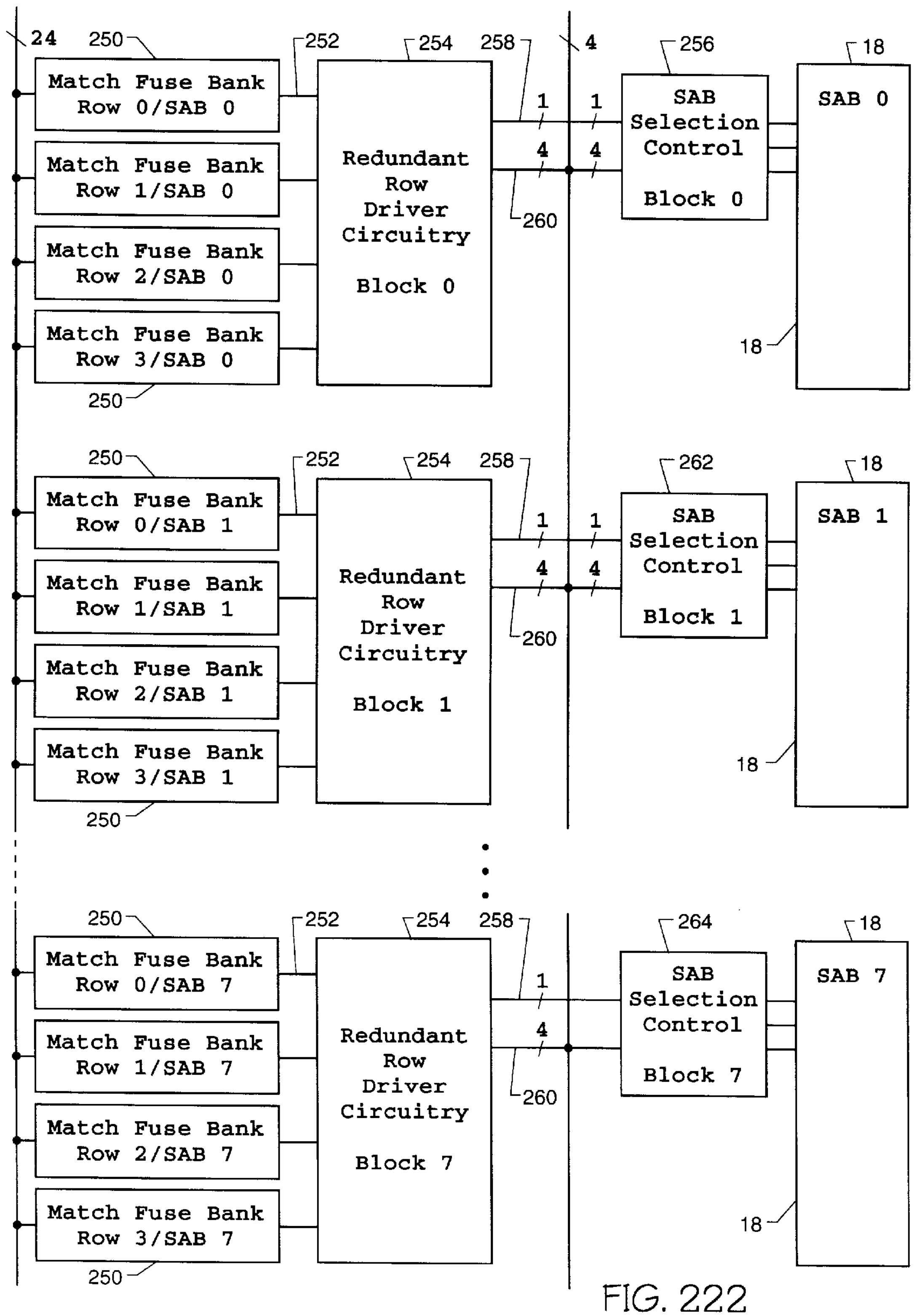
Figures 223, 223A:
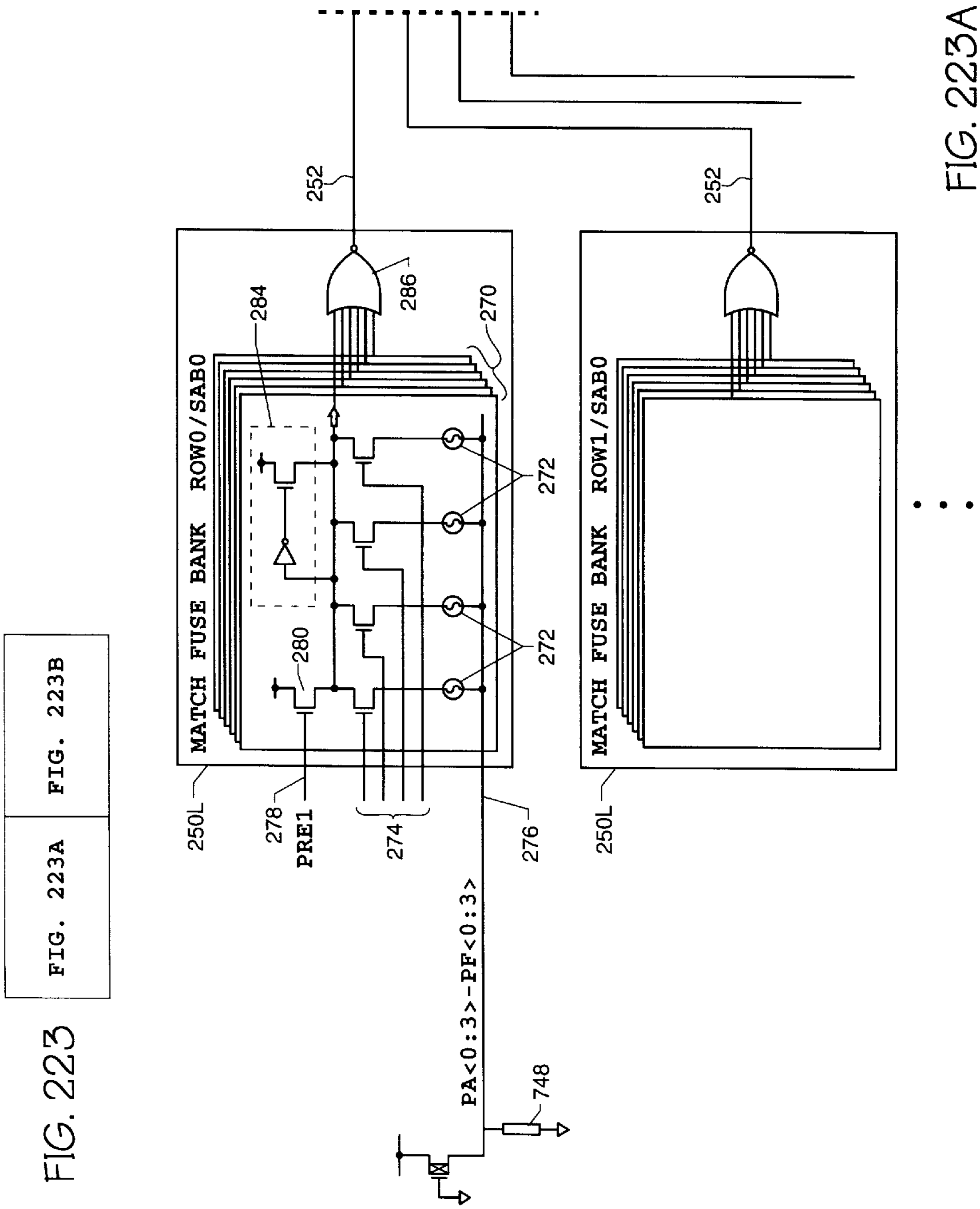
Figure 223B:
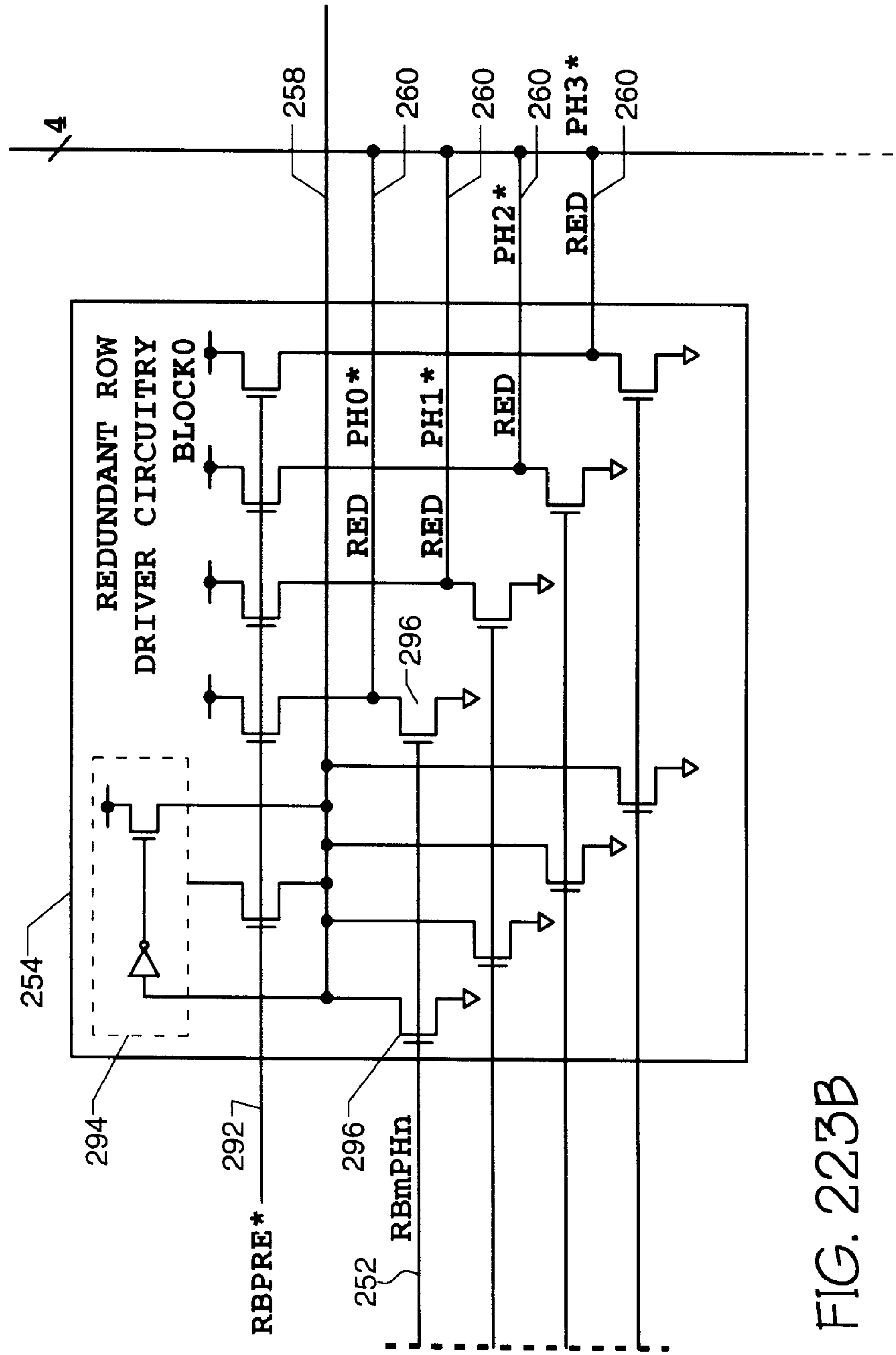
Figure 224:
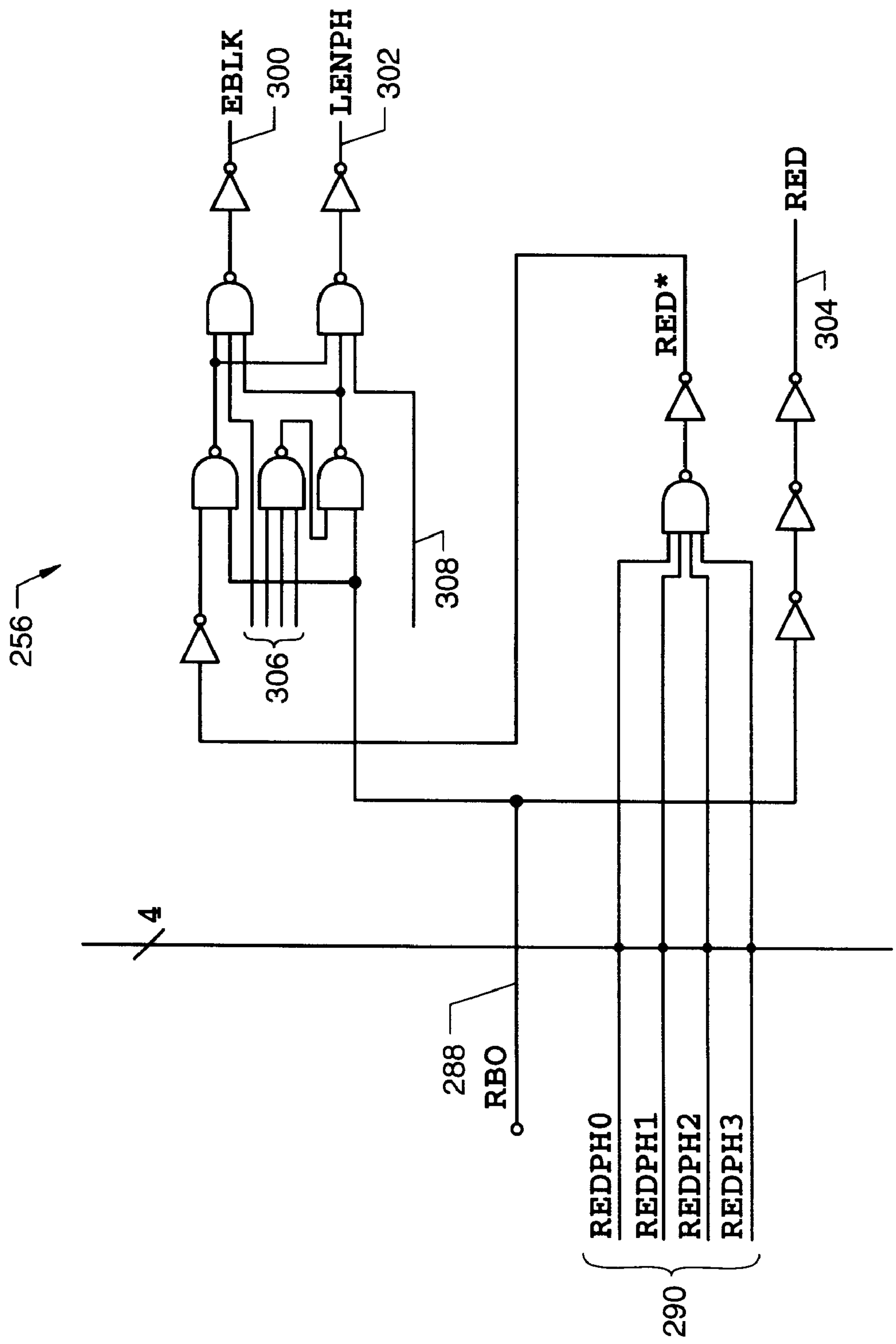
Figure 226:
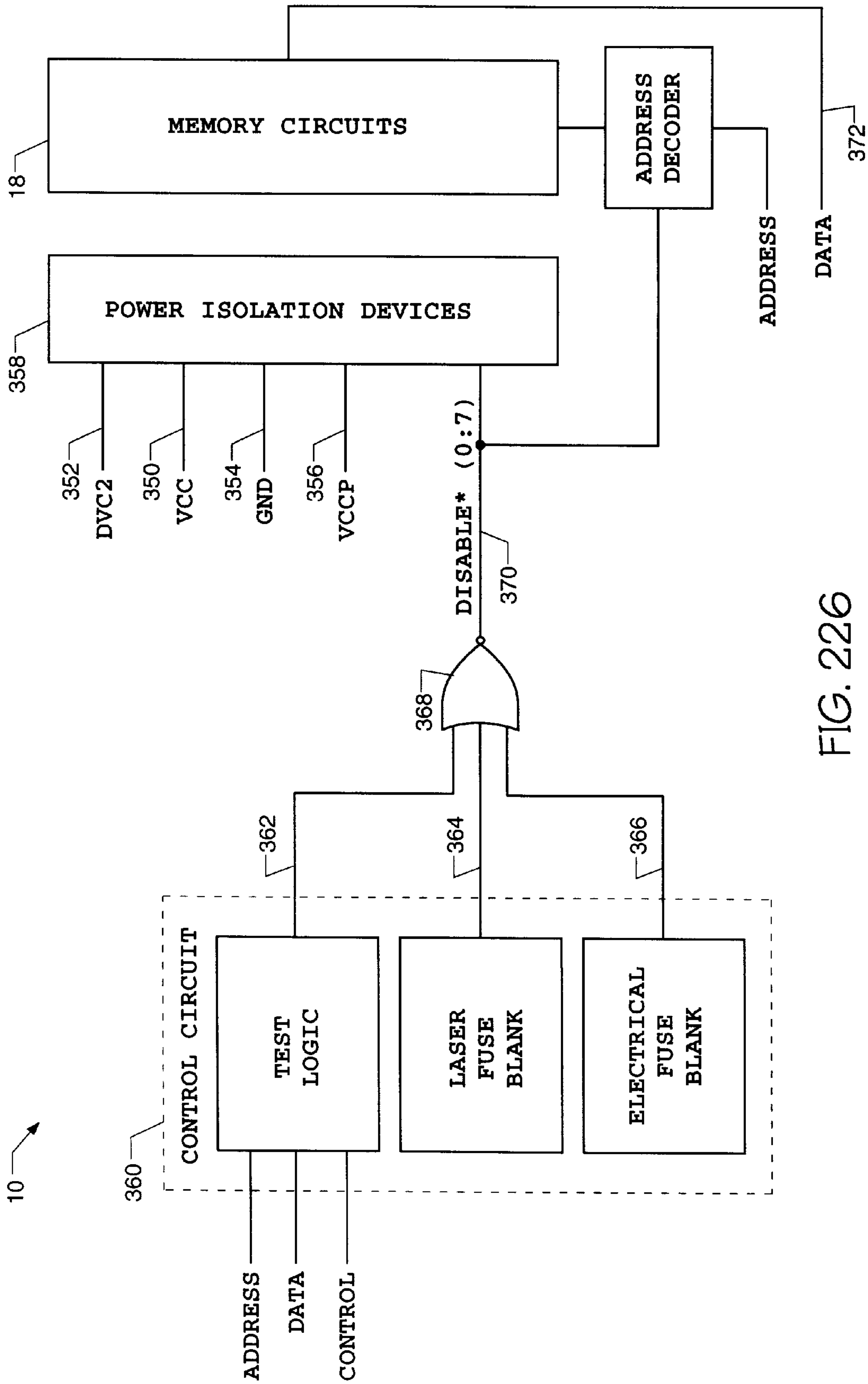
Figure 228:
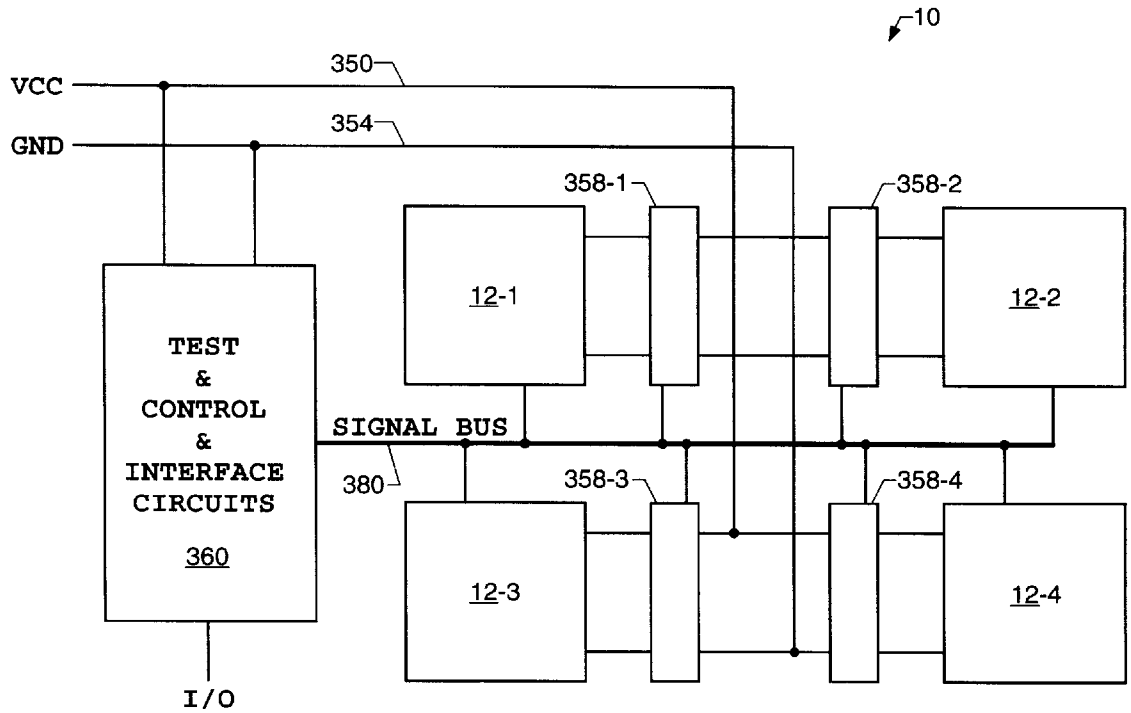
Figure 227:
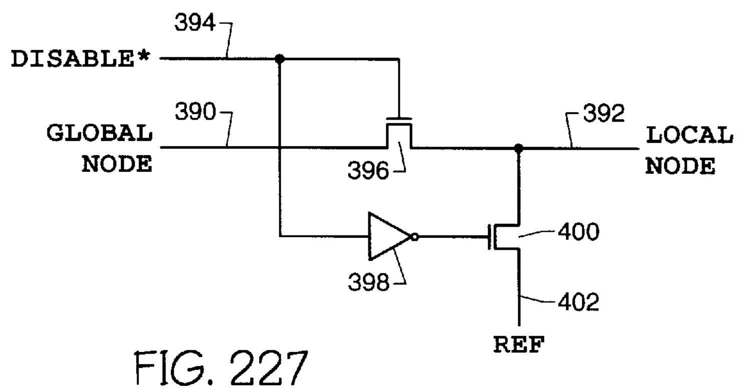
Figure 229:
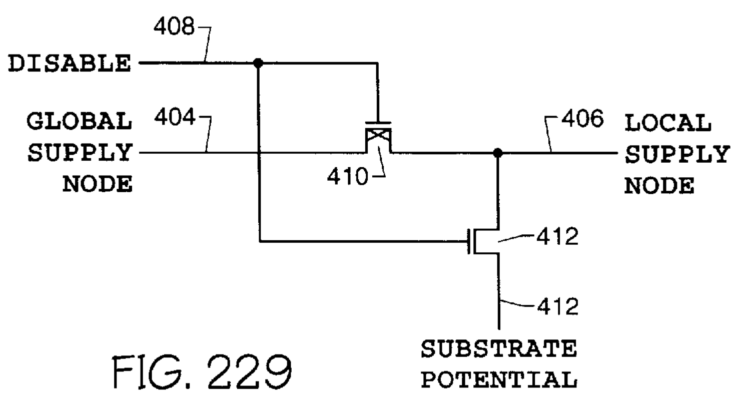
Figure 230:
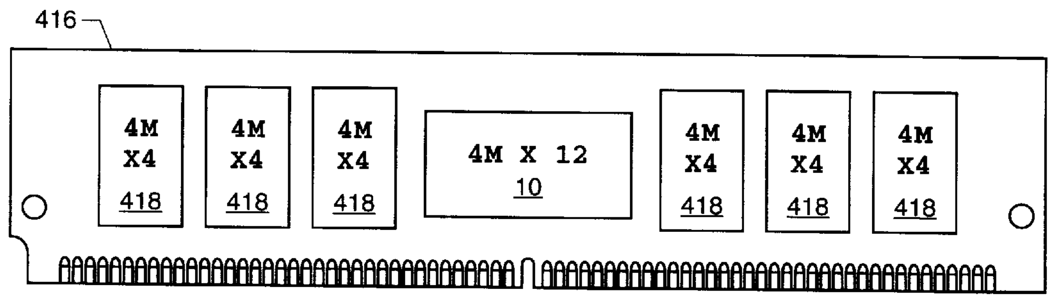
Figure 231:
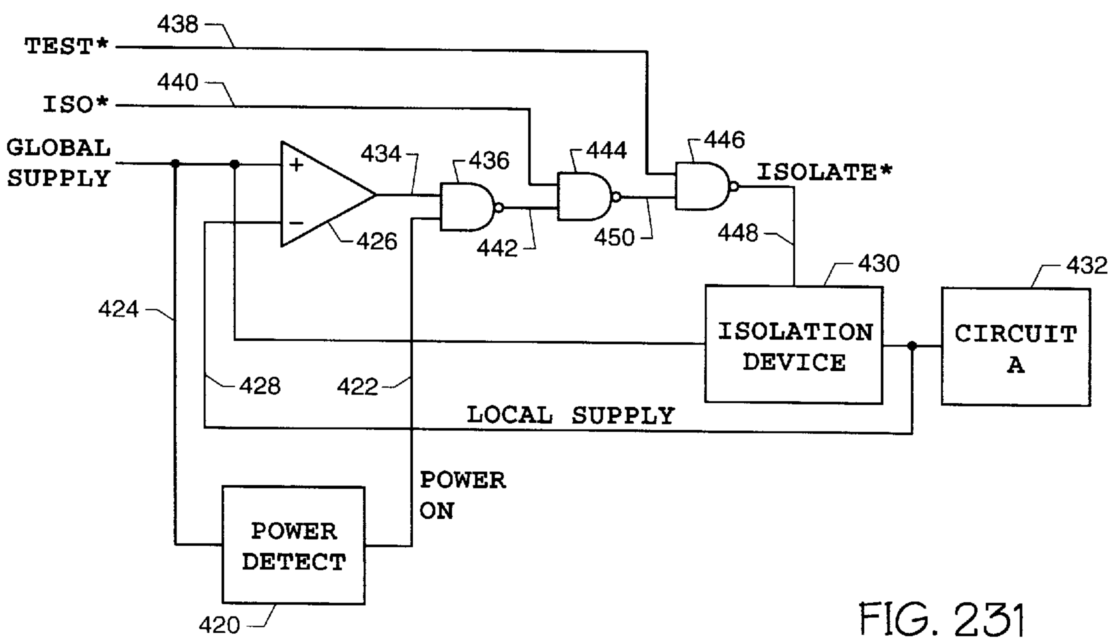
Figure 236:
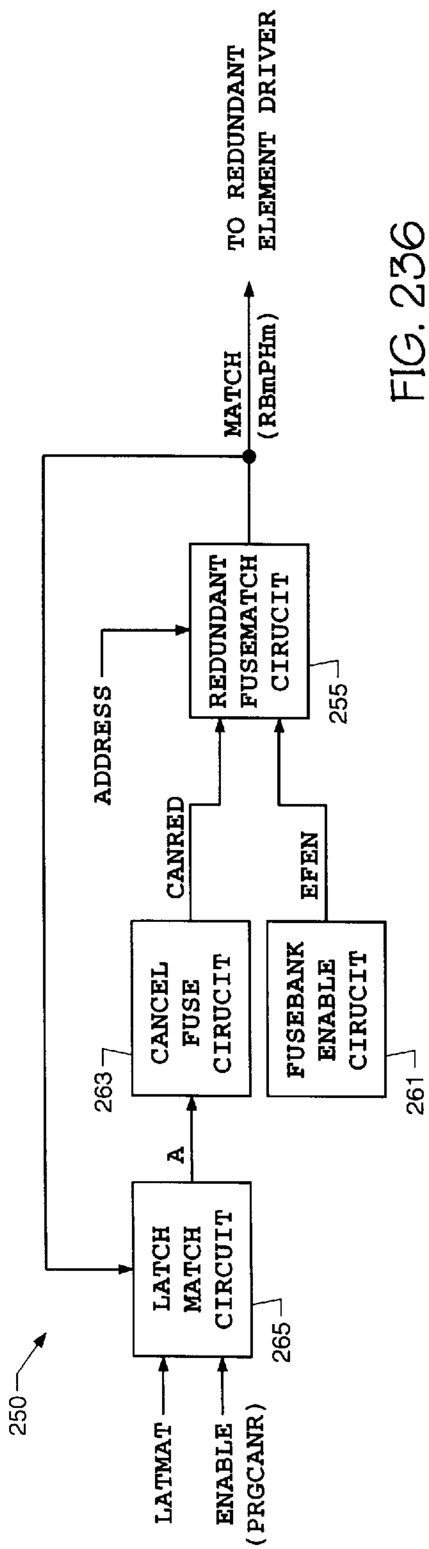
Figure 237:
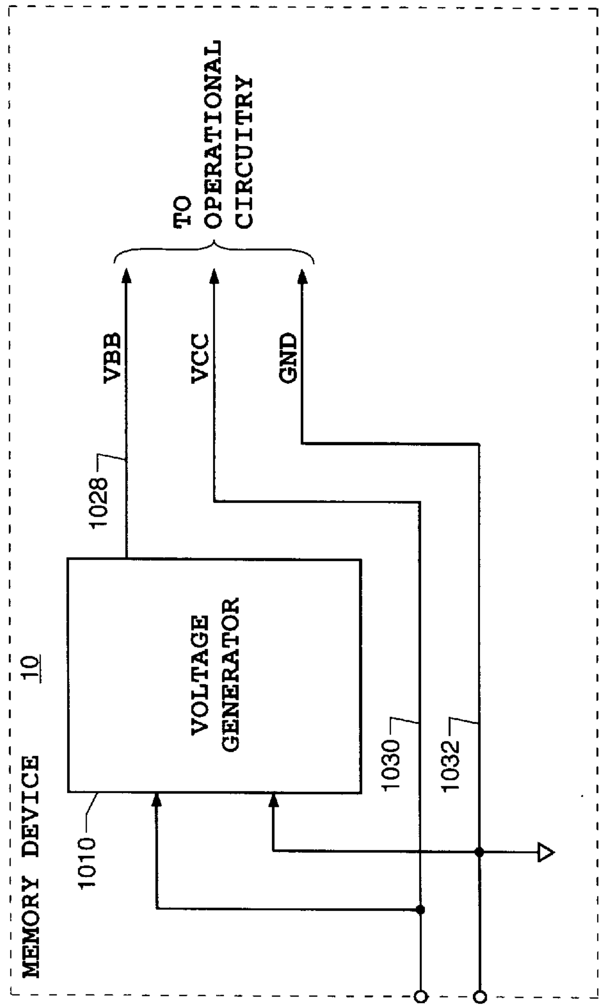
Figure 238:
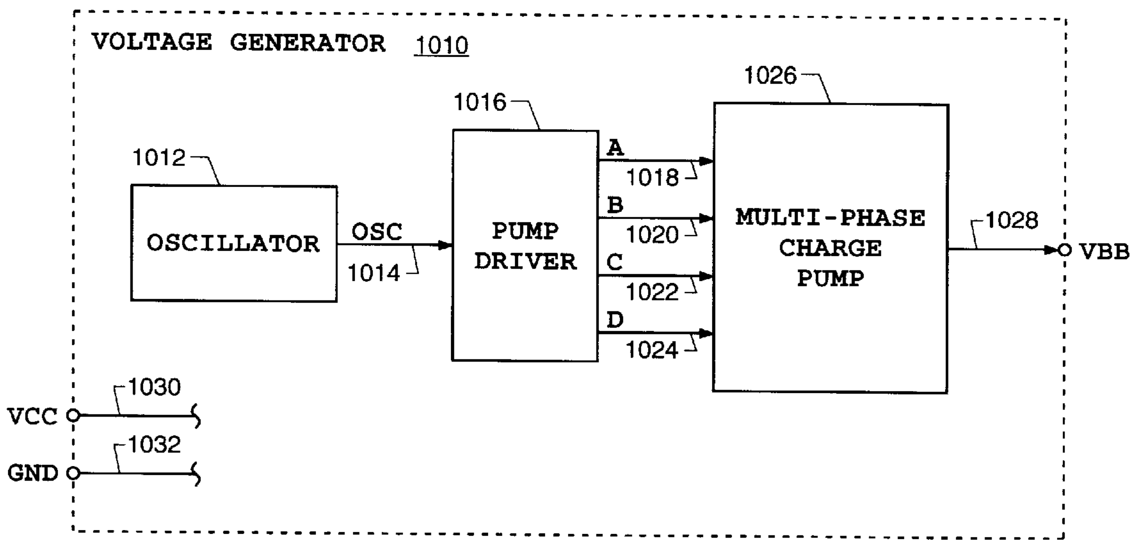
Figure 239:
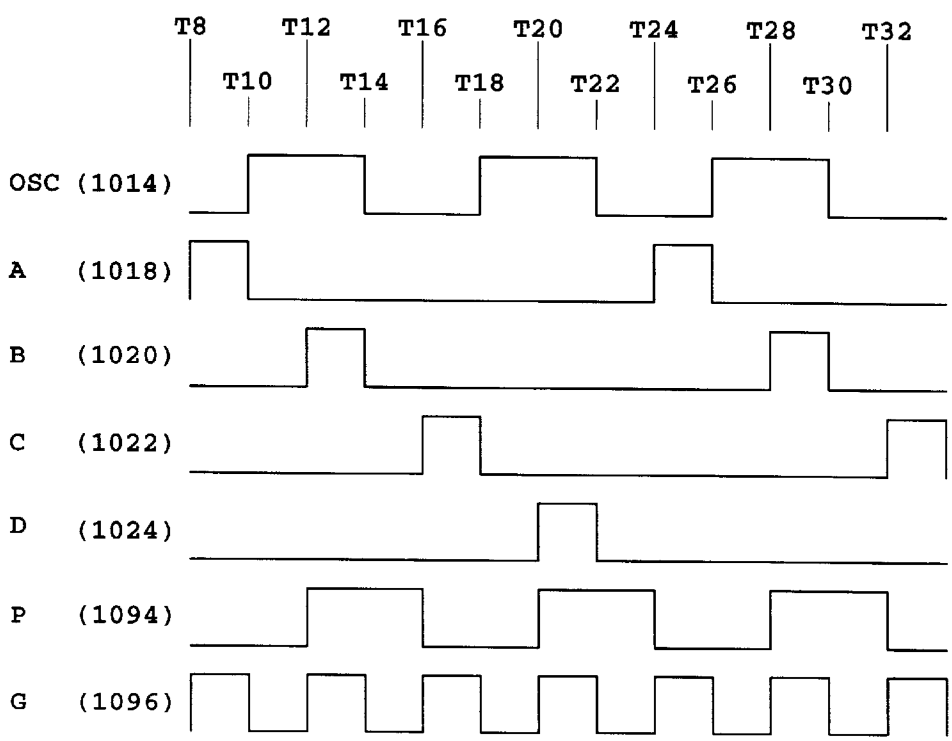
Figure 240:
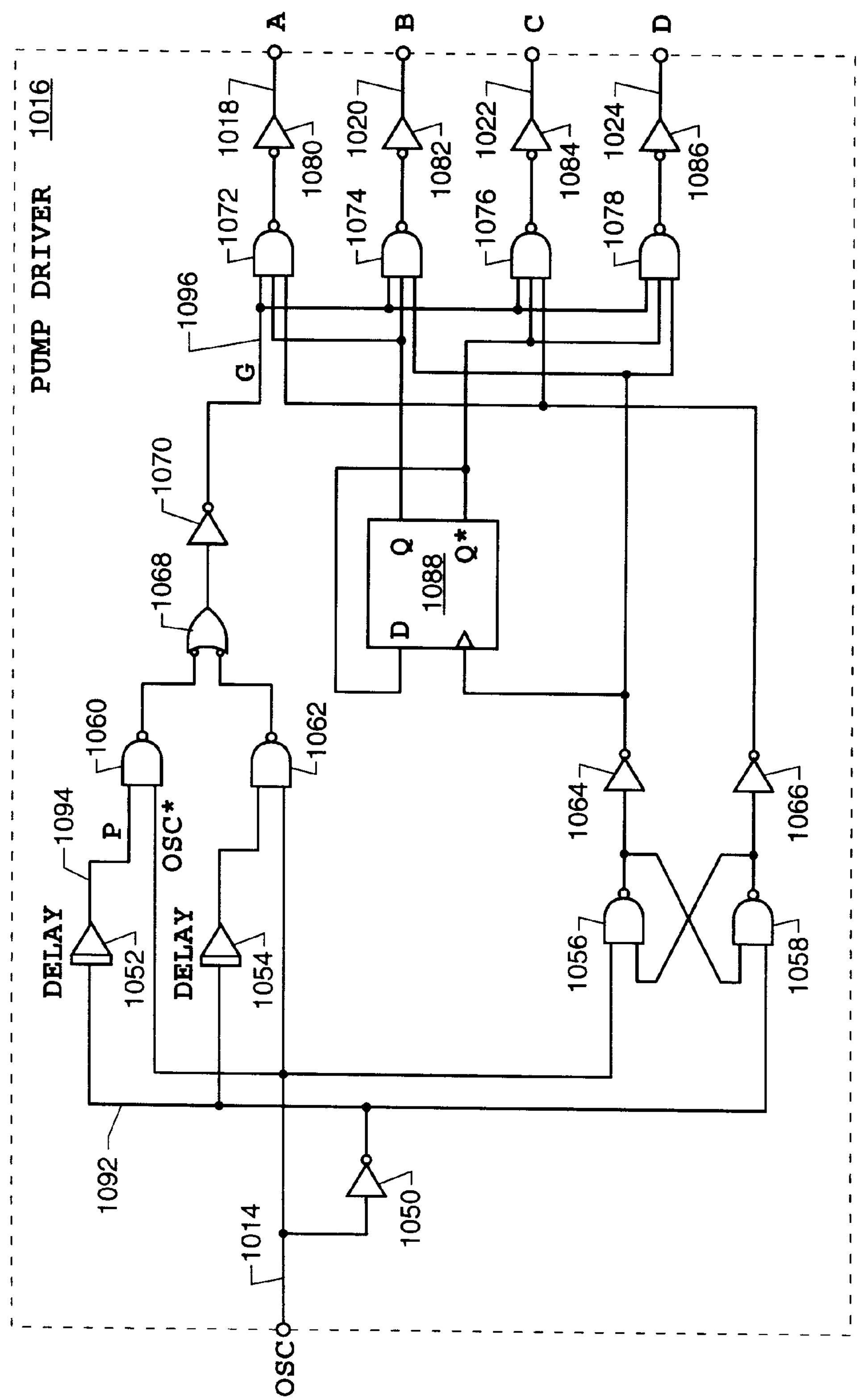
Figure 241:
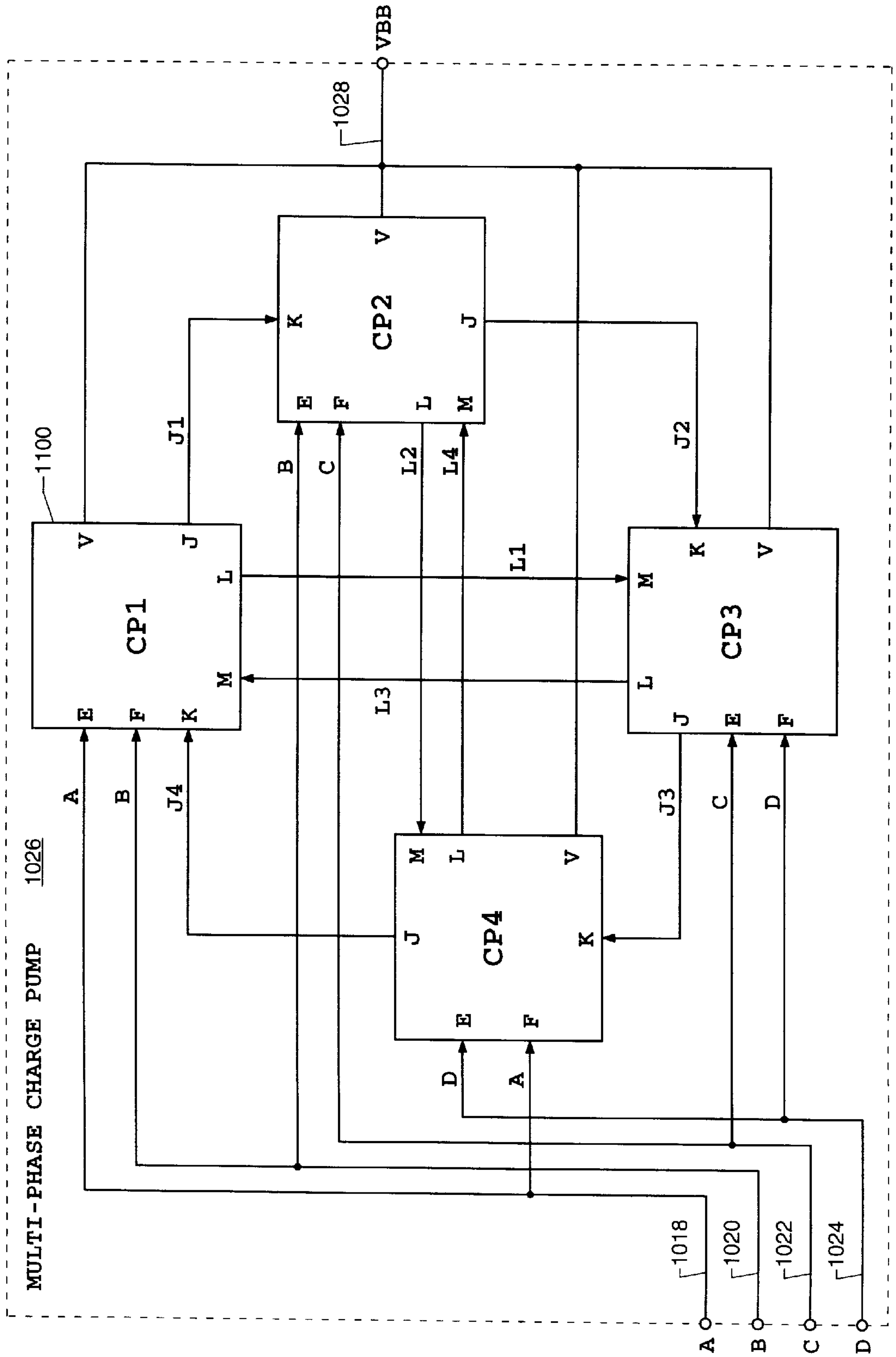
Figure 242:
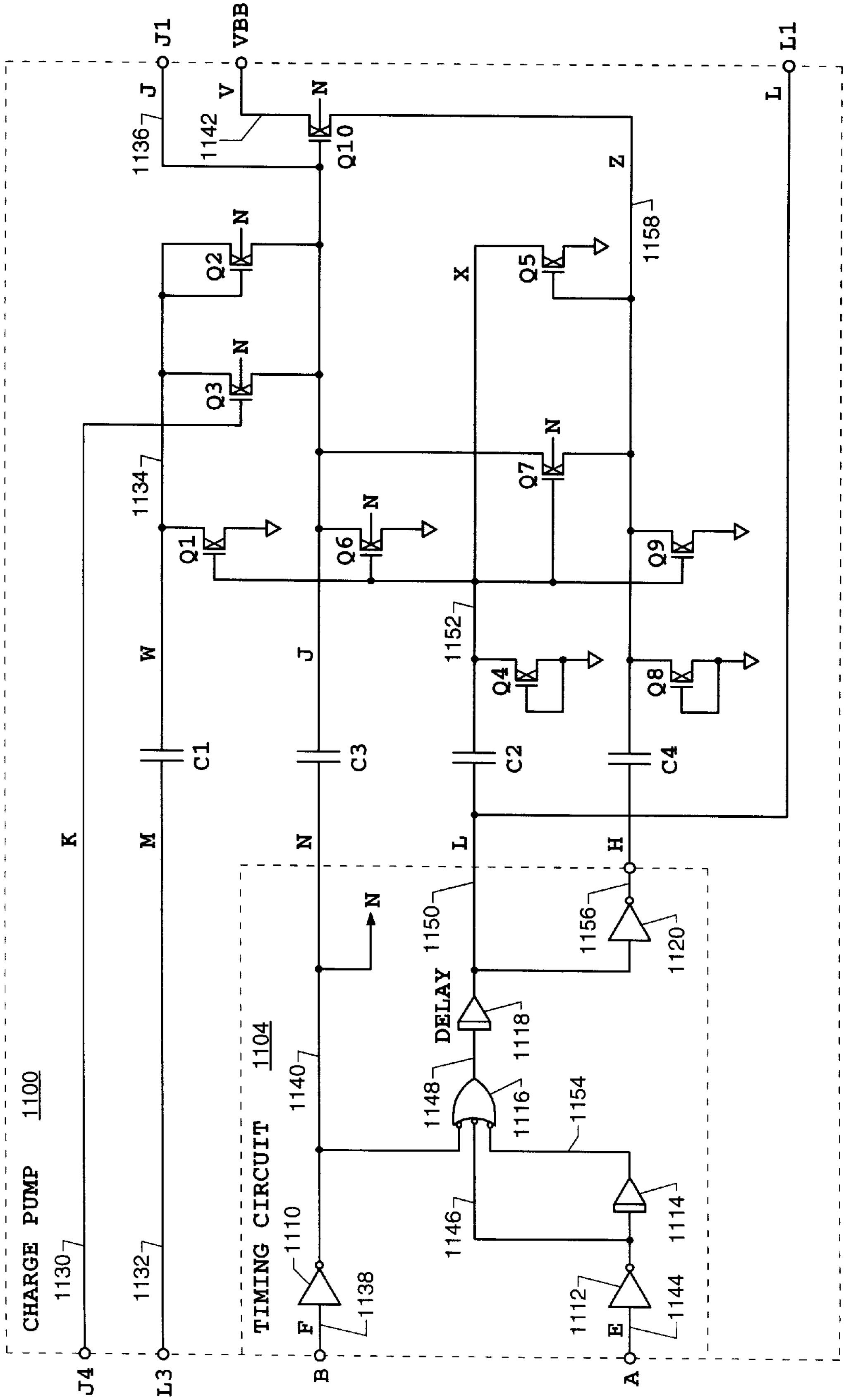
Figure 243:
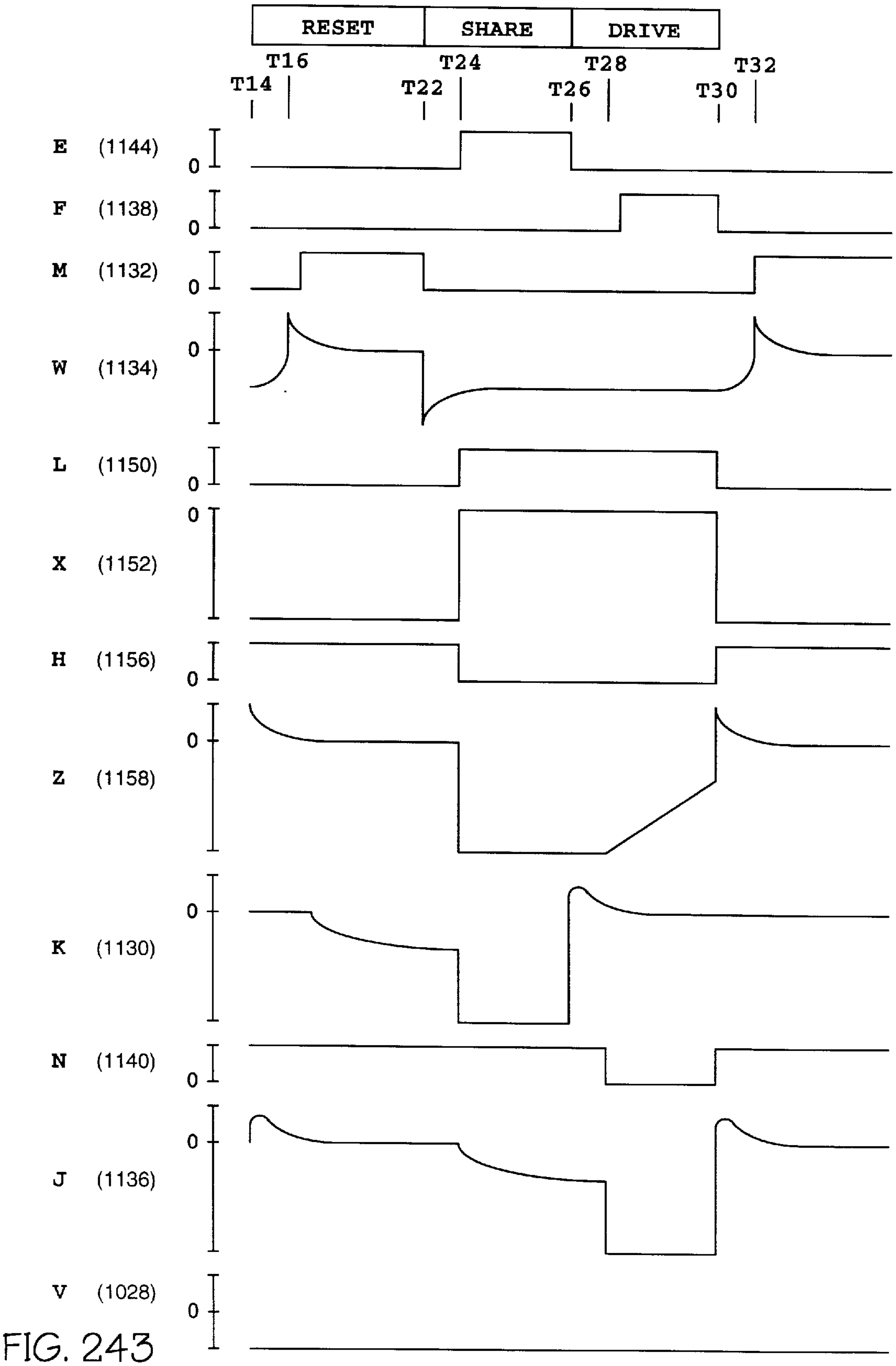
Figure 244:
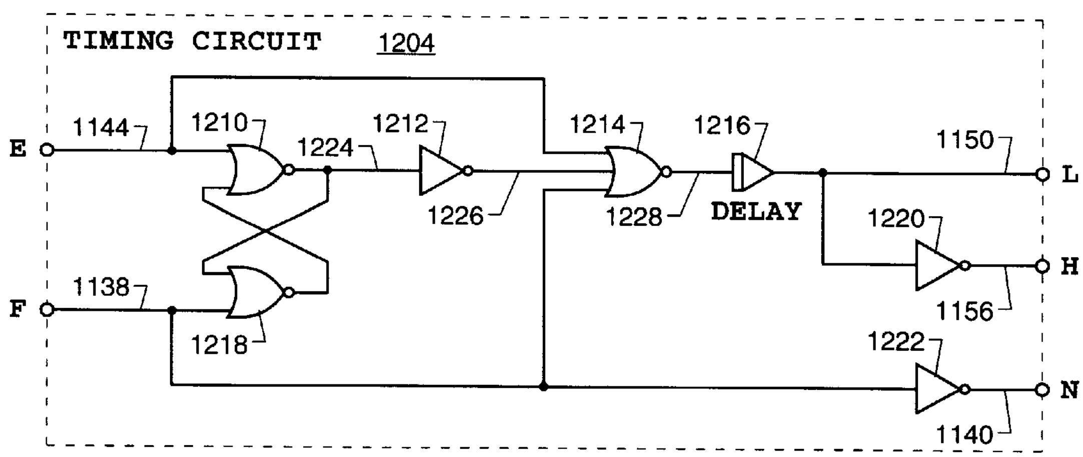
Figure 245:
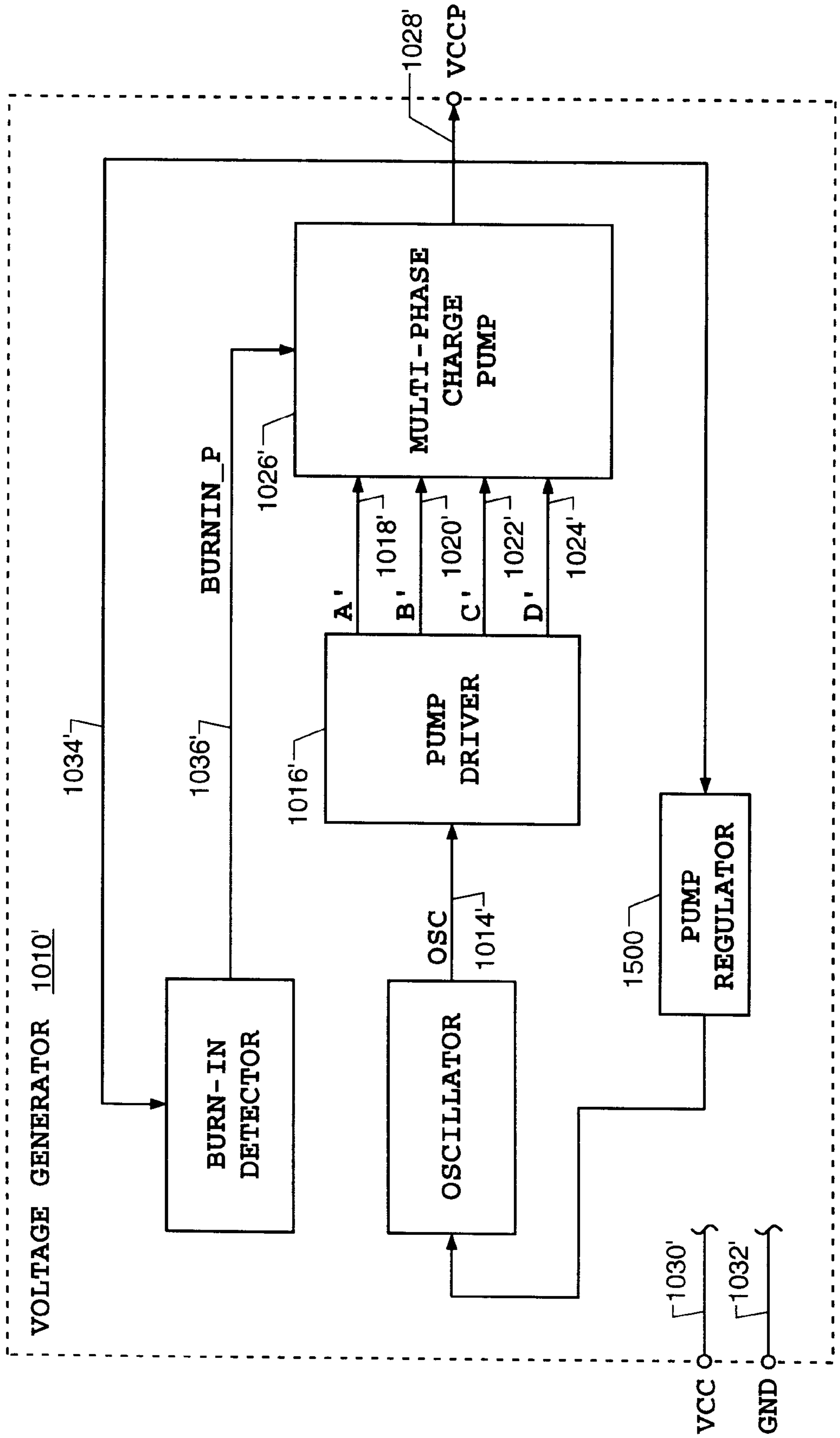
Figure 246:
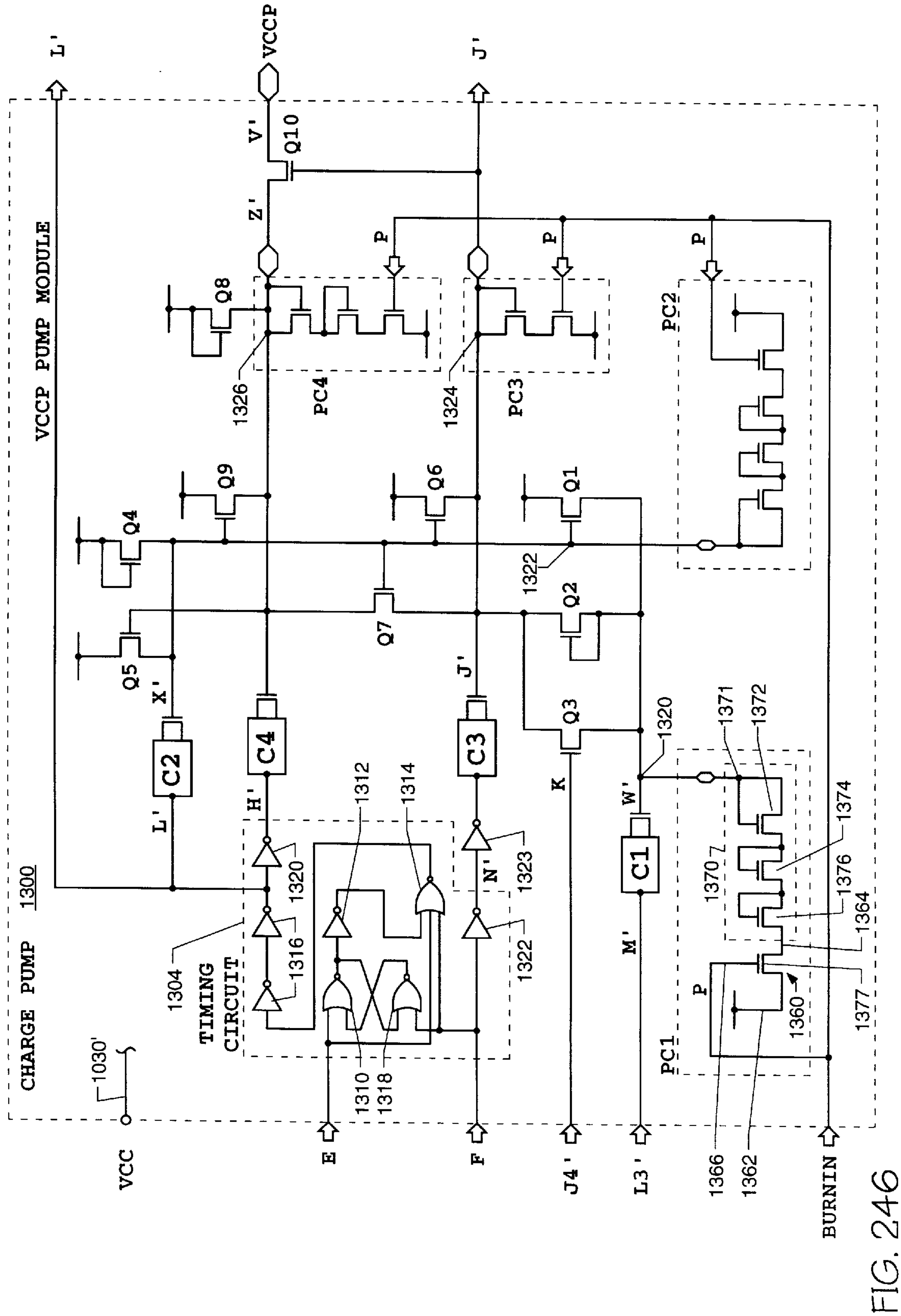
Figure 247:
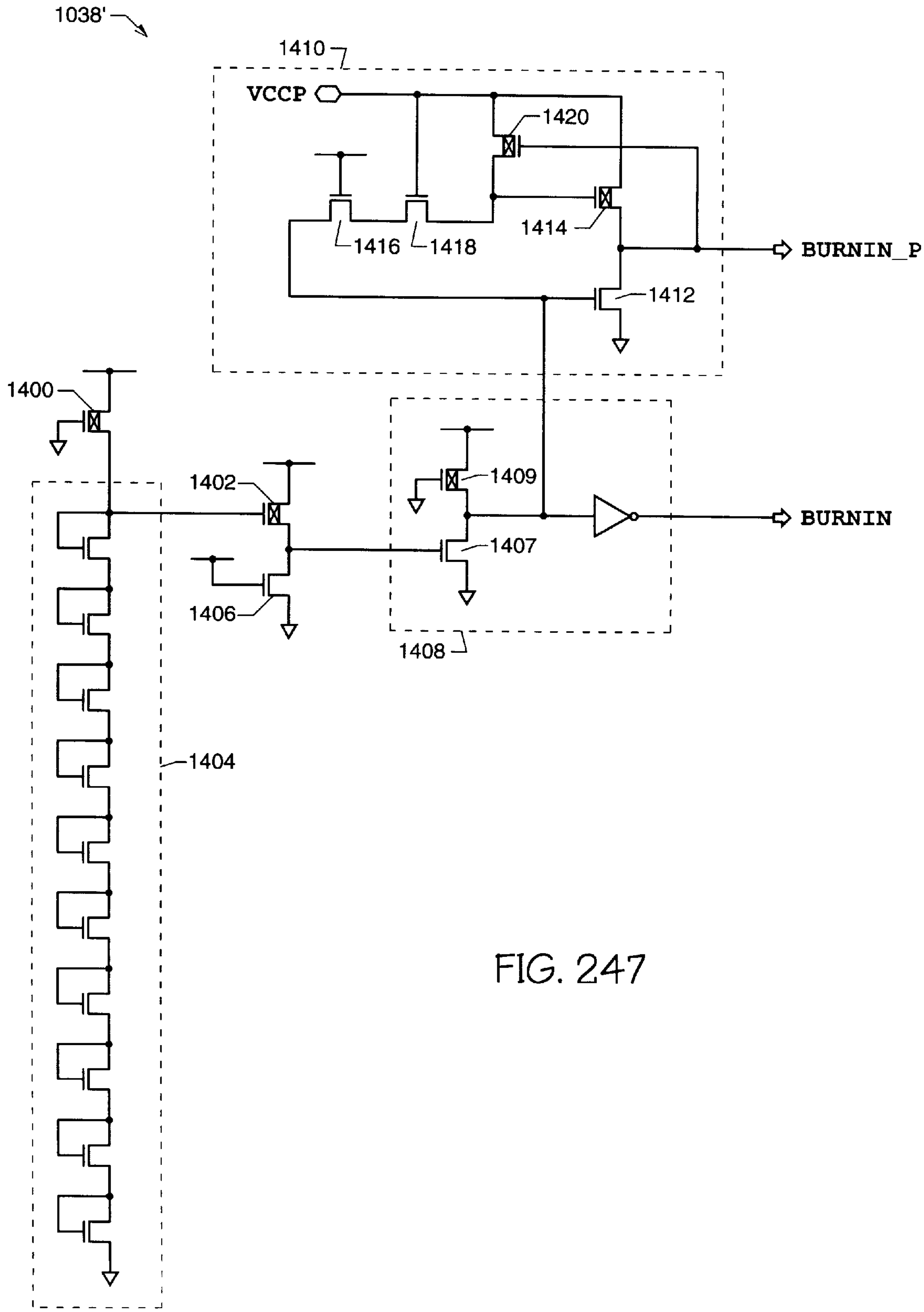
Figure 248:
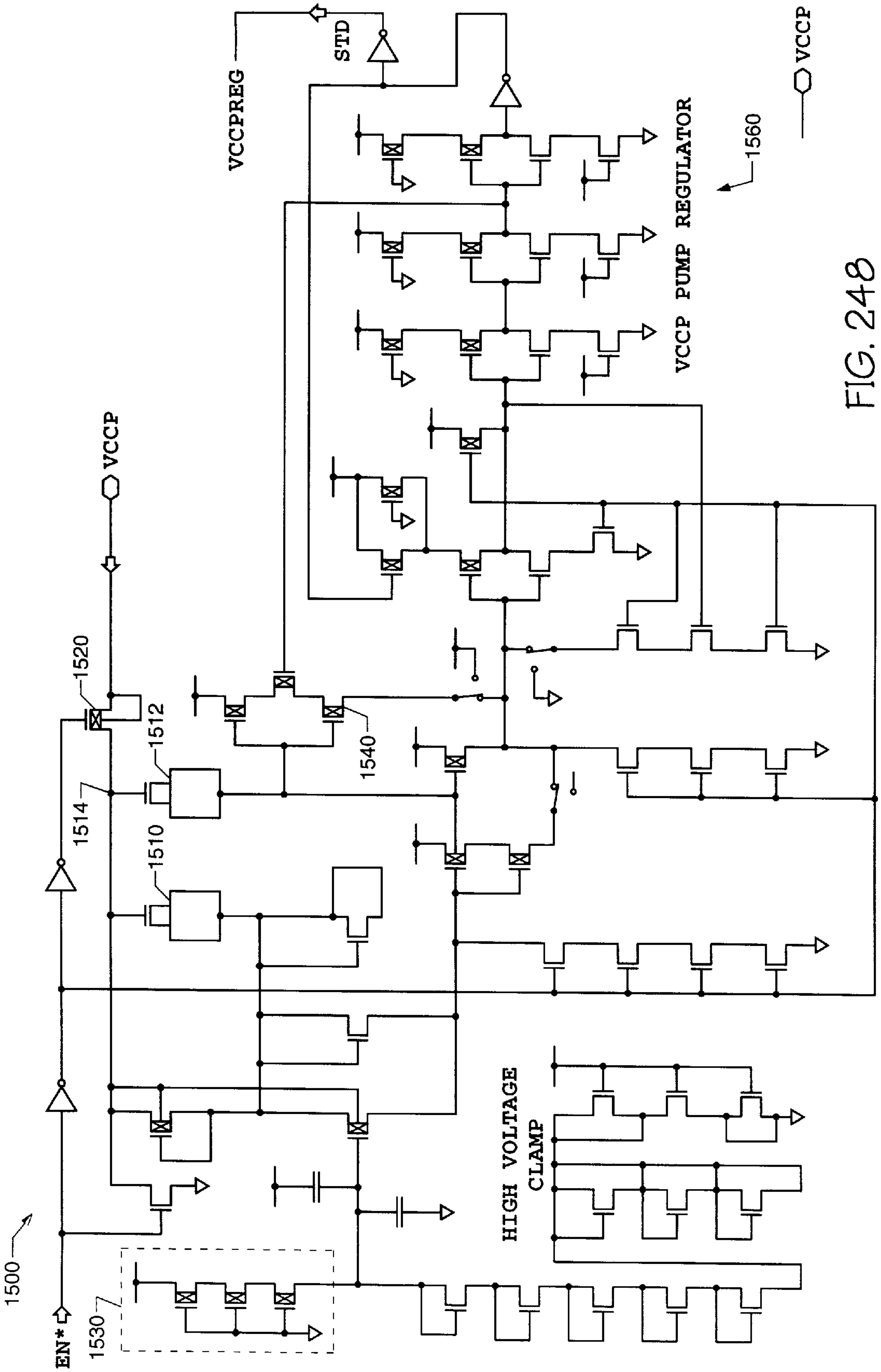

FIG. 131 identifies the signal names of input and output signals to right logic repeater circuitry in the memory device of FIG. 2;

FIG. 132 is a schematic diagram of right side array driver buffer circuitry in the memory device of FIG. 2;

FIG. 133 is a schematic diagram of right side fuse precharge buffer circuitry in the memory device of FIG. 2;

FIG. 134 is a schematic diagram of left side array driver buffer circuitry in the memory device of FIG. 2;

FIG. 135 is a schematic diagram of left side fuse precharge buffer circuitry in the memory device of FIG. 2;

FIG. 136 is a schematic diagram of spare topology gate circuitry in the memory device of FIG. 2;

FIG. 137 is a schematic diagram of spare topology gate circuitry in the memory device of FIG. 2;

FIG. 138 is a schematic diagram of spare topology gate circuitry in the memory device of FIG. 2;

FIG. 139 is a schematic diagram of row program cancel redundancy decode circuitry in the memory device of FIG. 2;

FIG. 140 is a schematic diagram of circuitry associated with the right logic repeater circuitry in the memory device of FIG. 2;

FIG. 141 is a schematic diagram of circuitry associated with the right logic repeater circuitry in the memory device of FIG. 2;

FIG. 142 is a schematic diagram of a portion of redundant test circuitry in the memory device of FIG. 2;

FIG. 143 identifies the signal names of input and output signals to left side logic repeater circuitry in the memory device of FIG. 2;

FIG. 144 is a schematic diagram of left side array driver buffer circuitry in the memory device of FIG. 2;

FIG. 145 is a schematic diagram of left side fuse precharge buffer circuitry in the memory device of FIG. 2;

FIG. 146 is a schematic diagram of right side array driver buffer circuitry in the memory device of FIG. 2;

FIG. 147 is a schematic diagram of right side fuse precharge buffer circuitry in the memory device of FIG. 2;

FIG. 148 is a schematic diagram of row program cancel redundancy decode circuitry in the memory device of FIG. 2;

FIG. 149 is a schematic diagram of VCCP diode clamp circuitry in the memory device of FIG. 2;

FIG. 150 is a schematic diagram of a portion of row redundancy circuitry associated with the test mode of the memory device of FIG. 2;

FIG. 151 is a schematic diagram of a portion of circuitry associated with left logic repeater circuitry in the memory device of FIG. 2;

FIG. 152 is a schematic diagram of another portion of circuitry associated with left logic repeater circuitry in the memory device of FIG. 2;

FIG. 153 identifies the signal names of input and output signals to array driver circuitry in the memory device of FIG. 2;

FIG. 154 is a schematic diagram of a portion of redundant row driver circuitry in the memory device of FIG. 2;

FIG. 155 is a schematic diagram of a portion of redundant row driver circuitry in the memory device of FIG. 2;

FIG. 156 is a schematic diagram of a portion of redundant row driver circuitry in the memory device of FIG. 2;

FIG. 157 s a schematic diagram of a portion of redundant row driver circuitry in the memory device of FIG. 2;

FIGS. 158A–158B are schematic diagram of a portion of array driver circuitry in the memory device of FIG. 2;

FIGS. 159A–159C are a schematic diagram of another portion of array driver circuitry from FIG. 159;

FIG. 160 is a schematic diagram of a portion of gap P-type sense amplifier driver circuitry in the memory device of FIG. 2;

FIG. 161 is a schematic diagram of another portion of gap P-type sense amplifier driver circuitry in the memory device of FIG. 2;

FIG. 162 is a schematic diagram of N-type sense amplifier driver circuitry and local I/O multiplexer circuitry in the memory device of FIG. 2;

FIG. 163 is a schematic diagram of local phase driver and local redundant phase driver circuitry in the memory device of FIG. 2;

FIG. 164 identifies the signal names of input and output signals to data I/O circuitry associated with the ×8 and ×16 configurations of the memory device of FIG. 2;

FIGS. 165A–165D are schematic/block diagram of data path circuitry associated with the ×8 and ×16 configurations of the memory device of FIG. 2;

FIG. 166 is a schematic diagram of data input/output (DQ) terminals of the memory device of FIG. 2;

FIG. 167 is schematic diagram of column enable delay circuitry associated with the ×8 and ×16 configurations of the memory device of FIG. 2;

FIGS. 168A–168D are schematic diagram of data path circuitry associated with the ×8 and ×16 configurations of the memory device of FIG. 2;

FIG. 169 is a table identifying data input/output (DQ) pads associated with the ×8 and ×16 configurations of the memory device of FIG. 2;

FIG. 170 identifies the signal names of input and output signals to circuitry associated with the data path of the ×4, ×8, and ×16 configurations of the memory device of FIG. 2;

FIG. 171 is a schematic diagram of data input/output (DQ) control circuitry associated with the ×4, ×8, and ×16 configurations of the memory device of FIG. 2;

FIG. 172 is a schematic/block diagram of test data path circuitry associated with the ×4, ×8, and ×16 configurations of the memory device of FIG. 2;

FIGS. 173A–173C are schematic/block diagram of a portion of data I/O path circuitry associated with the ×4, ×8, and ×16 configurations of the memory device of FIG. 2;

FIGS. 174A–174B are schematic/block diagram of another portion of data I/O path circuitry associated with the ×4, ×8, and ×16 versions of the memory device of FIG. 2;

FIG. 175 is a schematic diagram of test data path circuitry associated with the ×4, ×8, and ×16 configurations of the memory device of FIG. 2;

FIGS. 176A–176D are schematic diagram of test data path circuitry associated with the ×4, ×8, and ×16 configurations of the memory device of FIG. 2;

FIG. 177 identifies the signal names of input and output signals to data I/O circuitry associated with the ×1, ×4, ×8, and ×16 configurations of the memory device of FIG. 2;

FIG. 178 is a table setting forth correlations between pinout and bond pad designations associated with the ×4 configuration of the memory device of FIG. 2;

FIG. 179 is a table setting forth correlations between input/output (DQ) designations for ×8 and ×16 configurations of the memory device of FIG. 2;

FIG. 180 is a schematic diagram of data in circuitry associated with the ×1 configuration of the memory device of FIG. 2;

FIG. 181 is a schematic diagram of a portion of delay circuitry associated with the ×1 configuration of the memory device of FIG. 2;

FIGS. 182A–182B are schematic diagram of test data path circuitry associated with the ×1 configuration of the memory device of FIG. 2;

FIGS. 183A–183D are schematic diagram of data I/O circuitry associated with the ×1, ×4, ×8, and ×16 configurations of the memory device of FIG. 2;

FIGS. 184A–184B are schematic/block diagram of circuitry associated with the ×1, ×4, ×8, and ×16 configurations of the memory device of FIG. 2;

FIG. 185 is a schematic diagram of internal RAS generator circuitry associated with self-refresh circuitry in the memory device of FIG. 2;

FIGS. 186A–186D are schematic diagram of self-refresh circuitry in the memory device of FIG. 2;

FIGS. 187A–187B are schematic diagram of self-refresh clock circuitry in the memory device of FIG. 2;

FIG. 188 is a schematic diagram of set/reset D-latch circuitry in the memory device of FIG. 2;

FIG. 189 is a schematic diagram of a metal option switch associated with the self-refresh circuitry in the memory device of FIG. 2;

FIG. 190 is a schematic diagram of self-refresh oscillator counter circuitry in the memory device of FIG. 2;

FIG. 191 is a schematic diagram of a multiplexer circuit associated with the self-refresh circuitry in the memory device of FIG. 2;

FIGS. 192A–192D are schematic diagram of a $V_{BB}$ pump circuit in the memory device of FIG. 2;

FIG. 193 is a schematic diagram of a sub-module of the $V_{BB}$ pump circuit in the memory device of FIG. 2;

FIGS. 194A–194B are schematic diagram of a portion of a $V_{CCP}$ pump circuit in the memory device of FIG. 2;

FIGS. 195A–195C are schematic diagram of another portion of a $V_{CCP}$ pump circuit in the memory device of FIG. 2;

FIG. 196 is a schematic diagram of a sub-module of a $V_{CCP}$ pump circuit in the memory device of FIG. 2;

FIGS. 197A–197B are schematic diagram of a differential regulator associated with the $V_{CCP}$ pump circuit in the memory device of FIG. 2;

FIG. 198 is a block diagram of a DC sense amplifier and write driver circuit in the memory device of FIG. 2;

FIG. 199 is a block diagram of data I/O path circuitry in the memory device of FIG. 2;

FIGS. 200A–200D are schematic diagram of data I/O path circuitry associated with the ×4, ×8, and ×16 configurations of the memory device of FIG. 2;

FIG. 201 is a schematic diagram of a data input/output (DQ) buffer clamp in the memory device of FIG. 2;

FIG. 202 is a schematic diagram of a data input/output (DQ) keeper circuity in the memory device of FIG. 2;

FIGS. 203A–203D are layout diagram of the bus architecture and noise-immunity capacitive circuits associated therewith in the memory device of FIG. 2;

FIG. 204 is a table setting forth row and column address ranges for ×4, and ×8 configurations of the memory device of FIG. 2 with 4K and 8K implementations of the memory device of FIG. 2;

FIG. 205 is a table identifying ignored column addresses for test mode compression in the memory device of FIG. 2;

FIG. 206 is a table correlating data input/output (DQ) terminals and column addresses in the ×1, ×4, ×8, and ×16 configurations of the memory device of FIG. 2;

FIG. 207 is a table correlating data input/output (DQ) pins and bond pads in the memory device of FIG. 2;

FIG. 208 is a table correlating data input/output (DQ) pins and bond pads in the ×4 configuration of the memory device of FIG. 2;

FIG. 209 is a table identifying data read (DR) and data write (DW) terminals for DQ compression in the ×8 and ×16 configurations of the memory device of FIG. 2;

FIG. 210 is a table relating to row and column addresses and address compression in the memory device of FIG. 2;

FIG. 211 is a table relating to test mode compression addresses in the memory device of FIG. 2;

FIG. 212 is a flow diagram setting forth the steps involved in electrical fusebank programming in the memory device of FIG. 2;

FIG. 213 is a flow diagram setting forth the steps involved in row fusebank cancellation in the memory device of FIG. 2;

FIG. 214 is a flow diagram setting forth the steps involved in row fusebank programming in the memory device of FIG. 2;

FIG. 215 is a flow diagram setting forth the steps involved in electrical fusebank cancellation in the memory device of FIG. 2;

FIG. 216 is a flow diagram setting forth the steps involved in column fusebank programming the memory device of FIG. 2;

FIG. 217 is a flow diagram setting forth the steps involved in column fusebank cancellation in the memory device of FIG. 2;

FIG. 218 is an alternative block diagram of the memory device of FIG. 2;

FIG. 219 is another alternative block diagram of the memory device of FIG. 2;

FIG. 220 is a diagram relating to the topology of the twisted bit line configuration of the memory device of FIG. 2;

FIG. 221 is a flow diagram setting forth the steps involved in a method of testing the memory device of FIG. 2;

FIG. 222 is a block diagram of redundant row circuitry in accordance with the present invention;

FIGS. 223A–223B are schematic/block diagram of a portion of the redundant row circuitry from FIG. 222;

FIG. 224 is a schematic diagram of an SAB selection control circuit in the redundant row circuitry of FIG. 222;

FIG. 225 is a truth table of SAB selection control inputs and outputs corresponding to the six possible operational states of a sub-array block in the memory of FIG. 2;

FIG. 226 is an alternative block diagram of the memory device of FIG. 2 showing power isolation circuitry therein;

FIG. 227 is another alternative block diagram of the memory device of FIG. 2 showing power isolation circuits therein;

FIG. 228 is a schematic diagram of one implementation of the power isolation circuits of FIG. 227;

FIG. 229 is a schematic diagram of another implementation of the power isolation circuits of FIG. 227;

FIG. 230 is an illustration of a single in-line memory module (SIMM) incorporating the memory device from FIG. 2 configured as a 56 Mbit device;

FIG. 231 is a schematic/block diagram of power isolation circuitry in the memory device of FIG. 2;

FIG. 232 is a table identifying row antifuse addresses for the memory device of FIG. 2;

FIG. 233 is a table identifying row fusebank enable addresses in the memory device of FIG. 2;

FIG. 234 is a table identifying column antifuse addresses in the memory device of FIG. 2;

FIG. 235 is a table identifying column fusebank enable addresses in the memory device of FIG. 2;

FIG. 236 is a block diagram of the row electrical fusebank circuit from FIGS. 76, 77, and 78;

FIG. 237 is a functional block diagram of the memory device of FIG. 2 and the voltage generator circuitry included therein;

FIG. 238 is a functional block diagram of the voltage generator shown in FIG. 237;

FIG. 239 is a timing diagram of signals shown in FIGS. 238 and 240;

FIG. 240 is a schematic diagram of pump driver 16 shown in FIG. 238;

FIG. 241 is a functional block diagram of multi-phase charge pump 26 in FIG. 238;

FIG. 242 is a schematic diagram of charge pump 100 shown in FIG. 241;

FIG. 243 is a timing diagram of signals shown in FIG. 242;

FIG. 244 is a schematic diagram of a timing circuit alternate to timing circuit 104 shown in FIG. 242;

FIG. 245 is a functional block diagram of a second voltage generator for producing a positive $V_{CCP}$ voltage;

FIG. 246 is a schematic diagram of a charge pump 300 for the voltage generator of FIG. 245;

FIG. 247 is a schematic diagram of the burn-in detector shown in FIG. 245; and FIG. 248 is a schematic diagram of a $V_{CCP}$ Pump Regulator 500.

DETAILED DESCRIPTION OF A SPECIFIC EMBODIMENT OF THE INVENTION

GENERAL DESCRIPTION OF ARCHITECTURE AND TOPOLOGY

Referring to FIG. 2, there is provided a high-level layout diagram of a 64-megabit dynamic random-access memory device (64 Mbit DRAM) 10 in accordance with a presently preferred embodiment of the invention. Although the following description will be specific to this presently preferred embodiment of the invention, it is to be understood that the principles of the present invention may be advantageously applied to semiconductor memories of different sizes, both larger and smaller in capacity. Also, in the following description, various aspects of the disclosed memory device 10 will be depicted in different Figures, and often the same component will be depicted in different ways and/or different levels of detail in different Figures for the purposes of describing various aspects of device 10. It is to be understood, however, that any component depicted in more than one Figure will retain the same reference numeral in each.

Regarding the nomenclature to be used herein, throughout this specification and in the Figures, "CA<x>" and "RA<y>" are to be understood as representing bit x of a given column address and bit y of a given row address x, respectively. In addition, references such as "CAxy=2" will be understood to represent a situation in which the xth and yth bits of a column address are interpreted as a two-bit binary value. For example, "CA78=2" would refer to a situation in which bit 7 of a given column address was a 0 and bit eight of that column address was a 1 (i.e., CA7=0, CA 8=1), such that the two-bit binary value formed by bits CA7 and CA8 was the binary number 10, having the decimal equivalent of 2.

Similarly, references to "Local Row Address xy" or "LRAxy" will refer to a "predecoded" and/or otherwise logically processed row addresses, typically provided from circuitry distributed in a plurality of localized areas throughout the memory array, in which the binary number represented by the xth and yth digits of a given row address, (which binary number can take on one of four values 0, 1, 2, or 3), is used to determine which of four signal lines is asserted. For example, references to "LRxy<0:3>" will reflect situations in which the xth and yth digits of a row address are decoded into a binary number (0, 1, 2, or 3) and used to assert a signal on one or more of four LRA lines. According to this convention, if the third and second bits of a given row address are 1 and 0 respectively (which decodes into a binary representation of 2), LRA23<0:3> would reflect a situation in which among the four lines LRA23<0>, LRA23<1>, LRA23<2> and LRA23<3>, the second of the four LRA23 lines would be asserted, i.e., LRA23<0> would be a 0, LRA23<1> would be a 0, LRA23<2> would be 1 and LRA23<3>would be 0.

The foregoing LRA convention is adopted as result of a notable aspect of the present invention, which involves the predecoding of row addresses at one physical location in integrated circuit memory device 10 in accordance with the disclosed embodiment of the invention, such that a number X of Local Row Address (LRA) signals are derived from a smaller number Y of row address (RA) bits. For example, two row address (RA) bits would convert into four local row address (LRA) signals, three RA bits would convert into eight LRA signals, and so on.

Also, it is to be understood that the various signal line designations are used consistently in the Figures, such that the same signal line designation (e.g., "WCBR," "CAS," etc . . . ) appearing in two or more Figures should be interpreted as indicating a connection between the lines that they designate in those Figures, in accordance with conventional practice relating to schematic and/or block diagrams.

As shown in FIG. 2, DRAM 10 is arranged in four essentially identical or equivalent quadrants, such as the one enclosed within dashed line 12. Each quadrant 12, in turn, consists of two substantially identical or equivalent halves 14, such as the one enclosed within dashed line 14L in FIG. 1 (the suffix "L" or "R" on reference numeral 14 being used herein to designate the left or right half 14 of a given quadrant 12). Quadrant halves 14 are sometimes referred to herein as partial array blocks or PABs. Each PAB 14L or 14R is an 8 Mbit array comprising thirty-two 256 Kbit sections, such as the one identified with reference numeral 16. Thus, each quadrant 12 contains 16 Mbits and the entire memory 10 has a 64 Mbit storage capacity. Each pair of PABs 14L and 14R is arranged such that they are adjacent to one another with their respective sides defining an elongate intermediate area designated generally as 30 therebetween, as will be hereinafter described in further detail. In addition, each quadrant 12 comprising left and right PABs 14L and 14R is disposed adjacent to another, such that the bottom edges of the top two quadrants 12 and the top edges of the bottom two quadrants 12 define an elongate intermediate area therebetween, as will also be hereinafter described in further detail.

Figure 3:
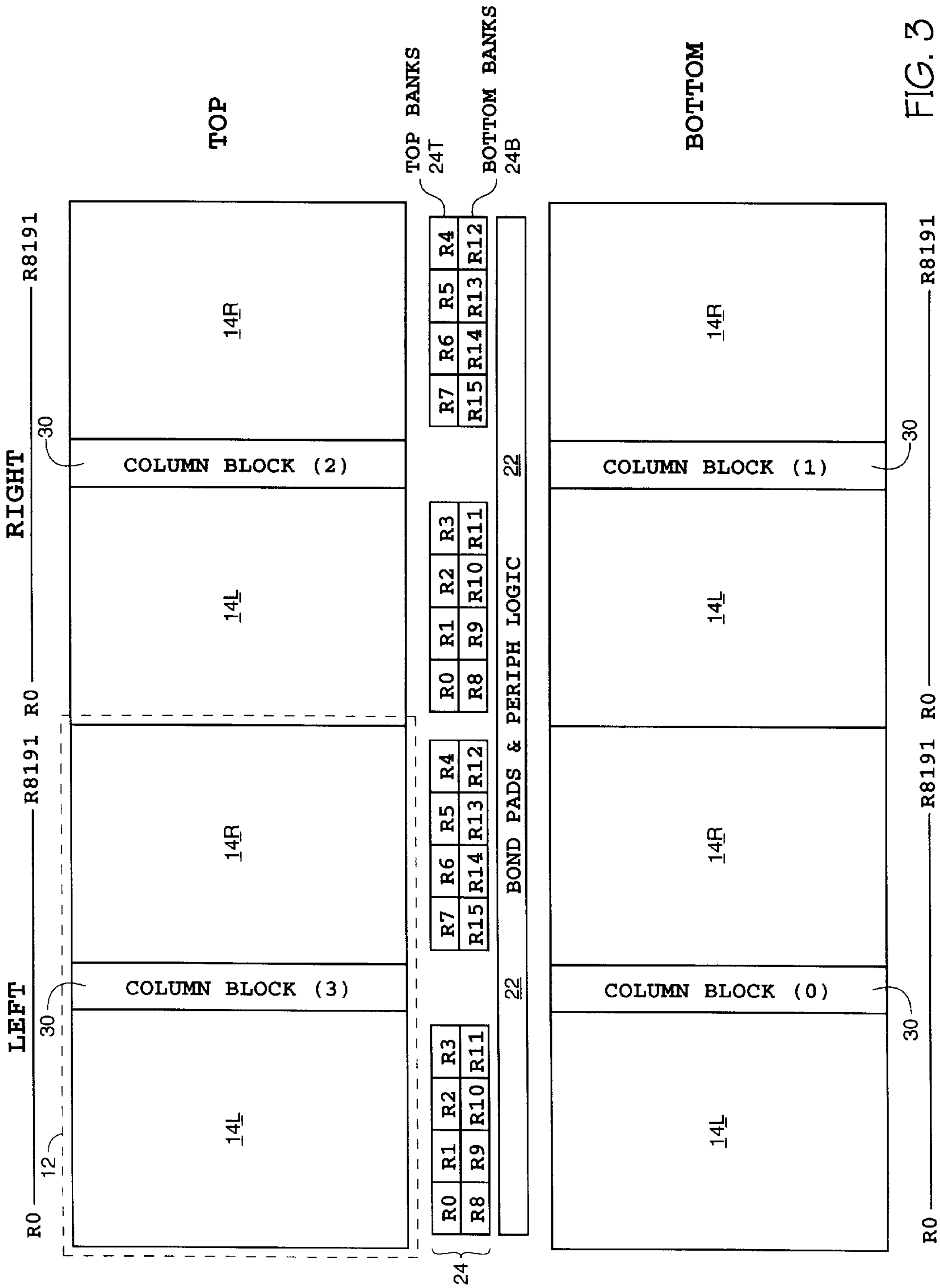
FIG. 3 is another layout diagram of the memory device from FIG. 2 showing the arrangement of row fusebank circuits therein.
Figure 4:
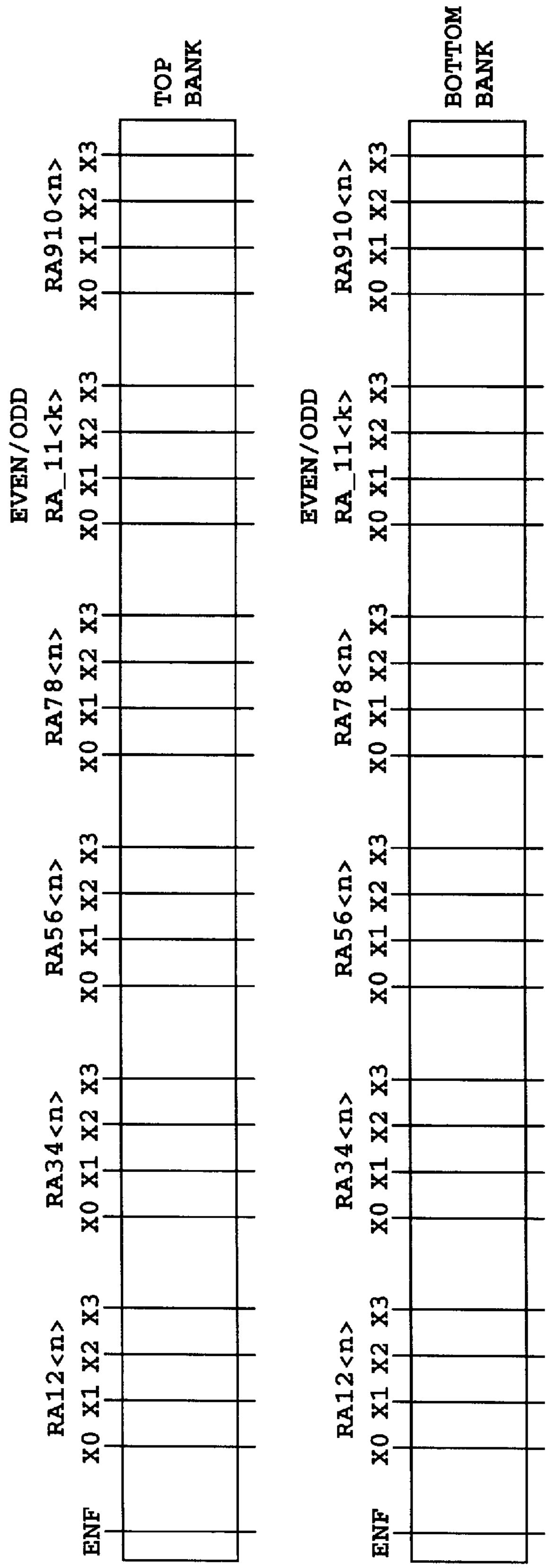
FIG. 4 illustrates the layout of row fusebank circuits from the diagram of FIG. 3.

The layout of DRAM 10 as thus far described may also be appreciated with reference to FIGS. 3 and 4, which show that DRAM 10 comprises top left, bottom left, top right, and bottom right quadrants 12, with each quadrant 12 comprising left and right PABs 14L and 14R.

Figure 5:
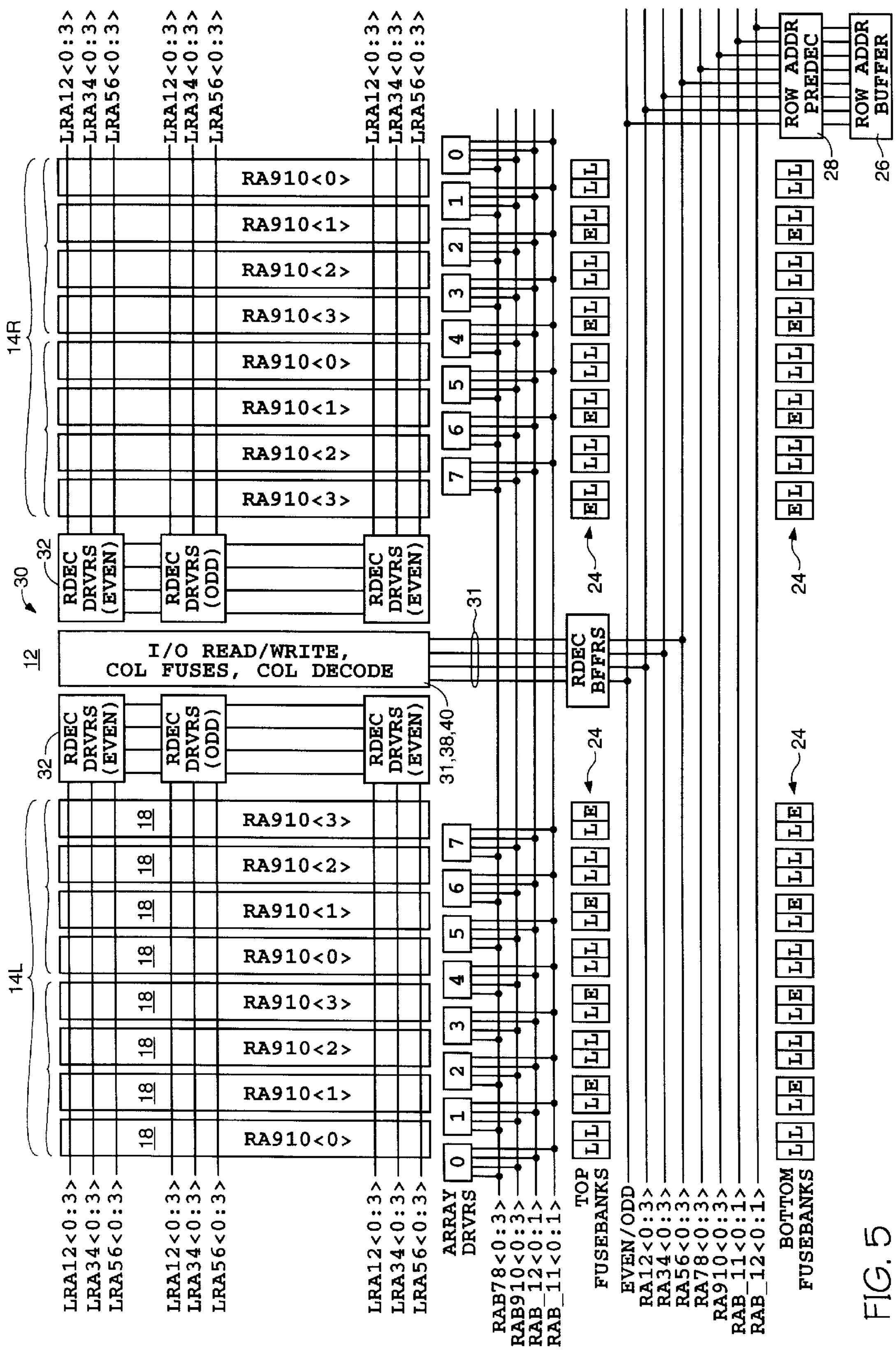
FIG. 5 is a diagram illustrating the row and column architecture of the memory device from FIG. 2.

A more detailed view of the row architecture of the top left quadrant 12 of DRAM 10 is provided in FIG. 5. As is evident from FIG. 5, each 8 Mbit PAB 14 (L or R) of each quadrant 12 can be thought of as comprising eight sections or sub-array blocks (SABs) 18 of 512 primary rows and 4 redundant rows each. Alternatively, as is evident from the view of the column architecture provided in FIG. 6, each quadrant 12 may be thought of as comprising four sections 20, referred to herein as "DQ sections 20" of 512 primary digit line pairs and 32 redundant digit line pairs each.

As shown in FIGS. 3, 4, 5, and 6, disposed horizontally between top and bottom quadrants 12 are bond pads and peripheral logic 22 for DRAM 10, as well as row fusebanks 24 for supporting row redundancy (both laser fusebanks and electrical fusebanks, as will be hereinafter described in further detail). With reference to FIG. 5 in particular, included among the peripheral logic are row address buffers 26 and a row address predecoder 28 which provides predecoded row addresses to a plurality of local row address decoders physically distributed throughout device 10 which provide so-called "local row addresses" (LRAs) from the row addresses applied to DRAM 10 from off-chip.

In FIG. 3, each block R0 through R15 represents a row fuse circuit consisting of three laser fuse banks and one electrical fuse bank, supporting a total of 128 redundant rows in DRAM 10 (96 laser fusebanks and 32 electrical fusebanks). The top banks of fuses 24T in FIG. 3 are for the top rows of DRAM 10, while the bottom banks of fuses 24B in FIG. 3 are for the bottom rows of DRAM 10. The layout of each fusebank 24 (top and bottom) is shown in FIG. 4. In each fusebank 24, the fuse ENF is blown to enable the fusebank. The row redundancy fusebank arrangement will be hereinafter described in greater detail with reference to FIGS. 76 through 86. Top and bottom row fusebanks 24T and 24B, respectively, are shown in FIGS. 83 and 84

Figure 1:
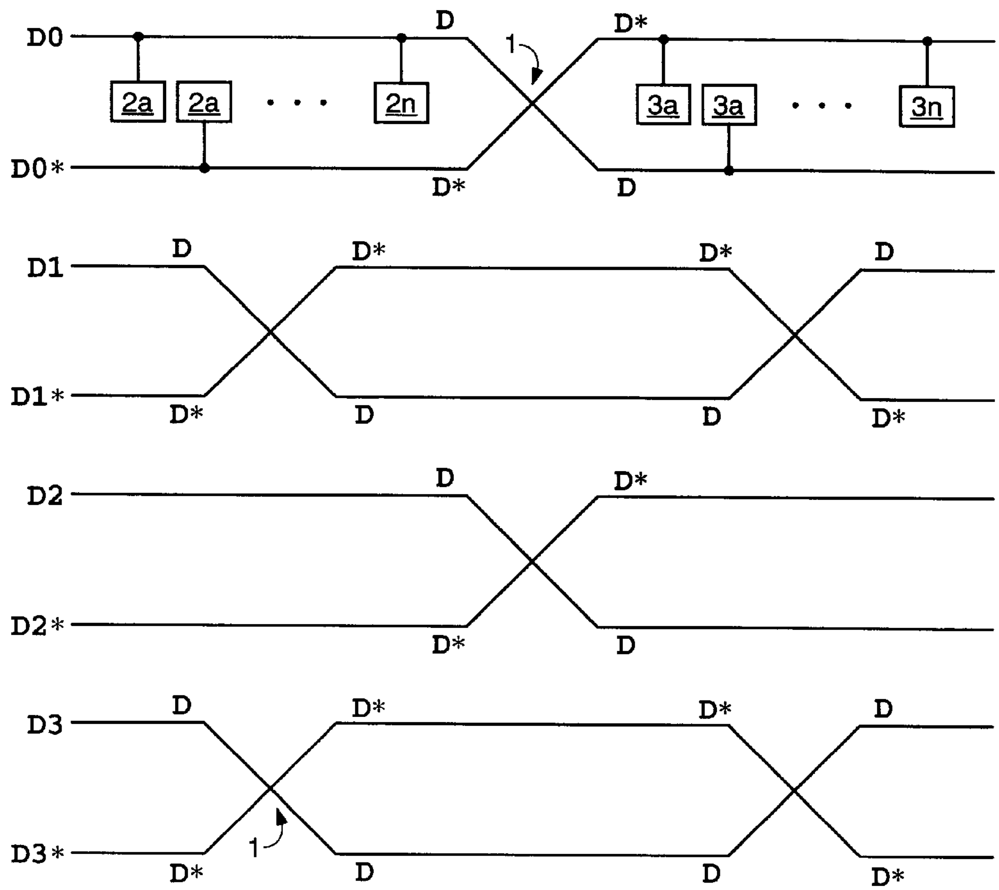
FIG. 1 is a diagram illustrating a prior art twisted bit line configuration for a semiconductor memory device.
Figure 7:
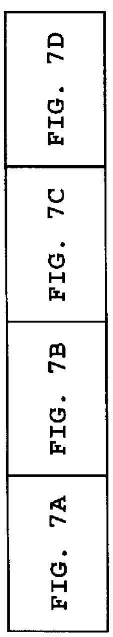
FIGS. 7A–7D are bond pad and pinout diagrams for the memory device from FIG. 2.
Figure 7A:
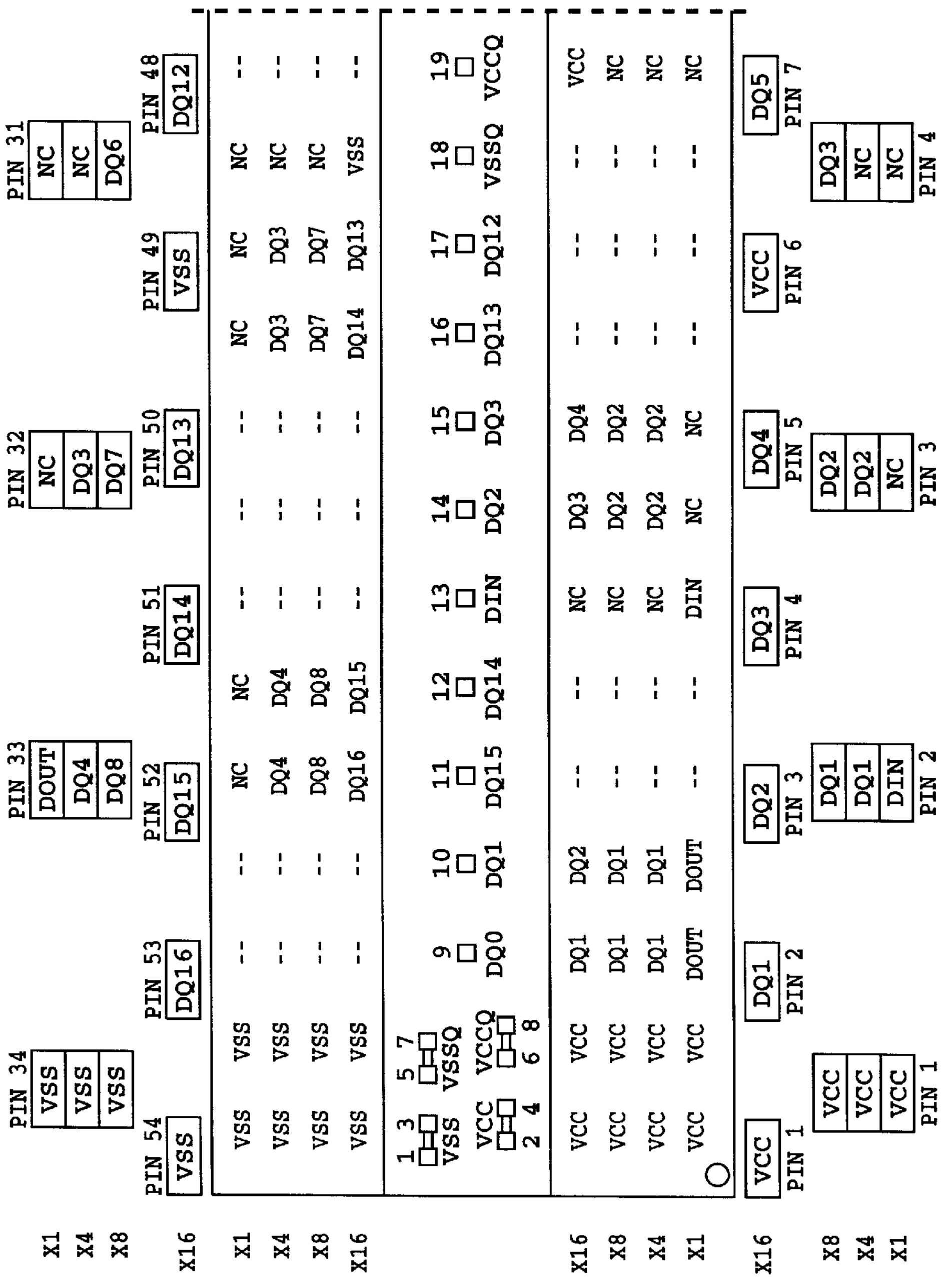
Figure 7B:
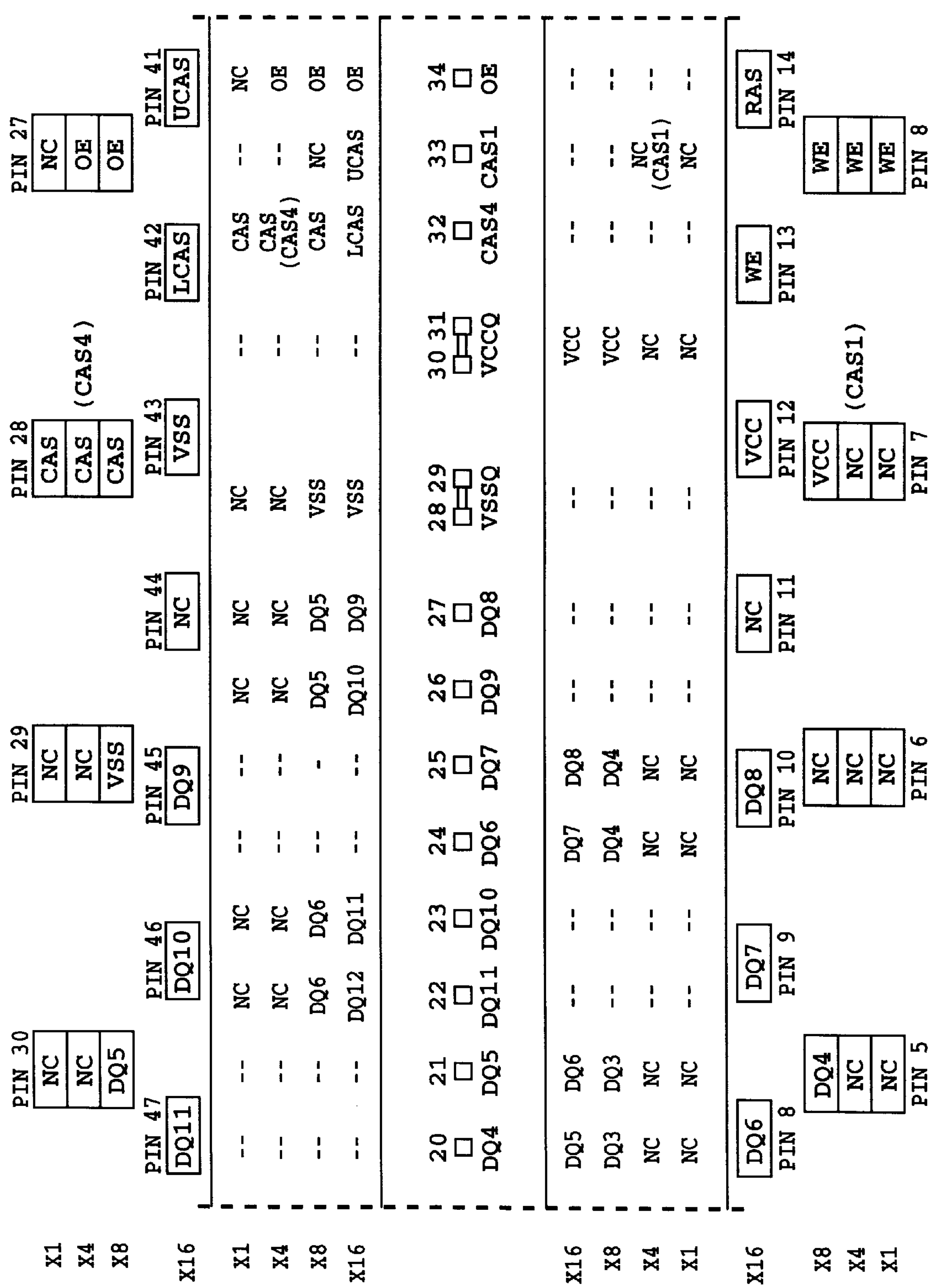
Figure 7C:
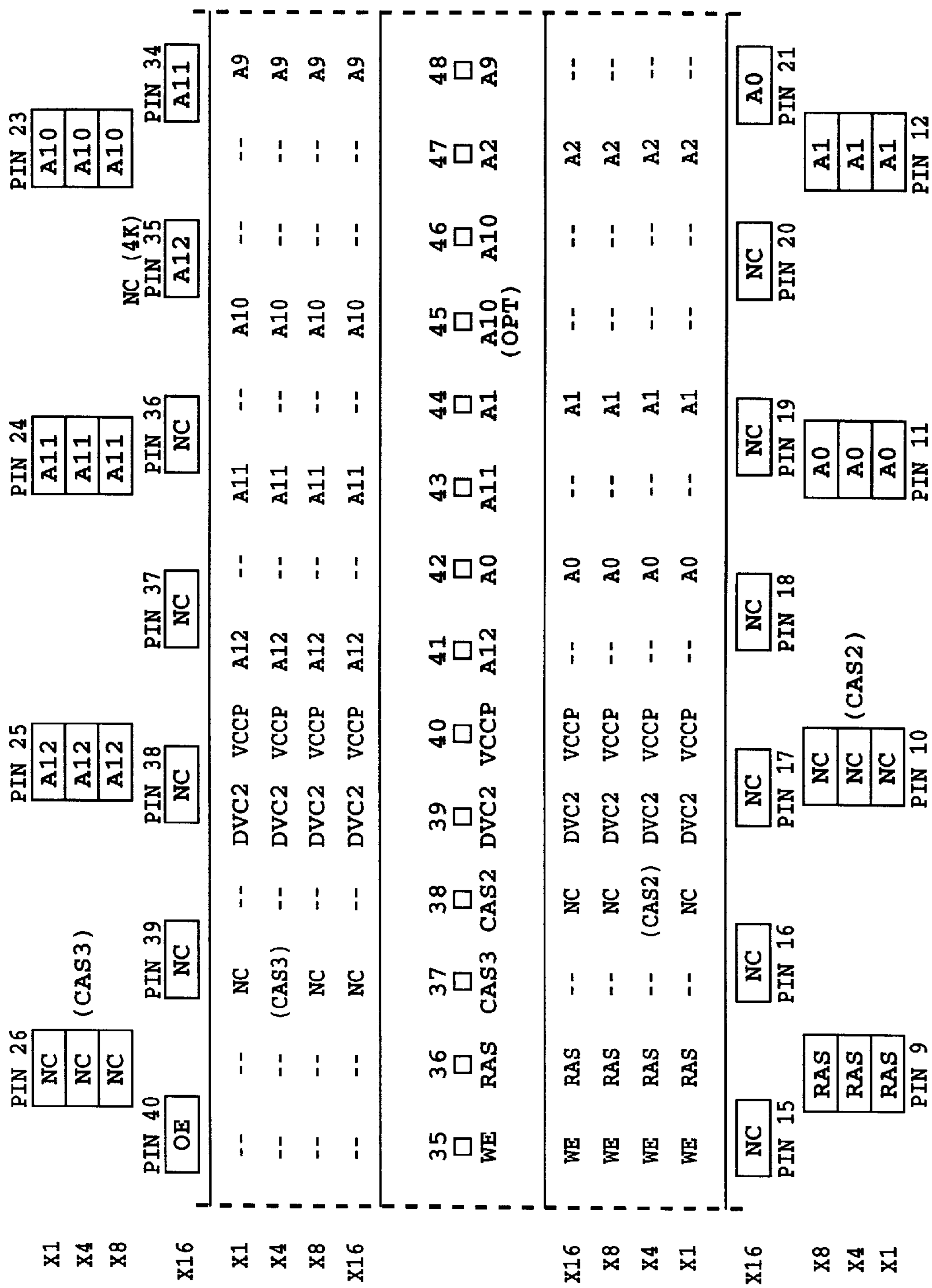
Figure 7D:
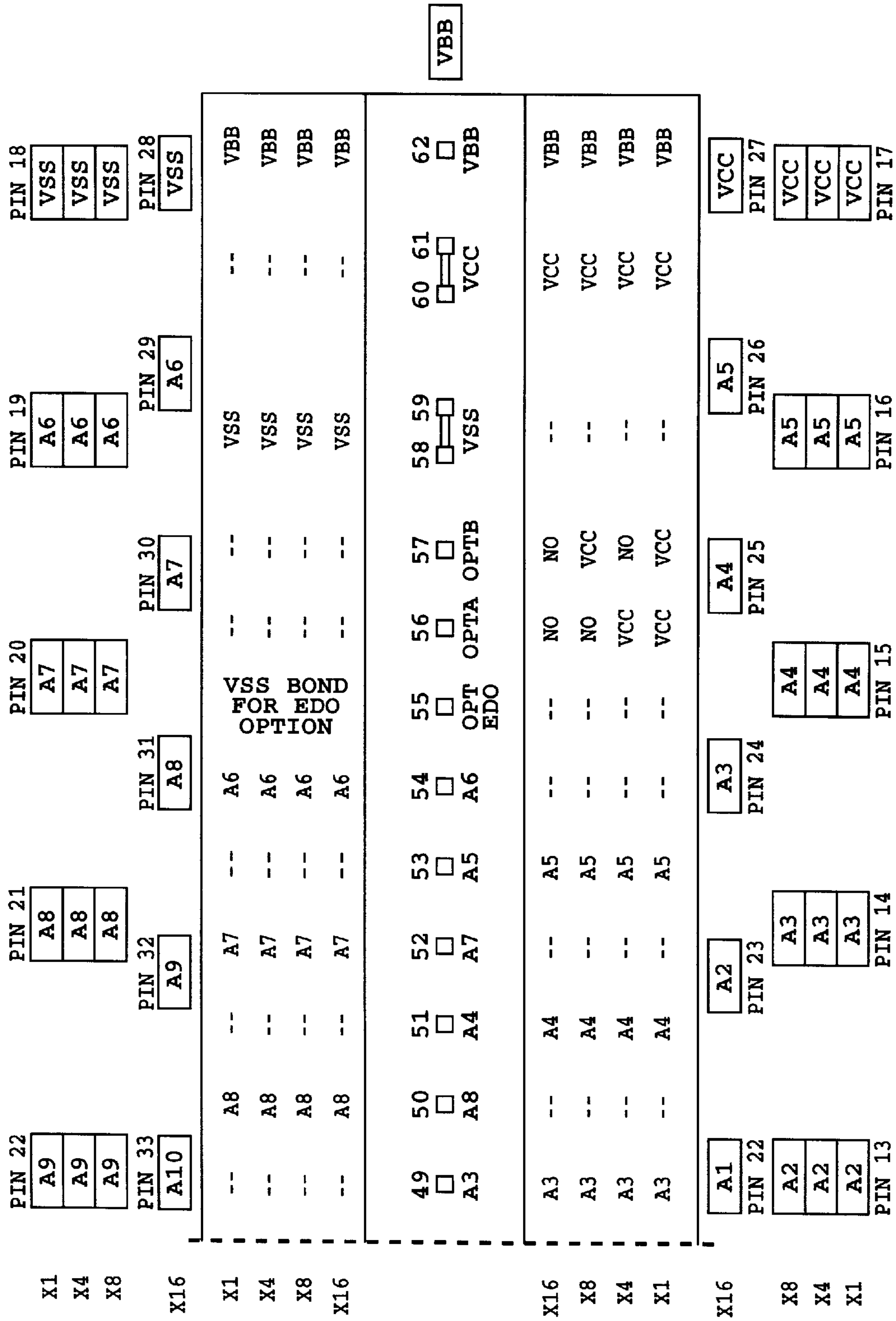
Figure 25:
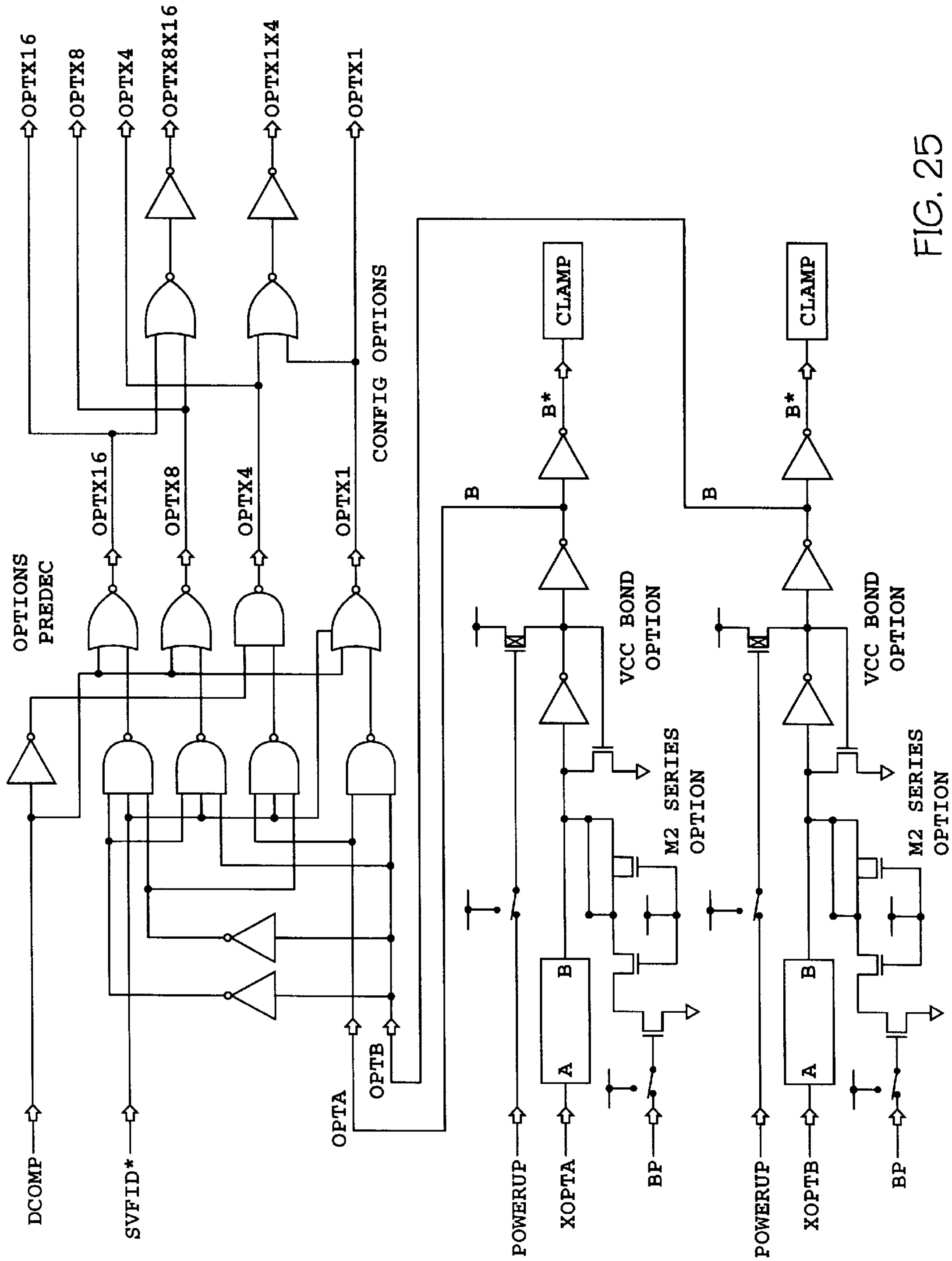
FIG. 25 is a schematic diagram of the circuitry associated with bonding options available for the memory device of FIG. 2.
Figure 26:
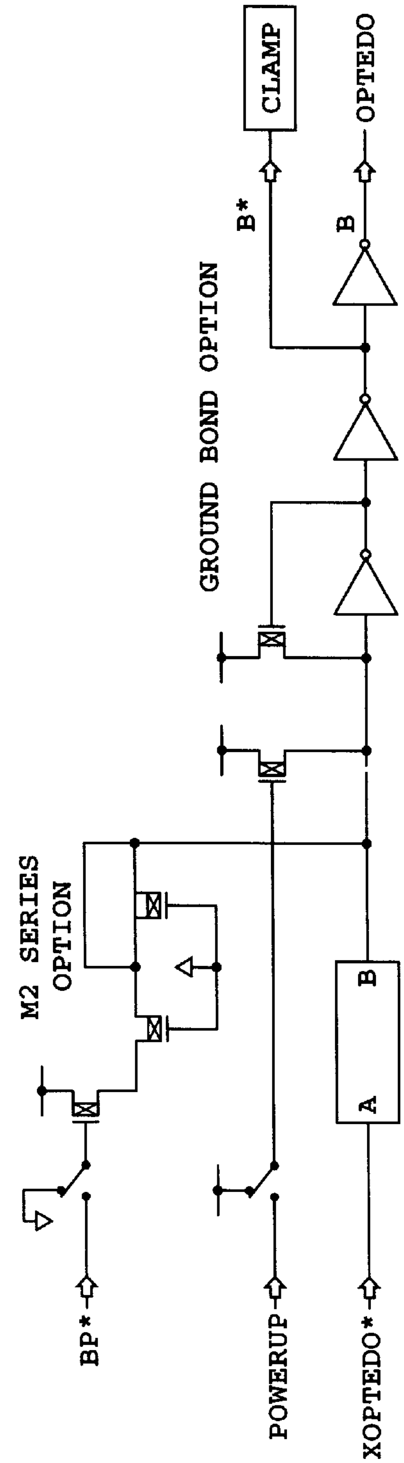
FIG. 26 is a schematic diagram of circuitry associated with an extended data out (EDO) option for the memory device of FIG. 2.
Figure 27:
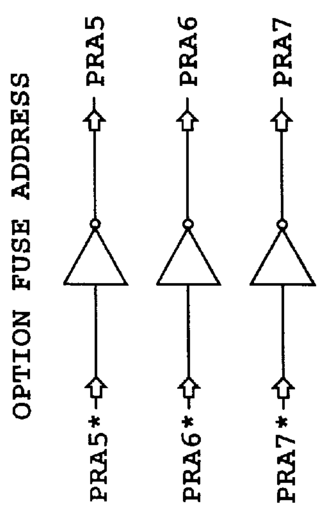
FIG. 27 is a schematic diagram of circuitry associated with addressing option fuses in the memory device of FIG. 2.

Regarding the bond pads, these can be seen in FIG. 1, and are depicted in further detail in the bond pad and pinout diagram of FIG. 7. It is believed that those of ordinary skill in the art will comprehend from FIG. 7 that different pins and bond pads for DRAM 10 have different definitions depending upon whether DRAM 10 is configured, through metal bonding variations, as a ×1 ("by one"), ×4, ×8, or ×16 part (i.e., whether a single row and column address pair accesses one, four, eight, or sixteen bits at a time). In accordance with one aspect of the invention, DRAM 10 is designed with bonding options such that any one of these access modes may be selected during the manufacturing process. The circuitry associated with the ×1/×4/×8/×16 bonding options is shown in FIG. 25, and tables summarizing the ×1/×4/×8/×16 bonding options appear in FIGS. 22, 169, 178, 206, 207, 208, and 209.

For a device 10 in accordance with the presently disclosed embodiment of the invention configured with the ×1 bonding option, one set of row and column addresses is used to access a single bit in the array. The table of FIG. 206 shows that for a ×1 configuration, column addresses 9 and 10 (CA910) determine which quadrant 12 of memory device 10 will be accessed, while column addresses 11 and 12 (CA1112) determine which horizontal section 20 (see FIG. 6) the accessed bit will come from.

For a device 10 configured with a ×4 bond option, on the other hand, each set of row and column addresses accesses four bits in the array. FIG. 206 shows that for a ×4 configuration, each of the four bits accessed originates from a different section 20 of a given quadrant 12 of the array.

For a device 10 configured with a ×8 bonding option, each set of row and column addresses accesses eight bits in the array, with each one of the eight bits originating from a different section 20 in either the left or right half of the array.

Finally, for a device 10 configured with the ×16 bonding option, sixteen bits are accessed at a time, with four bits coming from each quadrant of the array.

The table of FIG. 169 sets forth the correlation between pinout designations DQ1 through DQ8 with schematic designations DQ0 through DQ7, bond pad designations PDQ0 through PDQ7, data write (DW) line designations DW0 through DW15 and data read/data read* (DR/DR*) designations DR0/DR0* through DR15/DR15* for a device 10 configured with a ×16 bonding option. Similarly, the table of FIG. 207 sets forth those same correlations for a ×8 bonding option device, and the table of FIG. 208 sets forth those correlations for the ×4 and ×1 bonding options.

Figure 8:
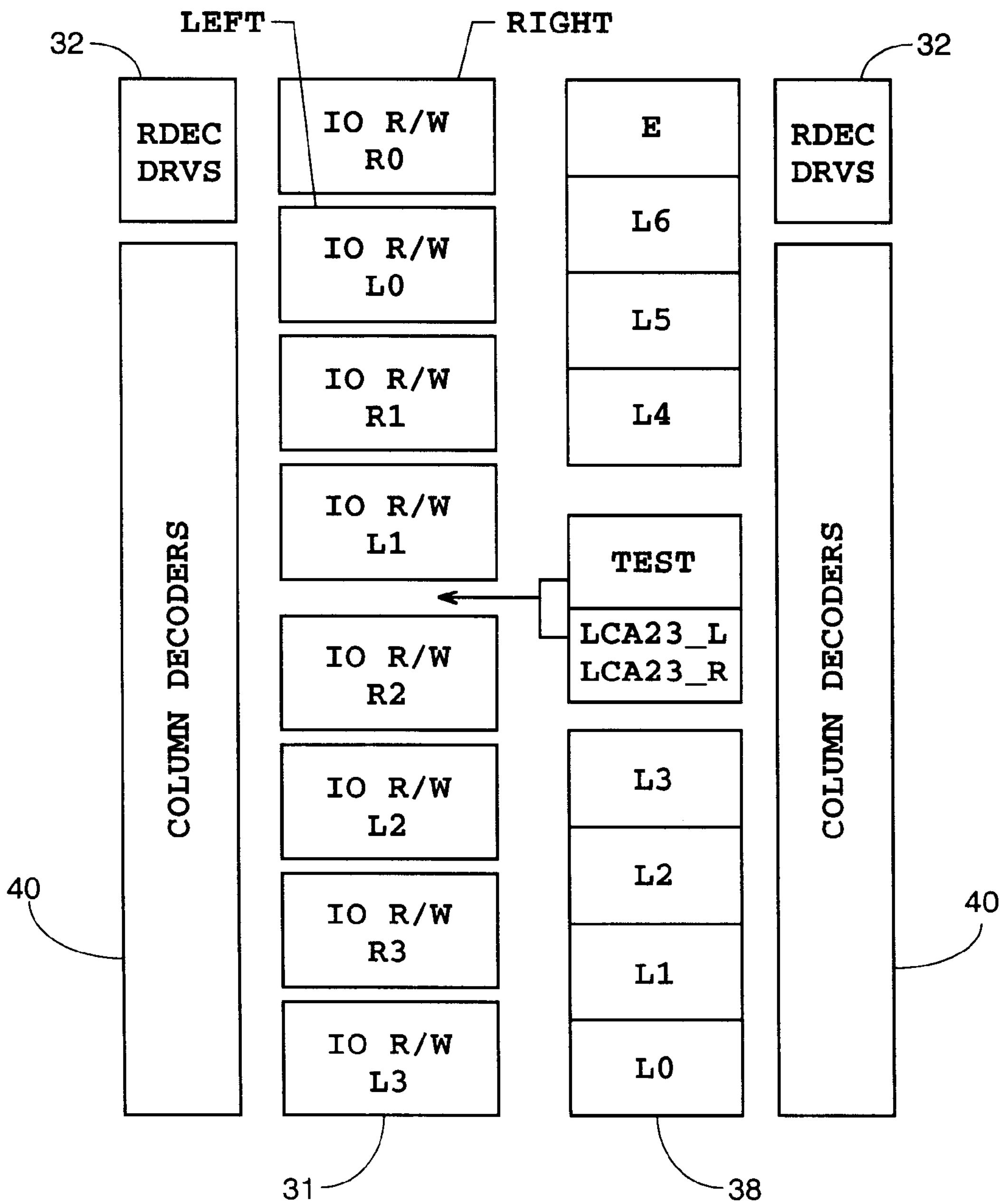
FIG. 8 is a block diagram of a column block segment from the memory device of FIG. 2.
Figure 9:
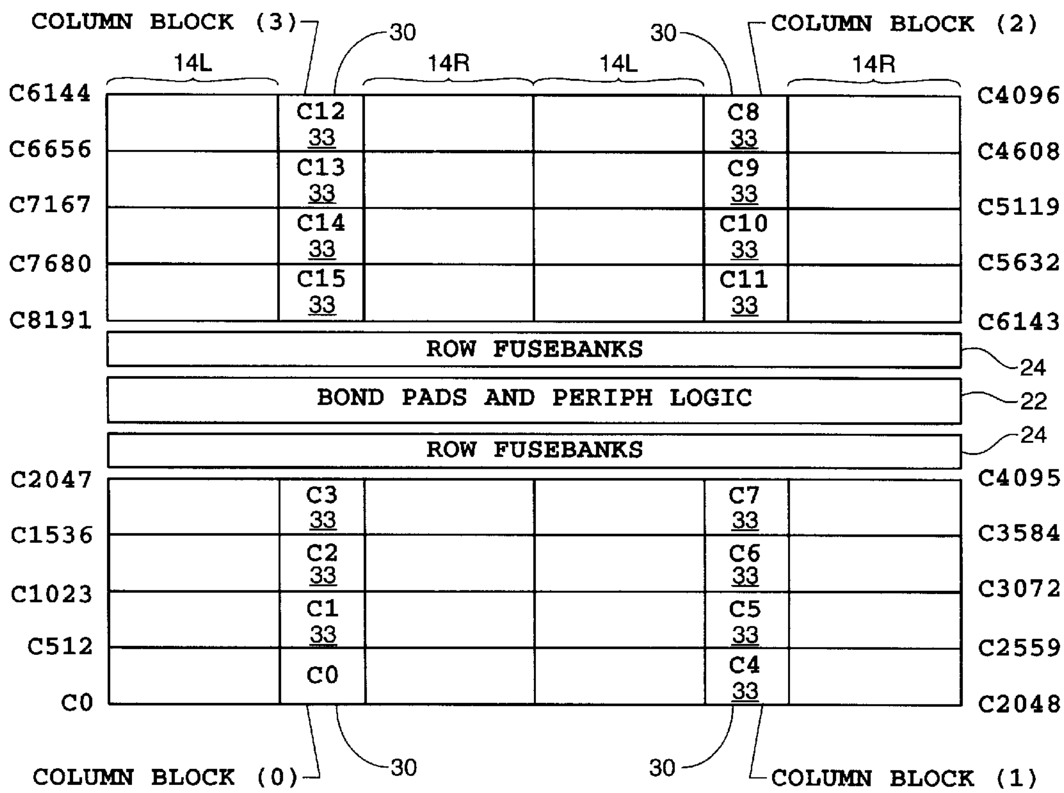
FIG. 9 is another layout diagram of the memory device from FIG. 2 showing the arrangement of column fusebank circuits therein.

Returning now to FIGS. 3, 4, 5, and 6, it can be seen that disposed vertically between each pair of 8 Mbit PABs 14L and 14R within each quadrant 12 are column blocks 30 containing I/O read/write lines 31, column fuses 38 (both laser fuses, designated with an "L" and electrical fuses designated with an "E" in FIG. 5 and elsewhere) for supporting column redundancy, and column decoders 40. Also disposed within each pair of 8 Mbit PABs 14L and 14R are row decoder drivers 32 which receive predecoded (i.e., partially decoded) row addresses from row address predecoder 28. FIG. 9 shows that each column block 30 consists of four column block segments 33. A typical column block segment 33 is shown in block form in FIG. 8. As shown in FIG. 9, column block 0 is associated with columns 0 through 2047 of DRAM 10, column block 1 is associated with columns 2048 through 4095, column block 2 is associated with columns 4096 through 6143, and column block 3 is associated with columns 6144 through 8191.

Figure 10:
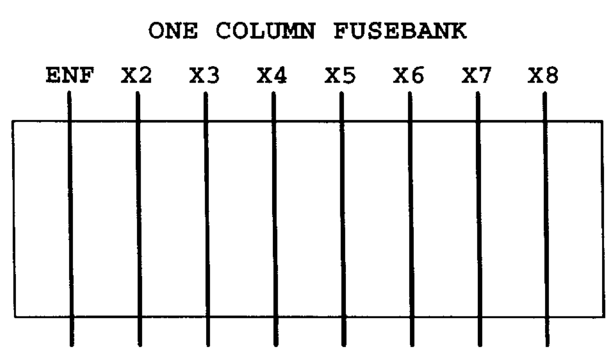
FIG. 10 is a diagram illustrating the configuration of a typical column fusebank from the memory device of FIG. 2.

With continued reference to FIG. 9, each column block 30 contains four sets of eight fusebanks (seven laser fusebanks 844 shown in detail in FIG. 110 and one electrical fusebank 846 shown in detail in FIG. 112), which when enabled (by blowing the fuse ENF therein) replaces 4 adjacent least significant columns. Column blocks 0 through 3 comprise sixteen sections C0 through C15. A typical column fusebank is depicted in FIG. 10. The ENF fuse in each fuse bank is enabled to enable its corresponding fusebank. The column block fusebank circuitry is shown in greater detail in FIGS. 110 through 112.

Figure 6:
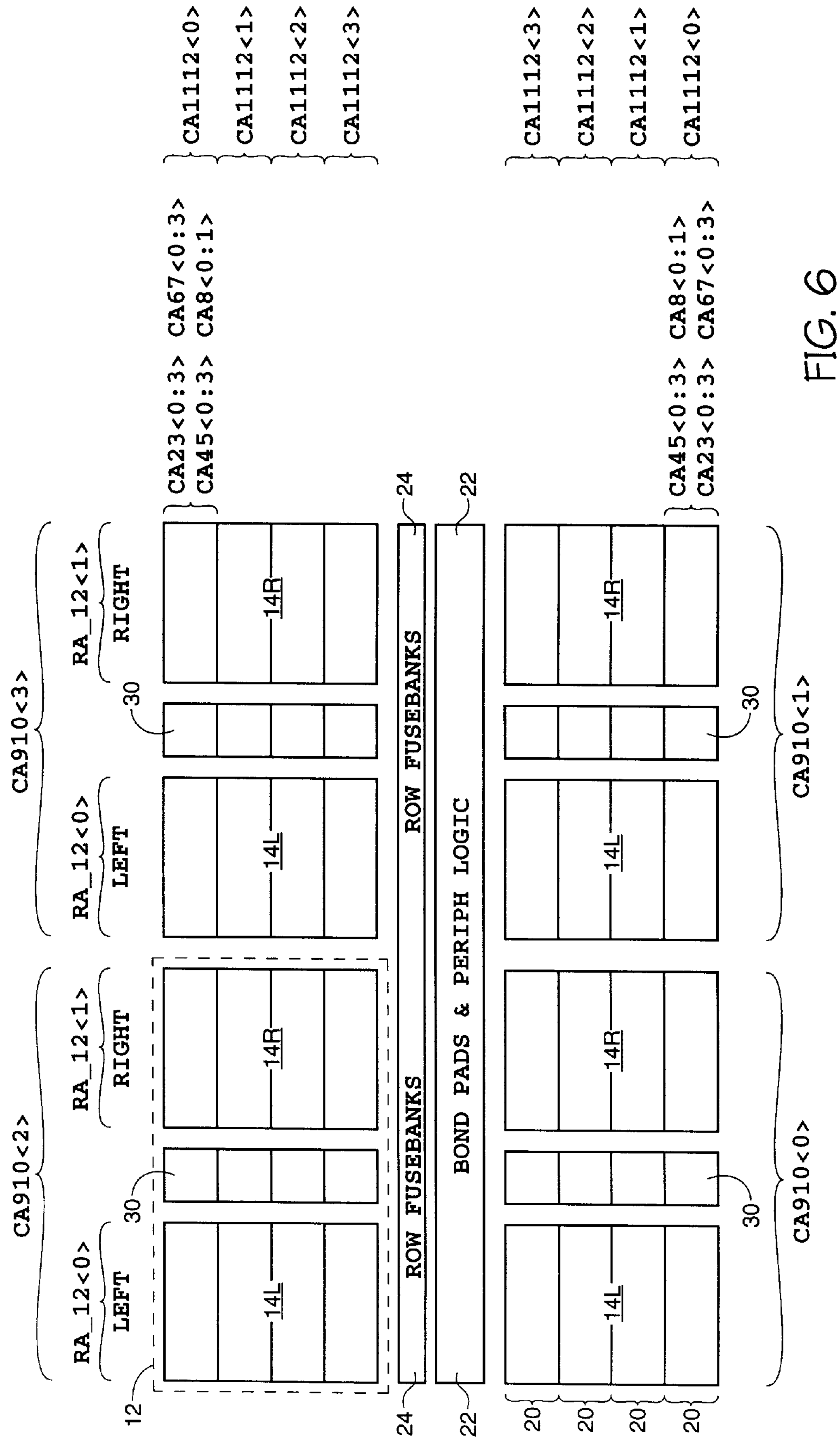
FIG. 6 is another layout diagram of the memory device from FIG. 2 showing the arrangement of column block circuits, bond pads, row fusebanks and peripheral logic therein.

FIG. 6 shows in part how various sections of DRAM 10 are addressed. For example, FIG. 6 shows that for any given quadrant 12, the left 8 Mbit PAB 14L will be selected when bit 12 of the row address (RA_12) is 0, while the right 8 Mbit PAB 14R will be selected when bit 12 of the row address is 1. Likewise, the top left quadrant 12 of DRAM 10 is accessed when bits 9 and 10 of the column address (referred to as CA910 in FIG. 6) are 0 and 1, respectively, whereas the top right quadrant 12 of DRAM 10 is accessed when CA910 are 1 and 1, respectively, the bottom left quadrant 12 when CA910 are 0 and 0, respectively, and the bottom right quadrant 12 when CA910 are 1 and 0, respectively.

Figures 13, 13A:
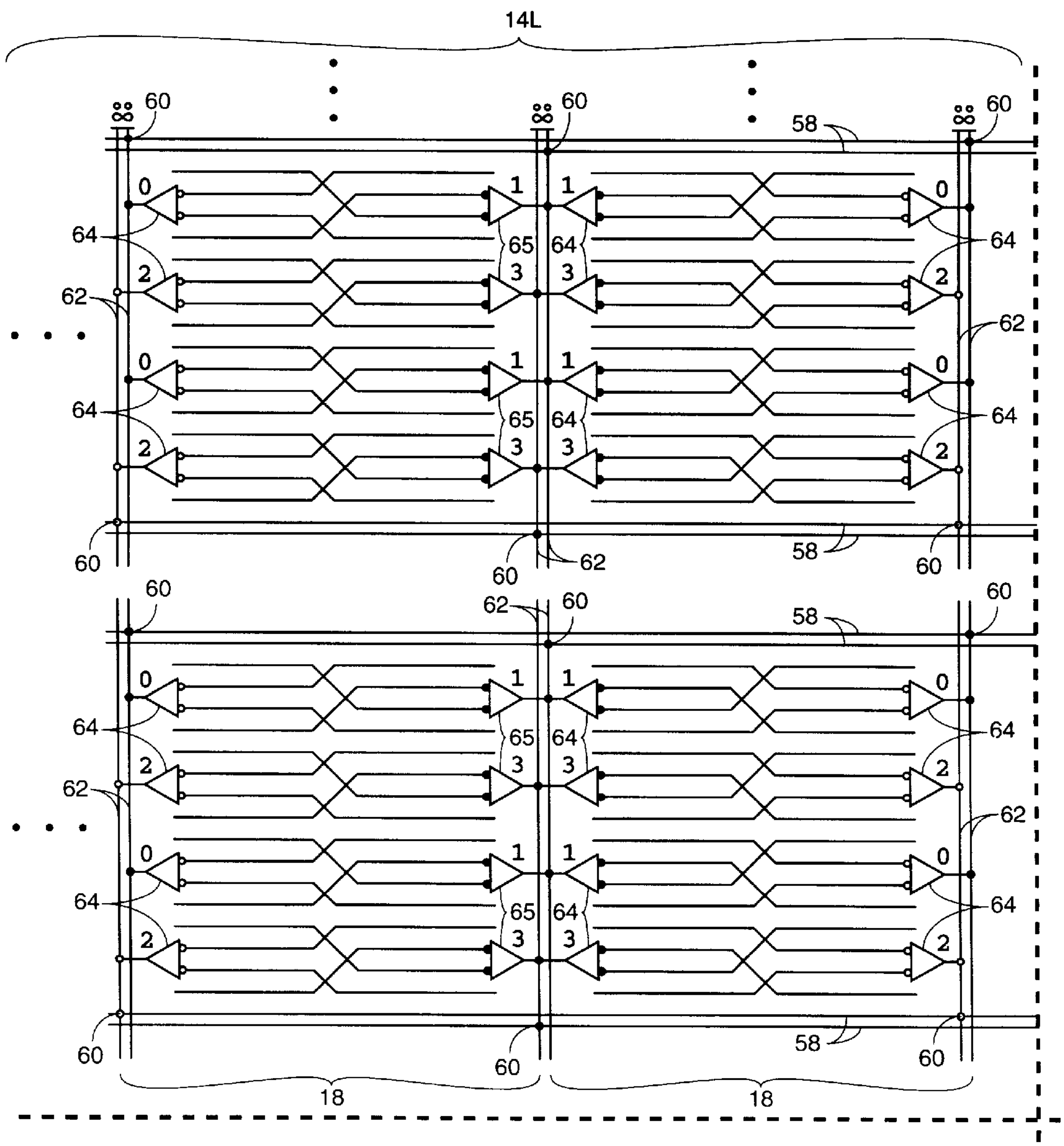
FIGS. 13A–13F layout diagrams showing the bitline and input/output (I/O) line arrangement in the memory device of FIG. 2.
Figure 13B:
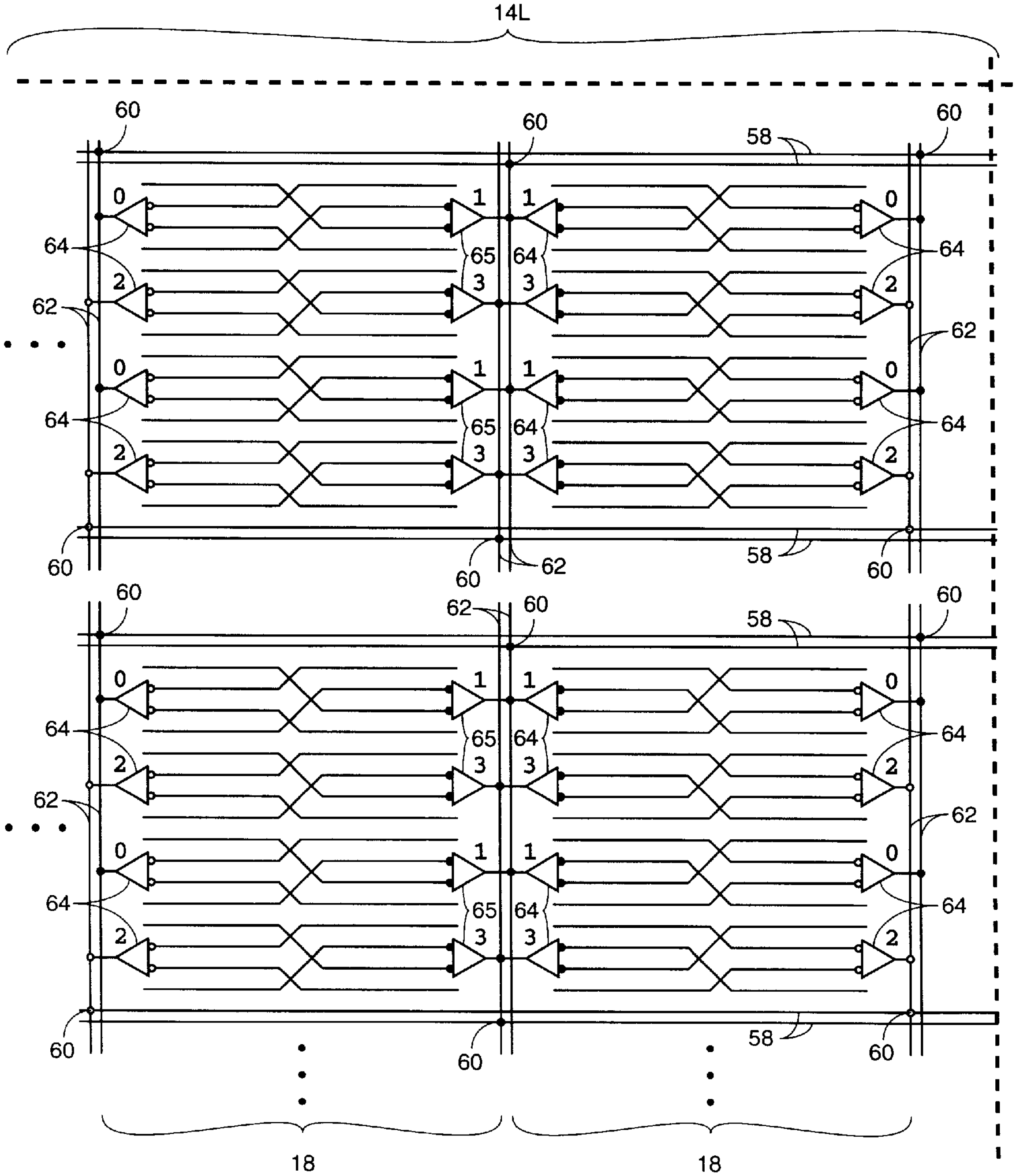
Figure 13C:
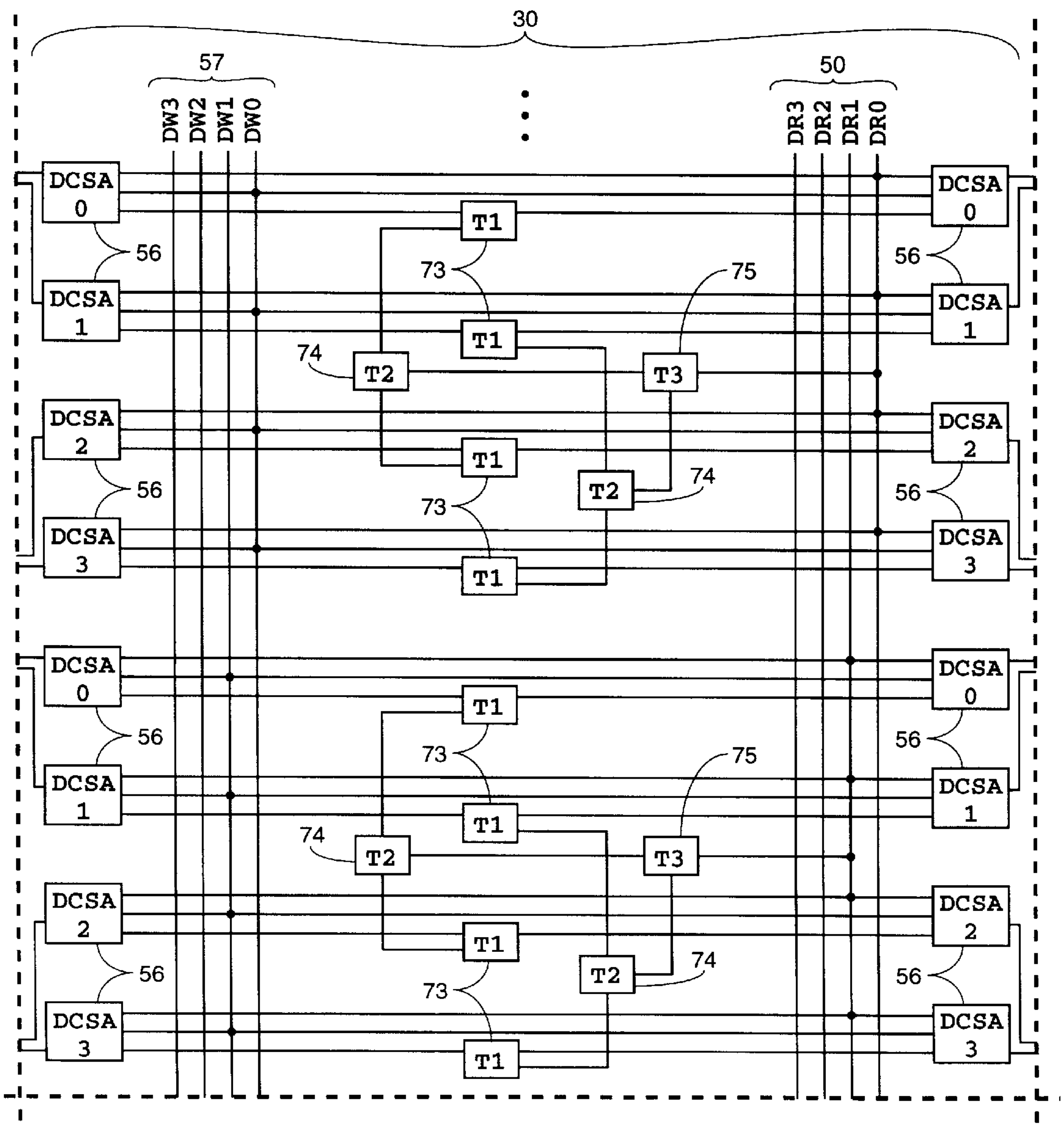
Figure 13D:
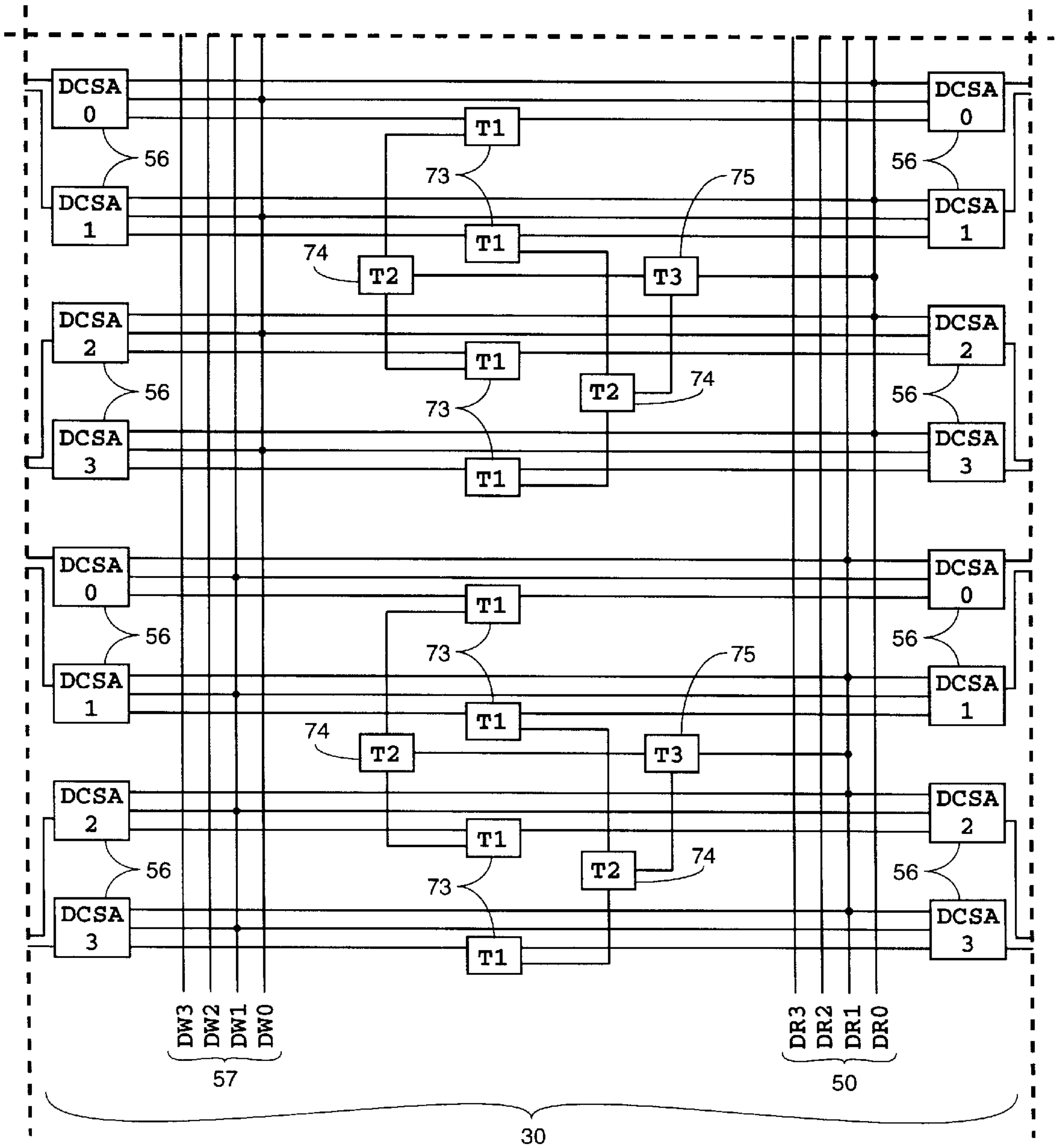
Figure 13E:
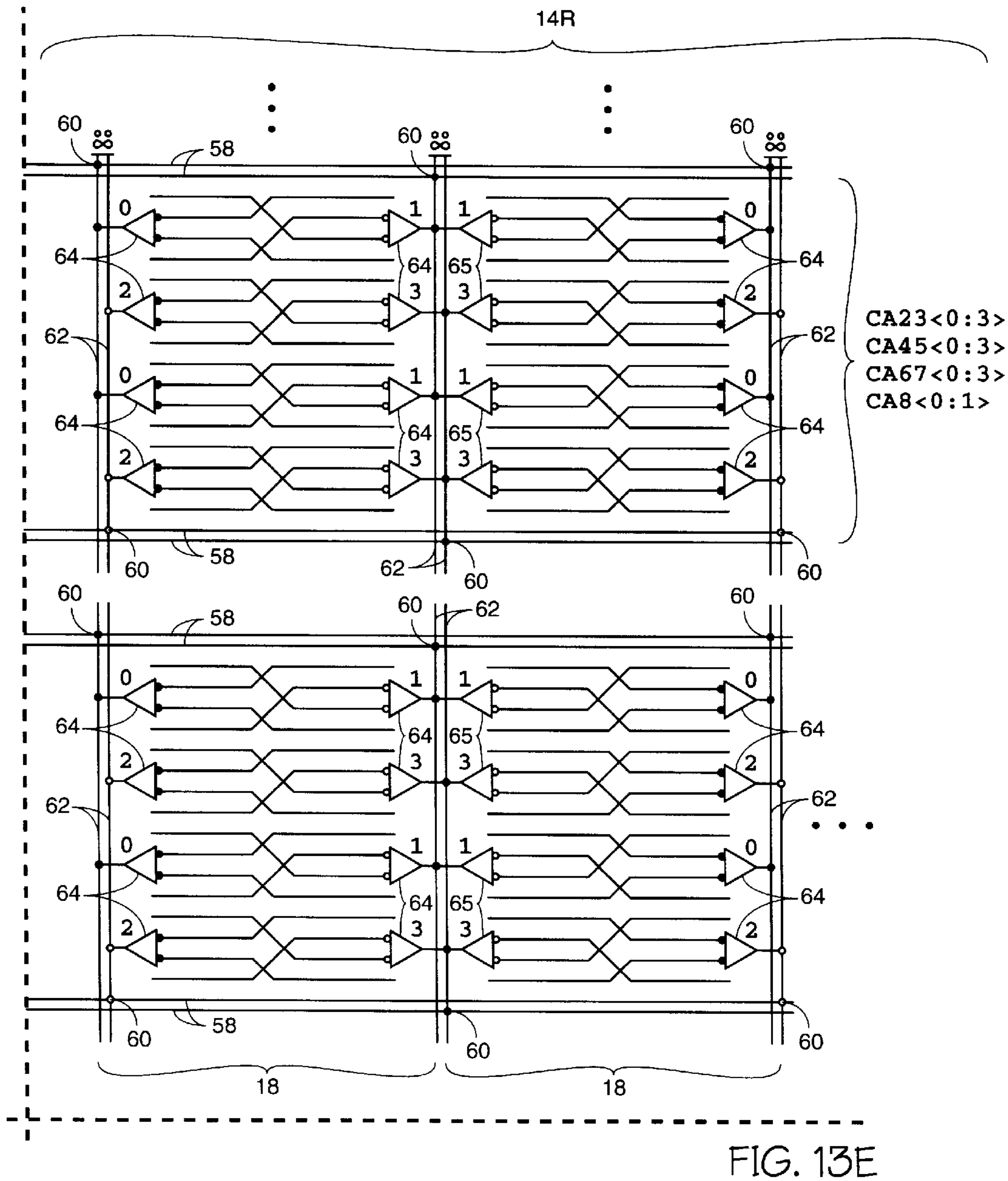
Figure 13F:
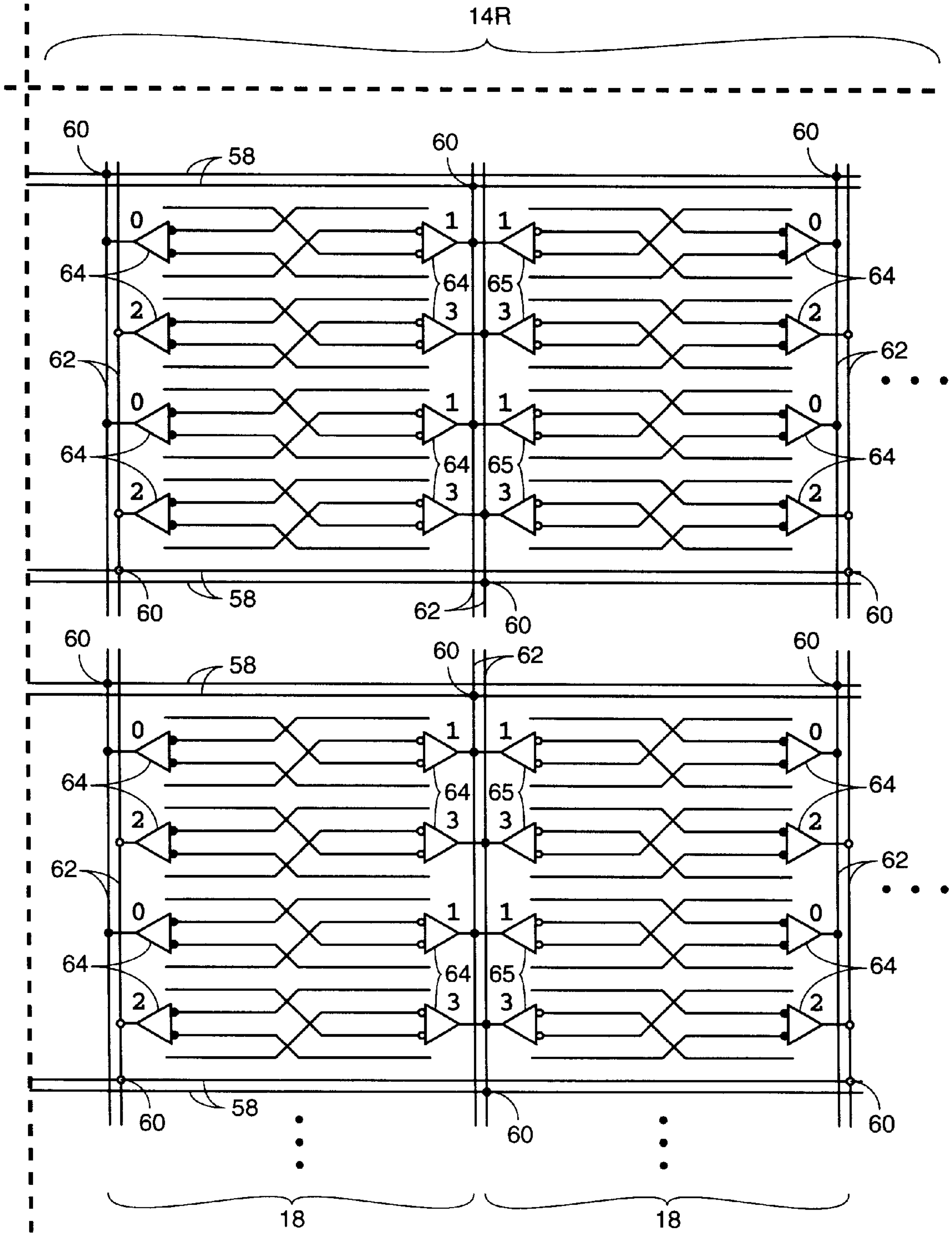

Turning now to FIG. 13, which is a schematic representation of a typical quadrant 12 of DRAM 10, it can again be seen that each 16 Mbit quadrant 12 consist of two 8 Mbit sections or PABs 14L and 14R mirrored about a column block 30. Each column block 30 drives four pairs of data read (DR) lines 50 and four data write (DW) lines 52. A shown in FIG. 13, column block 30 includes a plurality of DC sense amplifiers (DCSAs) 56 which are coupled to so called secondary I/O lines 58 extending laterally along 8 Mbit PABs 14L and 14R. Secondary I/O lines 58, in turn, are multiplexed by multiplexers 60 to sense amplifier output lines 62, also referred to herein as local I/O lines. Local I/O lines 62 are coupled to the outputs of primary sense ampifiers 64 and 65, whose inputs are coupled to bit lines 66. This arrangement can perhaps be better appreciated with reference to FIG. 14, which depicts a portion of an 8 Mbit PAB 14 including a section 20 of columns and a section 18 of rows.

Figure 14:
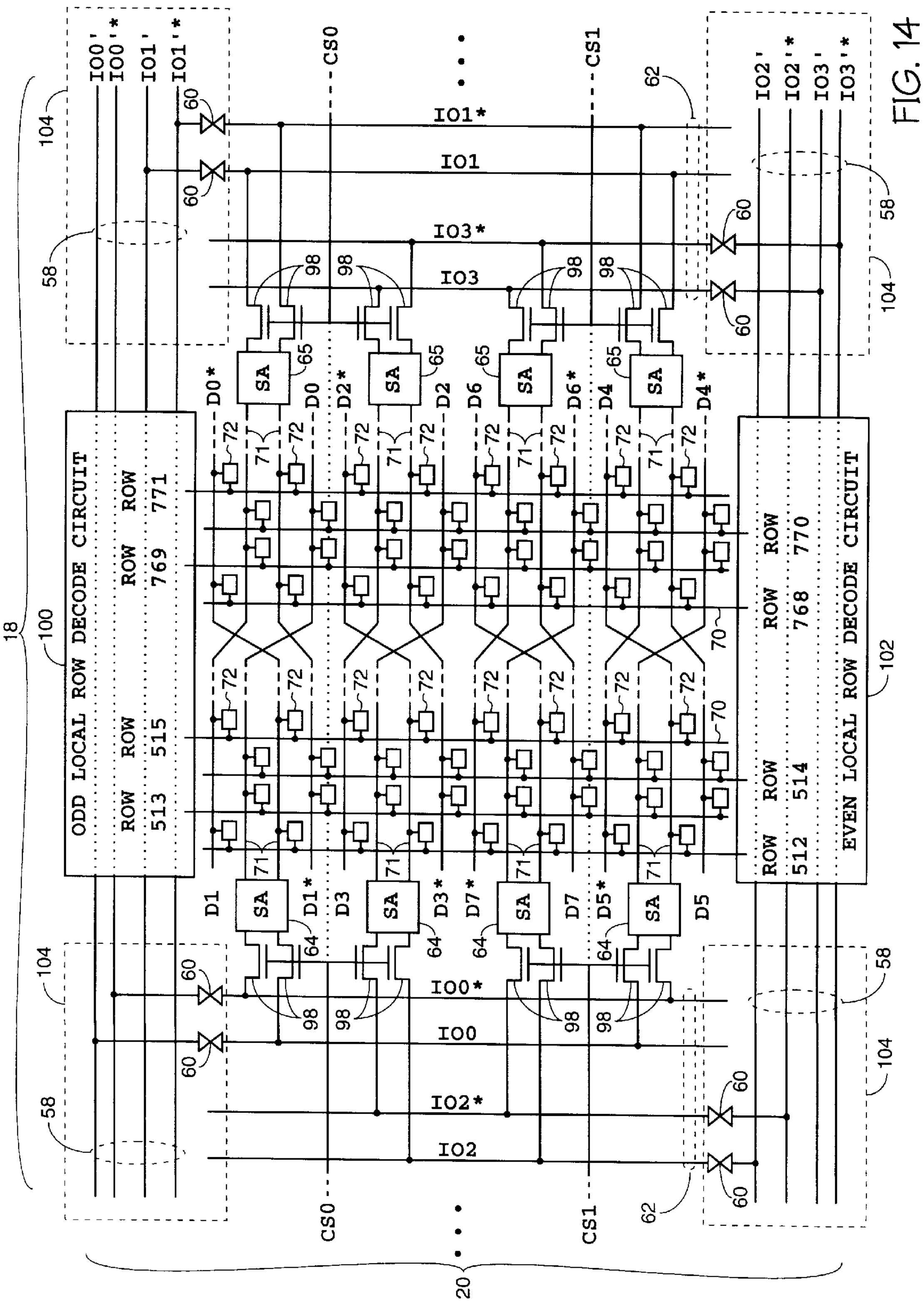
FIG. 14 is another layout diagram showing the bitline and I/O line arrangement and local row decoder circuits in the memory device of FIG. 2.

As shown in FIG. 14, the memory array of DRAM 10 has a plurality of memory cells 72 operatively connected at the intersections of row access lines 70 and column access lines 71. Column access lines (digit lines) 71 are arranged in pairs to form digit line pairs. Eight digit line pairs D0/D0*, D1/D1*, D2/D2*, D3/D3*, D4/D4*, D5/D5*, D6/D6*, and D7/D7* are shown in FIG. 14, although it is to be understood that there are 512 digit line pairs (plus redundant digit line pairs) between every odd and even row decoder 100 and 102.

In accordance with a notable aspect of the present invention, in a selected SAB, four sets of digit line pairs are selected by a single column select (CS) line. For example, in FIG. 14, column select line CS0 turns out output switches 98 on the left side of FIG. 14 to couple bit line pair D0/D0* to the local I/O lines 62 designated IO0/IO0* and to couple bit line pair D2/D2* to local I/O lines 62 designated IO2/IO2*, and also turns on output switches 98 on the right side of FIG. 14 to couple digit line pair D1/D1* to local I/O lines 62 designated IO1/IO1* and to couple digit line pair D3/D3* to local I/O lines 62 designated IO3/IO3*.

Another notable aspect of the present invention which is evident from FIG. 14 is that column select lines (e.g., CS0 and CS1 in FIG. 14) extend along the entire length of an SAB 18. In fact, column select lines extend continously along the width of each PAB 14 of eight SABs 18. Thus, four switches 98 are turned on in each of eight PABs 18 upon assertion of a single column select line. As a result of this, it is important that the local I/O lines 62 in the array be equilibrated to DVC2 (½ $V_{cc}$) in between each memory cycle. I/O lines 62 must, of course, be biased to some voltage when unselected. With the architecture in accordance with the presently disclosed embodiment of the invention, the I/O lines 62 of unselected SABs must be biased to DVC2 to prevent unwanted power consumption associated with the current which would flow when digit lines 71 in unselected SABs are shorted to local I/O lines 62 biased to a voltage other than DVC2. To ensure that local I/O lines 62 are equilibrated to DVC2, circuitry associated with multiplexers 60, to be hereinafter described in greater detail, applies DVC2 to local I/O lines 62 when multiplexers 60 are not activated.

Notable aspects of the layout of device 10 in accordance with the present invention are also evident from FIG. 14. For example, as noted above, column select lines (e.g., CS0 and CS1 shown in FIG. 14), which are implemented as metal lines, extend laterally across the entire width of a PAB 14, originating centrally from column block 30 as described with reference to FIG. 13, for example. To achieve this, in the presently preferred embodiment of the invention, column select lines CS0, CS1, etc. . . are in one metal layer for some parts of their extent, and in an another metal layer for other parts. In particular, in the portion of the column select lines which extend over the array of memory cells 72, the column select lines are in a higher metal layer METAL2, while in the regions where the column select lines cross over sense amplifiers 64 and 65 and local I/O lines 62, column select lines drop down to a lower metal layer METAL1. This is necessary because local I/O lines 62 are implemented in METAL2.

Note also from FIG. 14 that secondary I/O lines 58 pass through the same area as local row decoders 100 and 102.

Another notable aspect of the layout of device 10 relates to the gaps, designated within dashed lines 104 in FIG. 14, which exist as a result of the positioning of local row decoders 100 and 102. As will be hereinafter described in greater detail, gaps 104 advantageously provide area for containing circuitry including multiplexers 60.

The even digit line pairs D0/D0*, D2/D2*, D4/D4*, and D6/D6* are coupled to the left or even primary sense amplifiers designated 64 in FIG. 14, while the odd bit line pairs D1/D1*, D3/D3*, D5/D5*, and D7/D7* are coupled to right or odd primary sense amplifiers 65. The even or odd sense amplifiers 64/65 are alternatively selected by the least significant bit of the column address (CA0), where CA0=0 selects the even primary sense amplifiers 64 and CA0=1 selects the odd primary sense amplifiers 65.

Figure 15:
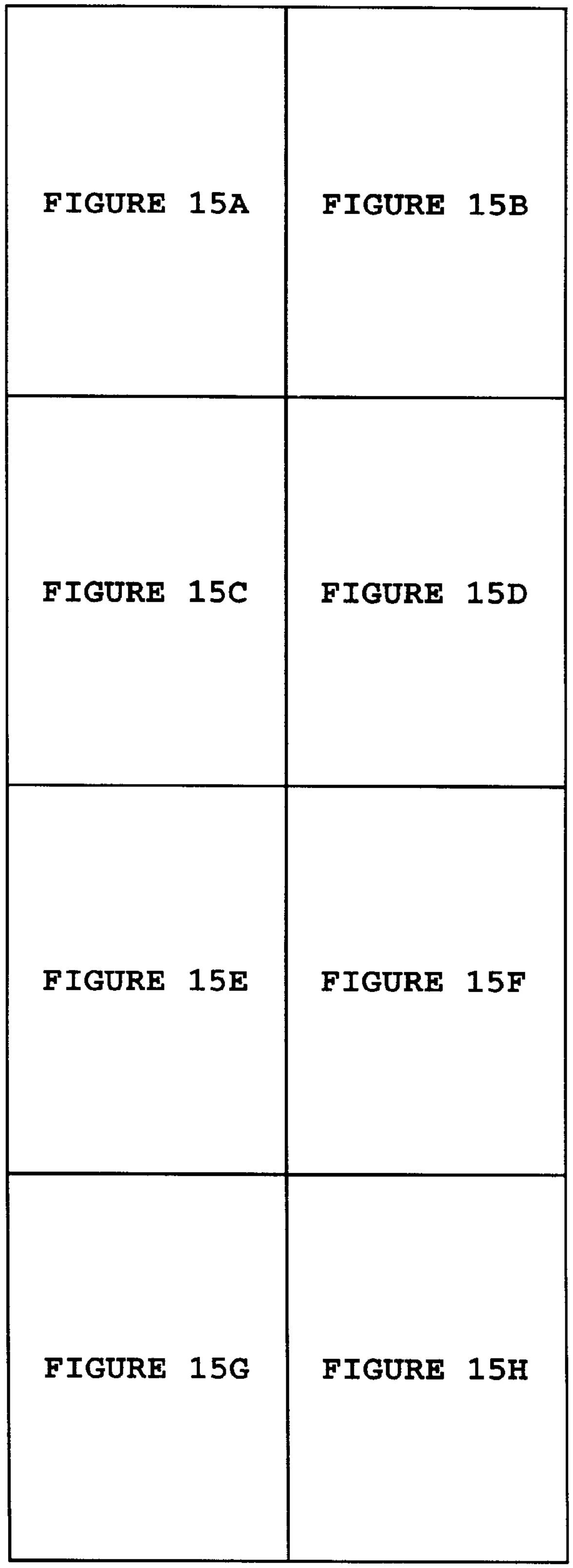
FIGS. 15A–15H are schematic diagrams of a portion of the memory device of FIG. 2 including bitlines and primary sense amplifiers therein.
Figure 15A:
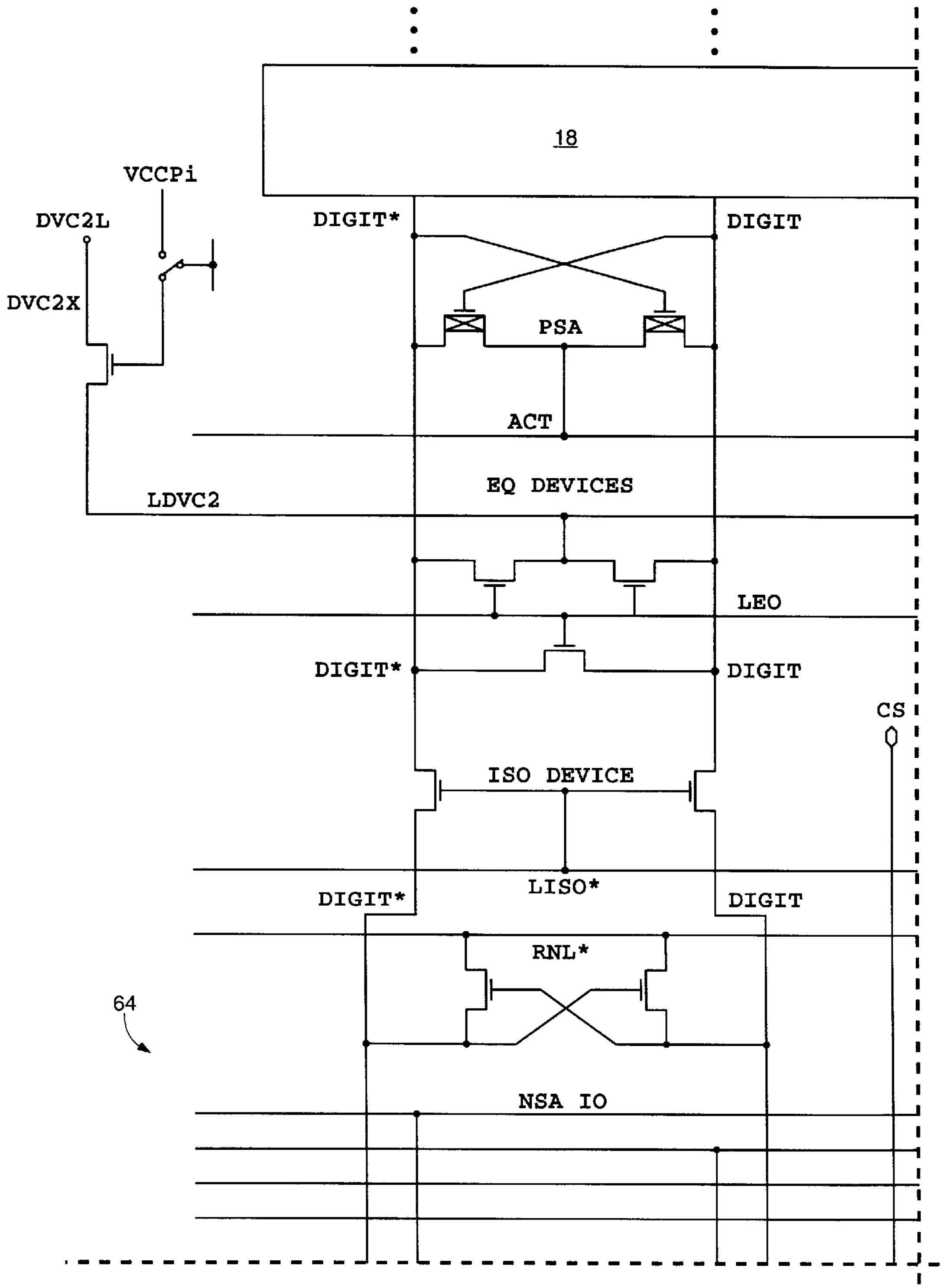
Figure 15B:
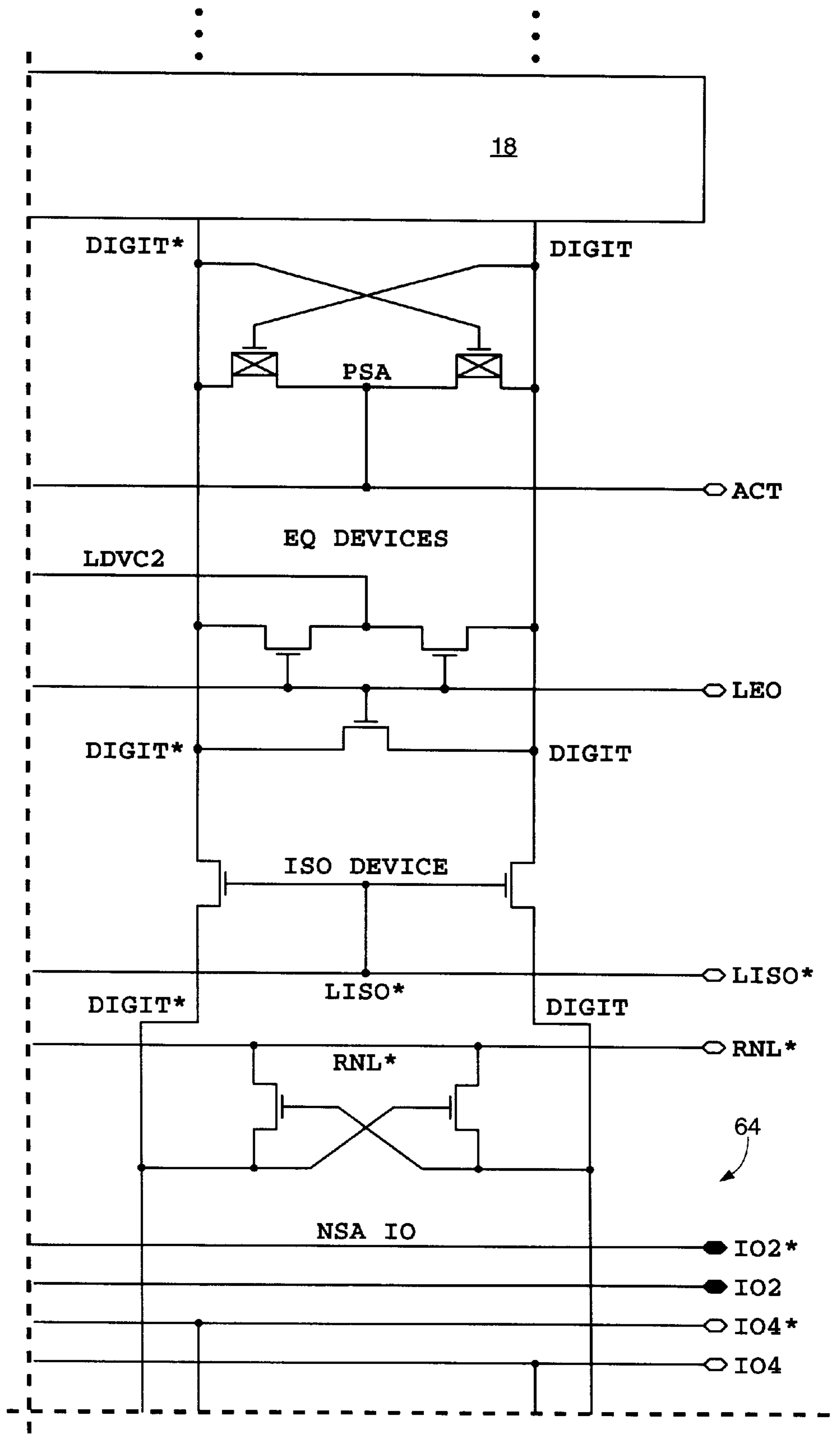
Figure 15C:
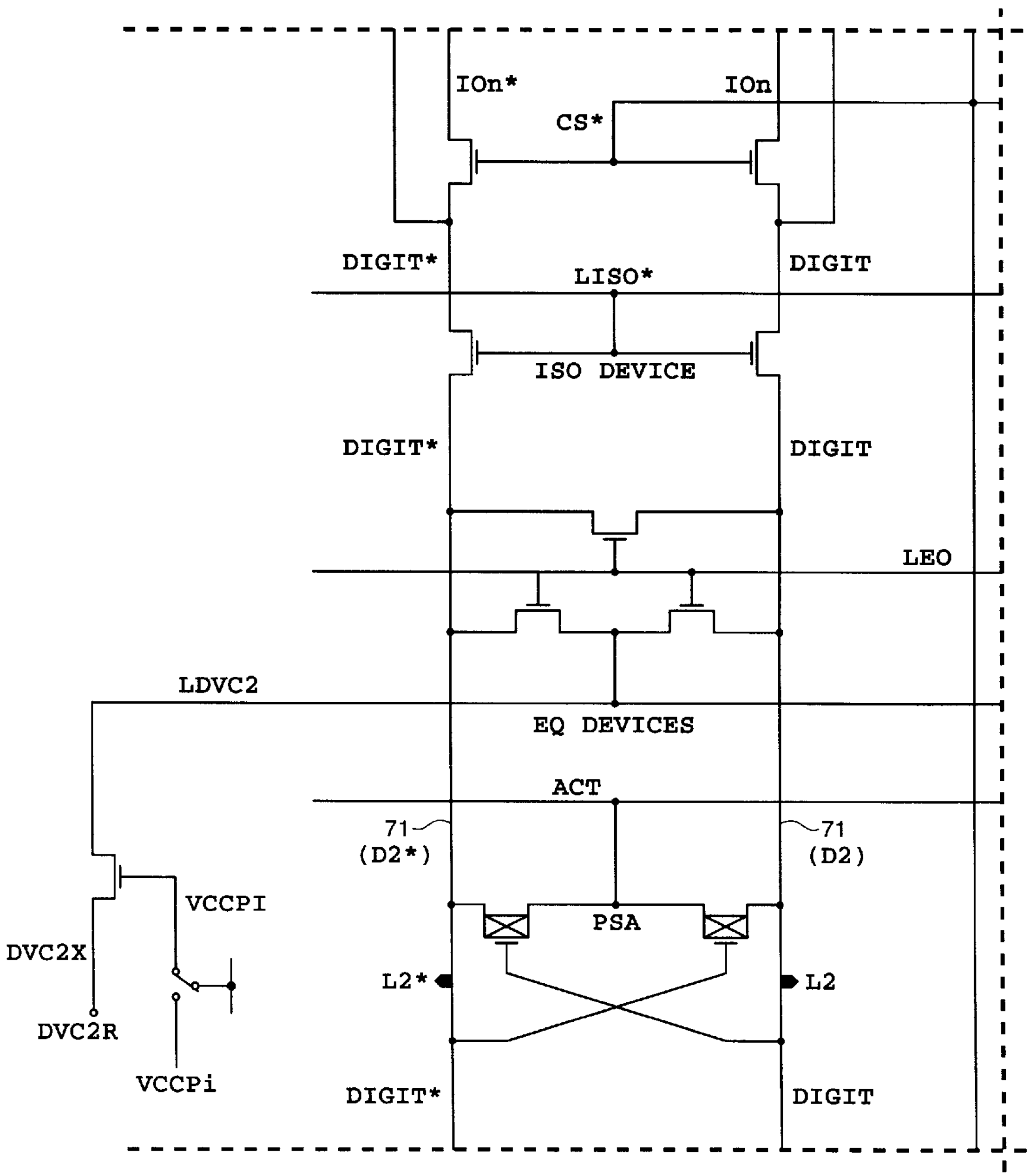
Figure 15D:
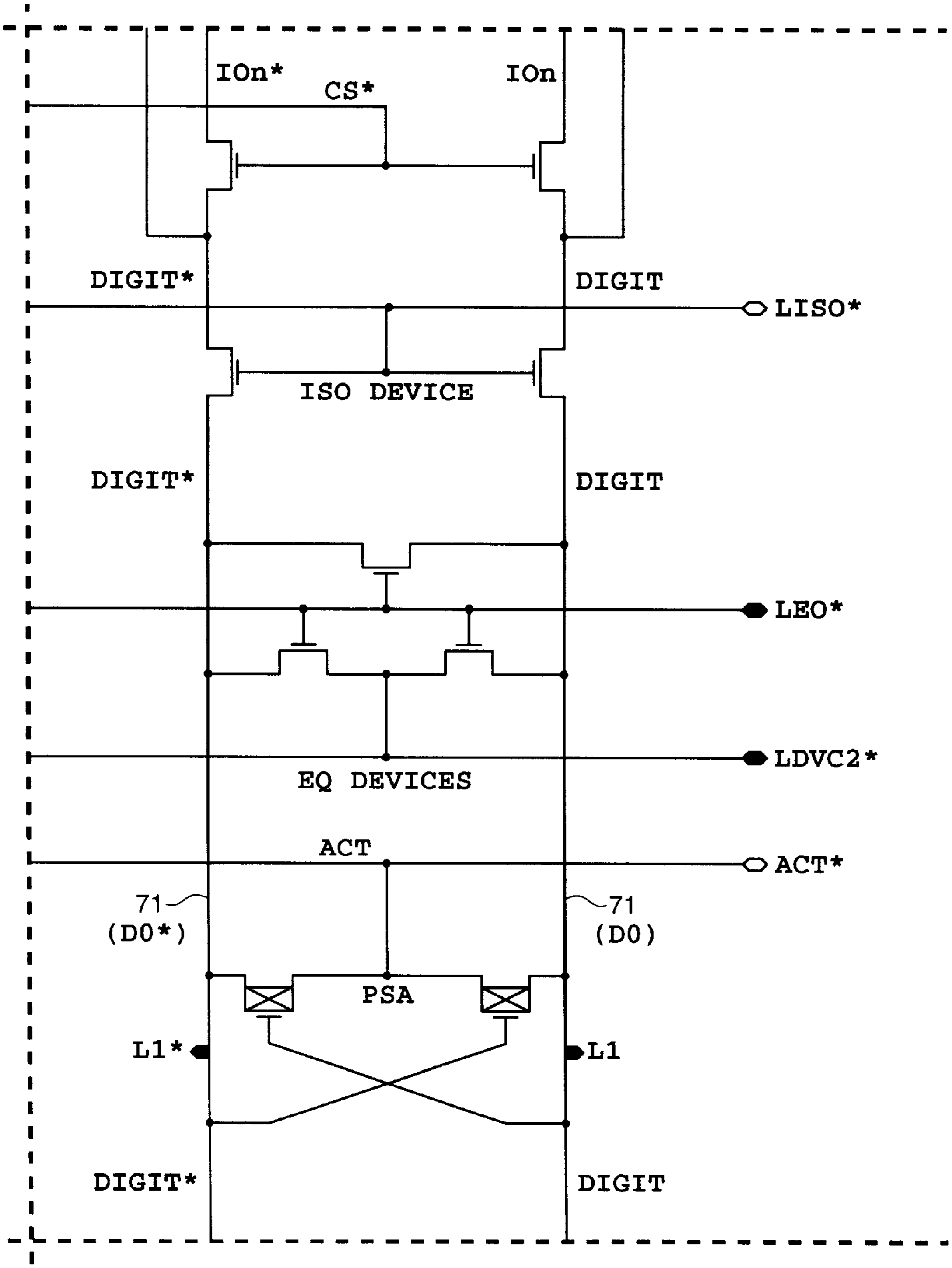
Figure 15E:
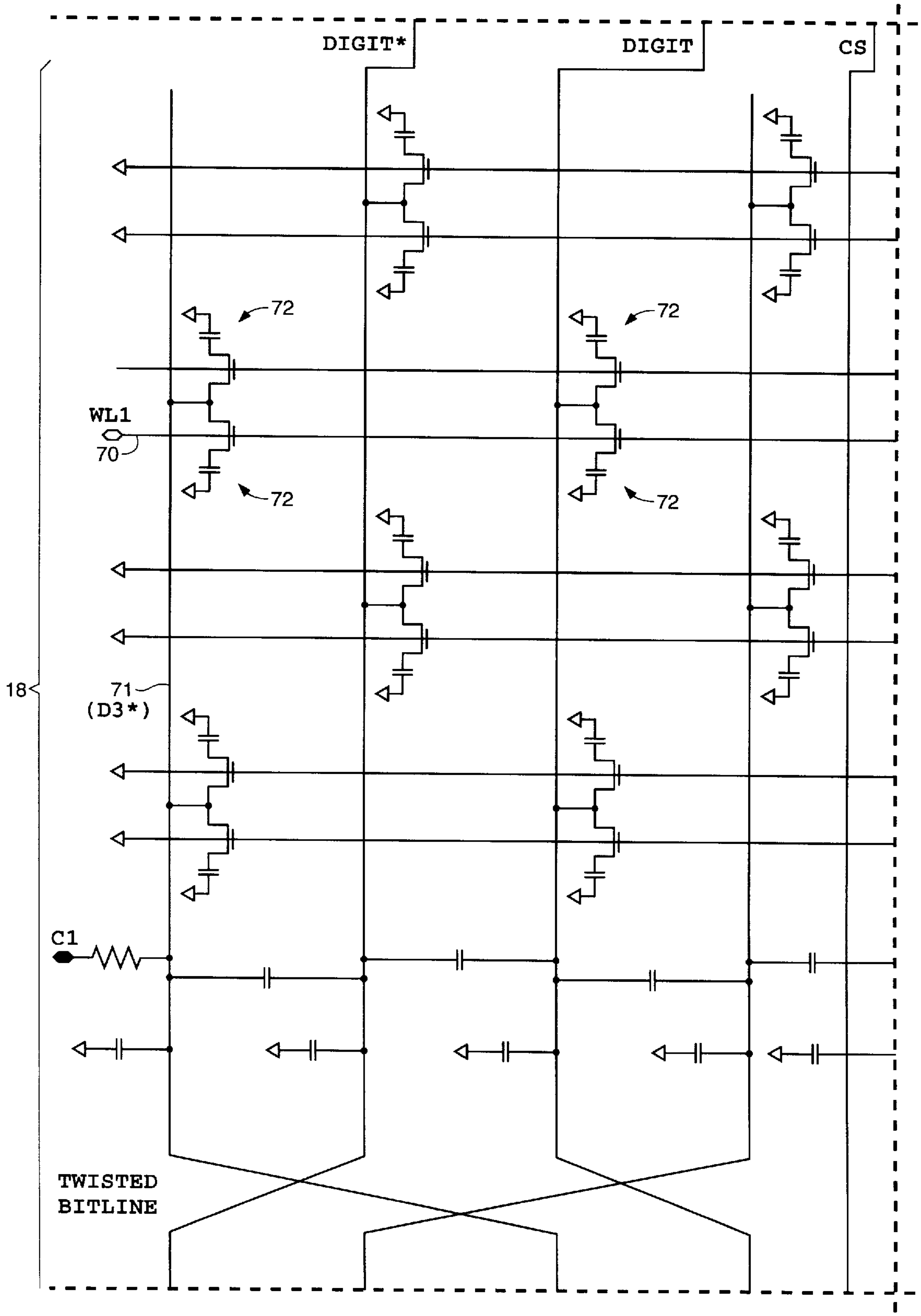
Figure 15F:
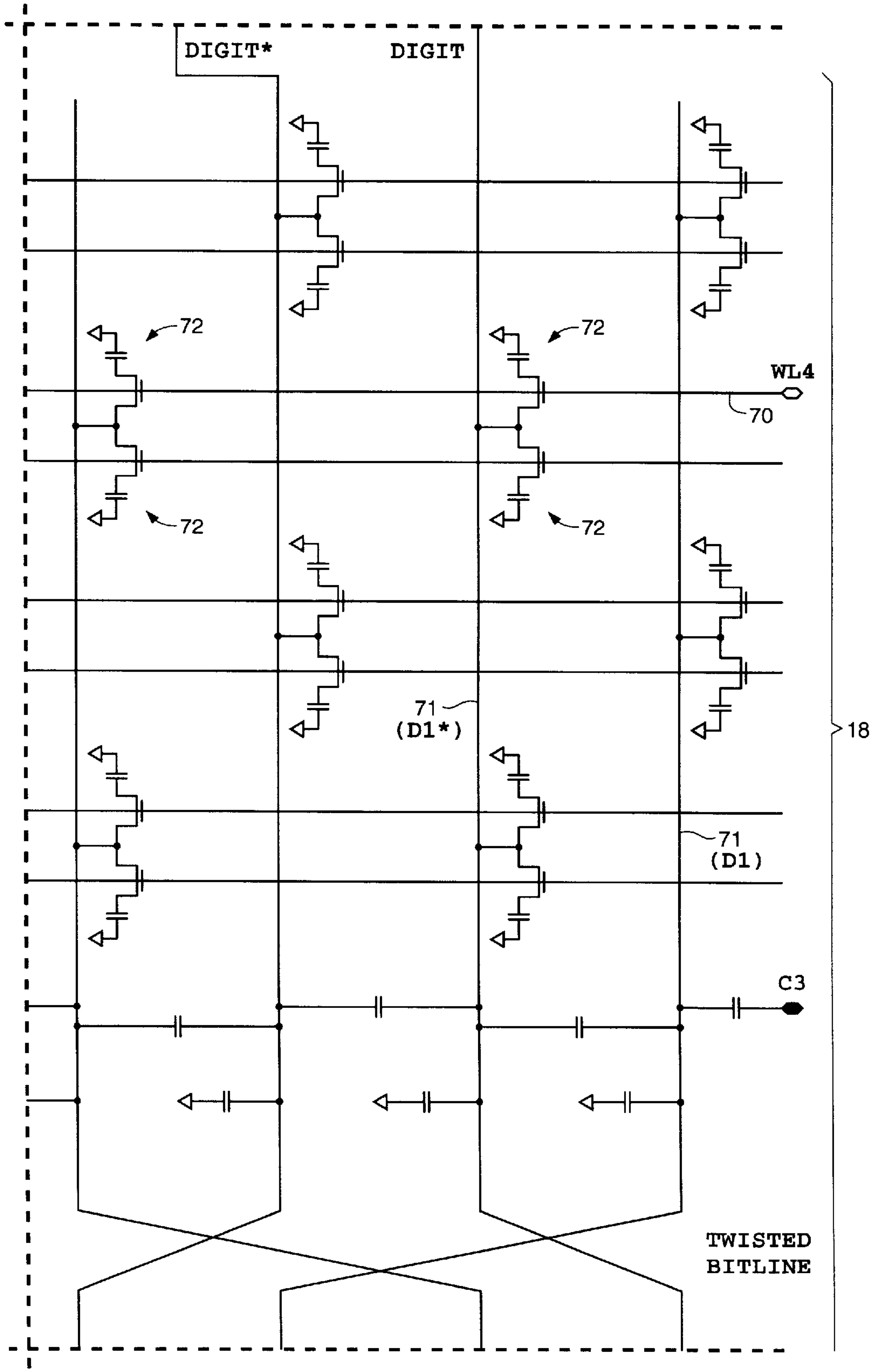
Figure 15G:
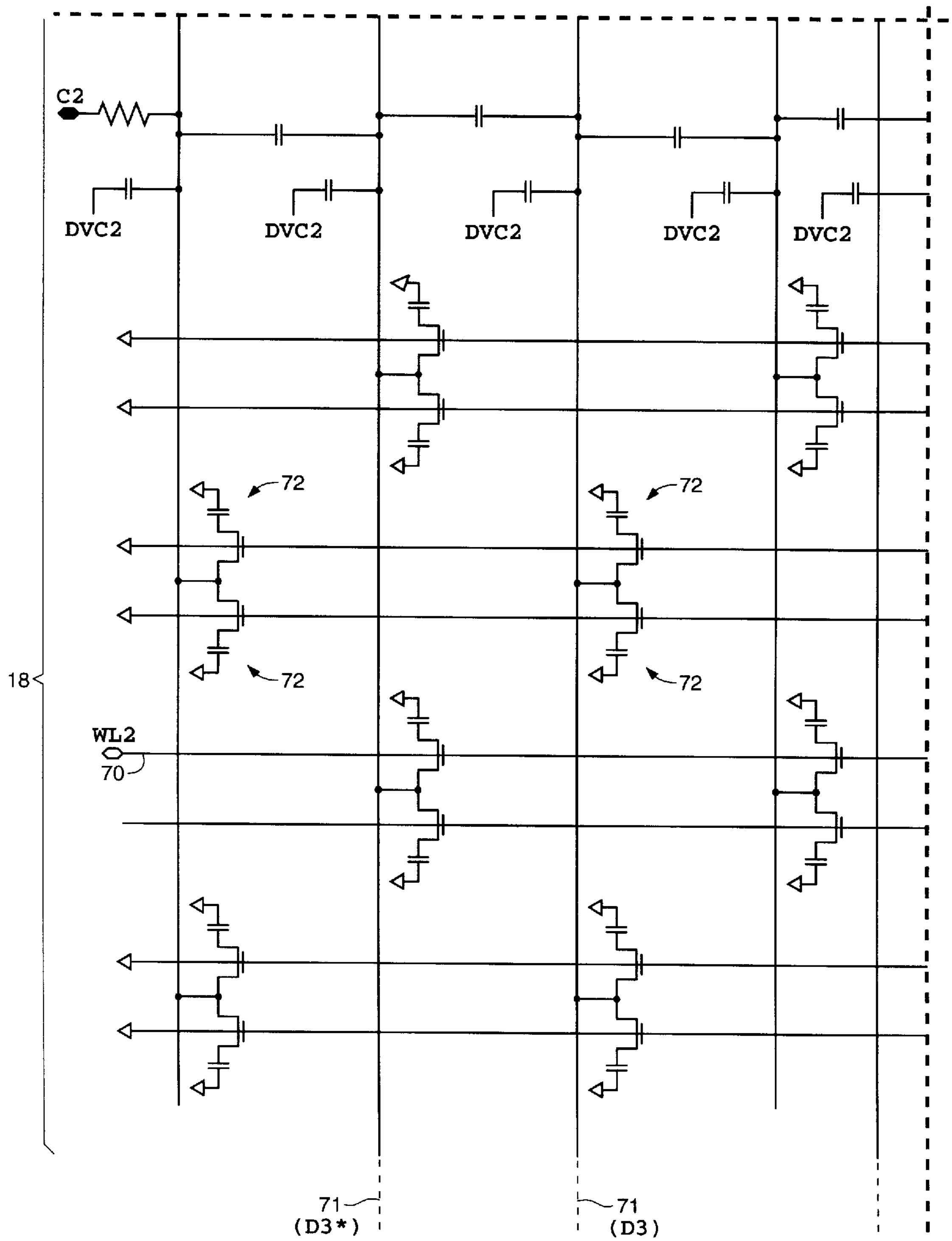
Figure 15H:
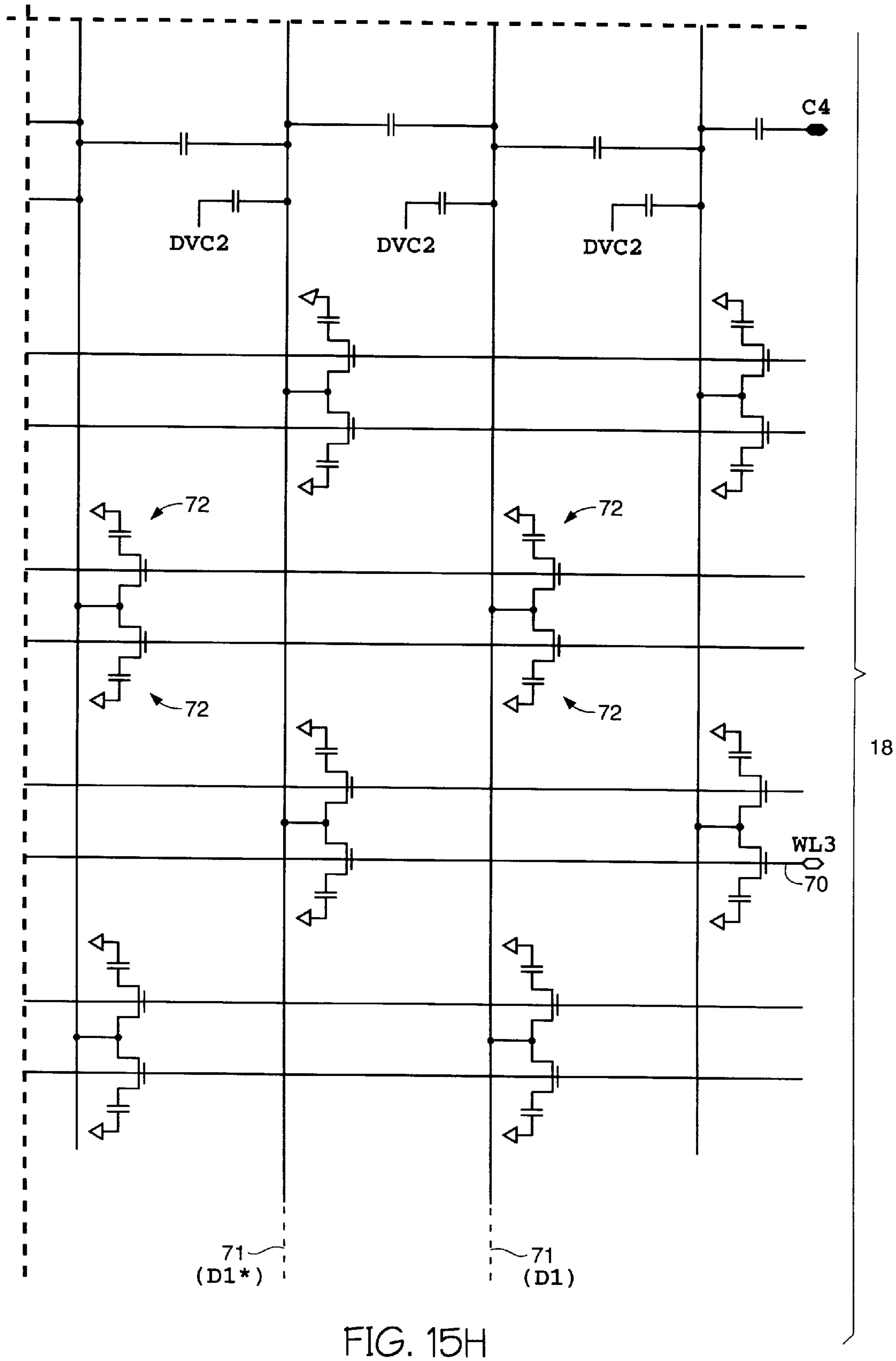

FIG. 15 is another illustration of a portion of an 8 Mbit PAB 14, the portion in FIG. 15 including two 512 row line sections 18 and a row of sense amplifiers 64 therebetween. (Sense amplifiers 65 are identical to sense amplifiers 64.)

Note, in FIG. 15, that the column select line CS is shared between two adjacent sense amplifiers, instead of having separate column select lines for each sense amplifier (in fact, as noted above, a single column select line extends along the entire width of a PAB 14 (eight SABs 18). This feature of sharing column select lines offers several advantages. One advantage is that less column select lines need to run over and parallel to digit lines 71. Thus, the number of column select drivers is reduced and the parasitic coupling of the column select lines to digit lines 71 is reduced Those of ordinary skill in the art will appreciate that in a double-layer metal part where the digit lines are in METAL1 and the column select lines are in METAL2 when running over the digit lines, the shared column select line arrangement in accordance with the presently disclosed embodiment of the invention offers an additional benefit in that it allows the column select lines to switch to METAL1 in the region of sense amplifiers 64 and 65. This allows high current flow sense amplifier signals, such as RNL* and ACT, which run perpendicular to digit lines 71 to run in METAL2.

In FIG. 15, digit lines 71 for digit line pairs D0/D0* and D2/D2* are shown coupled to sense amplifiers 64. Digit lines 71 for digit line pairs D1/D1* and D3/D3* are also shown in FIG. 15, although odd sense amplifiers 65 are not.

Note from FIG. 15 that sense amplifiers 64 are shared between two sections 18 of an 8 Mbit PAB 14—in FIG. 15 a left-hand section 18 (designated as 18L) is shown in block form while a right-hand section 18 (designated as 18R) is shown schematically.

Figure 16:
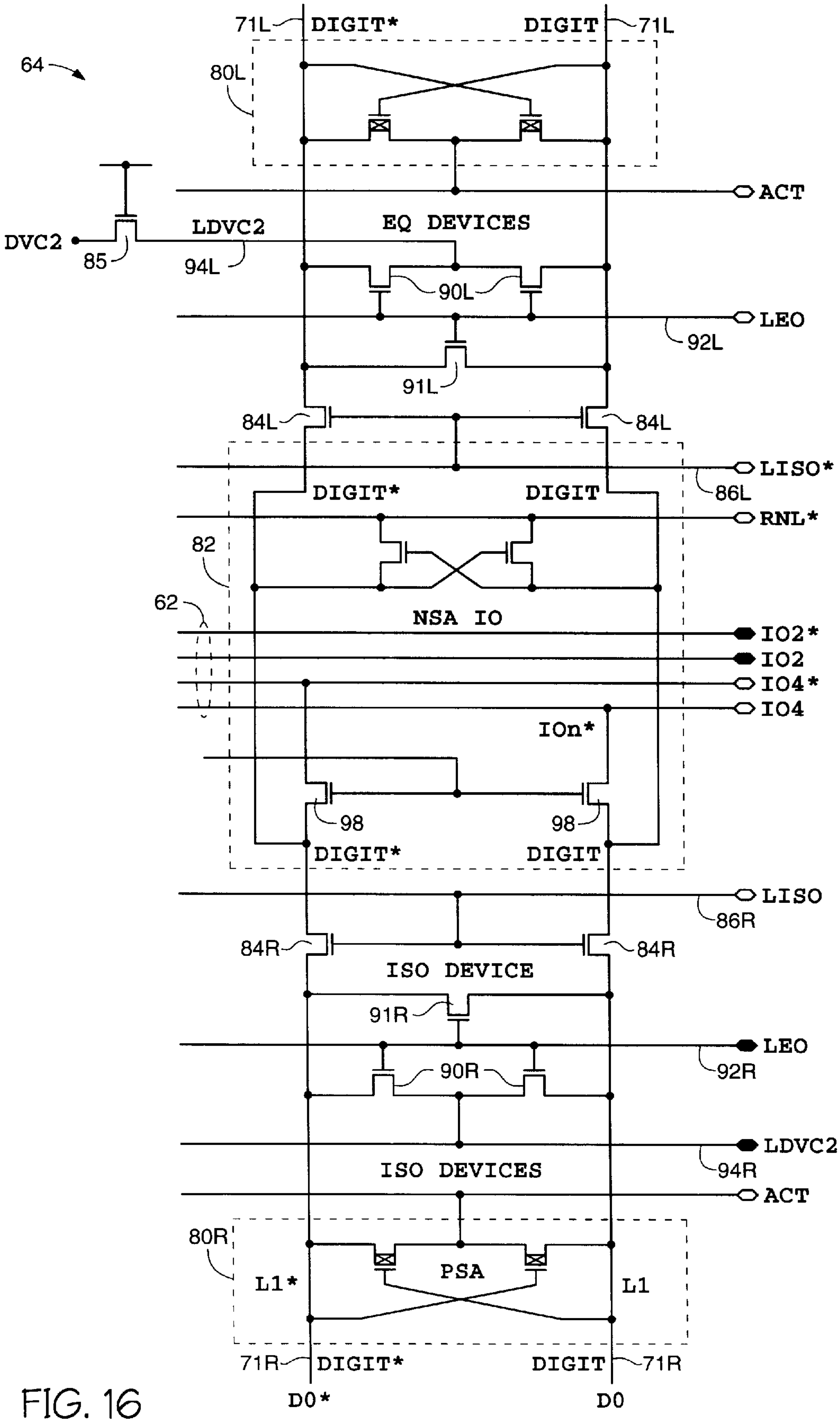
FIG. 16 is a schematic diagram of a primary sense amplifier from the memory device of FIG. 2.

For clarity, one of the sense amplifiers 64 from FIG. 15 is shown in isolation in FIG. 16. On the right-hand side of FIG. 16, two digit lines 71R, corresponding to the digit line pair D0/D0*, for example, are applied to a P-type sense amplifier at designated within dashed line 80R. On the left-hand side of FIG. 16, two other digit lines from another section 18L of 8 Mbit PAB 14 are applied to an identical P-type sense amplifier circuit 80L.

Sense amplifiers 64 further comprise an N-type sense amplifier circuit designated within dashed line 82 in FIG. 16. While separate P-type stages 80 (80L and 80R) are provided for the bit lines coupled on the left and right sides of sense amplifier 64, respectively, the N-type stage 82 is shared by sections 18 on both sides of sense amplifier 64. Isolation devices 84L and 84R are provided for decoupling the section 18 (either 18L or 18R) on one side or the other of sense amplifier 64 for any given access cycle in response local isolation signals applied on lines 86L and 86R, respectively.

As will be appreciated by those of ordinary skill in the art, memory cells 72 in DRAM 100 each comprise a capacitor and an insulated gate field-effect transistor (IGFET) referred to as an "access transistor". The capacitor of each memory cell 72 is coupled to a column or digit line 71 through the access transistor, the gate of which is controlled by row or word lines 70. A binary bit of data is represented by either a charged cell capacitor (a binary 1) or an uncharged cell capacitor (a binary zero). In order to determine the contents of a particular cell (ie., to "read" the memory location), the word line 70 associated with that cell is activated, thus shorting the cell capacitor to the digit line 71 associated with that particular cell. It has become common to "elevate" the word line to a voltage greater than the power supply voltage ($V_{cc}$) so that the full charge (or lack of charge) in the cell is dumped to the digit line 71. Prior to the read operation, digit lines 71 are equilibrated to $V_{cc}/2$ via equilibration devices 90L and 90R activated by a signal on LEQ lines 92L and 92R, respectively, and equilibration devices 91L and 91R, as shown in FIG. 16. The $V_{cc}/2$ voltage is supplied from LDVC2 lines 94L and 94R through a bleeder device 85.

When a cell 72 is shorted to its respective digit line 71, the equilibration voltage is either bumped up slightly by a charged capacitor in that cell, or is pulled down slightly by a discharged capacitor in that cell. Once full charge transfer has occurred between the digit line and the cell capacitor, the sense amplifier 64 associated with that digit line 71 is activated in order to latch the data. The latching operation proceeds as follows: If the resulting digit line voltage on one digit line 71 of a digit line pair is less than the other digit line 71, N-type sense amplifier 82 pulls that digit line 71 to ground potential; conversely, if a resulting digit line's voltage is greater than the other's, P-type sense amplifier 80 raises the voltage on the digit line to a full $V_{cc}$. Once the voltages on the digit lines 71 have been pulled up and down to reflect the data read from the addressed memory cell 72, digit lines 71 are coupled to sense amplifier output lines 62, via output switches 98 and sense amplifier output lines 62, for multiplexing onto secondary I/O bus 58.

Figure 17:
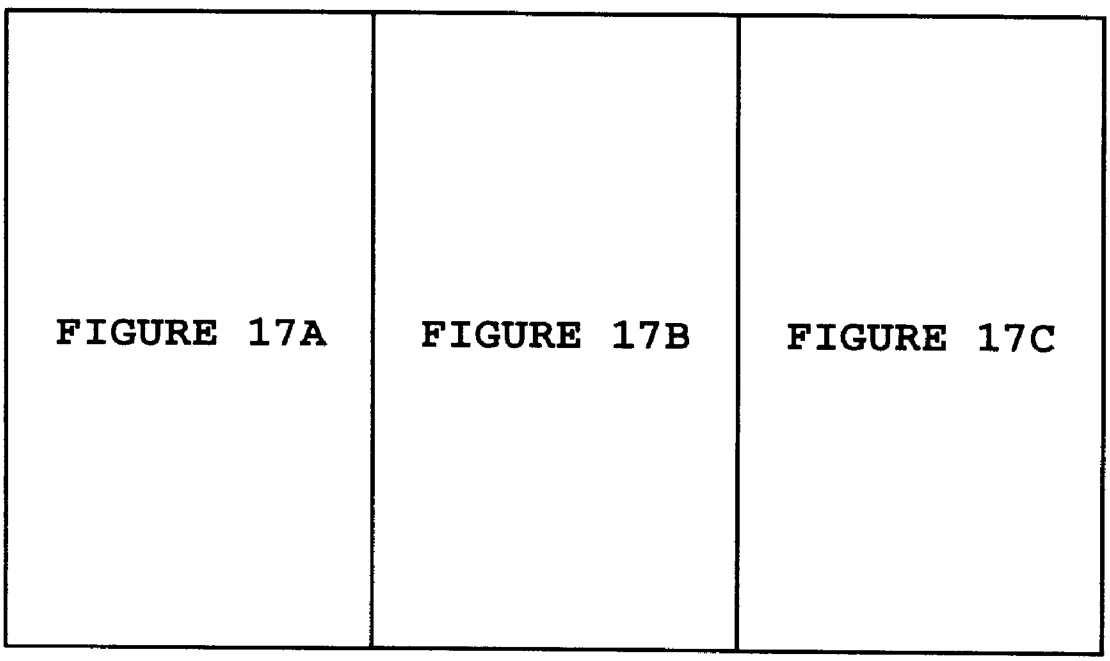
FIGS. 17A–17C are schematic diagrams of a DC sense amplifier circuit from the memory device of FIG. 2.
Figure 17A:
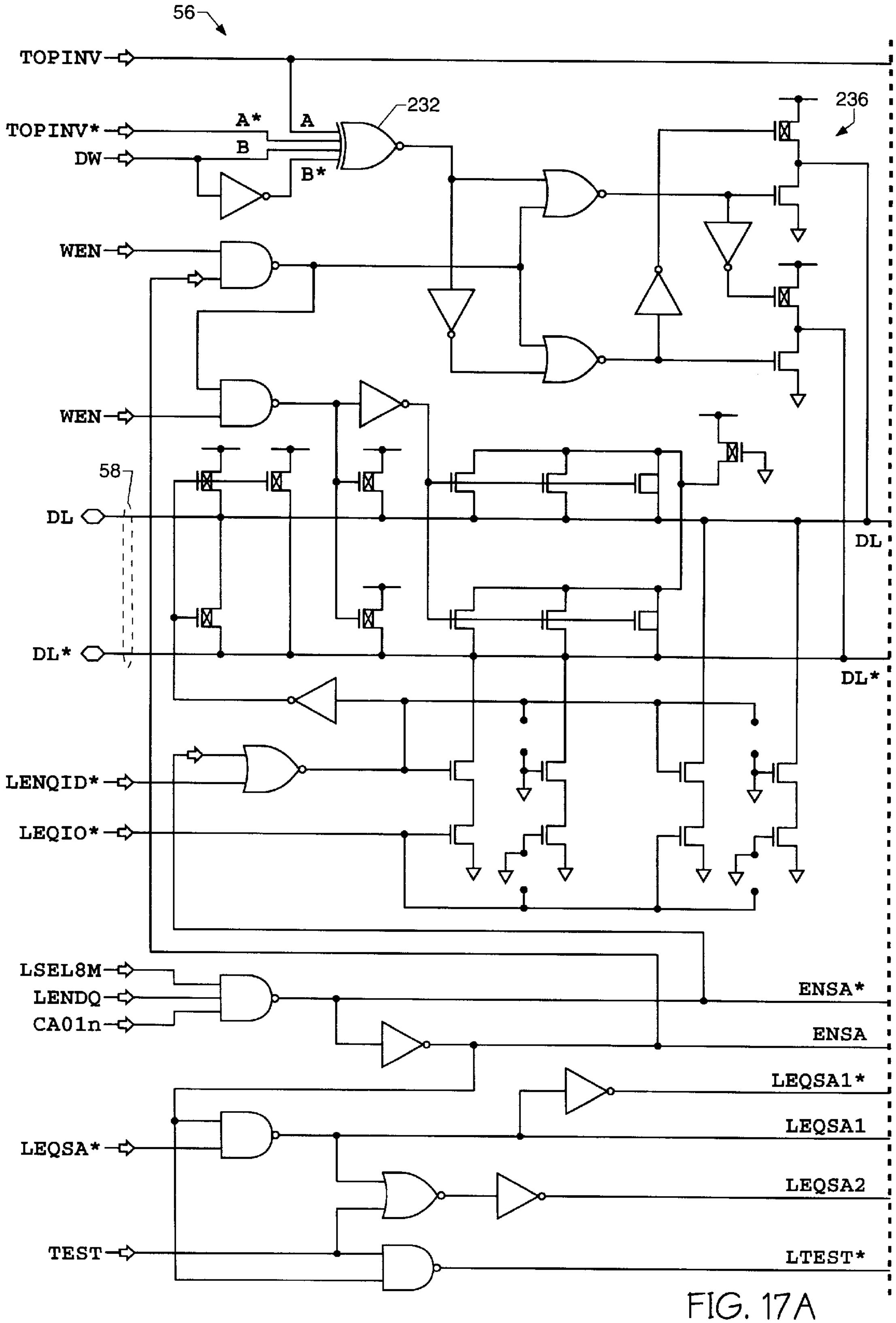
Figure 17B:
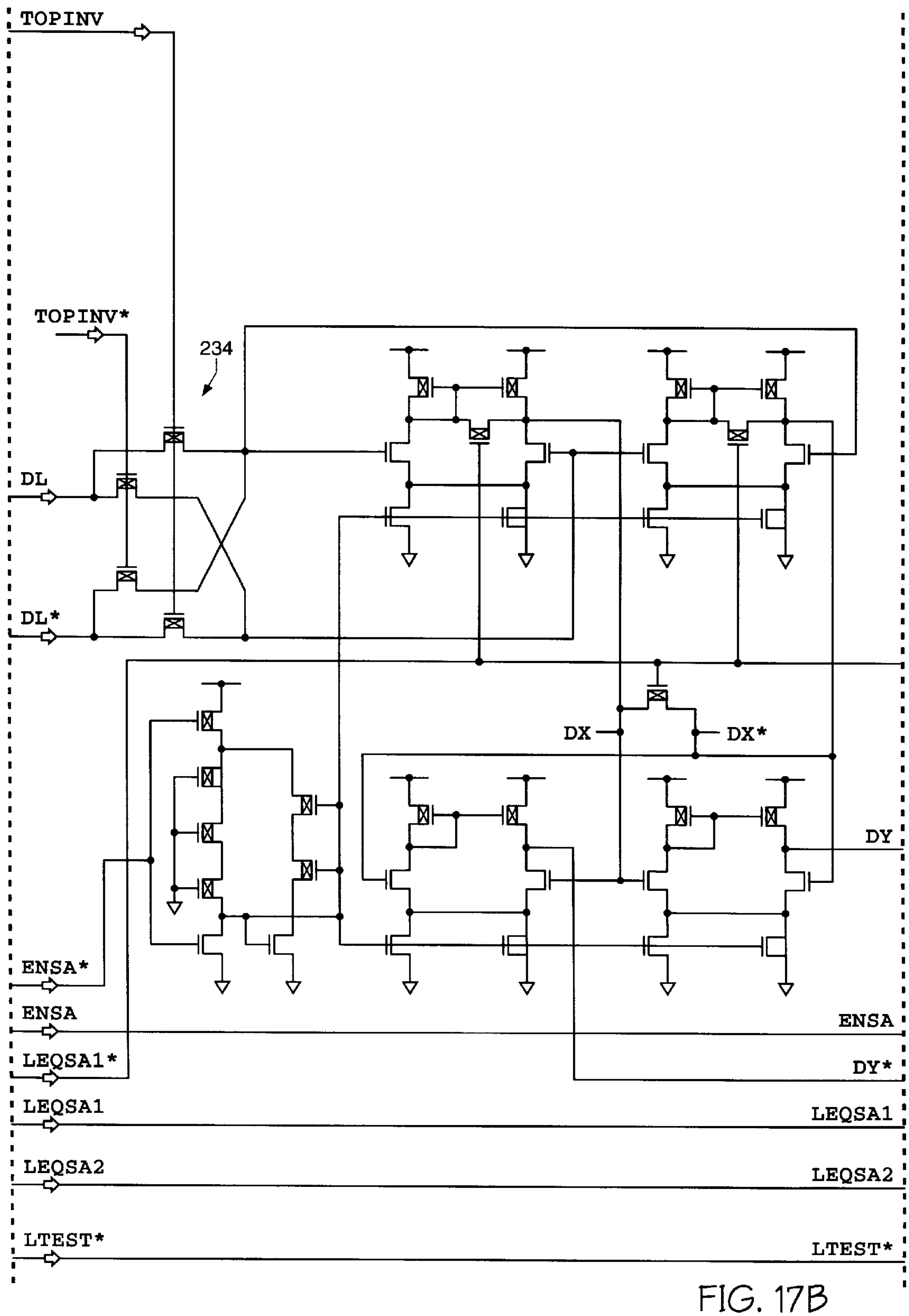
Figure 17C:
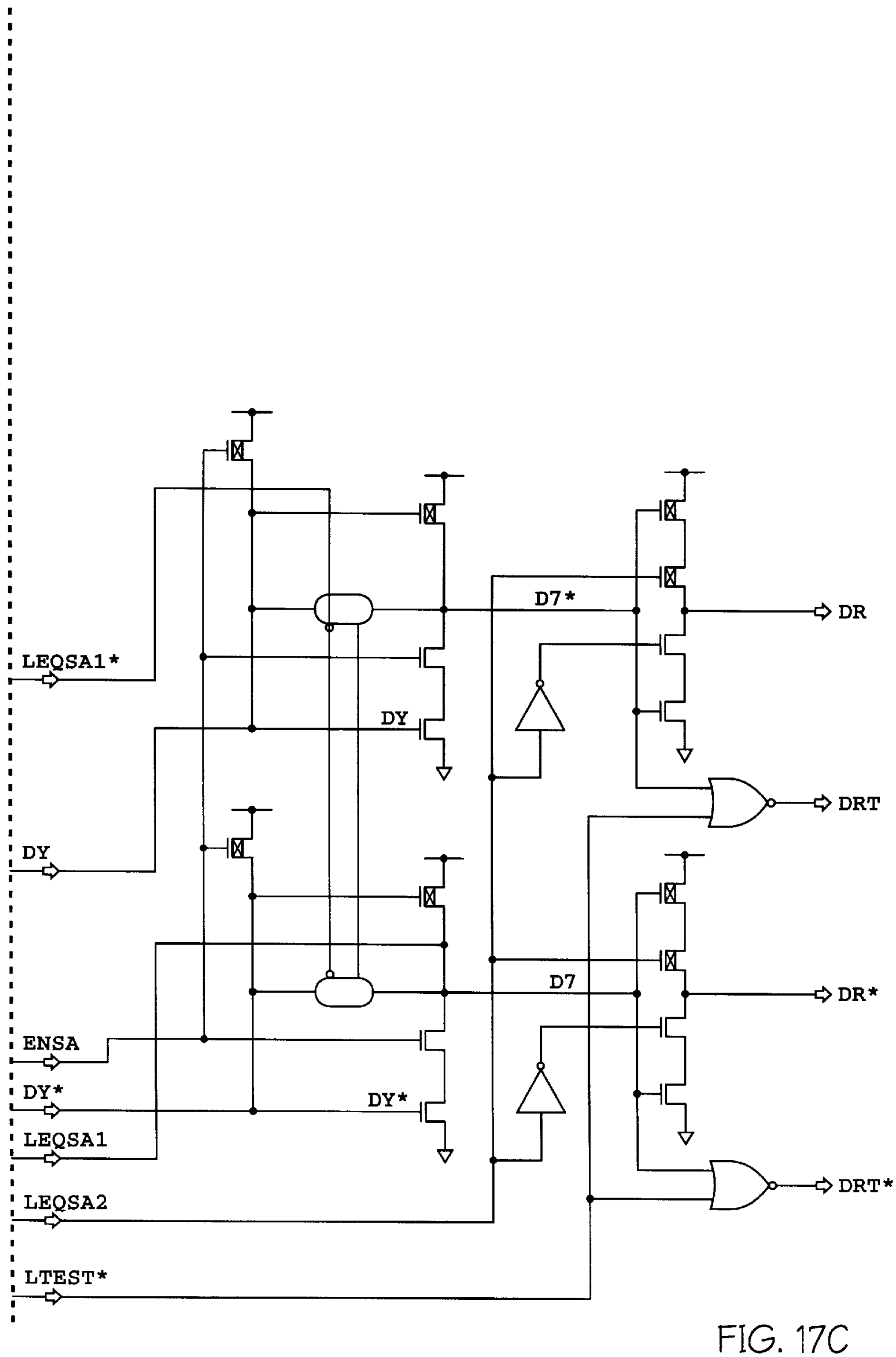

Referring again to FIG. 13, after being multiplexed onto secondary I/O lines 58, data signals from sense amplifiers 64/65 are conducted by secondary I/O lines 58 to the inputs of a DC sense amplifier 56 included within column block 30. (Note in FIG. 13 that each secondary I/O line 58 actually reflects a complementary pair of I/O lines, e.g., D1/D1*.) A typical DC sense amplifier 56 is shown in FIG. 17.

The data outputs DR and DR* from all sense amplifiers are tied together onto the primary data read (DRDR*) lines 50 and data write (DW/DW*) lines 52, shown in FIG. 13. Also shown in FIG. 13 are a plurality of data test compression comparators 73, 74, and 75. In accordance with a notable aspect of the invention, data test compression comparators are provided for simplifying the process of performing data integrity testing memory device 10. As noted above, it is common to test a memory device by writing a test pattern into the array, for example, writing a 1 into each element in the array, and then reading the data to determine data integrity.

As the number of memory cells 72 in device 100 is very large, it is desirable to make the process more efficient. To this end, data test compression comparators 73, 74, 75 are provided to enable a single bit on the data read (DR/DR*) lines 50 to reflect the presence of a 1 in a plurality of memory cells. This is accomplished as follows: From FIG. 13, it can be seen that the outputs from each DC sense amplifier 56 are tied to the primary data read lines 50, data write lines 52, and to the inputs of a data compression multiplexer 73, which functions as a 2:1 comparator. The outputs from each comparator 73, in turn, are coupled to the input of a data comparator 74, which also functions as a 2:1 comparator. Similarly, the outputs from each comparator 74 are coupled to the inputs of a comparator 75, which also performs a 2:1 comparator function. Finally, the outputs from comparators 75 are each tied to a separate one of the data read lines (DR/DR*) 50.

In a test mode in which is are written to each cell in the array, the arrangement of comparators 73, 74, and 75 results in a situation in which the outputs from four DC sense amplifiers 56 are reflected by the output from a single comparator 75. If all four DC sense amps 56 associated with a comparator 75 are reading 1s, the output from that comparator 75 will be a 1; if any of the four DC sense amps 56 is reading a zero, the output from that comparator 75 will also be zero. In this way, a 4:1 test data compression is achieved.

Figure 103:
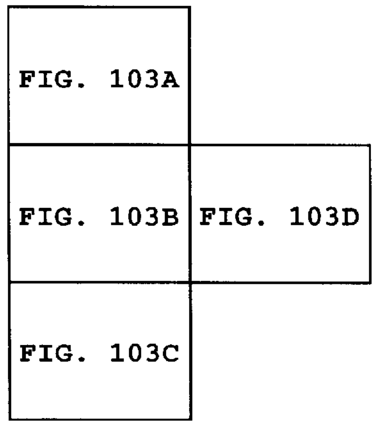
FIGS. 103A–103D are schematic/block diagram of DC sense amplifier (DCSA) and write line driver circuitry in the memory device of FIG. 2.
Figure 103A:
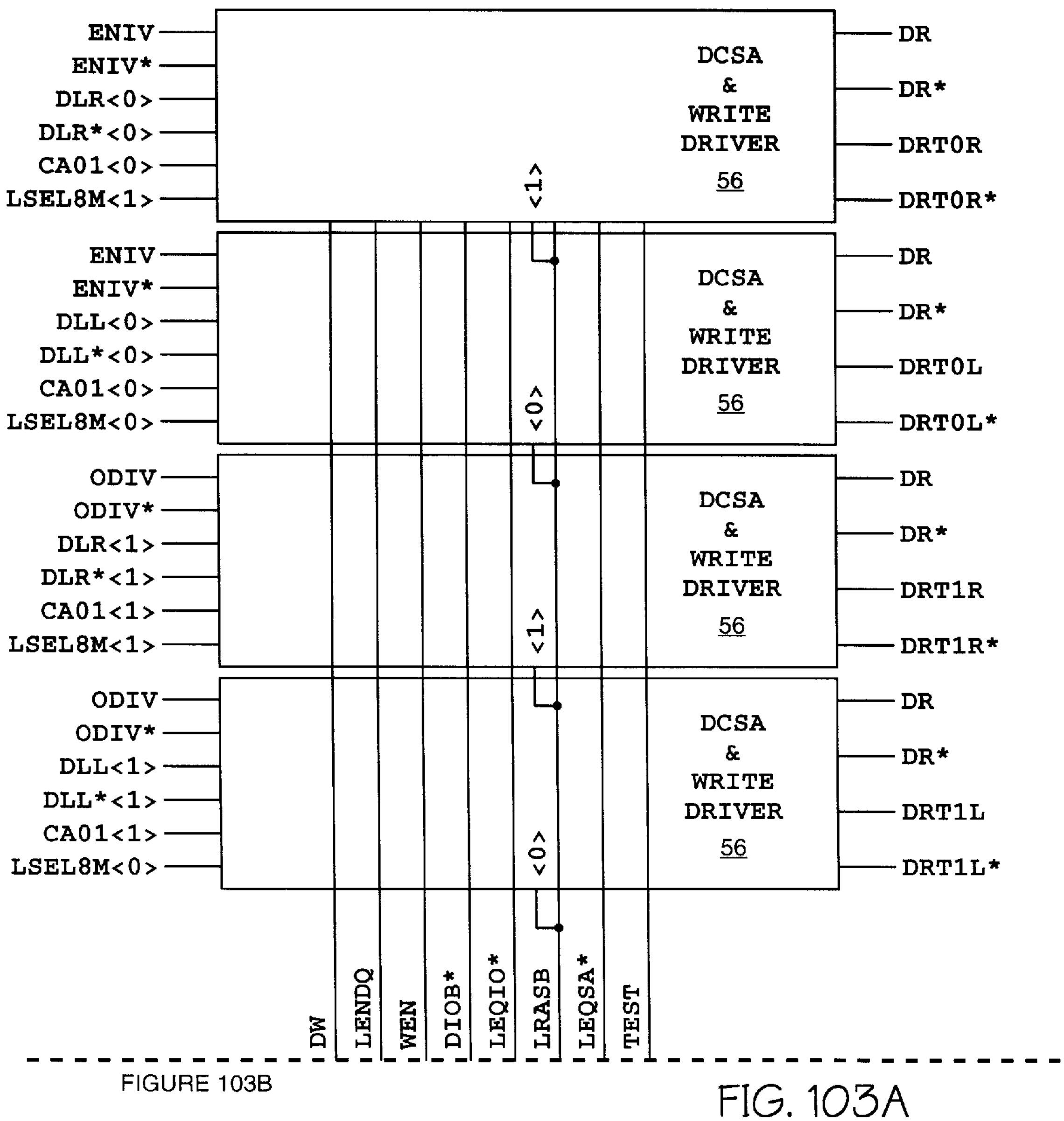
Figure 103B:
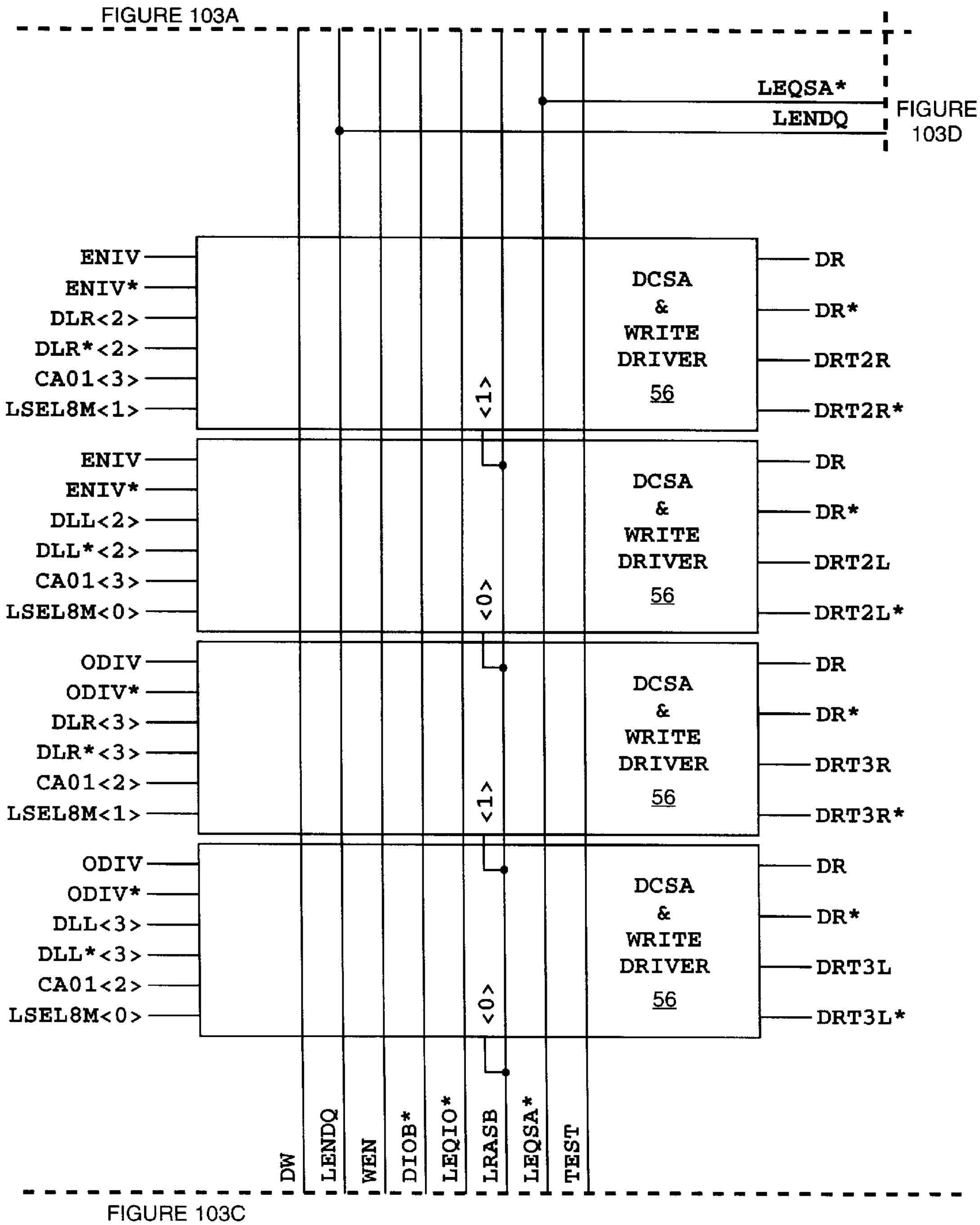
Figure 103C:
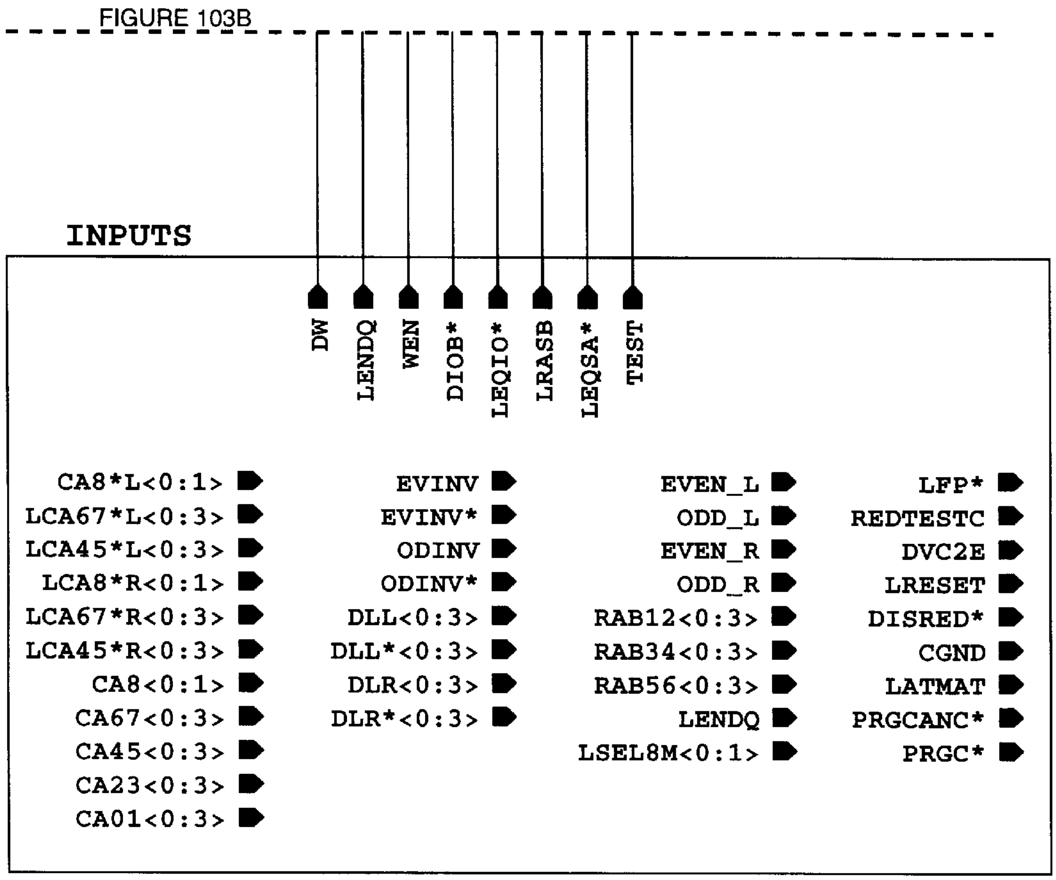
Figure 103D:
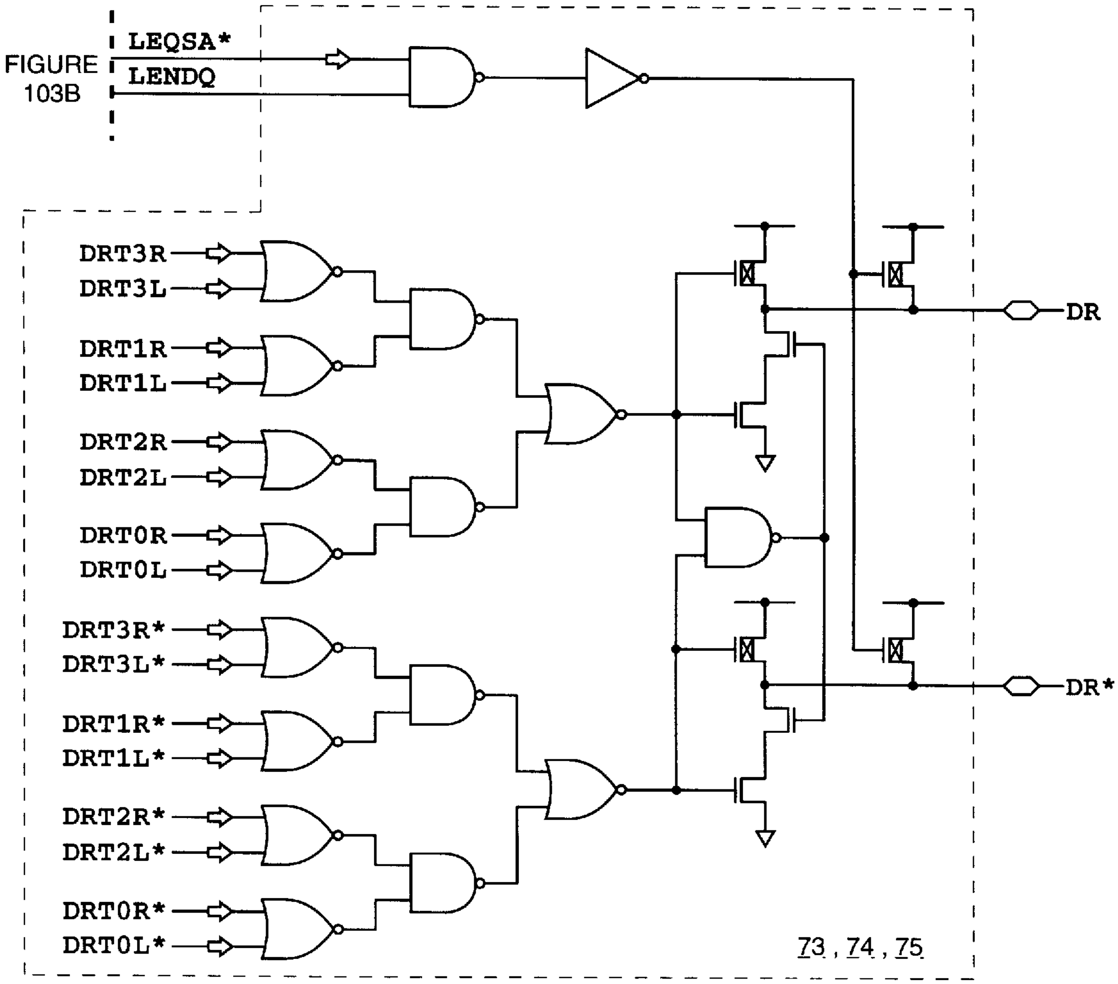
Figure 104:
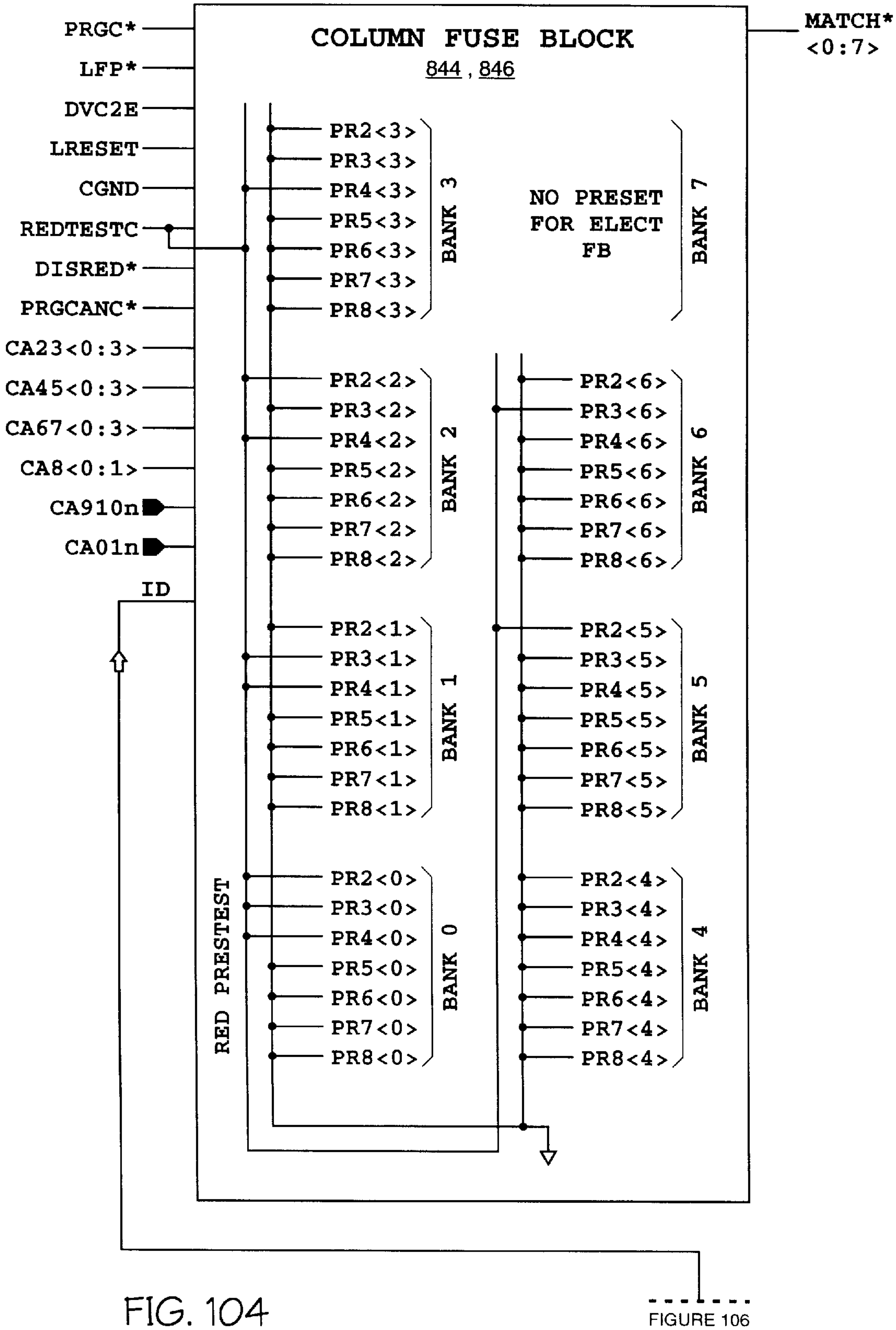
FIG. 104 is a schematic/block diagram of a column redundancy fuseblock circuit in the memory device of FIG. 2.
Figure 105:
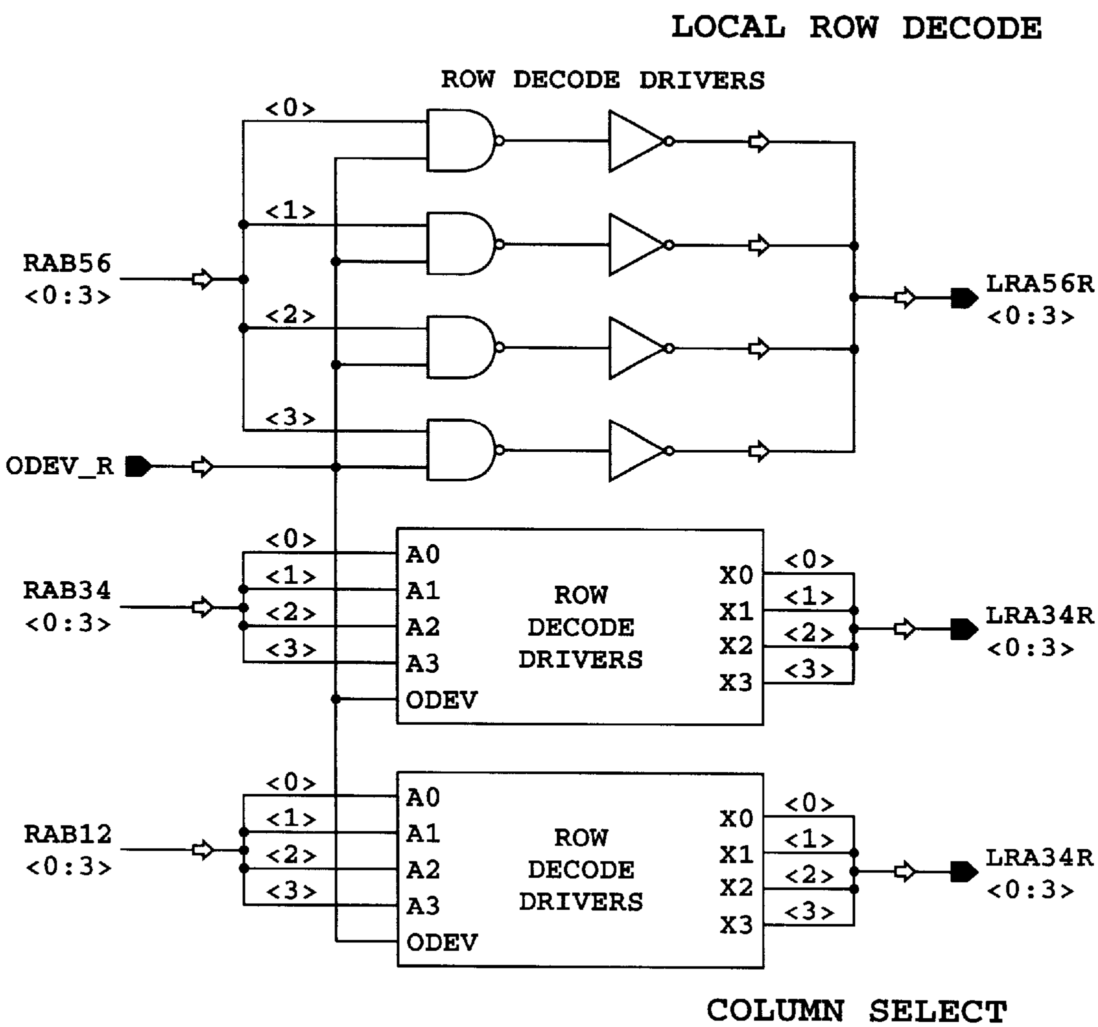
FIG. 105 is a schematic/block diagram of a local row decode driver circuit associated with column select circuitry in the memory device of FIG. 2.

A more detailed schematic of the interconnection of DC sense amplifiers and comparators 73, 74, and 75 is provided in FIG. 103, which shows that the network implementing comparators 73, 74, and 75 receives the DRTxR/DRTxR* and DRTxL/DRTxL* outputs from each DC sense amplifier 56 and compresses these outputs to a single DR/DR* output to achieve 4:1 test data compression.

Figure 18:
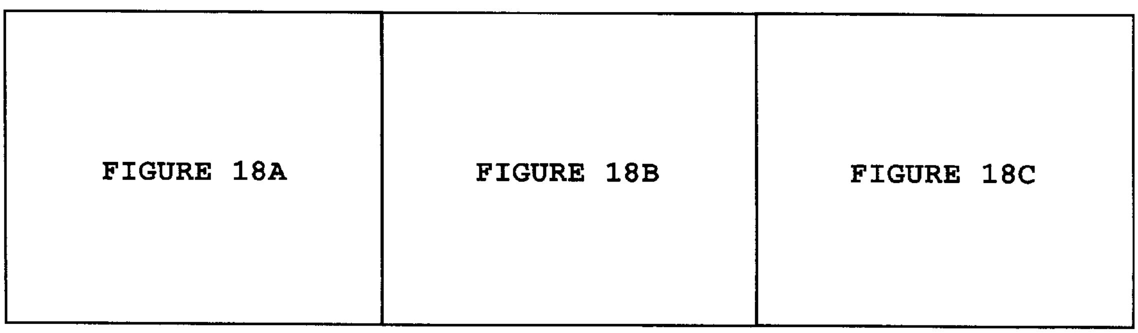
FIGS. 18A–18C are layout diagrams illustrating the data topology of the memory device of FIG. 2.
Figure 18A:
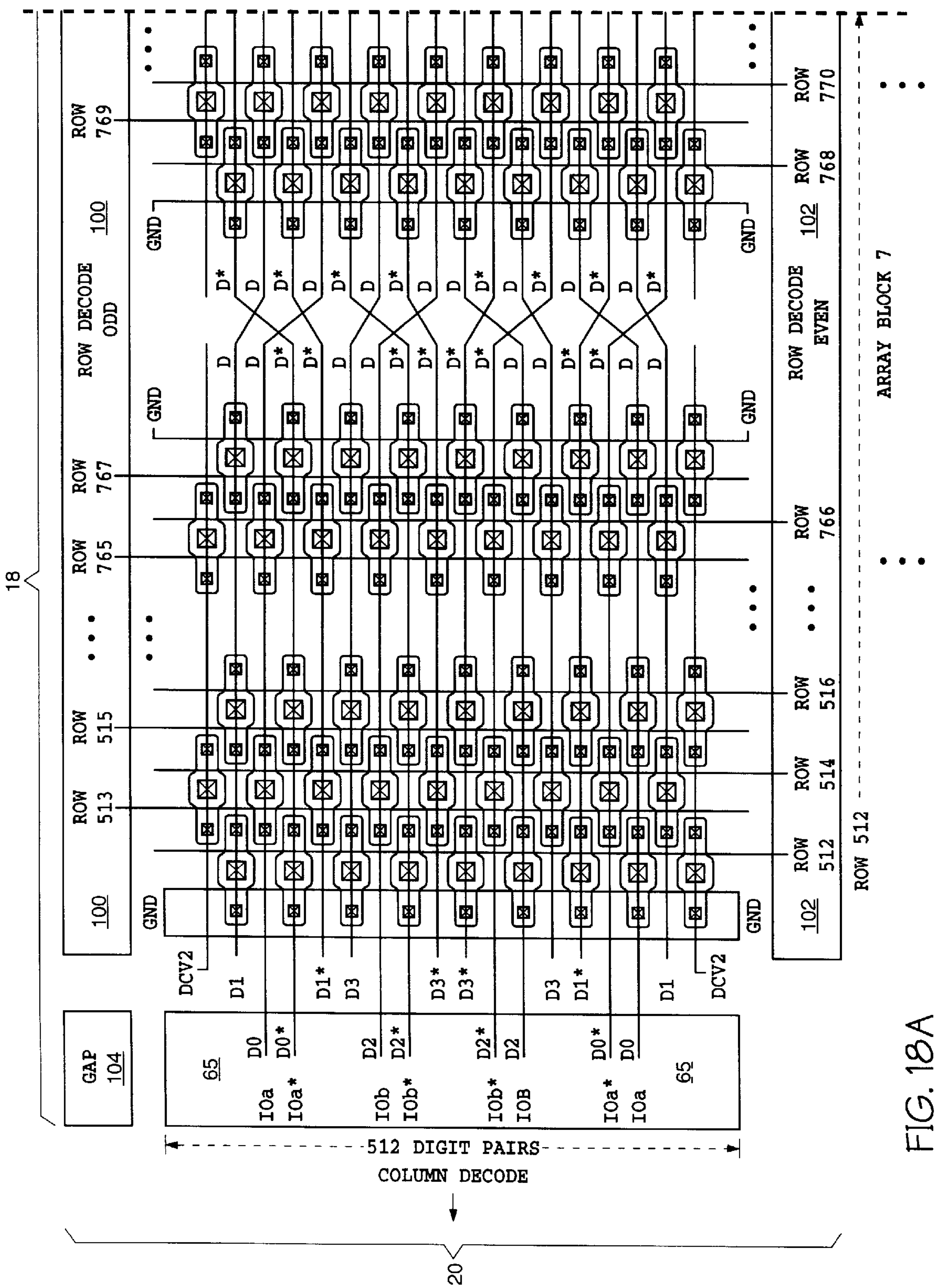
Figure 18B:
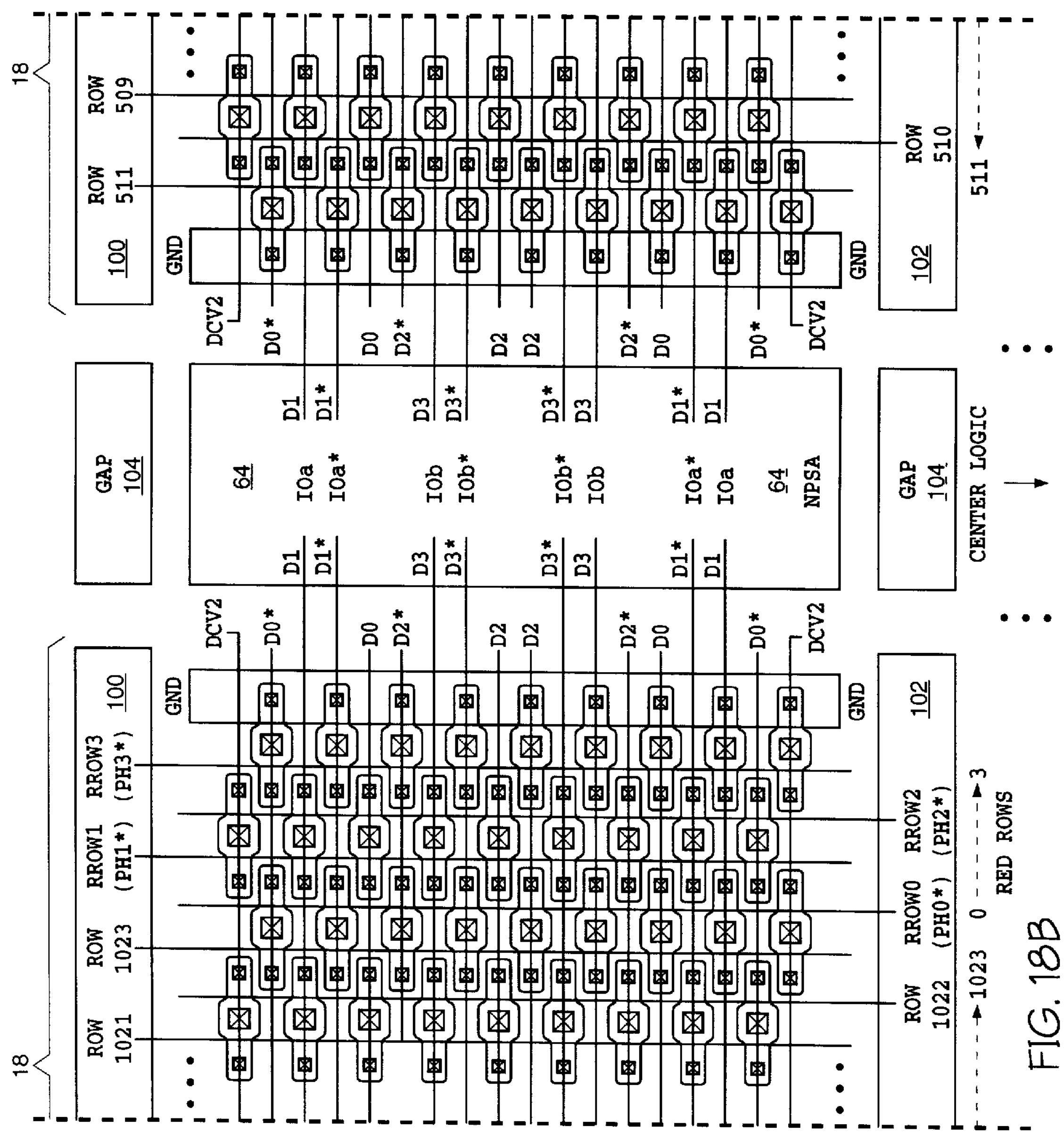
Figure 18C:
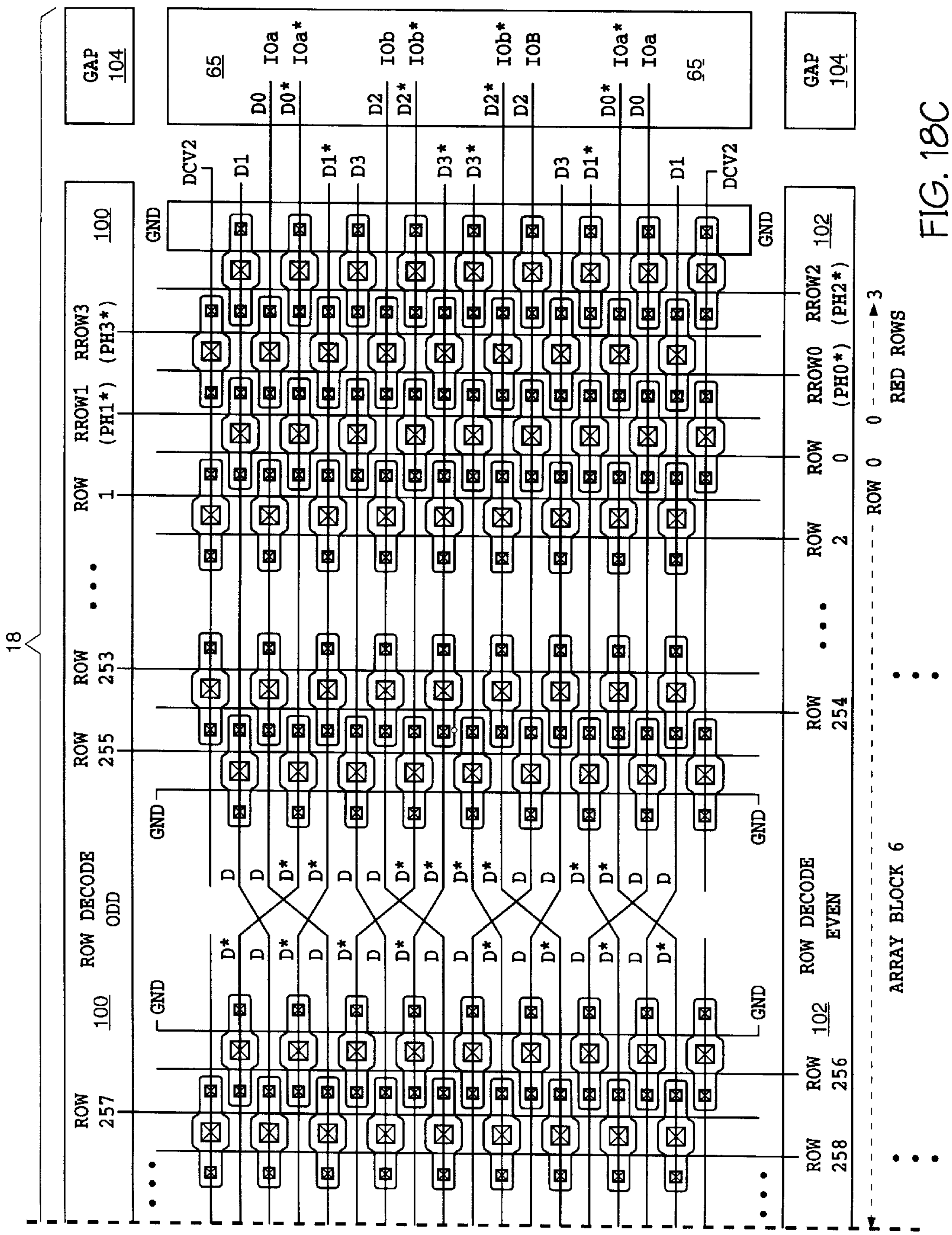

Returning to FIG. 14, and referring also to FIG. 18, it can be seen that row lines 70 for activating the access transistors for a row of memory cells as described above originate from even and odd local row decode circuits 100 and 102 which are disposed at the top and bottom, respectively, of each section 20 of each 8 Mbit PAB 14.

Note, especially with reference to FIG. 18, that because local row decoder circuits 100 and 102 are coextensive laterally with the array of cells 72 (i.e., circuits 100 and 102 do not extend over the areas occupied by sense amplifier circuits 64 or 65), gaps 104 are created between every pair of odd local row decoders 100 and every pair of even row decoders 102. (This was also noted above with reference to FIG. 14.)

The arrangement and layout of memory device 10, and especially the distributed or hierarchical row decoder arrangement described above with reference to 5, 14, 18, and 19, such that the plurality of gaps 104 are present at various locations throughout the memory array, is a notable aspect of the present invention. The areas defined by these gaps 104 are advantageously available for other circuitry, including the aforementioned multiplexers 60 (see FIG. 14) which facilitate the hierarchical or distributed data path arrangement in accordance with the present invention.

The circuitry that is disposed in the gaps 104 which exist as a result of the hierarchical row decoding arrangement in accordance with the present invention is shown in greater detail in FIGS. 160 through 163. Notably, gaps 104 serve as a convenient location of multiplexers 60 (see FIG. 14) which operate to selectively couple the outputs of primary sense amplifiers 64 or 65 to local I/O lines 58. A typical one of multiplexers 60 is shown in schematic form in FIG. 162.

As noted above with reference to FIG. 14, in addition to performing the aforementioned multiplexing function, multiplexers 60 in FIG. 162 also function to bias the sense amplifier output lines 62 (also referred to as "local I/O lines") to the DVC2 (½ $V_{cc}$) voltage supply when the columns to which they correspond are not selected.

Referring to FIG. 162, the local enable N-type sense amplifier input signal LENSA, which is generated by the array driver circuitry of FIGS. 158 and 159, functions both to generate the active-low RNL* signal and to turn on local I/O multiplexers 60. As noted above with reference to FIG. 15, the arrangement of shared column select lines in the architecture in accordance with the present invention enables signals such as RNL* to have relatively large currents.

Also advantageously disposed in gaps 104 are drivers 500 and 502 for P-type sense amplifiers 80, a typical driver 500 being shown in schematic form in FIG. 160 and a typical driver 502 being shown in schematic form in FIG. 161. Drivers 500 and 502 function to generate the ACTL and ACTR signals, respectively, (see FIG. 16) which activate P-type sense amplifiers 80L and 80R, respectively.

The presence of the above-described circuitry of FIGS. 160 through 163 within gaps 104 is believed to be a notable and advantageous aspect of the present invention which arises as a result of the hierarchical or distributed manner in which row decoding is accomplished. According to the hierarchical or distributed row decoding scheme employed by memory device 10 in accordance with the presently disclosed embodiment of the invention, local row decode circuits 100 and 102 function to receive partially decoded ("predecoded") row addresses provided from row address predecoder 28 included among the peripheral logic circuitry 22 (see FIGS. 5 and 9). In particular, the most significant bit (MSB) of a given row address is used to select each half of each 8 Mbit PAB 14 of the array. Row address bit 12 (RA_12) is then used to select four of the 8 Mbit PABs 14.

Figure 19:
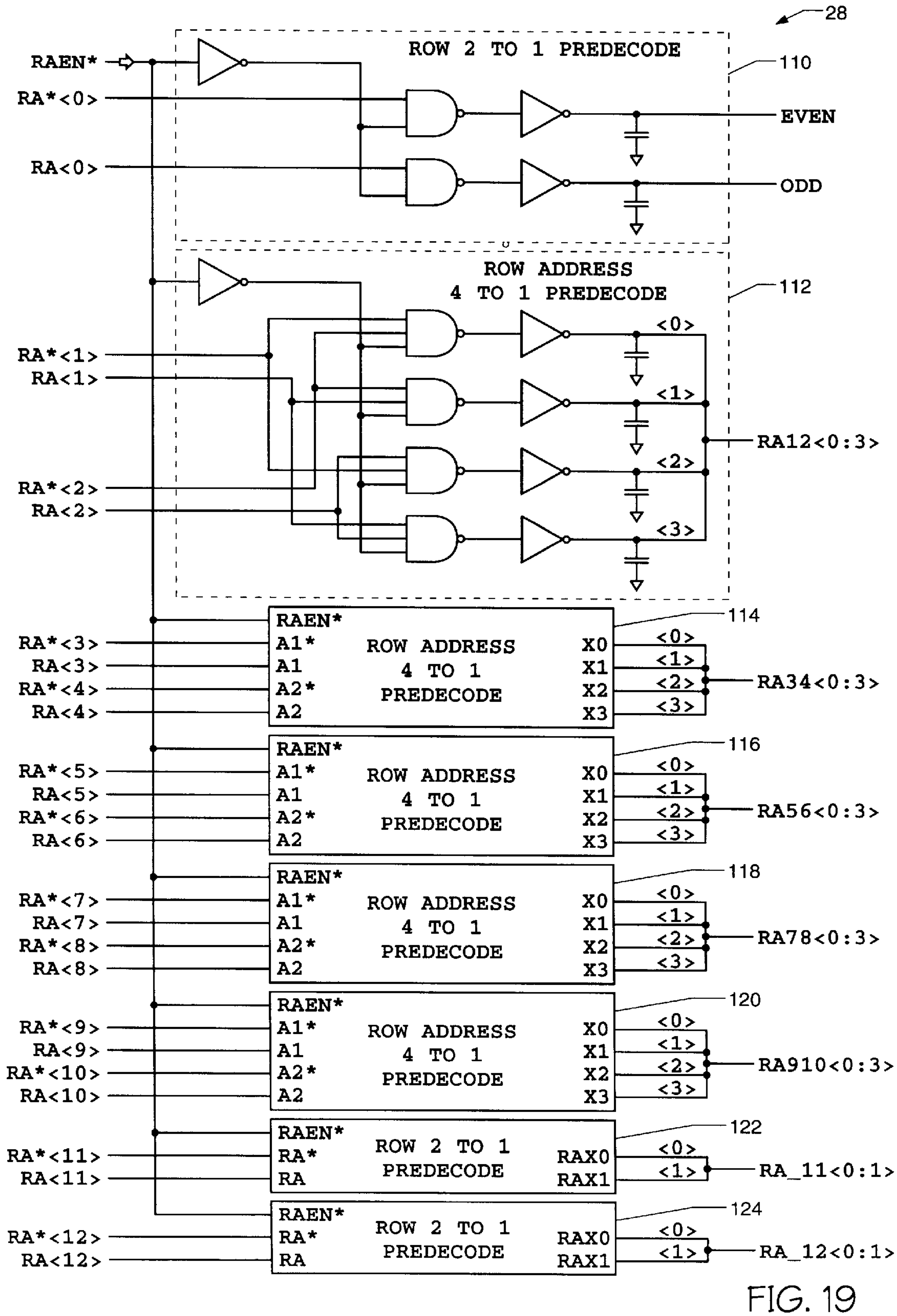
FIG. 19 is a schematic diagram of a row address predecoder from the memory device of FIG. 2.

A schematic diagram of row predecoder circuitry 28 is provided in FIG. 19. As shown on the left side of FIG. 19, row predecoder circuitry 28 receives row address bits RA0 through RA12 (and their complements RA0* and RA12*) as inputs, and derives a plurality of partially decoded signal sets, RA12<0:3>, RA34<0:3>, and so on, as outputs. (As previously noted, the nomenclature RAxy<0:3> refers to a set of four signal lines RAxy<0>, RAxy<1>, RAxy<2>, and RAxy<3>, one of which is asserted depending upon the binary value of the two-bit binary number comprising the xth and yth bits of a given row address. Thus, for example, if bits x and y of a given row address are 1 and 0, respectively, making the corresponding two bit binary value 01—decimal 1—then the signal RAxy<0> would be deasserted, RAxy<1> would be asserted, and RAxy<2> and RAxy<3> would be deasserted; that is RAxy<0:3> would be [0 0 1 0]. If bits RAx and RAy of a given row address were 1 and 1, respectively, then RAxy<0:3> would be [1 0 0 0].)

In predecoder circuit 28 of FIG. 19, a two-to-one predecode circuit 110 derives EVEN and ODD signals from the least significant bit RA0 (and its complement RA0*). A four-to-one predecoder 112 derives the four signals RA12<0:3> from the row address bits RA<1> and RA<2> (and their complements RA*<1> and RA*<2>). Substantially identical four-to-one predecoders 114, 116, 118, and 120 derive respective groups of four signals RA34<0:3>, RA56<0:3>, RA78<0:3> and RA910<0:3>. Two-to-one predecoder circuits 122 and 124, which are each substantially identically to two-to-one predecoder 110, derive groups of two signals RA_11<0:1> and RA_12<0:1>, respectively, from the row address bits RA<9>–RA<10>, and RA<11>–RA<12>, respectively.

Figure 20:
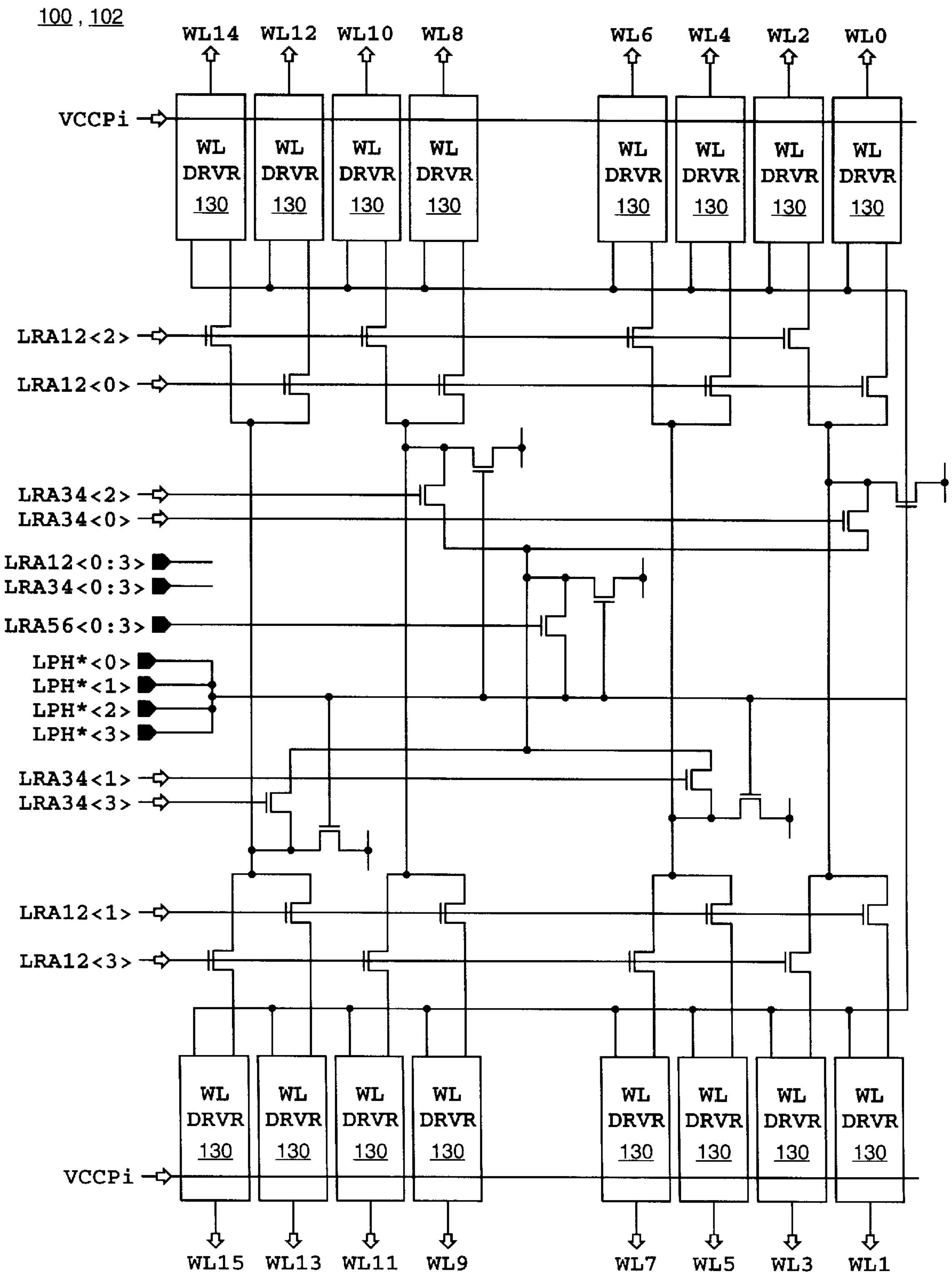
FIG. 20 is a schematic diagram of a local row decoder from the memory device of FIG. 2.

FIG. 20 illustrates in schematic form the construction of a typical local row decoder circuit 100 and 102. Local row decoder circuits 100 and 102 each include word line driver circuits 130, a typical one of which is shown in shown in FIG. 21. Local row decoder circuits 100 and 102 each function to derive signals WL0 through WL15 from the predecoded row address signals derived by predecoder circuit 28, as discussed above with reference to FIG. 19.

One notable advantage of the hierarchical or distributed row decoding scheme in accordance with the present invention relates to the minimization of metal structures on the semiconductor die, a factor which was discussed in the Background of the Invention section above. In prior art DRAM layouts, row decoding is often performed in one centralized location, and then the decoded row address signals fanned-out to all sections of the array. By contrast, with the row decoding scheme of the present invention, local row decoders are distributed throughout the array, reducing the number of metal layers needed to form row address lines, and thereby reducing the complexity and cost of the chip, and improving yields.

Having provided a broad overview of the logical layout and organization of DRAM 10 in accordance with the presently disclosed embodiment of the invention, the description can now be directed to certain details of implementation.

BONDING AND FUSE OPTIONS

As alluded to above, DRAM 10 in accordance with the presently disclosed embodiment of the invention is programmable by means of various laser fuses, electrical fuses, and metal options, such that, for example, it may be operated either as a ×1, ×4, ×8, or ×16 device, various redundant rows and columns can be substituted for ones found to be defective, portions of it may be disabled, and so on. Laser fuse options are selectable by blowing on-chip fuses with a laser beam during processing of the device prior to its packaging. Electrical fuses are "programmable" by blowing on-chip fuses using high voltages applied to certain input terminals to the chip even after packaging thereof. Metal options are selected during deposition of metal layers during fabrication of the chip, in accordance with common practice in the art.

Various circuits associated with the laser fuse, electrical fuse, and metal bonding options of DRAM 10 are illustrated in FIGS. 22 through 32.

The table of FIG. 22 indicates that there are several fuse options available for configuring device 10 in accordance with the presently disclosed embodiment of the invention. These include 4K and 8K refresh options, to be described below in greater detail; a fast option, which when enabled causes device 10 to increase its operational rate, a fast page or static column option; row and column redundancy options and a data topology option.

In accordance with a notable aspect of the invention, some fuse options supported by device 10 are programmable both via laser and via electrical programming, meaning that these options can be selected both before and after packaging of the semiconductor die.

Figure 23:
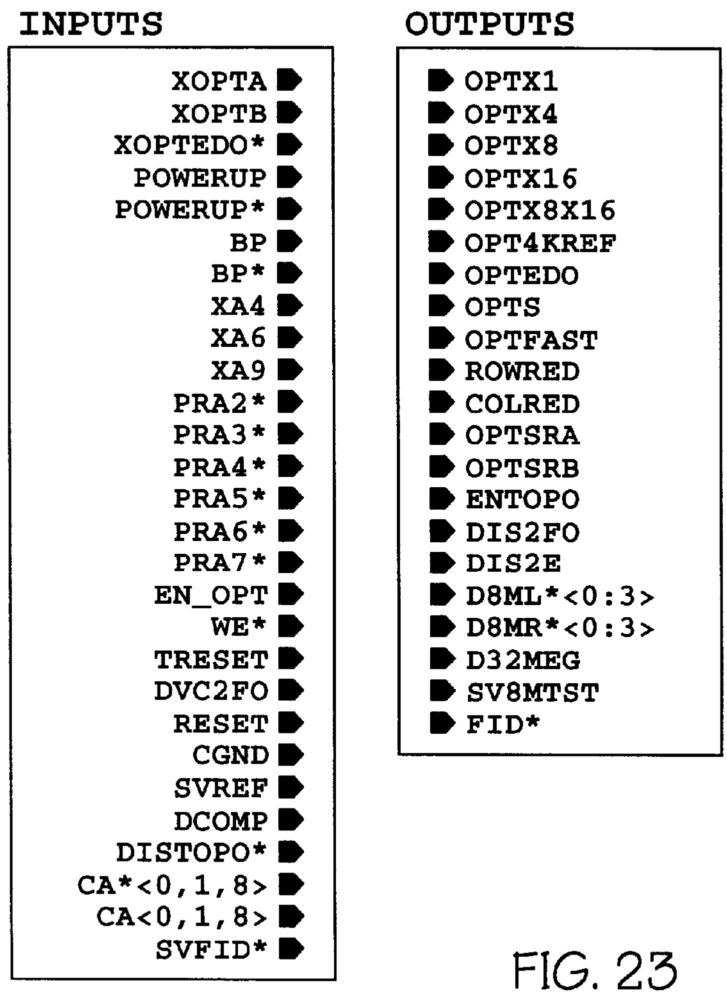
FIG. 23 depicts the inputs and outputs to bonding and fuse option circuitry for the memory device of FIG. 2.

FIG. 23 lists the signal names of input and output signals to the fuse option circuitry of device 10.

32-MEGABIT OPTION LOGIC

As noted in the Background of the Invention section of this disclosure, certain defects in a given embodiment of the an integrated circuit memory device may be such that they cannot be remedied with the redundant circuitry that might be incorporated into the device. In such cases, it may be desirable to provide a mechanism whereby some section or sections of the memory device are disabled, such that the most can be made of the non-defective portions of the device. (Merely "ignoring" the defective areas is often not an acceptable solution, since, for example, this does not cause the defective area to stop draining current, and the defect itself may give rise to unacceptably elevated levels of current drain.)

To address this problem, DRAM 10 in accordance with the presently disclosed embodiment of the invention includes circuitry for selectively disabling and powering-down individual 8 Mbit PABs 14 of the device, thereby transforming the device into a 32 Mbit DRAM having an industry standard pinout. This is believed to be particularly advantageous, as it reduces the number of parts which must be scrapped by the manufacturer due to defects detected during testing of the part.

Figure 24:
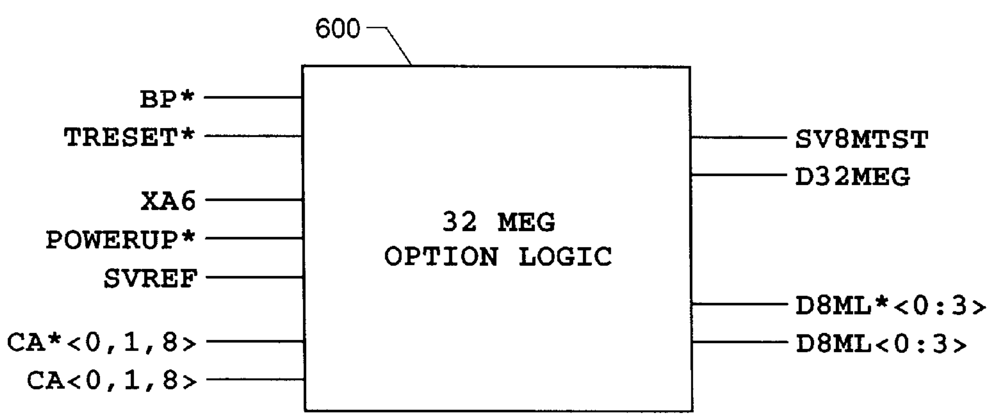
FIG. 24 is a block diagram of the 32 MEG option circuitry for transforming the memory device of FIG. 2 into a 32 Mbit device.

The circuitry associated with this 32 Mbit option of DRAM 10 is shown in FIGS. 24 and 33 through 36. FIG. 24 is a block diagram of 32 Meg option logic circuitry 600 of device 10, which circuitry is shown in greater detail in FIGS. 35 and 36. 32 Meg option circuitry 600 allows selected 8 Mbit PABs 14 of device 10 to be disabled in the event that defects not reparable through column and row redundancy are found during pre-packaging processing, resulting in a 32 Mbit part having an industry-standard pinout. This feature advantageously reduces the number of parts which must be scrapped entirely as a result of detected defects. In the presently preferred embodiment of the invention, the 32 Meg option is a laser option only, meaning it cannot be selected post-packaging, although it could be implemented as both a laser and electrical option.

Figure 36:
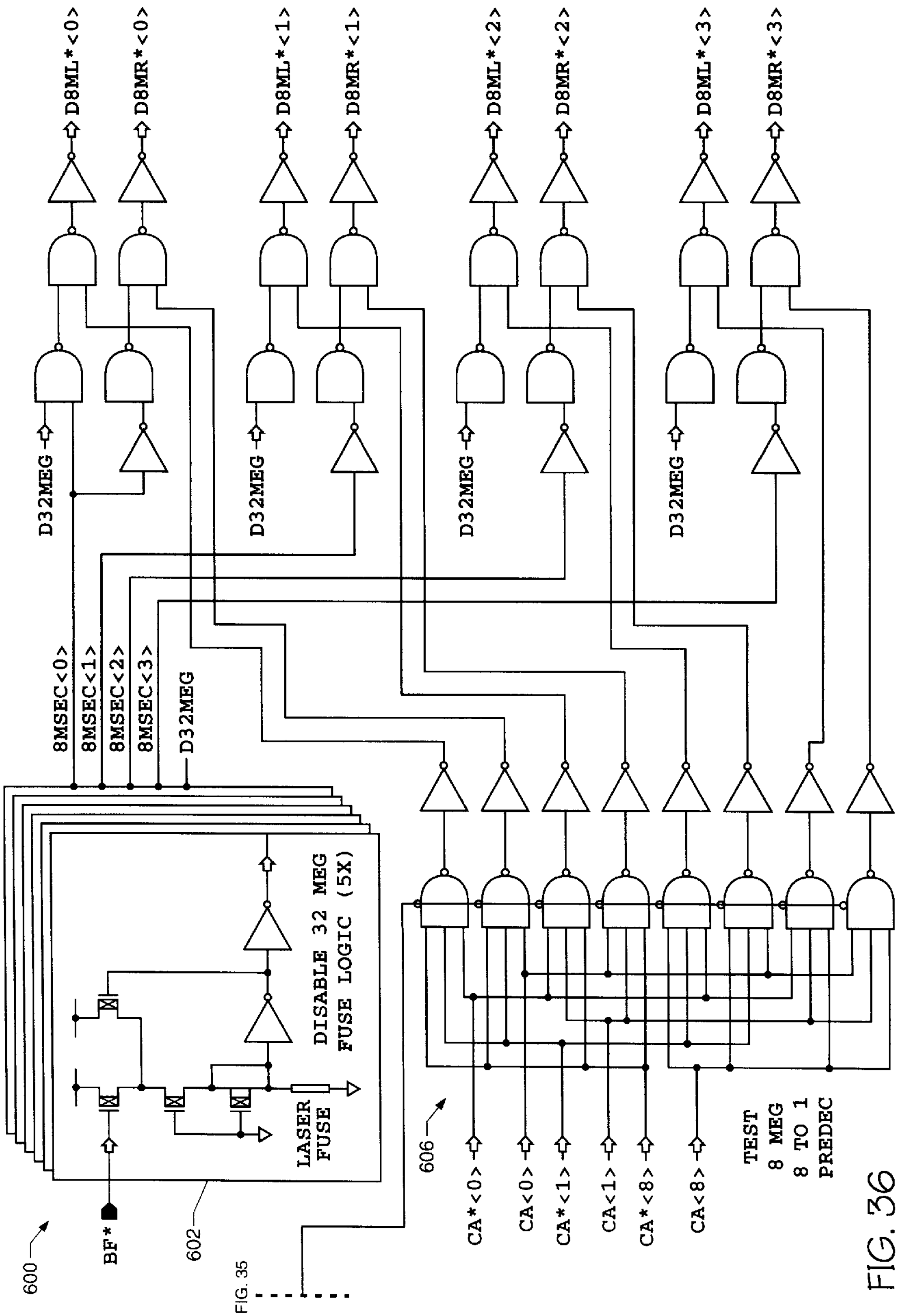
FIG. 36 is a schematic diagram of circuitry implementing the 32 MEG laser fuse option for the memory device of FIG. 2.
Figure 37:
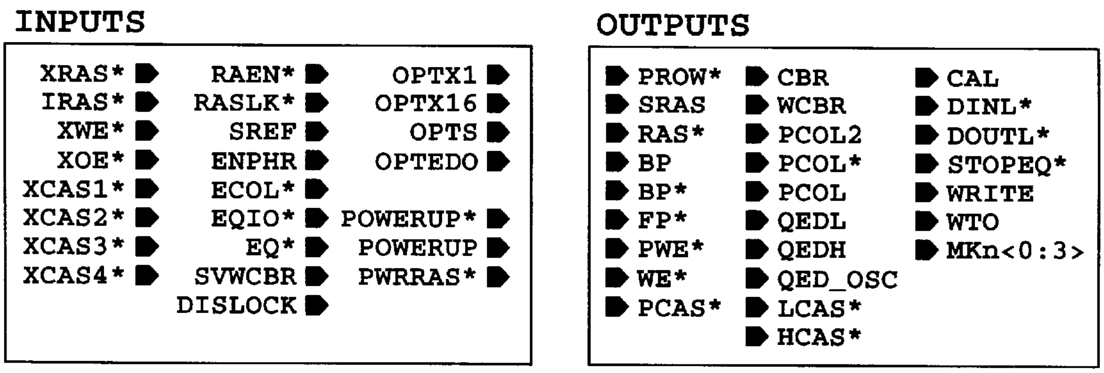
FIG. 37 identifies the inputs and outputs to control logic circuitry in the memory device of FIG. 2.
Figure 38:
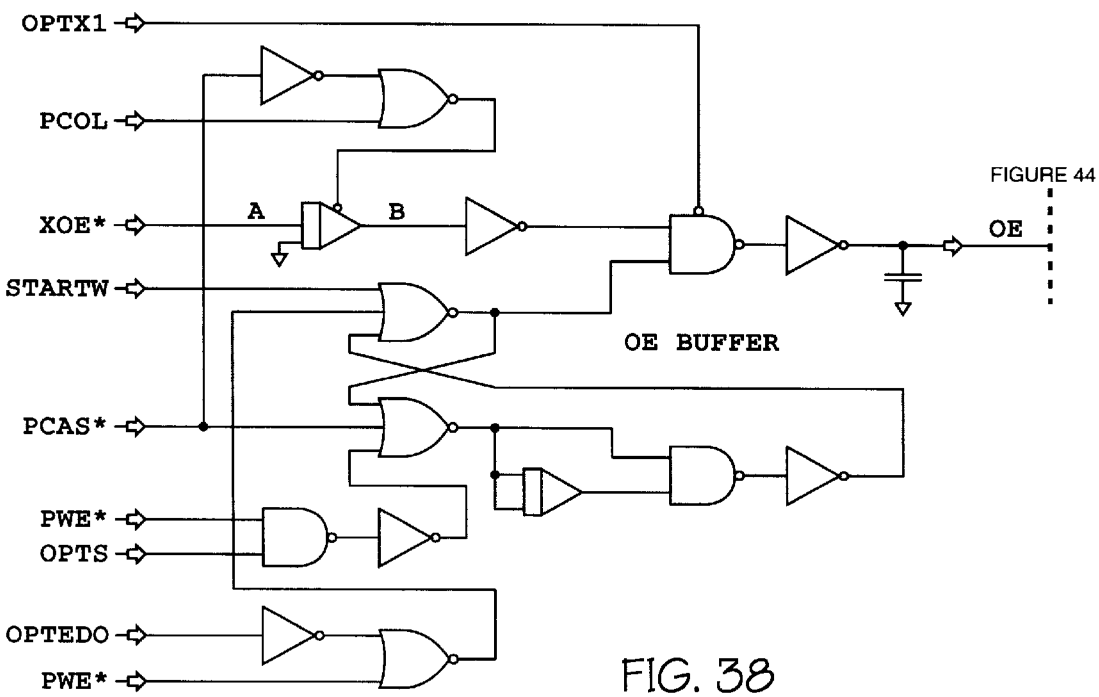
FIG. 38 is a schematic diagram of an output enable (OE) buffer in the memory device of FIG. 2.
Figure 39:
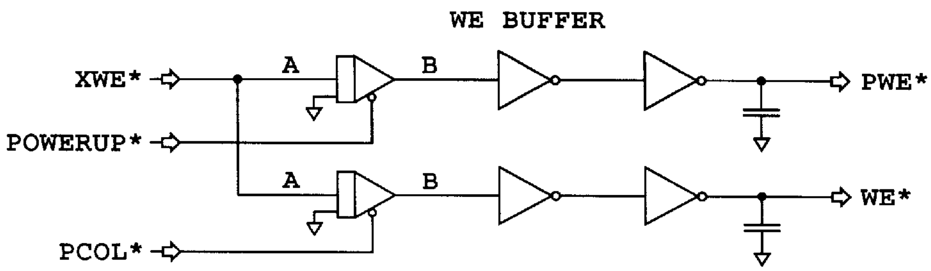
FIG. 39 is a schematic diagram of a write enable (WE) signal generator circuit in the memory device of FIG. 2.
Figure 40:
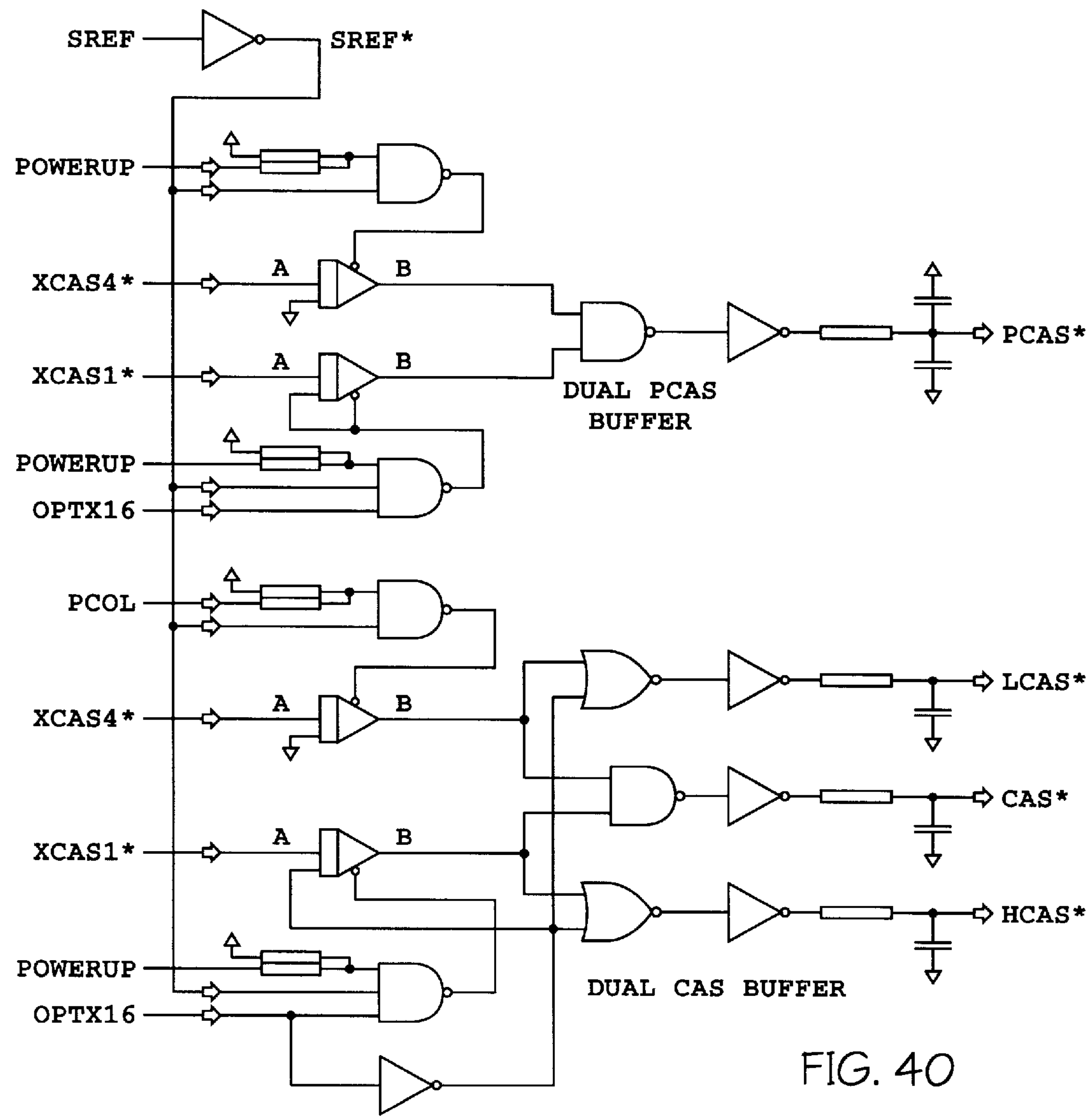
FIG. 40 is a schematic diagram of a column address strobe (CAS) signal generating circuit in the memory device of FIG. 2.
Figure 41:
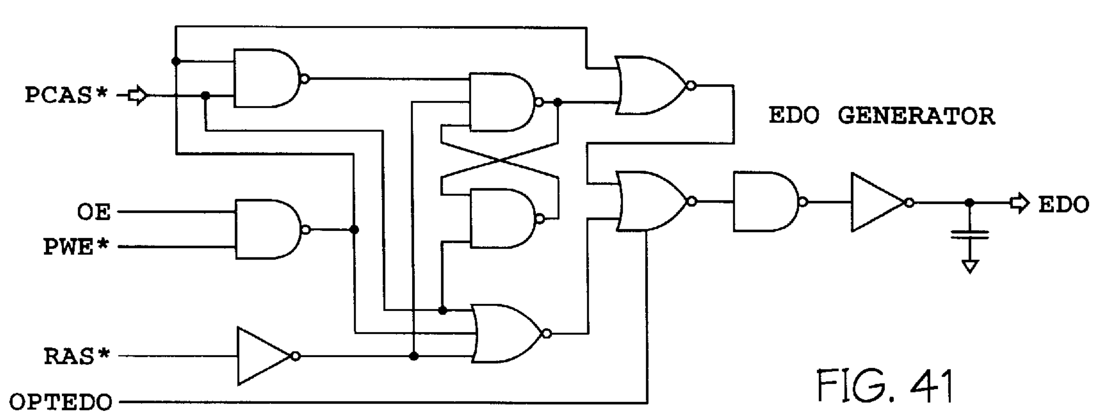
FIG. 41 is a schematic diagram of an extended data out (EDO) signal generating circuit in the memory device of FIG. 2.
Figure 42:
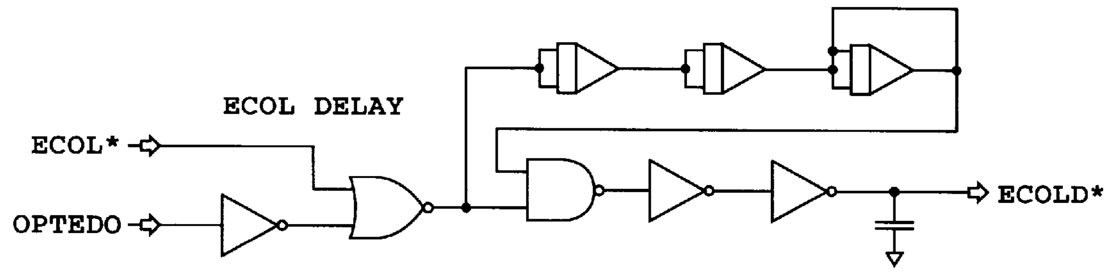
FIG. 42 is a schematic diagram of an extended column (ECOL) delay signal generating circuit in the memory device of FIG. 2.

Referring to FIG. 36, a laser fuse bank 602 includes five laser fuses, designated D32 MEG and 8 MSEC<0> through 8 MSEC<3>. The D32 MEG fuse enables the 32 Meg option, such that one PAB 14 (either PAB 14L or PAB 14R) in each quadrant 12 of device 10 will then be disabled, effectively halving the capacity of device 10. The state (blown or not blown) of the 8 MSEC<0> through 8 MSEC<3> fuses determines which PAB 14 (either PAB 14L or PAB 14R) in each quadrant 12 is to be disabled.

Figure 35:
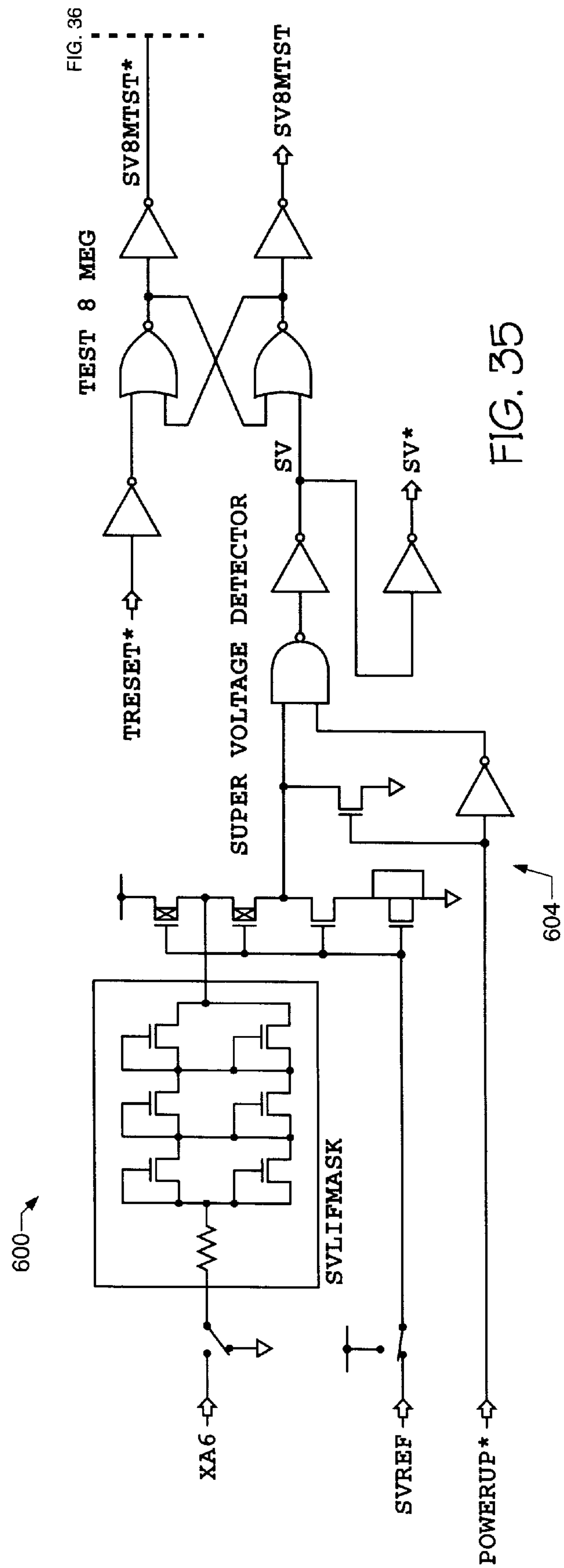
FIG. 35 is a schematic diagram of a supervoltage detector and latch circuit utilized in connection with the 32 MEG option of the memory device of FIG. 2.

Referring to FIG. 35, a supervoltage detect circuit is provided to detect a "supervoltage" i.e., 10-V or so, voltage applied to address pin 6 upon power-up of the device. When such a supervoltage is detected, supervoltage detect circuit 604 asserts (low) a SV8MTST* signal which is applied to the input of a Test 8 Meg 8:1 Predecode circuit 606, shown in FIG. 606. When SV8MSTST* is asserted, this causes all 8 Mbit PABs 14 in device 10 to be powered down (i.e., decoupled from voltage supplies) except the one PAB 14 identified on address pins 0, 1, and 8. All PABs 14 will be subsequently re-powered upon occurrence of a CAS-before-RAS cycle, or a RAS-only cycle.

The ability to shut down all but one PAB 14 in device 10 using the SV8MTST* signal as described above is advantageous in that it facilitates the determination of which PABs 14 are defective and causing undue current drain. Once detected, the faulty PAB can be permanently disabled using the fuse options in fusebank 602.

FUSE IDENTIFICATION (FUSEID) OPTION

Figure 28:
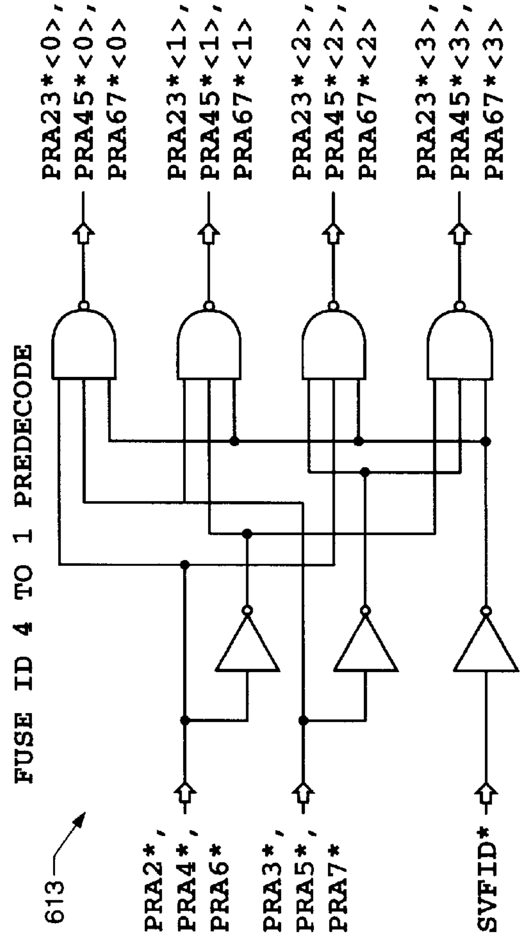
FIG. 28 is a schematic diagram of laser fuse address predecoding circuitry in the memory device of FIG. 2.

Device 10 is provided with a fuse identification (FUSEID) option for enabling 64 bits of information to be encoded into each part during pre-packaging processing. Information such as a serial number, lot or batch identification codes, dates, model numbers, and other information unique to each part can be encoded into the part and subsequently read out, for example, upon failure of the device. Like the 32 Meg option, the FUSEID option is a laser fuse option only in the presently preferred embodiment, although it could also be implemented as a laser and electrical option. Circuitry associated with the laser FUSEID option is shown in FIGS. 28 and 29.

Figure 29A:
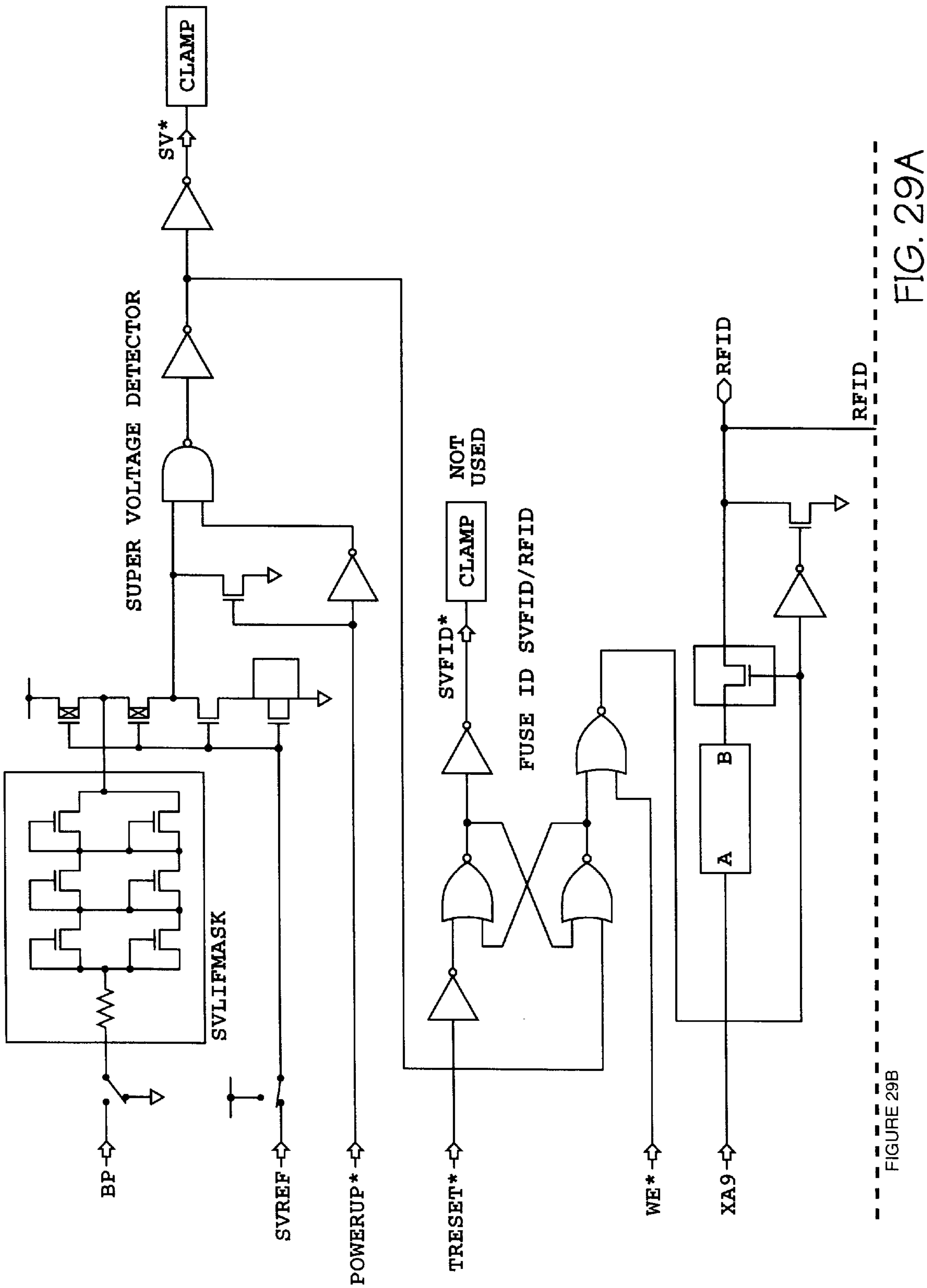
FIGS. 29A–29B are schematic diagram of laser fuse ID circuitry associated with a 64-bit identification word option in the memory device of FIG. 2.
Figure 29B:
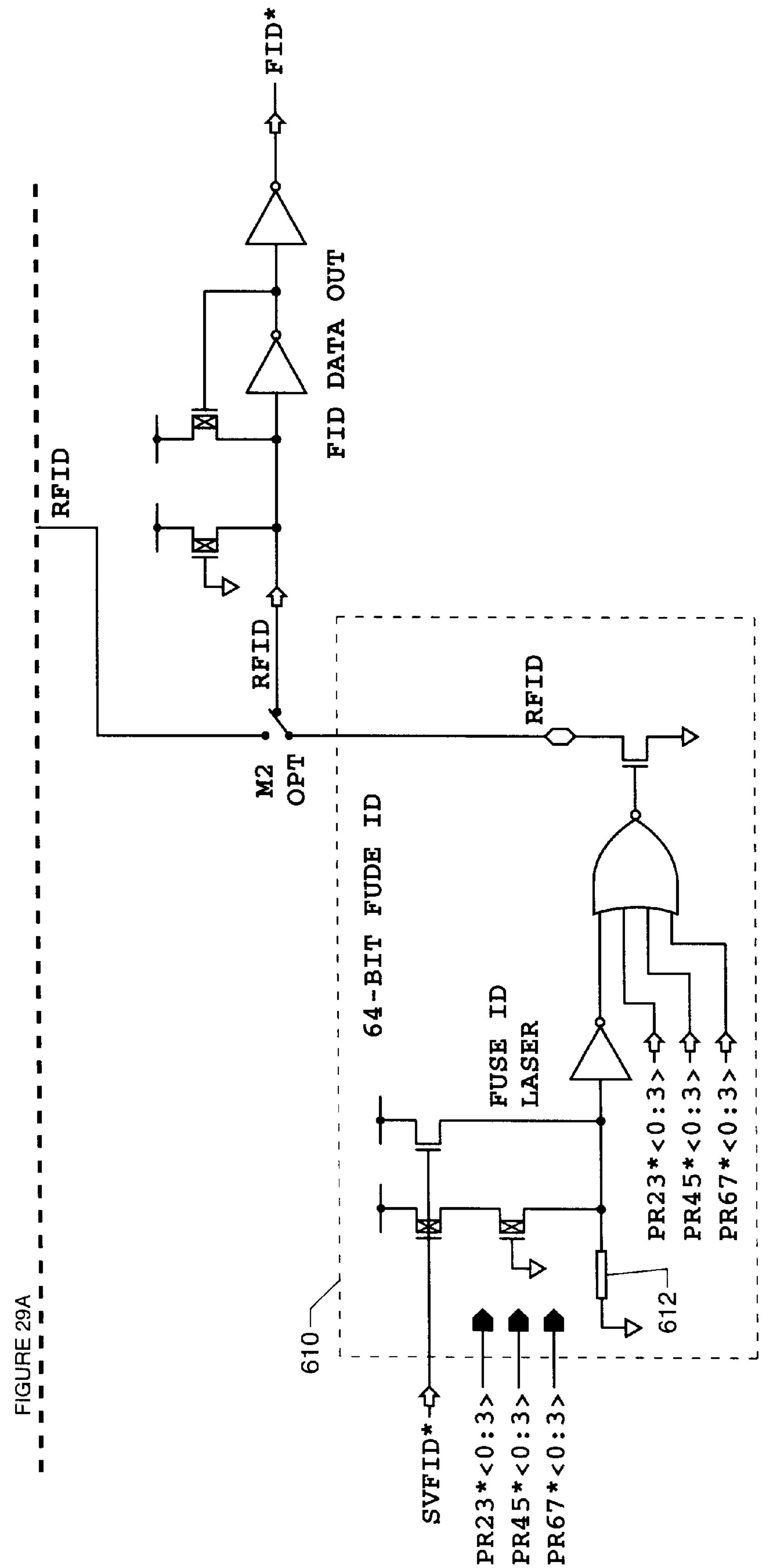

Referring to FIG. 29, the FUSEID option circuitry includes a FUSEID laser fusebank 610, consisting of 64 individually addressable laser fuses 612. The FUSEID option is activated by performing a write CAS-before-RAS cycle (i.e., asserting (low) the write enable (WE) and column address strobe (CAS) inputs to device 10 before asserting (low) the row address strobe (RAS) input, while at the same time asserting address input 9. Once in the FUSEID option is so activated, the 64 bits of information encoded by selectively blowing fuses 612 can be read out, serially, on a data input/output (DQ) pin of device 10 during 64 subsequent RAS cycles. With each cycle, a fuse's address must be applied on row address pins 2 through 7. These addresses are predecoded by FUSEID address predecoder circuitry 613 shown in FIG. 28 and applied to FUSEID fusebank 610 as signals PRA23*, PRA45*, and PRA67*, as shown in FIG. 29. With each fuse address, the output FID* from fusebank 610 will go low if the addressed fuse has been blown. The FID* output signal is applied to datapath circuitry 614 shown in FIGS. 182 and 183 to be communicated to data path output PDQ<0>.

Figure 57A:
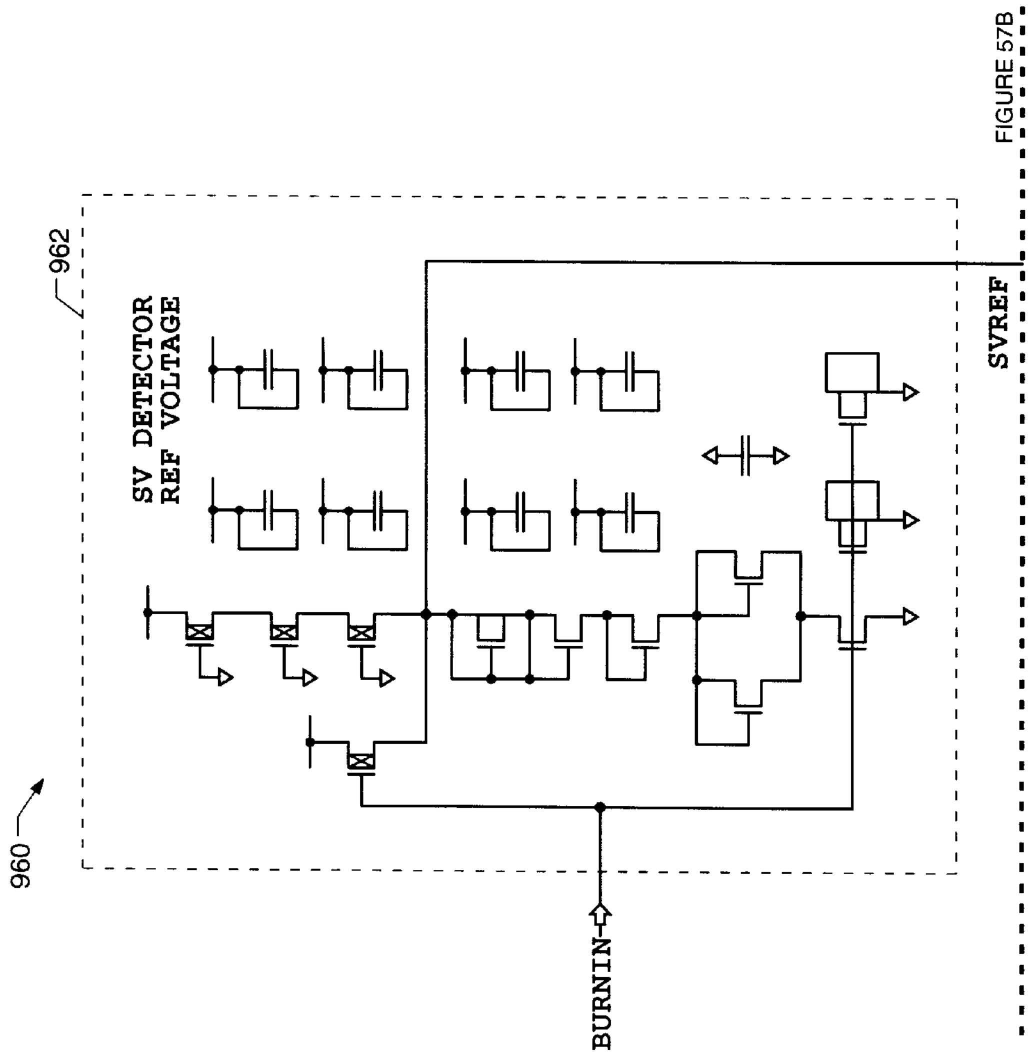
FIGS. 57A–57B are schematic diagram of a portion of the test mode logic circuitry in the memory device of FIG. 2, including a supervoltage detector circuit.
Figure 57:
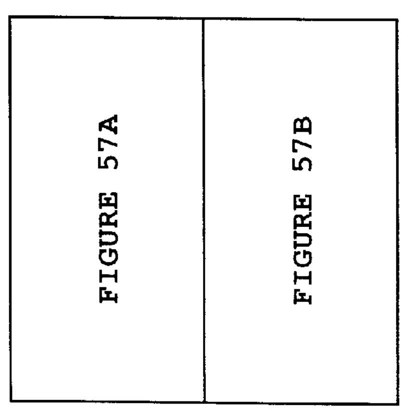
Figure 57B:
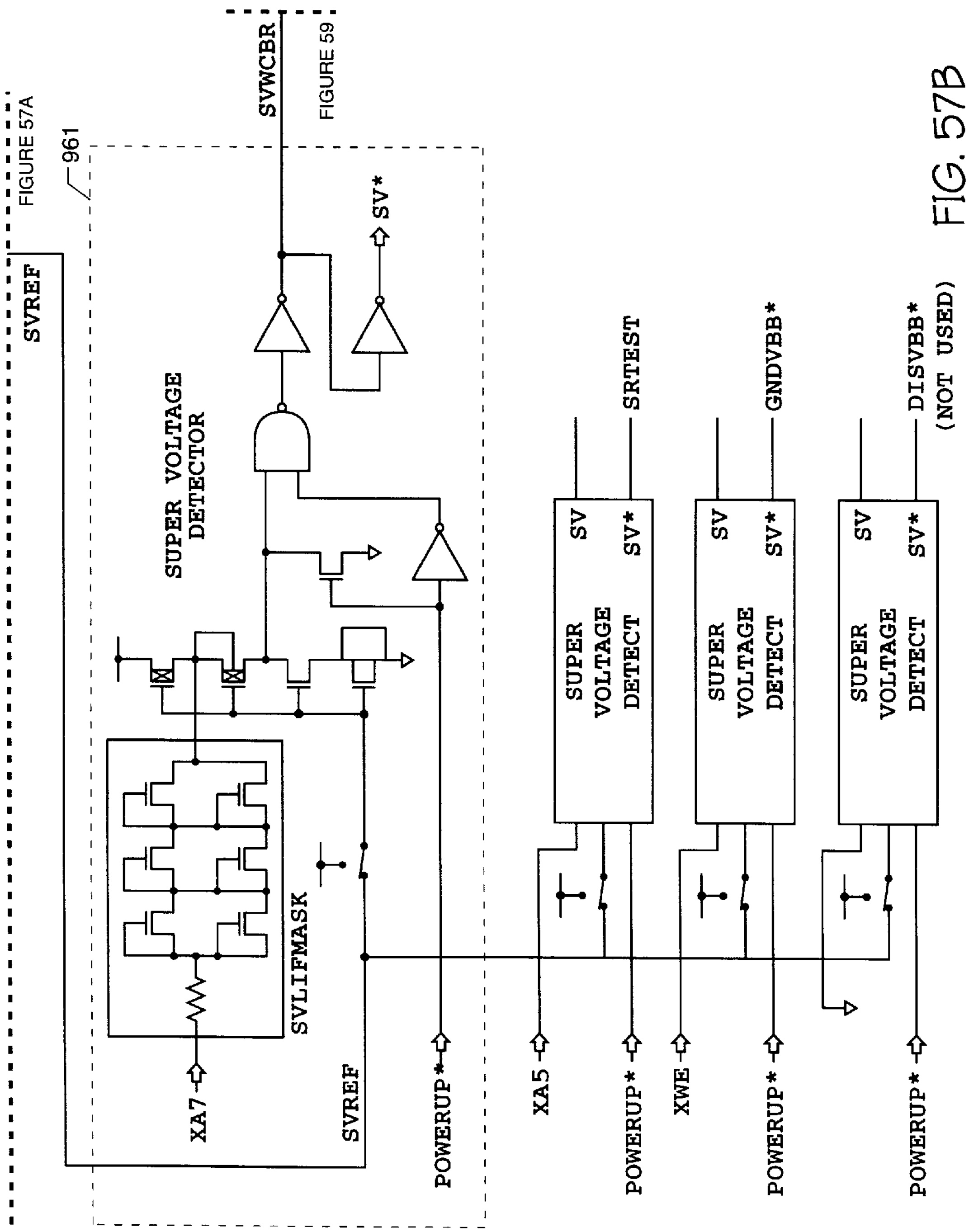
Figure 59:
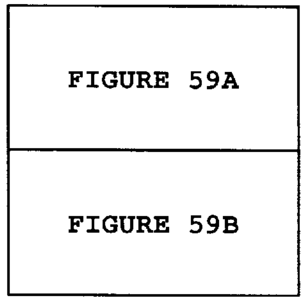
FIGS. 59A–59B are schematic diagram of another portion of the test mode logic circuitry in the memory device of FIG. 2.
Figure 59A:
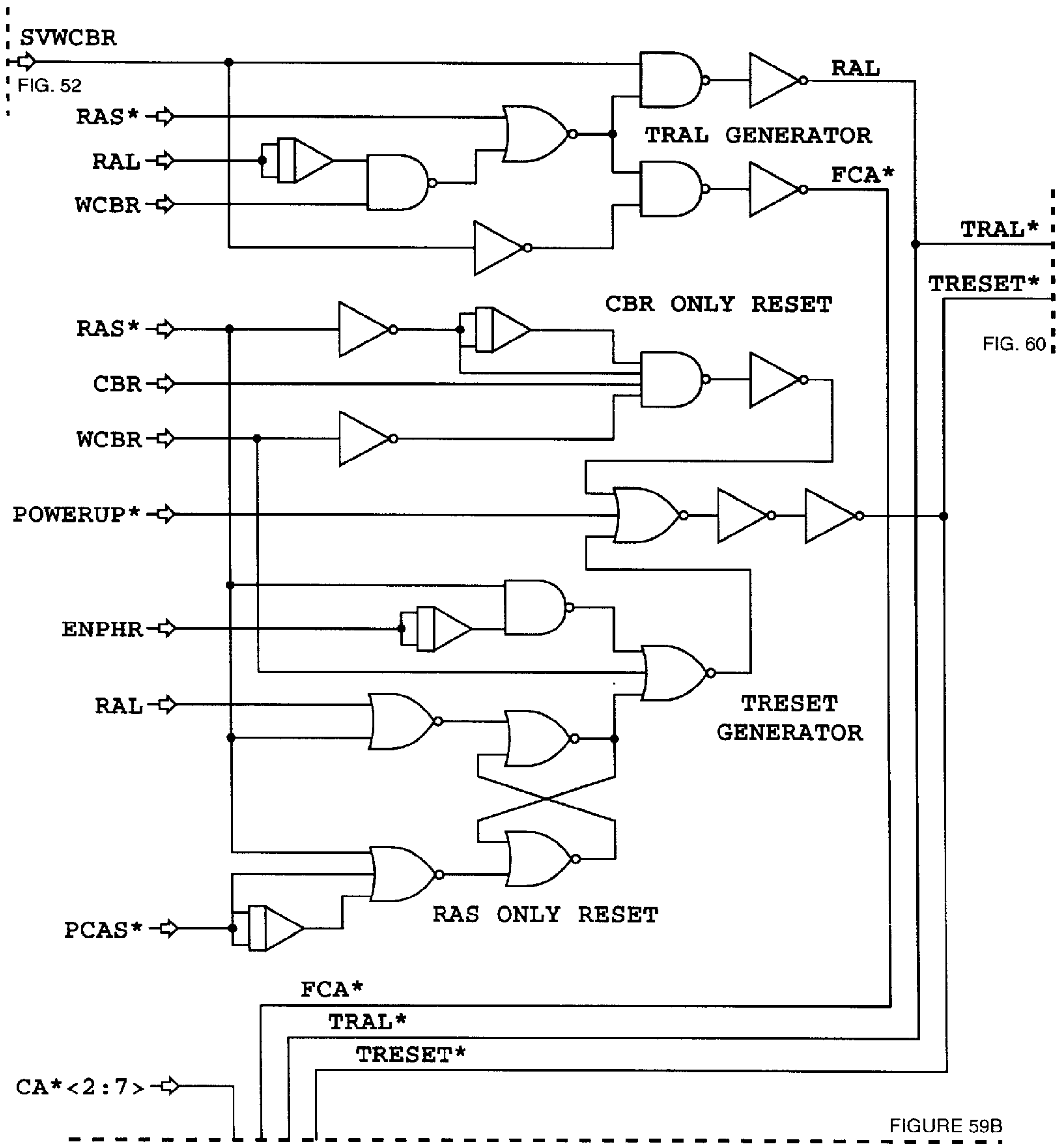
Figure 59B:
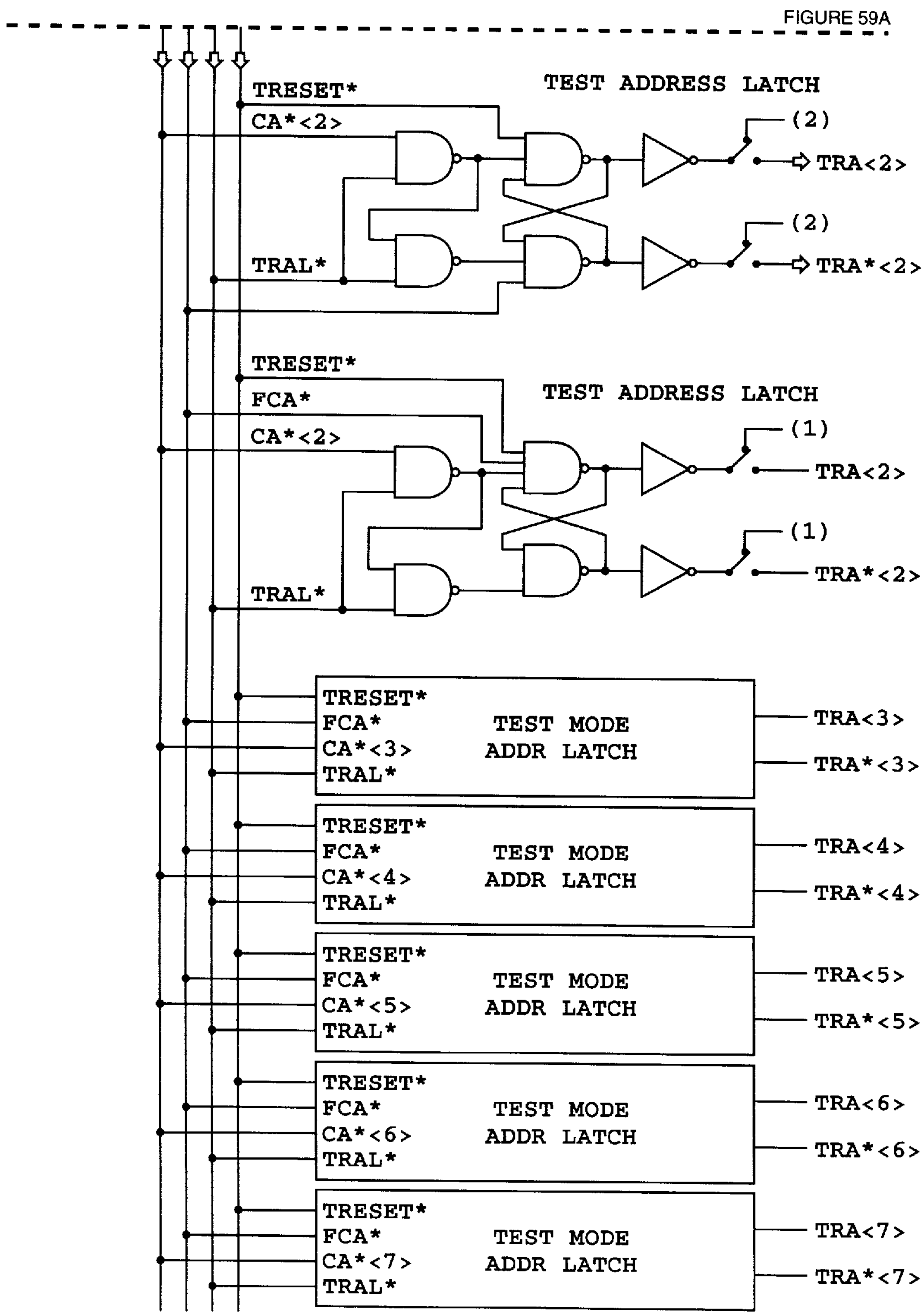
Figure 60:
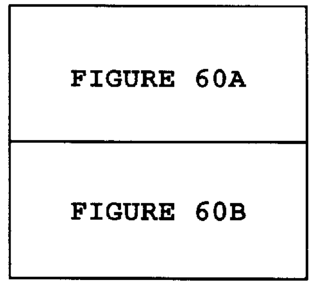
FIGS. 60A–60B are schematic diagram of another portion of the test mode logic circuitry in the memory device of FIG. 2.
Figure 60A:
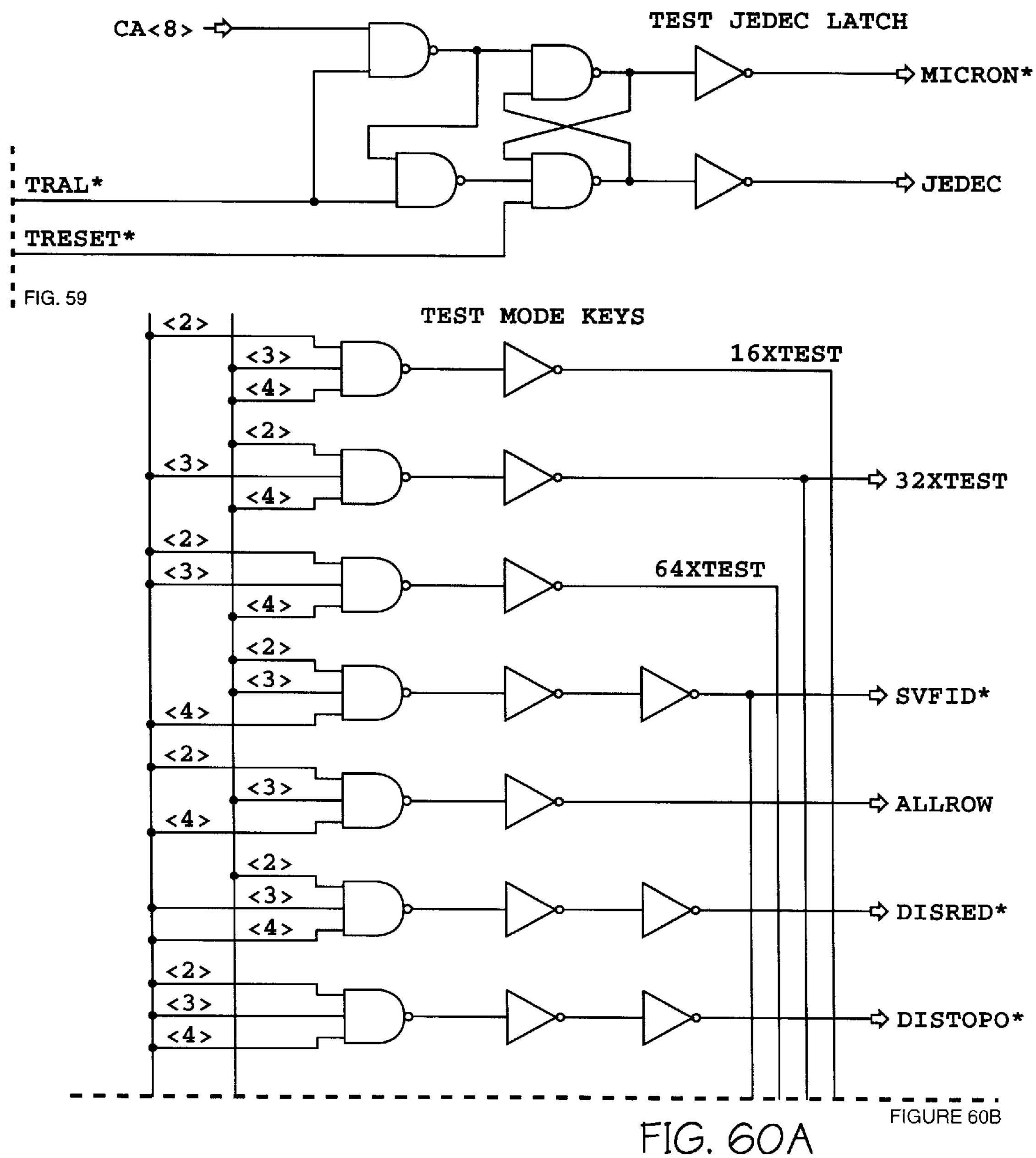
Figure 60B:
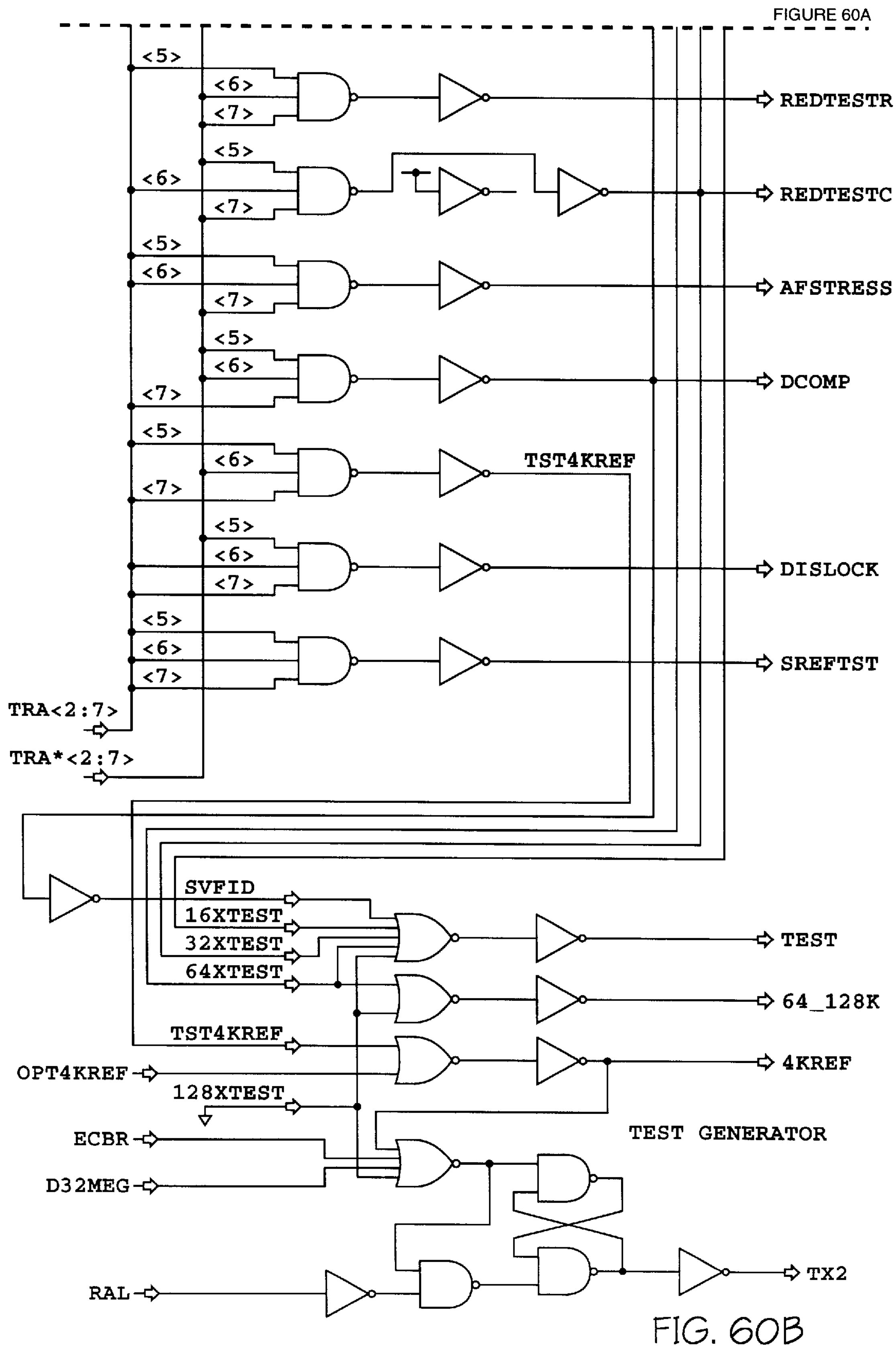

The SVFID* input signal also required to enable FUSEID fusebank 610 is generated by the test mode logic circuitry of FIG. 57, 59, and 60 in response to a supervoltage being detected on address input pin 7 accompanying a WCBR cycle.

LASER/ELECTRICAL FUSE OPTIONS

As noted above, some options supported by device 10 are programmable or selectable via both electrical fuses and laser fuses. By providing both laser and electrical fuses, options can be selected either during pre-packaging processing through use of a laser, or after packaging, by applying a high voltage to a CGND pin of the device while applying an address for the desired fuse on address pins of the device. Addresses for the various option fuses are set forth in the table of FIG. 22. Combination laser/electrical fuse option circuitry is shown in FIG. 30.

Figure 30A:
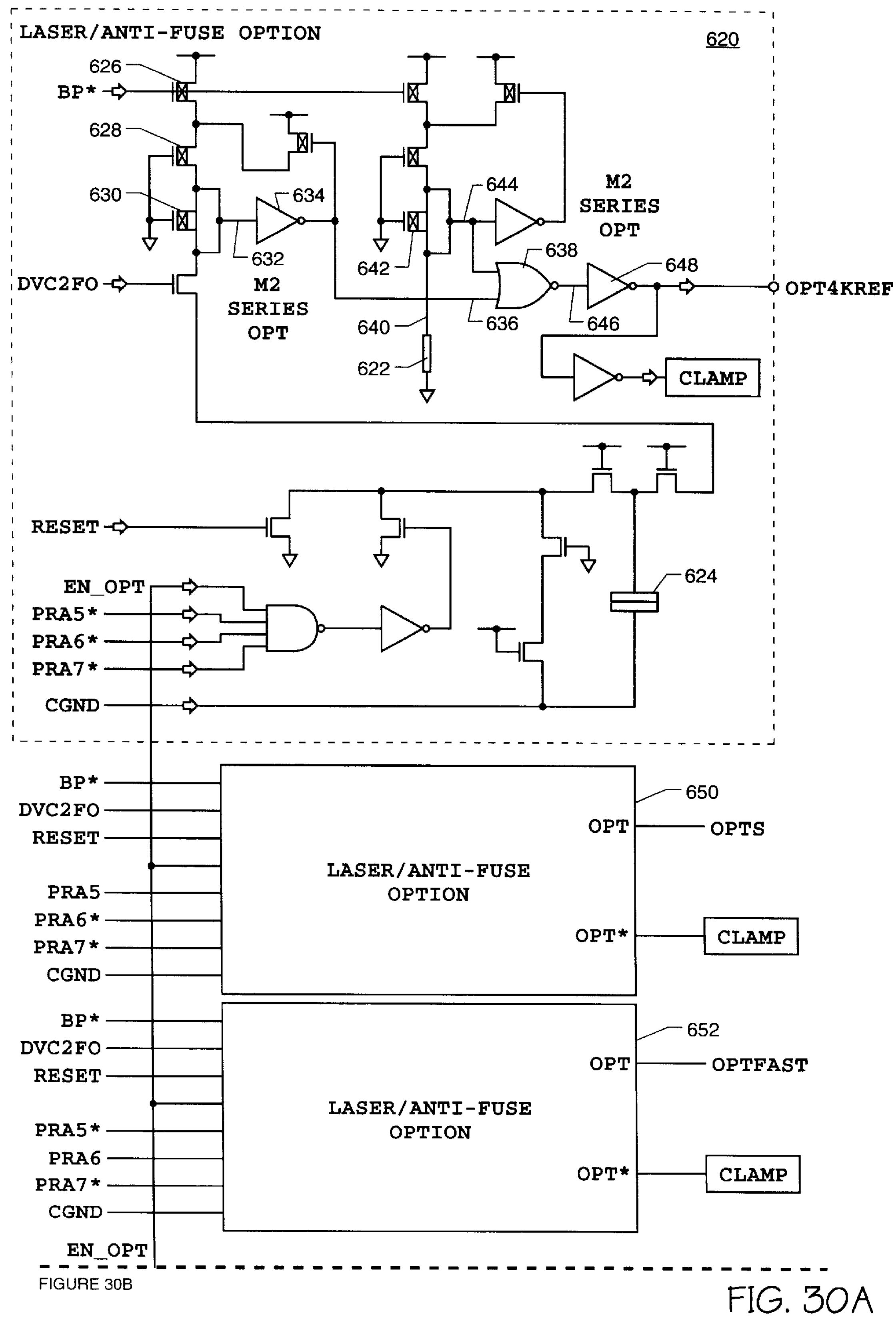
FIGS. 30A–30B are schematic/block diagram of circuitry implementing combination laser and electrical fuse options in the memory device of FIG. 2.
Figure 30B:
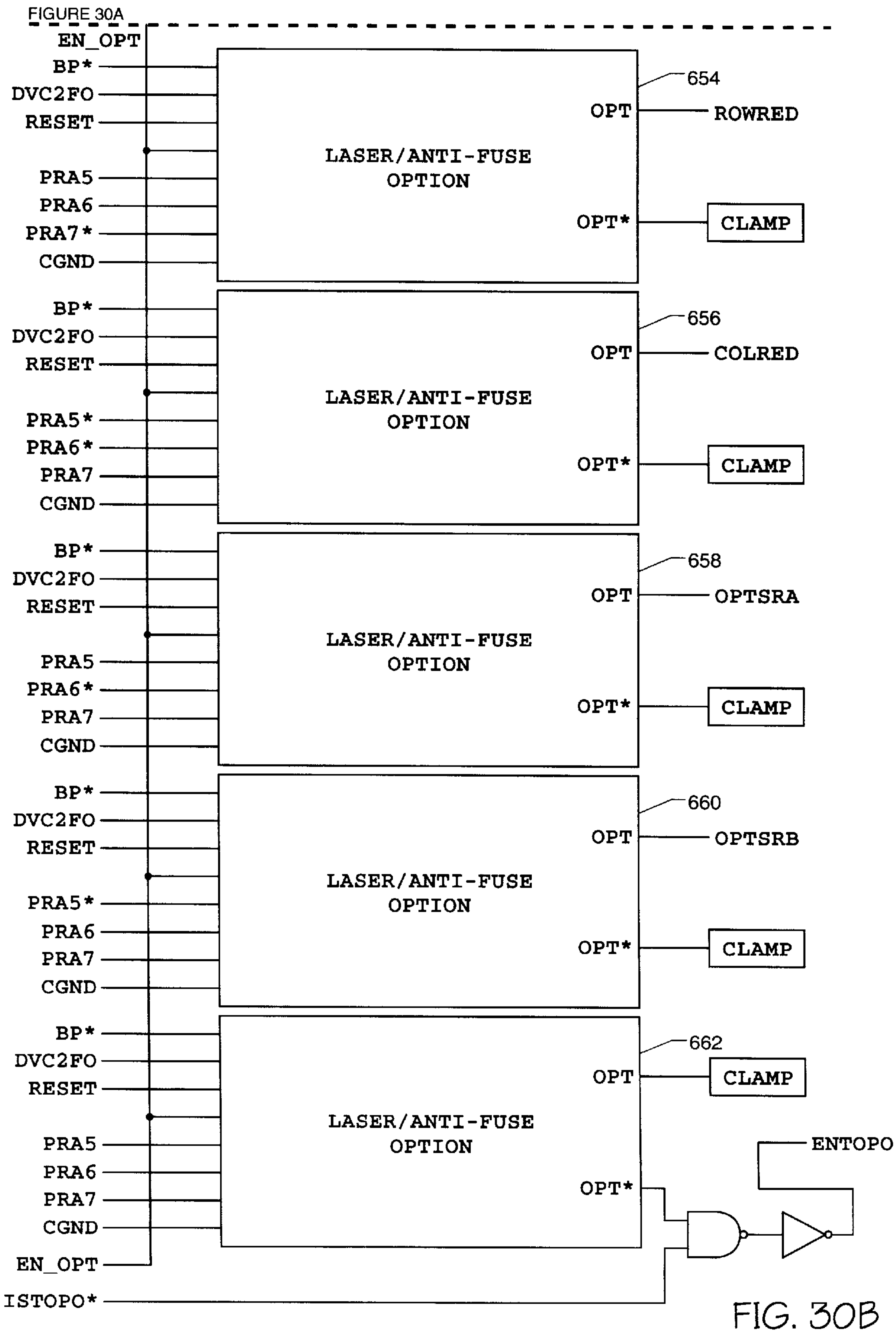

Referring to FIG. 30, the 4K refresh option, to be described in further detail below, is selected with laser/electrical fuse circuitry 620. As for other laser/electrical fuse options supported by device 10, circuitry 620 functions to generate a signal, OPT4KREF, which is provided to circuitry elsewhere in device 10 to indicate whether that option has been selected. The state of the OPT4KREF signal is determined based upon whether a laser fuse 622 or an electrical "antifuse" 624 has been blown in circuitry 620.

The input signal BP* to circuit 620 is asserted (low) every RAS cycle. As a result, the operation of P-channel devices 626, 628, and 630 brings the input to inverter 634 high, bringing the output of inverter 634 low. The low output of inverter 634 is applied to an input 636 of NOR gate 638.

When neither laser fuse 622 nor electrical fuse 624 is blown, laser fuse couples a node 640 to ground. The source-to-drain path of P-channel device 642 is shorted, so that with laser fuse 622 not blown, both inputs 636 and 644 to NOR gate 638 are low, making its output 646 high, and hence the output OPT4KREF of inverter 648 low. When OPT4KREF is low, the 4K refresh option is not selected.

When laser fuse 622 is blown, however, node 640 is no longer tied to ground, and hence input 644 to NOR gate 638 goes high. Everything else about circuit 620 stays the same as just described, so that the output 646 of NOR gate 638 goes low and hence the OPT4KREF output of inverter 648 goes high, indicating that the 4K refresh option has been selected.

Electrical fuse 624 is implemented as a nitride capacitor, such that when electrical fuse 624 is not blown, it acts as an open circuit to DC voltages. When electrical fuse 624 is "blown" by applying a high voltage across the nitride capacitor (using the CGND input to circuitry 620 as will be described in further detail below), the capacitor breaks down and acts essentially like a short circuit (with some small resistance) between its terminals. (As a result of this behavior, electrical fuses such as that included in circuit 620 are sometimes referred to herein as "antifuses.")

When antifuse 624 is not blown, input 632 to inverter 634- is tied high through P-channel devices 626 and 628, and the OPT4KREF output is low, as previously described.

When antifuse 624 is blown, however, it ties the input 632 of inverter 634 to CGND (which is normally at ground potential). Thus, the output of inverter 634 is high, the output 646 of NOR gate 638 is low, and hence the OPT4KREF output of inverter 648 is high, indicating that the OPT4KREF option has been selected.

As described above, therefore, the OPT4KREF option can be selected either by blowing laser fuse 622 or antifuse 624. Each of the other laser/electrical option circuits 650, 652, 654, 656, 658, 660, and 662 functions in a substantially identical fashion to enable both laser and electrical selection of their corresponding options.

CONTROL LOGIC

Like many known and commercially-available memory devices, DRAM 10 in accordance with the presently disclosed embodiment of the invention, device 10 requires certain control circuitry to generate various timing and control signals utilized by various elements of the memory array. Such control circuitry for device 10 is shown in detail in FIGS. 37 through 48. Much of the circuitry in these Figures is believed to be straightforward in design and would be readily comprehended by those of ordinary skill in the art. Accordingly, this circuitry will not be described herein in considerable detail.

Figure 45:
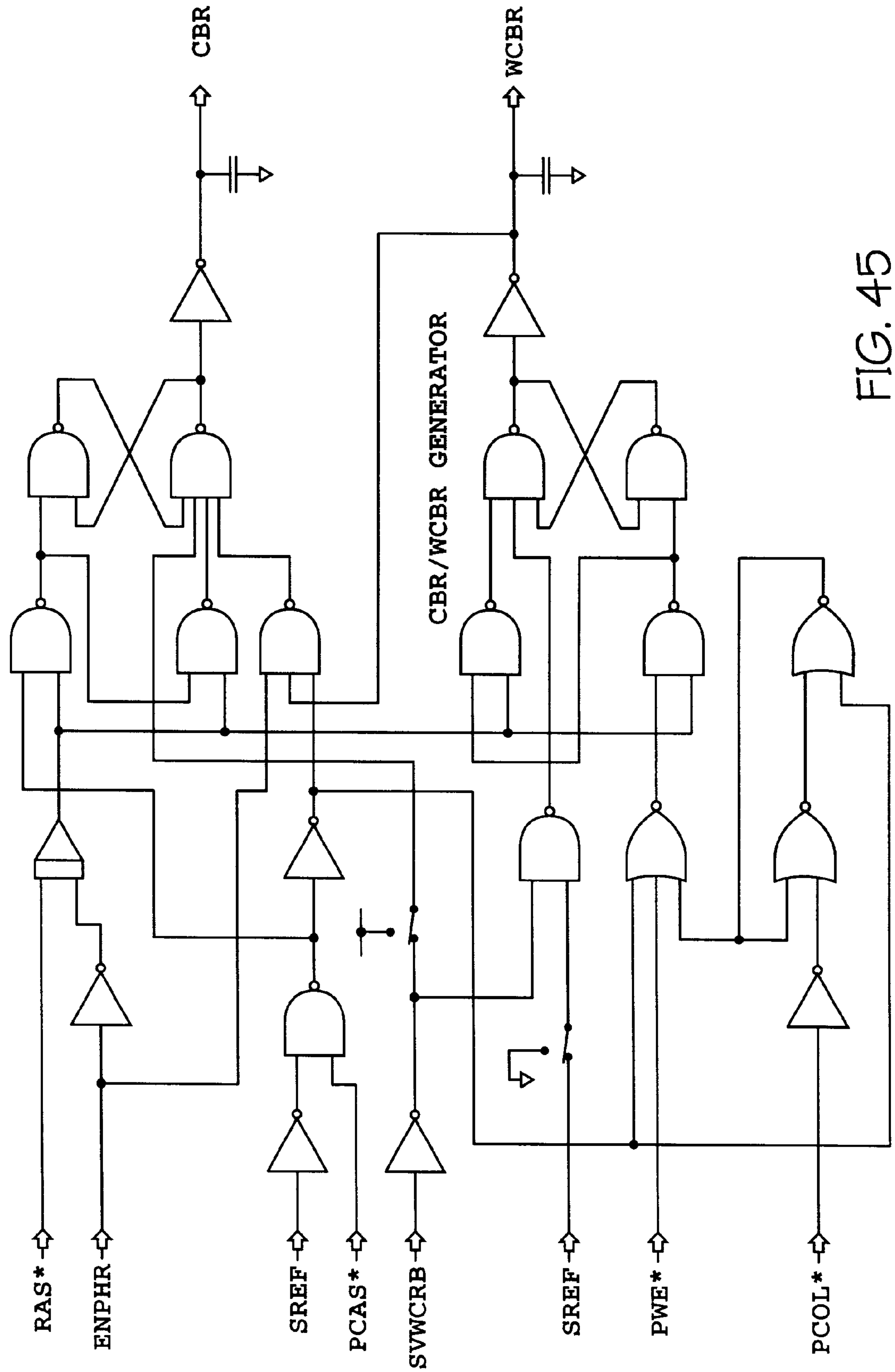
FIG. 45 is a schematic diagram of a CAS-before-RAS (CBR) and Write CAS-before-RAS (WCBR) signal generating circuit in the memory device of FIG. 2.
Figure 46:
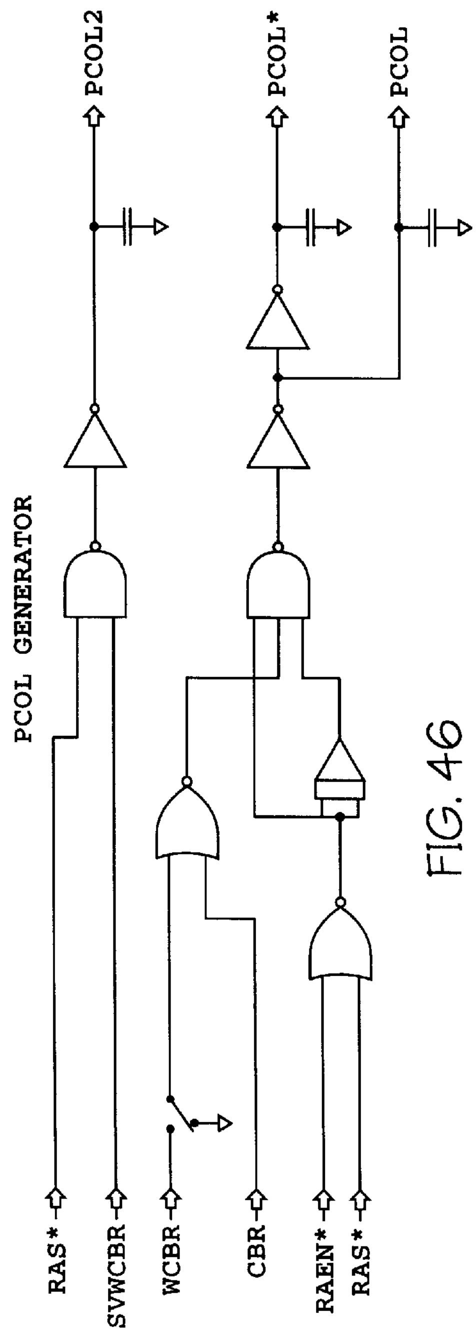
FIG. 46 is a schematic diagram of a power-up column buffer generator.
Figure 47:
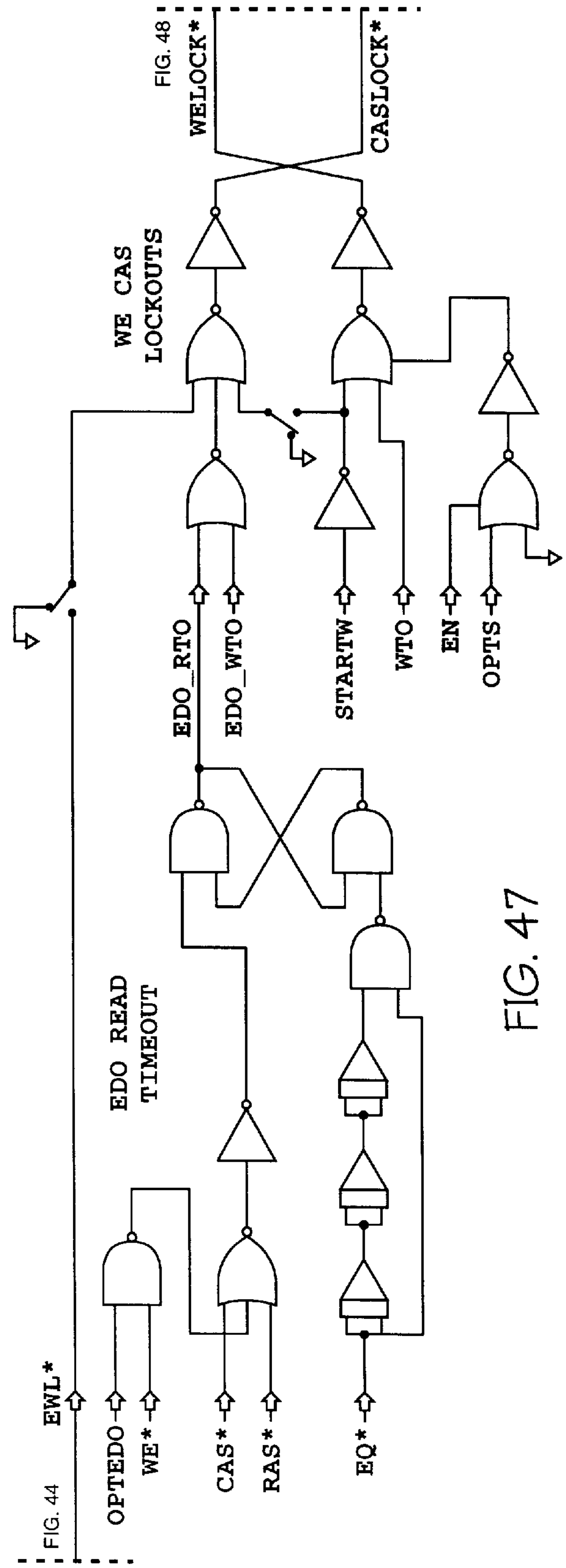
FIG. 47 is a schematic diagram of a write enable/CAS lock (WE/CAS Lock) circuit in the memory device of FIG. 2.
Figure 48:
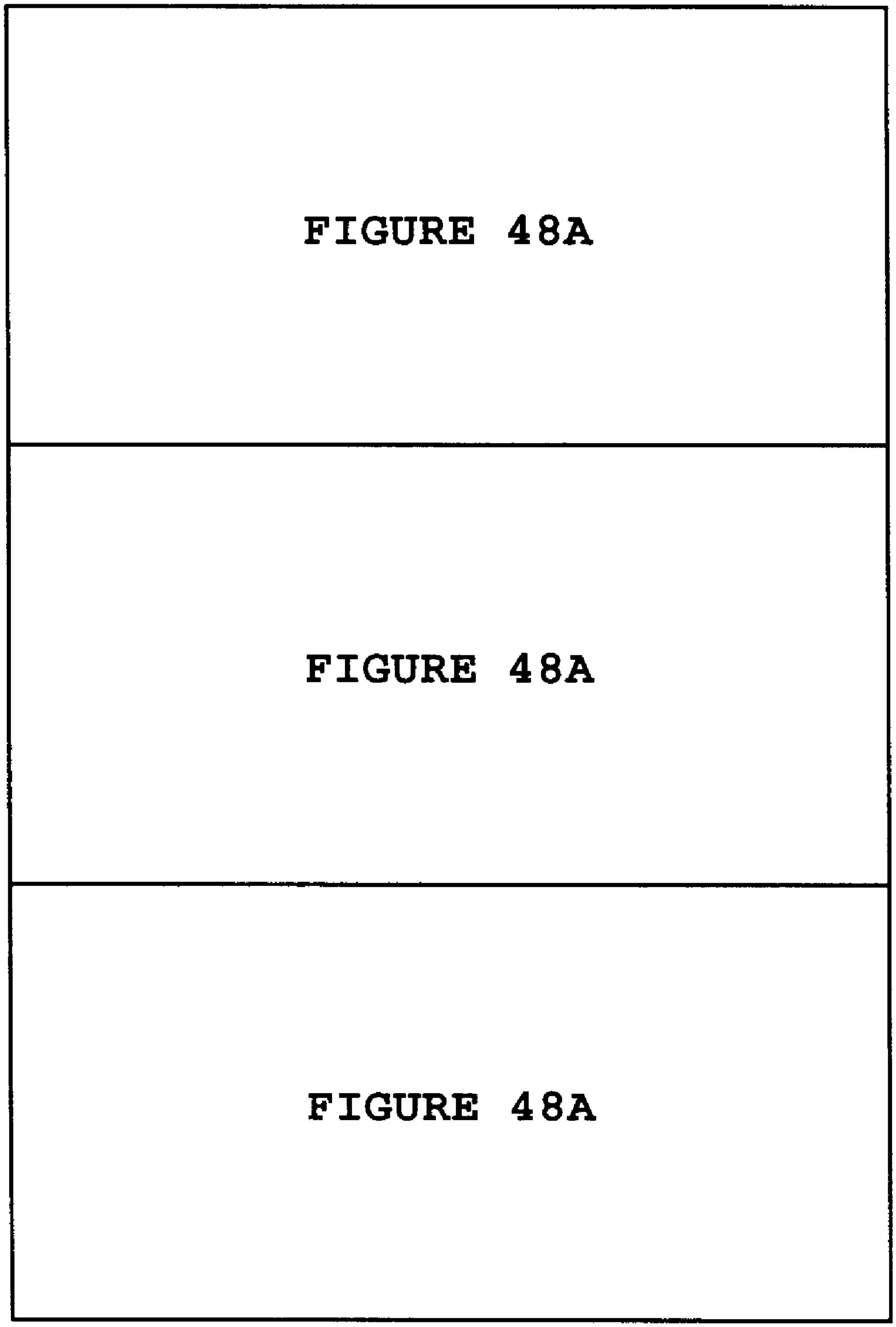
FIGS. 48A–48C schematic diagram of a read/write control circuit in the memory device of FIG. 2.
Figure 48A:
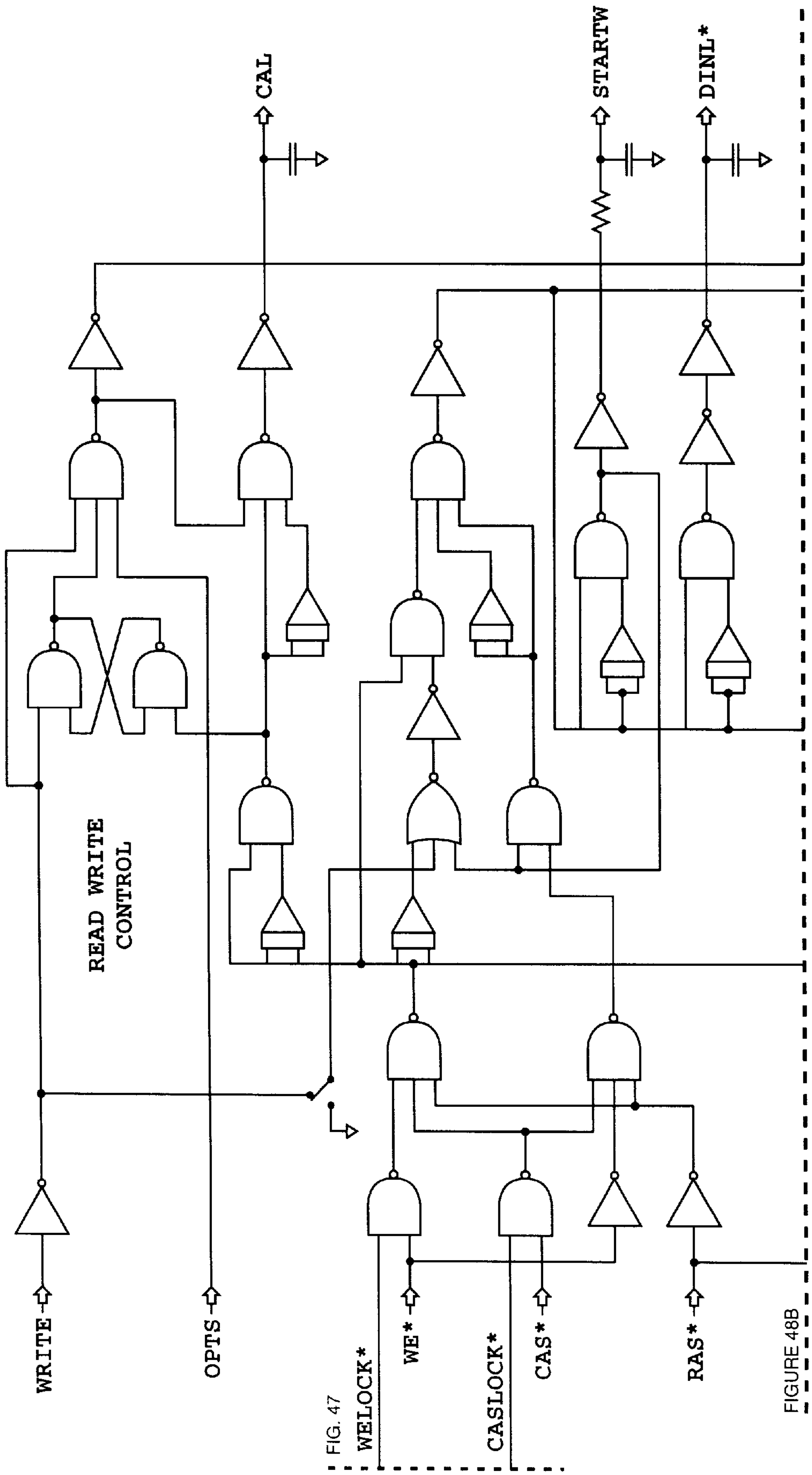
Figure 48B:
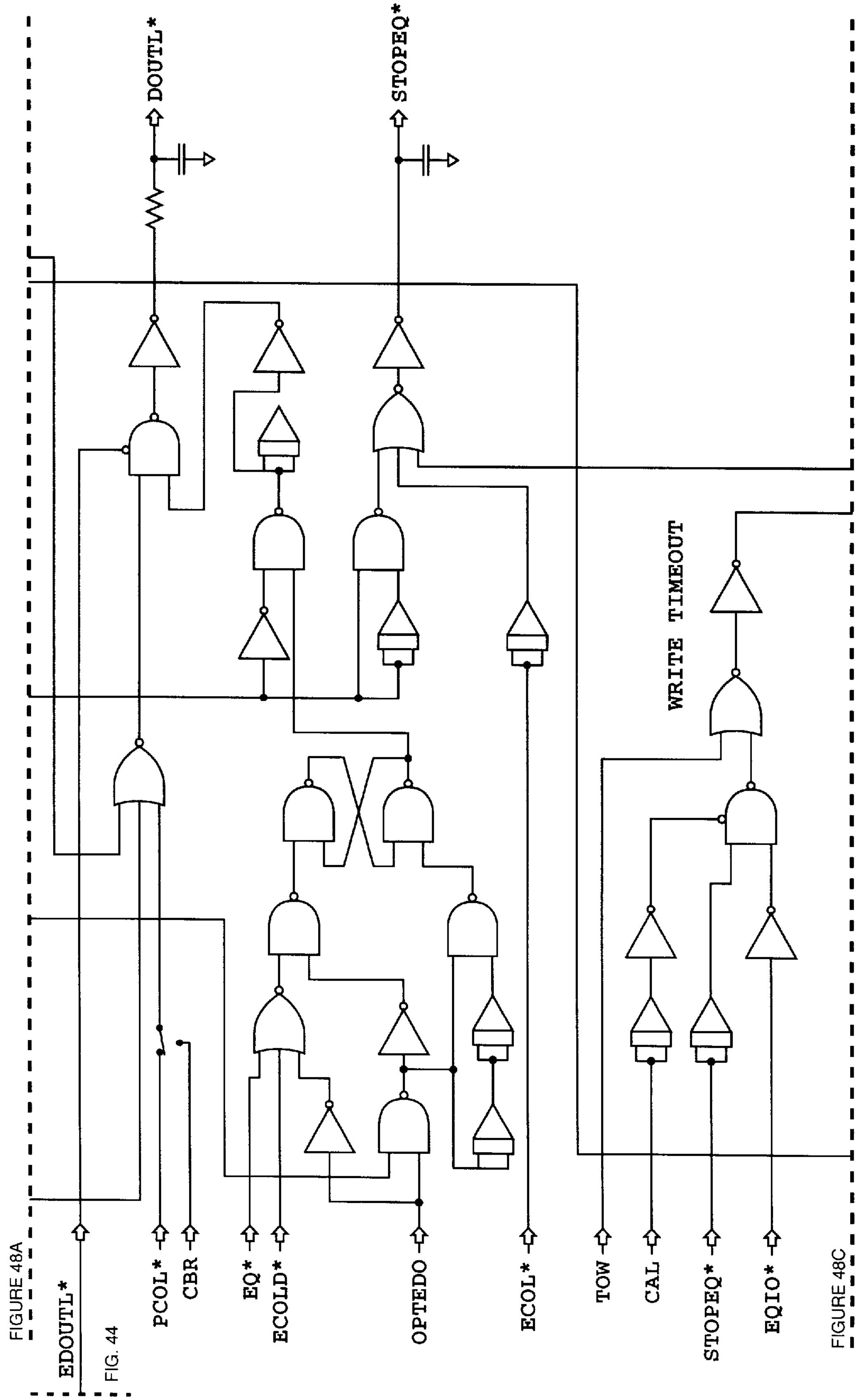
Figure 48C:
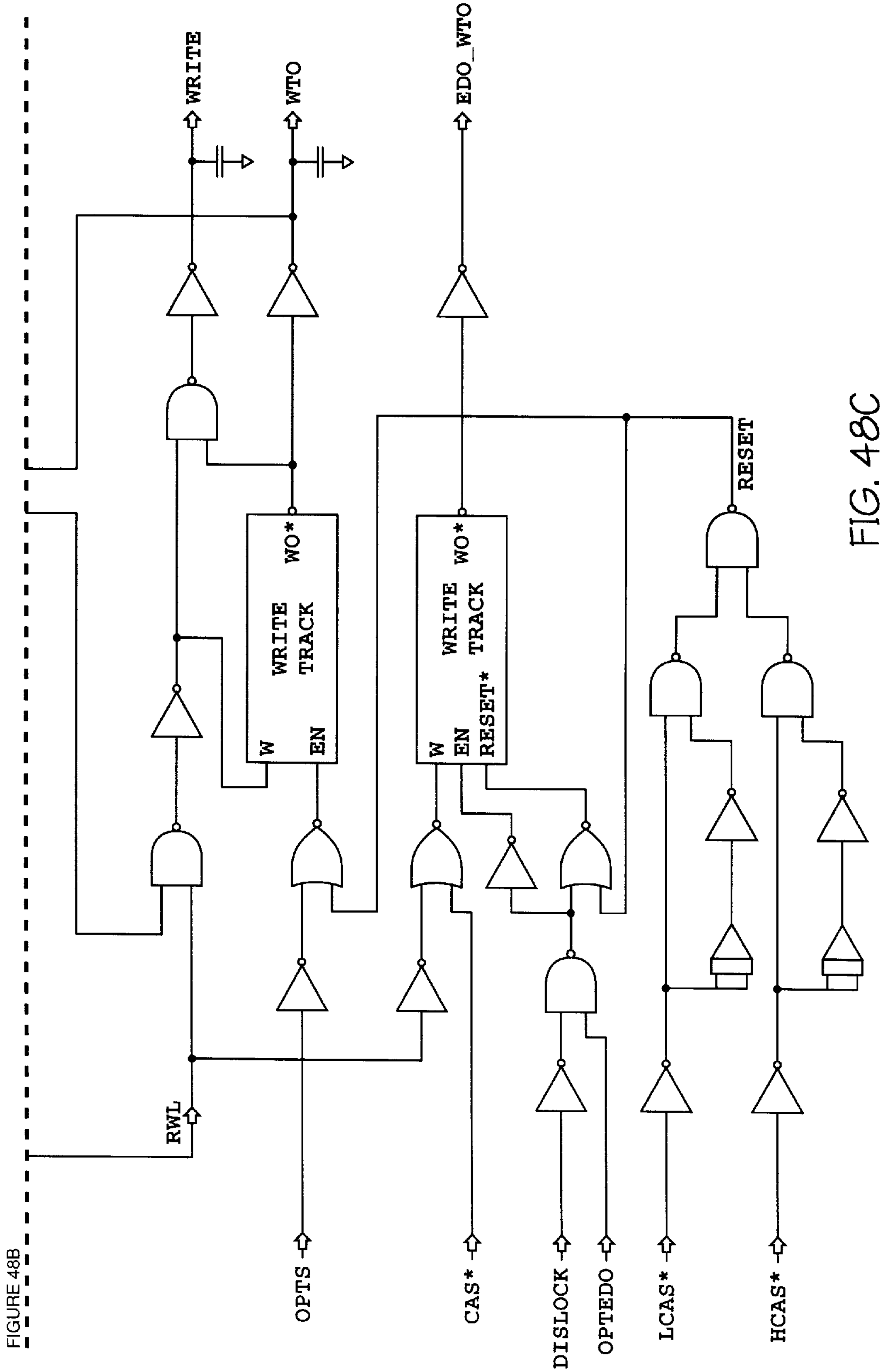
Figures 71, 71A:
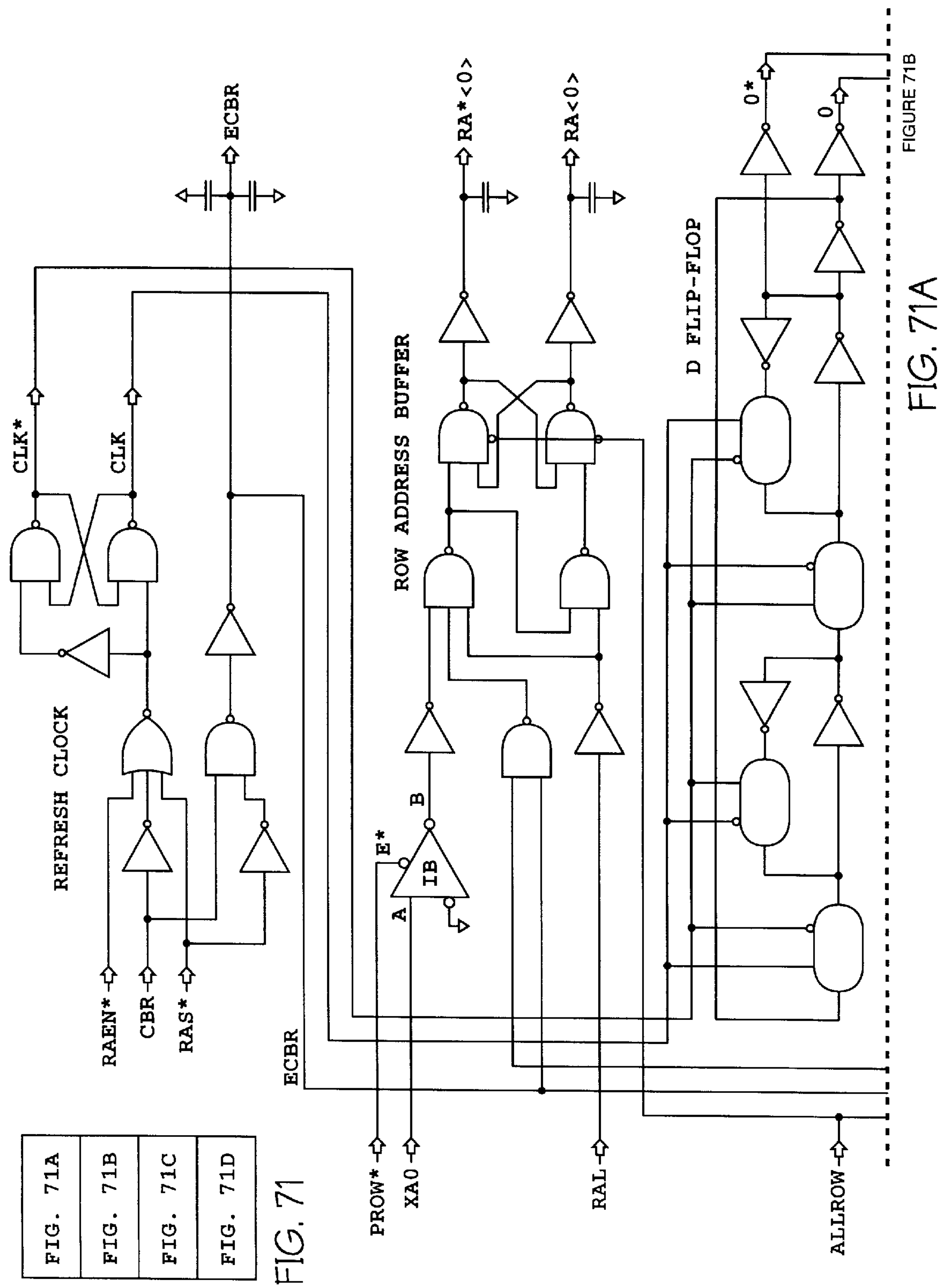
FIGS. 71A–71D are schematic/block diagram of a portion of a CAS-before-RAS (CBR) counter circuit in the memory device of FIG. 2.
Figure 71B:
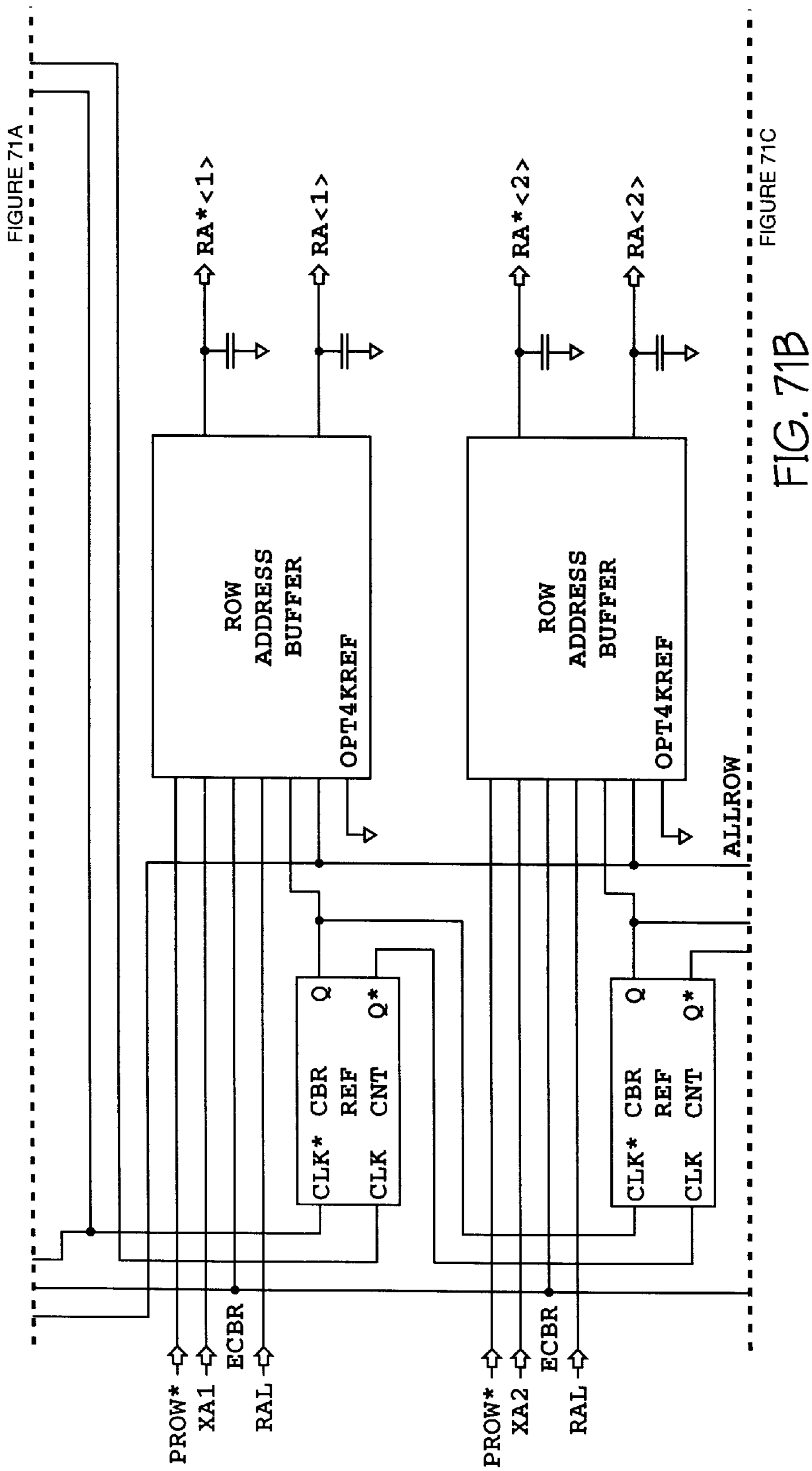
Figure 71C:
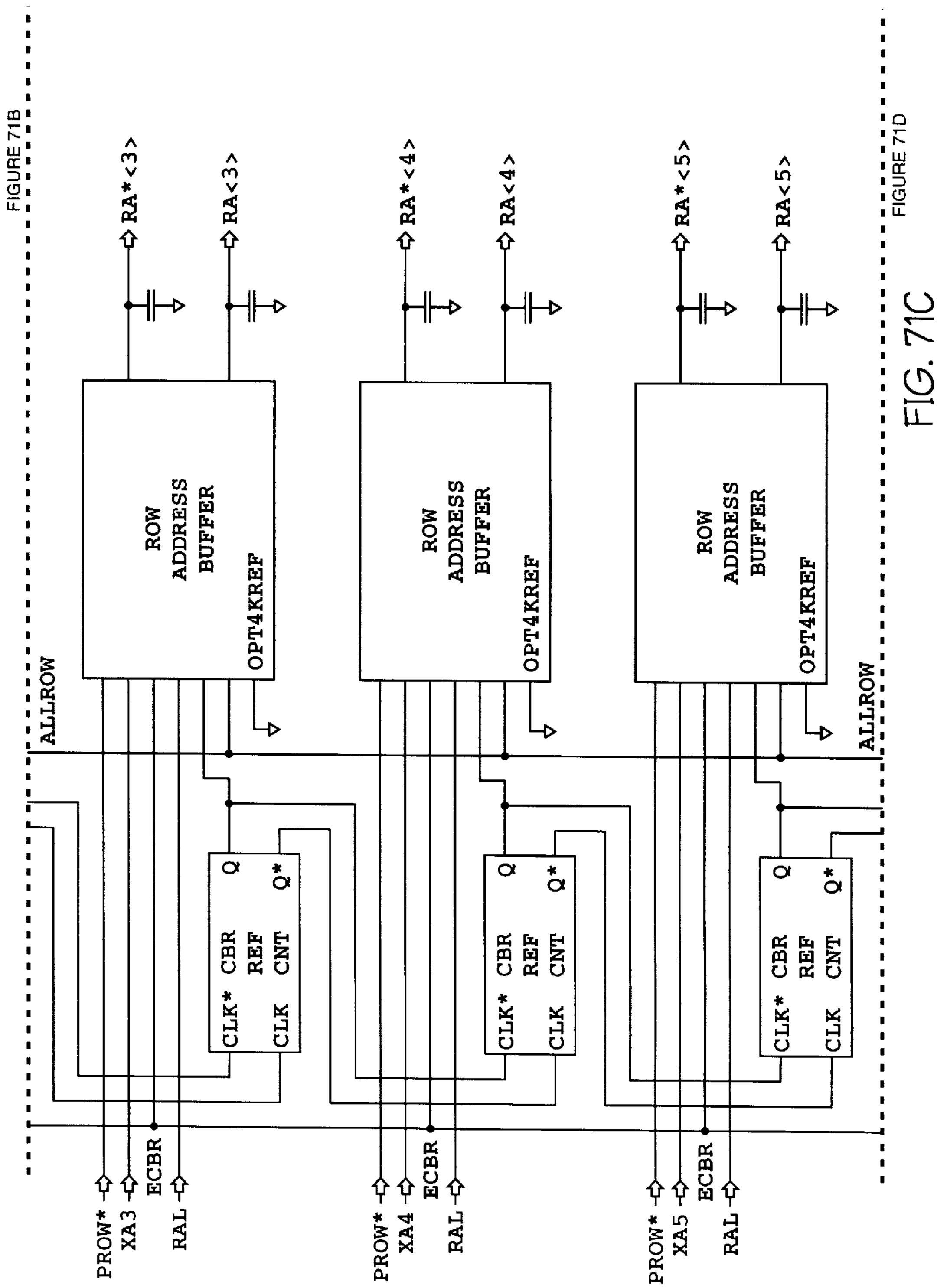
Figure 71D:
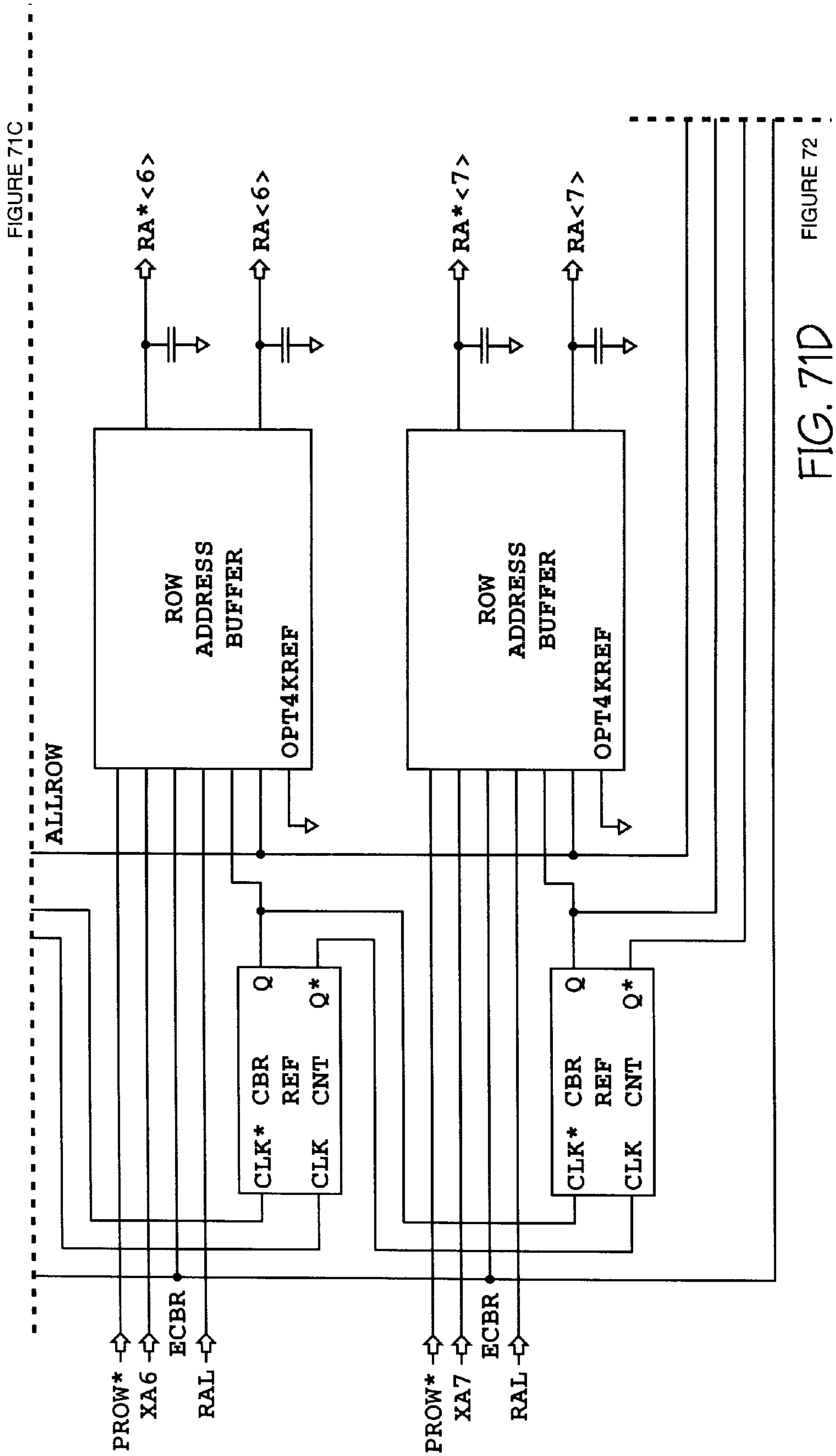
Figures 72, 72A:
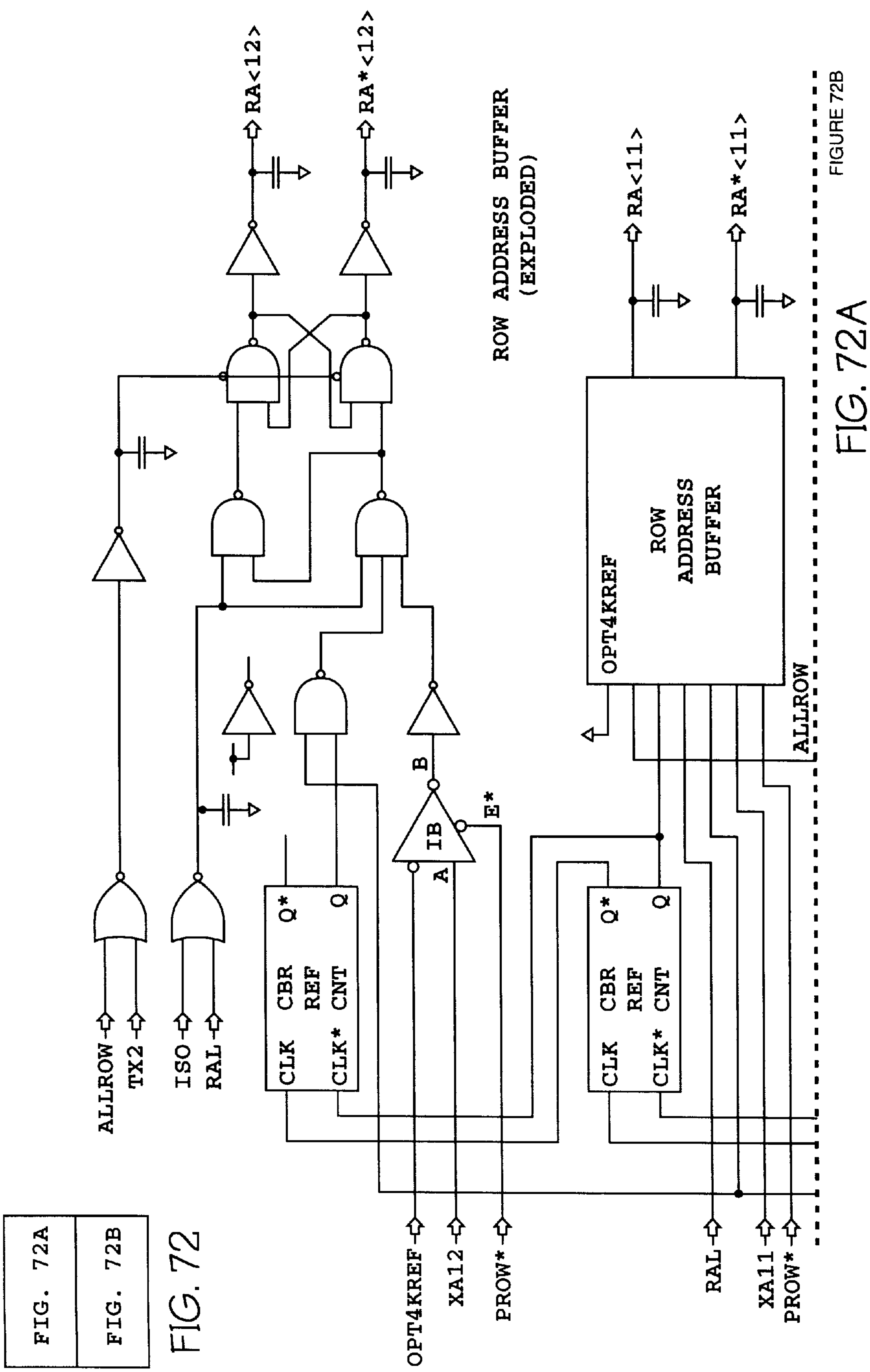
FIGS. 72A–72B are schematic/block diagram of another portion of the row-address buffer and CBR counter circuit from FIG. 71.
Figure 72B:
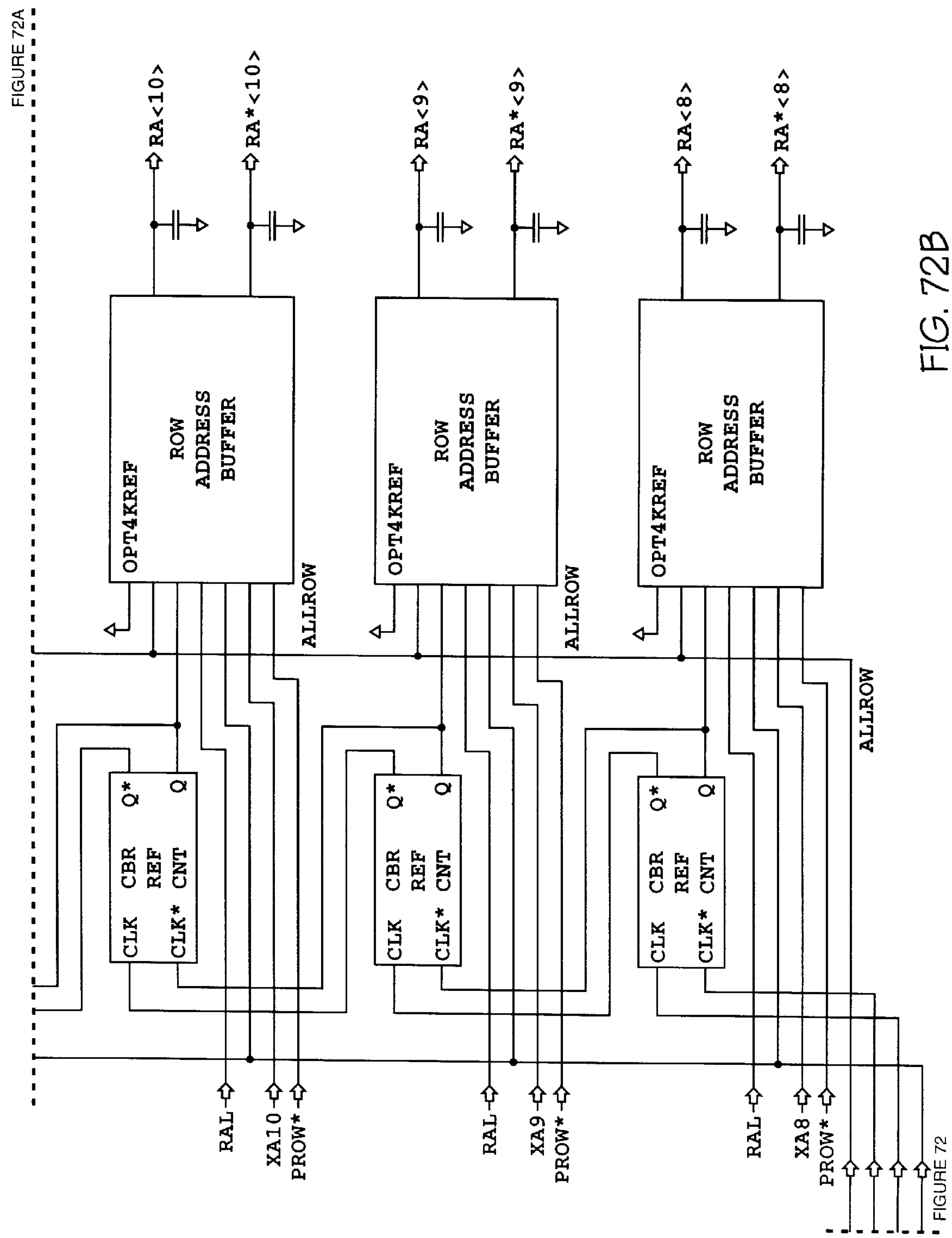

A circuit, shown in FIG. 45, is provided for detecting the predetermined relationship between assertion of RAS and CAS and generating CBR and WCBR signals. The CBR signal, in turn, is among those supplied to a CBR counter and row address buffer circuit, shown in FIGS. 71 and 72, which functions to buffer incoming row addresses and also to increment an initial row address for subsequent CBR cycles.

RAS CHAIN

Those of ordinary skill in the art will appreciate that most events which occur in a dynamic random access memory have a precisely timed relationship with the assertion of the CAS and RAS input signals to the device. For example, the activation of N-type sense amplifiers 82 and P-type sense amplifiers 80L and 80R (discussed above with reference to FIG. 16) are initiated in a precise timed relationship with the assertion of RAS.

In FIGS. 49 through 55, various circuits associated with assertion of RAS (the so-called "RAS chain") are depicted. The RAS chain circuits define the sequence of events which occur in response to assertion (low) of the row address strobe (RAS*) signal during each memory access. Referring to the RASD generator circuit 890 of FIG. 52, assertion (low) of RAS* causes, after a delay defined by a delay element 892 assertion of an active high RASD signal. RASD is applied to the input of an RAL/RAEN* generator circuit 894 which leads to assertion of a signal RAL. RAL causes latching of the RA address on the address pins of device 10, as is apparent from the schematic of the row address buffer circuitry in FIGS. 71 and 72.

Returning to FIG. 52, it is also apparent therefrom that assertion of RASD also leads to assertion of an active low signal RAEN*, which signal activates row address predecoders 110, 112, 114, 116, 118, 120, 122, and 124, as shown in FIG. 19. Assertion of RAEN* also leads to deassertion of the signals ISO and EQ, as is apparent from the EQ control and ISO control circuitry of FIG. 54. Deassertion of ISO and EQ isolates non-accessed arrays by turning off isolation devices 84L and 84R in primary sense amplifiers 64, and discontinues equalization of digit lines 71 by turning off equlization devices 90L and 90R, as is apparent in the schematic of FIG. 16.

Figure 53:
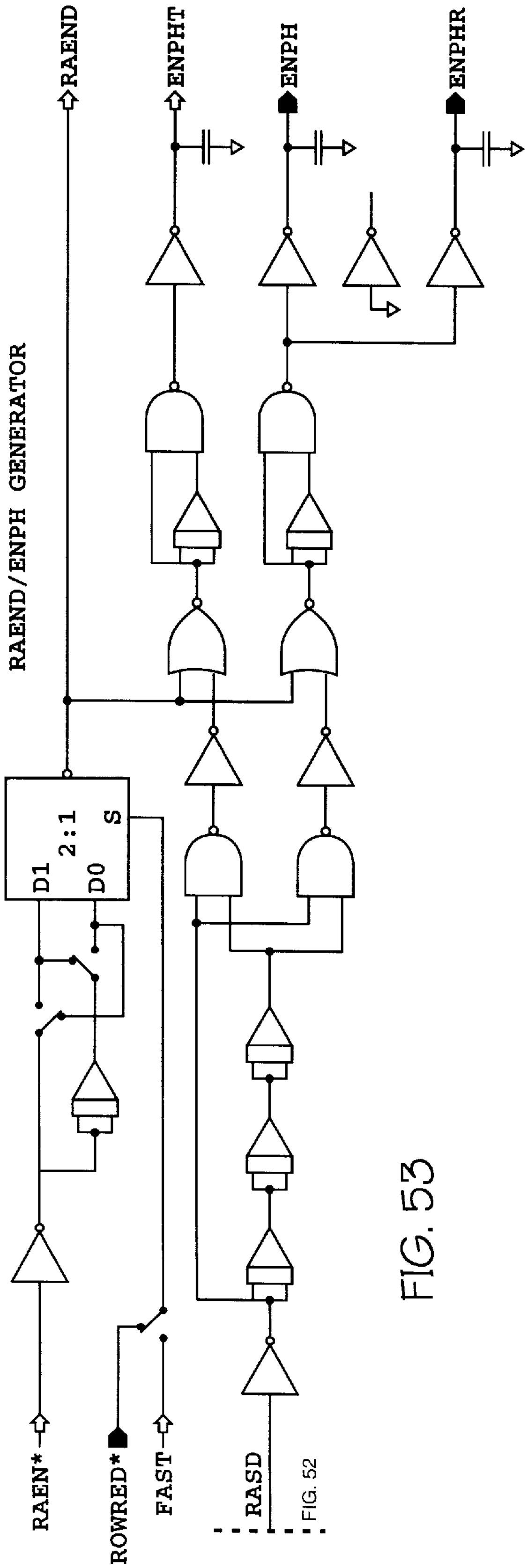
FIG. 53 is a schematic diagram of a word line enable signal generator.
Figure 54:
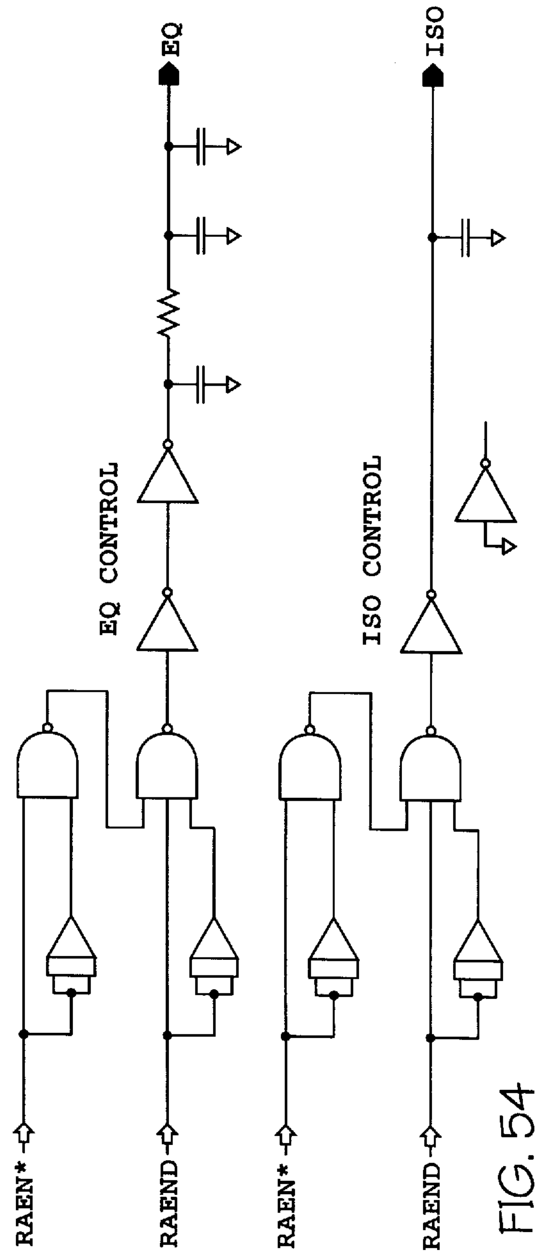
FIG. 54 is a schematic diagram of circuitry for generating sense amplifier equalization and isolation control signals in the memory device of FIG. 2.
Figure 55:
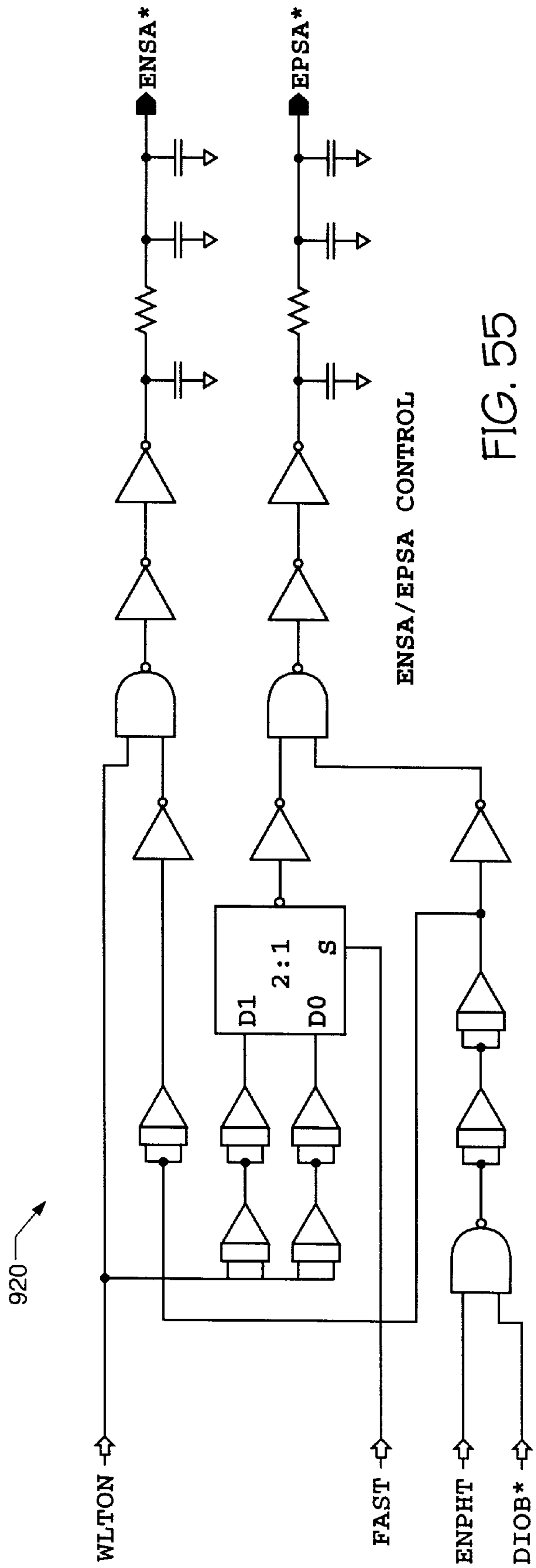
FIG. 55 is a schematic diagram of circuitry for enabling P-type and N-type sense amplifiers in the memory device of FIG. 2.
Figure 56:
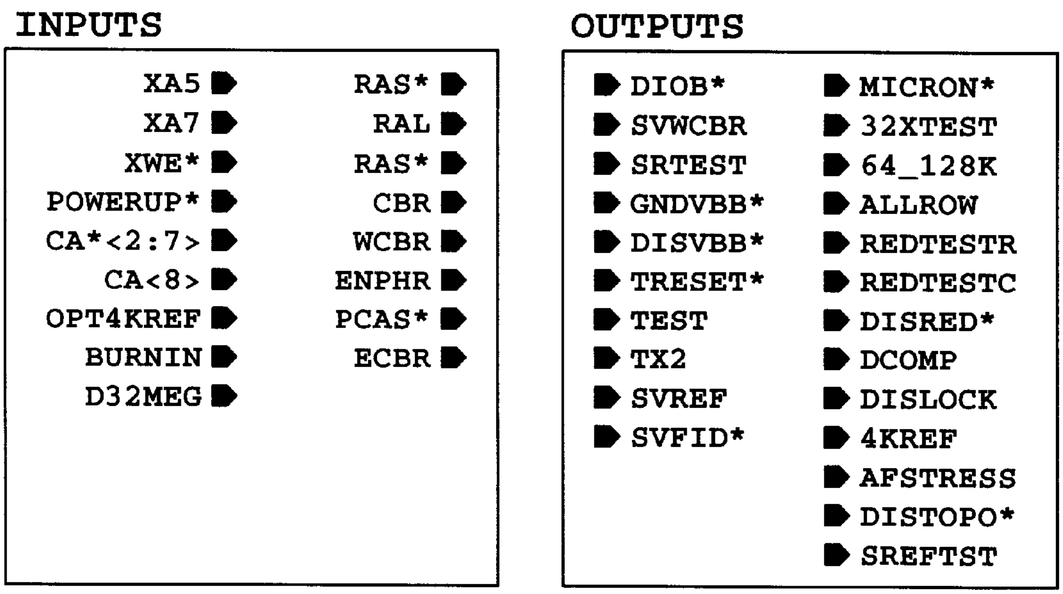
FIG. 56 identifies the names of input and output signals to test mode logic circuitry in the memory device of FIG. 2.
Figure 58:
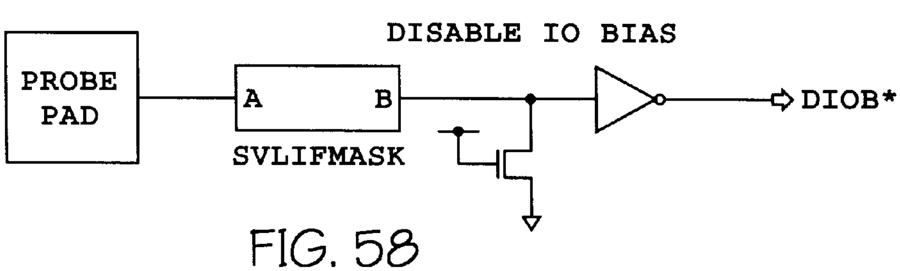
FIG. 58 is a schematic diagram of a probe pad circuit related to disabling I/O bias in the memory device of FIG. 2.

From the schematic of FIG. 53, it is apparent that assertion of RAEN* also leads to the subsequent assertion of enable phase signals ENPH, and ENPHT which are applied to inputs of array driver circuitry of FIGS. 158 and 159 to enable word lines for a memory access cycle.

Figure 49:
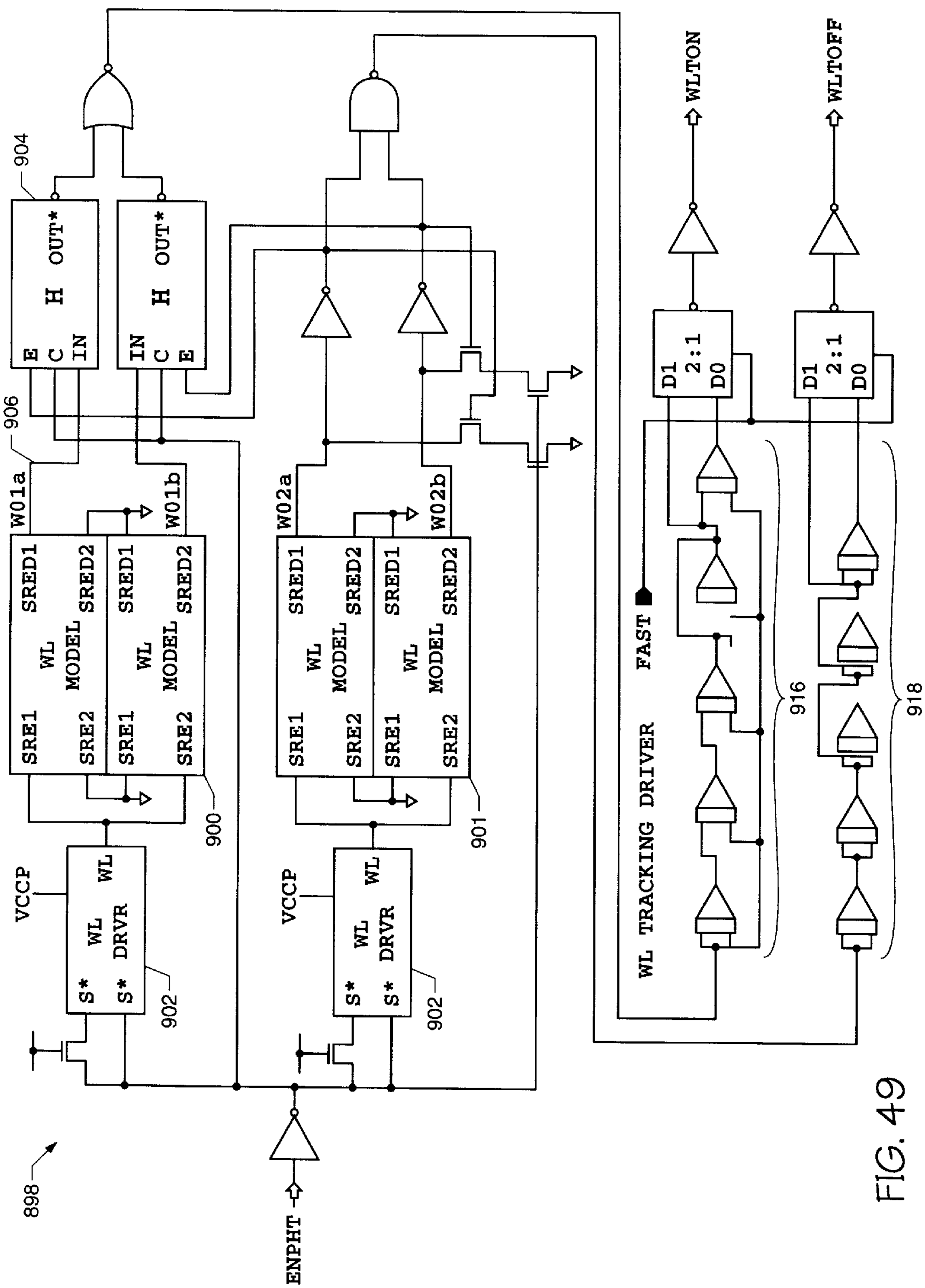
FIG. 49 is a schematic diagram of a word line tracking driver circuit in the memory device of FIG. 2.
Figure 50:
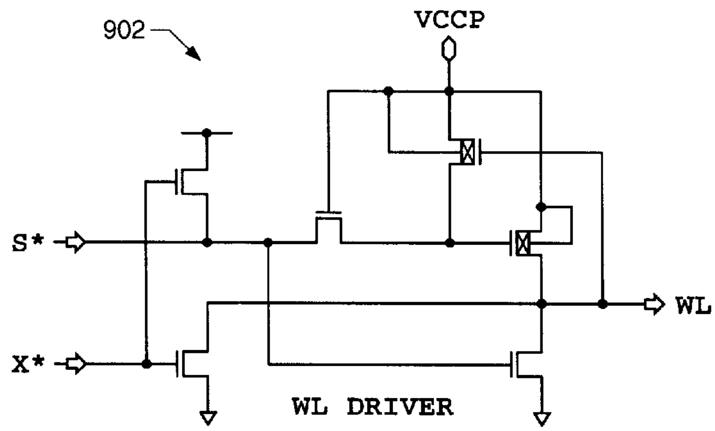
FIG. 50 is a schematic diagram of a word line driver circuit in the memory device of FIG. 2.

Once word lines in device 10 are activated, the timing of events becomes particularly critical, especially with regard to when sensing of charge from individual memory cells can begin. To this end, device 10 in accordance with the presently disclosed embodiment of the invention includes a word line tracking driver circuit which is shown in FIG. 49. Word line tracking driver circuit 898 includes model circuits 900 and 901 which model the RC time constant behavior of word lines 70 in the memory array. Tracking circuit 898 applies the ENPHT signal to word line driver circuits 902 which are identical to those used to drive word lines in the array itself. A typical word line tracking circuit 902 is shown in FIG. 50.

Word line driver circuits 902 in tracking circuit 898 drive word line model circuits 900 and 901 which, as noted above, mimic the RC delayed response of word lines 70 and sensing circuits 64 and 65 in the array to being driven by word line driving signals from word line drivers 902. Thus, transitions in the outputs from model circuits 900 and 901 will reflect delays with respect to transitions of the driver signals from word line drivers 902.

Figure 51:
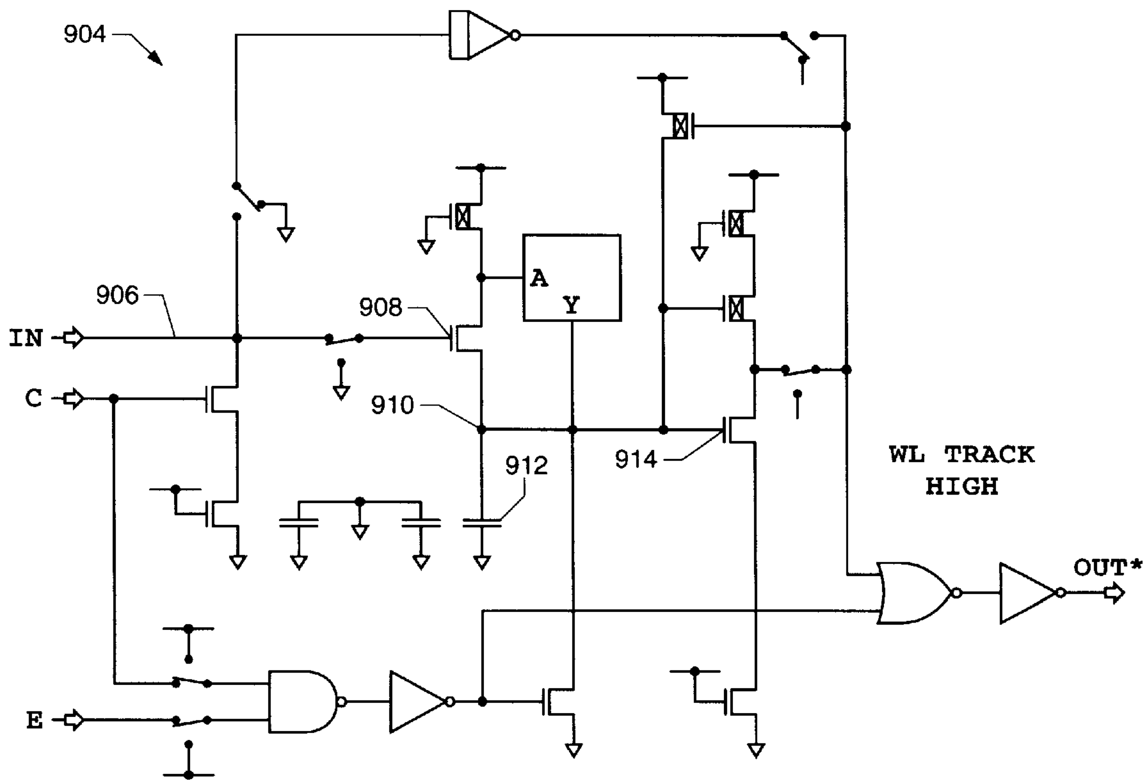
FIG. 51 is a schematic diagram of a word line track high circuit in the memory device of FIG. 2.
Figure 52:
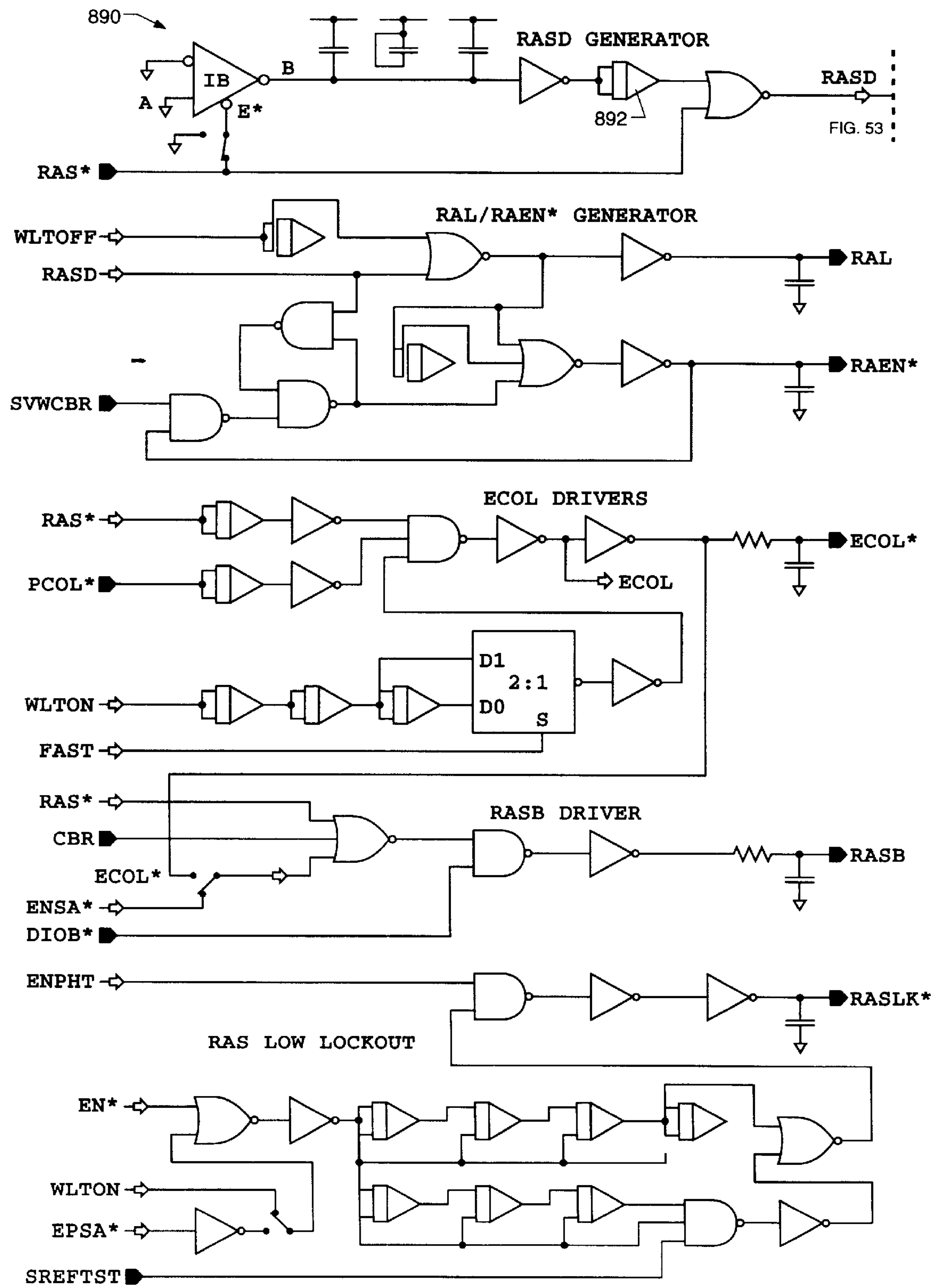
FIG. 52 is a schematic diagram of a RAS Chain circuit in the memory device of FIG. 2.

With continued reference to FIG. 49, the output from word line model circuit 900 is applied to the inputs of a pair of word line track high circuits 904, one of which is shown in FIG. 51. Word line track high circuits 904 operate to mimic the accessing of a memory cell on a word line, as follows: the input 906 to word line track high circuit 904 is applied to a transistor 908 which is formed in the same manner as the access devices in each memory cell 72 in the memory array of device 10. Thus, as the output from word line model circuit 900 goes high, device 908 turns on, causing charging of a node designated 910 in FIG. 51. The rate of charging of node 910, however, is controlled or limited due to the presence of a capacitor 912 coupled thereto. Capacitor 912 is provided in order mimic the digit line capacitance during an access to a memory cell in the arrays. The use of capacitor 912 for this purpose is believed to be advantageous in that capacitor 912 can be readily modelled to closely mimic the digit line capacitance over a range of temperatures and operating voltages.

Once node 910 is charged to a sufficiently high voltage (i.e., above the threshold voltage of N-channel device) the output signal OUT* from word line track high circuit 904 is asserted (low).

With continued reference to FIG. 49, the outputs from both word line track high circuits 904 are NORed together and passed through a delay network to derive the WLTON output from word line tracking driver 898. Delay network is included to add a safety margin in the assertion of WLTON, and to allow for adjustment of word line tracking driver circuit 898 through metal options.

The output of word line model circuit 901 is applied to another delay network 918 to derive a WLTOFF output signal. The WLTON and WLTOFF output signals are applied to the inputs of and ENSA/EPSA control circuit 920, shown in FIG. 55. Circuit 920 derives an N-type sense amplifier enable signal ENSA and a P-type sense amplifier enable signal EPSA to enable and disable N-type sense amplifiers 82 and P-type sense amplifiers 80 in sense amplifier circuits 64 and 65 (see FIG. 16) at precise instants, based upon the assertion of the WLTON and WLTOFF outputs from word line tracking circuit. In this way, the critical timing of memory cycle sensing is achieved.

TEST MODE LOGIC

DRAM 10 is in accordance with the presently disclosed embodiment of the invention is capable of being operated in a test mode wherein it can be determined, for example, whether defects in the integrated circuit make it necessary to switch-in certain redundant circuits (rows or columns). Some of the circuitry associated with this test mode of DRAM 10 is depicted in FIGS. 56 through 63.

One notable aspect of the test mode circuitry relates to the supervoltage detect circuit 960 shown in FIG. 57. Supervoltage detect circuits similar to that shown in FIG. 57 are used in various portions of the circuitry of device 10, to detect voltage levels applied to input pins of the device which are higher than the standard logic-level (e.g., 0 to 3.3 or 5 volts) signals normally applied to those inputs. Supervoltages are applied in this manner 10 to trigger device 10 temporarily into different modes of operation, for example, fuse programming modes, test modes, etc., as will be hereinafter described in further detail.

Supervoltage detect circuit 960 of FIG. 57 operates to detect a "supervoltage" (e.g., 10 volts or so) applied to address pin A7 (designated XA7 in FIG. 57), and to assert an output signal SVWCBR in response to such detection. As will hereinafter be explained, care must be taken to ensure that supervoltage detect circuit 960 is operable even when the power supply voltage $V_{cc}$ applied to device 10 is higher than normal, e.g., during burn-in of the device to avoid infant mortality.

During normal operation of supervoltage detect circuit 960 in FIG. 57, the input signal BURNIN thereto is low (0 volts), so that the supervoltage reference voltage SVREF is pulled to $V_{cc}$. SVREF is applied to the SV detect circuit 961, which operates to apply the SVREF voltage to a resistance such that SVREF must exceed a predetermined level before SVWCBR is asserted. The trip point of SV detect circuit 961 is reference to $V_{cc}$, and for normal operation is set at about 6.8 volts when $V_{cc}$=2.7 volts.

The signal BURNIN is generated from a BURNIN detect circuit shown in FIG. 195. During burn-in, when $V_{cc}$ is 5.5 volts, the signal BURNIN goes to $V_{cc}$ to activate a burn-in reference circuit 962. The signal SVREF will move from $V_{cc}$ to approximately ½ $V_{cc}$ such that SV detect circuit 961 is now reference to ½ $V_{cc}$. This effectively lowers the trip point of SV detect circuit 961, so that normal-magnitude supervoltages can still be detected during burn-in.

ROW ADDRESSING

Much of the circuitry associated with row addressing in memory device 10 in accordance with the presently disclosed embodiment of the invention was described above in connection with the general layout and control logic portions of the device. Certain other circuits associated with row addressing are depicted in FIGS. 70 through 75.

COLUMN ADDRESS BUFFERING

Various circuits associated with the buffering of column addresses in memory device 10 are shown in FIGS. 87 through 98.

COLUMN DECODE DQ SECTION

The circuitry associated with column decoding and data input/output terminals (so-called "DQ" terminals) is shown in FIGS. 99–109.

COLUMN BLOCK

A block diagram of the column block of memory device 10 is shown in FIG. 113.

COLUMN FUSES

Memory device 10 in accordance with the presently disclosed embodiment of the invention includes a plurality of redundant columns which may be selectively switched-in to replace primary columns in the array which are found to be defective. The column fusebanks 24 previously mentioned with reference to FIG. 5, are shown in more detail in FIG. 110 through 112, and will be described in further detail below in connection with the description of redundancy circuits in device 10.

ON-CHIP TOPOLOGIC DRIVER

An on-chip topology logic driver of memory device 10 operates selectively inverts the data being written to and read from the addressed memory cells. The topology logic driver selectively inverts the data for certain addressed memory cells and does not invert the data for other addressed memory cells based upon location of the addressed memory cells in the circuit topology of the memory array. In the presently preferred embodiment of the invention, the topology logic driver includes a combination of logic gates that embody a boolean function of selected bits in the address, whereby the boolean function defines the circuit topology of the memory array.

FIG. 218 shows an alternative block diagram of semiconductor memory IC chip 10 constructed in accordance with the presently disclosed embodiment of the invention. Those of ordinary skill in the art will appreciate that the depiction of memory device 10 in FIG. 218 has been simplified as compared with those of earlier Figures. For example, while FIG. 218 shows an address decoder 200 receiving both row and column addresses, it will be clear from the descriptions above that this block 200 actually embodies separate row and column address decoders. Column decoders 40 within column block segments 33 have been described above with reference to FIG. 8 and are shown in more detail in FIGS. 99 through 109. Row decoding in accordance with the presently preferred embodiment of the invention is distributed among various circuits within memory device 10, including row address predecoder circuit 28 described above with reference to FIGS. 5 and 19, and local row address decoders 100 and 102 described above with reference to FIGS. 14, 18, and 19. Nonetheless, the simplifications made to the block diagram of FIG. 218 have been made for the purposes of clarity in the following description of the global redundancy scheme in accordance with the presently disclosed embodiment of the invention.

Memory device 10 includes a memory array, designated as 202 in FIG. 218. Memory array 202 in FIG. 218 represents what has been described above as comprising four quadrants 12 each comprising two 8 Mbit PABs 14L and 14R (see, e.g., the foregoing descriptions with reference to FIGS. 2, 3, 5, 6, 13, and 14).

Data I/O buffers designated 204 in FIG. 218 represent the circuitry described above with reference to FIGS. 164 through 184. The block designated read/write control 205 in FIG. 218 is intended to represents the various circuits provided in memory device 10 for generating timing and control signals used to manage data write and data read operations which transfer data between the I/O buffers and the memory cells. In this manner, the data I/O buffers and the read/write controller 205 effectively form a data I/O means for reading and writing data to chosen bit lines.

Memory array 202 is comprised of many memory cells (64 Mbit in the presently preferred embodiment) arranged in a predefined circuit topology. The memory cells are addressable via column address signals CA0 through CAJ and row address signals RA0 through RAK. Address decoding circuitry 200 receives row addresses and column address from an external source (such as a microprocessor or computer) and further decodes the addresses for internal use on the chip. The internal row and column addresses are carried via an address bus designated 206. Address decoding circuitry 200 thus provides an address (consisting of the row and column addresses) for selectively accessing one or more memory cells in the memory array.

Data I/O buffers 204 temporarily hold data written to and read from the memory cells in the memory array. The data I/O buffers, which are referred to herein and in the Figures as DQ buffers, are coupled to memory array 202 via a data bus designated 208 in FIG. 218 that carries data bits D0-DL.

Memory IC 30 also has an on-chip topology logic driver, designated with reference number 210 in FIG. 218, that is coupled to address bus 206 and to the memory array 202. Topology logic driver 210 in FIG. 218 represents the circuitry that is shown in greater detail in the schematic diagram of FIG. 73. Topology logic driver 210 outputs one or more invert signals which selectively invert the data being written to and read from the memory cells over I/O data bus 42 to account for complexities in the circuit topology of the IC, as discussed in the background of the invention section above. Topology logic driver 210 selectively inverts the data for certain memory cells and does not invert the data for other memory cells based upon location of the memory cells in the circuit topology of the memory array.

Figure 119:
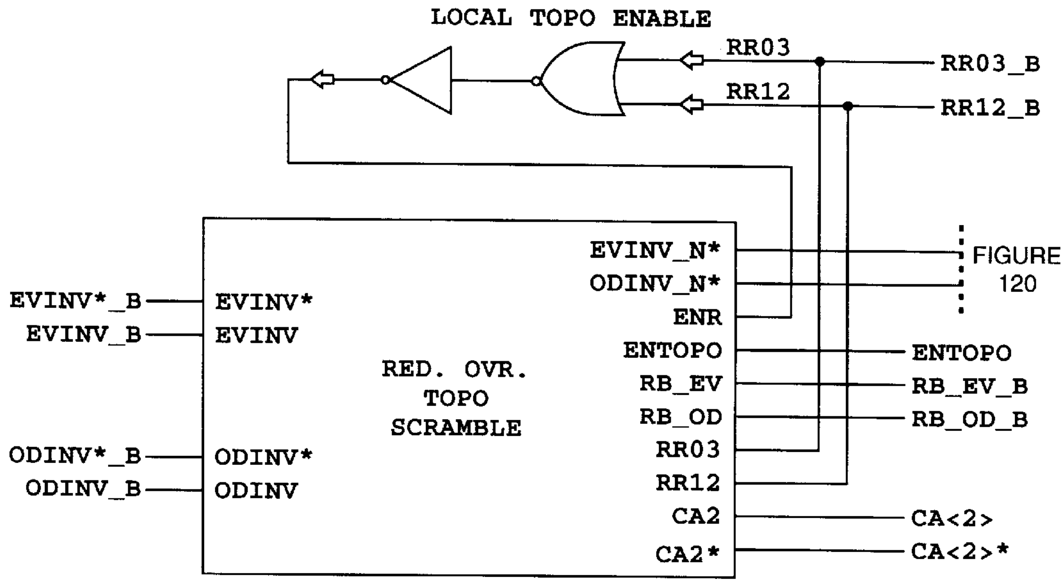
Figure 120:
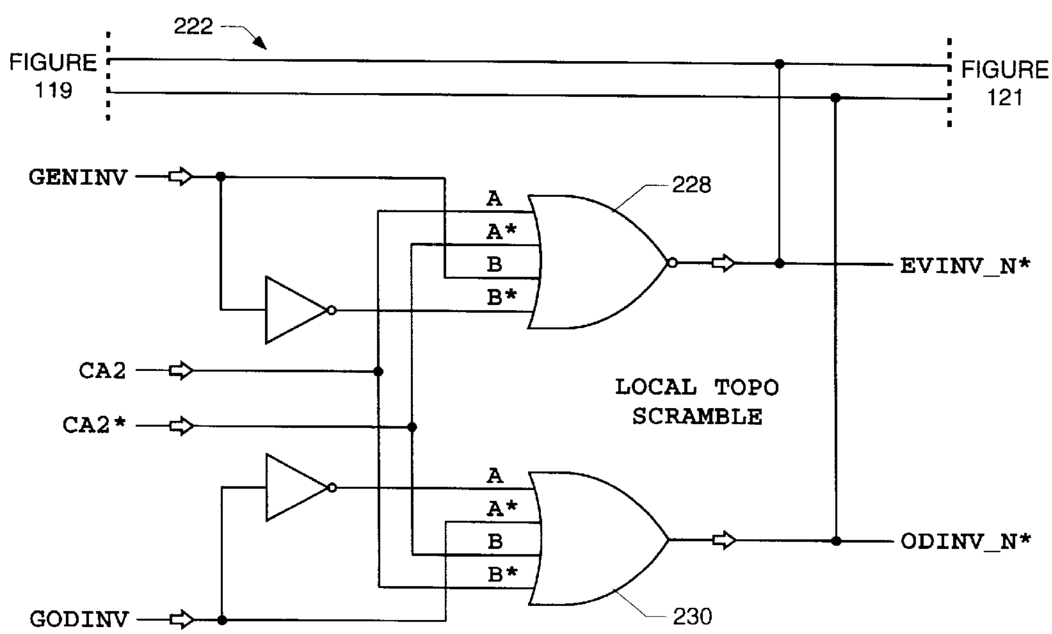
Figure 121:
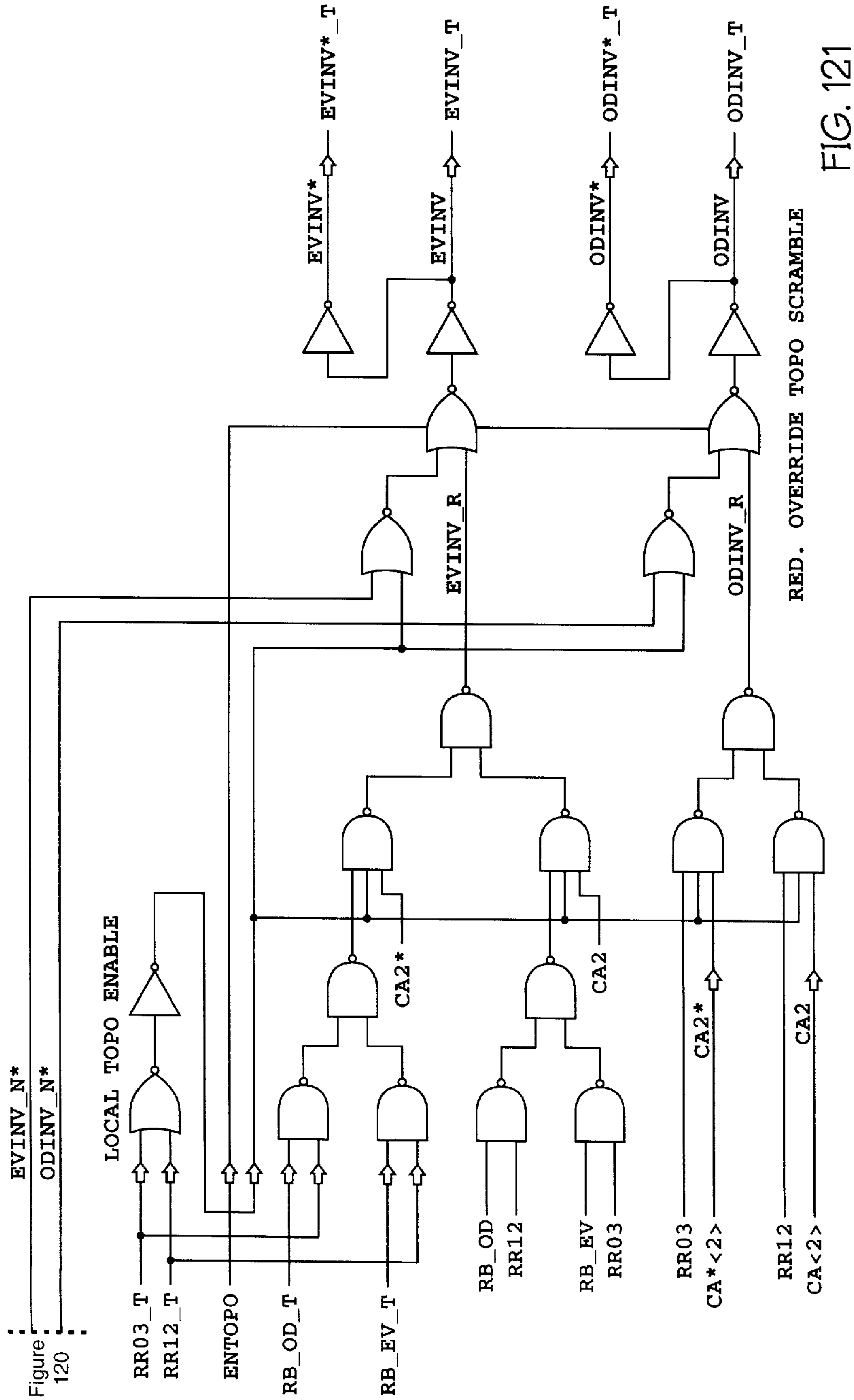
Figure 122:
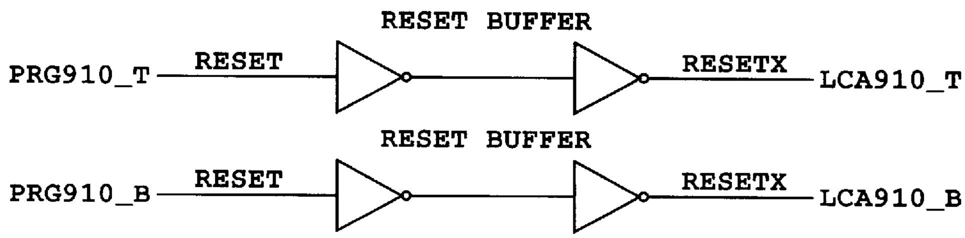
Figure 123:
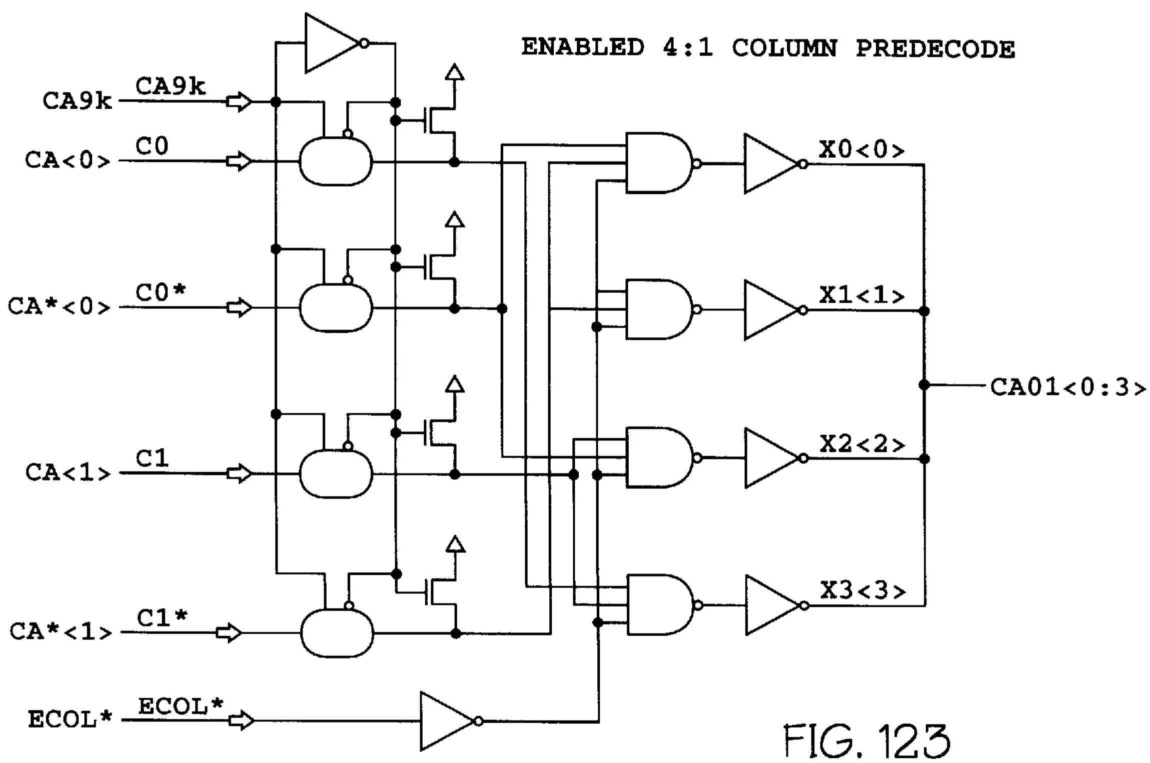
Figure 124:
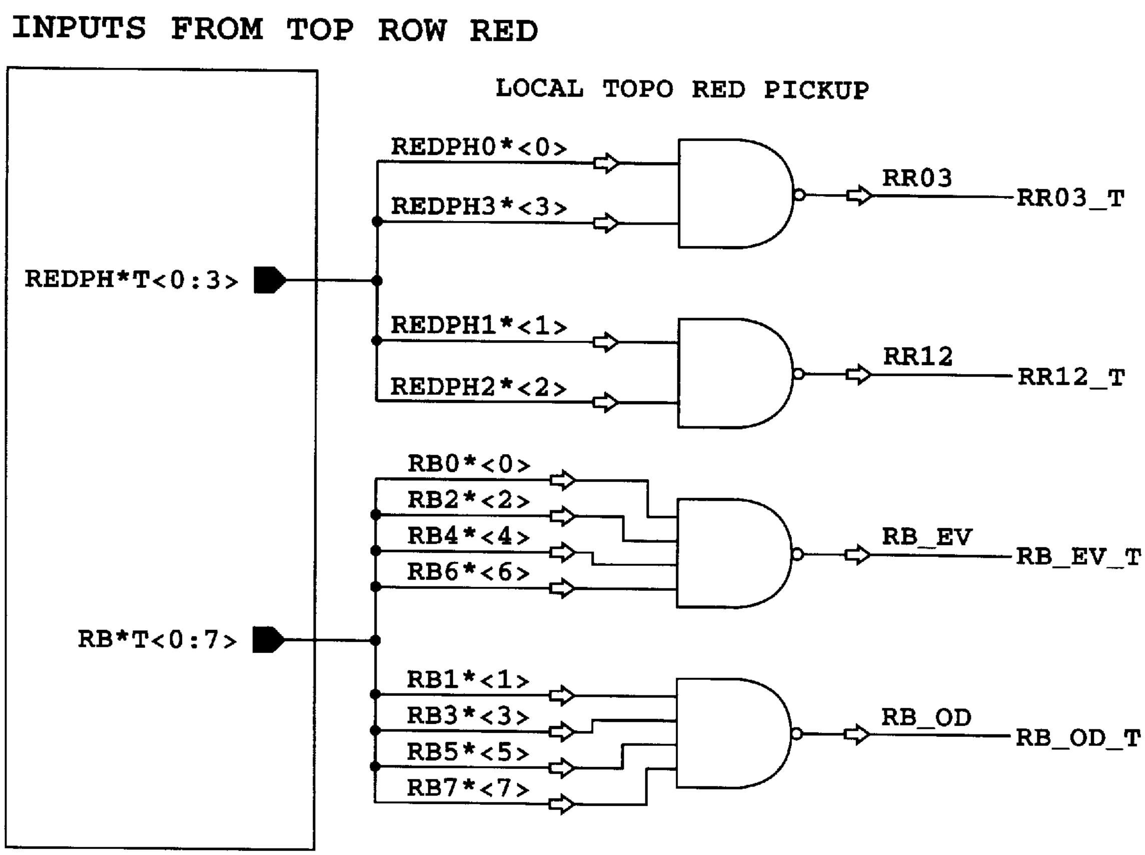
Figure 125:
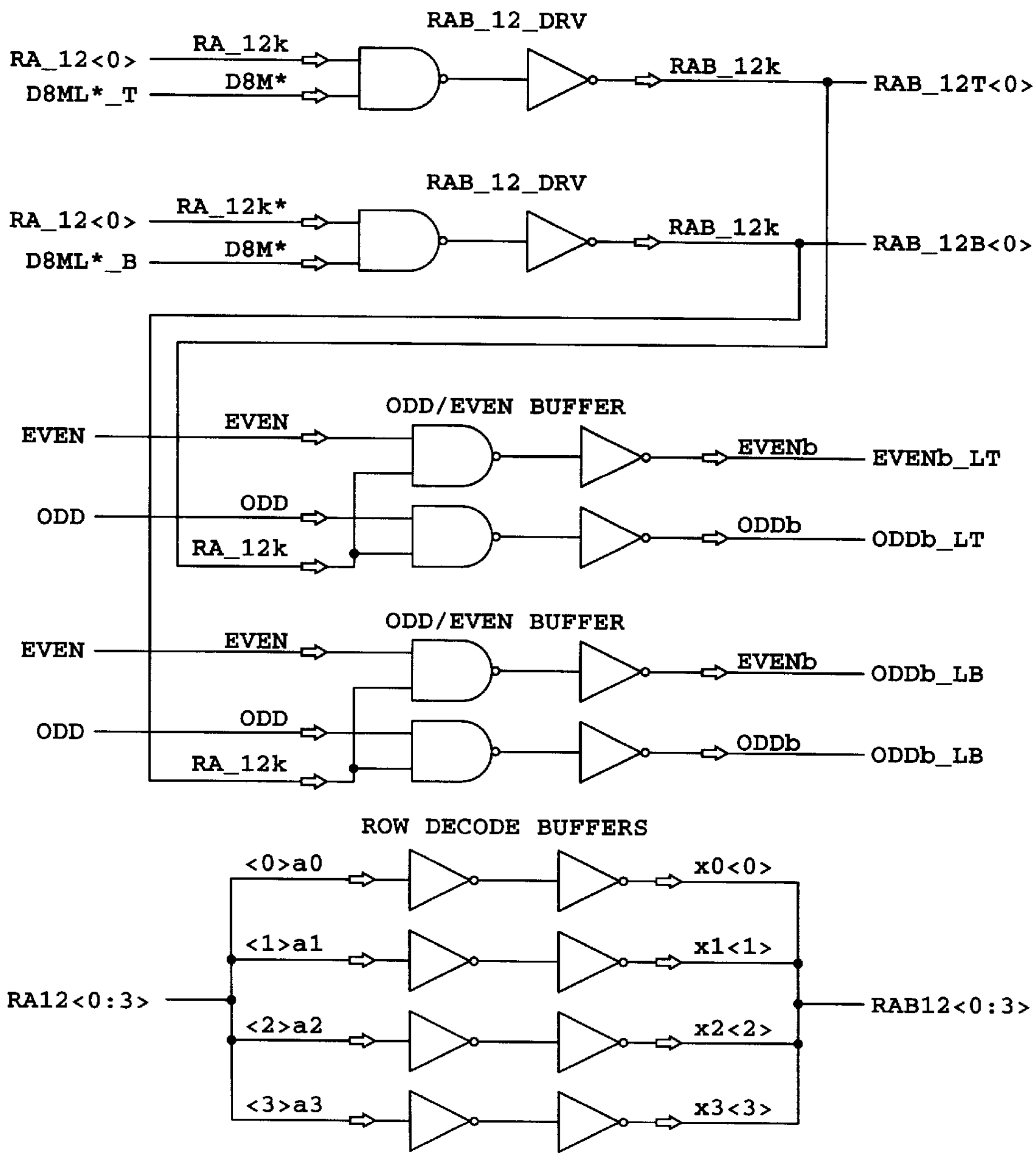
Figure 126:
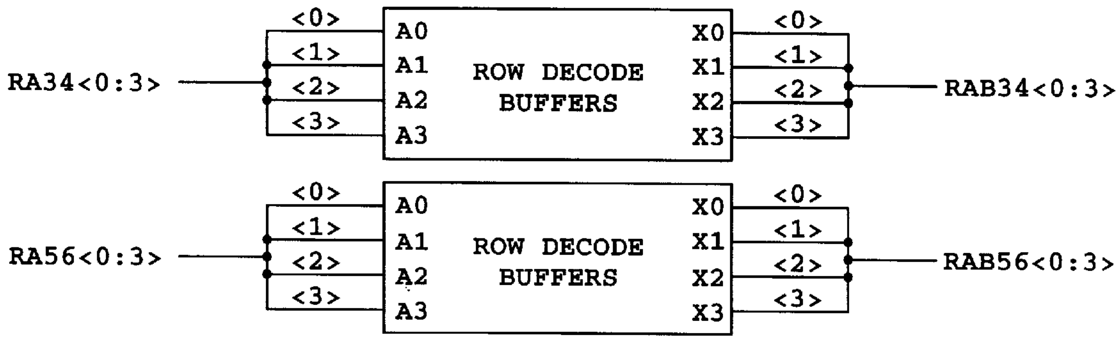
Figure 127:
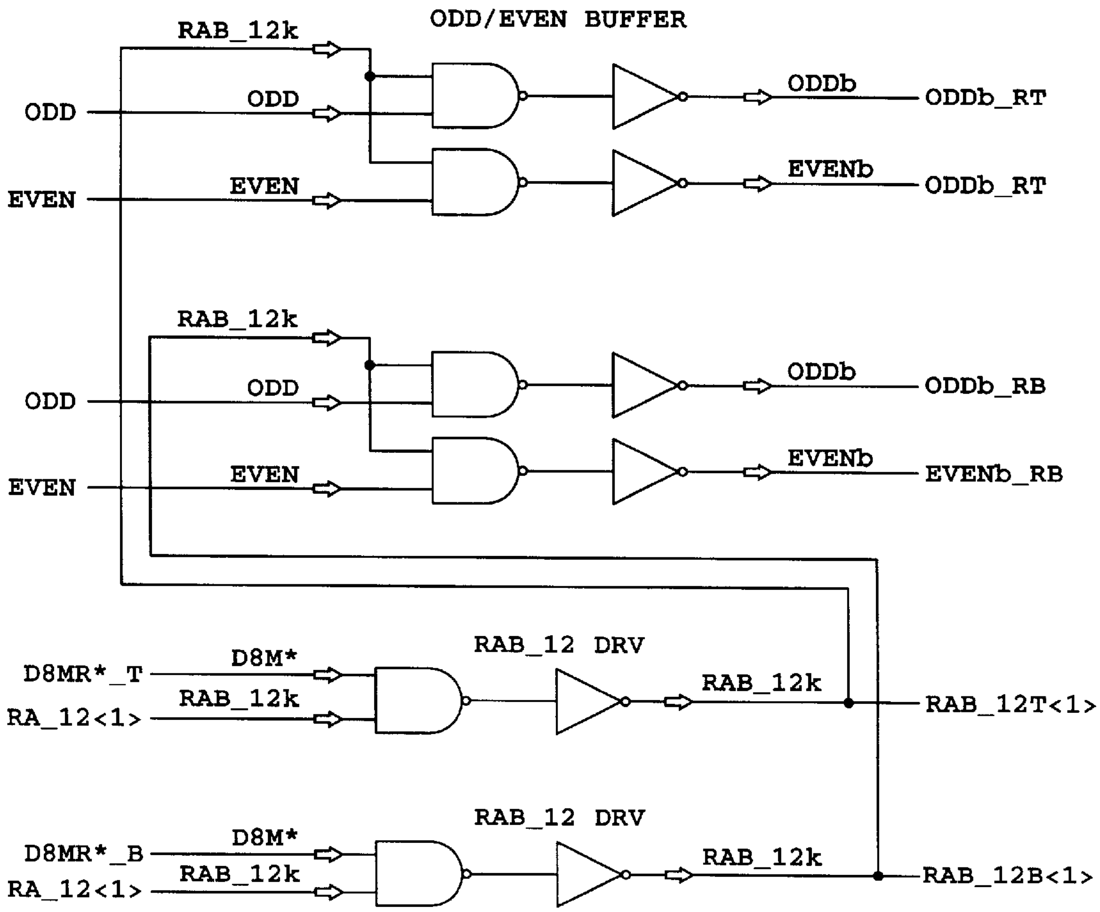
Figure 128:
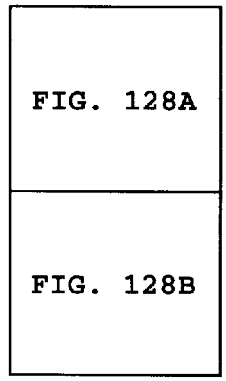
Figure 128A:
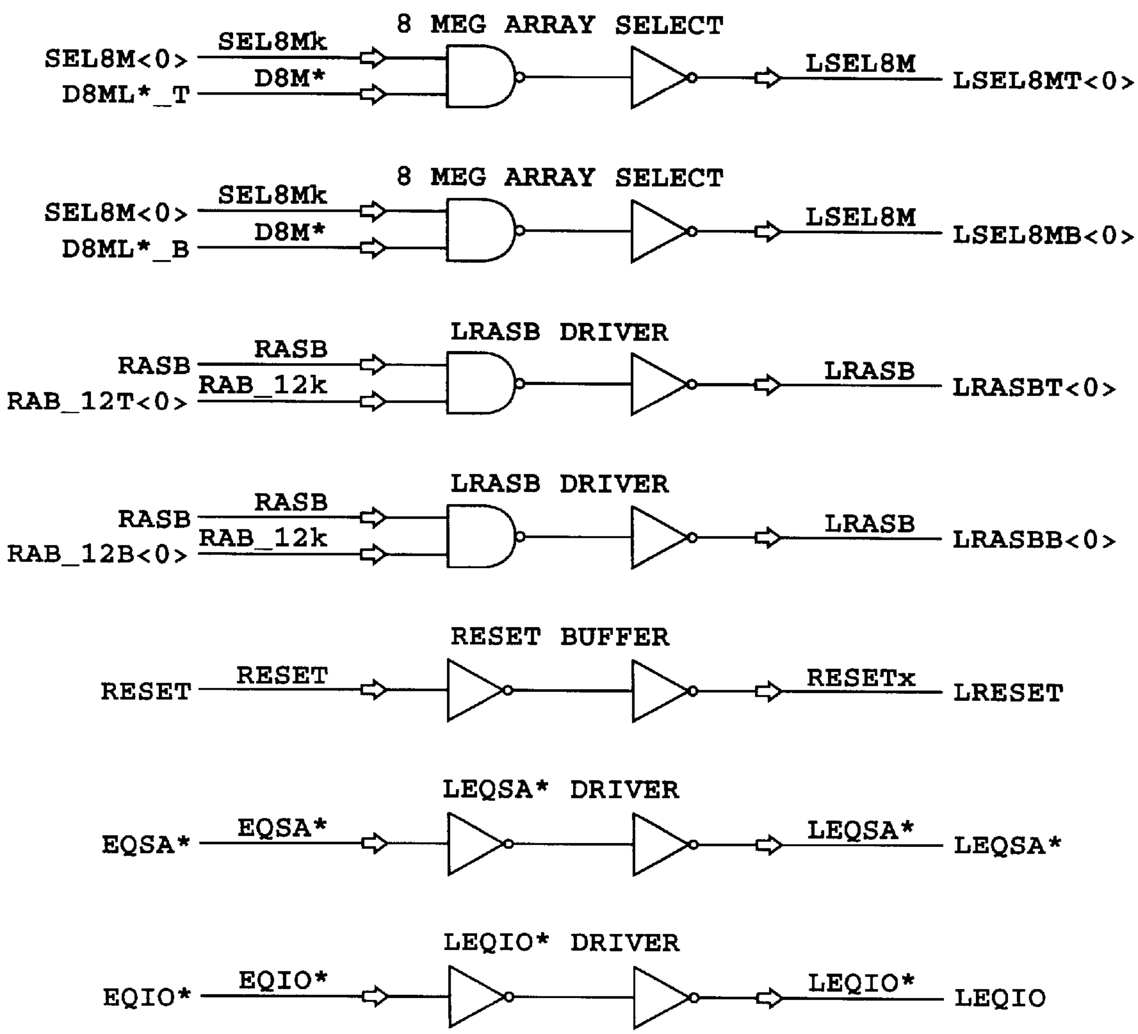
Figure 128B:
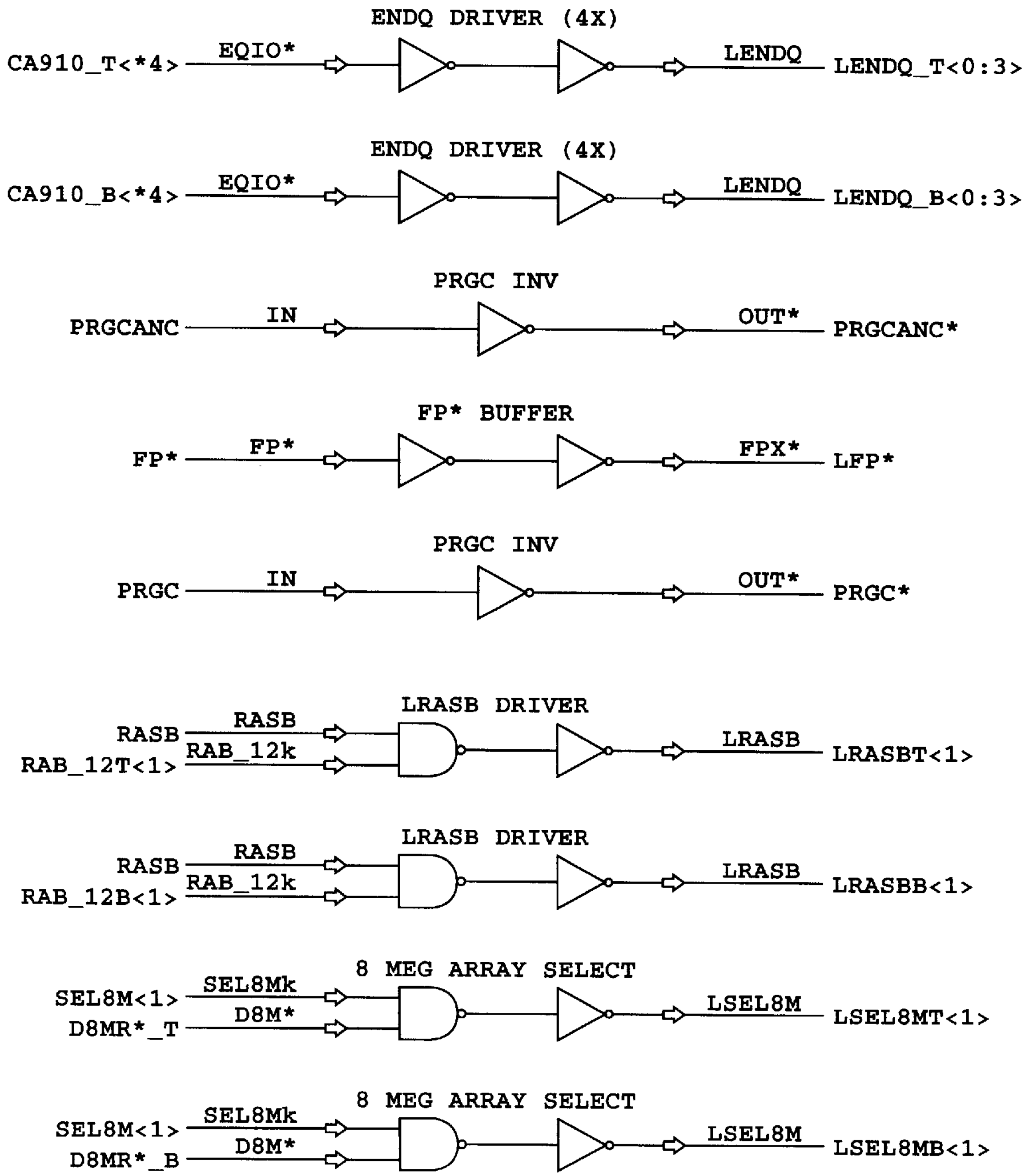
Figure 129:
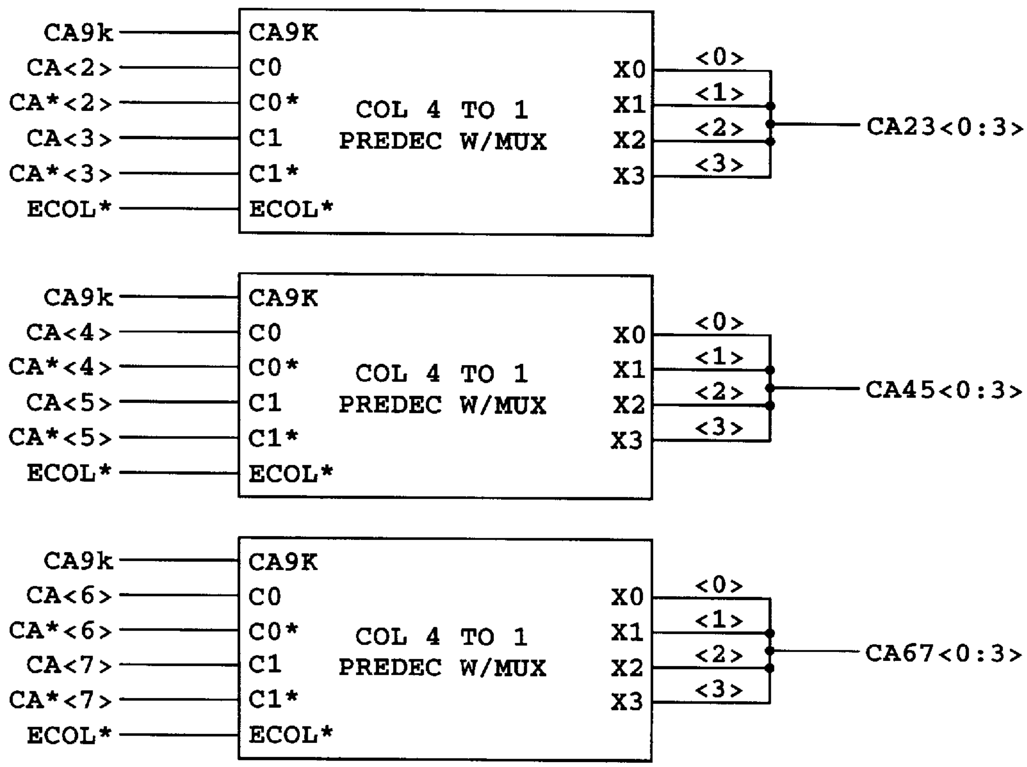
Figure 130:
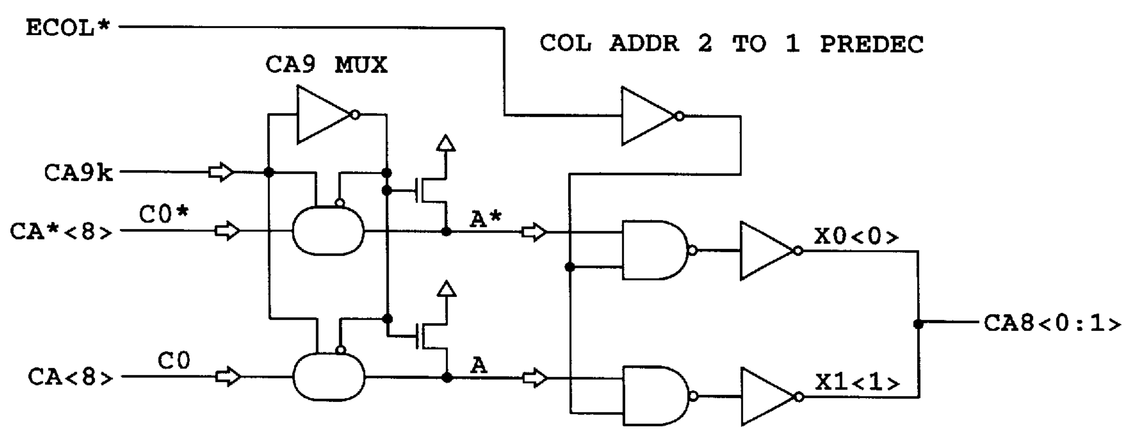

Topology logic driver 50 outputs invert signals in the form of two sets of complementary signals EVINV/EVINV* and ODINV/ODINV* (see FIGS. 119 through 121. The complementary EVINV/EVINV* signals are used to alternately invert or not invert the even bits of data being transferred to and from the memory array over data bus 208. Likewise, the complementary ODINV/ODINV* signals are used to alternately invert or not invert the odd bits of data. These complementary signals are described below in more detail. The topology logic driver 210 is uniquely designed for different memory IC layouts. It is configured specially to account for the specific topology design of the memory IC. Accordingly, topology logic driver 210 will be structurally different for various memory ICs. The logic driver is preferably embodied as logic circuitry that expresses the boolean function that defines the circuit topology of the given memory array. By designing the topology logic driver onto the memory IC chip, there is no need to specially program the testing machines used to test the memory ICs with complex boolean functions for every test batch of a different memory IC. The memory IC will now automatically realize the topology adjustments without any external consideration by the manufacturer or subsequent user.

FIG. 219, which is a somewhat simplified rendition of the diagrams of FIGS. 14, 15, and 18, shows a portion of the memory array 202 from FIG. 218. The memory portion has a first memory block 52 and a second memory block 54. Each memory block has multiple arrayed memory cells (designated 72 in FIGS. 14 and 15) connected at intersections of row access lines 70 and column access lines 71. A first memory block designated 212 in FIG. 219 is coupled between two sets of sense amplifiers 64 and 65. Similarly, a second memory block 214 in FIG. 219 is coupled between sense amplifiers 65 and 64. Sense amplifiers 64 and 65 are connected to column access lines 71, which are also commonly referred to as bit or digit lines. Column access lines 71 are selected by column decode circuit 40. Column addressing has been described hereinabove with reference to FIGS. 5, 8, and 99–109.

Each memory block in array 202 is also coupled between odd and even row local row decoders 100 and 102, respectively, described above with reference to FIGS. 14, 18, 19, and 20. These decode circuits are connected to row access lines 70, which are also commonly referred to as word lines. Local row decoders 100 and 102 select the row lines 70 for access to memory cells 72 in the memory array blocks based upon the row address received by memory device 10.

Recall that FIG. 14 shows a portion of memory device 10 in more detail. The memory array block shown in FIG. 14 has a plurality of memory cells (designated by the small boxes 72) operatively connected at intersections of the row access lines 70 and column access lines 71. Column access lines are arranged in pairs to form bit line pairs. Two sets of four bit line pairs are illustrated where each set includes bit line pairs D0/D0*, D1/D1*, D2/D2*, and D3/D3*. The upper or first set of bit line pairs is selected by column address bit CA2=0 and the lower or second set of bit line pairs is selected by column address bit CA2=1.

The even bit line pairs D0/D0* and D2/D2* are coupled to left or even primary sense amplifiers 64. The odd bit line pairs D1/D1*and D3/D3* are coupled to right or odd primary sense amplifiers 65. The even or odd sense amplifiers are alternatively selected by the least significant bit of the column address CA0, where CA0=0 selects the even primary sense amplifiers 64 and CA0=1 selects the odd primary sense amplifiers 65. The four even bit line pairs D0/D0* and D2/D2* are further coupled to two sets of I/O lines that proceed to secondary DC sense amplifiers 80, Likewise, the four odd bit line pairs D1/D1* and D3/D3* are coupled to a different two sets of I/O lines which are connected to secondary DC sense amplifiers 56, as described above with reference to FIGS. 13 and 17. The secondary DC sense amplifiers 56 are coupled via the same data line to a data I/O buffer.

DC sense amplifiers 56 are shown in FIGS. 17 and 103 to have incoming invert signals TOPINV and TOPINV*. These signals are generated in topology logic driver 210, which is shown in more detail in FIG. 73. These invert signals can separately invert the data on bit lines D0/D0*, D1/D1*, D2/D2*, and D3/D3*.

Individual bit line pairs have a twisted line structure where bit lines in the bit line pairs cross other bit lines in the bit line pairs at twist junctions in the middle of the memory array block (such as those designated 1 in FIG. 1, and such as can be seen in FIGS. 13, 14, and 15). The preferred construction employs a twist configuration involving overlapping of bit lines from two bit line pairs.

Row lines 70 are used to access individual memory cells coupled to the selected rows. The even rows 512, 514, . . . , 768, 770, etc. . . in FIG. 14 are coupled to even row decode circuit 102, whereas the odd rows 513, 515, . . . , 769, 771, . . . , etc. . . are coupled to odd row decode circuit 100. The memory cells to the left of the twist junctions are addressed via row address bit RA8=0 and the memory cells to the right of the twist junctions 76 are addressed via row address bit RA8=1.

Some of the memory cells in the array block are redundant memory cells. For example, the memory cells coupled to rows 512 and 768 might be redundant memory cells. Such cells are used to replace defective memory cells in the array that are detected during testing. One preferred method for testing the memory IC having on-chip topology logic driver is described below. The process of substituting redundant memory cells for defective memory cells can be accomplished using conventional, well known techniques.

The IC layout of FIG. 14 presents a specific example of a circuit topology of 64 Meg DRAM in accordance with the presently disclosed embodiment of the invention. Given this circuit topology, a topology logic driver 210 can be derived for this DRAM. The unique derivation for the DRAM will now be described in detail with reference to FIGS. 220 through 224.

FIG. 220 shows a table representing the circuit topology of the array block from FIG. 14. The table contains example rows R512, R513, R514, and R515 to the left of the twist and example rows R768, R769, R770, and R771 to the right of the twist. The table is generated by examining the circuit topology in terms of memory cell location and assuming that the binary value "1" is written to all memory cells in the array block 52.

Consider the memory cells coupled to row R512. This row is addressed by RA8=0, RA1=0, and RA0=0. The upper set of bit line pairs is addressed via CA2=0. For the bit line pair D1/D1*, the memory cell on row R512 in the array block 52 (FIG. 14) is coupled to bit line D1. Thus, the table reflects that a binary "1" should be written to bit line D1 to place a data value of "1" in the memory cell. For bit line pair D0/D0*, the memory cell on row R512 is coupled to bit line D0*. The table therefore reflects that a binary "0" should be written to bit line D0 (i.e., this is the same as writing a binary "1" to complementary bit line D0*) to place a data value of "1" in the memory cell. The table is completed in this manner. Notice that some of the data bits entered in the table are binary"0"s even though the test pattern is all "1"s. This result is due to the given circuit topology which requires the input of a binary "0", or complementary inverse of binary "1", to effectuate storage of a binary"1" in the desired cell.

For this circuit topology, the even data bits placed on the even bit lines D0 and D2 are identical throughout the array. Similarly, the odd data bits placed on the odd bit lines D1 and D3 are identical. Accordingly, two pair of complementary signals can be used to selectively invert the even and odd bits of data for input to the memory cells. These complementary inversion signals are EVINV_T/EVINV_T* and ODINV_T/ODINV_T*. These signals are derived as follows: the circuit of FIG. 73 derives the signals GEINV and GODINV from row address bits RA0, RA1, and RA8. The GEINV and GODINV signals are applied to the circuitry of FIG. 120, which derives EVINV_N* and ODINV_N* from the GEINV and GODINV signals and column address bit CA2. The circuit of FIG. 121 then derives the EVINV_T/EVINV_T* and ODINV_T/ODINV_T* signals. EVINV_T/EVINV_T* are used to invert the even bits and ODINV_T/ODINV_T* are used to invert the odd bits.

A boolean function for the inversion signals EVINV_T and ODINV_T for the example circuit topology of FIG. 4 can be derived from the FIG. 5 table as follows:

$$EVINV\_T = [(RA8^* \times RA0^* \times RA1^*) + (RA8^* \times RA0 \times RA1) + (RA8 \times RA0^* \times RA1^*) + (RA8 \times RA0 \times RA1)] \times CA2^* +$$

-continued $$[(RA8^* \times RA0 \times RA0^*) + (RA8^* \times RA0^* \times RA1) + (RA8 \times RA0 \times RA1^*) + (RA8 \times RA0^* \times RA1)] \times CA2$$

$$= (RA0^* \times RA1^* + RA0 \times RA1) \times CA2^* + (RA0 \times RA1^* + RA0^* \times RA1) \times CA2$$

$$ODINT\_T = [(RA8^* \times RA0 \times RA1^*) + (RA8^* \times RA0^* \times RA1) + (RA8 \times RA0^* \times RA1^*) + (RA8 \times RA0 \times RA1)] \times CA2^* +$$

$$[(RA8^* \times RA0^* \times RA1^*) + (RA8^* \times RA0 \times RA1) + (RA8 \times RA0 \times RA1^*) + (RA8 \times RA0^* \times RA1)] \times CA2$$

$$= (RA8^* \times (RA0 \square RA1) + RA8 \times (RA0 \square RA1)^*] \times CA2^* + [RA8^* \times (RA0 \square RA1)^* + RA8 \times (RA0 \square RA1)] \times CA2$$

Figure 73:
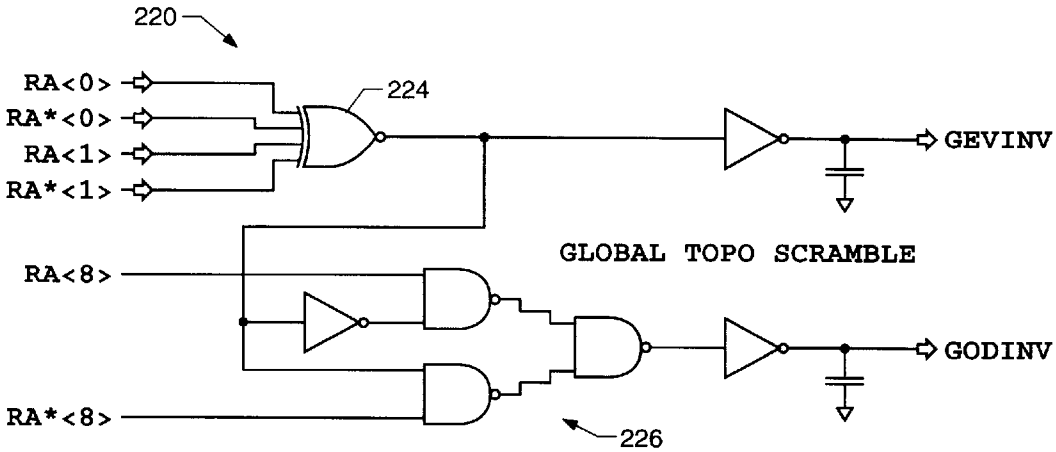
FIG. 73 is a schematic diagram of a global topology scramble circuit in the memory device of FIG. 2.
Figure 74:
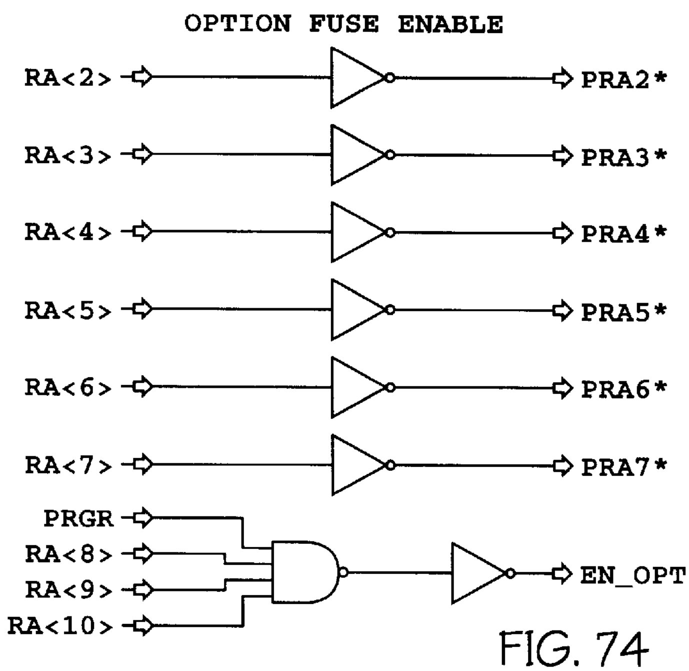
FIG. 74 is a schematic diagram of circuitry associated with fuse addressing in the memory device of FIG. 2.
Figure 75:
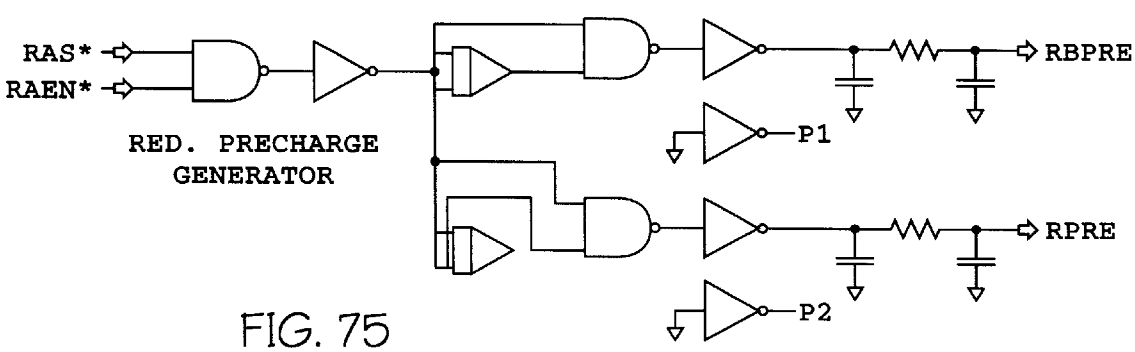
FIG. 75 is a schematic diagram of redundant row line precharge circuitry in the memory device of FIG. 2.

FIGS. 73 and 120 show circuits that embody these boolean functions for generating the inversion signals EVINV and ODINV based upon the row and column addresses. The circuits of FIGS. 73 and 120 are part of the topology logic driver 210 for the 64 Meg DRAM in accordance with the presently disclosed embodiment of the invention. The topology logic driver includes a global topology decoding circuit 220 (FIG. 73) and multiple regional topology decoding circuits 222 (FIG. 120) coupled to the global decoding circuit.

The global topology decoding circuit 220 of FIG. 73 is preferably positioned at the center of the memory array. It identifies regions of memory cells in the memory array for possible data inversion based upon a function of the row address signals RA0, RA0*, RA1, RA1*, RA8, and RA8*. Global topology decoding circuit 100 has an exclusive OR (XOR) gate 224 coupled to receive the two least significant row address bits RA0, RA1, and their complements. These row address bits are used to select specific row lines. The output of the OR function is inverted to yield the global even bit inversion signal GEVINV. A combination of AND gates 226 couple the result of the OR function to row address bits RA8 and RA8*. These row address bits are used to select memory cells on either side of the twist junctions. The results of this logic is the global odd bit inversion signal GODINV.

Multiple regional topology decoding circuits, such as circuit 222 in FIG. 120, are provided throughout the array to identify a specific region of memory cells for possible data inversion. Each regional topology decoding circuit 222 comprises two OR gates 228 and 230 which perform an OR function of the global invert signals GEVINV and GODINV and the column address signals CA2 and CA2*. The column address signals CA2 and CA2' are used to select a certain set of bit line pairs D0/D0*–D3/D3*. Regional circuit 222 outputs the inversion signals EVINV_N* and ODINV_N* used in the regional array blocks.

In the schematic diagram of DC sense amplifier 56 in FIG. 17, there is shown even bit inversion I/O circuitry which interfaces the EVINV/EVINV* signals with the internal even bit line pairs (i.e., D0/D0* and D2/D2*) in the memory array. DC sense amplifier 56 is shown in FIG. 17 being coupled to bit line pair DL/DL* for purposes of explanation. It operatively inverts data being written to or read from the bit line pair DL/DL*. The construction of an odd bit inversion I/O circuit that interfaces the ODINV/ODINV* signals with the internal odd bit line pairs is identical.

Even bit inversion I/O circuitry in FIG. 17 includes an exclusive-or (XOR) gate 232 which receives the EVINV_T and EVINV_T* signals (or ODINV_T/ODINV_T* signals) output from the circuitry of FIG. 121. (As shown in FIG. 17, the EVINV_T/EVINV_Y* or ODINV_T/ODINV_T* signals are received at the TOPINV and TOPINV* inputs to DC sense amplifier 56. The circuit of FIG. 17 also includes a crossover transistor arrangement or data invertor 234 and a write driver/data bias circuit 236. Data is transferred to or from bit line pair DL/DL* via data read lines DR/DR*. The data read lines DR/DR* from DC sense amplifier 56 are connected to the data I/O buffer circuitry 204 (FIG. 218) which shown in greater detail in FIGS. 164 through 184. As shown in FIG. 17, data is written or read depending upon the data write control signal DW which is input to XOR gate 232. The output of XOR gate 232 controls write driver 234.

The EVINV/EVINV* signals are coupled to the crossover transistor arrangement or data invertor 234. If the data is to be inverted, the EVINV_T* signal is low and the EVINV_T signal is high. This causes data invertor 234 to flip the data being written into or read from the data lines DL/DL*. Conversely, if the data is not inverted, the EVINV_T* signal is high and the EVINV_T signal is low. This causes the data invertor 234 to keep the data the same, without inverting it.

The on-chip topology logic driver in accordance with the present invention, which includes global topology circuit 220 of FIG. 73, regional topology circuit 222 of FIG. 120 and inversion I/O circuit shown in FIG. 17 to include XOR gate 232, inverter 234, and write driver/data bias circuit 236, effectively inverts data to certain memory cells depending upon a function of the row and column addresses. In the above example, the logic driver operated based on a function of row bits RA0, RA0*, RA1, RA1*, RA8, RA8* and column bits CA2, CA2*. By using the address bits, the logic driver can account for any circuit topology, including twisted bit line structures. In this manner, the topology logic driver defines a data inversion means for selectively inverting the data being written to and read from the addressed memory cells based upon location of the addressed memory cells in the circuit topology of the memory array, although other means can be embodied.

The above description is tailored to a specific preferred embodiment of a 64 Meg DRAM. However, the invention can be used for any circuit topology, and is not limited to the structure shown and described. For example, the topology might employ a twisted row line structure, or complex memory block mirroring concepts, or more involved twisted bit line architectures. Accordingly, another aspect of this invention concerns a method for producing a memory integrated circuit chip having an on-chip topology logic driver. The method includes first designing the integrated circuit chip of a predefined circuit topology. Next, a boolean function representing the circuit topology of the integrated circuit is derived. Thereafter, a topology logic circuit embodying the boolean function is formed on the integrated circuit chip.

The memory IC 10 of this invention is advantageous over prior art memory ICs in that it has a built-in, on-chip topology circuit. The on-chip topology logic driver selectively inverts the data being written to and read from the addressed memory cells based upon the location of the addressed memory cells in the circuit topology of the memory array. The use of this predefined topology circuit alleviates the need for manufacturers and user trouble shooters to preprogram testing machines with the boolean function for the specific memory IC. Each memory IC instead has its own internal address decoder which accounts for circuit topologies of any complexity. The testing machine need only write the data test patterns to the memory array without concern for whether the data ought to be inverted for topology reasons.

Another benefit of the novel on-chip topology decoding circuit is that it facilitates testing of the memory array. The on-chip topology circuit is particularly useful in a testing compression mode where many is in the test bits are written and read simultaneously to the memory array. Therefore, another aspect of this invention concerns a method for testing a memory integrated circuit chip having a predefined circuit topology and an on-chip topology decoding circuit. This method will be described with reference to the specific embodiment of a 64 Meg DRAM described herein.

FIG. 221 illustrates the testing method of this invention. The first step 240 is to access groups of memory cells in the memory array. Next, a selected number of bits of test data are simultaneously written to the accessed groups of memory cells according to a test pattern (step 241). Example test patterns include all binary "1"s, all binary "0"s, a checkerboard pattern of alternating "1"s and "0"s, or other possible combinations of "1's and "0"s.

The on-chip topology logic driver can accommodate a large number of simultaneously written data bits. For instance, a 128× compression (i.e., writing 128 bits simultaneously) or greater can be achieved using the circuitry of this invention. This testing performance exceeds the capabilities of testing machines. Since four secondary (DC) sense amplifiers 56 are coupled to one data line, the testing machines can only write the same data to all four write drivers in secondary amplifiers 56. However, from the table in FIG. 220, it is shown that D0 and D2 may have to be in an opposite state than D1 and D3 to actually write the same data to the memory cells. Thus, data on two of the four I/O lines may have to be inverted. There is no way for an external testing machine to handle this condition. An on-chip topology circuit of this invention, however, is capable of handling this situation, and moreover can readily accommodate the maximum test address compression of selecting all read/write drivers simultaneously.

The next step 243 is to internally locate certain memory cells within the accessed groups that should receive inverted data to achieve the test pattern given the circuit topology of the memory array. In the above example table of FIG. 220, data applied to upper bit lines D0 and D2 in row R512 (where CA2=0) should be inverted to ensure that the test pattern of all "1"s is actually written to the memory cell. At step 244, the bits of test data being written to the certain memory cells are selectively inverted on-chip based upon their location in the circuit topology. The remaining bits of test data being written to the other memory cells (such as upper bit lines D1 and D3 in row R512) are not inverted.

Subsequent to the writing and inverting steps, test data is then read from the accessed groups of memory cells (step 245). The bits of test data that were previously inverted and written to the certain identified memory cells are again selectively inverted on-chip to return them to their desired state (step 246). Thereafter, at step 247, the bits of test data read from the accessed groups of memory cells are compared with the bits of test data written to the accessed groups of memory cells to determine whether the memory integrated circuits defective memory cells.

REDUNDANCY

As previously noted, memory device 10 includes a plurality of extra or "redundant" rows and columns of memory cells, such that if certain ones of the primary rows or columns of the device are found to be defective during testing of the part, the redundant rows or columns can be substituted for those defective rows or columns. By "substituted," it is meant that circuitry within device 10 causes attempts to access (address) a row or column that is found to be defective, to be re-directed to a redundant row or column. Circuitry associated with providing this capability in device 10 is shown in FIGS. 76 through 86.

Memory device 10 in accordance with the presently disclosed embodiment of the invention makes efficient use of its redundant circuits and reduces their number, and provides a system whereby a redundant circuit element can replace a primary circuit element within an entire section of a particular integrated circuit chip. Each match circuit analyzes incoming address information to determine whether the address is a "critical address" which corresponds to a specific defective element in any one of a number of sub-array blocks within the section. When a critical address is detected, the match circuit activates circuitry which disables access to the defective element and enables access to its dedicated redundant element.

There has previously been described with reference to FIGS. 2, 5, and 13, for example, the available memory in memory device 10. The memory chip is divided into eight separate 8 Mbit PAB 14. Each PAB 14 is further subdivided into 8 sub-array blocks (SABs) 18 (see FIG. 5). Each sub-array block 18 contains 512 contiguous primary rows and 4 redundant rows which are analogous to one another in operation. Each of the primary and redundant rows contains 2048 uniquely addressable memory cells. A twenty-four bit addressing scheme can uniquely access each memory cell within a section. Therefore, each primary row located in the eight SABs is uniquely addressable by the system. The rows are also referred to as circuit elements.

FIG. 222 shows a block diagram of the redundancy system according to the invention for a section of the 64 Mbit DRAM IC. The memory in each PAB 14 is divided into eight SABs 18 which are identified as SAB 0 through SAB 7 in FIG. 222. As described above, each SAB 18 has 512 primary rows and 4 redundant rows. In accordance with an important aspect of the present invention, both laser and electrical fuses are provided in support of the device's row redundancy. As will be appreciated by those of ordinary skill in the art, laser fuses are blown to cause the replacement of a primary element with a redundant one at any time prior to packaging of the device. Electrical fuses, on the other hand, can be blown post-packaging, if it is only then determined that one or more rows are defective and must be replaced.

With reference to FIG. 222, each of the four redundant rows associated with an SAB 18 has a dedicated, multi-bit comparison circuit module in the form of a row match fuse bank 250. Three of the four redundant rows in each SAB 18 are programmable via laser fuses; hence, their match fusebanks 250 are referred to as row laser fusebanks, one of which being shown in greater detail in FIG. 79. In the following description and in the Figures, laser fusebanks will be designated 250L, while electrical fusebanks will be designated 250E; statements and Figures which apply equally to both laser fusebanks and electrical fusebanks will use the designation 250. One of the four redundant rows associated with an SAB 18 is programmable via electrical fuses; hence, this row's match fusebank 250E is referred to as a row electrical match fusebank, one of which being shown in the schematic diagram of FIGS. 76, 77, and 78.

Each match fuse bank 250 is capable of receiving an identifying multi-bit addressing signal in the form of a predecoded address (signals RA12, RA34, etc. . . in FIGS. 77 and 78). Each fuse bank 250 scrutinizes the received address and decides whether it corresponds to a memory location in a primary row which is to be replaced by the redundant row associated with that bank. There are a total of 32 fuse banks 250 for the 32 redundant rows existing in each PAB 14.

Address lines carry a twenty-four bit primary memory addressing code (local row address) to all of the match-fusebanks 250. Each bank 250 comprises a set of fuses which have been selectively blown after testing to identify a specific defective primary row. When the local row address corresponding to a memory location in that defective row appears on the address lines applied to the bank, the corresponding match-fuse bank sends a signal on an output line 252 toward a redundant row driver circuit 254. The redundant row driver circuitry then signals its associated SAB Selection control circuitry 256 through its redundant block enable line 258 that a redundant row in that SAB is to be activated. The redundant row driver circuitry 254 also signals which redundant row of the four available in the SAB is to be activated. This information is carried by the four redundant phase driver lines (REDPH1 through REDPH4) 260. The redundant phase driver lines are also interconnected with all of the other SAB Selection Control circuitry blocks 262, 264 which service the other SABs 18. Whenever an activation signal appears on any one of the redundant phase driver lines 260, the SAB Selection Control blocks 256 disable primary row operation in each of their dedicated SABs 18.

Correlating the foregoing description of row redundancy operation in accordance with the present invention with the schematics, operation proceeds as follows: when the address corresponding to a memory location in a defective row appears address lines applied to the bank, a corresponding match-fuse bank 250 sends a signal on an output line 252 toward a redundant row driver circuit 254. One row electrical fusebank 250 is shown in FIGS. 76, 77, and 78 (it is to be understood that the circuitry of FIGS. 76, 77, and 78, interconnected as indicated therein, collectively forms a single row electrical fusebank 250; thus, the designation "PORTION OF 250" appears in those Figures, as no one portion of a row electrical fusebank 250 shown in the individual FIGS. 76, 77, and 78 constitutes an electrical fusebank on its own). As shown in FIGS. 76, 77, and 78, particularly FIGS. 77 and 78, bits of decoded addresses RA12, RA34, RA56, etc. . . , are applied to electrical row fuse match circuits 253. Each electrical row fuse match circuit 253 in FIGS. 77 and 78 is identical, with the exception of electrical row fuse match circuit 253', which differs from the other circuits 253 in that it receives a predecoded row address reflecting only two predecoded row address bit, RA11<0:1>, whereas the other circuits 253 receive a predecoded row address reflecting four address bits, e.g, RA12<0:3>, RA34<0:3>, RA56<0:3>, etc. . . .

FIG. 77 shows one electrical row fuse match circuit 253 in schematic form. The electrical row fuse match circuit 253 shown in FIG. 77 includes a match array 255 which receives predecoded row address signals RA12<0:3>. From FIG. 78, it is apparent that each of the other electrical row fuse match circuits 253 in row electrical fusebank 250 receives a different set of predecoded row address signals, RA34<0:3>, RA56<0:3>, RA78<0:3>, and RA910<0:3>, while row electrical fusebank 253' receives predecoded row address signals RA_11<0:1>, which are applied to a match array 255'.

As shown in FIG. 77, each electrical row fuse match circuit 253 includes two antifuses 257 (refer to the description herein of laser/electrical fuse options for a description of what is meant by “antifuse”) which may be addressed and thereby selectively blown in order to “program” a given electrical row fuse match circuit to intercept particular row address accesses. The addressing scheme for accessing particular row antifuses 257 is set forth in the tables of FIGS. 11 and 232. (The corresponding addressing scheme for accessing particular column antifuses is set forth in the tables of FIGS. 12 and 234.) The addressing scheme for fuses accessed to enable row redundancy fusebanks is set forth in FIG. 233, while the addressing scheme for fuses accessed to enable column redundancy fusebanks is set forth in FIG. 235.)

The state of each fuse in an electrical row fuse match circuit 253, in conjunction with the predecoded row address applied to match array 255 in that electrical row fuse match circuit 253, determines whether the m*<n> output signal from that electrical row fuse match circuit 253 is asserted or deasserted in response to a given predecoded row address. Each electrical row fuse match circuit 253 (and 253') asserts a separate m*<n> signal (electrical row fuse match circuit 253' asserts has m*<5> and m*<6> as outputs). Collectively, the signals m*<0:6> generated by electrical row fuse match circuits 253 and 253' are applied to row redundant match circuitry designated generally as 257 in FIG. 76 to produce a signal RBmPHn, which corresponds to the output signal on line 252, as previously described with reference to FIG. 222, that is applied to redundant row driver circuitry 254. Each electrical match fuse bank 250 in device 0 produces a separate RBmPHn signal, those signals being designated in the schematics as RBaPH<0:3>, RBbPH<0:3>, RBc<PH<0:3>, and RbdPH<0:3>.

Each row electrical match fusebank 250 includes an electrical fuse enable circuit 261 containing an antifuse 748 which must be blow in in order to activate that fusebank into switching-in the redundant row corresponding to that fuse-bank 250 in place of a row found to be defective.

Figure 79A:
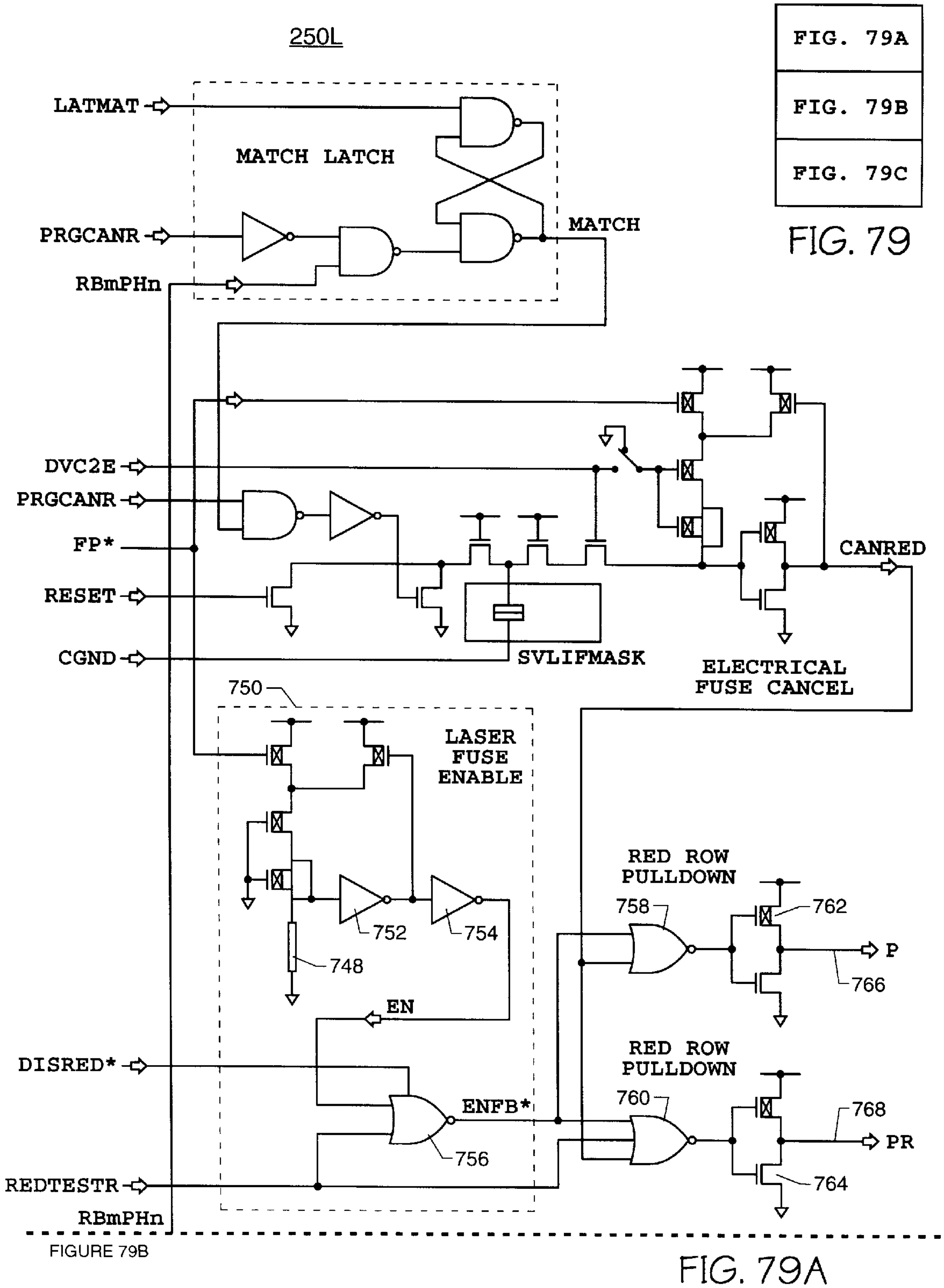
FIGS. 79A–79C are schematic diagram of row redundancy laser fusebanks in the memory device of FIG. 2.
Figures 79A, 79B, 79C:
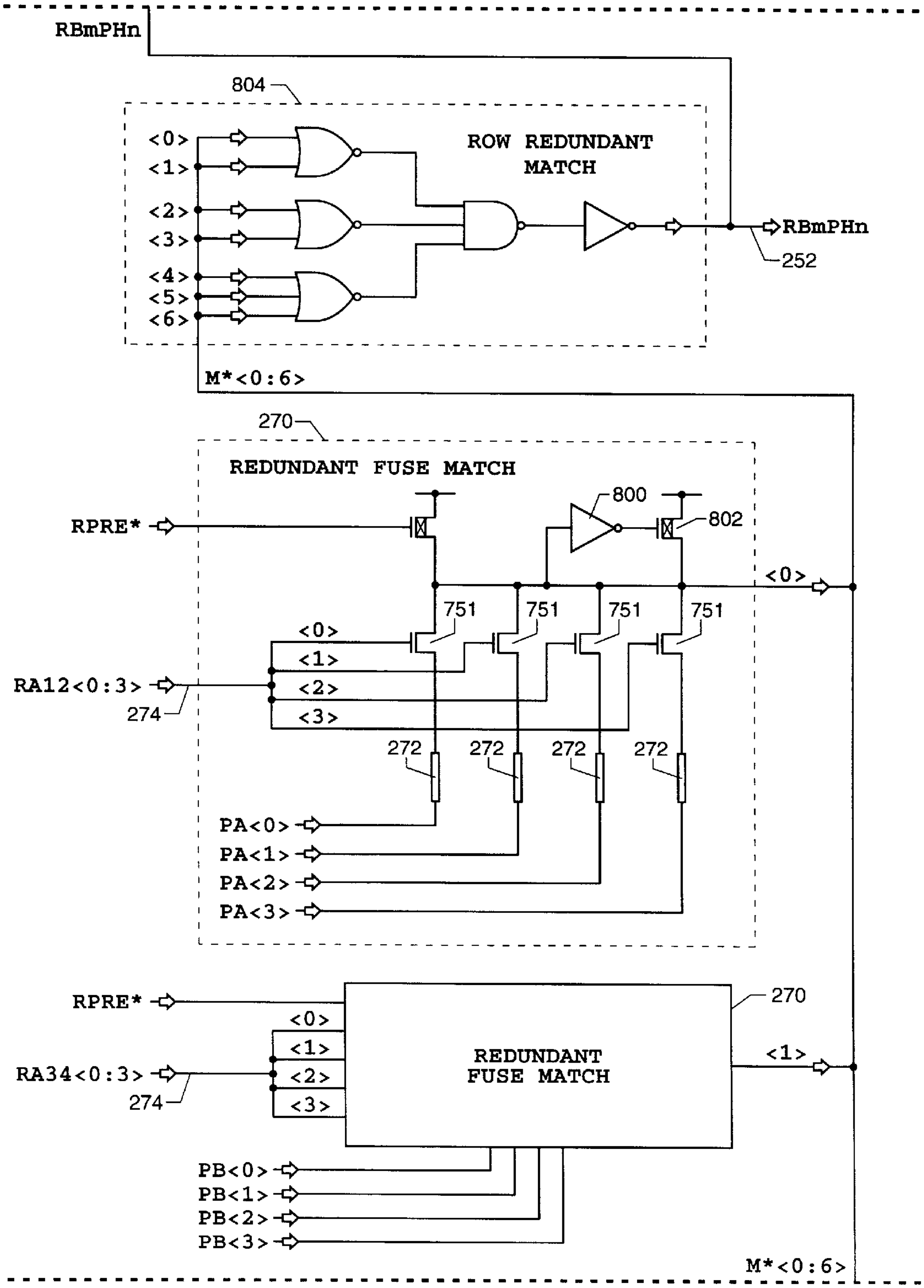
Figure 79C:
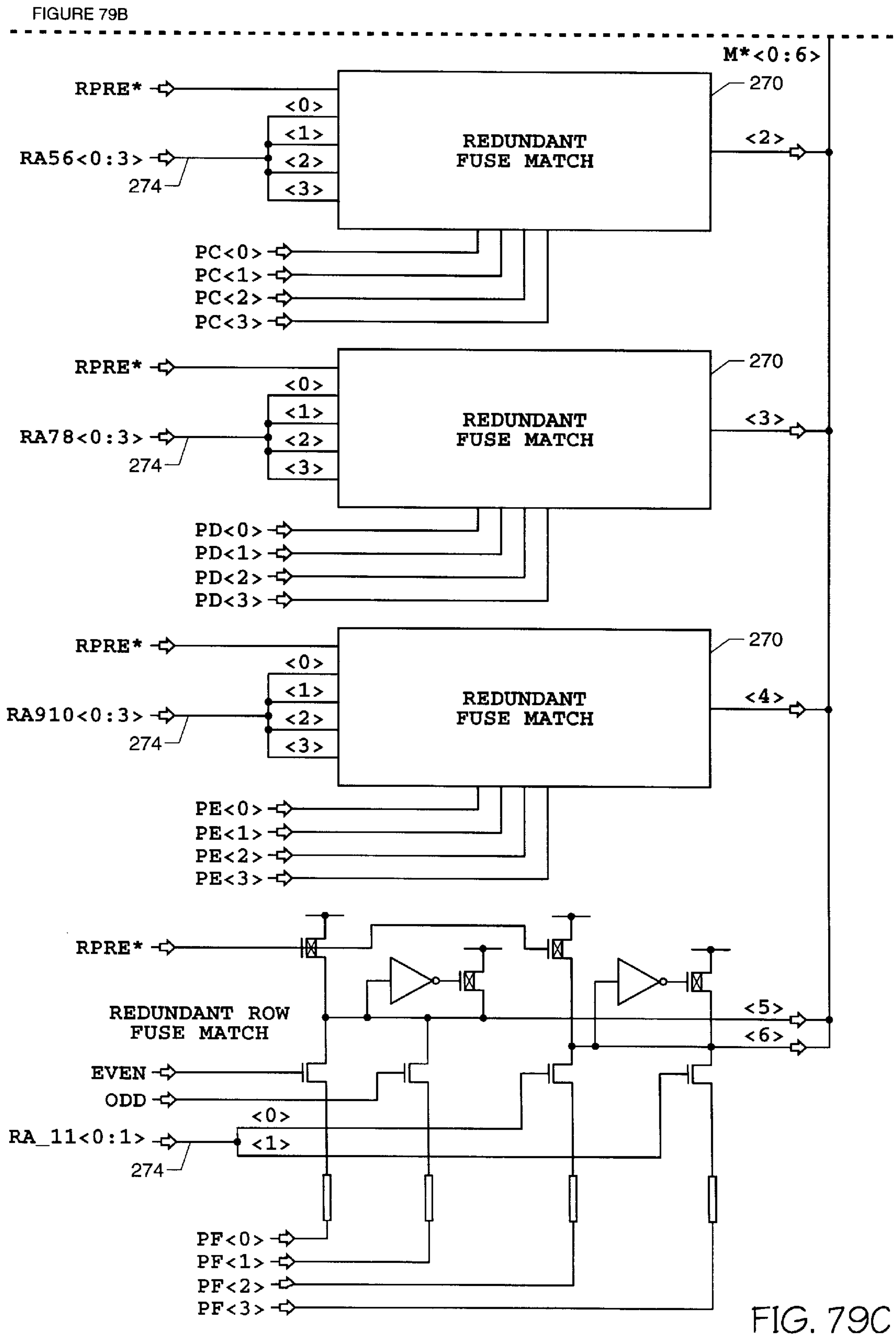
Figure 80:
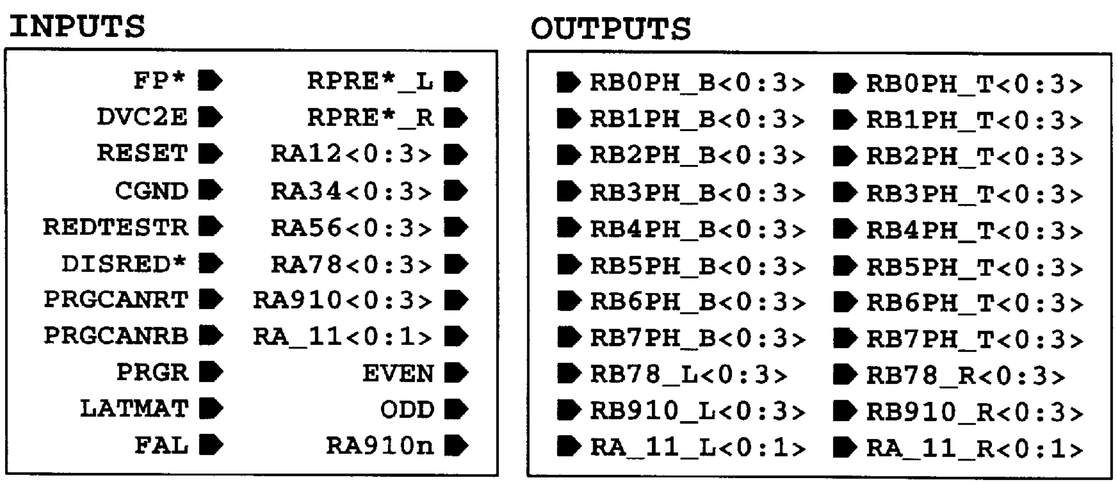
FIG. 80 identifies the signal names of inputs and outputs to row redundancy laser and electrical fusebanks in the memory device of FIG. 2.
Figure 81:
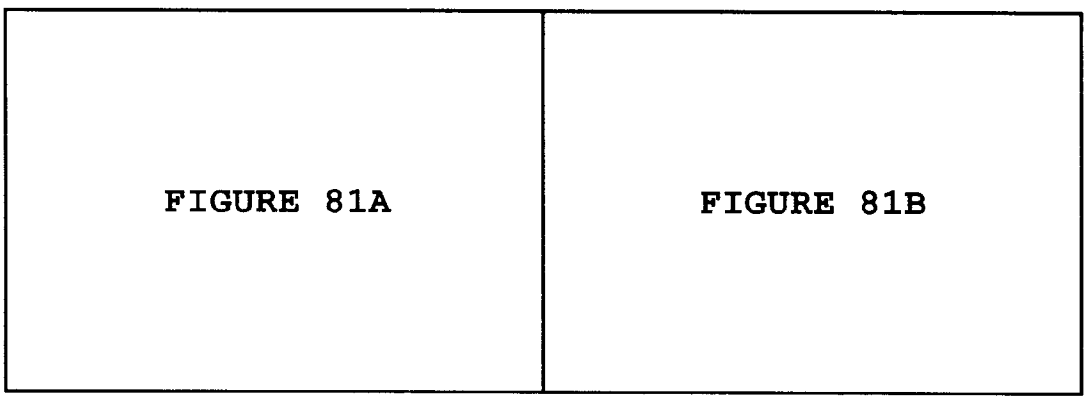
FIGS. 81A–81B are block diagram of a portion of row redundancy laser and electrical fusebanks in the memory device of FIG. 2.
Figure 81A:
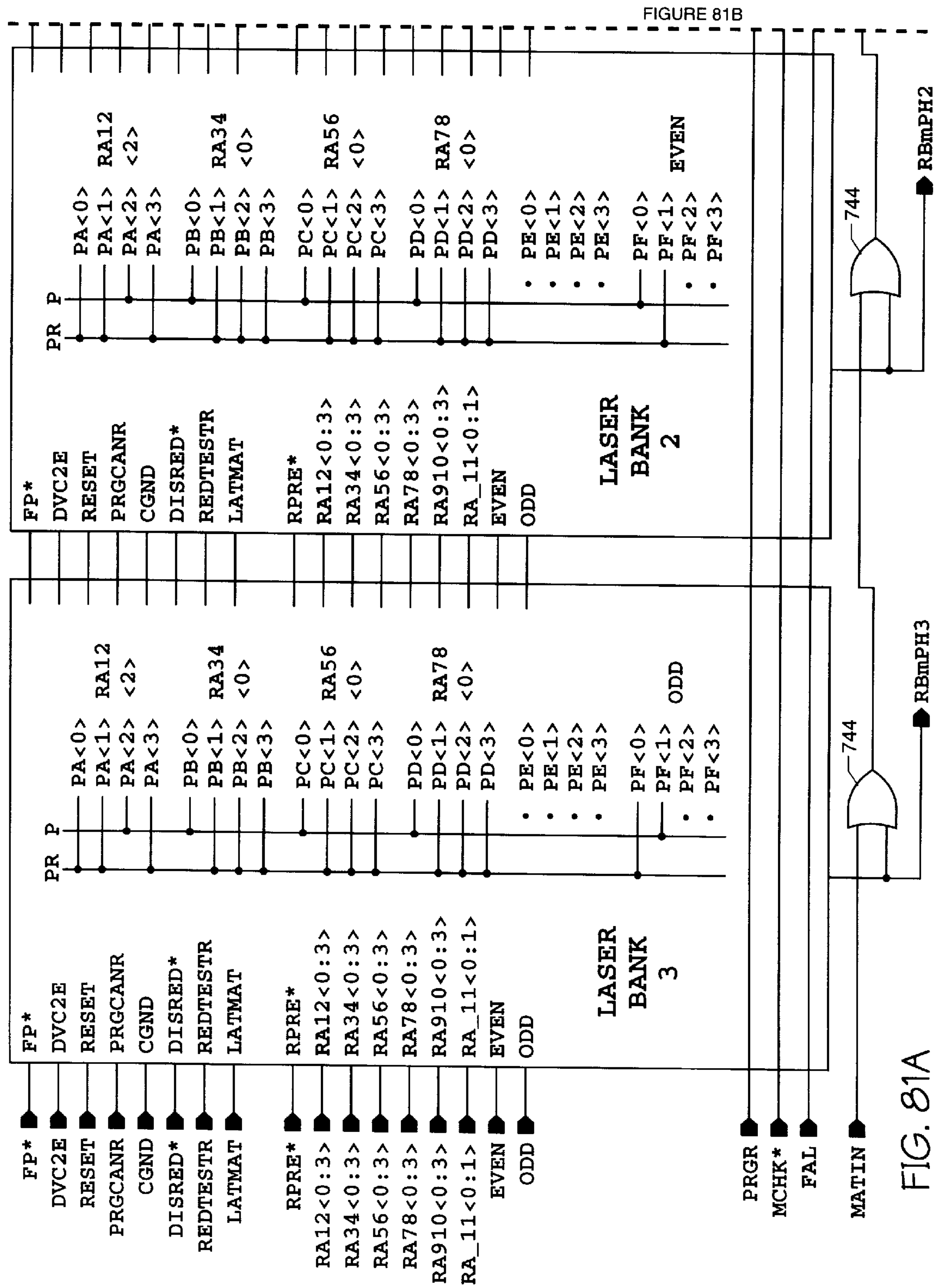
Figures 81A, 81B:
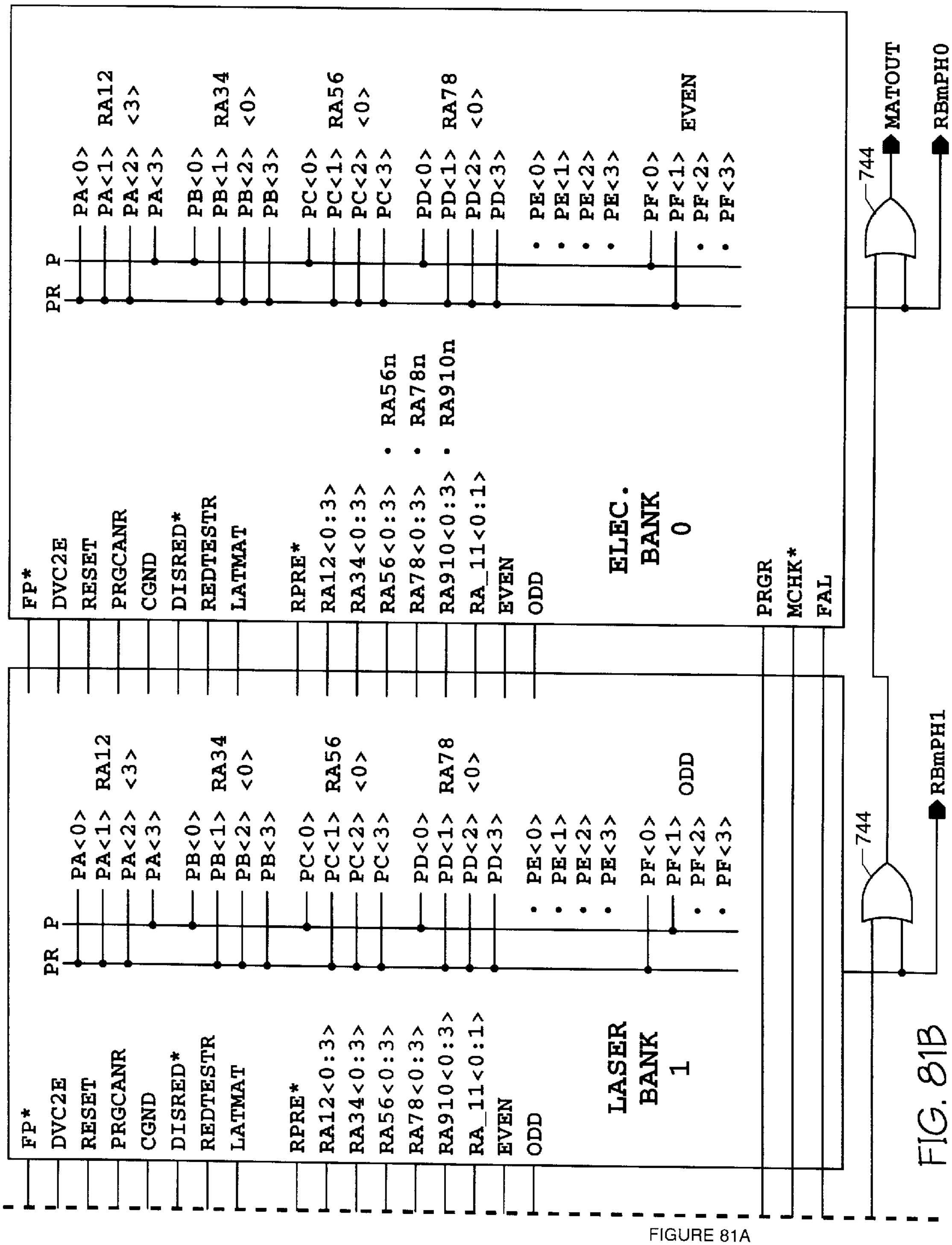
Figure 82:
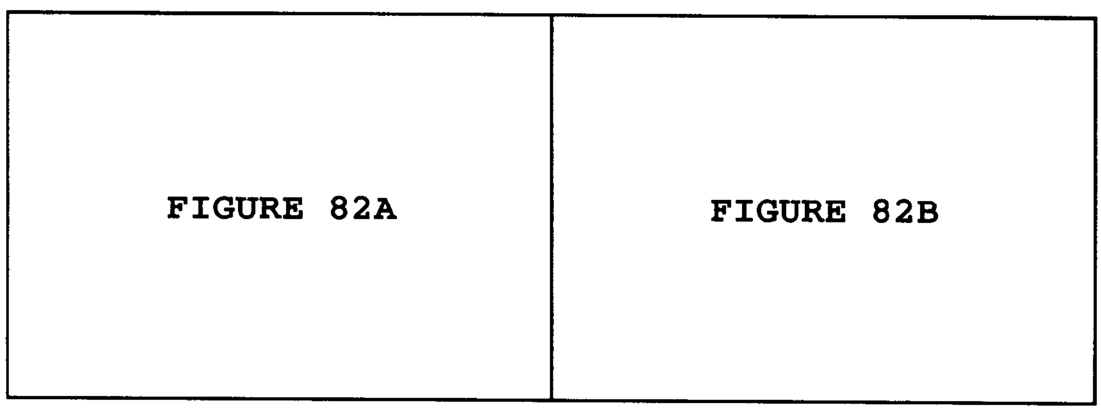
FIGS. 82A–82B are block diagram of another portion of row redundancy laser and electrical fusebanks from FIG. 81.
Figure 82A:
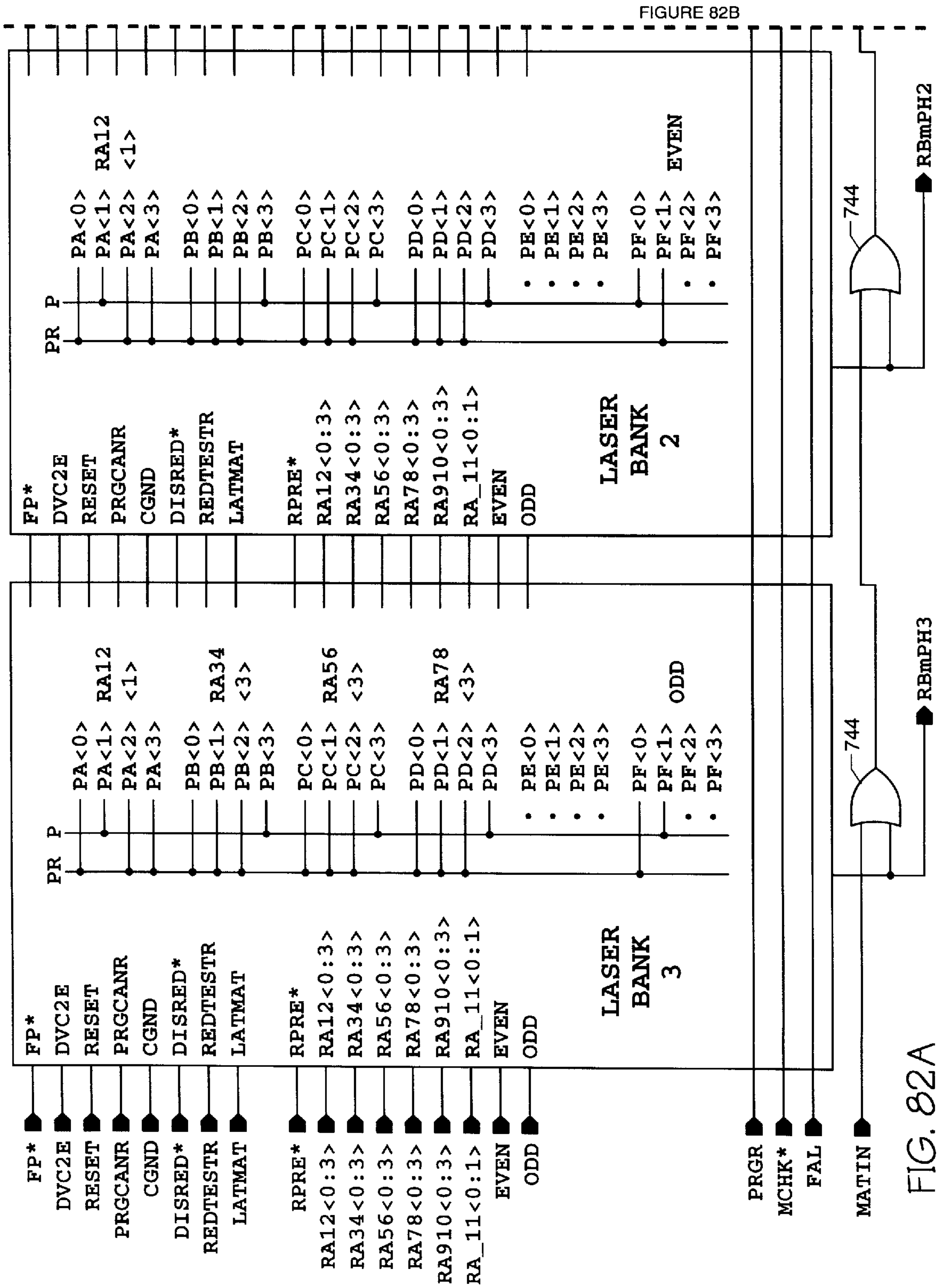
Figures 82A, 82B:
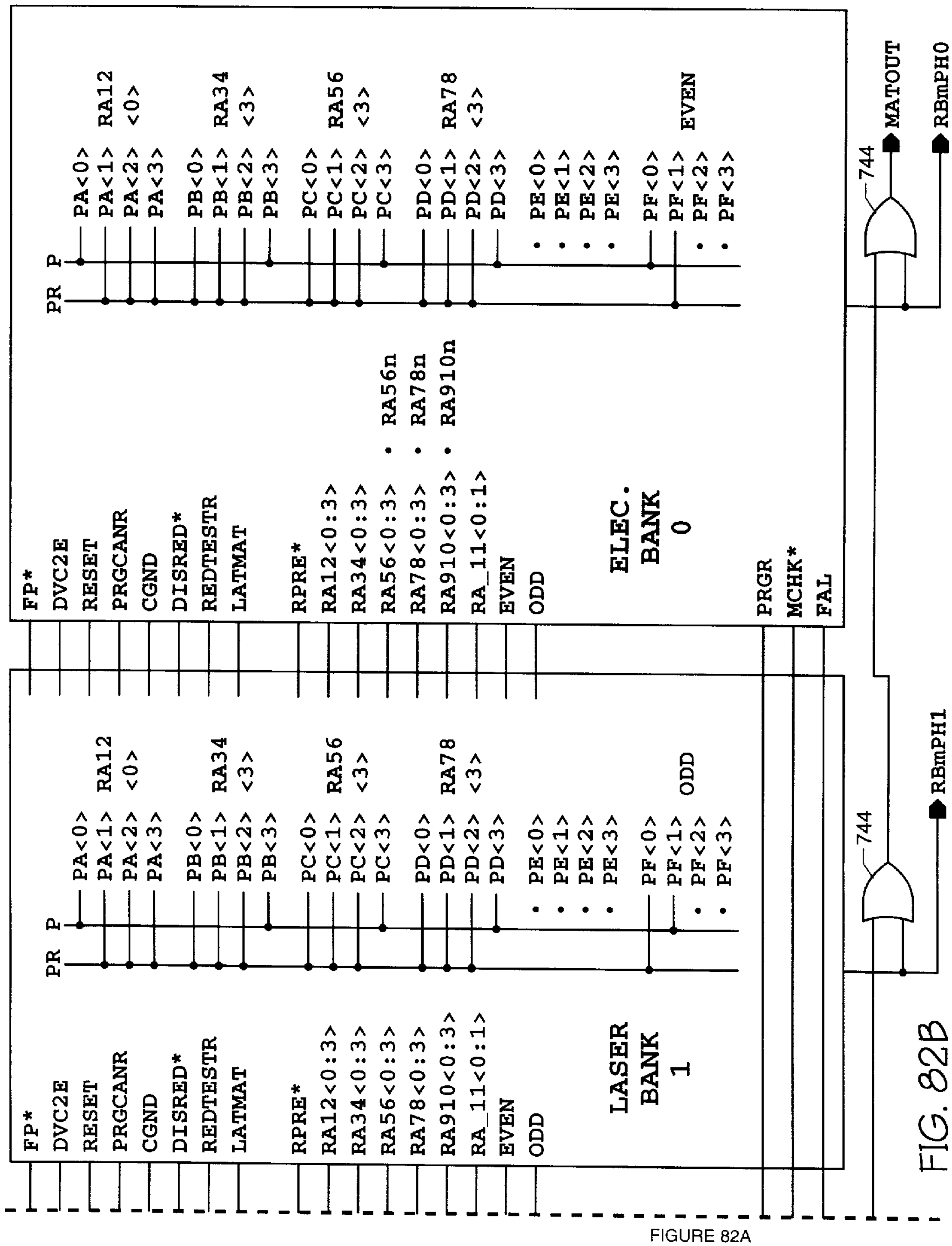
Figure 83A:
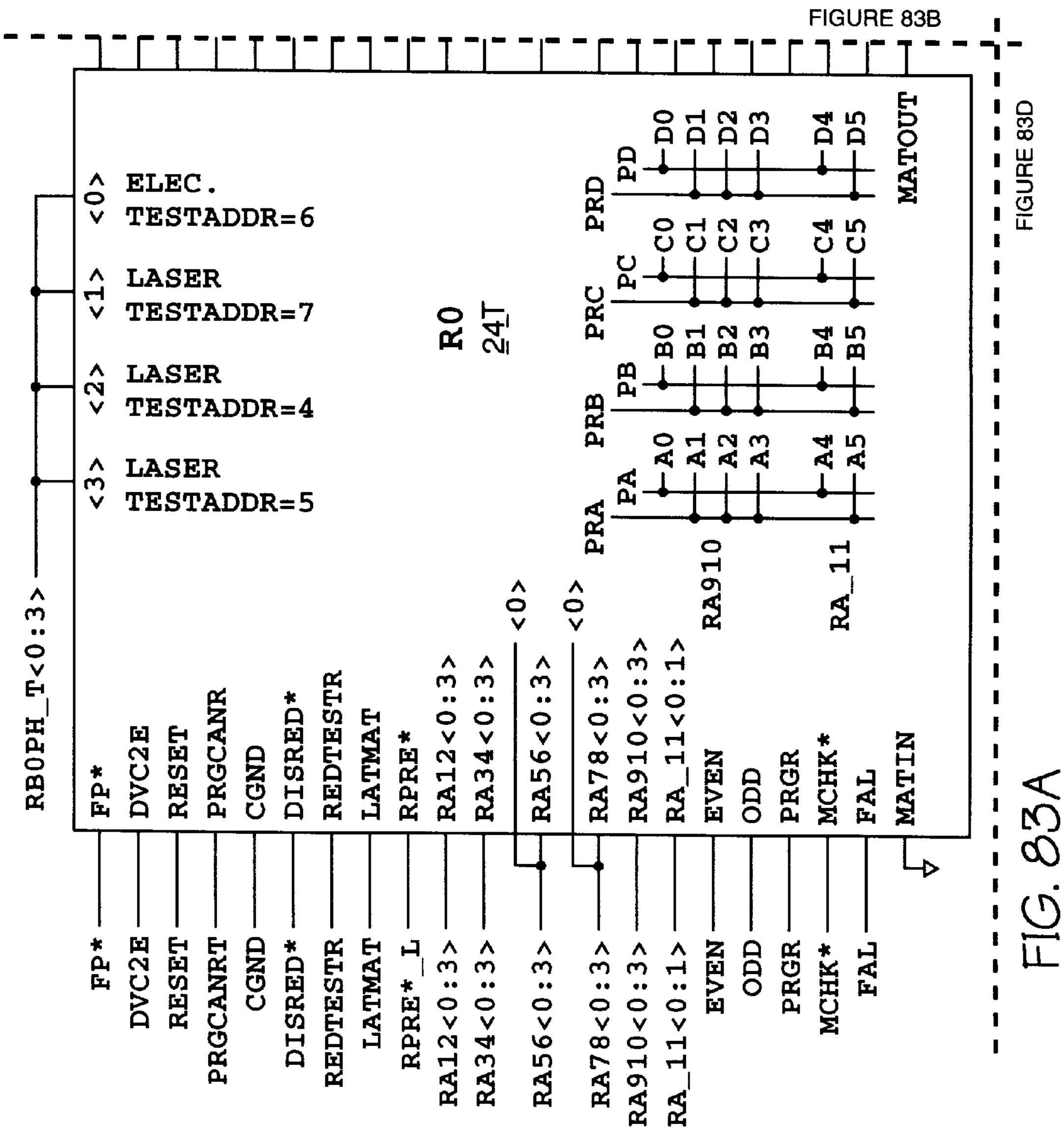
FIGS. 83A–83F are block diagram of another portion of row redundancy laser and electrical fusebanks from FIGS. 81 and 82.
Figure 83B:
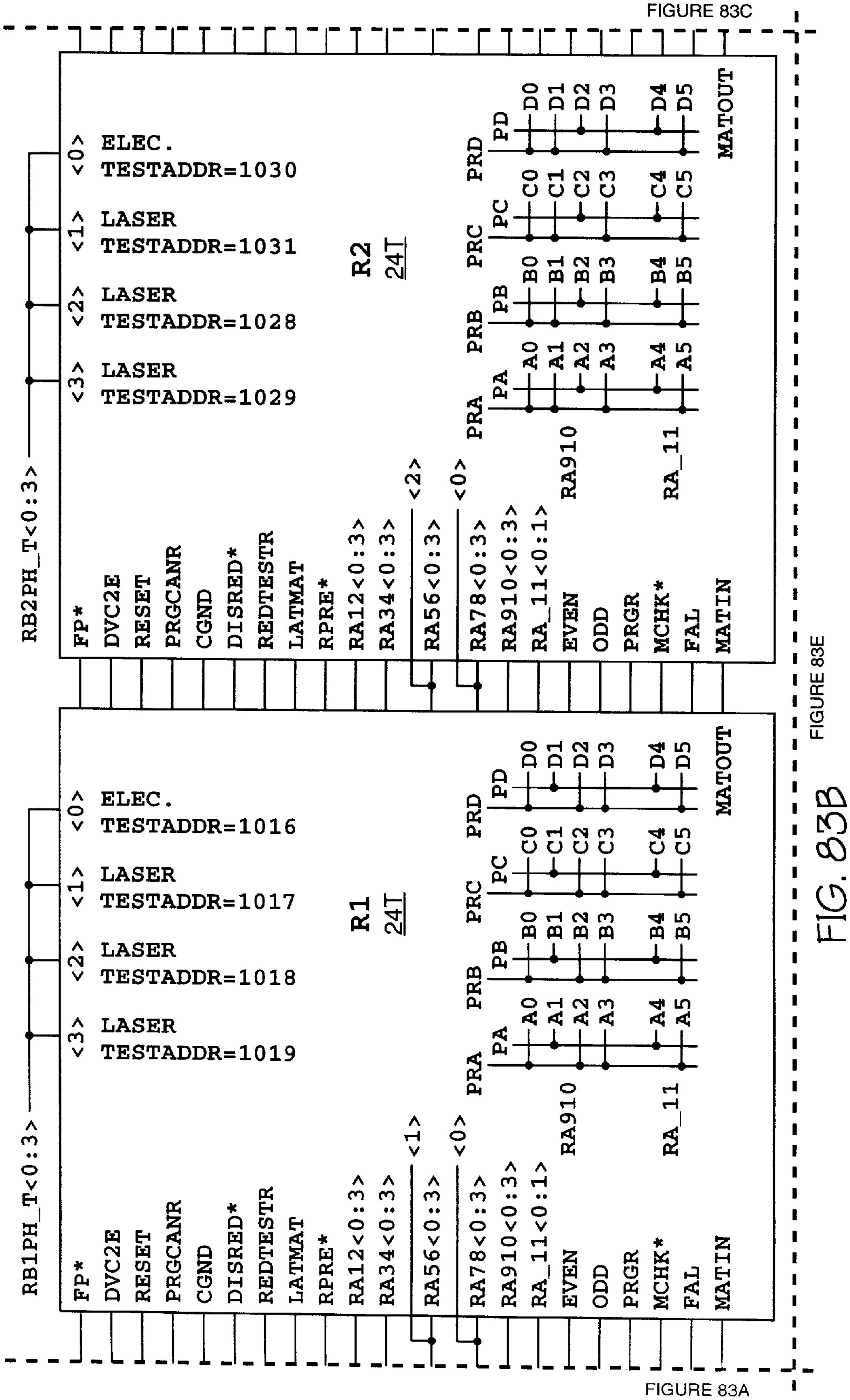
Figures 83C, 83F:
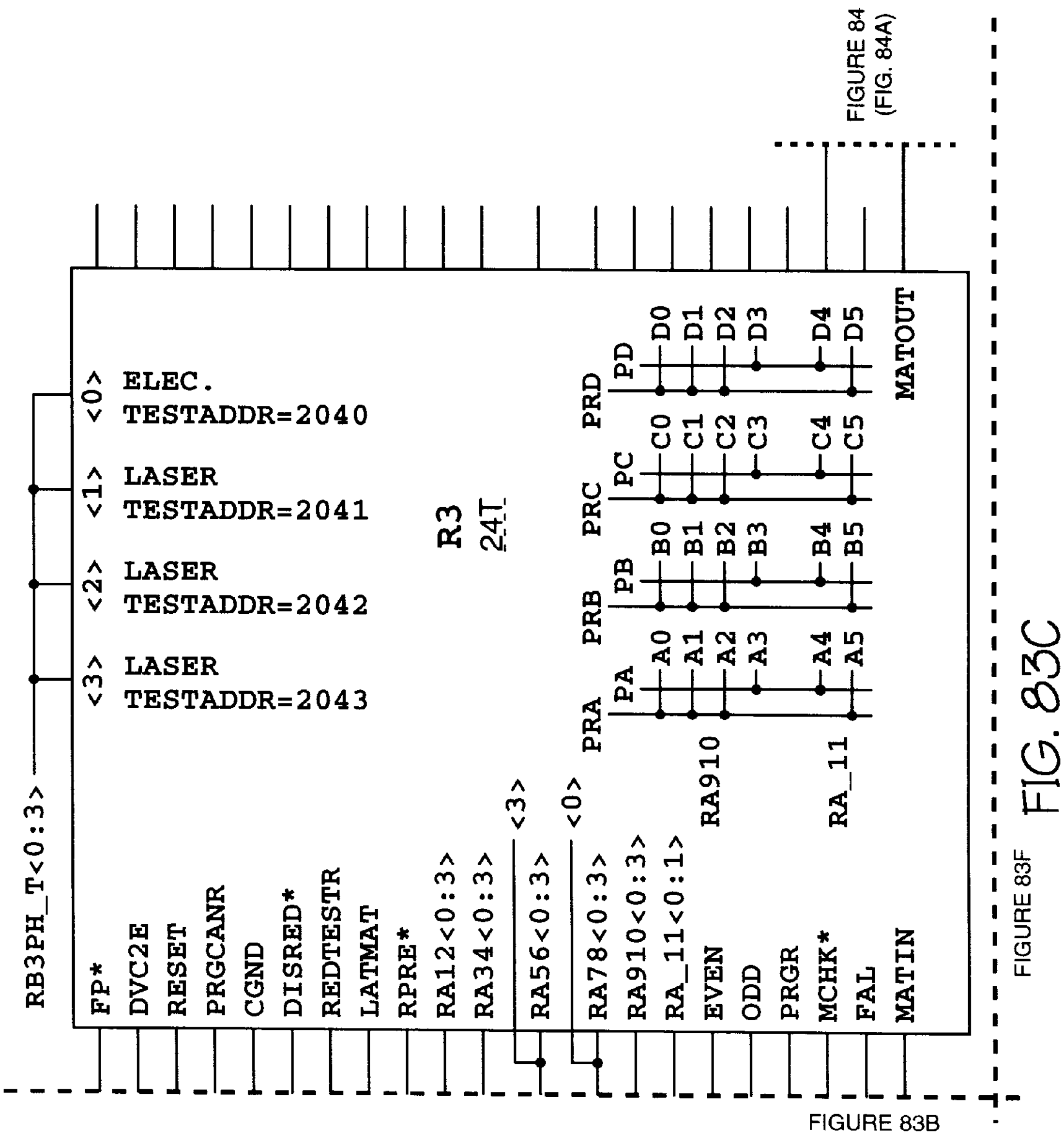
Figure 83D:
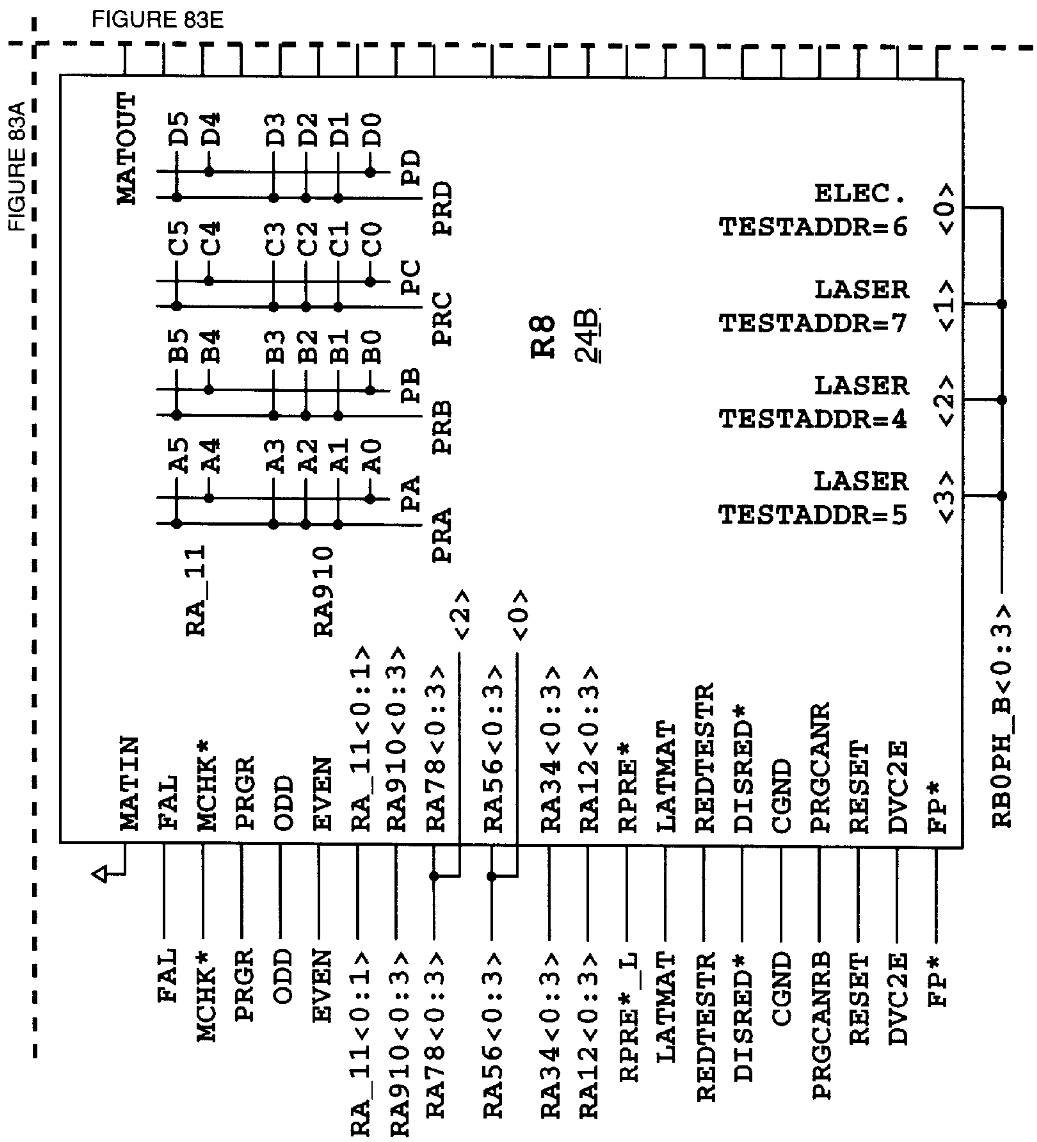
Figure 83E:
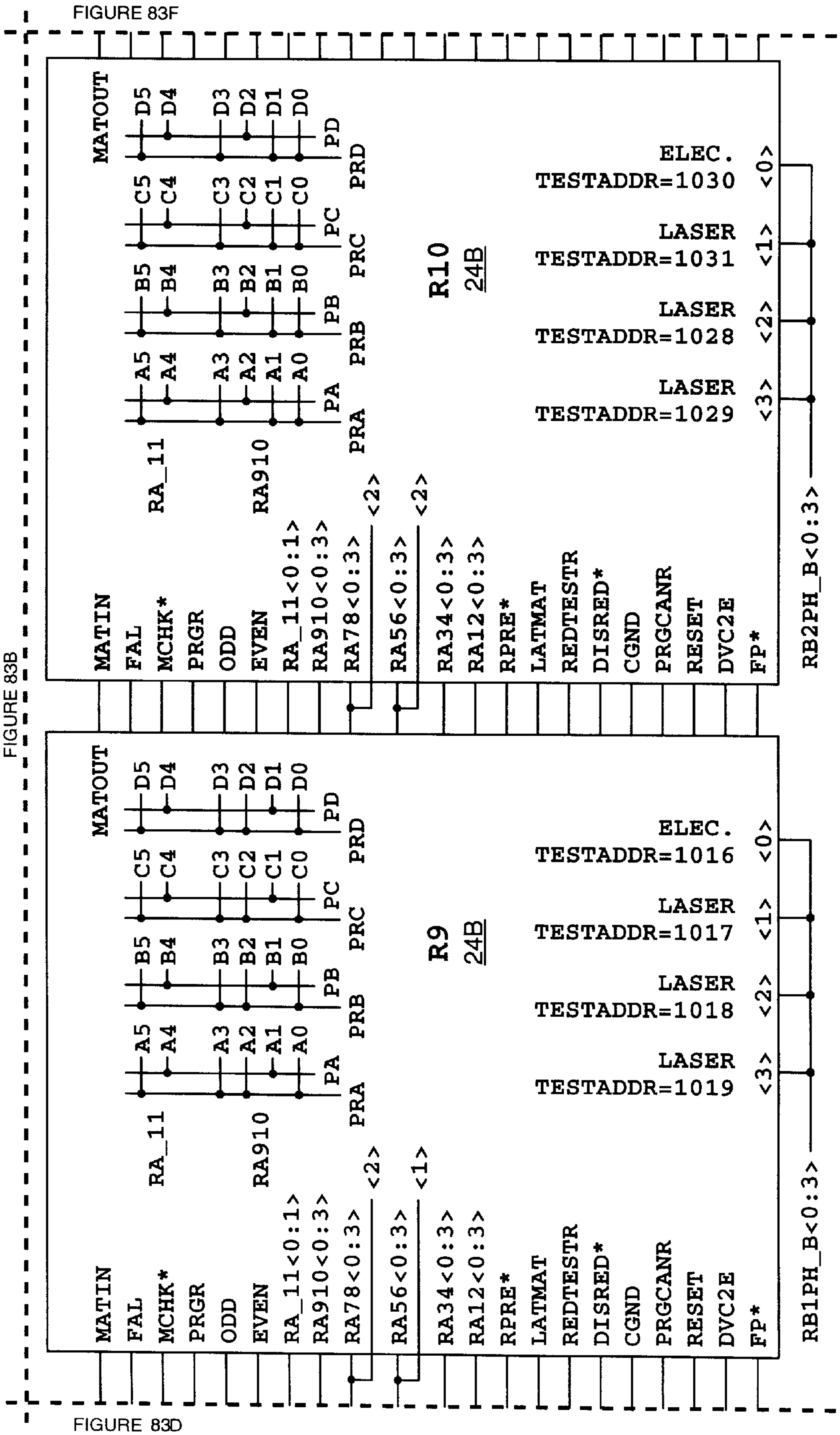
Figure 83F:
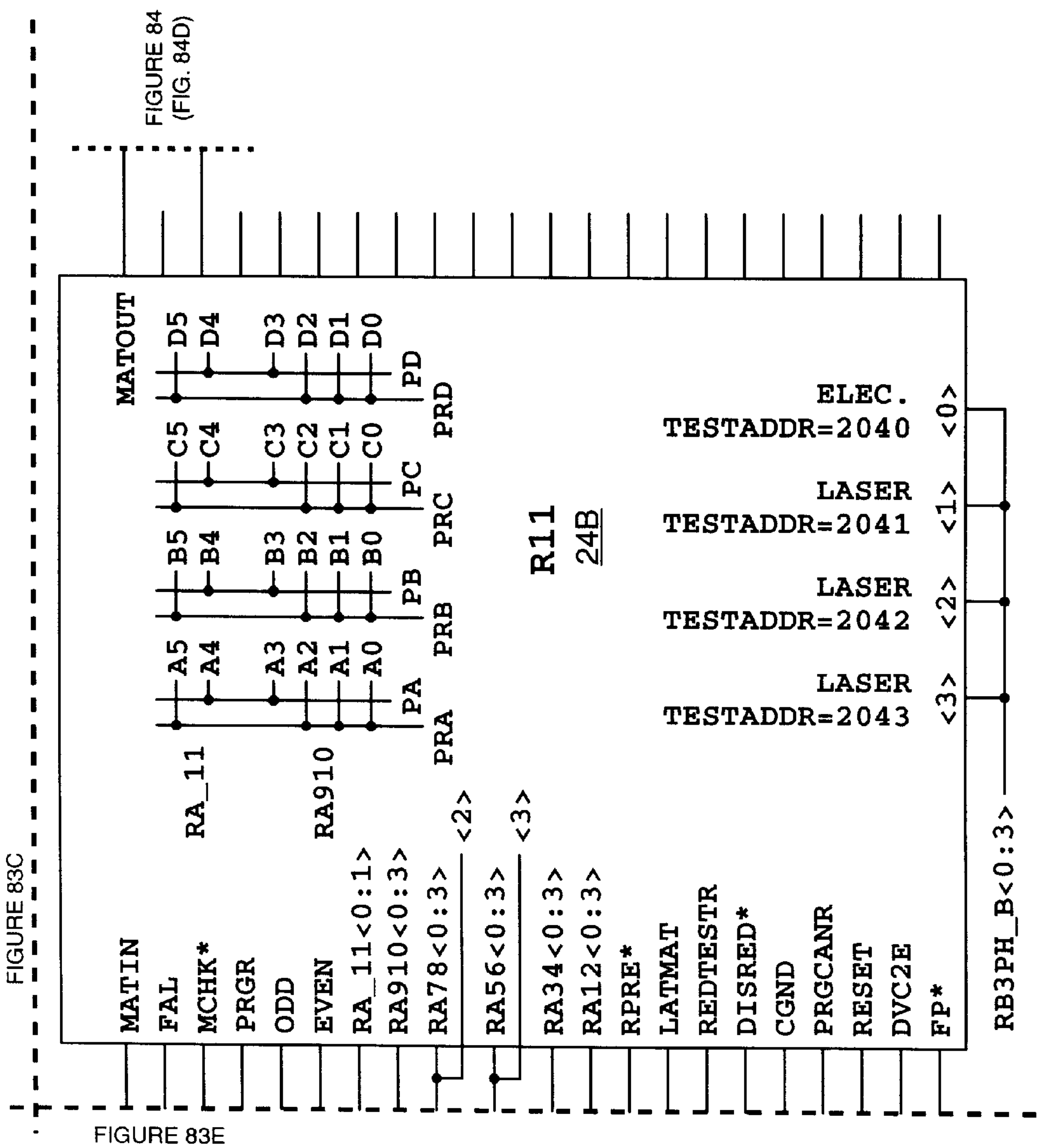
Figure 84A:
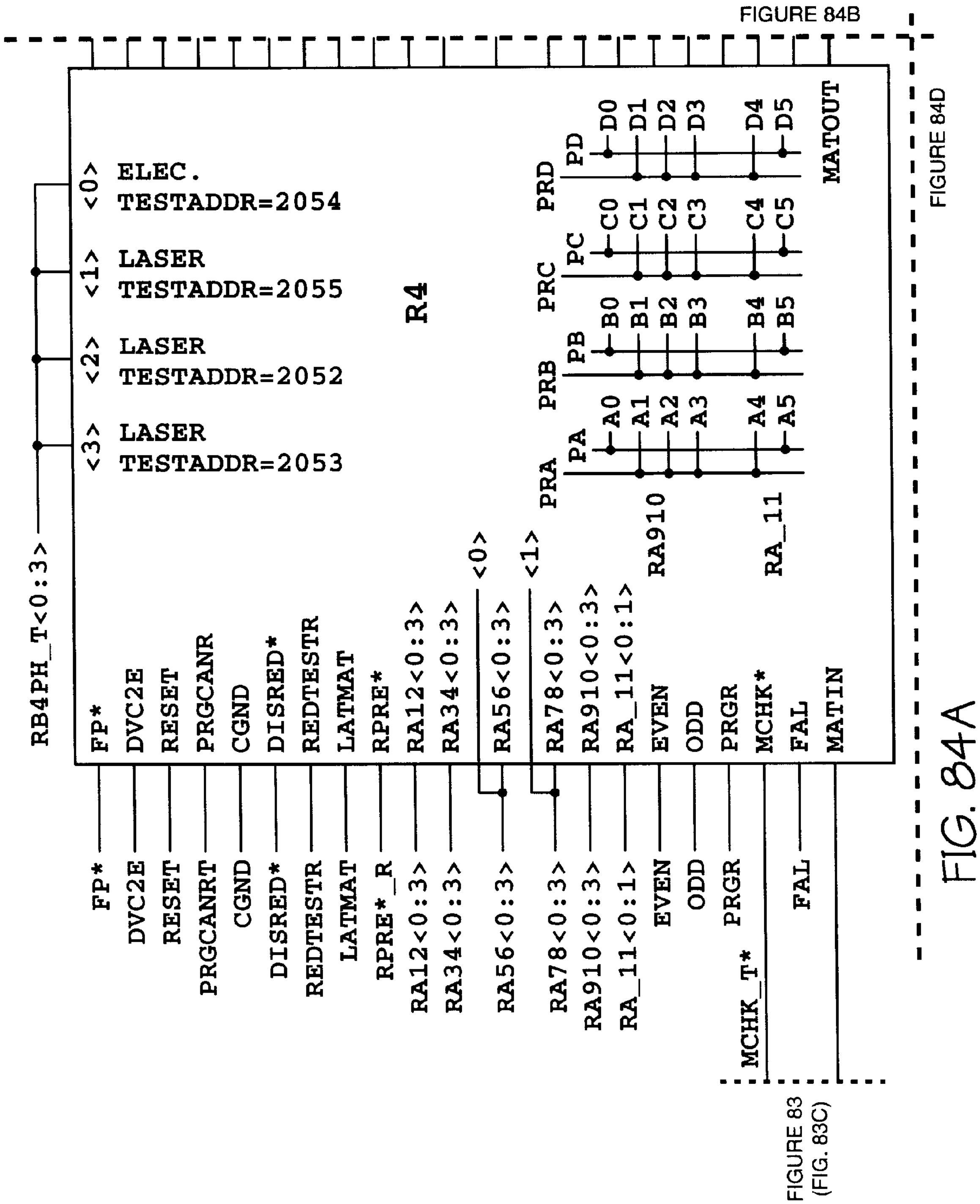
FIGS. 84A–84F are diagram of another portion of row redundancy laser and electrical fusebanks from FIGS. 81, 82, and 83.
Figure 84B:
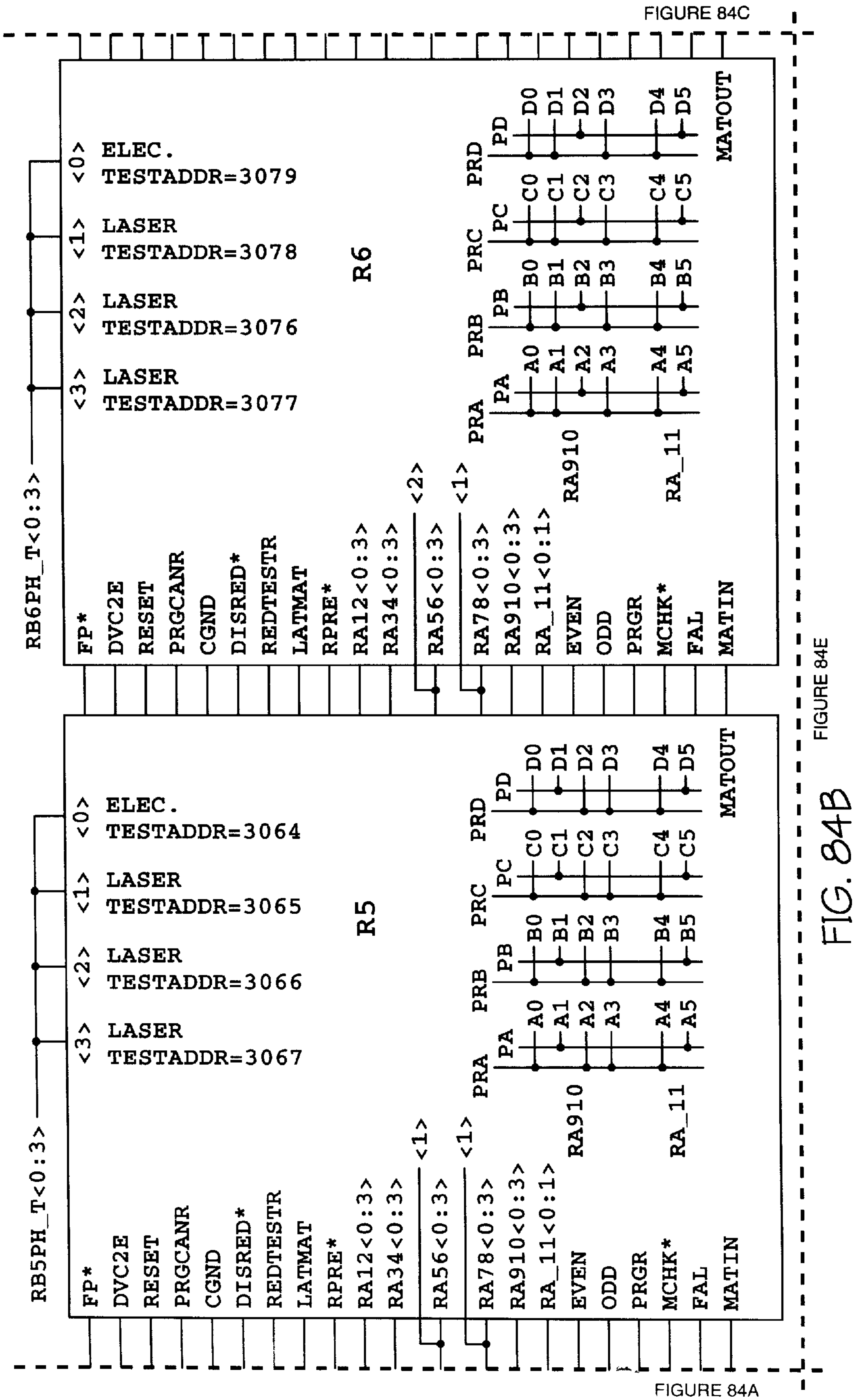
Figure 84C:
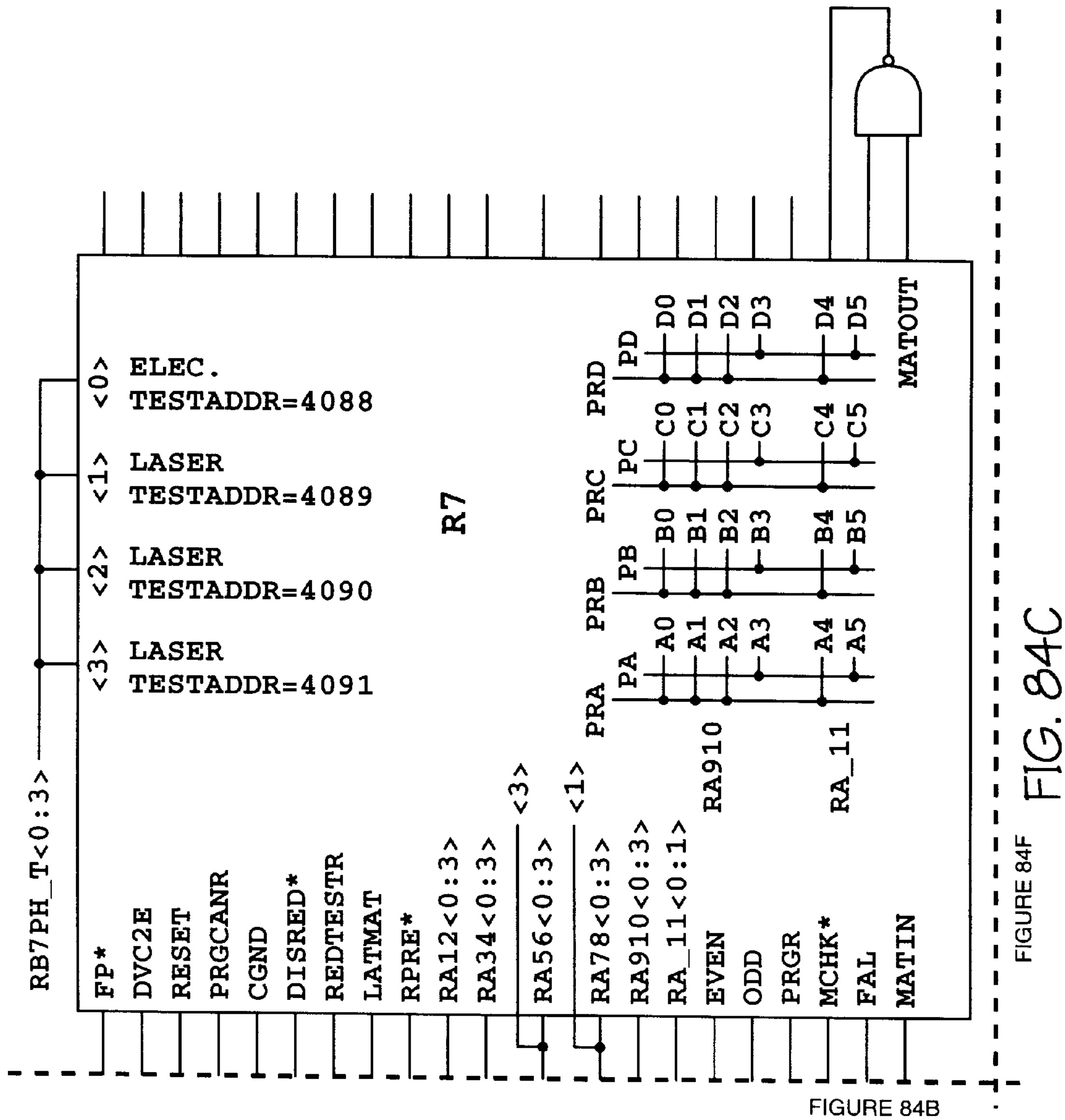
Figure 84D:
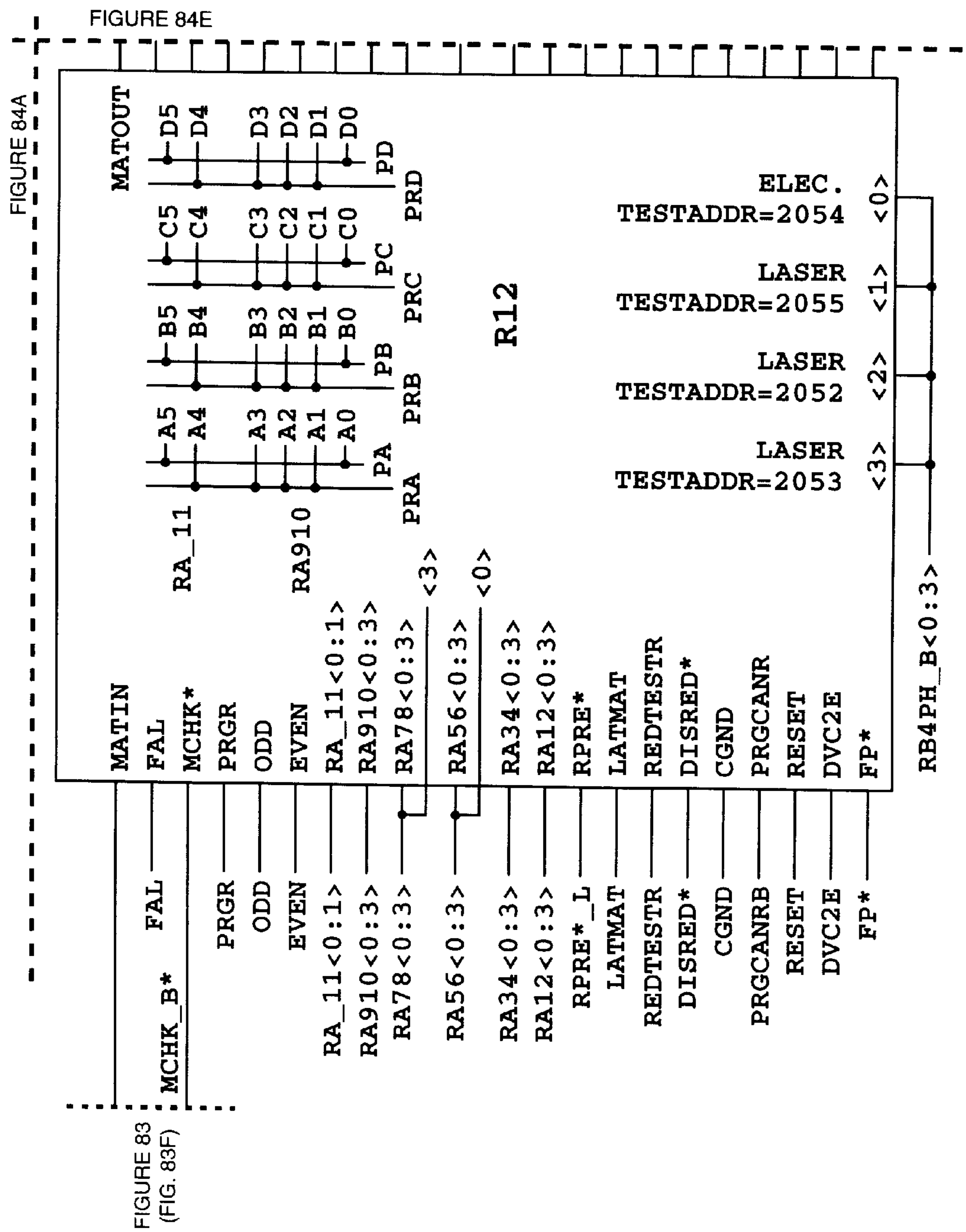
Figure 84E:
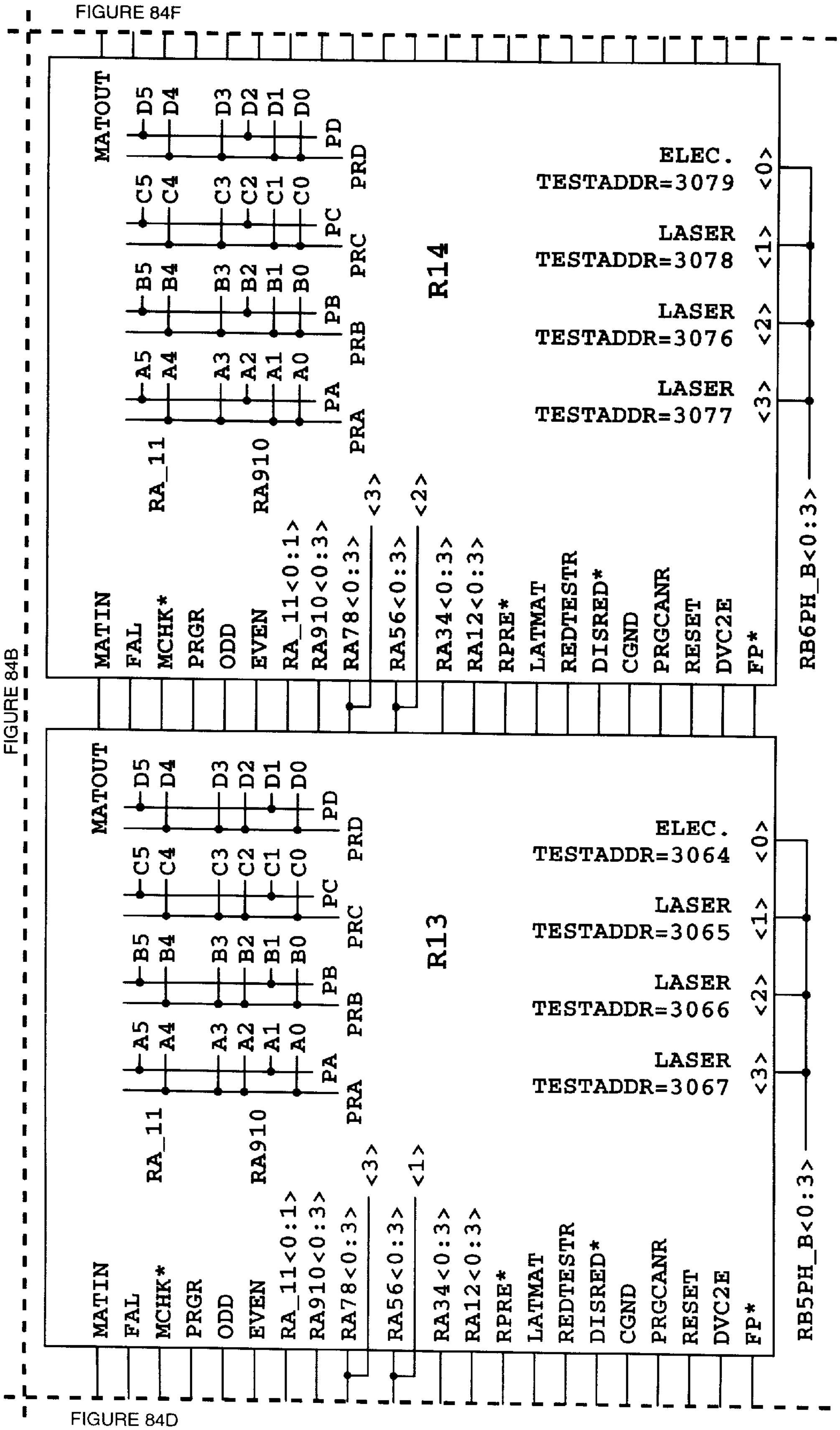
Figure 84F:
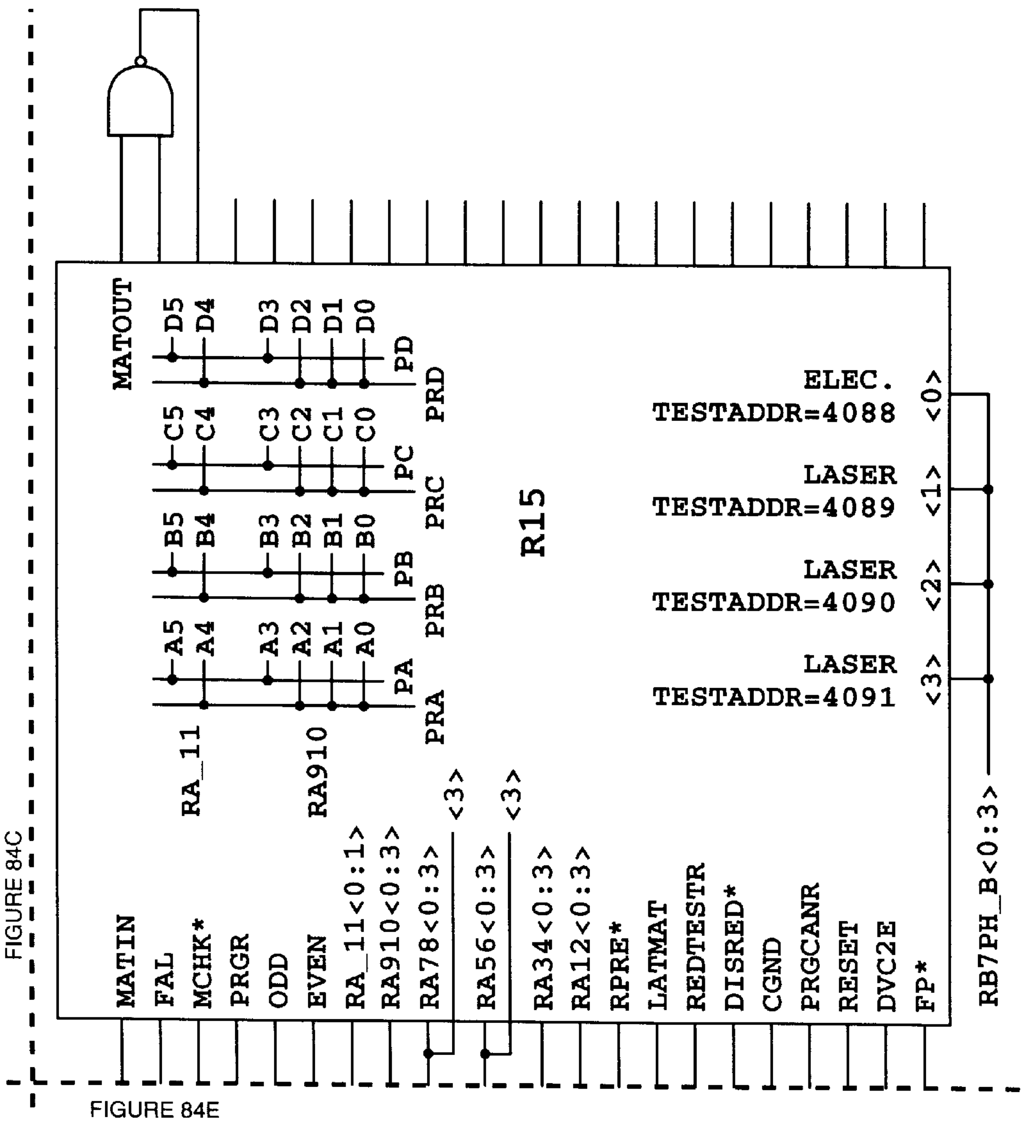
Figure 85:
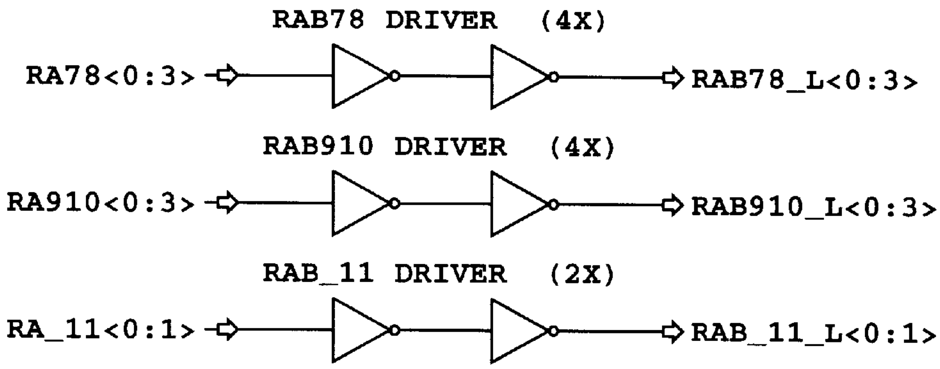
FIG. 85 is a schematic diagram of row addressing circuitry associated with the row redundancy fusebanks in the memory device of FIG. 2.
Figure 86:
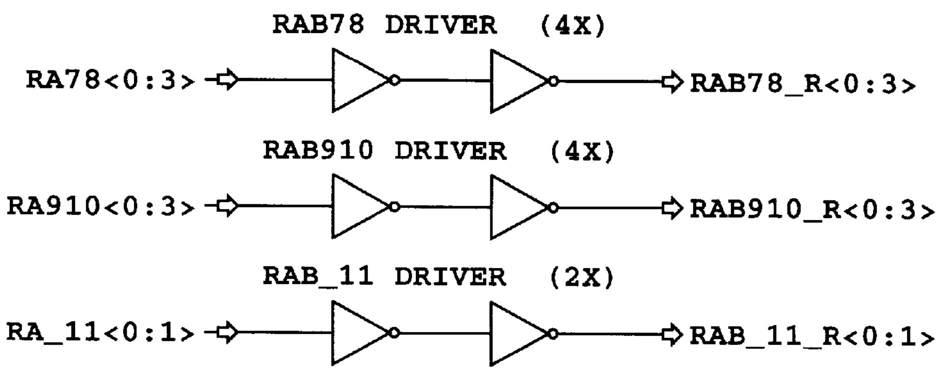
FIG. 86 is a schematic diagram of row addressing circuitry associated with the row redundancy fusebanks in the memory device of FIG. 2.
Figure 87:
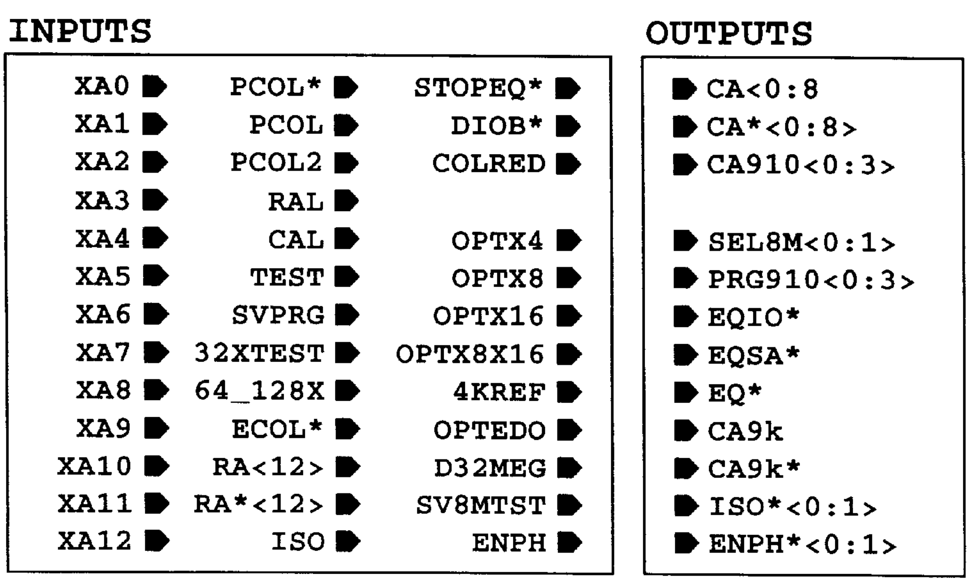
FIG. 87 identifies the signal names of inputs and outputs to column address buffer circuitry in the memory device of FIG. 2.
Figure 89:
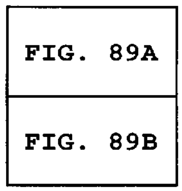
FIGS. 89A–89B are schematic/block diagram of column address buffer circuitry in the memory device of FIG. 2.
Figure 89A:
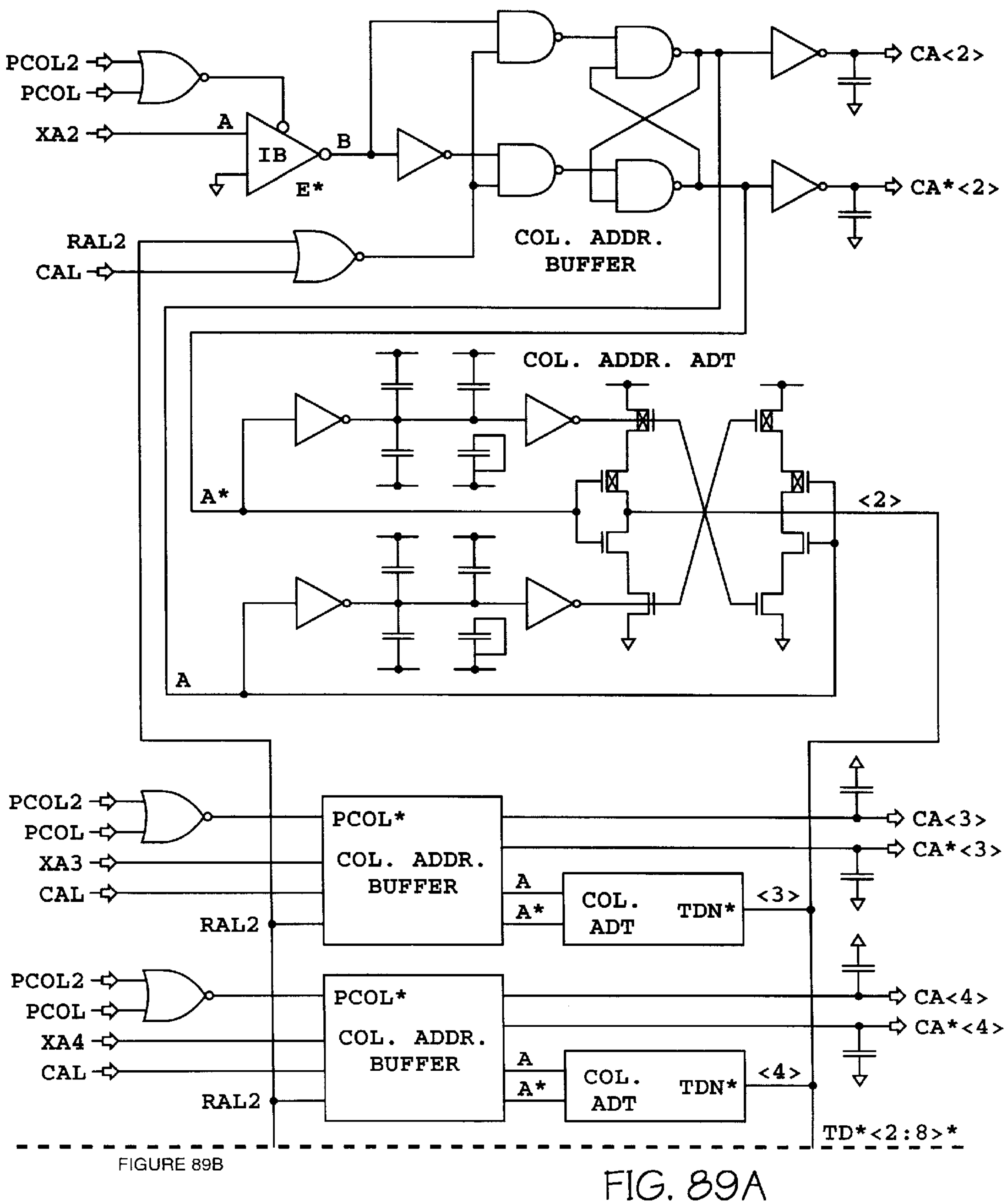
Figure 89B:
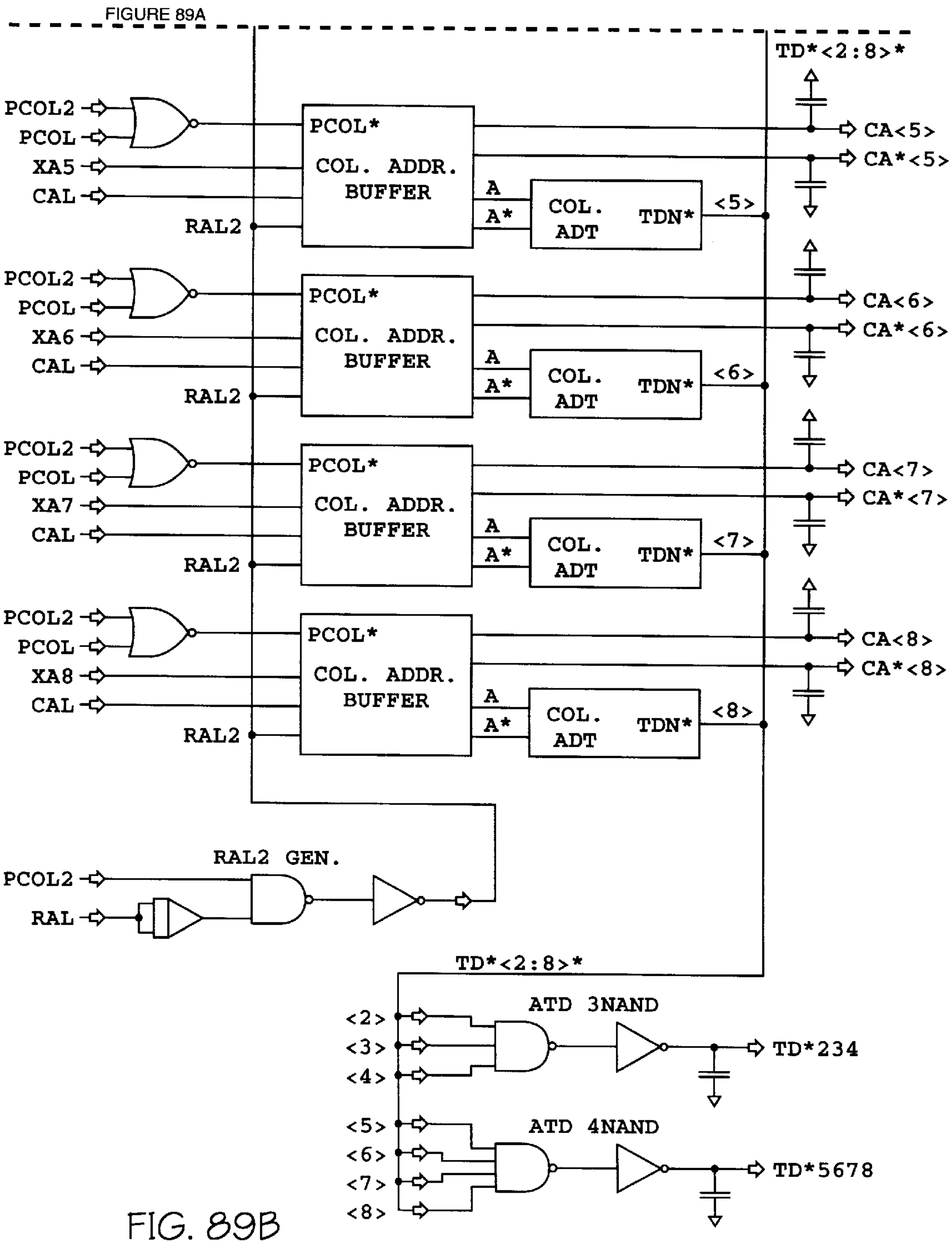
Figures 90, 90A:
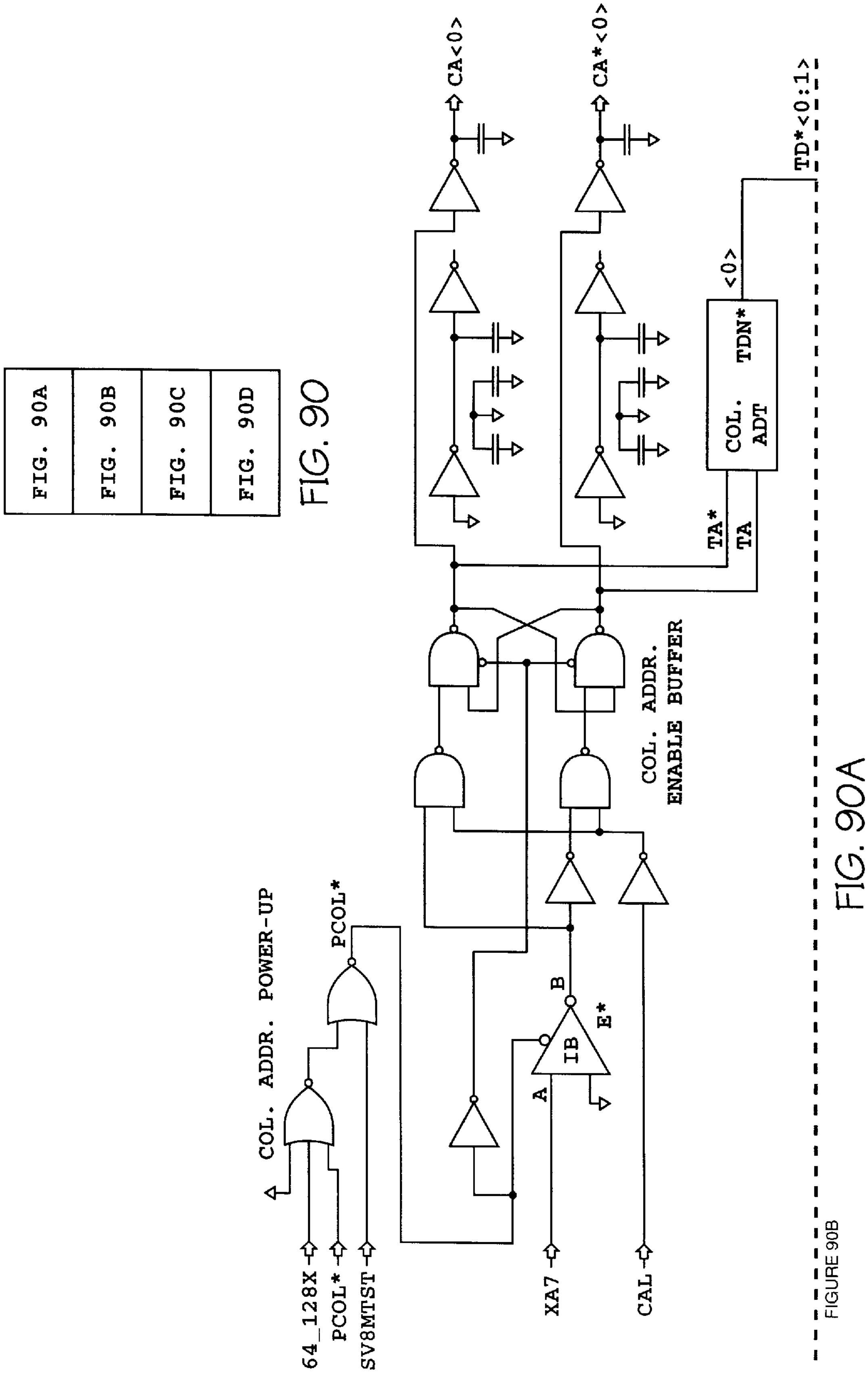
FIGS. 90A–90D are schematic/block diagram of column address power-up circuitry in the memory device of FIG. 2.
Figure 90B:
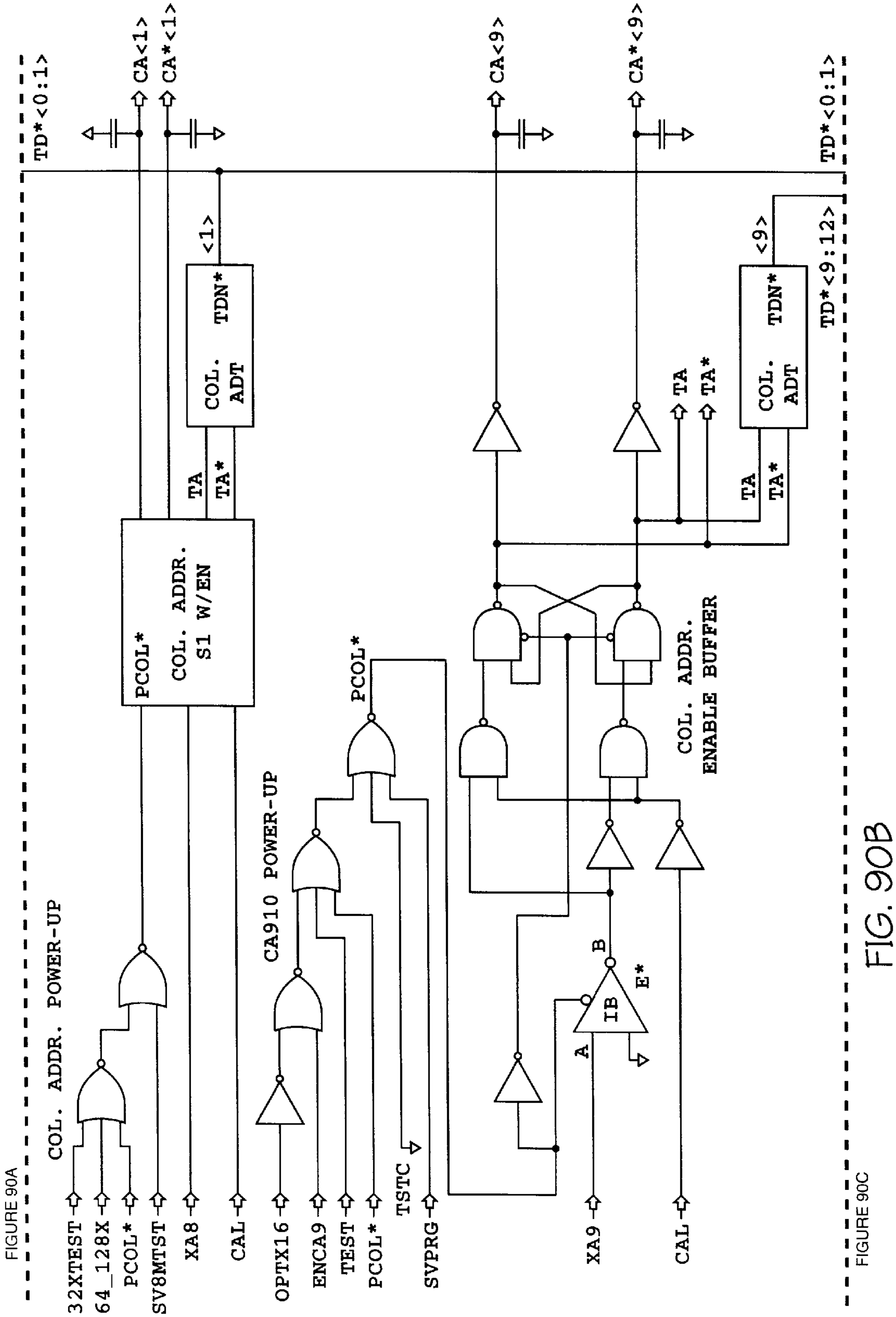
Figure 90C:
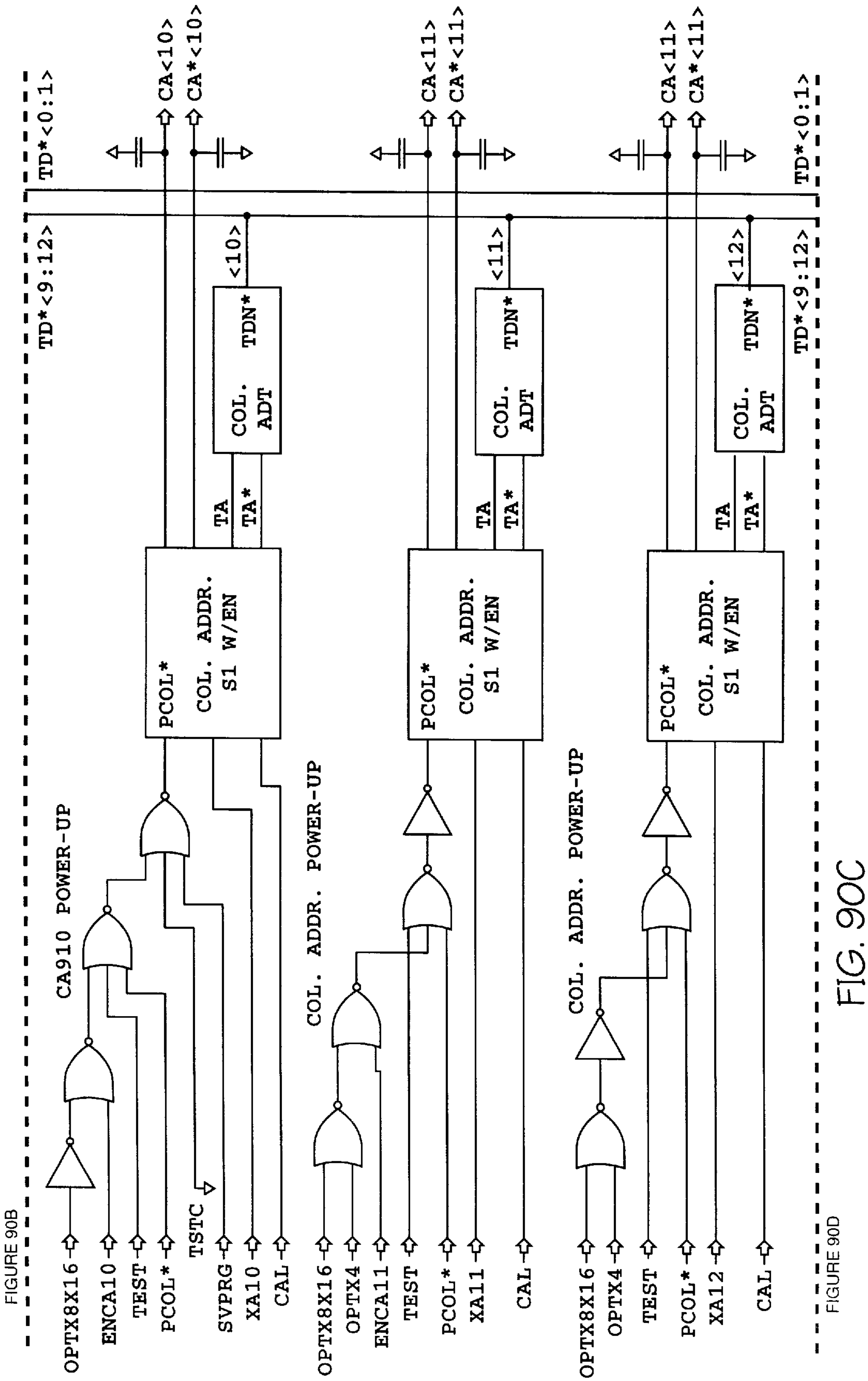
Figure 90D:
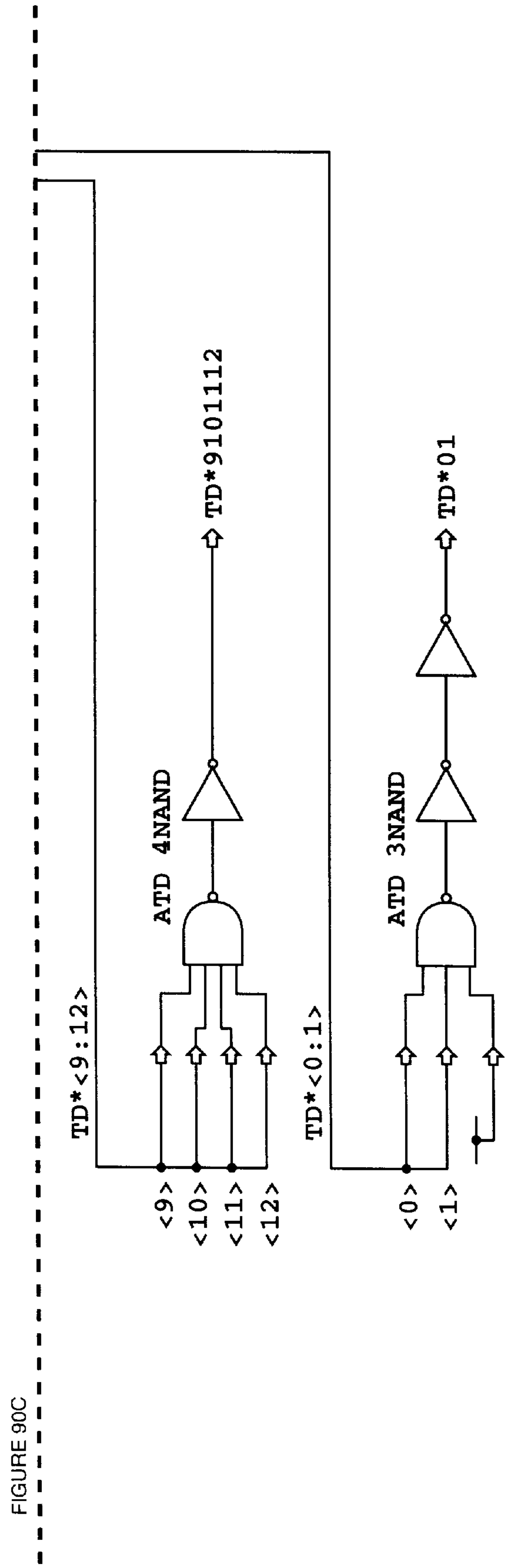
Figure 91:
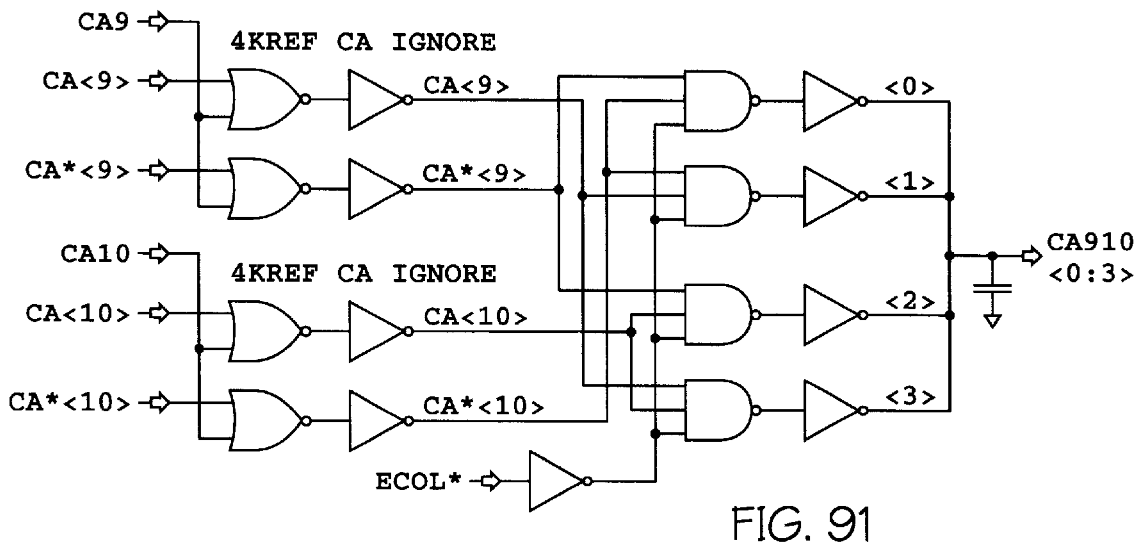
FIG. 91 is a schematic diagram of circuitry associated with ignoring the 4K refresh option of the memory device of FIG. 2.
Figure 92:
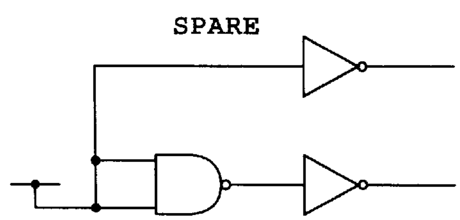
FIG. 92 is a schematic diagram of a portion of circuitry associated with column address buffer circuitry in the memory device of FIG. 2.
Figure 93:
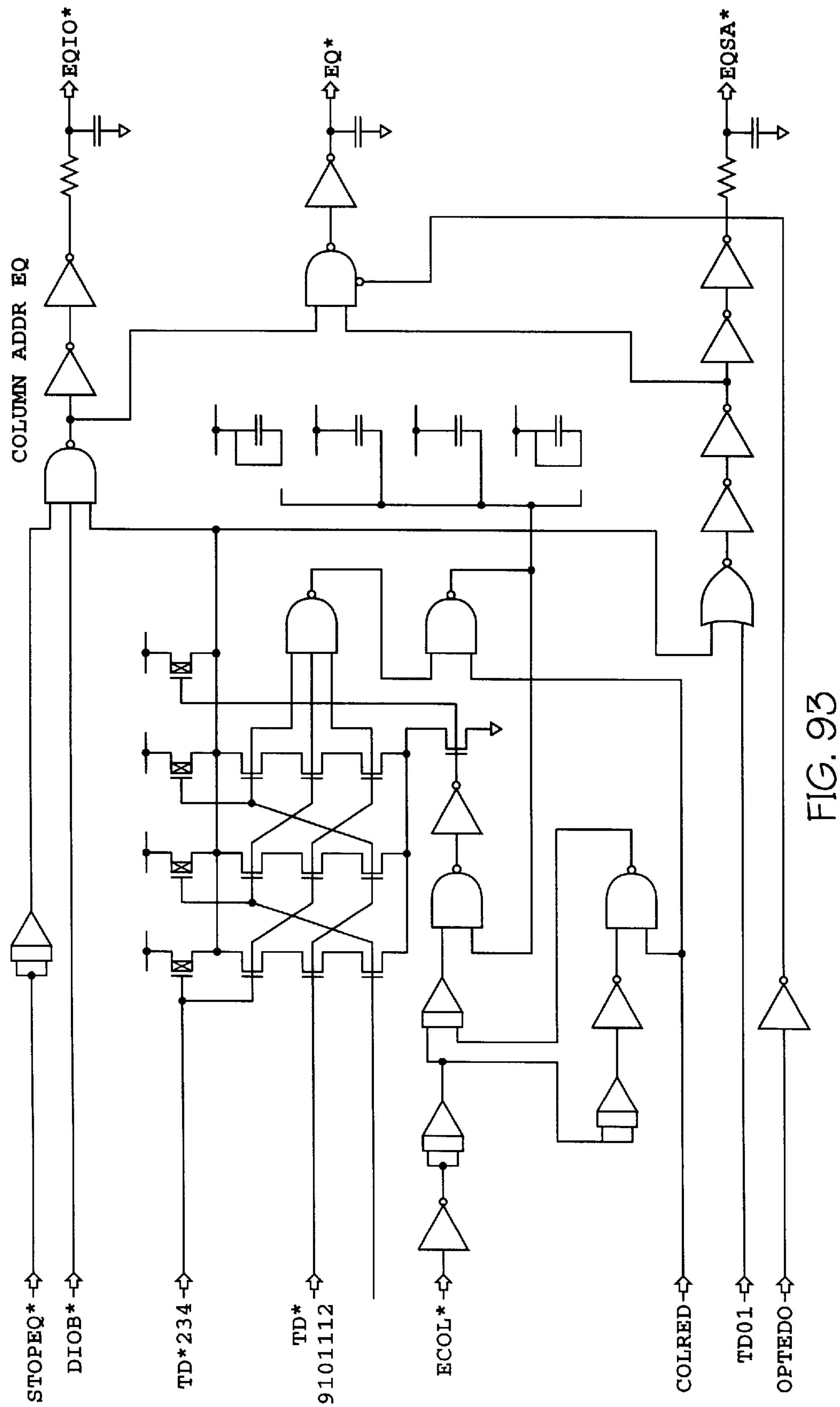
FIG. 93 is a schematic diagram of circuitry for generating I/O equalization and sense amplifier equalization signals in the memory device of FIG. 2.
Figure 94:
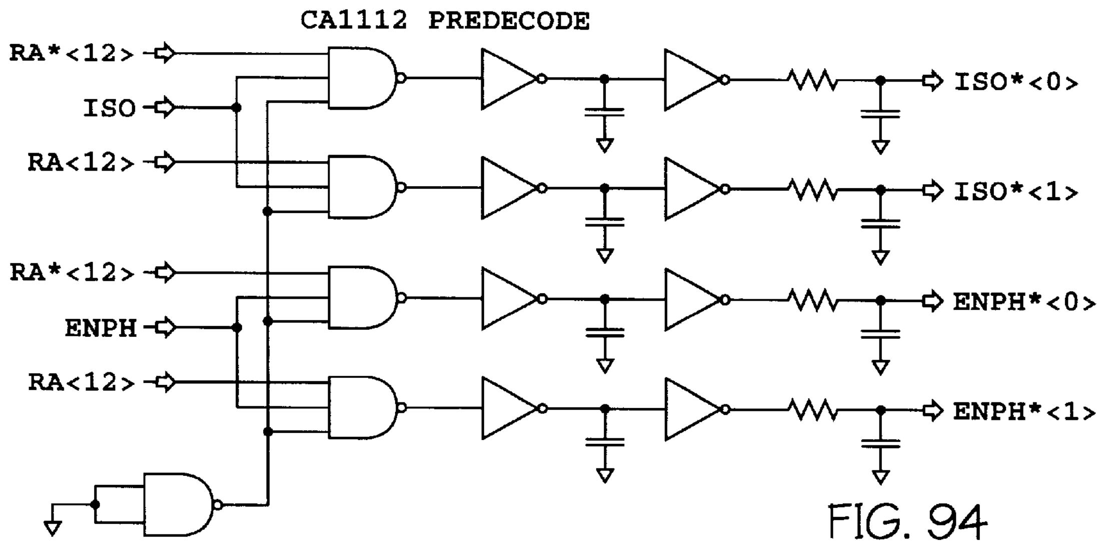
FIG. 94 is a schematic diagram of circuitry for predecoding address signals and generating signals associated with the isolation of N-type sense amplifiers and enabling P-type sense amplifiers in the memory device of FIG. 2.
Figure 95:
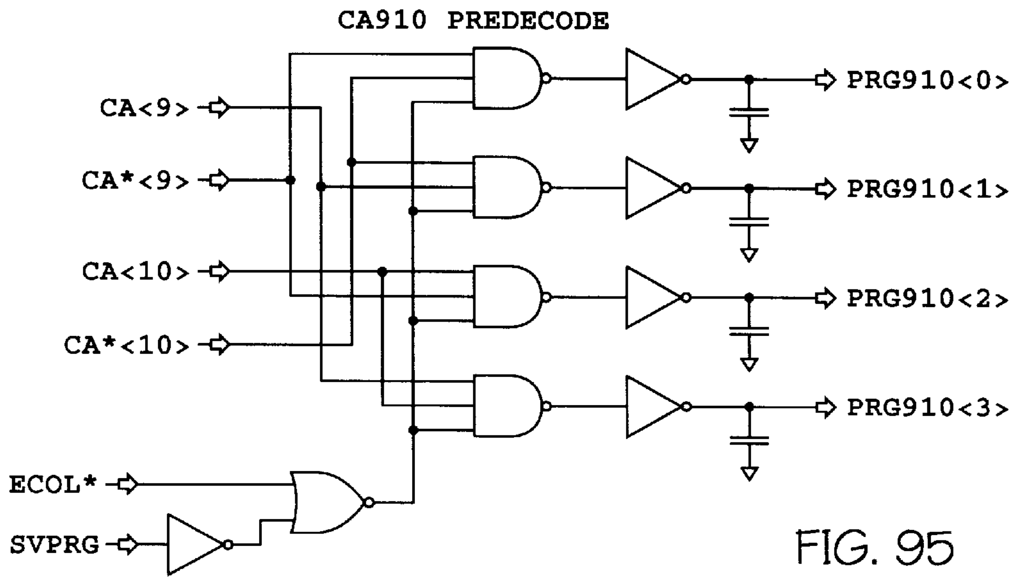
FIG. 95 is a schematic diagram of circuitry for decoding certain column address bits associated with programming of the memory device of FIG. 2.
Figure 96:
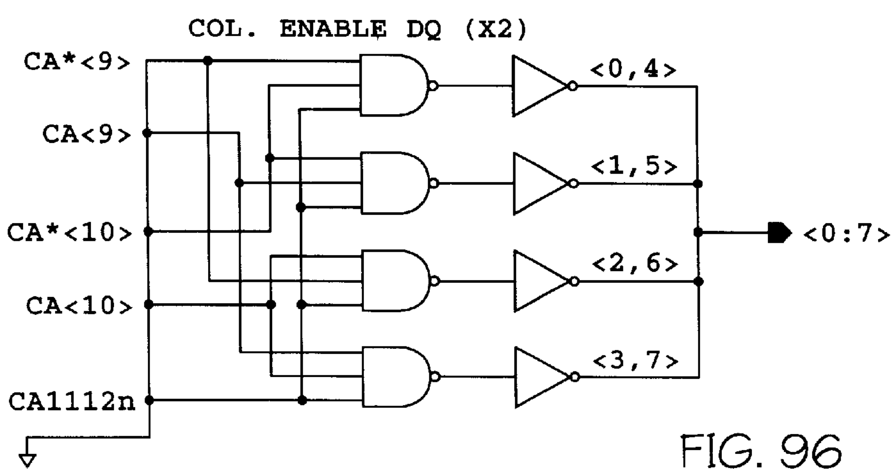
FIG. 96 is a schematic diagram of circuitry for decoding certain column address bits applied to the memory device of FIG. 2.
Figure 97:
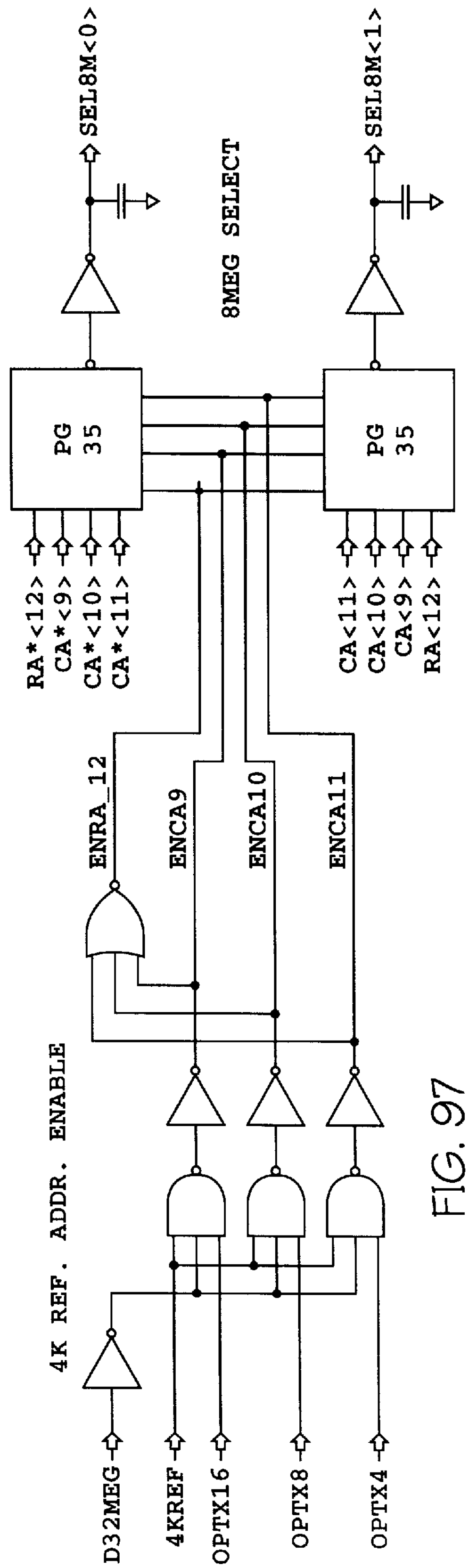
FIG. 97 is a schematic diagram of circuitry for generating signals to identify an 8 Mbit section of the memory device of FIG. 2.
Figure 98:
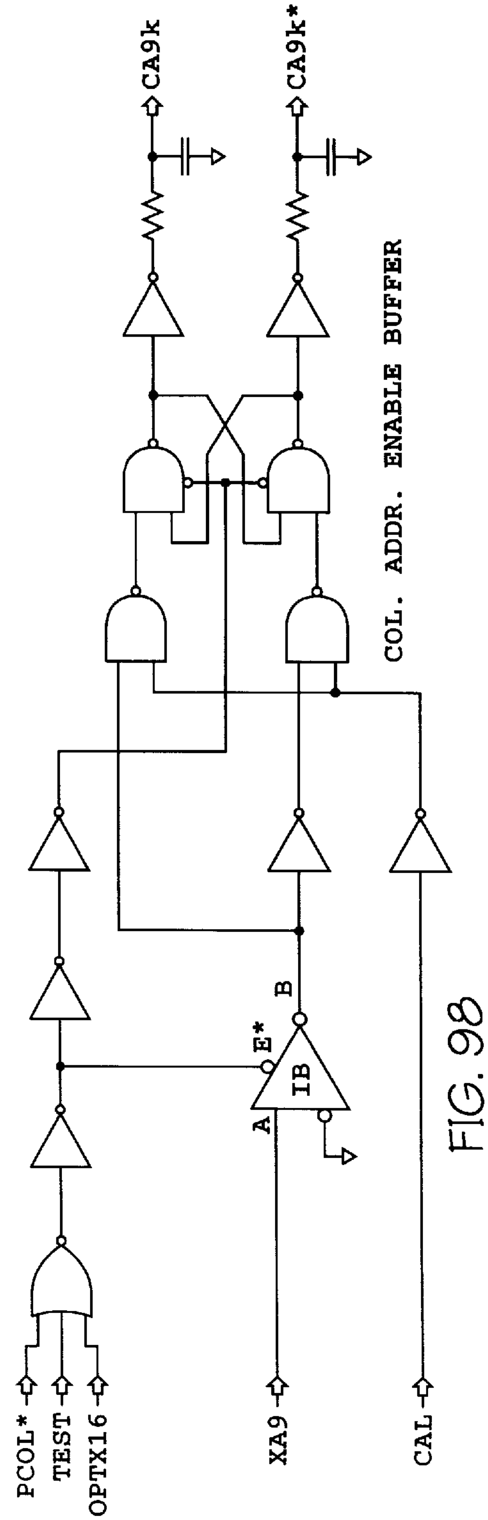
FIG. 98 is a schematic diagram of column address enable buffer circuitry in the memory device of FIG. 2.
Figure 99:
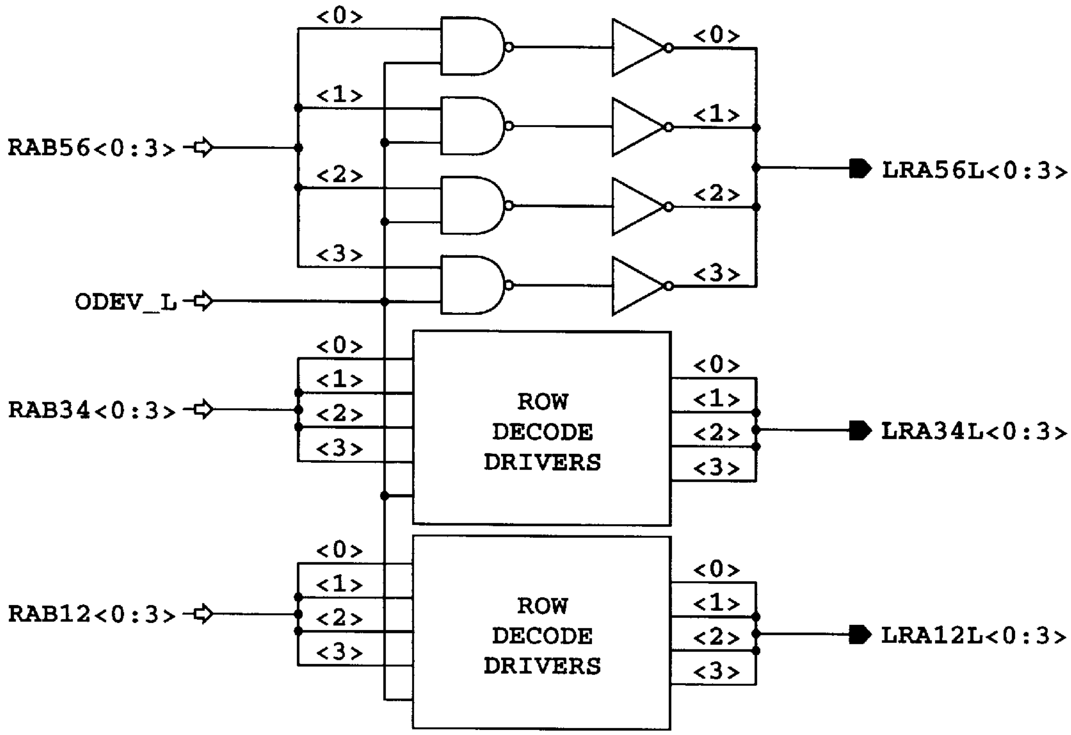
FIG. 99 is a schematic diagram of a local row decode driver circuit in the memory device of FIG. 2.
Figure 100:
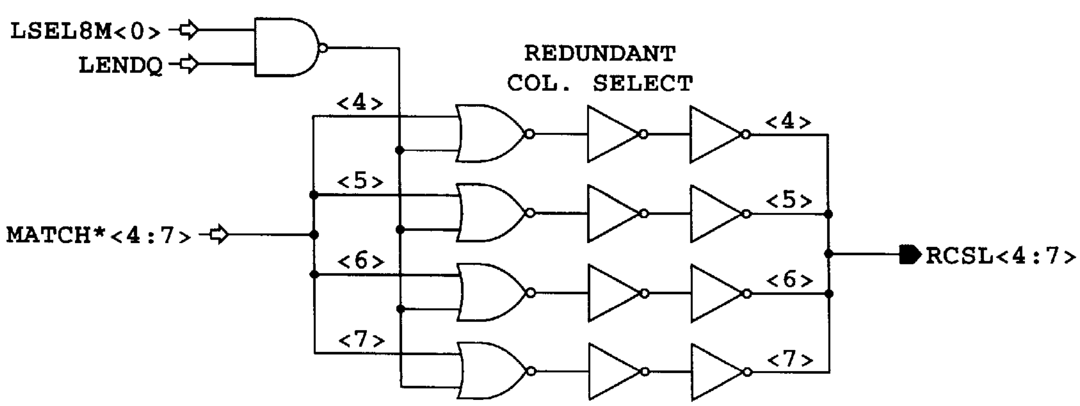
FIG. 100 is a schematic diagram of a column decode circuit in the memory device of FIG. 2.
Figure 101:
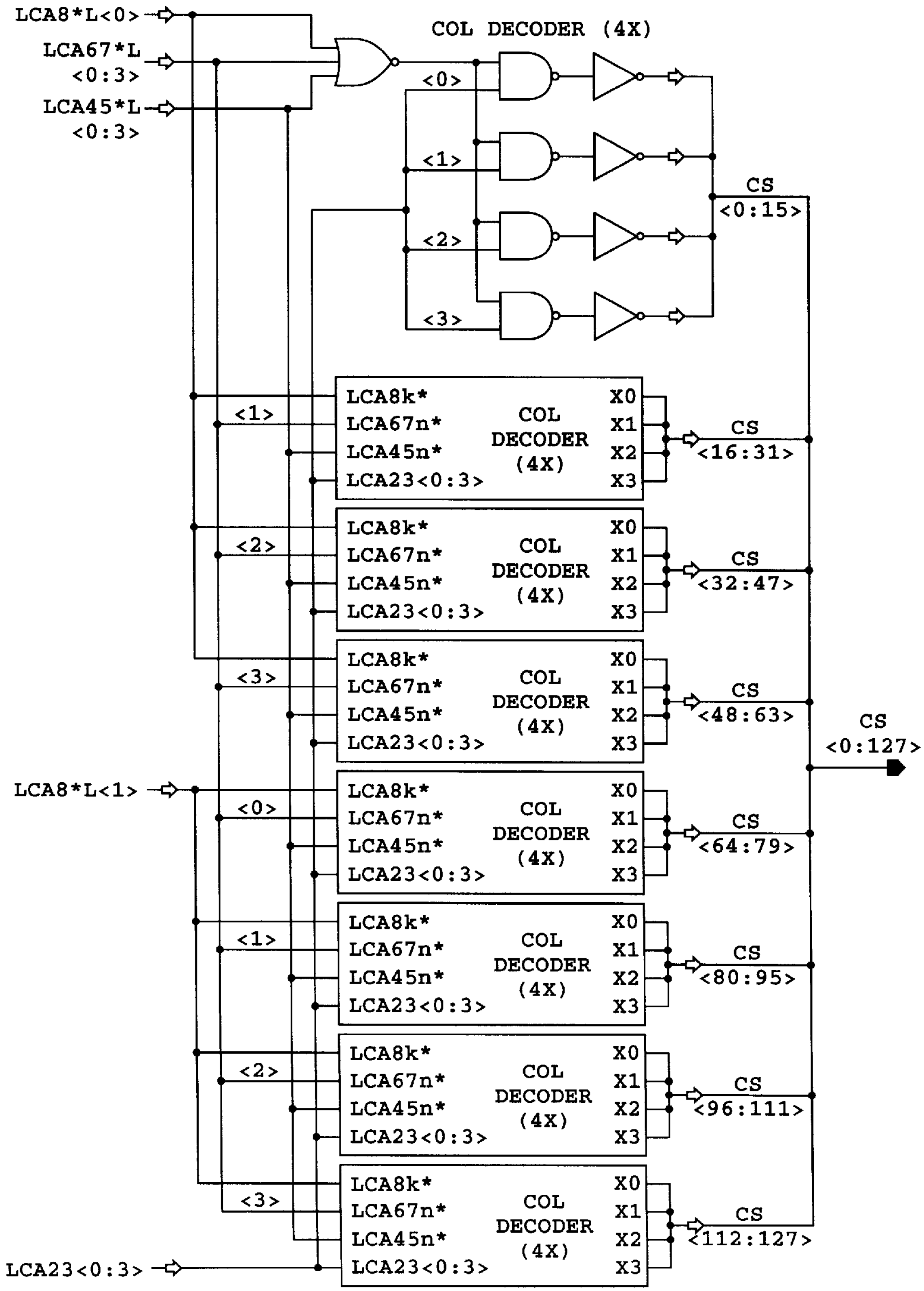
FIG. 101 is a schematic diagram of additional column decode circuitry in the memory device of FIG. 2.
Figure 102:
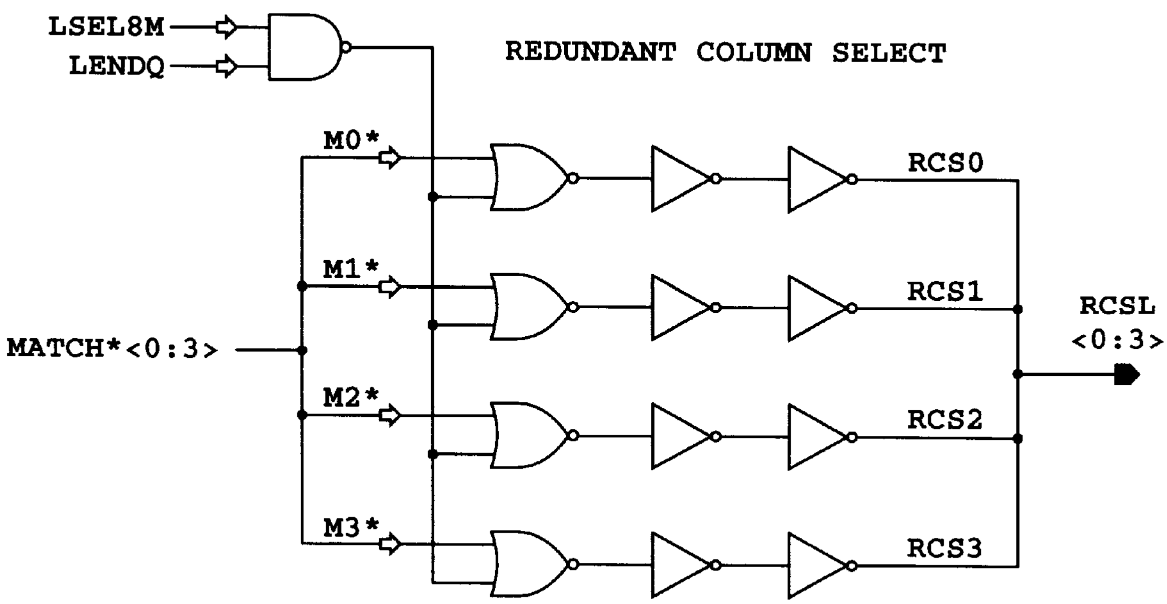
FIG. 102 is a schematic diagram of redundant column select circuitry in the memory device of FIG. 2.

An alternative block diagram representation of electrical match fuse banks 250, showing their relation to corresponding laser match fuse banks, is provided in FIGS. 80 through 86. FIG. 80 identifies the signal names of input signals to the circuitry associated with the laser and electrical redundancy fuse circuitry of device 10, the row laser match fusebanks being shown in FIG. 79. FIGS. 81, 82, 83 and 84 show that there are three laser fusebanks for every row fusebank, and either row electrical fusebanks 250 or row laser fusebanks 250 can generate the RBmPHn signals necessary to cause replacement of a defective row.

The redundant row electrical driver circuits 254 referred to above with reference to FIG. 222 are shown in FIGS. 154, 155, 156, and 157. As shown in those Figures, each driver circuit 254 receives the RBmPHn signals generated by the match fuse banks 250 and decodes those signals into REDPHm*<0:3> signals, which correspond to the signals applied to lines 260 as described above with reference to FIG. 222, and further generates an RBm* signal, which corresponds to the signal applied to line 258 as also discussed above with reference to FIG. 222.

The REDPHm*<0:3> signals produced by redundant row driver circuits 254 are conveyed to the array driver circuitry shown in FIGS. 158 and 159, collectively, which circuitry corresponds to the SAB Selection Control circuitry blocks 256, 262, and 264 described above with reference to FIG. 222.

Those of ordinary skill in the art will recognize how the REDPHm<0:3> signals applied to the array driver circuitry of FIGS. 158 and 159 function to override the predecoded row address signals RAxy also applied to the array driver circuitry, thereby causing access of a redundant row rather than a primary row for those rows identified through blowing antifuses or laser fuses in the redundant row circuitry.

In accordance with an important aspect of the present invention, it is notable that the address which initially fired off the match fuse bank can correspond to a memory location anywhere in the PAB 14, in any one of the 8 SABS. FIG. 222 simply shows how the various components interact for the purposes of the redundancy system. As a result, some lines such as those providing power and timing are not shown for the sake of clarity. FIGS. 76 through 86 and 154 through 159 show row redundancy circuitry in accordance with the present invention in considerably more detail.

FIG. 79 is a schematic diagram of a row laser fusebank 250L in accordance with the presently disclosed embodiment of the invention. To replace a defective row with a redundant row, an available redundant row must be selected. Selectively blowing a certain combination of fuses in a fusebank 250L will cause the match-fuse bank to fire upon the arrival of an address corresponding to a memory location existing in the defective primary row of SAB 18. An address which causes detection by the match-fuse bank shall be called a “critical” address. Each match fuse bank 250L is divided into six sub-banks 270, each having four laser fuses 272. (Laser fuses are utilized in the presently preferred embodiment of the invention, however, it is contemplated that any state-maintaining memory device may be used in the system.) The twenty-four predecoded address lines RA<0:3> etc. . . are divided up so that four or fewer lines 274 go to each sub-bank. Each of the address lines 274 serving a sub-bank is wired to the gate of a transistor switch 751 within the sub-bank.

In order to program the match-fuse bank to detect a critical address, three of the four laser fuses 272 existing on each sub-bank are-blown leaving one fuse unblown. Each sub-bank therefore, has four possible programmed states. By combining six sub-banks, a match-fuse bank provides $4^6$ or 4096 possible programming combinations. This corresponds to the 4096 primary rows existing in a section.

With continued reference to FIG. 79, each laser match fuse bank further comprises an enable fuse 748 in a laser fuse enable circuit 750. Enable fuse 748 determines the state of signals pa<0:3>, pb<0:3>. . . pf<0:3> which are applied to redundant fuse match circuits 270, as will be hereinafter explained.

Prior to being blown, enable fuse 748 couples the input of an inverter 752 to ground, making the output of inverter 754, designated LFEN (laser fuse enable) low. The LFEN signal is applied to the input of a NOR gate 756 which also receives a normally-low redundancy test signal REDTESTR. Since REDTESTR and LFEN are both low, the ENFB* output of NOR gate 756 will be high, making the output of NOR gates 758 and 760 low. As a result of the operation of P-type devices 762 and 764, lines p 766 and pr 768 are both high.

Although it is not shown in FIG. 79, the lines pa<0:3>, pb<0:3>. . . pf<0:3> in FIG. 79 are each selectively coupled to either line p 766 or line pr 768. This means that prior to blowing enable fuse 748, all of the lines pa<0:3>, pb<0:3>. . . pf<0:3> are high. Since no laser fuses 272 will be blown if enable fuse 748 is not blown, the drain of all laser fuses 272 will be held at a high level by the pa<0:3>, pb<0:3>. . . pf<0:3> signals. Thus, no combination of incoming predecoded row address signals RA12<0:3> etc. . . can cause any of the transistors 751 to be turned on.

Figure 43:
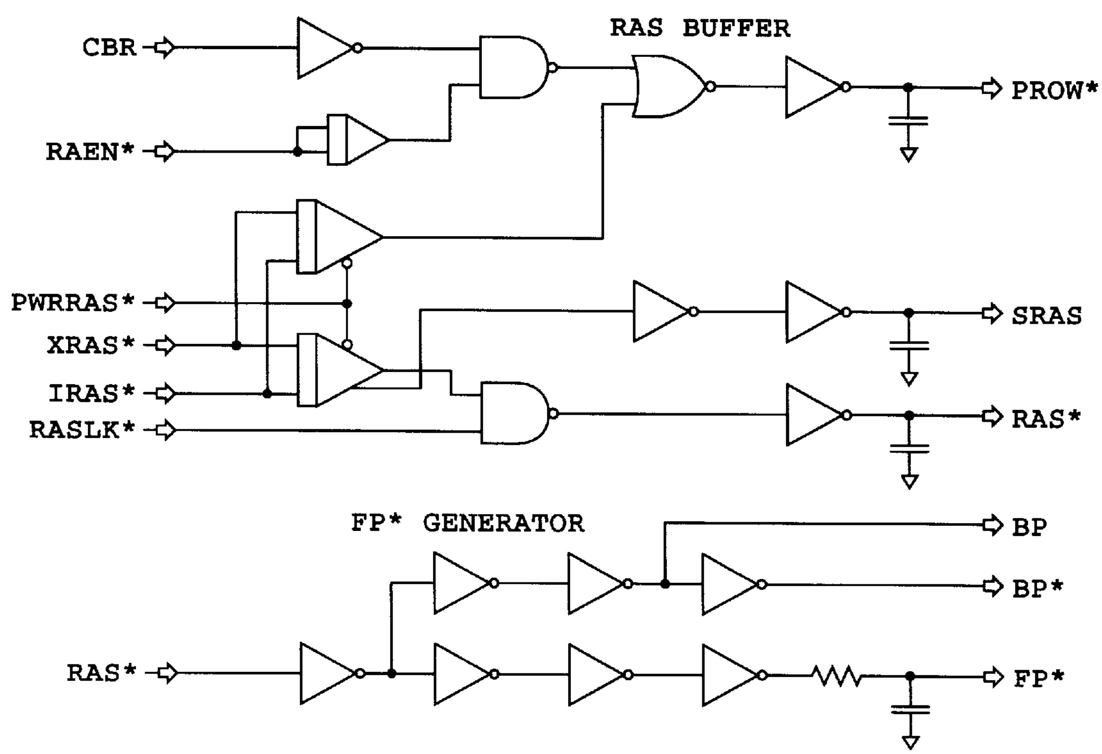
FIG. 43 is a schematic diagram of a row address strobe (RAS) signal generating circuit in the memory device of FIG. 2.
Figure 44:
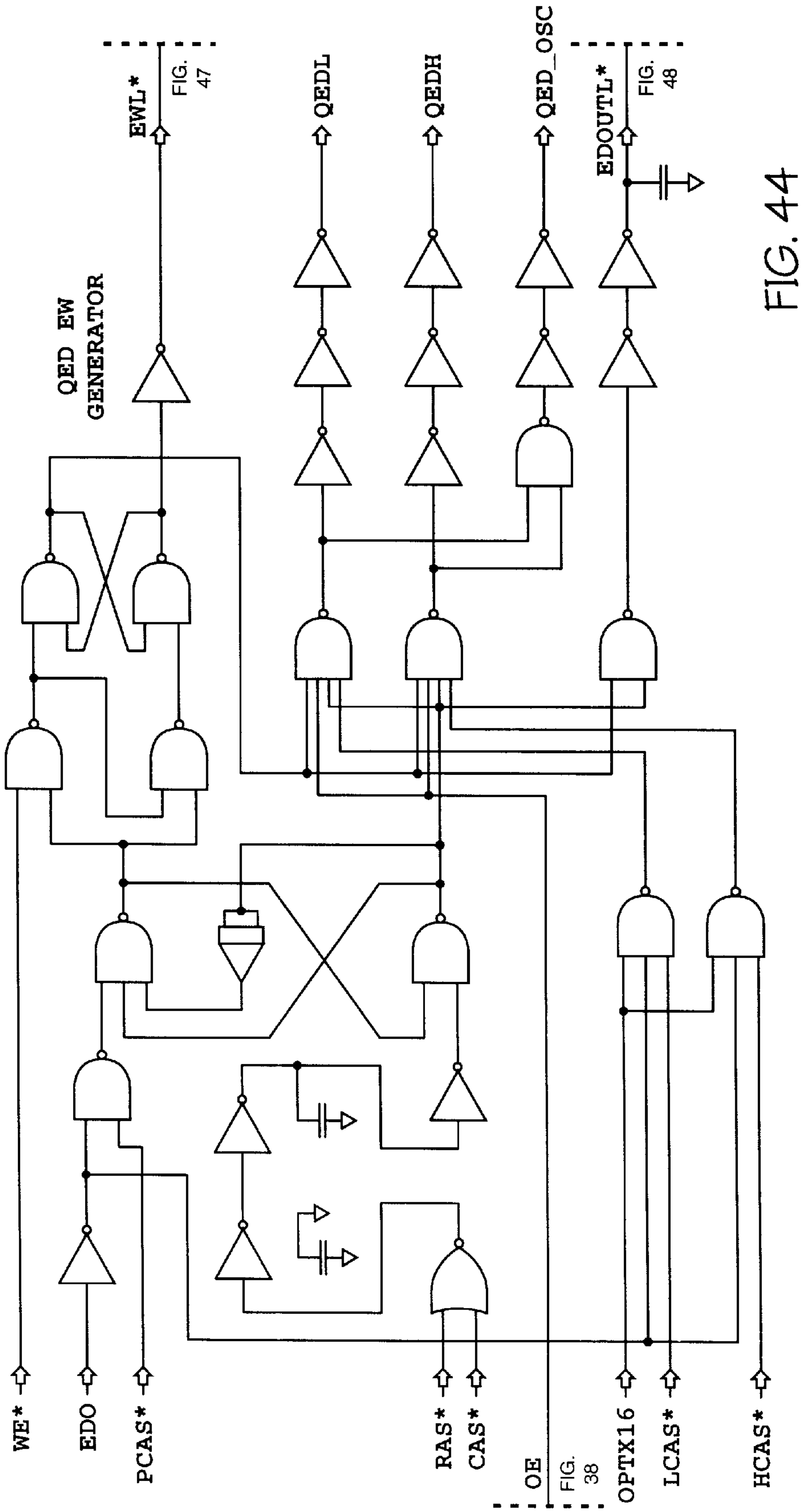
FIG. 44 is a schematic diagram of an output enable generate and early latch circuit in the memory device of FIG. 2.

Once laser enable fuse 748 is blown, however, the input of inverter 752 goes high whenever FP* goes low, which it does every RAS cycle as a result of the operation of the circuit of FIG. 43. This causes the LFEN output of inverter 754 to go high, causing the output of NOR gate 756 to go low, causing the output of NOR gates 758 and 760 to go high, turning on transistors 762 and 764. When transistors 762 and 764 turn on, they each establish a path to ground from the various inputs pa<0:3> through pf<0:3> to redundant laser fuse match circuits 270.

(Each of the inputs pa<0:3> through pf<0:3> to redundant laser fuse match circuits 270 are coupled to either signal line p 766 or to signal line pr 768 terminals shown in FIG. 79. During normal operation of device 10, terminals p 766 and pr 768 are always both tied to $V_{cc}$ or both tied to ground, depending upon whether enable fuse 748 is not blown or blown, respectively, to enable row laser fusebank 250. Thus, the signals pa<0:3> through pf<0:3> are likewise all either at $V_{cc}$ or all at ground, depending upon whether enable fuse 748 is blown or not blown. The reason the signals pa<0:3> through pf<0:3> are differentiated is in support of a redundancy test mode, in which it is desirable to temporarily map each fusebank 250 to an address without blowing enable fuse 748 for the purposes of testing the redundant rows, i.e., simulating a situation in which the fusebank 250L is enabled and a row address is applied to cause a critical address match without blowing fuses in the fusebank 250L.

FIG. 223 represents a simplified block diagram of row laser fusebank 250L in accordance with the presently disclosed embodiment of the invention, in which it is more explicitly shown that the signals pa<0:3> through pf<0:3> are always all either grounded or all at $V_{cc}$ depending upon the state of enable fuse 748, except during the redundancy row testing mode of operation.)

With continued reference to FIG. 79, when signal lines pa<0:3> through pf<0:3> are at $V_{cc}$ (i.e., when laser enable fuse 748 is not blown), the various outputs m*<0> through m*<6> are maintained at $V_{cc}$ regardless of the state of the local row address signals RAxy<0:3> applied to each redundant fuse match circuit 270. This is due to the operation of an inverter 800 and a p-type transistor 802 in each redundant laser fuse match circuit 270, which tend to hold the m*<x> lines at $V_{cc}$. However, when laser redundancy enable fuse 748 is blown, such that each of the signals pa<0:3> through pf<0:3> is taken to ground potential, a given local row address signal 274 applied to a redundant laser fuse match circuit 270 will cause the corresponding m*<x> line to be pulled down to ground potential.

Those of ordinary skill in the art will appreciate that the arrangement of NOR, NAND, and inverter gates in row redundant match circuit 804 in FIG. 79 is such that if each of the signals m*<0> through m*<6> applied thereto is low, the RBmPHn output therefrom will be asserted (high), indicating a match in that fusebank 250 has occurred. In order to cause each signal m*<0> through m*<6> goes low in response to a unique local row address, three out of each four laser fuses 272 in each redundant fuse match circuit 270 in a laser fusebank 250L is blown. Upon occurrence of the unique local row address to which a particular laser fuse bank 250L has been programmed, then the unblown laser fuse 272 in each redundant laser fuse match circuit 270 will cause the corresponding m*<x> line to be pulled low, causing the corresponding RBmPHn signal to be asserted to indicate a redundant row match to that unique row address.

If an arriving address is not a match, the m*<x> signal generated by one or more of the redundant fuse match circuits 270 will remain high, thereby keeping the output of row redundant fuse match circuit 804 low. Thus, the combination of the blown and un-blown states of the twenty-four fuses 272 in a given laser row fusebank 250 determines which primary row will be replaced by the redundant row dedicated to this bank. It shall be noted that this system can be adapted to other memory arrays comprising a larger number of primary circuit elements by changing the number of fuses in each sub-bank and changing the number of sub-banks in each match-fuse bank. Of course the specific design must take into account the layout of memory elements and the addressing scheme used. The circuit design of the sub-bank can be changed to accommodate different addressing schemes such that a match-fuse bank will fire only on the arrival of a specific address or addresses corresponding to other arrangements of memory elements, such as columns. Logic circuitry can be incorporated into the sub-bank circuitry to allow for more efficient use of the available fuses without departing from the invention.

Referring now to FIGS. 76, 77, and 78, the operation of row redundancy electrical fusebanks 250E, which is similar but slightly different than that of row redundancy laser fusebanks 250L as just described with reference to FIG. 79. In FIGS. 76, 77, and 78, however, those components which are substantially identical to those of FIG. 79 have retained identical reference numerals.

In FIG. 76, it can be seen that each row electrical fusebank 250E includes an electrical fusebank enble circuit 261 having an enable fuse 748. Enable fuse 748, like enable fuse 748 in FIG. 79, is blown to activate or enable the fusebank 250E with which it is associated. When enable fuse 748 is blown, this causes assertion of the electrical fuse enable signal designated EFEN in FIGS. 76, 77, and 78 to activate electrical fusebank 250. In particular, the EFEN signal which is asserted in response to the blowing of enable fuse 748 in row electrical fusebanks 250, is applied to one input of NAND gates 810, 812, 184, and 816 included in each row redundant electrical fuse match circuit 270 in each row electrical fusebank 250. When the EFEN input to each NAND gate 810, 812, 814, and 816 is deasserted, the outputs from those NAND gates will always be high. When enable fuse 748 in a row electrical fusebank 250 is blown, however, the EFEN input to each NAND gate 810, 812, 814, and 816 will be asserted, so that those NAND gates each act as inverters with respect to the other input thereof. The assertion of the EFEN output from electrical row fuse enable circuit 261 also is determinative of the assertion or deassertion of the p and pr outputs 766 and 768 from redundant row pulldown circuits 268 and 269 in FIG. 76. Like the p and pr outputs 766 and 768 in row laser fusebank circuits in FIG. 79, the p and pr outputs 766 and 768 from redundant row pulldown circuits 268 and 269 in FIG. 76 determine whether the pa<0:3> through pf<0:3> inputs to redundant row fuse match circuits 255 in row electrical fusebanks 250 are asserted or deasserted. As was the case for the pa<0:3> through pf<0:3> signals in FIG. 279, those in FIGS. 77 and 78 are either all asserted or all deasserted, depending upon whether enable fuse 748 is or is not blown, except during a redundant row test mode of operation, in which individual electrical row fusebanks 250 are mapped to particular addresses for the purposes of testing. If enable fuse 748 is not blown, the signals pa<0:3> through pf<0:3> will always be asserted, preventing the m*<x> outputs from electrical row fuse match circuit 255 from ever being asserted (low). When enable fuse 748 is blown, on the other hand, (and device 10 is not operating in the redundant row test mode) the pa<0:3> through pf<0:3> signals are all deasserted, so that depending upon which electrical antifuses 257: are blown, each row electrical fusebank 250 will be responsive to a unique local row address applied to its RAxy<z> inputs to its electrical row fuse match circuits 253 to assert (low) its m*<x> outputs. If a row address for which a given row electrical fusebank 250 is programmed is applied, each of its m*<x> outputs will be asserted (low), so that the RBmPHn output from its row redundant match circuit 257 will be asserted (high).

Summarizing the operation of row electrical fusebank circuits 250E, each electrical fuse row match circuit 253 in each row electrical fusebank circuit 250E includes two electrical antifuses 257 which are selectively blown in order to render the fusebank circuit 250 responsive to a unique row address. Those of ordinary skill in the art will appreciate upon observing FIG. 77 that when the EFEN input to NAND gates 810, 812, 814, and 816—is enabled, whether neither, one, or both antifuses 257 in each electrical row fuse match circuit 253 is/are blown will determine which combination of local row address signals RAxy<z> applied to each electrical row fuse match circuit 253 will result in assertion of the FX0/FX0* and FX1/FX1* outputs of NAND gates 810, 812, 814, and 816 will be asserted. Those FX0/FX0* and FX1/FX1* outputs, in turn, determine whether the m*<x> output of the electrical row fuse match circuit 253 is asserted, in the same manner in which the local row address signals applied to redundant laser fuse match circuits 270 in FIG. 279 determine whether the respective m*<x> outputs therefrom are asserted.

Both laser and electrical row fusebanks 250L and 250E as described above function to assert their RBmPHn outputs in response to unique local row addresses, and these RBmPHn signals are provided to redundant row driver circuits, depicted in FIGS. 154 through 157, to generate REDPH*<x> signals.

The purpose of the redundant row drivers shown in FIGS. 154 through 157 is to inform its SAB 18 that a redundant row is to be activated, and which of the four redundant rows on the SAB is to be accessed. The drivers also inform all the other SAB's the redundant operation is in effect, disabling all primary rows. The redundant row drivers use means similar to the match fuse bank to detect a match. Referring to FIGS. 154 through 157, and to FIG. 223, information that a redundant row in an SAB 18 is to be accessed is carried on a line RBm* 288 in each driver 254 as a selection signal. RBm* attains a ground voltage when any of the four lines 252 arriving from the match fuse banks 250 carries an activation voltage. Information concerning which of the four redundant rows in the SAB 18 is to be accessed is carried on the four redundant phase driver lines 260 labeled REDPH0*, REDPH1*, REDPH2* and REDPH3*. Since the redundant phase driver lines are common to all the SABs, these lines are used to inform all the SAB's that primary row operation is to be disabled.

During an active cycle, when a potential matching address is to be scrutinized by the match fuse banks, RBm* 258 and REDPH0* through REDPH3* 260 are precharged to $V_{cc}$ by RBPRE* line 292 prior to the arrival of the address. RBm* is held at $V_{cc}$ by a keeper circuit 294. When a match fuse bank 250 has a match, its output 252 closes a transistor switch 296 which brings RBm* to ground. It also closes a transistor switch 297 dedicated to one of the four redundant phase driver lines 290 corresponding to that match fuse bank's phase position. The remaining phase driver lines REDPHX* remain at Vcc, however, since the other match fuse banks serving the SAB 18 would not have been set to match on the current address.

The outputs of the redundant row drivers (Rbm* 258 and REDPH0* through REDPH3*) supply information to the SAB Selection Control circuitry 256 for all the SABs. The job of each SAB Selection Control module 256 is to simply generate signals which help guide its SAB operations with respect to its primary and redundant rows of memory. If primary row operation is called for, the module will generate signals which enable its SAB for primary row operations and enable the particular row phase-driver for the primary row designated by the incoming address. If redundant operation is called for, the module must generate signals which disable primary row operations, and if the redundant row to be used is within its SAB, enable its redundant row operations.

In other words, when memory is being accessed, each SAB can have six possible operating states depending on three factors: (1) whether or not the current operation is accessing a primary row or a redundant row somewhere in the entire section; (2) whether or not the address of the primary row is located within the SAB of interest; and (3) if a redundant row is to be accessed, whether or not the redundant row is located in the SAB of interest. In the case where a primary row is being accessed, REDPH0 through REDPH3 will be inactive, allowing for primary row designation. During redundant operation, one of REDPH0 through REDPH3 will be active, disabling primary operation in all SABs and indicating the phase position of the redundant row. The status of a particular SAB's RBm* line will signify whether or not the redundant row being accessed is located within that SAB.

FIG. 224 shows a simplified circuit diagram for one embodiment of one SAB Selection Control circuit 256.

In order to set its dedicated SAB to the proper operational state, the SAB Selection Control circuit 256 has three outputs. The first, EBLK 300, is active when the SAB is to access one of its rows, either primary or redundant. The second, LENPH 302, is active when the SAB phase drivers are to be used, either primary or redundant. The third, RED 304, is active when the SAB will be accessing one of its redundant rows.

The SAB Selection Control circuit is able to generate the proper output by utilizing the information arriving on several inputs. Primary row operation inputs 306 and 308 become active when an address corresponding to a primary row in SAB 0 is generated. When a redundant match occurs, redundant operation is controlled by redundant input lines RB0 288 and REDPH0 through REDPH3 290.

FIGS. 158 and 159 collectively illustrate in greater detail the implementation of SAB selection control circuitry 256 and the derivation of the RED, EBLK, and LENPH signals.

Each of the above mentioned six operational cases for a given SAB 18 will now be discussed in greater detail. During primary operation when the address does not correspond to a memory location in the SAB, none of the redundant input lines 288 and 290 and none of the primary operation input lines 306 and 308 are active.

During primary operation when the address does correspond to a memory location in the SAB, none of the redundant input lines are active. However, the primary operation lines 306 and 308 are active. This in turn activates EBLK 300 and LENPH 302. During-redundant operation one of the redundant phase driver lines 290 will be active low. This logically results in outputs EBLK and LENPH being disabled. This can be overridden by an active signal arriving on RB0 288. Thus, all SABs are summarily disabled when a redundant phase driver line is active, signifying redundant operation. Only the SAB which contains the actual redundant row to be used is re-enabled through one of the redundant block enable lines RB0 through RB7.

Although FIG. 224 and FIGS. 158 and 159 show a specific logic circuit layout. Any layout which results in the following truth table would be adequate for implementing the system. FIG. 225 is a truth table of SAB Selection Control inputs and outputs corresponding to the six possible operational states.

The preferred embodiment describes the invention as implemented on a typical 64 Mbit DRAM where redundant circuit elements are replaced as rows. This is most convenient during "page mode" access of the array since all addresses arriving between precharge cycles correspond to a single row. However, the invention may be used to globally replace column type circuit elements so long as the match-fuse circuitry and the redundant driver circuitry is allowed to precharge prior to the arrival of an address to be matched.

One advantage of this aspect of the invention is that it provides the ability to quickly and selectively replace a defective element in a section with any redundant element in that section.

The invention is readily adaptable to provide parallel redundancy between two or more sections during test mode address compression. In this way, one set of match-fuse banks would govern the replacement of a primary row with a specific redundant row in a first section and the same replacement in a second section. This allows for speedier testing and repair of the memory chip.

Another advantage is that existing redundancy schemes on current memory ICs can be upgraded without redesigning the architecture. Of course, this aspect of the invention provides greater flexibility to subsequent memory array designs which may incorporate the invention at the design stage. In this case, modifications could provide for a separate redundancy bank which could provide circuits to replace primary circuitry in any SAB or any section. likewise, a chip having only one section would allow for replacing any primary circuitry on the chip with equivalent redundant circuitry.

REDUNDANT ROW CANCELLATION/REPAIR

While the provision of redundant rows (or columns) in a memory device enables a part to be salvaged even though one or more primary rows (or columns) is found to be defective, it is believed that there has not been shown in the prior art a method in accordance with the present invention for salvaging a part if a redundant row that has been switched-in in place of a defective primary row is subsequently found to be defective. That is, there is not believed to have previously been shown a way to effectively "unblow" a fuse which causes the switching-in of a redundant row, and to then cause another non-defective redundant row to be switched-in in place of the defective redundant row.

In accordance with the presently preferred embodiment of the invention, however, such a capability exists. Referring to FIG. 236, there is shown a block diagram of electrical row fusebank circuit 250 in accordance with the presently disclosed embodiment of the invention, including a match array circuit 255 as previously described with reference to FIGS. 76, 77, and 78 which, as previously noted, collectively show row fusebank circuit 250 in detail.

Row fusebank circuit 250 also includes a fusebank enable circuit 261 which, as shown in FIG. 236, functions to generate an EFEN signal to enable match array 255. Row fusebank circuit 250 further includes a cancel fuse circuit 263 which, as will be hereinafter described in further detail, operates to generate a CANRED signal to cancel or switch-out a previously switched-in redundant row. Finally, row fusebank circuit 250 includes a latch match circuit 265 which receives the MATCH signal (which corresponds to the RBmPHn signals previously described with reference to FIGS. 76, 77, and 78) from match array 255.

The latch match circuit 265, cancel fuse circuit 263, fusebank enable circuit 261, CANRED signal, and EFEN signal from FIG. 236 are each identified in the schematic diagrams of FIG. 76, 77, and 78.

In accordance with the presently disclosed embodiment of the invention, a redundant element (row or column) is cancelled by disabling the corresponding match array 255.

As shown in FIG. 76, the EFEN signal is ORed with a signal REDTESTR in OR gate 266 to generate an active low enable fusebank signal ENFB* (the ORing of EFEN with REDTESTR is done for purposes related to test modes in device 10, which is not relevant to the present description). The enable fusebank signal ENFB* is then ORed, in OR gate 267 in a redundant row pulldown circuit 268, to generate a pulldown signal p, and in a redundant pulldown circuit 269 to generate a pulldown signal pr.

The state of these signals p and pr determines the states of signals px<0:3> that are applied to match arrays 255 in the fusebank 250. The correlation between the p and pr signals and the various px<0:3> signals (i.e., pa<0:3>, pb<0:3>, . . . pf<0:3>) is apparent from diagrams of FIGS. 81, 82, and 83.

Referring again to FIG. 76, cancel fuse circuit 263 includes an antifuse 271, a pass transistor 273, protection transistors 275 and 277, a program transistor 279, a reset transistor 281, and a latch made up of transistors 283, 285, 287, and 289. To program antifuse 271, the address of the failed element is supplied to cause a match to occur in match array 255, causing RBmPHn to go high.

Figures 66, 66A:
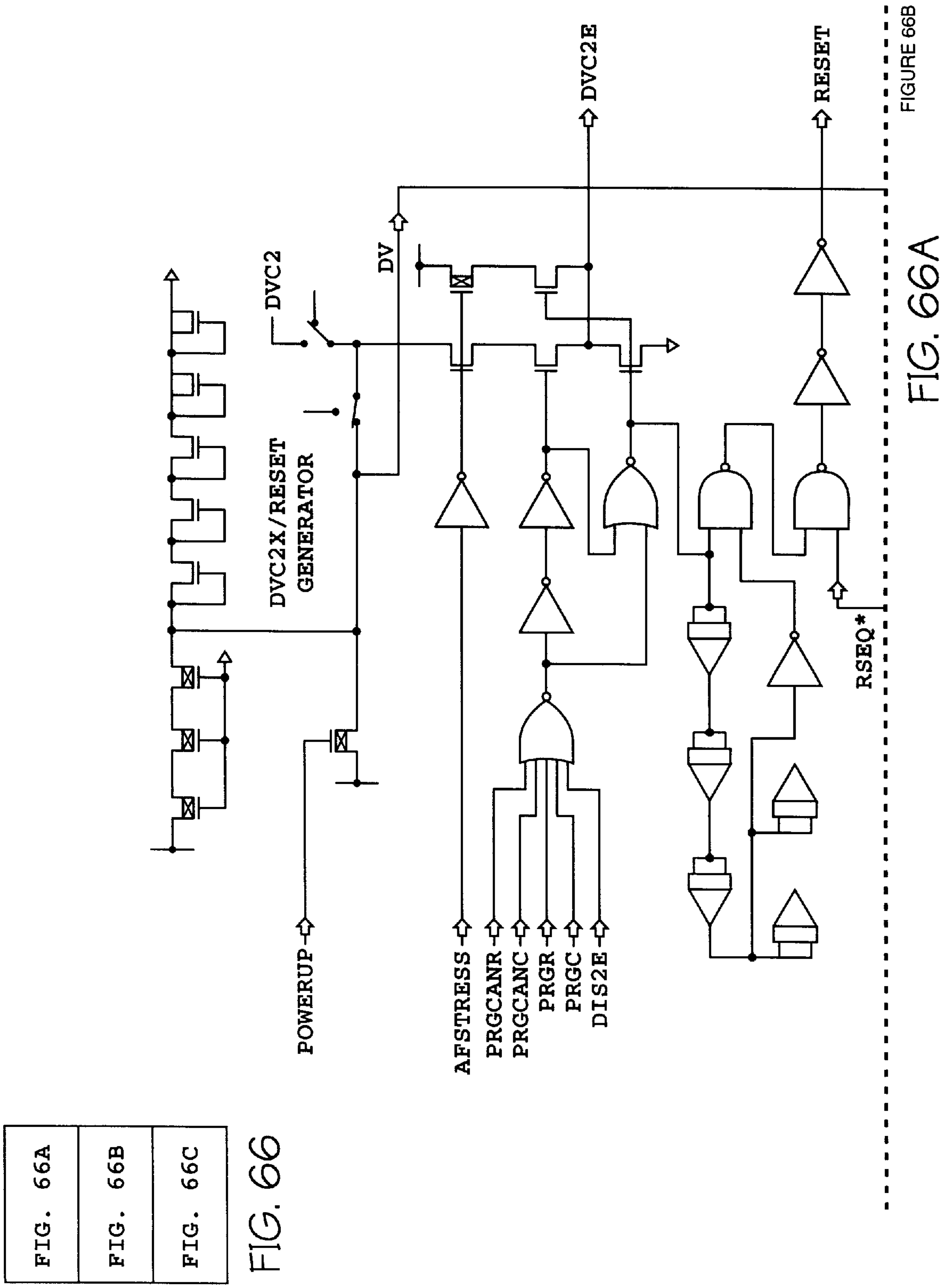
FIGS. 66A–66C are schematic diagram of a portion of backend repair programming logic circuitry in the memory device of FIG. 2.
Figure 66B:
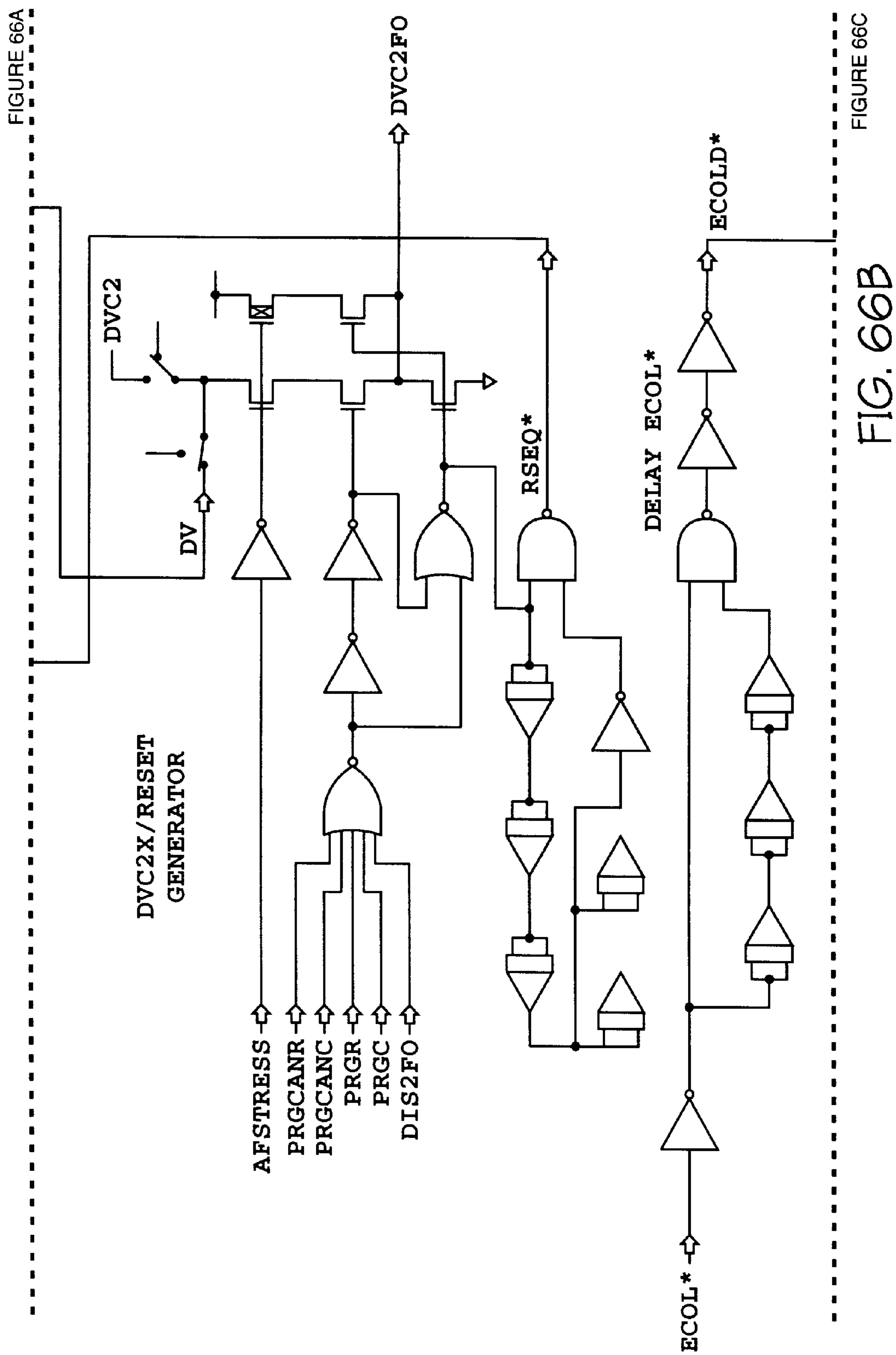
Figure 66C:
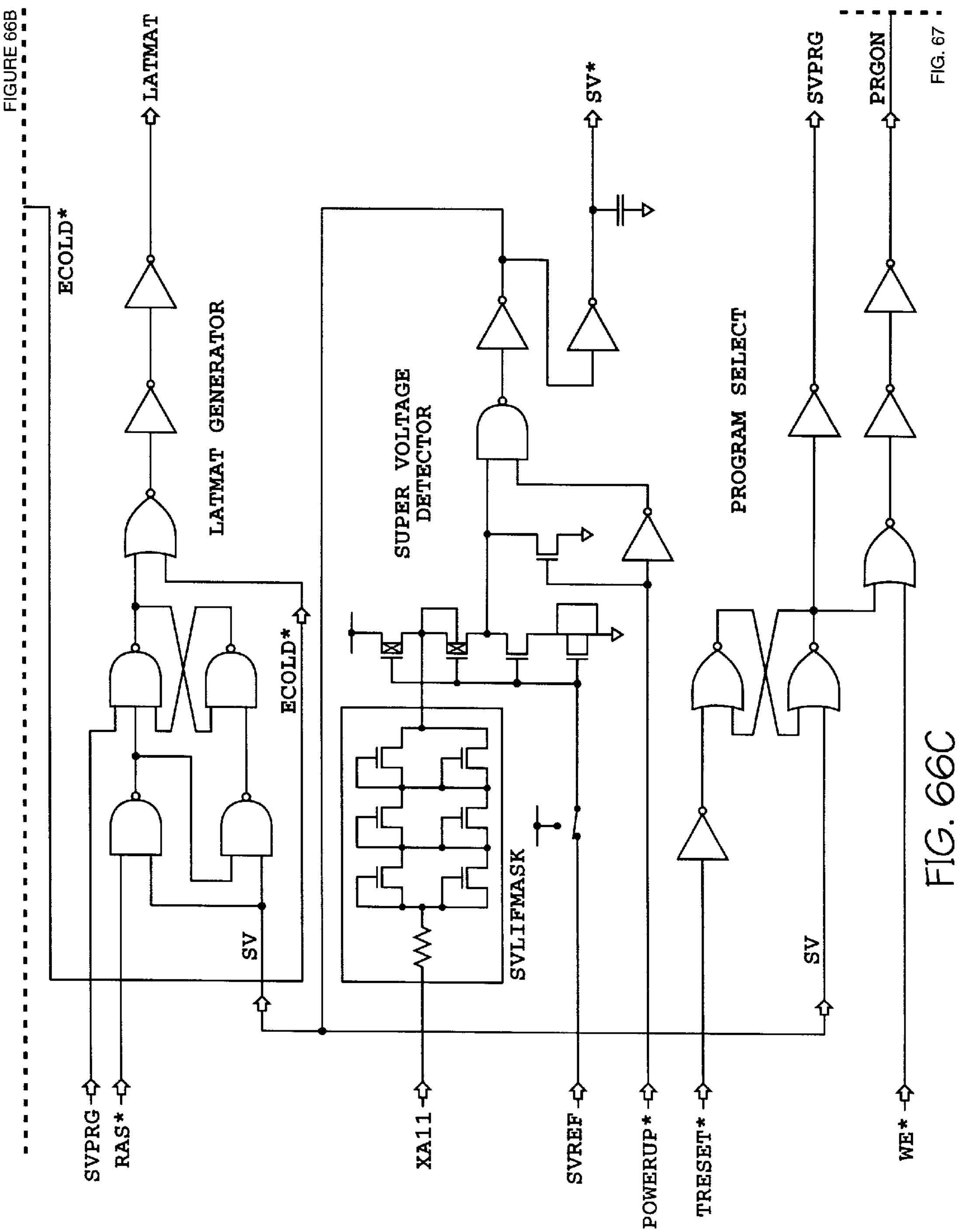

The signal LATMAT applied to latch match circuit 265 is generated by backend repair programming logic depicted in FIG. 66 and goes high in response to a RAS* cycle and a supervoltage programming signal on address pin 11. Thus, when the match signal RBmPHn goes high it is latched in latch match circuit 265. The ENABLE signal shown in FIG. 236 as an input to latch match circuit 265 corresponds to the cancel redundancy programming signal PRGCANR in the schematic of FIG. 76 and is also generated in response to a supervoltage signal on address pin 11 and a 1 on address pin 0, by backend programming logic circuitry depicted in FIGS. 66 and 67. ENABLE (PRGCANR) signal thus goes high to enable the latch match circuit to latch the match signal RBmPHn. The output of latch match circuit 265 goes high, so that the ENABLE (PRGCANR) signal going high turns on program transistor 279. At the same time, DVC2E (also generated by backend repair programming logic shown in FIG. 66) goes low to shut off passgate 273, thus isolating the latch circuit comprising transistors 283, 285, 287, and 289. (As previously noted, DVC2E is normally biased at around $V_{cc}$2.) Once transistor 279 is on and transistor 273 is off, the CGND input to device 10 is brought to the programming voltage to "pop" or "blow" antifuse 271. Once antifuse 271 is blown, it forms a short circuit. CGND then returns to ground, and DVC2E goes back to $V_{cc}/2$. The input of transistor 289 is pulled low by CGND via the shorted fuse 271, and thus the CANRED output of cancel fuse circuit 263 goes high to disable the fusebank.

The RESET input to cancel fuse circuit 263, which is generated by backend repair programming logic circuitry shown in FIG. 66 is used to ensure that the node designated 291 in FIG. 76 is initialized to ground potential before programming begins. The FP* input to fuse cancel circuit 263 is generated by RAS control logic shown in FIG. 43, and goes active low when RAS* goes low so that the input of transistor 189 is not precharged through transistors 285 and 283. FP* is high when RAS* is high to eliminate standby current after fuse 271 is programmed. Transistor 283 is a long L device to limit active current through shorted antifuse 271.

It is to be noted that the foregoing description of the programming (blowing) of antifuse 271 applies to the programming of all antifuses in device 10. CGND is a common programming line that connects to all other antifuses in device 10. For example, FIG. 77 shows that antifuses 257 in each electrical row fuse match circuit 253 have circuitry which is substantially identical to the circuitry described above with regard to the electrical fuse cancel circuit 263 (i.e., transistors 273, 275, 277, 279, 281, 283, etc. . . ), such that antifuses are blown in substantially the same way as antifuse 271.

While the procedure for blowing each antifuse in device 10 is substantially the same, one difference is that a different fuse address must be provided to identify the fuse to be blown in a given instance. As previously noted, the addresses for each fuse in device 10 are set forth in the tables of FIGS. 11, 12, and 232 through 235.

In FIG. 214, there is provided a flow diagram illustrating the steps involved in programming a redundant row electrical fusebank 250. The first step 700 in the process is to enter the program mode of device 10. This is accomplished by applying a supervoltage (e.g., 10 V or so) to address pin A11, while keeping the RAS, CAS, and WE inputs high.

Next, in step 702, the desired electrical fusebank is addressed by first applying its address within a quadrant 12, as set forth in the table of FIG. 233, to the address input pins and bringing RAS low, and then identifying the quadrant 12 of the desired fusebank on the address pins A9 and A10 and bringing CAS low.

Figure 67:
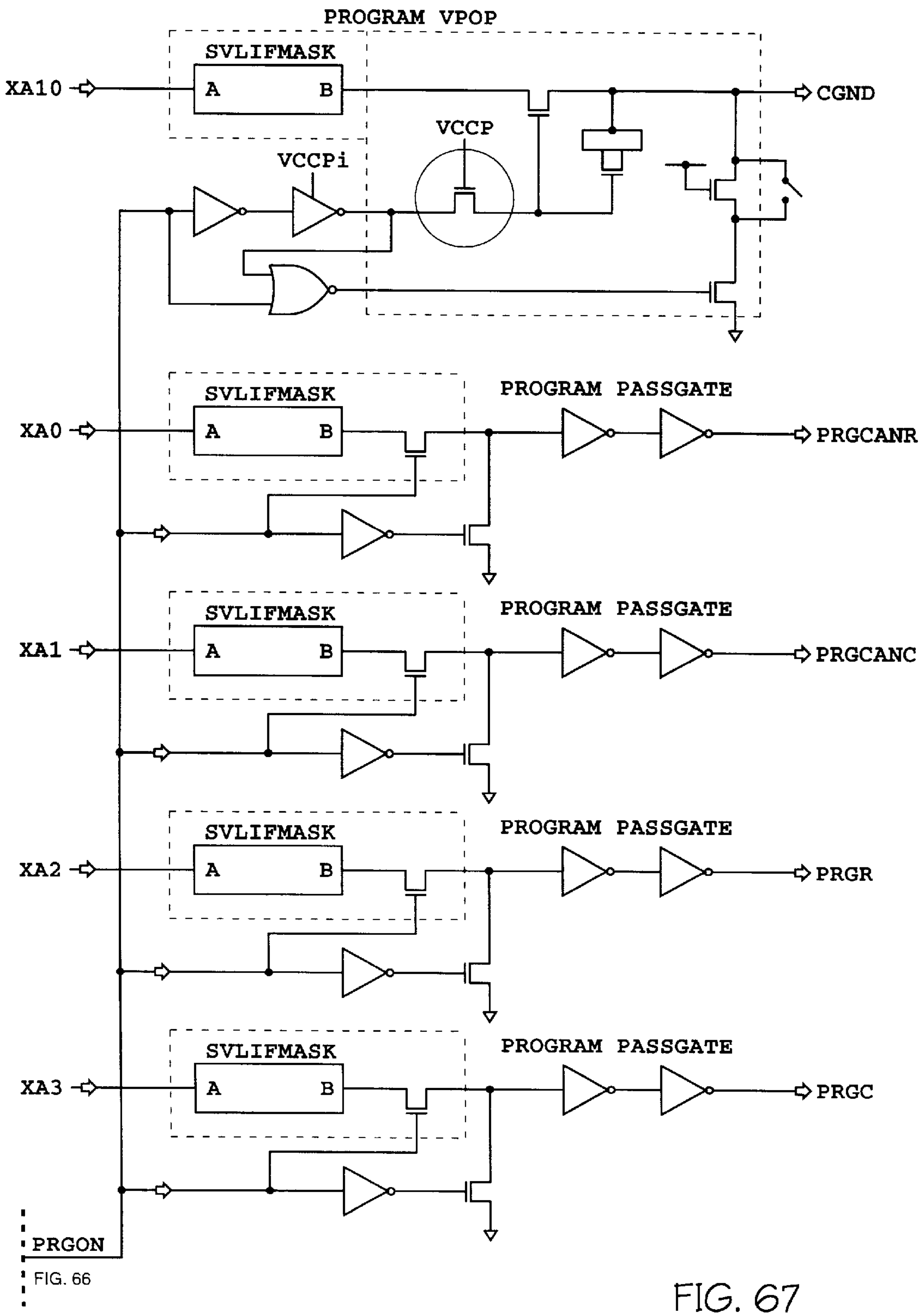
FIG. 67 is a schematic diagram of another portion of backend repair programming logic circuitry in the memory device of FIG. 2.
Figure 68:
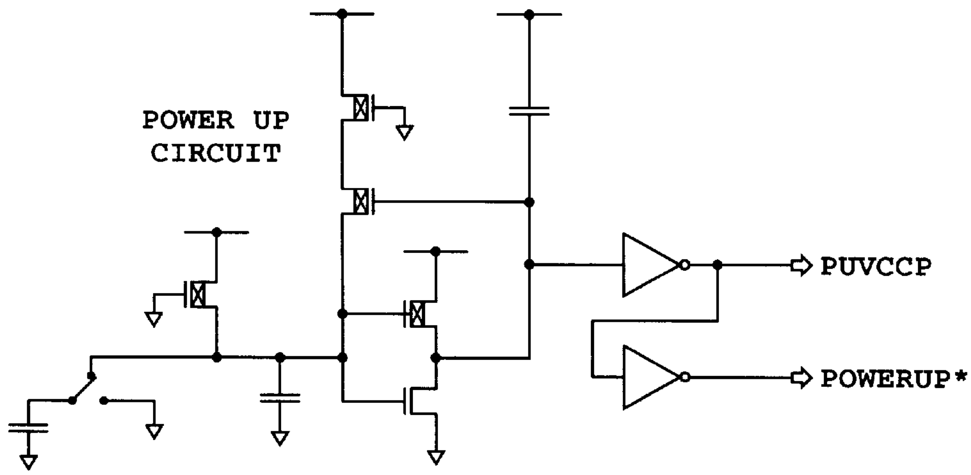
FIG. 68 is a schematic diagram of another portion of backend repair programming logic circuitry in the memory device of FIG. 2.
Figure 70:
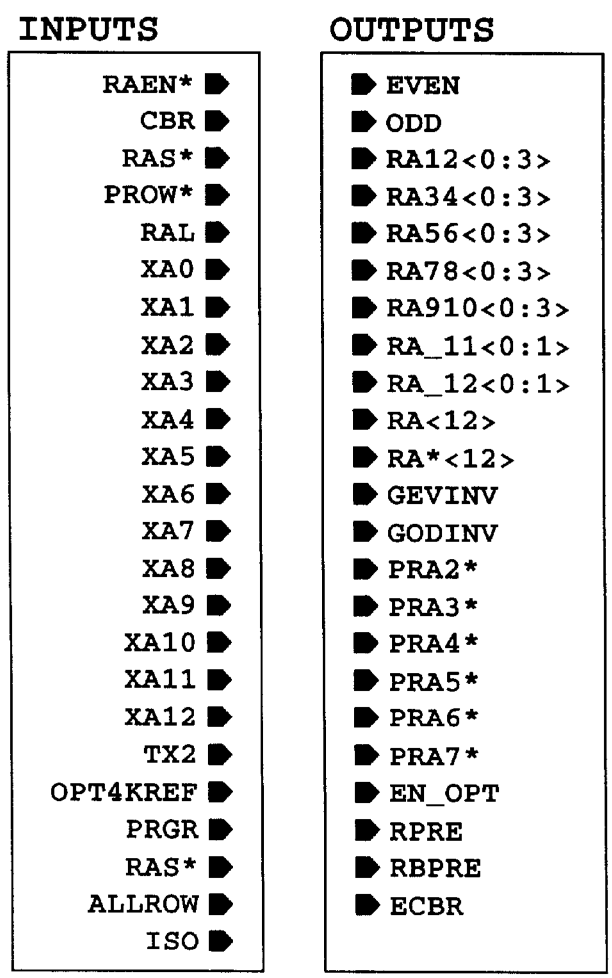
FIG. 70 identifies the inputs and outputs to row address buffer circuitry in the memory device of FIG. 2.
Figure 69:
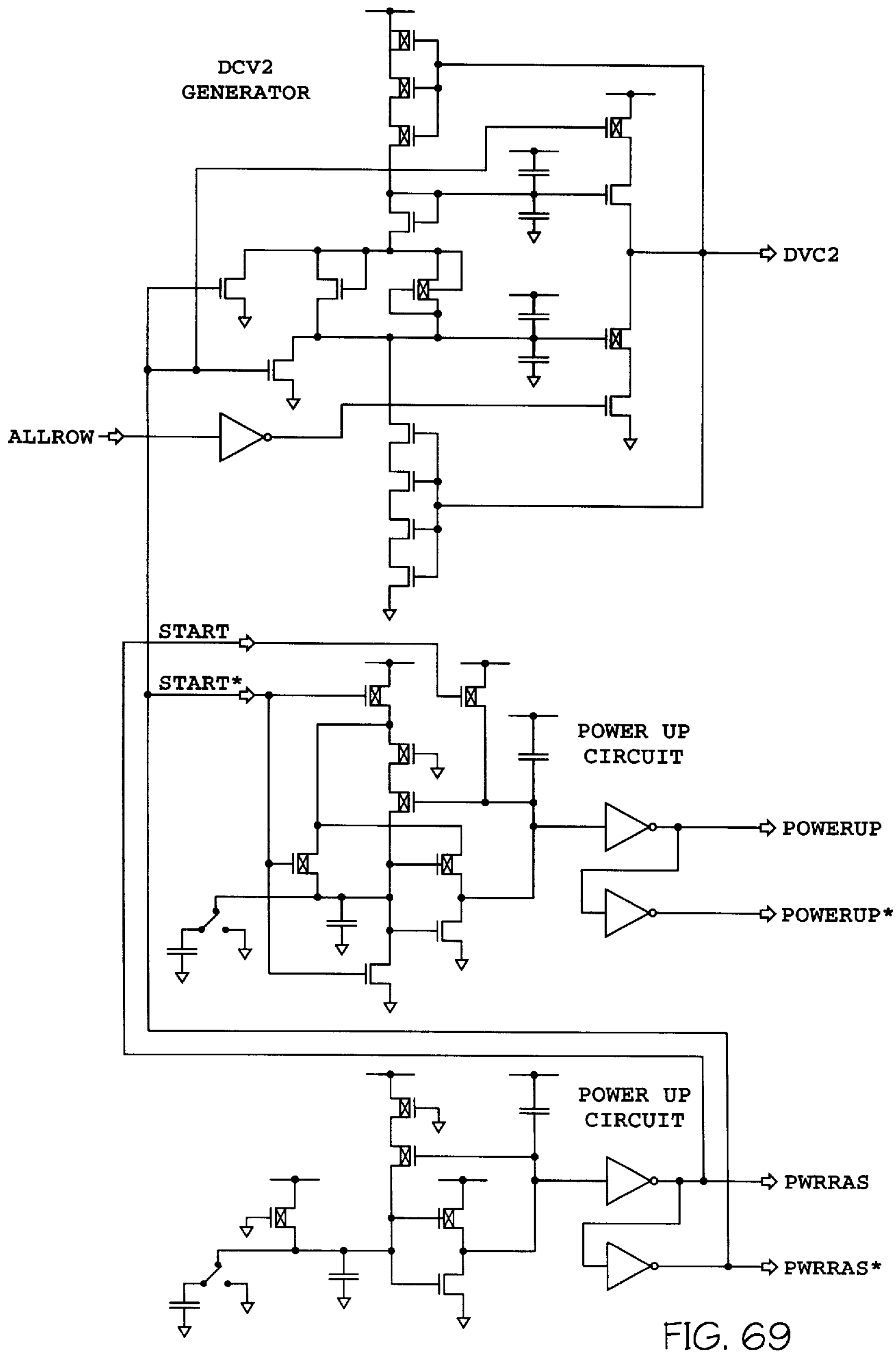
FIG. 69 is a schematic diagram of a DVC2 (one-half $V_{cc}$) supply voltage generator circuit in the memory device of FIG. 2.

In step 704, all address inputs are brought low, WE is brought low, and address pin A2 is brought high; this causes the backend repair programming logic shown in FIGS. 66 and 67 to assert the PRGR signal, which is applied to an electrical fuse select circuit 249 shown in FIG. 76. Electrical fuse select circuit 249 generates a fusebank select signal FBSEL to activate the row fusebank 250. Also in step 204, the selected fuse is programmed or blown by application of a programming voltage to address input A10. (As shown in FIGS. 66 and 67, the backend repair programming logic in device 10 functions to couple address input A10 to the CGND signal path of device 10 when device 10 is placed in program mode in step 700.)

To verify programming, in step 706 the resistance of the selected antifuse is measured by measuring the voltage on CGND/A10. As noted above, the blowing an antifuse causes the antifuse to act as a short circuit. As can be seen in FIGS. 76 and 77, each antifuse in device 10 (e.g., antifuses 257) is coupled between $V_{cc}$ and CGND. Thus, the voltage on CGND (as measured from address pin A10) will indicate whether the selected antifuse has been blown.

In decision block 708, it is determined whether the measured voltage reflected a properly blown antifuse. If not, the process is repeated starting at step 704. If so, programming is completed, and program mode may be exited. FIG. 216 shows the steps 712, 714, 716, 718, 720, and 722 involved in programming a column fusebank. The steps involved in programming a column fusebank are generally the same as those for programming a row fuse bank, except that in step 714, the row address is not necessary (although RAS must be brought low), and in step 716, address pin A3 is brought high instead of A2, to cause backend repair programming logic to assert PRGC instead of PRGR.

As described above, device 10 in accordance with the present invention is implemented such that if a redundant row or column that has been switched-in in place of a row or column that has been found to be defective is itself subsequently found to be defective, that redundant row or column can be cancelled, and another redundant row or column switched-in to replace the failed redundant row or column. FIG. 212 sets forth the steps which must be taken in the event that a row or column is found to be defective, in order to determine whether that defective row or column is a primary row or column or a redundant row or column.

In step 726, device 10 is put into the program mode, just as in steps 700 (FIG. 214) and 712 (FIG. 216). Steps 728 and 730 are then repeated as many times as necessary to find an unused redundant row in a given fusebank—in step 728, the fusebank is addressed (and PRGR is asserted by backend repair programming logic of FIGS. 66 and 67 to activate the fusebank, as described above with reference to step 704 in FIG. 214), while in step 730, the antifuse resistance is measured (via address pin A11) to determine whether the fuse has been blown.

Once an unused fusebank is found via steps 726 through 730, in step 732 the address of the unused fusebank is latched. This is accomplished as follows: while address pin A2 is held high (this is what causes PRGR to be asserted by backend repair programming logic of FIGS. 66 and 67), address pin A0 is held high (causing backend repair programming logic to assert PRGCANR as well). Assertion of both PRGR and PRGCANR causes backend repair programming logic to assert the signal FAL, as shown in FIG. 65.

As shown in FIG. 76, the signal FAL is applied to the inputs of a latch comprising NAND gates 734 and 736. The latch comprising gates 734 and 736 functions to latch the output of NAND gate 738 upon assertion of FAL. As shown in FIG. 76, the output of NAND gate 738 goes low whenever the fusebank in which it is located is accessed. Thus, if a fusebank is being addressed when FAL is asserted, the output of NAND gate 734 will be latched high (i.e., that fusebanks address is latched). This also results in one input of a NOR gate 741 being latched low.

The next step 742 shown in FIG. 212 is to attempt an access to a row previously known to be defective, so that it can be determined whether that row is a primary row or a redundant row. This is accomplished by addressing the row in a conventional manner. As described above, if the defective row is a redundant row, this will cause the RBmPHn output from some redundant fusebank (e.g., row electrical fusebank circuit 250). This; in turn leads to the assertion of a signal MATOUT. See, for example, FIGS. 81 and 82, which show that for row fusebanks, the MATOUT signal reflects the ORing, in OR gates 744, of the RBmPHn outputs from each row fusebank. Thus, if a match occurs in any fuse match circuit in a fusebank, the MATOUT signal from that fusebank will be asserted. From FIGS. 83 and 84, it can be seen that the MATOUT signals from all fusebanks are combined to generate an MCHK* signal, where MCHK* is asserted (low) whenever a match occurs in the fusebank. As shown in FIG. 76, the MCHK* signal is applied to another input of NOR gate 741, in each fusebank. (NOR gates 741 in each fusebank also receive the PRGCANR input signal, which is only asserted during row redundancy cancellation programming.)

Although MCHK* and PRGCANR will be low in every fusebank circuit in device 10 when a match occurs in response to a given address, only in the fusebank found to be available in steps 728 and 730 in FIG. 212 will the output of NAND gate 736 also be low, as a result of latching that fusebank's address in the latch formed by NAND gates 736 and 738.

As a result of this condition, if a match occurs in any fusebank in response to the address applied in step 742 of FIG. 212, the output of NOR gate 741 in the fusebank found to be available in steps 728 and 730 will go high, turning on transistors 744 and 746 and effectively establishing a short across antifuse 748 in that fusebank, which antifuse is known from steps 728 and 730 to be unblown. Thus, after applying the address of a known bad row in step 742, the resistance of antifuse 748 in the available row electrical fusebank 250 can be measured to determine whether the known bad row was a primary row or a redundant row. Measuring the resistance of antifuse 748 is represented by step 820 in FIG. 212.

If the resistance measurement of antifuse 748 in step 820 shows that antifuse 748 has been shorted out (by transistors 744 and 746), this indicates that the known bad row whose address was applied in step 742 was a redundant row, necessitating, as shown in step 822, the cancellation of that bad redundant row and replacement thereof with another redundant row. On the other hand, if the resistance measurement of antifuse 748 in step 820 shows an open circuit, this means that the known bad row was a primary row, not a redundant row (step 824 in FIG. 212). Thus, no cancellation is requred. The last step in the process illustrated in FIG. 212 is to exit the program mode of device 10.

Figure 106:
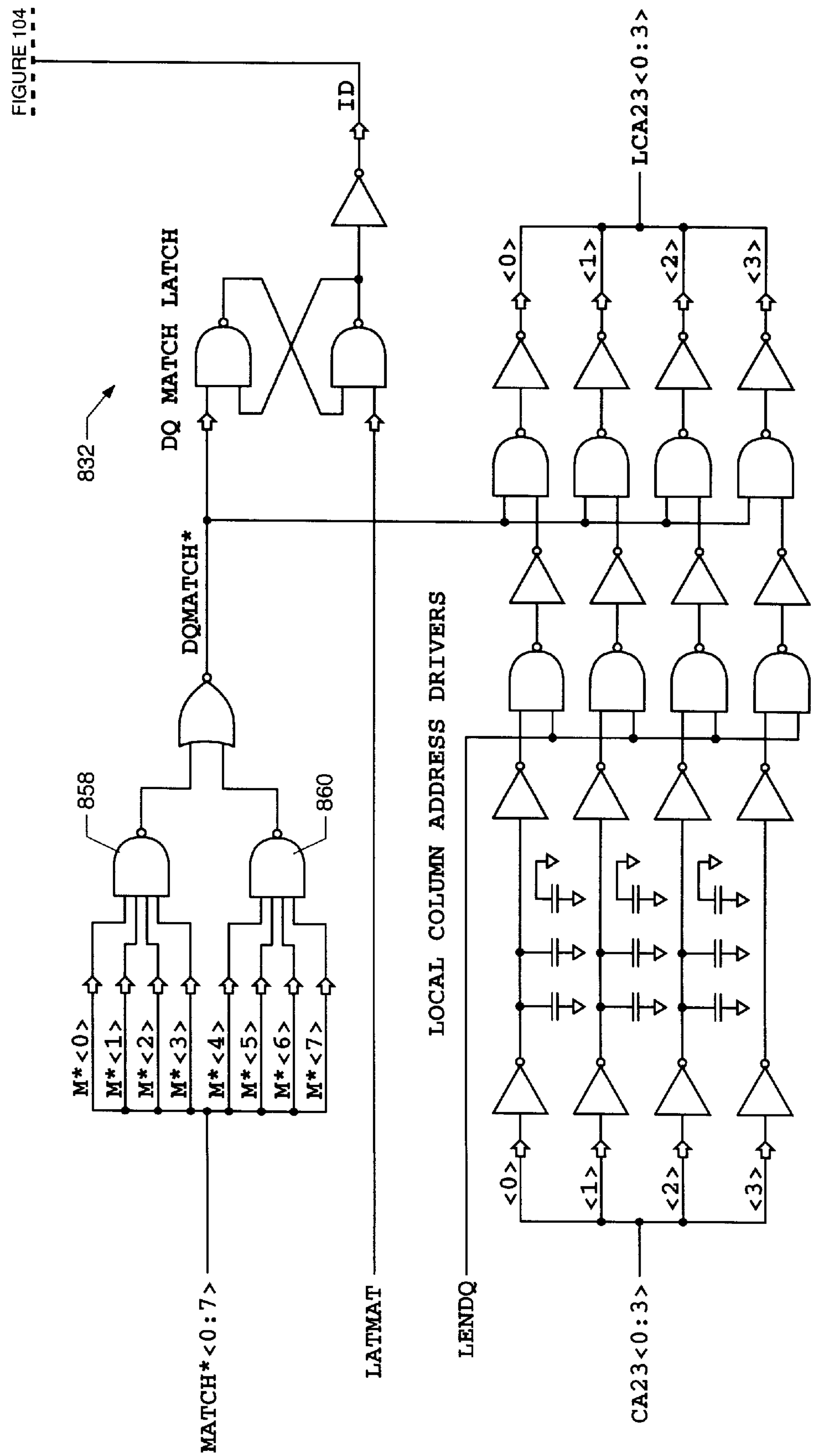
FIG. 106 is a schematic diagram of a local column address driver circuit in the memory device of FIG. 2.
Figure 107:
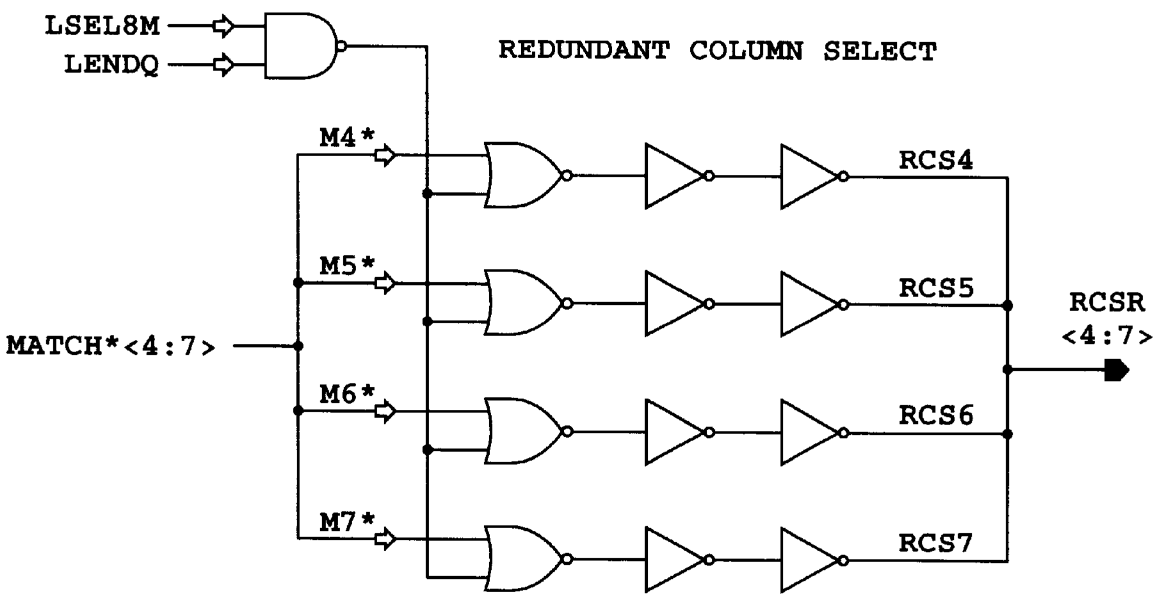
FIG. 107 is a schematic diagram of a redundant column select circuit in the memory device of FIG. 2.
Figure 108:
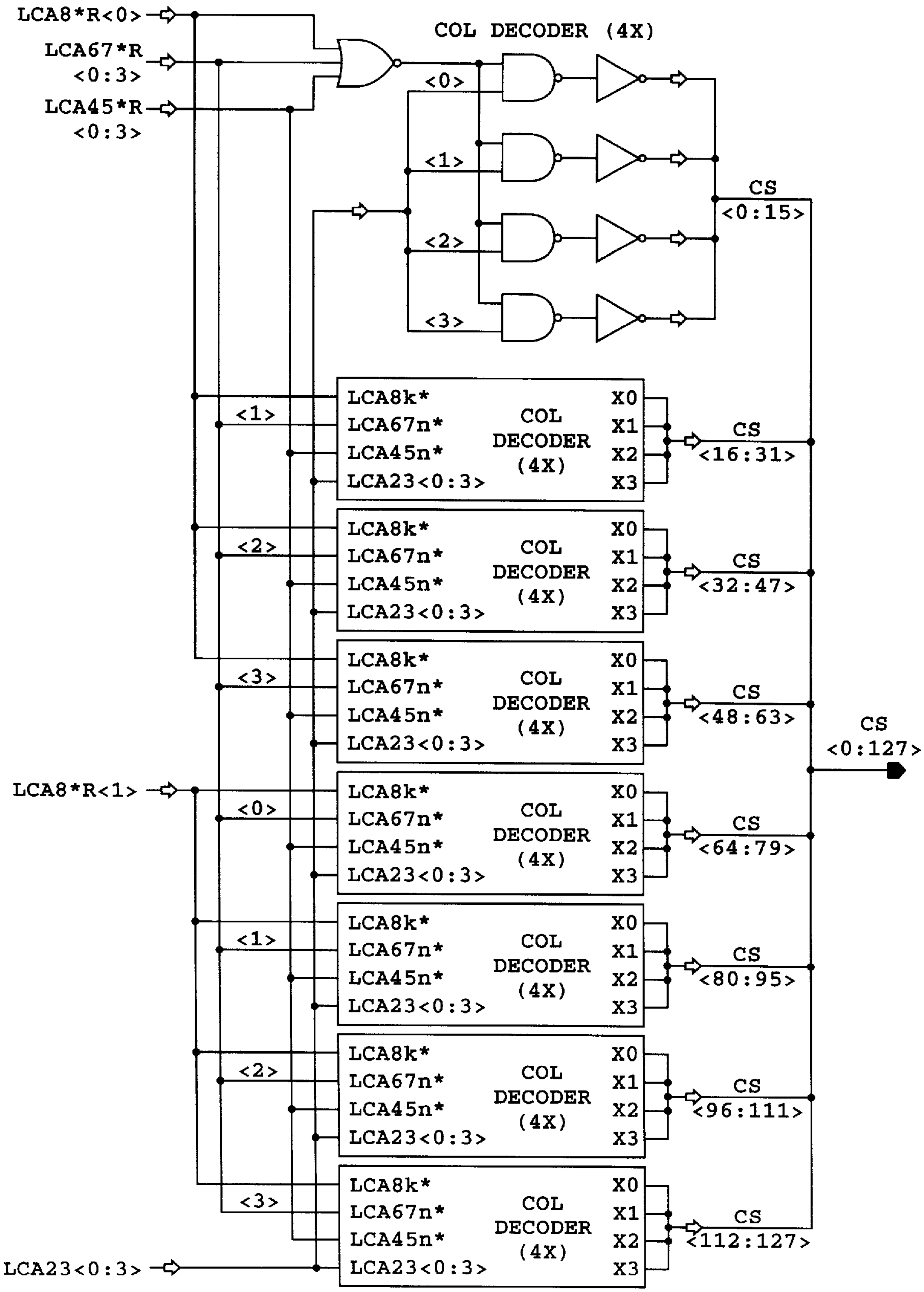
FIG. 108 is a schematic/block diagram of a column decoder circuit in the memory device of FIG. 2.
Figure 109:
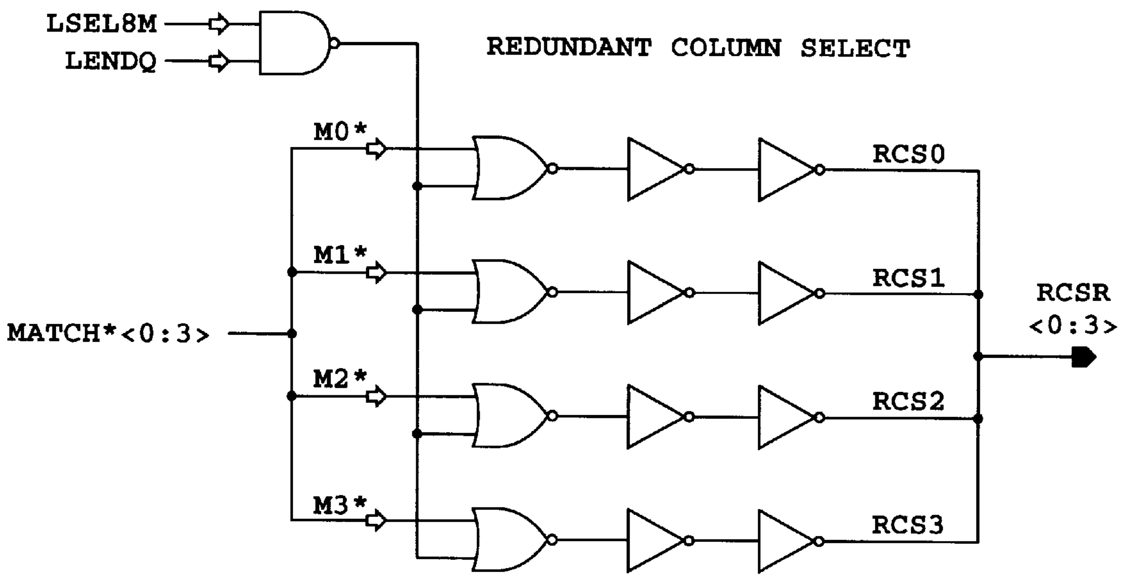
FIG. 109 is a schematic diagram of a redundant column select circuit in the memory device of FIG. 2.

Turning now to FIG. 215, there is provided a flow diagram illustrating the steps to be performed to determine the need for cancellation of a failed redundant column in device 10. The first step 828 in the process depicted in FIG. 215 is to enter the redundancy cancel program mode, which is accomplished by bringing address pin A11 to a supervoltage while keeping WE high and bringing RAS and CAS low. Then, address pin A11 is brought low and RAS and CAS are brought high. This causes assertion of the signal LATMAT by backend repair programming logic shown in FIG. 66. As shown in FIG. 106, the LATMAT signal is applied to an enable input of a DQ match latch 832.

Column decoding circuitry shown generally in FIGS. 99 through 109 operates in a manner generally analogous to row decoding circuitry described above to generate local column address (LCA) signals from which column select (CSL) and redundant column select RCSL) signals are derived. In addition, local row addresses (LRAs) are applied to inputs of laser column fusebank circuitry 844 shown in FIG. 110, and to electrical column fusebank circuitry 846 shown in FIG. 112. In the presently preferred embodiment of the invention, device 10 includes seven laser-programmable redundant columns and one electrically programmable redundant column for each DQ section 20 of device 10.

The operation of column laser fuse bank 844 and electrical laser fuse bank 846 is closely analogous to that of row laser and electrical fusebanks 250. For example, referring to FIG. 110, it can be seen that each column laser fusebank 844 includes a column laser fuse enable circuit 848 which, like row laser fuse enable circuit 261 in FIG. 76, includes a laser fuse 850 in FIG. 110) that must be blown to enable that fusebank 844. Likewise, each laser fusebank 844 includes an electrical fuse cancel circuit 852 for allowing cancellation of a redundant column which is found to be bad after being switched-in in place of a bad primary column.

Each column redundancy fusebank (both laser 844 and electrical 846) also includes a plurality of redundant column match circuits 854 which assert (low) m* signals in response to application of a unique address corresponding to a primary column which has been replaced with a redundant column, these column match circuits 854 being analogous in operation and design to the row redundancy match arrays 255 previously described with reference to FIGS. 77.

Column electrical fusebank circuit 846 in device 10 likewise includes a plurality of redundant column match circuits 854. In each column laser fusebank 844, if the m* outputs from each match array 854 is asserted (low) in response to a given predecoded column address, that fusebank asserts (low) a MATCH* output signal, the outputs from each group of seven column laser fusebanks 844 associated with a DQ section 20 being designated MATCH*0 through MATCH*6. Similarly, if each match array 854 in column electrical fusebank 854 asserts (low) its m* output indicating a match to a given column address, fusebank 846 asserts its MATCH*7 output signal.

Figures 112, 112A:
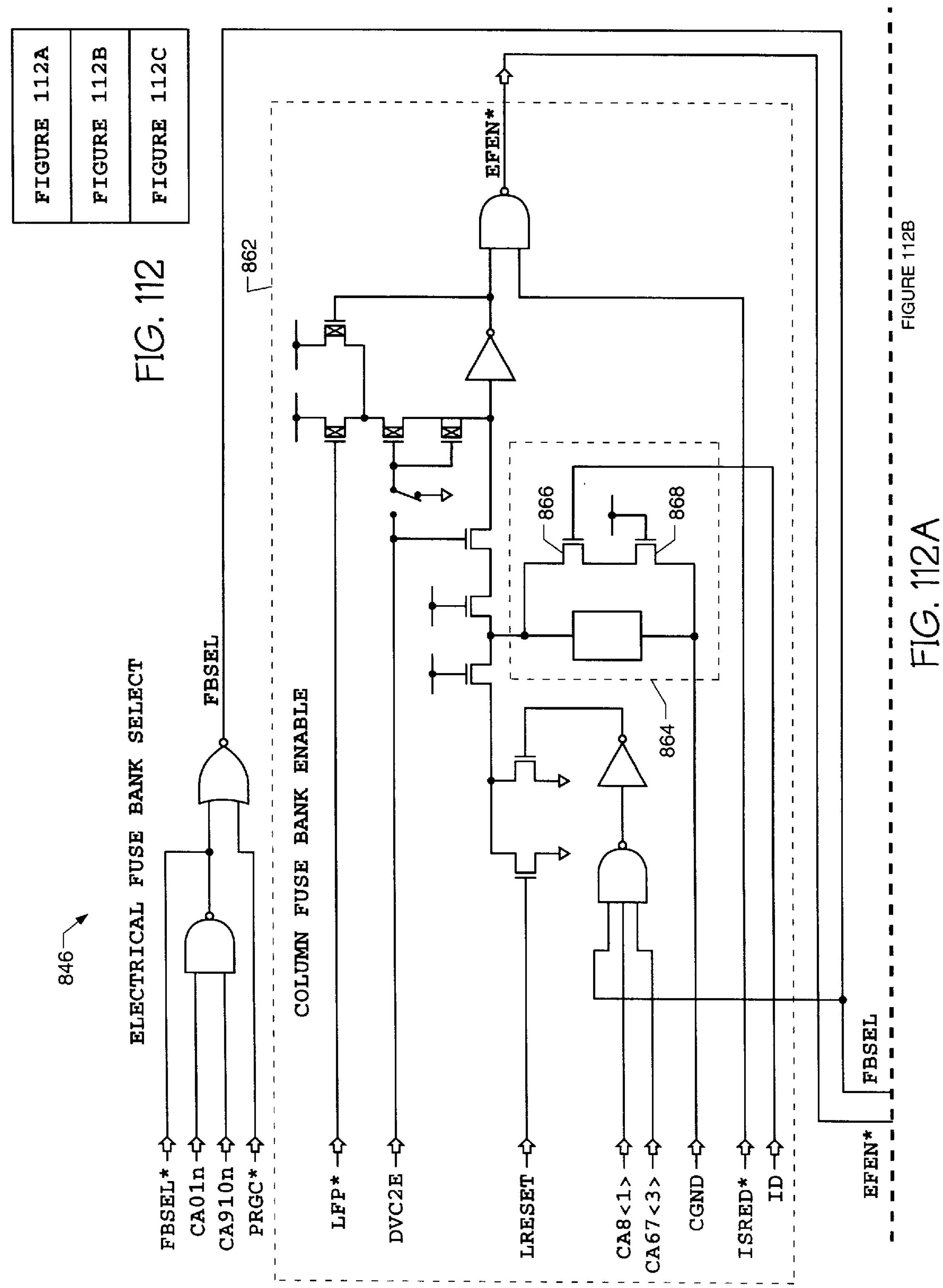
FIGS. 112A–112C are schematic/block diagram of a redundant column electrical fusebank circuit in the memory device of FIG. 2.
Figure 112B:
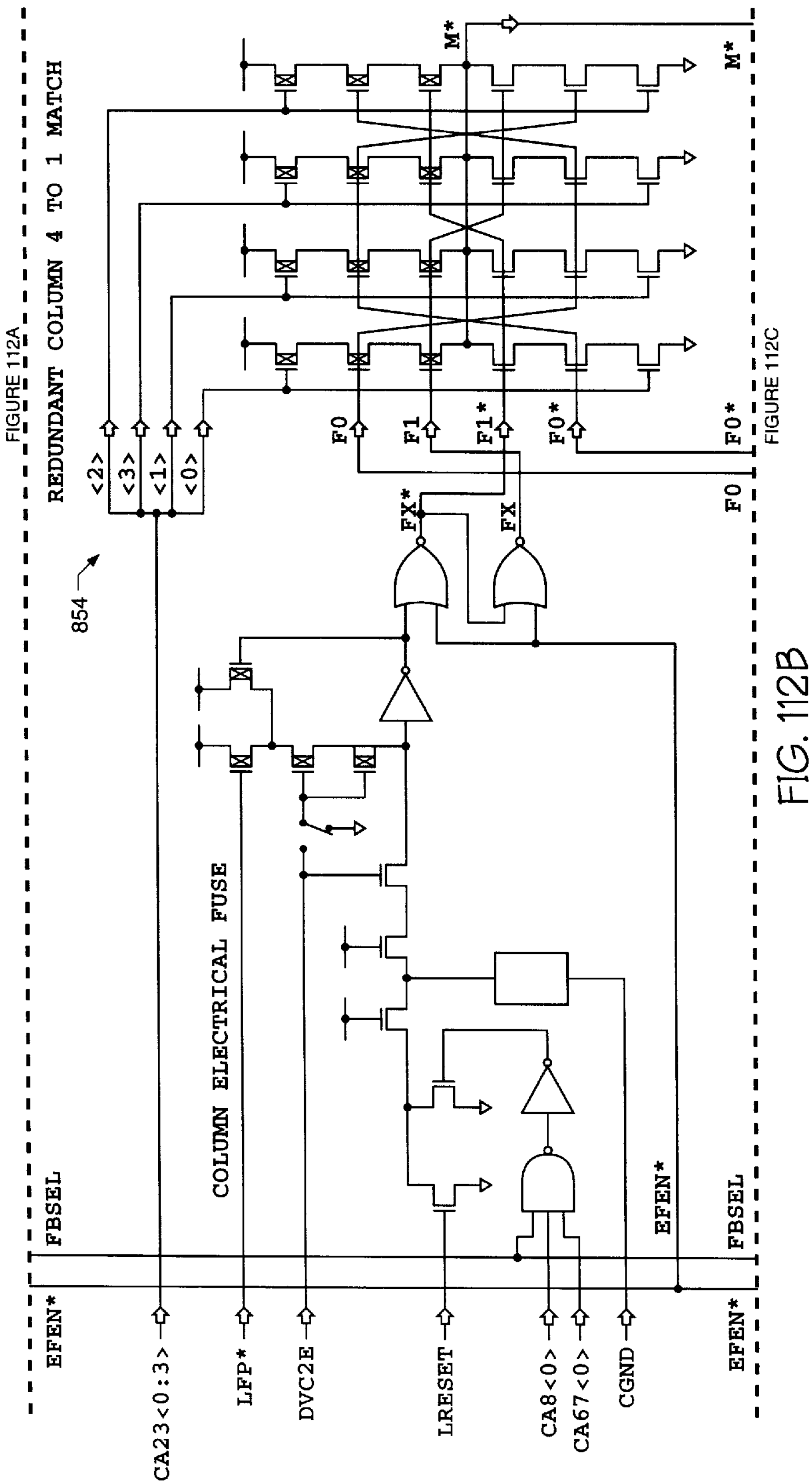
Figure 112C:
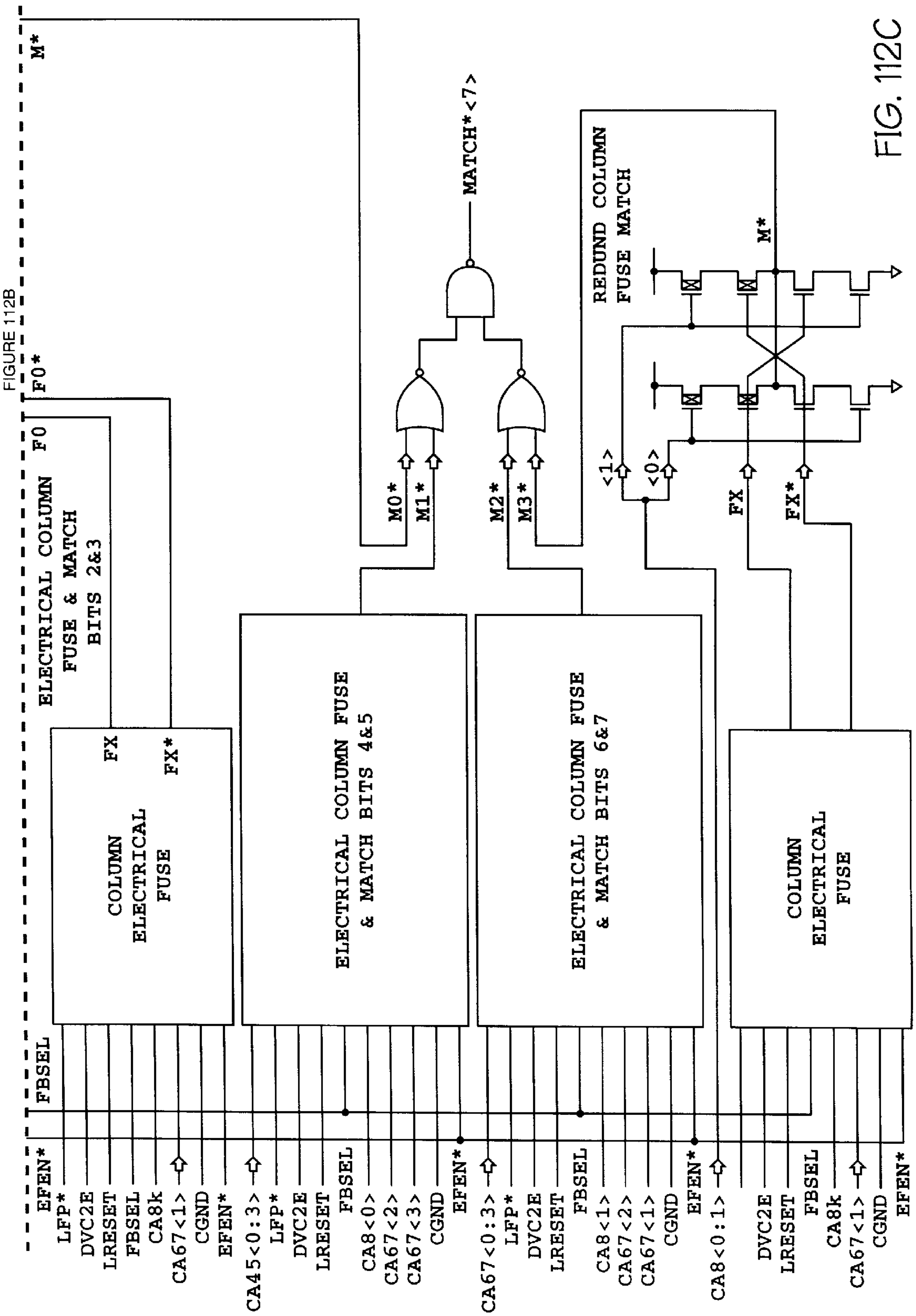
Figure 113A:
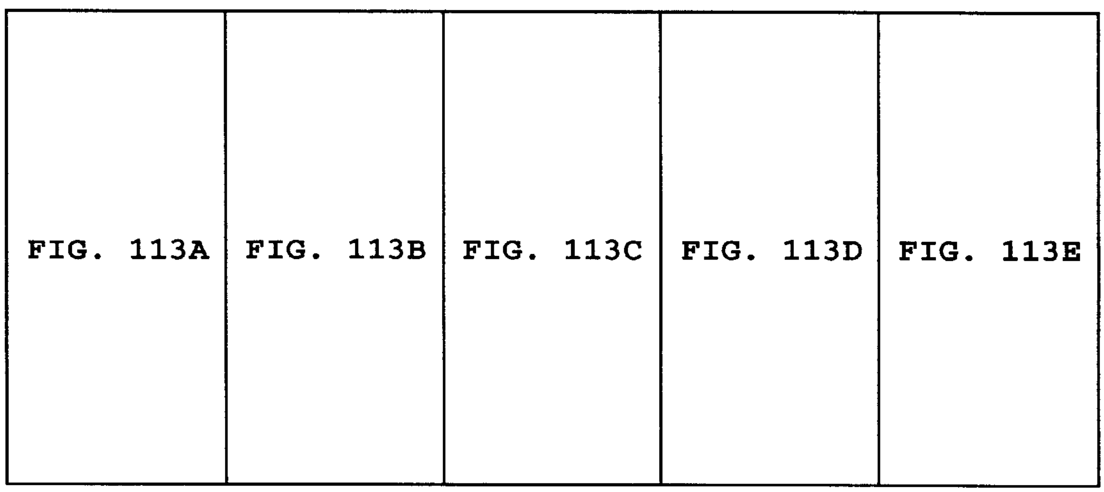
FIGS. 113A–113E are schematic/block diagram of column decoder and column input/output (column DQ) circuitry in the memory device of FIG. 2.
Figure 113A:
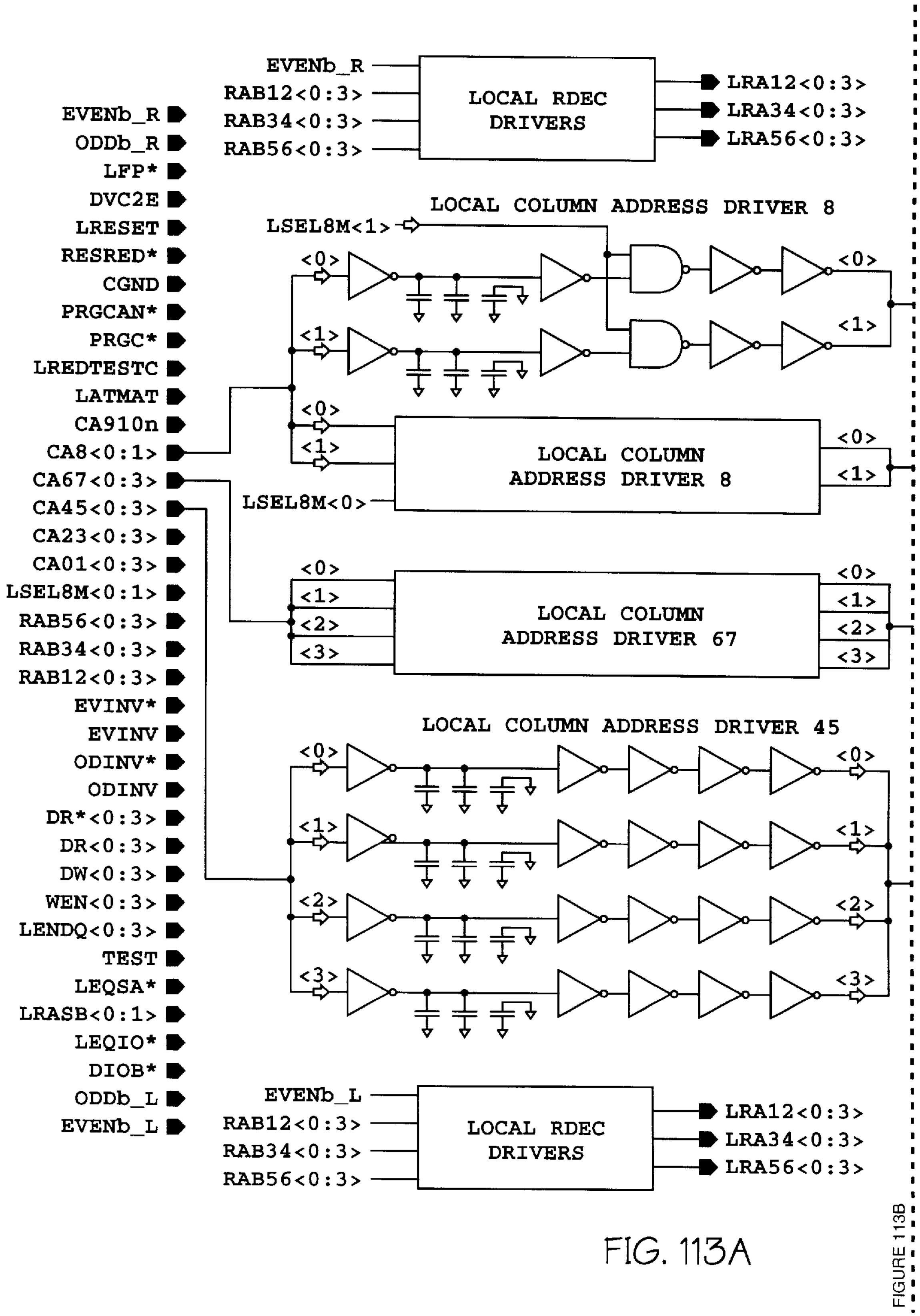
Figure 113B:
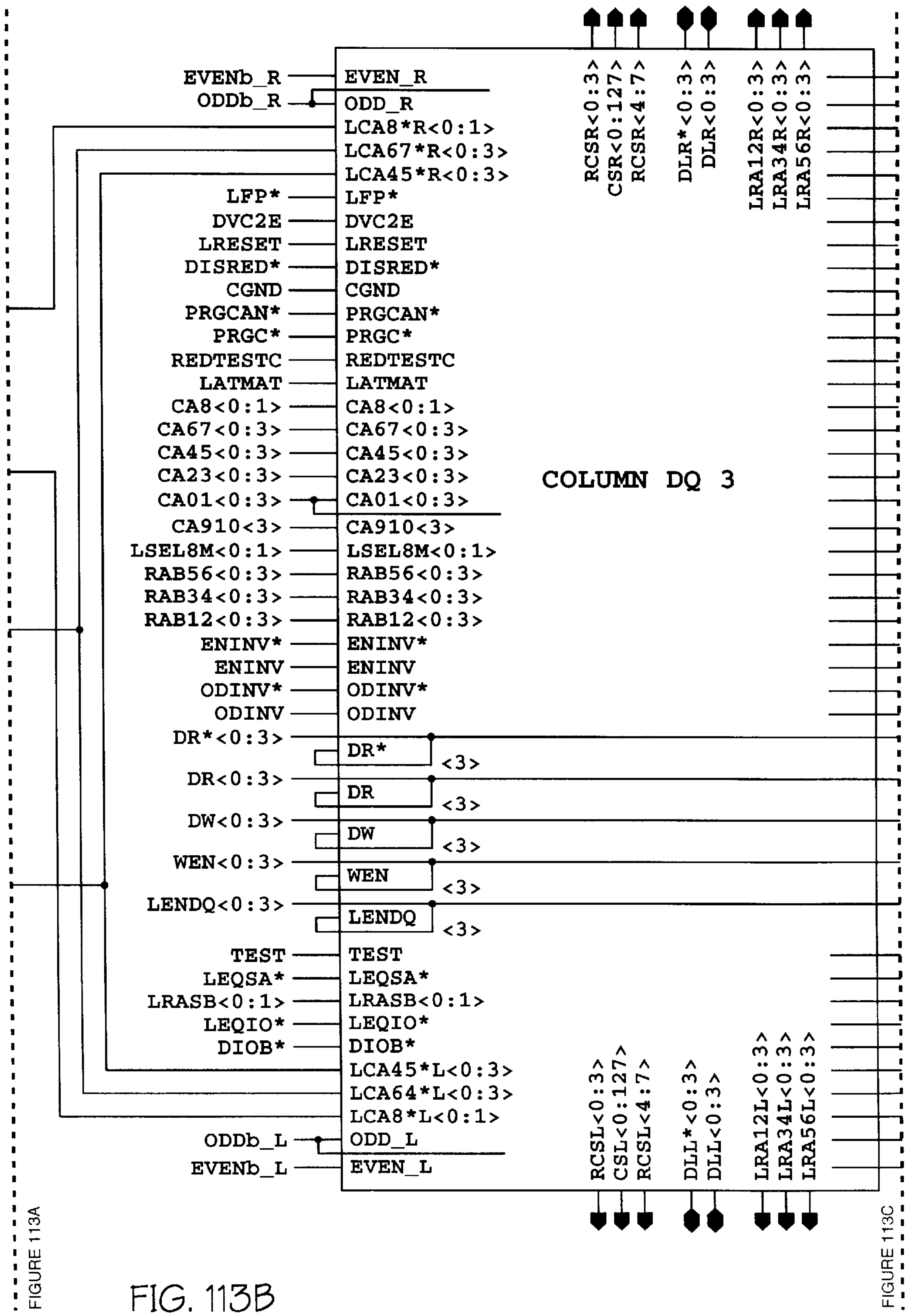
Figure 113C:
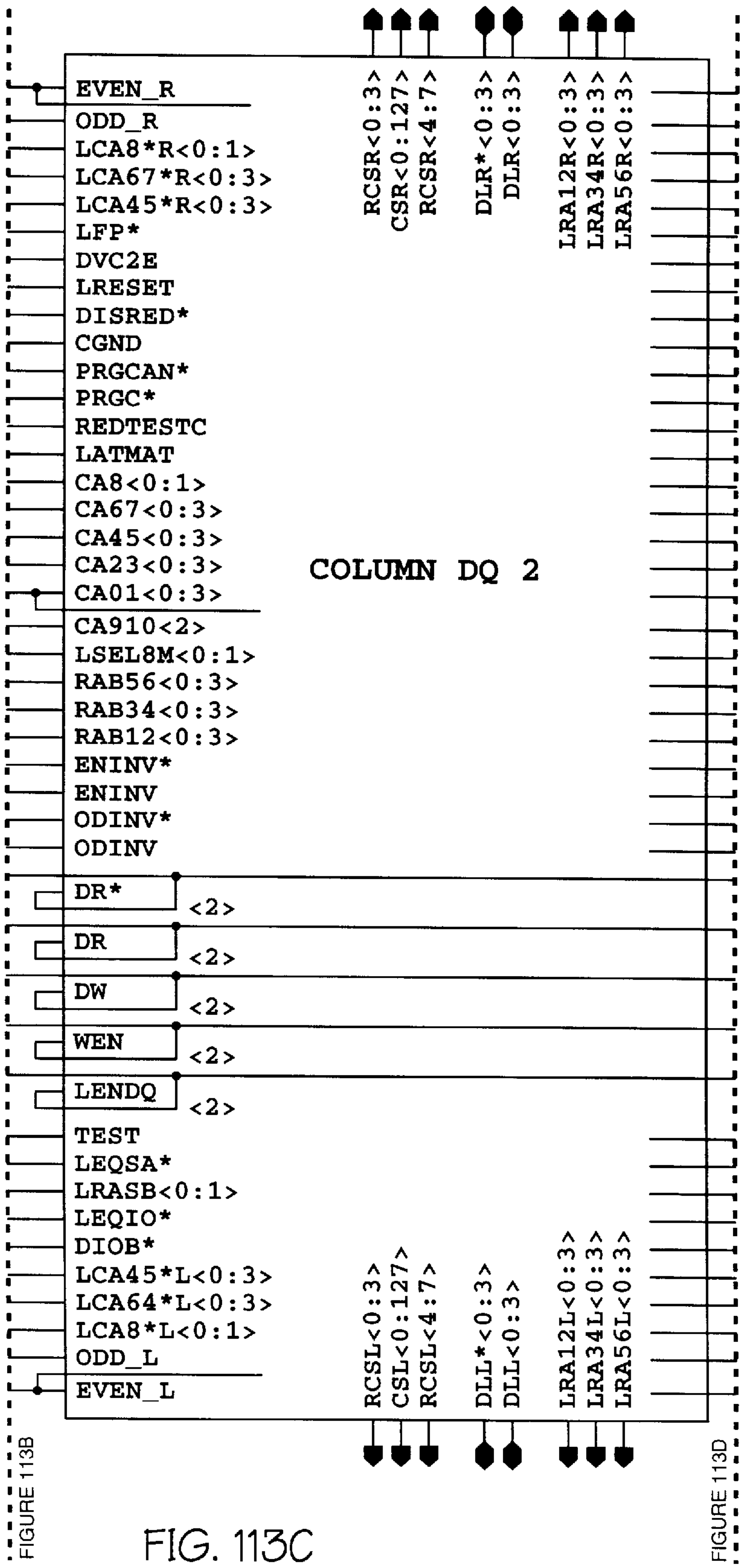
Figure 113D:
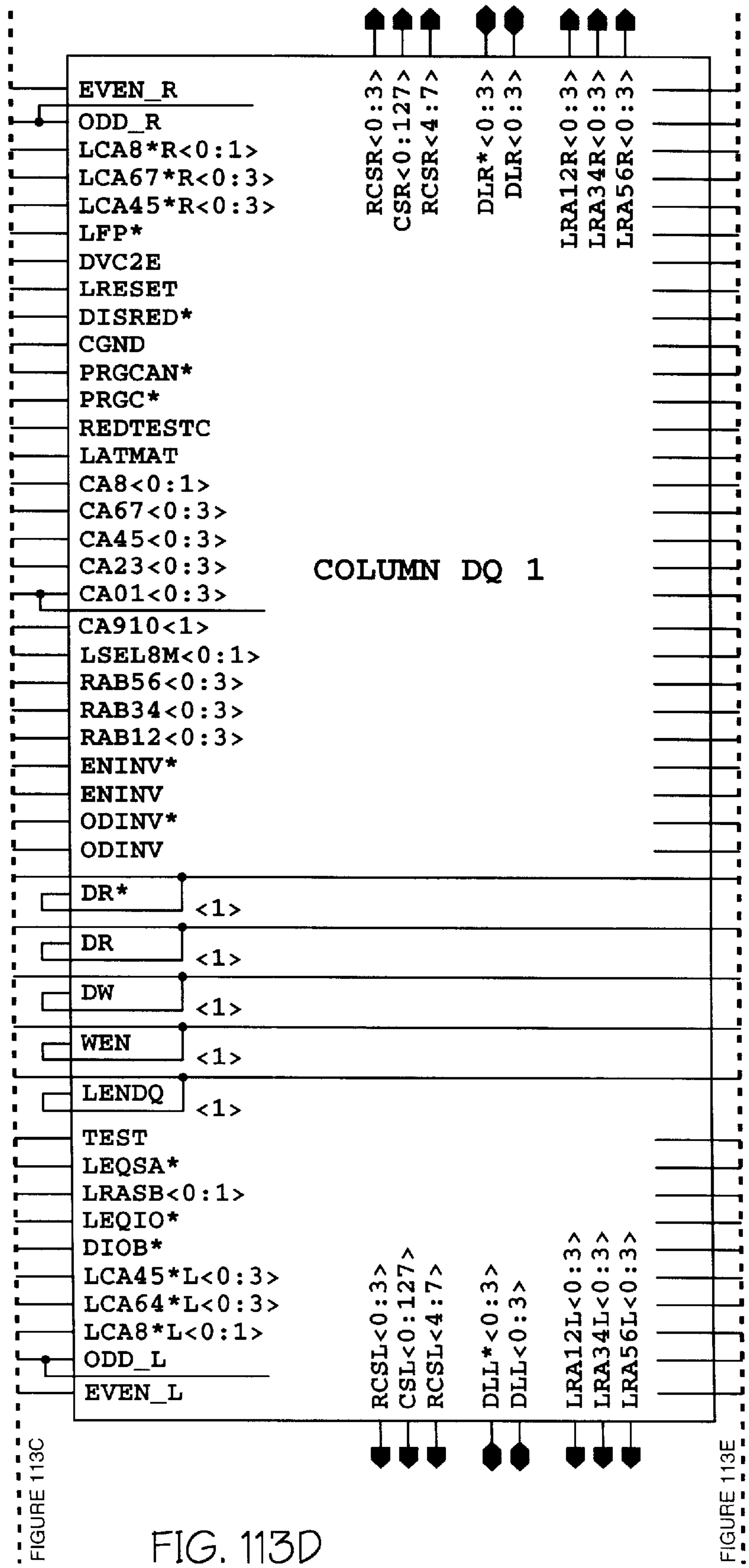
Figure 113E:
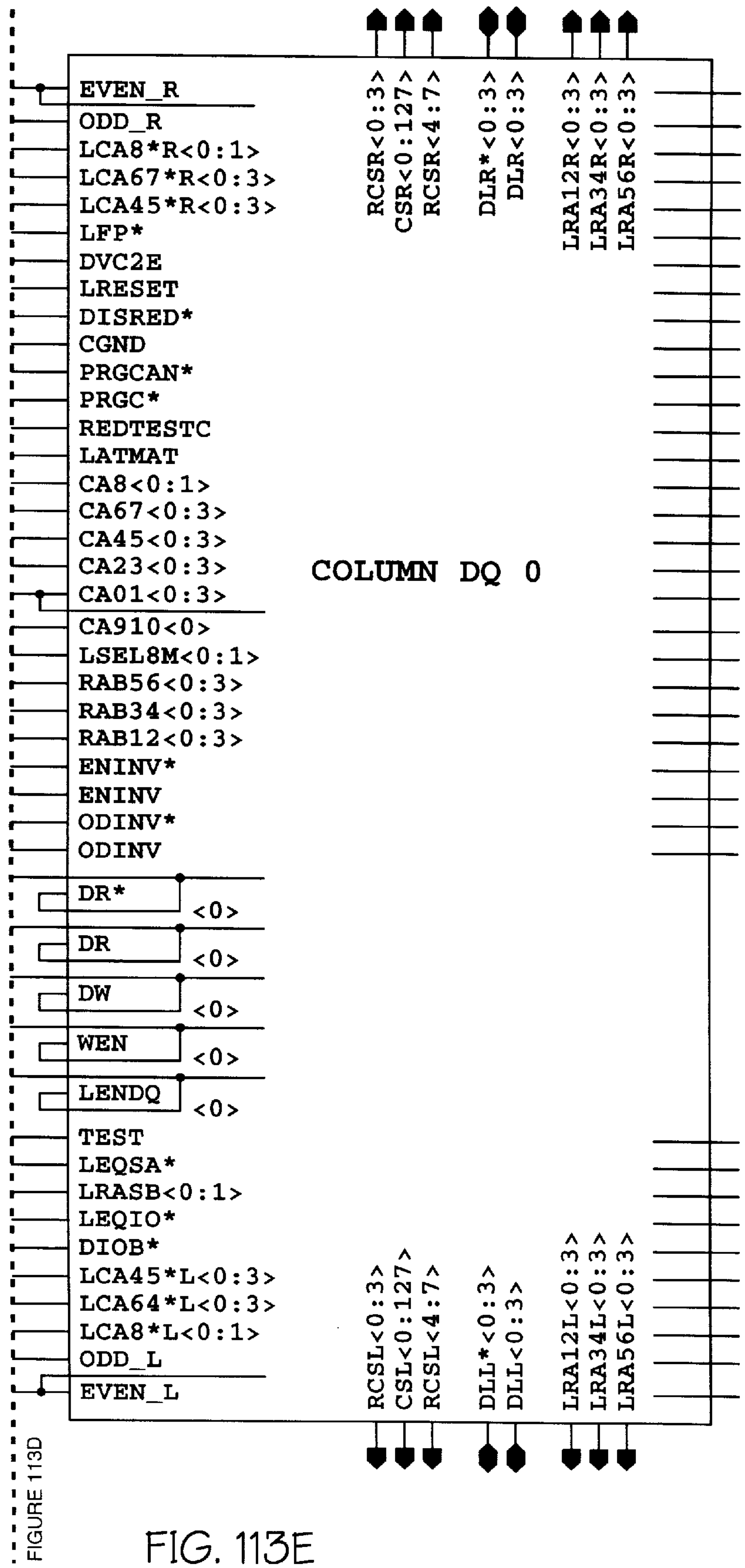
Figure 114:
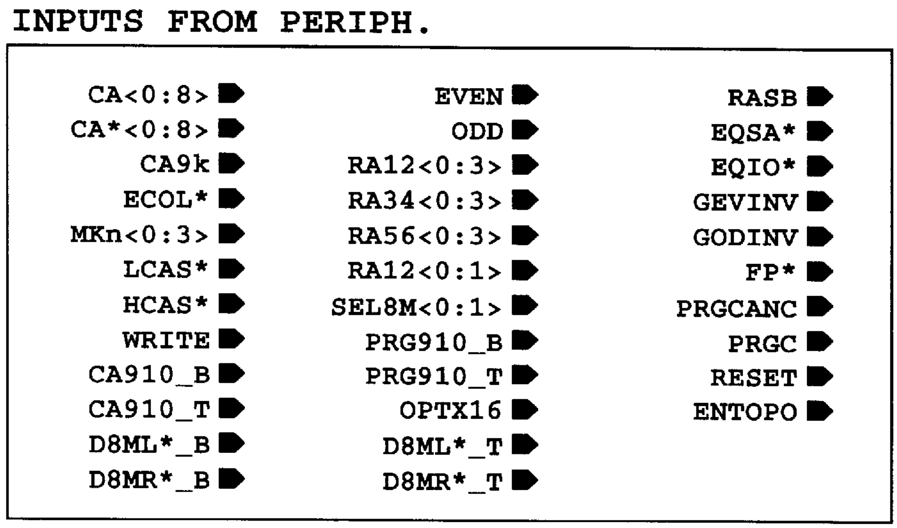
FIG. 114 identifies the signal names of input signals to peripheral logic gap circuitry in the memory device of FIG. 2.
Figure 115:
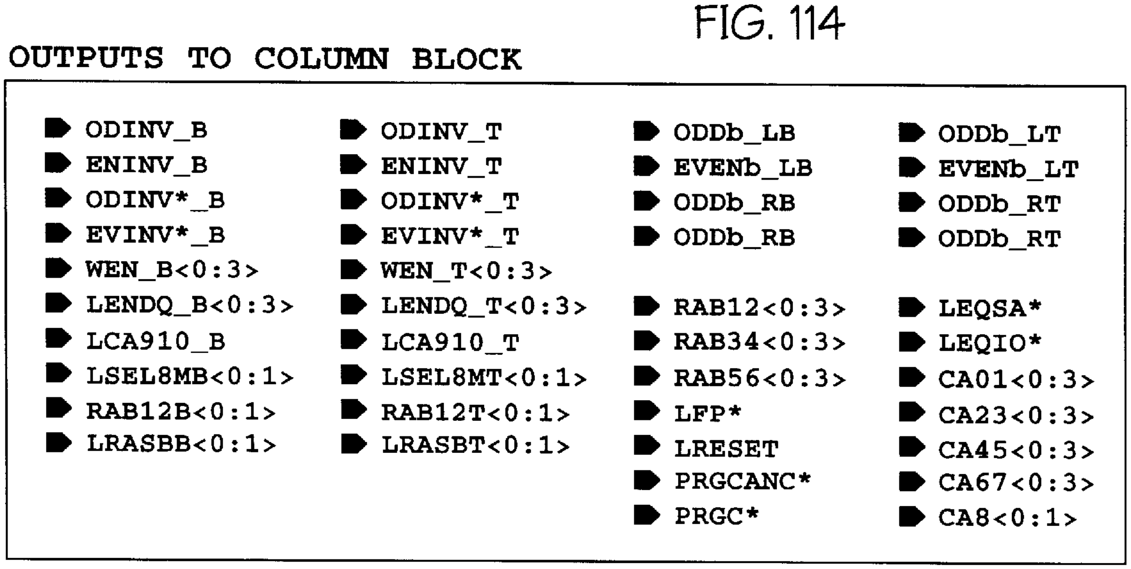
FIG. 115 identifies the signal names of output signals to column block circuitry from peripheral logic gap circuitry in the memory device of FIG. 2.
Figure 116:
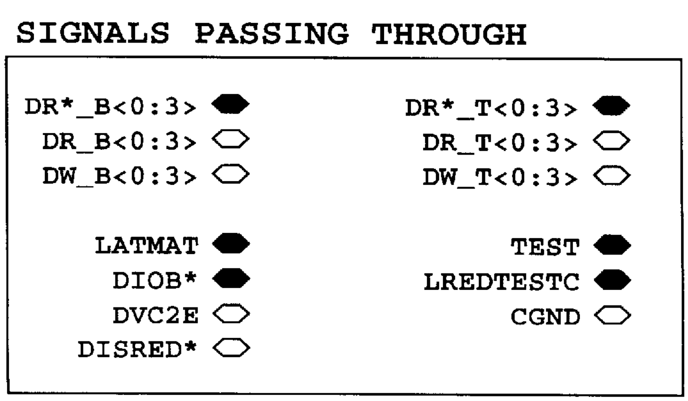
FIG. 116 identifies the signal names of signals which pass through peripheral logic gap circuitry in the memory device of FIG. 2.
Figure 117:
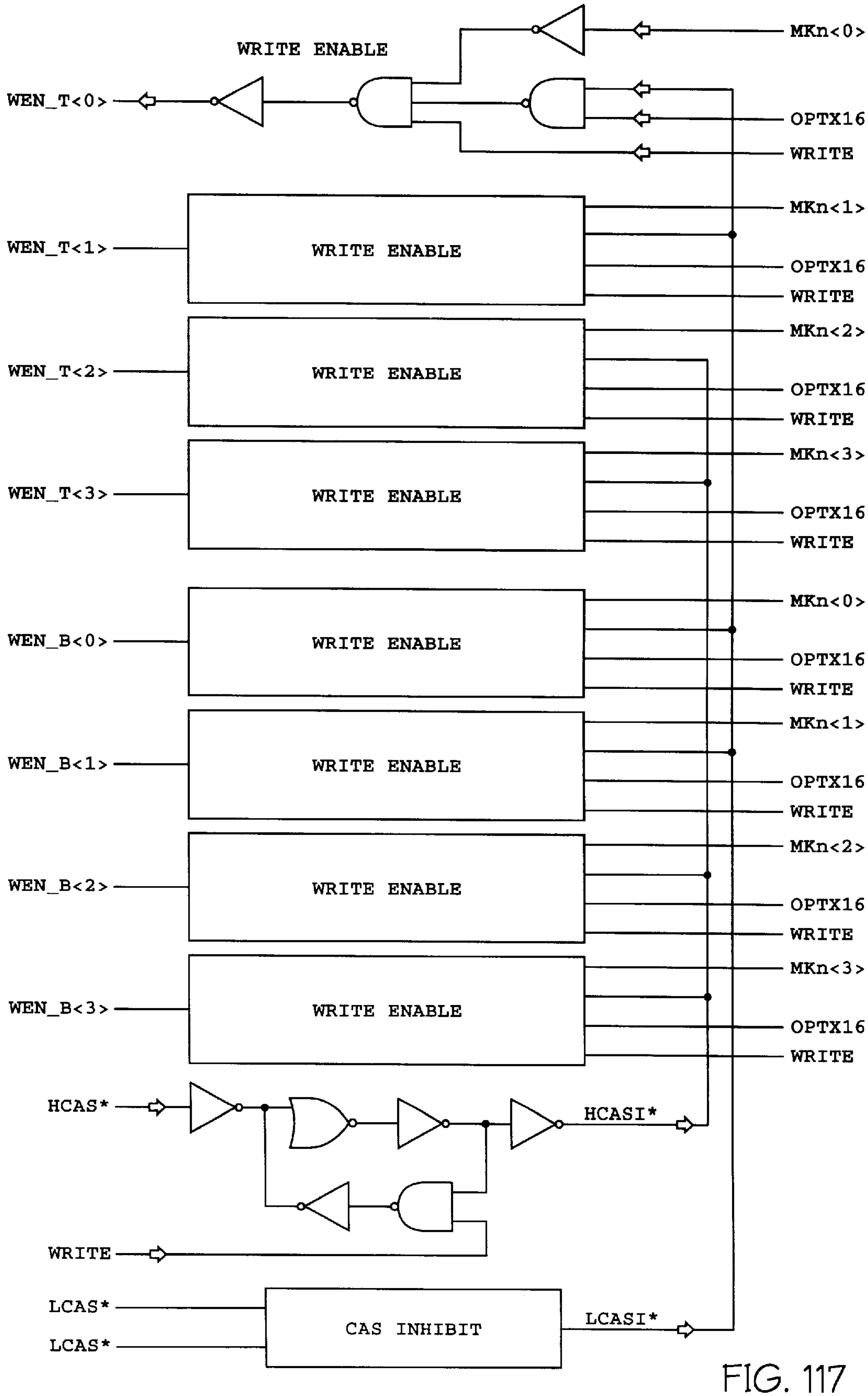
FIG. 117 is a schematic/block diagram of write enable and CAS inhibit circuitry in the memory device of FIG. 2.
Figure 118:
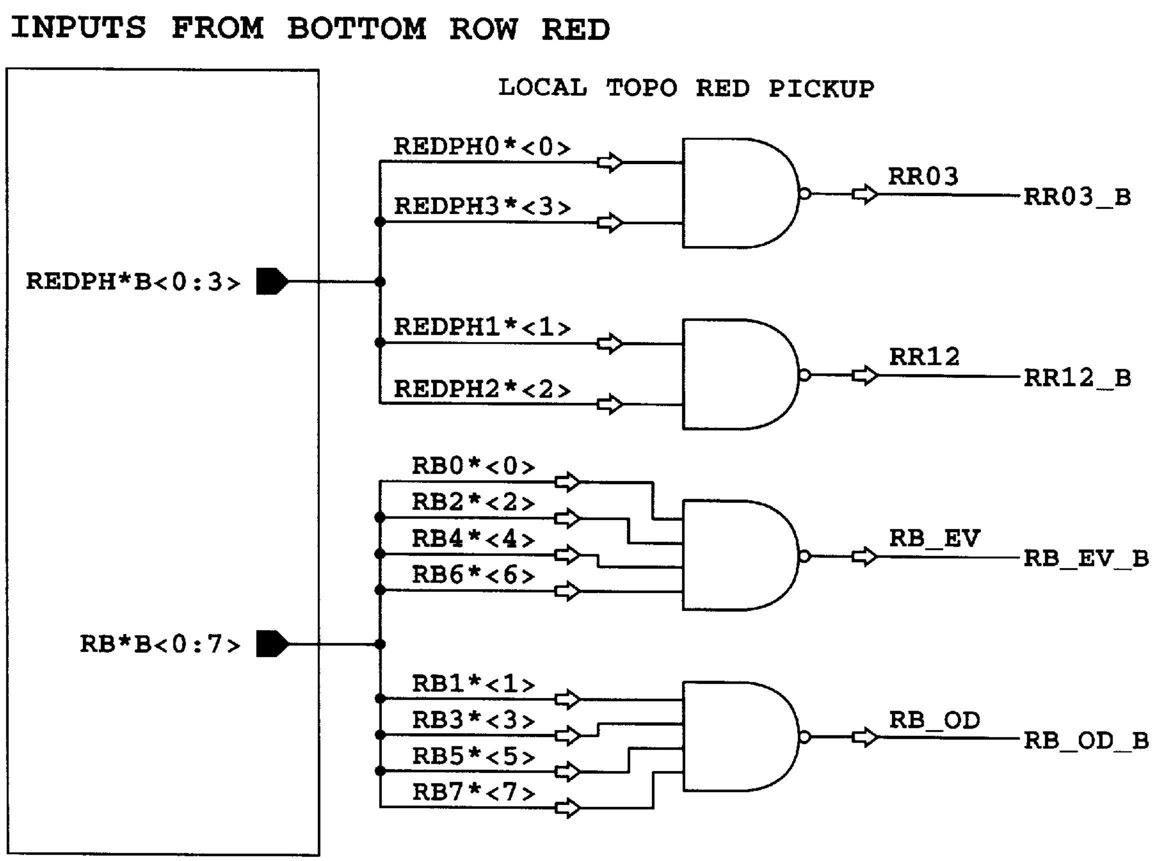
FIG. 118 is schematic/block diagram of local topology redundancy pickup circuitry in the memory device of FIG. 2.

The MATCH*<0:7> signals from column electrical and laser fusebanks 846 and 844 are applied to the inputs of a pair of NAND gates 858 and 860 shown in FIG. 106, such that a signald DQMATCH* is derived if a redundancy match occurs in response to an applied column address. Recall from FIG. 215 that the signal LATMAT is asserted during step 830 when the address of a known bad column is applied to device 10. Thus, in step 834, if the known bad column is a redundant column, in step 834 the DQMATCH* signal in the local column address driver circuitry of FIG. 106 will be asserted. When this occurs, the assertion of the DQMATCH* signal will be latched in latch 832, as a result of the LATMAT signal being asserted. As shown in FIG. 106, latching the DQMATCH* leads to assertion (low) of an ID signal which is provided as an input to the column fuse block circuit of FIG. 104 (which represents the combination of column electrical fusebank 846 and column laser fusebank 844). As shown in FIG. 112, the ID signal of latch 832 is applied as an input to a column fusebank enable circuit 862 which includes a fusebank enable antifuse 864 that must be blown to enable electrical fusebank 846. In particular, the ID signal is applied to the gate of one of two transistors 866 and 868 that are coupled in parallel with fusebank enable antifuse 864. With this arrangement, a redundancy hit during step 834 of FIG. 215 will result in transistor 866 being turned on, thereby shorting antifuse 864.

The next step 836 in the procedure of FIG. 215 is to address the electrical fusebank (whose address is as set forth in the table of Figure _____) and measure its resistance; if a short is measured, this indicates that transistor 866 is turned on and thus that the known bad column whose address was applied during step 830 was a redundant column which must be cancelled. If an open circuit is measured, this indicates that the known bad column was a primary column, and no redundancy cancellation is necessary.

Turning now to FIG. 213, a flow diagram is provided illustrating the steps to be taken in order to cancel a row redundancy fusebank. The first step 870 is to enter the program mode by applying a supervoltage to address pin A11 while keeping WE high and bringing RAS and CAS low, then bringing address pin A11 low and RAS and CAS high. In step 872, the address of a known bad row is applied to the address pins while RAS is brought low, and then the quadrant of the known bad row is identified with column address bits CA9 and CA10 while CAS is brought low. At this point, the LATMAT signal referred to above with reference to FIG. 215 will be asserted, as previously described.

In step 874 of FIG. 213, the fusebank is cancelled by bringing all address pins low, bringing WE low and address bit A0 high. This causes the backend repair programming logic of FIGS. 66 and 67 to assert the PRGCANR (cancel redundancy programming) signal which is applied to the electrical fuse cancel circuit of each row electrical fusebank 250E (see FIG. 76). The PRGCANR signal, in combination with the match signal that will be as asserted only in the fusebank 250E associated with the known bad redundant row, function to turn on transistor 279. At this point, a programming voltage is applied to address input A10 (CGND), blowing cancel redundancy fuse 271. (The blowing of cancel fuse 271 is made possible because transistor 279 being turned on provides a path between fuse 271 and ground.)

Next, in step 876, the resistance of fuse 271 is measured to verify cancellation. If an open circuit is detected, steps 874 and 876 must be repeated. Otherwise, cancellation is successful (step 878).

In FIG. 217, the steps to be performed to cancel a column redundancy fusebank are illustrated. The first step 880 is to enter the programming mode of device 10, by bringing address pin A11 to a supervoltage and keeping RAS, CAS, and WE high, as before. Next, in step 882, the address of the redundant column to be cancelled is applied to the address pins. In step 884, the column is cancelled, by bringing all addresses low, then bringing WE low and A1 high; this causes the backend repair programming logic of FIGS. 66 and 67 to assert the PRGCANC signal.

Figures 110, 110A:
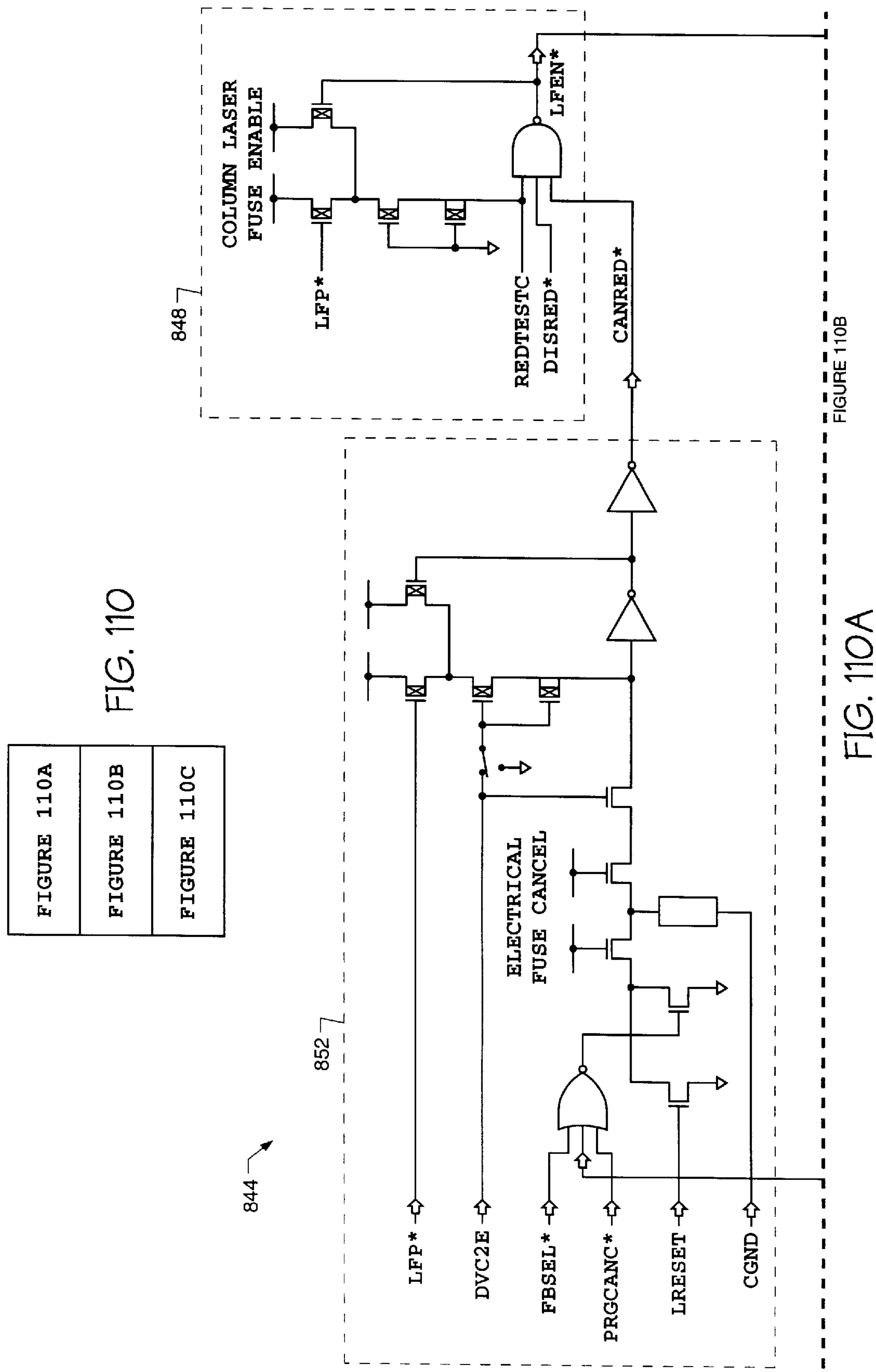
FIGS. 110A–110C are schematic/block diagram of a seven laser redundant column laser fuse bank circuit in the memory device of FIG. 2.
Figure 110B:
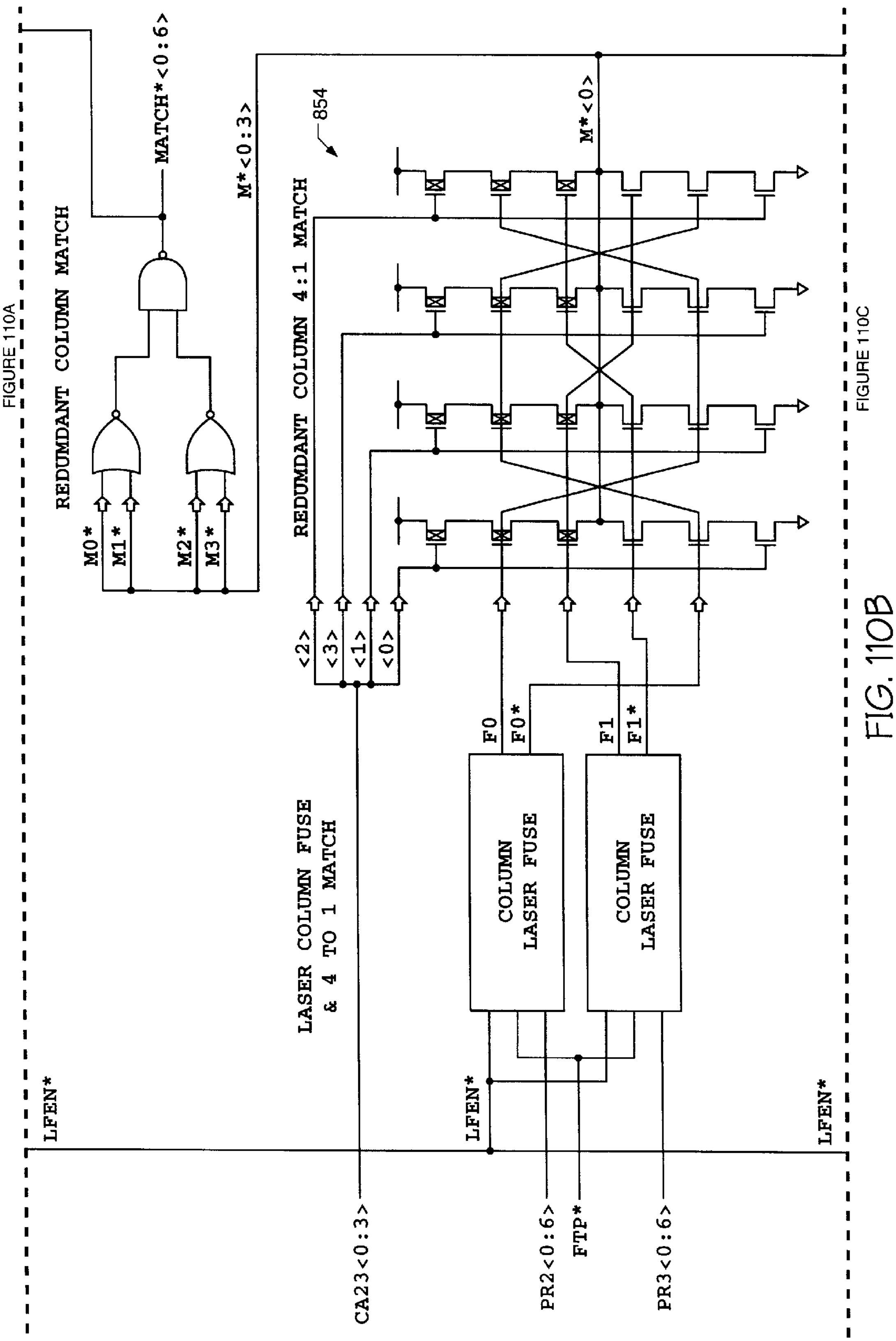
Figure 110C:
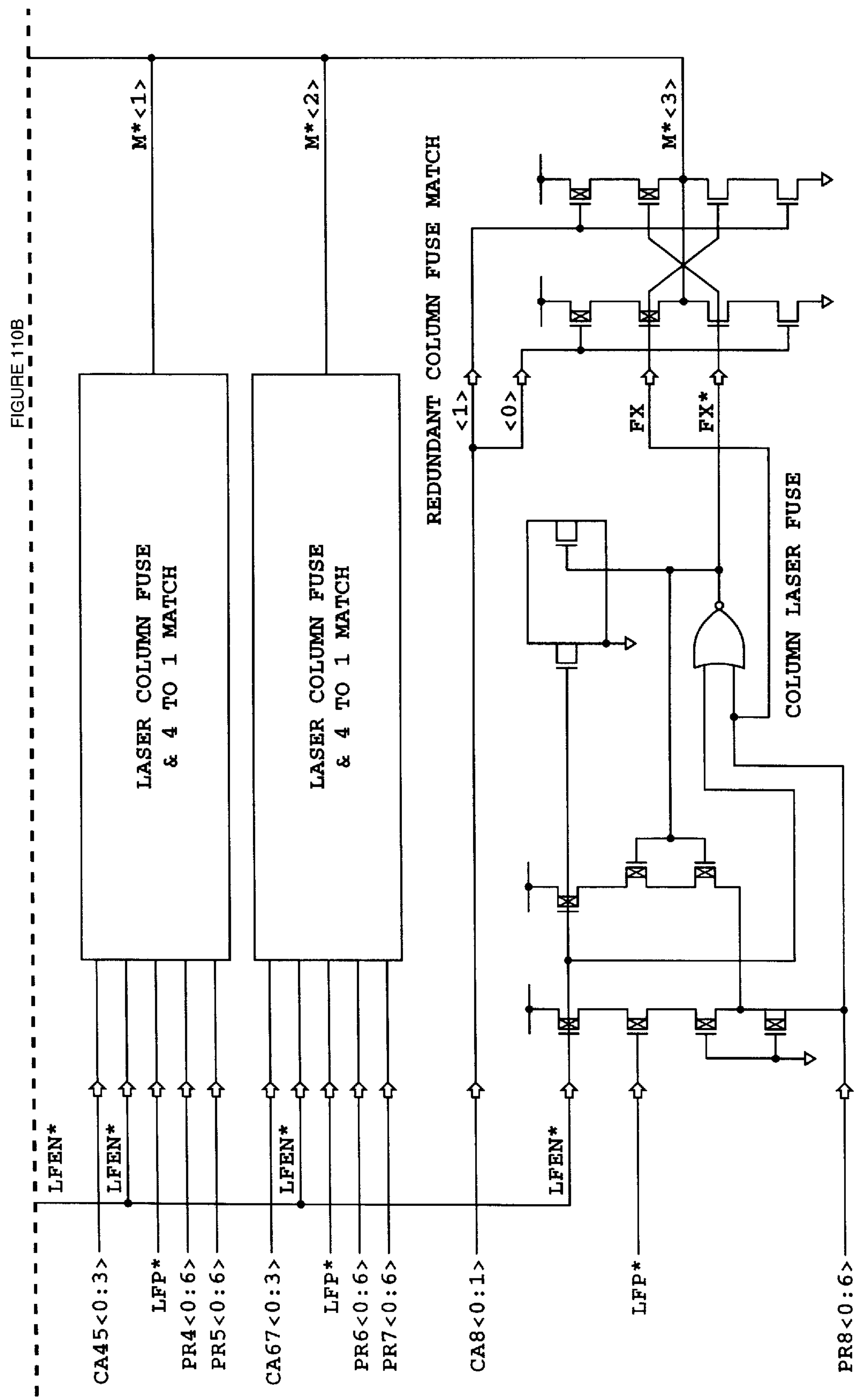
Figure 111:
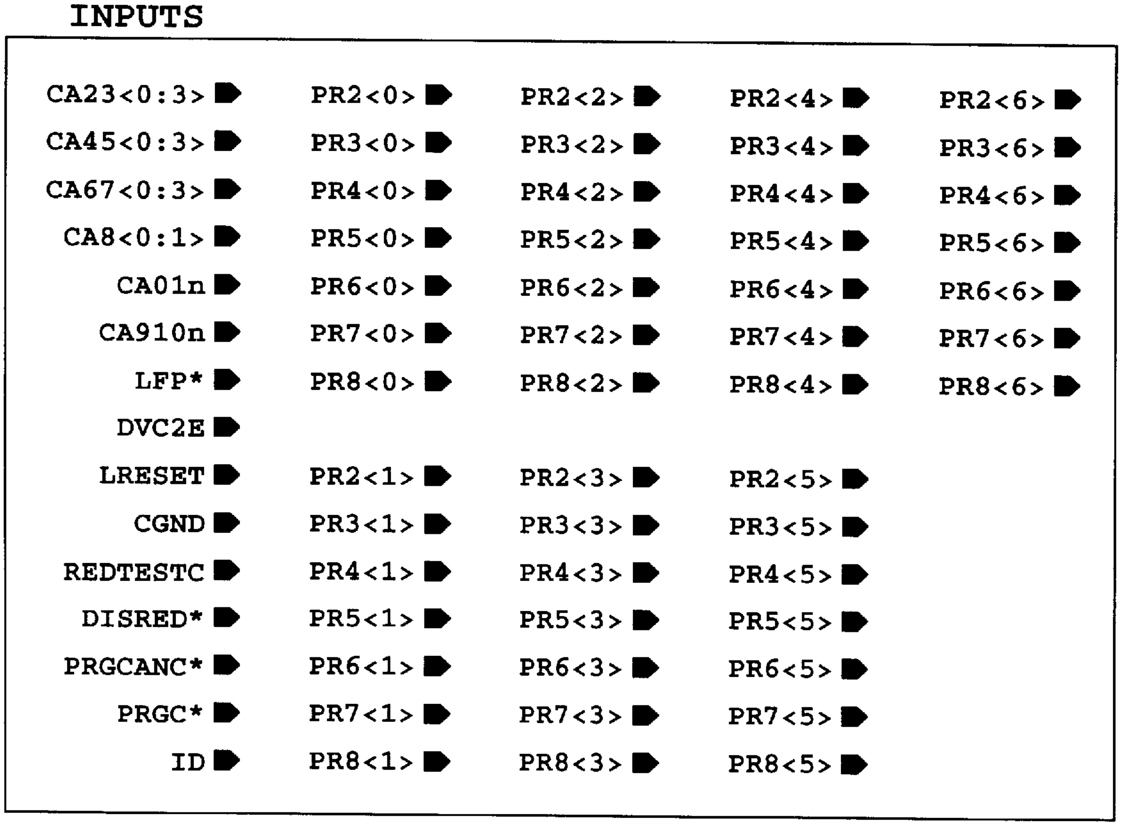
FIG. 111 identifies the signal names of inputs and outputs to redundant column fusebank circuitry in the memory device of FIG. 2.

As shown in the schematic diagram of laser fuse banks 844 in FIG. 110, the PRGCANC* (i.e., the complement of PRGCANC signal asserted in step 884 is applied to electrical fuse cancel circuit, where it is NORed with a fusebank select signal FBSEL*.

PARTIAL DISABLEMENT (94-0151)

In accordance with still another notable aspect of the present invention, each of the PABs 14 of integrated circuit memory device 10 can be independently tested to verify functionality. The increased testability of these devices provides for greater ease of isolating and solving manufacturing problems. Should a subarray of the integrated circuit be found to be inoperable, it is capable of being electrically isolated from the remaining circuitry so that it cannot interfere with the normal operation of the device. Defects such as power to ground shorts in a subarray, which would have previously been catastrophic, are electrically isolated allowing the remaining functional subarrays to be utilized either as a repaired device or as a memory device of lessor capacity. Integrated circuit repair which includes isolation of inoperative elements eliminates the current draw and other performance degradations that have previously been associated with integrated circuits that repair defects through the incorporation of redundant elements alone. Further, the manufacturing costs associated with the production of a new device of greater integration are recuperated sooner by utilizing partially good devices which would otherwise be discarded. For example, a 256 Mbit DRAM with eight subarray partitions could have a number of defective bits that would prevent repair of the device through conventional redundancy techniques. In observance of the teachings of this invention, die on a wafer with defective subarrays are isolated from functional subarrays, and memory devices of lower capacity are recovered for sale as such.

These lower capacity memory devices are useful in the production of memory modules specifically designed to make use of these devices. For example, a 4 Mbit×36 SIMM module which might otherwise be designed with two 4 Mbit×18 DRAMs of the 64 Mbit DRAM generation, are designed with three DRAMs where one or more of the DRAMs is manufactured in accordance with the present invention such as three each 4 megabit by 12 DRAMs. In this case each of the three DRAMs is of the 64 megabit generation, but each has only 48 megabits of functional memory cells. Memory devices of the type described in this specification can also be used in multichip modules, single-in-line packages, on motherboards, etc. It should be noted that this technique is not limited to memory devices such as DRAM, static random access memory (SRAM) and read only memory (ROM, PROM, EPROM, EEPROM, FLASH, etc.). For example, a 64 pin programmable logic array could take advantage of the disclosed invention to allow partial good die to be sold as 28, 32 or 48 pin logic devices by isolating defective circuitry on the die. As another example, microprocessors typically have certain portions of the die that utilize an array of elements such as RAM or ROM as well as a number of integrated discrete functional units. Microprocessors repaired in accordance with the teachings of this invention can be sold as microprocessors with less on board RAM or ROM, or as microprocessors with fewer integrated features. A further example is of an application specific integrated circuit (ASIC) with multiple circuits that perform independent functions such as an arithmetic unit, a timer, a memory controller, etc. It is possible to isolate defective circuits and obtain functional devices that have a subset of the possible features of a fully functional device.

Isolation of defective circuits may be accomplished through the use of laser fuses, electrical fuses, other non-volatile data storage elements, or the programming of control signals. Electrical fuses include circuits which are normally conductive and are programmably opened, and circuits which are normally open and are programmably closed such as anti-fuses.

One advantage of this invention is that it provides an integrated circuit that can be tested and repaired despite the presence of what would previously have been catastrophic defects. Another advantage of this invention is that it provides an integrated circuit that does not exhibit undesirable electrical characteristics due to the presence of defective elements. An additional advantage of the invention is an increase in the yield of integrated circuit devices since more types of device defects can be repaired. Still another advantage of the invention is that it provides an integrated circuit of decreased size by eliminating the requirement to include large arrays of redundant elements to achieve acceptable manufacturing yields of saleable devices.

As previously discussed, memory device 10 in accordance with the presently disclosed embodiment of the invention is partitioned into multiple subarrays (PABs) 14. Each of these subarrays 14 has primary power and control signals which can be electrically isolated from other circuitry on the device. Additionally, the device has test circuitry which is used to individually enable and disable each of the memory subarrays as needed to identify defective subarrays. The device also has programmable elements which allow for the electrical isolation of defective subarrays to be permanent at least with respect to the end user of the memory. After the device is manufactured, it is tested to verify functionality. If the device is nonfunctional, individual memory subarrays, or groups of subarrays may be electrically isolated from the remaining DRAM circuitry. Upon further test, it may be discovered that one or more memory subarrays are defective, and that these defects result in the overall non-functionality of the memory. The device is then programmed to isolate the known defective subarrays and their associated circuitry. The device's data path is also programmed in accordance with the desired device organization. Other minor array defects may be repaired through the use of redundant memory elements, as discussed above. The resulting DRAM will be one of several possible memory capacities dependent upon the granularity of the subarray divisions, and the number of defective subarrays. The configuration of the memory may be altered in accordance with the number of defective subarrays, and the ultimate intended use of the DRAM. For example, in a 256 megabit DRAM with eight input/output data lines (32 Mbit×8) and eight subarrays, an input/output may be dropped for each defective subarray. The remaining functional subarrays are internally routed to the appropriate input/output circuits on the DRAM to provide for a DRAM with an equivalent number of data words of lessor bits per word, such as a 32 megabit× 5, 6 or 7 DRAM. Alternately, row or column addresses can be eliminated to provide DRAMs with a lessor number of data words of full data width such as a 4, 8 or 16 megabit×8 DRAM.

FIG. 226 is an alternative block diagram representation of memory device 10 in accordance with the presently disclosed embodiment of the invention. As noted above with reference to FIG. 2, device 10 has eight memory subarrays 18 which are selectively coupled to global signals VCC 350, DVC2 352, GND 354 and VCCP 356. DVC2 is a voltage source having a potential of approximately one half of VCC, and is often used to bias capacitor plates of the storage cells. VCCP is a voltage source greater than one threshold voltage above VCC, and is often used as a source for the word line drivers. Coupling is accomplished via eight isolation circuits 358, one for each subarray 18. A control circuit 360, in addition to generating standard DRAM timing, interface and control functions, generates eight test signals 362, eight laser fuse repair signals 364 and eight electrical fuse repair signals 366. One each of the test and repair signals are combined in each one of eight logic gates 368 to generate a "DISABLE*" active low isolation control signal 370 for each of the isolation circuits 70 which correspond to the subarrays 18. A three input OR gate is shown to represent the logic function 368; however, numerous other methods of logically combining digital signals are known in the art. The device 10 of FIG. 226 represents a memory where each subarray is tied to multiple input/output data lines of a DATA bus 372.

This architecture lends itself to repair through isolation of a subarray and elimination of an address line. When a defective subarray is located, half of the subarrays will be electrically isolated from the global signals 350 through 356, and one address line will be disabled in the address decoding circuitry, represented by the simplified block 374 in FIG. 226 but previously described herein in detail. In this particular design the most significant row address is disabled. This provides a 32 megabit DRAM of the same data width as the fully functional 64 megabit DRAM. This is a simplified embodiment of the invention which is applicable to current DRAM designs with a minimum of redesign. Devices of memory capacity other than 32 megabits could be obtained through the use of additional address decode modifications and the isolation of fewer or more memory subarrays. For example, if only a single subarray is defective out of eight possible subarrays on a 64 megabit DRAM, it is possible to design the DRAM so that it can be configured as a 56 megabit DRAM. The address range corresponding to the defective subarray is remapped if necessary so that it becomes the highest address range. In this case, all address lines would be used, but the upper 8 megabits of address space would not be recognized as a valid address for that device, or would be remapped to a functional area of the device. Masking an 8 Mbit address range could be accomplished either through programming of the address decoder or through an address decode/mask function external to the DRAM.

An alternative embodiment of the invention is shown in FIG. 227. Recall from FIG. 2 that integrated circuit memory device 10 in accordance with the presently disclosed embodiment of the invention has four substantially identical quadrants 12, designated in FIG. 227 as 12-1, 12-2, 12-3, and 12-4. VCC 350, and GND 354 connections are provided to the functional elements through isolation devices 358-1, 358-2, 358-3, and 358-4. Control circuit 360 provides control and data signals to and from the functional elements via signal bus 380. After manufacture, device 10 is placed in a test mode. Methods of placing a device in a test mode are well known in the art and are not specifically described herein. A test mode is provided to electrically isolate one, some or all of the functional elements 12-1, 12-2, 12-3, and 12-4 from global supply signals VCC 350 and GND 354 via control signals from control circuit 360 over signal bus 380. The capability of individually isolating each of the functional elements 12-1, 12-2, 12-3, and 12-4 allows ease of test of the control and interface circuits 1360, as well as testing of each one of the functional elements 12-1, 12-2, 12-3, and 12-4 without interference from the others.

Circuits that are found defective are repaired if possible through the use of redundant elements. After test and repair, any remaining defective functional elements can be programmably isolated from the global supply signals. The device can then be sold in accordance with the functions that are available. Additional signals such as other supply sources, reference signals or control signals may be isolated in addition to global supply signals VCC and GND. Control signals in particular may be isolated by simply isolating the supply signals to the control signal drivers. Further, it may be desirable to couple the local isolated nodes to a reference potential such as the substrate potential when these local nodes are isolated from the global supply, reference or control signals.

FIG. 338 shows one embodiment of a single isolation circuit of the type that may be used to accomplish the isolation function of elements 358-1, 358-2, 358-3, and 358-4 shown in FIGS. 227. One such circuit is required for each signal to be isolated from a functional element. In FIG. 228, the global signal 390 is decoupled from the local signal 392 by the presence of a logic low level on the disable signal node 394 which causes a transistor 396 to become nonconductive between nodes 390 and 392. Additionally, when the disable node 394 is at a logic low level, invertor 398 causes transistor 400 to conduct between a reference potential 402 and the local node 392. The device size of transistor 396 will be dependent upon the amount of current it will be required to pass when it is conducting and the local node is supplying current to a functioning circuit element. Thus, each such device 396 may have a different device size dependent upon the characteristics of the particular global node 390, and local node 392. It should also be noted that the logic levels associated with the disable signal 394 must be sufficient to allow the desired potential of the global node to pass through the transistor 396 when the local node is not to beisolated from the global node. In the case of an n-channel transistor, the minimum high level of the disable signal will typically be one threshold voltage above the level of the global signal to be passed.

FIG. 229 shows another embodiment of a single isolation circuit of the type that may be used to accomplish the isolation function of elements 358-1, 358-2, 358-3, and 358-4 in FIG. 227. One such circuit is required for each signal to be isolated from a functional element. In FIG. 229, a global supply node 404 is decoupled from the local supply node 406 by the presence of a logic high level on a disable signal node 408 which causes the transistor 410 to become nonconductive between nodes 404 and 406. Additionally, when the disable node 408 is at a logic high level, transistor 412 will conduct between the device substrate potential 414 and the local node 406. By tying the isolated local nodes to the substrate potential, any current paths between the local node and the substrate, such as may be caused by a manufacturing defect, will not draw current. In the case of a p-channel isolation transistor 410, care must be taken when the global node to be passed is a logic low. In this case the disable signal logic levels should be chosen such that the low level of the disable signal is a threshold voltage level below the level of the global signal to be passed.

Typically a combination of isolation circuits such as those shown in FIGS. 228 and 229 will be used. For example, a p-channel isolation device may be desirable for passing VCC, while an n-channel isolation device may be preferable for passing GND. In these cases, the disable signal may have ordinary logic swings of VCC to GND. If the global signal is allowed to vary between VCC and GND during operation of the part, then the use of both n channel and p channel isolation devices in parallel is desirable with opposite polarities of the disable signal driving the device gates.

FIG. 230 shows an example of a memory module designed in accordance with the teachings of the present invention. In this case the memory module is a 4 megaword by 36 bit single in line memory module (SIMM) 416. The SIMM is made up of six DRAMs 418 of the sixteen megabit DRAM generation organized as 4 Meg×4's, and one DRAM 10 of the sixty-four megabit generation organized as 4 Meg×12. The 4 Meg×12 DRAM 10 contains one or two defective 4 Meg×2 arrays of memory elements that are electrically isolated from the remaining circuitry on the device. In the event that the DRAM 10 has only a single defective 4 Meg×2 array, but a device organization of 4 Meg×12 is desired for use in a particular memory module, it may be desirable to terminate unused data input/output lines on the memory module in addition to isolating the defective array. Additionally, it may be determined that it is preferable to isolate a second 4 Meg×2 array on the memory device even though it is fully functional in order to provide a lower power 4 Meg×12 device. Twenty-four of the data input/output pins on connector 640 are connected to the sixteen megabit DRAMs 10. The remaining twelve data lines are connected to DRAM 630. This SIMM module has numerous advantages over a SIMM module of conventional design using nine 4 M×4 DRAMs. Advantages include reduced power consumption, increased reliability and manufacturing yield due to fewer components, and increased revenue through the use and sale of what may have otherwise been a nonfunctional sixty-four megabit DRAM. The 4 Meg×36 SIMM module described is merely a representation of the numerous possible organizations and types of memory modules that can be designed in accordance with the present invention by persons skilled in the art.

FIG. 231 shows an initialization circuit which when used as part of the present invention allows for automatically isolating defective circuit elements that draw excessive current when an integrated circuit is powered up. By automatically isolating circuit elements that draw excessive current, the device can be repaired before it is damaged. A power detection circuit 420 is used to generate a power-on signal 422 when global supply signal 424 reaches a desired potential. Comparator 426 is used to compare the potential of global supply 424 with local supply 428. Local supply 428 will be of approximately the same potential as global supply 424 when the isolation device 430 couples global node 424 to local node 428 as long as the circuit element 432 is not drawing excessive current. If circuit element 432 does draw excessive current, the resistivity of the isolation device 430 will cause a potential drop in the local supply 428, and the comparator 426 will output a high level on signal 434. Power-on signal 422 is gated with signal 434 in logic gate 436 so that the comparison is only enabled after power has been on long enough for the local supply potential to reach a valid level. If signals 438 and 440 are both inactive high, then signal 442 from logic gate 790 will pass through gates 444 and 446 and cause isolation signal 448 to be low, which will cause the isolation device 430 to decouple the global supply from the local supply. Isolation signal 440 (ISO*) can be used to force signal 448 low regardless of the output of the comparator as long as signal 438 is high. Signal 440 may be generated from a test mode, or from a programmable source to isolate circuit element 432 for repair or test purposes. Test signal 81 may be used to force the isolation device 430 to couple the global supply to the local supply regardless of the active high disable signal 450. Signal 438 is useful in testing the device to determine the cause of excessive current draw. In an alternate embodiment, multiple isolation elements may be used for isolation device 430. On power up of the chip, a more resistive isolation device is enabled to pass a supply voltage 424 to the circuit 432. If the voltage drop across the resistive device is within a predetermined allowable range, then a second lower resistance isolation device is additionally enabled to pass the supply voltage 424 to circuit 432. This method provides a more sensitive measurement of the current draw of circuit 432. If the voltage drop across the resistive element is above an acceptable level, then the low resistance device is not enabled, and the resistive device can optionally be disabled. If the resistive device does not pass enough current to a defective circuit 432, it is not necessary to disable it, or even to design it such that it can be disabled. In this case a simple resistor is adequate.

MULTIPLE-ROW CAS-BEFORE RAS REFRESH

Those of ordinary skill in the art will appreciate that the one capacitor—one transistor configuration of dynamic memory cells makes it necessary to periodically refresh the cells in order to prevent loss of data. A row of memory cells is automatically refreshed whenever it is accessed. In addition, rows of cells are refreshed during so-called refresh cycles, which must occur frequently enough to ensure that each column in the array is refreshed often enough to maintain data integrity.

Those of ordinary skill in the art will recognize that most conventional DRAMs support several methods of accomplishing refresh, including so-called "RAS-only" refresh, "CAS-before-RAS" refresh, and "hidden" refresh.

For memory device 10 in accordance with the presently disclosed embodiment of the invention, a default 8K refresh option is specified, meaning that 8000 cycles are required to refresh each memory cell. Since the overhead associated with refreshing a DRAM in a given system can be burdensome, however, particularly in view of the fact that the refresh process can prevent the memory from being accessed for productive purposes, it is in some cases desirable to minimize the refresh rate.

To this end, memory device 10 in accordance with the presently disclosed embodiment of the invention has offers a "4K" refresh option, selectable in pre-packaging processing by blowing a laser fuse or selectable post-packaging by blowing an electrical fuse, for enabling memory device 10 to access two rows per 16 Mbit quadrant 12 instead of just one during each memory cycle, during CAS-before-RAS refresh cycles.

CHARGE PUMP CIRCUITRY

FIG. 237 is a functional block diagram showing memory device 10 from FIG. 2 and an associated charge pump circuit 1010 in accordance with the presently disclosed embodiment of the invention. Charge pump circuit 1010 is preferably implemented on the same substrate as the remaining components of memory device 10. Voltage generator 1010 receives a supply voltage $V_{cc}$ on a $V_{cc}$ bus 1030 and a ground reference signal GND on a ground bus 1032. A DC voltage therebetween provides operating current to voltage generator 1010, thereby powering memory device 10. $V_{cc}$ bus 1030 is shown in greater detail in the bus architecture diagram of FIG. 203.

Power supplied to the operational components of memory device 10 is converted by voltage generator 1010 to an intermediate voltage $V_{BB}$. The voltage signal $V_{BB}$ has a magnitude outside the range from GND to $V_{CC}$. For example, when the voltage of signal $V_{CC}$ is 3.3 volts referenced to GND, the voltage of signal $V_{BB}$ in one embodiment is about −1.5 volts and in another embodiment is about −5.0 volts. Voltages of opposite polarity are used as substrate bias voltages for biasing the substrate in one embodiment wherein integrated circuit 8 is fabricated with a MOS or CMOS process. Further, when the voltage of signal $V_{CC}$ is 3.3 volts referenced to GND, the voltage of signal $V_{BB}$ in still another embodiment is about 4.8 volts. Voltages in excess of $V_{CC}$ are called boosted (and are sometimes referred to by the nomenclature $V_{CCP}$—see, for example, FIG. 203) and are used, for example, in memories for improved access speed and more reliable data storage.

FIG. 238 is a functional block diagram of voltage generator 1010 shown in FIG. 237. Voltage generator 1010 receives power and reference signals $V_{CC}$ and GND on lines 1030 and 1032, respectively, for operating oscillator 1012, pump driver 1016, and multi-phase charge pump 1026. Oscillator 1012 generates a timing signal OSC on line 1014 coupled to pump driver 1016. Control circuits, not shown, selectively enable oscillator 1012 in response to an error measured between the voltage of signal $V_{BB}$ and a target value. Thus, when the voltage of signal $V_{BB}$ is not within an appropriate margin of the target value, oscillator 1012 is enabled for reducing the error. Oscillator 1012 is then disabled until the voltage of signal $V_{BB}$ again is not within the margin.

Pump driver 1016, in response to signal OSC on line 1014, generates timing signals A, B, C, and D, on lines 1018–1024, respectively. Pump driver 16 serves as clocking means coupled in series between oscillator 1012 and multi-phase charge pump 1026. Timing signals A, B, C, and D are non-overlapping. Together they organize the operation of multi-phase charge pump 1026 according to four clock phases. Separation of the phases is better understood from a timing diagram.

FIG. 239 is a timing diagram of signals shown on FIGS. 238 and 240. Timing signals A, B, C, and D, also called clock signals, are non-overlapping logic signals generated from intermediate signals P and G. Signal OSC is an oscillating logic waveform. Signal P is the delayed waveform of signal OSC. Signal G is the logic inverse of the exclusive OR of signals OSC and P. The extent of the delay between signals OSC and P determines the guard time between consecutively occurring timing signals A, B, C, and D. The extent of delay is exaggerated for clarity. In one embodiment, signal OSC oscillates at about 40 MHz and the guard time is about 3 nanoseconds. Signal transitions at particular times will be discussed with reference to a schematic diagram of an implementation of the pump driver.

FIG. 240 is a schematic diagram of pump driver 1016 shown on FIG. 238. Pump driver 1016 includes means for generating gate signal G on line 1096; a first flip flop formed from gates 1056, 1058, 1064, and 1066; a second flip flop 1088; and combinational logic.

Signal G on line 1096 operates to define non-overlapping timing signals. Means for generating signal G include gate 1050, delay elements 1052 and 1054, and gates 1060, 1062, 1068 and 1070. Delay elements 1052 and 1054 generate signals skewed equally in time. Referring to FIG. 239, signal OSC rises at time T10. At time T12, signal P on line 1094 rises after the delay accomplished by element 1052. Inverted oscillator signal OSC* on line 1092 is similarly delayed through element 1054. The remaining gates form signal G from the logic inverse of the exclusive OR of signal OSC and signal P according to principles well known in the art. Signal G on line 1096 rises and remains high from time T12 to time T14 so that one of the four flip flop outputs drives one of the timing signal line 1018–1024. First and second flip flops operate to divide signal OSC by four to form symmetric binary oscillating waveforms on flip flop outputs from gates 1064 and 1066 and from flip flop 1088. The logic combination of appropriate flip flop outputs and signal G produces, through gates 1072–7108, the non-overlapping timing signals A, B, C, and D as shown in FIG. 239. Gates 1080–1086 provide buffering to improve drive characteristics, and invert and provide signals generated by gates 1072–1078 to charge pump circuits to be discussed below. Buffering overcomes intrinsic capacitance associated with layout of the coupling circuitry between pump driver 16 and multi-phase charge pump 1026, shown in FIG. 238.

FIG. 241 is a functional block diagram of multi-phase charge pump 1026 shown in FIG. 238. Multi-phase charge pump 1026 includes four identical charge pump circuits identified as charge pumps CP1–CP4 and inter-connected in a ring by signals J1–J4. The output of each charge pump is connected in parallel to line 28 so that signal $V_{BB}$ is formed by the cooperation of charge pumps CP1–CP4. Timing signals A, B, C, and D are coupled to inputs E and F of each charge pump in a manner wherein no charge pump receives the same combination of timing signals. Consequently, operations performed by charge pump CP1 in response to timing signals A and B at a first time shown in FIG. 239 from time T8 to time T14 will correspond to operations performed by charge pump CP2 at a second time from time T12 to time T18.

Each charge pump has a mode of operation during which primarily one of three functions is performed: reset, share, and drive. Table 1 illustrates the mode of operation for each charge pump during the times shown in FIG. 239.

| | | Mode of Operation | | | |
|---|---|---|---|---|---|
| Period | Times | CP1 | CP2 | CP3 | CP4 |
| 1 | T14–T18 | reset | drive | share | reset |
| 2 | T18–T22 | reset | reset | drive | share |
| 3 | T22–T26 | share | reset | reset | drive |
| 4 | T26–T30 | drive | share | reset | reset |

During the reset mode, storage elements in the charge pump are set to conditions in preparation for the share mode. In the share mode, charge is shared among storage elements to develop voltages needed during the drive mode. During the drive mode, a charge storage element that has been pumped to a voltage designed to established the voltage of signal $V_{BB}$ within an appropriate margin is coupled to line 28 to power operational circuit 11.

Power is supplied via line 1028 by multi-phase charge pump 1026 as each charge pump operates in drive mode. Each charge pump is isolated from line 1028 when in reset and share modes. As will be discussed in greater detail with reference to FIG. 243, each charge pump generates a signal for enabling another pump of multi-phase charge pump 1026 to supply power. Such a signal, as illustrated in FIG. 241 includes two signals, J and L, generated by each pump. In alternate embodiments, enablement is accomplished by one or more signals individually or in combination.

Enabling a charge pump in one embodiment includes enabling the selective coupling of a next pump to line 1028. In other alternate embodiments, enabling includes providing a signal for selectively controlling the mode of operation or selectively controlling the function completed during a mode of operation, or both. Such control is accomplished by generating and providing a signal whose function is not primarily to provide operating power to another pump.

Charge pumps CP1–CP4 are arranged in a sequence having "next" and "prior" relations among charge pumps. Because charge pump CP2 receives a signal J1 generated by charge pump CP1, charge pump CP1 is the immediately prior pump of CP2 and, equivalently, CP2 is the immediately next pump of CP1. In a like manner, with respect to signal J2, charge pump CP3 is the immediately next pump of CP2. With respect to signals J3 and J4, and by virtue of the fact that signal J1–J4 form a ring, charge pump CP4 is the immediately prior pump of CP1 and charge pump CP3 is a prior pump of the immediate prior pump of CP1. Signals L1–L4 are coupled to pumps beyond the immediate next pump. Consequently, charge pump CP3 receives signal L1 from a prior pump (CP1) of the prior pump CP2; and provides signal L3 to a next pump (CP1) of the next pump CP4. Charge pumps CP1–CP4 are numbered according to their respective sequential positions 1–4 in the ring.

In alternate embodiments, one or more additional charge pumps are coupled between a given charge pump and a next charge pump without departing from the concept of "next pump" taught herein. A next pump need not be an immediate next pump. A prior pump, likewise, need not be an immediately prior pump.

The operation of each charge pump, e.g. CP1, is coordinated by timing signals received at inputs E and F, timing signals received at inputs M and K. Due to the fact that pump circuits are identical and that timing signals A–D are coupled to define four time periods, each period including two clock phases, signals J1–J4 all have the same characteristic waveform, occurring at a time according to the sequential position 1–4 of the pump from which each signal is generated. Signals L1–L4, in like manner, all have a second characteristic waveform, occurring according to the generating charge pump's sequential position.

In an alternate and equivalent embodiment, the sequence of charge pumps illustrated as CP1–CP4 in FIG. 241 does not form a ring. The first pump in the sequence does not receive a signal generated by the last charge pump in the sequence. The sequence in other equivalent embodiments includes fewer or more than four charge pumps. Those skilled in the art can apply the principles of the present invention to various organizations and quantities of cooperating charge pumps without departing from the scope of the present invention. In an alternate embodiment, for example, an alternate pump driver provides a three phase timing scheme with three clock signals similar to signals A–C. An alternate multi-phase charge pump in such an embodiment includes six charge pumps in three pairs arranged in a linear sequence coupled in parallel to supply signal $V_{BB}$.

In yet another alternate embodiment, the timing and intermittent operation functions of oscillator 1012 are implemented by a multi-stage timing circuit formed in a series of stages, each charge pump including one stage. In such an embodiment, the multi-stage timing circuit performs the functions of pump driver 1016. The multi-stage timing circuit is implemented in one embodiment with delay elements arranged with positive feedback. In another embodiment, each stage includes retriggerable monostable multivibrator. In still another embodiment, delay elements sense an error measured between the voltage of signal $V_{BB}$ and a target value. In yet another embodiment, less than all charge pumps include a stage of the multi-stage timing circuit.

FIG. 242 is a schematic diagram of charge pump 1100 shown in FIG. 241. Charge pump 1100 includes timing circuit 1104; means for establishing start-up conditions (Q4 and Q8); primary storage means (C4); control means responsive to timing signal K for generating a second timing signal J (Q2 and Q3); transfer means responsive to signals M and N for selectively transferring charge from the primary storage means to the operational circuit (C1, C3, Q2, Q3, and Q10); and reset means, responsive to timing signal L, for establishing charges on each capacitor in preparation for a subsequent mode of operation (C2, Q1, Q6, Q7, Q9, and Q5).

Values of components shown in FIG. 242 illustrate one embodiment of the charge pump circuitry in accordance with the presently disclosed embodiment of the invention, i.e., one associated with memory device 10. In the embodiment of FIG. 242, $V_{CC}$ is about 3.0 volts, $V_{BB}$ is about –1.2 volts, the signal OSC has a frequency of 40 MHz, and each pump circuit (e.g., CP1) supplies about 5 milliamps in drive mode. In similar embodiments the frequency of signal OSC is in a range 1 to 50 MHz and each pump circuit supplies current in the range 1 to 10 milliamps.

Simulation analysis of charge pump 1100 using the component values illustrated in FIG. 242 shows that for $V_{CC}$ as low as 1.7 volts and $V_T$ of about 1 volt, an output current of about 1 milliamp is generated. Not only do prior art pumps cease operating at such low values of $V_{CC}$, but output current is about five times lower. A prior art pump operating at a minimum $V_{CC}$ of 2 volts generates only 100–200 microamps.

P-channel transistors Q2, Q3, Q6, Q7, and Q10 are formed in a well biased by signal N. The bias decreases the voltage apparent cross junctions of each transistor, allowing smaller dimensions for these transistors.

A modified charge pump having an output voltage $V_{BB}$ greater than $V_{CC}$ includes N-channel transistor for all P-channel transistors shown in FIG. 242. Proper drive signal N, L, and H are obtained by introducing logic invertors on each line 140, 150, and 156. In such an embodiment, signal N is not used for biasing wells of the pump circuit since no transistor of this embodiment need be formed in a well.

Charge pump 1100 corresponds to charge pump CP1 and is identical to charge pumps CP2–CP4. Signals in FIG. 242 outside the dotted line correspond to the connections for CP1 shown on FIG. 241. The numeric suffix on each signal name indicates the sequential position of the pump circuit that generated the signal. For example, signal K received as signal J4 on line 130 is generated as signal J by charge pump CP4.

When power signal $V_{CC}$ and reference signal GND are first applied, transistors Q4 and Q8 bleed residual charge off capacitors C2 and C4 respectively. Since the functions of transistors Q4 and Q8 are in part redundant, either can be eliminated, though start up time will increase. The first several oscillations of signal OSC eventually generate pulses on signals A, B, C, and D. Signals C and D, coupled to the equivalent of timing circuit 1104 in charge pump CP3, form signal L3 input to CP1 as signal M. Signals D and A, coupled to the equivalent of timing circuit 1104 in charge pump CP4, contribute to the formation of signal J4. In approximately two occurrences of each signal A–D, all four charge pumps are operating at steady state signal levels. Steady state operation of charge pump 1100 in response to input timing and control signals J4 (K) and L3 (M), and clock signals A (E) and B (F) is best understood from a timing diagram.

FIG. 243 is a timing diagram of signals shown in FIG. 242. The times identified on FIG. 243 correspond to similarly identified times on FIG. 238. In addition, events at time T32 corresponds to events at time T16 due to the cyclic operation of multi-phase charge pump 1026 of which charge pump 1100 is a part.

During the period from time T14 to time T22, pump 1100 performs functions of reset mode. At time T14, signal X falls turning on reset transistor Q1, Q6, Q7, and Q9. Transistor Q1 draws the voltage on line 134 to ground as indicated by signal W. Transistor Q6 when on draws the voltage of signal J to ground. Transistor Q9 when on draws the voltage of signal J to ground. Transistor Q7 couples capacitors C3 and C4 so that signal Z is drawn more quickly to ground. In an alternate embodiment, one of the transistors Q6, Q7, and Q9 is eliminated to trade-off efficiency for reduced circuit complexity. In an alternate embodiment, additional circuitry couples a part of the residual charge of capacitors C1 and C3 to line 1142 as a design trade-off of circuit simplicity for improved efficiency. Such additional circuitry known to those skilled in the art.

At time T16 pump 1100 receives signal M on line 1132. Consequently, capacitor C1, charges as indicated by signal W.

During the period from time T22 to time T26 charge pump 100 performs functions of share mode. At time T22, signal M falls and capacitor C1 discharges slightly until at time T24 signal L rises. As a consequence of the rising edge of signal L, signal X rises, turning off transistor Q1 by time T24. The extent of the discharge can be reduced by minimizing the dimensions of transistor Q1. By stepping the voltage of signal M at time T22, a first stepped signal W having a voltage below ground has been established. At time T24, signal K falls, turning transistor Q3 on so that charges stored on capacitors C1 and C3 are shared, i.e., transferred in part therebetween. The extent of charge sharing is indicated by the voltage of signal J. The voltage of signal J at time T28 is adjusted by choosing the ratio of values for capacitors C1 and C3. Charge sharing also occurs through transistor Q2 which acts as a diode to conduct current from C3 to C1 when the voltage of signal J is more positive than the voltage of signal W. Transistor Q2 is eliminated in an alternate embodiment to trade-off efficiency for reduced complexity.

Also at time T24, signal H falls. By stepping the voltage of signal H, a second stepped signal Z having a voltage below ground has been established. Until time T28, transistor Q10 is off, isolating charge pump 1100 and signal Z from line 1142. While signal Z is low, transistor Q5 is turned on to draw signal X to ground. Signals L and H cooperate to force signal X to ground quickly.

At time T26, signal K rises, tuning off transistor Q3. The period of time between non-overlapping clock signals E and F provides a delay between the rising edge of signal K at time T26 and the falling edge of signal N at time T28. By turning transistor Q3 off at time T26, capacitors C1 and C3 are usually isolated from each other by time T28 so that the effectiveness of signal N on signal J is not compromised.

During the period from time T28 to time T32, charge pump 1100 performs functions of drive mode. At time T28 signal N falls. By stepping the voltage of signal N, a third stepped signal J is established at a voltage below the voltage of signal Z. Consequently, transistor Q10 turns on a remains on until time T30. Stepped signal J, coupled to the gate of pass transistor Q10, enables efficient conduction of charge from capacitor C4 to line 1142 thereby supplying power from a first time T28 to a second time T30 as indicated by the voltage of signal Z. The voltage of the resulting signal $V_{BB}$ remains constant due to the large capacitive load of the substrate of integrated circuit 8. Q10 operates as pass means for selectively conducting charge between C4 and the operational circuit coupled to line 1142, in this case the substrate. In alternate and equivalent embodiments, pass means includes a bipolar transistor in addition to, or in place of, field effect transistor Q10. In yet another alternate embodiment, pass means includes a switching circuit.

The waveform of signal J, when used as signal K in a next pump of the sequence, enables some of the functions of share mode in the next pump. As used in charge pump 100, signal J is a timing signal for selectively transferring charge from charge pump 1100 to between capacitors C1 and C3. By generating signal J in a manner allowing it to perform several functions, additional signals and generating circuitry therefor are avoided.

At time T30, signal F falls. Consequently, signal L falls, signal H rises, and signal N rises. Responsive to signal H, capacitor C4 recharges as indicated by the voltage of signal Z. Responsive to signals N and L, capacitors C1 and C3 begin resetting as indicated by the voltage of signal J at time T30 and equivalently, time T14.

During share and drive modes, charge pump 1100 generates signal L for use as signal M in a next pump of the next pump of charge pump 1100. The waveform of signal L when high disables reset functions in share and drive modes of charge pump 100 and when used as signal M in another pump, enables functions of reset mode therein. By generating signal L in a manner allowing it to perform several functions, additional signals and generating circuitry therefor are avoided.

Timing circuit 1104 includes buffers 1110, 1112, and 1120; gate 1116; and delay elements 1114 and 1118. Buffers provide logical inversion and increased drive capability. Delay element 1114 and gate 1116 cooperate as means for generating timing signal L having a waveform shown on FIG. 243. Delay element 1118 ensures that signal N falls before signal L falls to preserve the effectiveness of signal J at time T30.

FIG. 244 is a schematic diagram of a timing circuit alternate to timing circuit 104 shown in FIG. 242. Gates 1210 and 1218 form a flip flop to eliminate difficulties in manufacturing and testing delay element 1114 shown in FIG. 242. Corresponding lines are similarly numbered on FIGS. 6 and 8. Likewise, delay element 1216 functionally corresponds to delay element 1118; buffers 1220 and 1222 functionally correspond to buffers 1120 and 1110, respectively; and gate 1214 functionally corresponds to gate 1116.

In an alternate embodiment, the functions of timing circuits 1104 and 1204 are accomplished with additional and different circuitry in a modification to pump driver 1016 according to logic design choices familiar to those having ordinary skill in the art. In such an embodiment, the modified pump driver generates signals N1, L1, and H1 for CP1; N2, L2, and H2 for CP2; and so on for pumps CP3–4.

FIG. 245 is a functional block diagram of a second voltage generator 1010 ' for producing a positive $V_{CCP}$ voltage having over-voltage protection circuitry. Because this $V_{CCP}$ voltage generator 1010' is structurally similar to voltage generator 1010 of FIGS. 238–244, the $V_{CCP}$ voltage generator has been labelled 1010' and elements similar to those discussed relative to voltage generator 1010 have been identified with similar, but primed numerals.

Voltage generator 1010' receives power signal $V_{CC}$ and reference signal GND on lines 1030' and 1032' respectively and includes an oscillator 1012', a pump driver 1016' and a multi-phase charge pump 1026'. Oscillator 1012' generates a timing signal OSC' coupled to pump driver 1016' through line 1014'. Pump driver 1016' produces clock signals A', B', C', and D', which are coupled to the multi-phase charge pump 1026' through lines 1018', 1020', 1022': and 1024' respectively. Multi-phase charge pump 1026' in turn produces an output boosted voltage $V_{CCP}$ on output line 28'.

In addition, voltage generator 1010' further includes a burn-in detector 1038', which responds to signal $V_{CCP}$ on line 1034', and a pump regulator 1500, which monitors the value of $V_{CCP}$ and produces a signal VCCPREG to turn the oscillator 12' on or off. Burn-in detector 1038' produces a BURNIN_P signal on line 1036' coupled to the multi-phase charge pump 1026'.

FIG. 246 is a schematic diagram of an exemplary configuration of a charge pump 1 300 suitable for use in the multi-phase charge pump 1026' shown in FIG. 245 for producing a positive boosted voltage $V_{CCP}$. Charge pump 1300 is similar to charge pump 1100 illustrated in FIG. 242 with a timing circuit 1304 similar to the timing circuit 1204 illustrated in FIG. 244. Similar elements are labelled with the same last two digits. Significant differences are that transistor terminals that were connected to ground in the schematic of FIG. 242 are now coupled to Vcc; that the phases of the pump are inverted (see inverter 1323), and that high-voltage nodes, 1320, 1322, 1324, and 1326, are clamped during burn-in testing by protective circuits PC1, PC2, PC3, and PC4 respectively.

Timing circuit 1304 includes gates 1310 and 1318 forming a flip-flop that acts as a delay element. The flip-flop and gate 1316 cooperate as means for generating timing signal L'. Buffers 1312, 1320, and 1322 provide logical inversion and increased drive capability. Delay element 1316 ensures that signal N' falls before signal L' falls to preserve the effectiveness of signal J' at the end of the drive mode of the charge pump 1300.

Charge pump 1300 also includes a transfer circuit responsive to signals M' and N' for selectively transferring charge from the primary storage capacitor to the operational circuit (C1, C3, Q2, Q3, and Q10), a reset circuit, responsive to timing signal L', for establishing charges on each capacitor in preparation for a subsequent mode of operation (C2, Q1, Q6, Q7, and Q9 a capacitor Q5 for restting the rest pump C2), a start-up condition circuit (including Q4 and Q8); a primary storage capacitor (C4); and a control circuit responsive to timing signal K' for generating a second timing signal J' (Q2 and Q3).

The transfer circuit includes a first capacitor C1 coupled across the input for signal L3' and the output for signal W' (node 1320); a third capacitor C3 coupled across the logical inverse of the signal N' from the timing circuit 1304 and the output of signal J' (node 1324); a second transistor Q2 (a node-connected MOSFET) having a drain terminal coupled to node 324 and a source terminal coupled to node 1320; a third transistor Q3 having a gate terminal coupled to input signal J4' (or K'), a drain terminal coupled to node 1324, and a source terminal coupled to node 1320; and a tenth transistor Q10 having a gate terminal coupled to node 324, a drain terminal coupled to a $V_{CCP}$ output, and a source terminal coupled to a node 1326.

The reset circuit includes a second capacitor C2 coupled across the L' signal line from the timing circuit 1304 and the node 1326; a first transistor Q1 having a drain terminal coupled to $V_{CC}$, a gate terminal coupled to a node 1322 (signal X'), and a source terminal coupled to node 320; a sixth transistor Q6 having a drain terminal coupled to $V_{cc}$, a gate terminal coupled to node 1322, and a source terminal coupled to node 1324; a seventh transistor Q7 having a gate terminal coupled to node 1322, a source terminal coupled to node 1326 (signal Z'), and a drain terminal coupled to node 1324 (signal J'); and a ninth transistor Q9 having a gate terminal coupled to node 1322, a drain terminal coupled to $V_{CC}$, and a source terminal coupled to node 1326. Fifth transistor Q5 has a source terminal coupled to node 1322, a gate terminal coupled to node 1326, and a drain terminal coupled to $V_{CC}$. Q5 resets C2 when the charge pump 1300 is in drive mode.

The start-up condition circuit includes a fourth transistor Q4 (a diode-connected MOSFET) having a gate and a drain terminal coupled to $V_{CC}$ and a source terminal coupled to node 1326; and an eight transistor Q8 (a diode-connected MOSFET) having a gate and a drain terminal coupled to $V_{CC}$ and a source terminal coupled to node 1326. Primary storage capacitor C4 is coupled across the output of signal H' from timing circuit 1304 and the node 1326 (signal Z'). Control circuit includes transistors Q2 and Q3.

In a preferred embodiment of charge pump 1300, $V_{CC}$ is about 3.3 volts and $V_{CCP}$ is about 4.8 volts. During burn-in testing, $V_{CC}$ reaches 5.0 volts and $V_{CCP}$ approaches 6.5 volts. The transistors are all MOSFET with a $V_T$ of about 0.6 volts.

Protection circuit PC1 includes a switching element 1360 and a voltage damp 1370. Switching element 1360 is a MOSFET switching transistor having a drain terminal 1364 (clamp terminal 1362) connected to the voltage clamp 1370, a source terminal 1364 (clamping voltage terminal) coupled to a reference voltage (Vcc) source 30', and a gate terminal 1366 (control terminal) connected to the BURNIN_P line 1036'.

Voltage clamp 1370 includes a chain of three diode-connected enhancement MOSFET transistors 1372, 1374, and 1376 coupled in series. The drain terminal 1371 of the first transistor 1372 (the node terminal) is coupled to the high-voltage node 1320, while the source terminal 1377 of the last transistor 1376 (the switch terminal) is coupled to the drain terminal 1364 of the switching transistor 1360.

During normal operation, the BURNIN_P signal is LOW and the switching transistor 1360 is off, removing the protection circuit PC1 from the system so as not to affect the efficiency of the charge pump 1300. During burn-in testing conditions, the BURNIN_P signal steps up to a value higher than logical one ($V_{CCP}$) causing switching transistor 1360 to go into pinch-off mode, and allowing current ($I_{ds}$) to flow from the drain terminal 1362 to the source terminal 1364. Once $I_{ds}$>0 the voltage clamp 1370 becomes part of the system and damps down the voltage of the high-voltage node to $V_{cc}+V_{tswitch}+V_{t1}+\ldots+V_{tn}$ (where n is the number of diode-connected transistors and $V_{tX}$ is the voltage drop across each transistor) thus avoiding over-voltage damage.

Protective circuits PC2, PC3, and PC4 are similar to protective circuit PC1 and include a switching transistor and a voltage clamp. The number and the value of diode-connected transistors in each voltage clamp varies according to the expected over-voltage values of the high-voltage node and the desired clamping voltage. Protection circuits allow accurate burn-in testing of a charge pump or of any other IC device having high-voltage nodes, while preventing damage caused by over-voltages. The protection circuit can be manufactured as part of the IC device, thereby avoiding the need to add additional components or assembly steps. Protection circuits in accordance with the present invention can be coupled to a variety of charge pump designs or to other IC devices having high-voltage nodes at risk of over-voltage damage. Finally, protection circuits do not affect the efficiency of the IC device during normal operation.

FIG. 247 is a schematic of a preferred embodiment of the burn-in detector 1038' of FIG. 245. The burn-in detector 1038' reacts to burn-in conditions to produce the BURNIN_P control signal for enabling the protective circuits.

The burn-in detector 1038' includes a p-channel device 400 having a drain terminal set at $V_{CC}$, a gate terminal set to ground, and a source terminal coupled in series to a chain of n-channel diodes 1404 coupled in series. The gate terminal of the first diode in the chain 1404 is coupled to the gate terminal of a p-channel gate 1402 having a drain terminal coupled to $V_{CC}$ and a source terminal coupled to an n-channel transistor 1406 and to logic circuit 1408. At low $V_{CC}$ values ($V_{CC}$=3.3 volts at normal operation), the diodes 1404 are turned off, therefore leaving the drain terminal of the p-channel device 1400 at $V_{CC}$, which drives the p-channel gate 1402. P-channel 1402 will be off and its drain terminal will be at ground because of the n-channel transistor 1406. Under these conditions, transistor 1407 is off, the voltage at node 4109 is high and the BURNIN signal is low (logic zero).

Conversely, under burn-in conditions, $V_{CC}$ goes high (about 5 volts). $V_{CC}$ then raises the stack of n-channel diodes 1404, which then overdrive the p-channel device 1400, bringing the source terminal of the device 1400 away from $V_{CC}$, which then turns on the p-channel gate 1402. Turning the p-channel gate 1402 on, overdrives the n-channel transistor 1406 which turns on switching transistor 1407. Once transistor 1407 is on, the voltage on node 1409 goes low and drives the logic circuit 1408 to produce a BURNIN logic value of 1.

A high BURNIN value activates BURNIN_P gate 1410 by turning off transistor 1412. Ground then propagates through transistors 1416 and 1418 and turns on transistor 1414, driving up the value of BURNIN_P to $V_{CCP}$. A value of BURNIN_P larger than $V_{CC}$ turns on the switching elements of the protective circuits PC1–PC4, thus activating the voltage clamps and preventing over-voltage damage. When BURNIN is low, transistor 412 is on, and transistor 1414 is off, thus drivng BURNIN_P close to ground and turning off the protective circuits PC1–PC4.

FIG. 1248 is a schematic diagram of the pump regulator 1500 of FIG. 245. Pump regulator 1500 monitors $V_{CCP}$, and produces an output signal VCCPREG, which is used as a control signal for the oscillator 1012'. The values for the IC elements are given in width over length of drawn microns. The pump regulator 1500 is a set voltage regulator having a reference voltage for turn-on (turn-on voltage=4.7 volts) and a fixed reference voltage for turn-off (turn-off voltage 4.9 to 5.0 volts), having therefore a built-in hysteresis. Basically, the regulator behaves as a comparator with hysteresis. Anytime $V_{CCP}$ goes below the turn-on voltage, the pump regulator produces a high VCCPREG signal which activates the oscillator 1012', thus cycling the charge pump and raising $V_{CCP}$. Signal VCCPREG remains high until the value of $V_{CCP}$ rises above the turn-off voltage. The regulator 1500 then drives VCCPREG low, which turns OFF the oscillator 1012'. The regulator 1500 then resets itself, and waits until the next turn-on cycle.

Pump regulator 1500 includes two n-well capacitors 1510 and 1512, each having a first plate coupled to node 1514 and a second plate. When the EN* enable signal is high, the transistor 1514 is on, and the voltage at node 1514 equals $V_{CCP}$. The voltage of the second plate of the n-well capacitors is set by diode chain 1530. When the second plate on the n-well capacitors 1510 and 1512 goes too low, then p-channel transistor 1540 turns on and propagates through a series of invertors 1560, which produce signal VCCPREG to turn the isolator on. When $V_{CCP}$ crawls up high enough again, the voltage of the second plate of capacitor 512 rises and to turns off p-channel device 1540, thus driving VCCPREG low.

Practice of the present invention as it relates ot charge pump circuitry includes use of a method in one embodiment that includes the steps (numbered solely for convenience of reference):

(1) maintaining a first voltage on a first plate of a first capacitor while storing a first charge on a second plate of the first capacitor;

(2) stepping the voltage on the first plate of the first capacitor thereby developing a first stepped voltage on the second plate of the first capacitor;

(3) coupling the first stepped voltage to a pass transistor;

(4) maintaining a second voltage on a first plate of a second capacitor while storing a second charge on a second plate of the second capacitor;

(5) stepping the voltage on the first plate of the second capacitor thereby developing a second stepped voltage on the second plate of the second capacitor;

(6) coupling the second stepped voltage to the first plate of a third capacitor;

(7) stepping the voltage on the second plate of the third capacitor thereby developing a third stepped voltage on the first plate of the third capacitor; and (8) coupling the third stepped voltage to a control terminal of the pass transistor thereby enabling the first stepped voltage to power the circuit.

The method in one embodiment is performed using some of the components and signals shown in FIGS. 242 and 243. Cooperation of oscillator 1012, pump driver 1016, timing circuit 1104, capacitor C4, transistor Q8, and signals H and Z accomplish step (1). Operation of timing circuit 1104 to provide signal H accomplishes the operation of stepping in step (2). In step (2) the first stepped voltage is a characteristic value of signal Z. Signal Z is coupled by line 1158 to transistor Q10 accomplishing step (3).

Cooperation of capacitor C1, transistor Q1 and signals M and, L accomplish step (4). These components cooperate as first generating means for providing a voltage W by time T22. Cooperation of timing circuit 1104 of another charge pump to provide signal L therein and consequently signal M herein accomplishes the operation of stepping in step (5). In step (5) the stepped voltage is a characteristic value of signal W.

Cooperation of timing circuit 1104 of another charge pump to provide signals N and J therein and consequently signal K herein along with transistors Q2 and Q3 accomplish step (6) with respect to capacitor C3. These circuits and components cooperate as means responsive to a timing signal for selectively coupling the first generating means to a second generating means.

Cooperation of oscillator 1012, pump driver 1016, timing circuit 1104, capacitor C3, and signal N accomplish step (7). These components cooperate as a second generating means for providing another stepped voltage. The stepped voltage is a characteristic value of signal J at time T28. The stepped voltage is outside the range of power, i.e., $V_{CC}$, and reference, i.e., GND, voltages applied to integrated circuit 8 of which charge pump 100 is a part. Finally, line 1136 couples signal J to the gate of transistors Q10, accomplishing step (8).

In the method discussed above, steps 1–3 occur while steps 7–8 are occurring as shown in FIG. 243 by the partial overlap in time of signals H and N.

The foregoing description discusses preferred embodiments of the charge pump circuitry in accordance with the present invention, which may be changed or modified without departing from the scope of the present invention. For example, N-channel FETs discussed above may be replaced with P-channel FETs (and vice versa) in some applications with appropriate polarity changes in controlling signals as required. Moreover, the FETs discussed above generally represent active devices which may be replaced with bipolar or other technology active devices. Still further, those skilled in the art will understand that the logical elements described above may be formed using a wide variety of logical gates employing any polarity of input or output signals and that the logical values described above may be implemented using different voltage polarities. As an example, an AND element may be formed using AND gate or an NAND gate when all input signals exhibit a positive logic convention or it may be formed using an OR gate or a NOR gate when all input signals exhibit a negative logic convention.

From the foregoing detailed description of a specific embodiment of the invention, it should be apparent that a high-density monolithic semiconductor memory device numerous features that collectively and/or individually prove beneficial with regard to the device's density, speed, reliability, cost, functionality, and size, among other factors, has been disclosed. Although a specific embodiment of the invention has been described herein in considerable detail, this has been done for the purposes of providing an enabling disclosure of the presently preferred embodiment of the invention, and is not intended to be limiting with regard to the scope of the invention or inventions embodied therein.

It is contemplated that a great many substitutions, alterations, modifications, omissions, and/or additions, including but not limited to those design options and other variables specifically discussed herein, may be made to the disclosed embodiment of the invention without departing from the spirit and scope of the invention as defined in the appended claims.

What is claimed is:

1. A semiconductor memory device, comprising an array of rows and columns of memory cells each disposed at an intersection between a digit line and a word line, wherein said array of rows and columns of memory cells is subdivided into a plurality of substantially equivalent partial arrays of rows and columns of memory cells, said plurality of partial arrays physically arranged in a plurality of adjacent pairs of partial arrays such that each pair of partial arrays defines a substantially elongate intermediate area between the partial arrays of said each pair of partial arrays, and said partial arrays being further subdivided into a plurality of sub-arrays, said sub-arrays physically arranged in a plurality of adjacent pairs such that each pair of sub-arrays defines a substantially elongate intermediate area between the sub-arrays of each pair of sub-arrays, said memory device further comprising:

- a hierarchical decoding system comprising, for each of said plurality of adjacent pairs of partial arrays, row address predecoding circuitry, responsive to row address signals supplied to said device to generate a plurality of predecoded row address signals; and
- a plurality of row decoder driver circuits, coupled to said row address predecoding circuitry, said row decoder driver circuits responsive to said predecoded row address signals to generate local row address signals;
- a plurality of local row address decoding circuits, distributed throughout said sub arrays and each electrically coupled to one of said row decoder driver circuits to receive said local row address signals, said local row decoding circuits selectively responsive to said local row address signals to apply at least one word line driving signal to its associated subarray during a memory access cycle; and
- a hierarchical data path, comprising:
  - a plurality sense amplifiers, adapted to sense the presence or absence of charge in one of said memory cells and to produce a sense amplifier output signal reflecting said presence or absence of charge;
  - a plurality of multiplexers, distributed throughout said subarrays, each coupled to receive a plurality of said sense amplifier output signals, said multiplexers responsive to said local row address signals to selectively couple one of said plurality of sense amplifier output signals to a local input/output line associated with one of said subarrays.

2. A memory device in accordance with claim 1, wherein said multiplexers are physically disposed in gaps defined between adjacent ones of said local row address decoding circuits.

* * * * *